US011812622B2

(12) United States Patent
Boudreault et al.

(10) Patent No.: US 11,812,622 B2
(45) Date of Patent: Nov. 7, 2023

(54) ORGANIC ELECTROLUMINESCENT COMPOUNDS AND DEVICES

(71) Applicant: Universal Display Corporation, Ewing, NJ (US)

(72) Inventors: Pierre-Luc T. Boudreault, Pennington, NJ (US); Chuanjun Xia, Lawrenceville, NJ (US); Scott Joseph, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 16/836,400

(22) Filed: Mar. 31, 2020

(65) Prior Publication Data

US 2020/0321543 A1 Oct. 8, 2020

Related U.S. Application Data

(63) Continuation of application No. 15/241,829, filed on Aug. 19, 2016, now abandoned.
(Continued)

(51) Int. Cl.

| | |
|---|---|
| ***H10K 85/30*** | (2023.01) |
| ***C09K 11/06*** | (2006.01) |
| ***C09K 11/02*** | (2006.01) |
| ***H10K 85/40*** | (2023.01) |

(Continued)

(52) U.S. Cl.
CPC .......... *H10K 85/342* (2023.02); *C09K 11/025* (2013.01); *C09K 11/06* (2013.01);
(Continued)

(58) Field of Classification Search
CPC . C09K 11/06; H01L 51/0085; C07F 15/0033; H10K 75/342; H10K 85/342
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 102190685 9/2011
CN 104610370 5/2015
(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).
(Continued)

*Primary Examiner* — Sean M DeGuire
(74) *Attorney, Agent, or Firm* — DUANE MORRIS LLP

(57) ABSTRACT

A compound having a formula $M(L_A)_x(L_B)_y(L_C)_z$ is provided. In the compound of $M(L_A)_x(L_B)_y(L_C)_z$, ligand $L_A$ is ligand $L_B$ is (Continued)

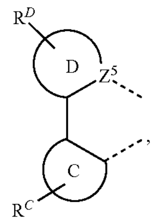

and ligand $L_C$ is

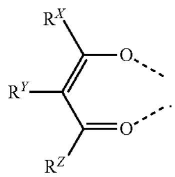

In addition, M is a metal having an atomic mass greater than 40, x is 1, 2, or 3, and y and z are independently 0, 1, or 2. In the compound, $Z^5$ is carbon or nitrogen; one of $Z^1$ to $Z^4$ is nitrogen and three of $Z^1$ to $Z^4$ are carbon substituted by $R^B$, and rings C and D are each independently a 5 or 6-membered carbocyclic or heterocyclic ring. Each $R^A$, $R^B$, $R^C$, and $R^D$ is independently selected from a group of substituents, where at least one $R^B$ is heteroaryl, which can be further substituted, and any adjacent substitutents are optionally joined or fused into a ring. Formulations and devices, such as OLEDs, that include the first compound are also provided.

20 Claims, 2 Drawing Sheets

Related U.S. Application Data

(60) Provisional application No. 62/232,476, filed on Sep. 25, 2015.

(51) Int. Cl.
*H10K 85/60* (2023.01)
*H10K 50/11* (2023.01)
*H10K 101/10* (2023.01)

(52) U.S. Cl.
CPC ........... *H10K 85/361* (2023.02); *H10K 85/40* (2023.02); *H10K 85/622* (2023.02); *H10K 85/626* (2023.02); *H10K 85/654* (2023.02); *H10K 85/657* (2023.02); *H10K 85/6572* (2023.02); *H10K 85/6576* (2023.02); *C09K 2211/1007* (2013.01); *C09K 2211/1029* (2013.01); *C09K 2211/1044* (2013.01); *C09K 2211/1051* (2013.01); *C09K 2211/1055* (2013.01); *C09K 2211/1092* (2013.01); *C09K 2211/1096* (2013.01); *C09K 2211/185* (2013.01); *H10K 50/11* (2023.02); *H10K 2101/10* (2023.02)

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
2002/0034656 A1 3/2002 Thompson et al.
2002/0134984 A1 9/2002 Igarashi
2002/0158242 A1 10/2002 Son et al.
2003/0068536 A1* 4/2003 Tsuboyama ......... H01L 51/0085 428/704
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Pakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0237334 A1* 9/2010 Ma ........................ H01L 51/004 257/40
2010/0270916 A1* 10/2010 Xia ........................ H05B 33/14 546/10
2011/0227049 A1 9/2011 Xia

(56) References Cited

U.S. PATENT DOCUMENTS

| | | | | |
|---|---|---|---|---|
| 2012/0274201 | A1 | 11/2012 | Seo et al. | |
| 2013/0137866 | A1 | 5/2013 | Inoue et al. | |
| 2013/0320377 | A1 | 12/2013 | Yamazaki et al. | |
| 2015/0005496 | A1 | 1/2015 | Inoue et al. | |
| 2015/0073142 | A1 | 3/2015 | Ohsawa et al. | |
| 2015/0155510 | A1 | 6/2015 | Kawata et al. | |
| 2016/0056396 | A1 * | 2/2016 | Sugino | H01L 51/0059 546/4 |

FOREIGN PATENT DOCUMENTS

| | | |
|---|---|---|
| EP | 0650955 | 5/1995 |
| EP | 1191612 | 3/2002 |
| EP | 1725079 | 11/2006 |
| EP | 2034538 | 3/2009 |
| JP | 200511610 | 1/2005 |
| JP | 2008074939 | 4/2006 |
| JP | 2007123392 | 5/2007 |
| JP | 2007254297 | 10/2007 |
| JP | 2014082235 | 8/2014 |
| JP | 2014109571 | 12/2014 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012053627 | 4/2012 |
| WO | 2013094620 | 6/2013 |
| WO | 2013137089 | 9/2013 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescenee Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence. Appl. Phys. Lett., vol. 75, No. 1, 4-6 (1999).

Gao, Zhiqiang et al., "Bright-Blue Electroluminescence From a Silyl-Substltuted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 906-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et at, "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electraluminesoent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTData), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridlum(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

(56) References Cited

OTHER PUBLICATIONS

Nishida, Jun-ichi et al., "Preparation, Characterization, and Electroluminescence Characteristics of a-Dilmine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota, Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Dilmine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N∧C∧N∧-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT COMPOUNDS AND DEVICES

CROSS-REFERENCE TO RELATED APPLICATIONS

This application is a continuation of U.S. Non-Provisional application Ser. No. 15/241,829, filed Aug. 19, 2016, which claims priority to U.S. Provisional Application Ser. No. 62/232,476, filed Sep. 25, 2015, the entire contents of which is incorporated herein by reference.

FIELD OF THE INVENTION

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

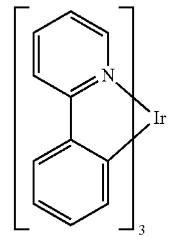

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, a compound having a formula $M(L_A)_x(L_B)_y(L_C)_z$ is provided. In the compound of $M(L_A)_x(L_B)_y(L_C)_z$, ligand $L_A$ is

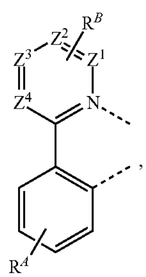

ligand $L_B$ is

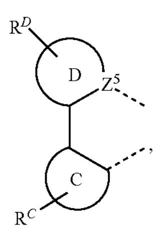

and ligand $L_C$ is

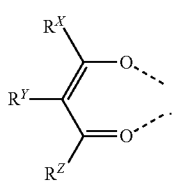

In addition:

M is a metal having an atomic mass greater than 40;

x is 1, 2, or 3;

y is 0, 1, or 2;

z is 0, 1, or 2;

x+y+z is the oxidation state of the metal M;

$Z^5$ is carbon or nitrogen;

one of $Z^1$ to $Z^4$ is nitrogen and three of $Z^1$ to $Z^4$ are carbon substituted by $R^B$;

rings C and D are each independently a 5 or 6-membered carbocyclic or heterocyclic ring;

$R^A$, $R^B$, $R^C$, and $R^D$ each independently represent mono to the possible maximum number of substitution, or no substitution;

each of $R^A$, $R^B$, $R^C$, $R^D$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

at least one $R^B$ is heteroaryl, which can be further substituted; and any adjacent substitutents are optionally joined or fused into a ring.

According to another embodiment, an organic light emitting diode/device (OLED) is also provided. The OLED can include an anode, a cathode, and an organic layer, disposed between the anode and the cathode. The organic layer can include a compound of $M(L_A)_x(L_B)_y(L_C)_z$ as provided herein. According to yet another embodiment, the OLED is incorporated into one or more device selected from a consumer product, an electronic component module, and/or a lighting panel.

According to yet another embodiment, a formulation containing a compound of $M(L_A)_x(L_B)_y(L_C)_z$ is provided.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
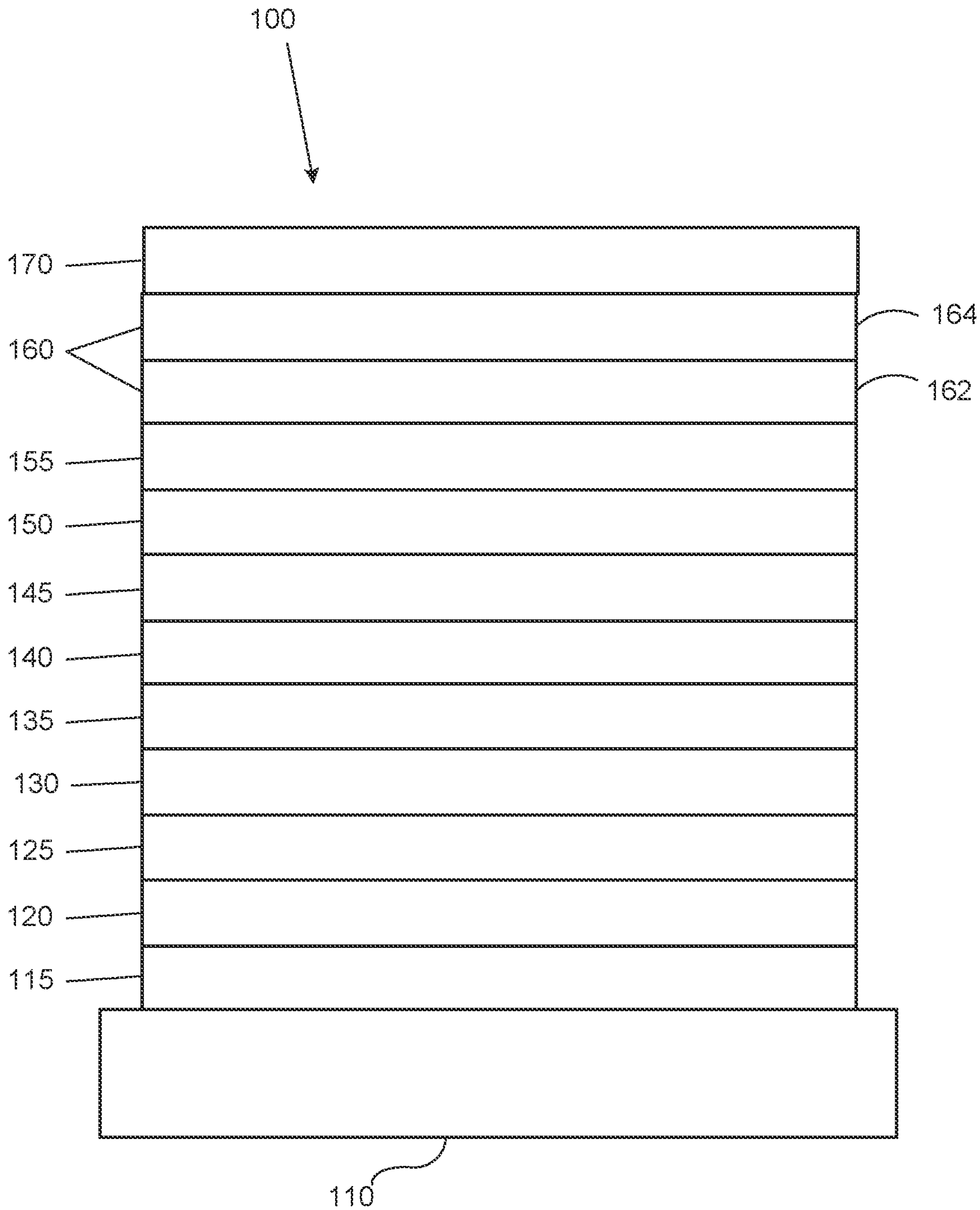
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
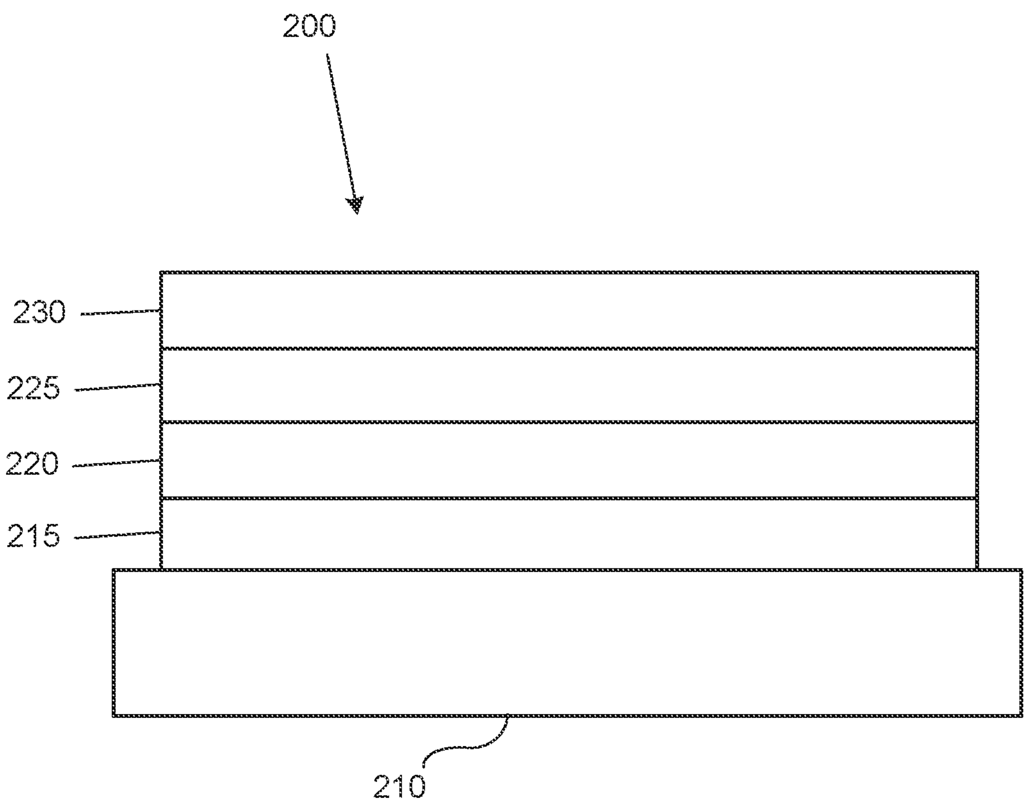
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable device, laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

According to one embodiment, a compound having a formula $M(L_A)_x(L_B)_y(L_C)_z$ is described. In the compound of $M(L_A)_x(L_B)_y(L_C)_z$, ligand $L_A$ is

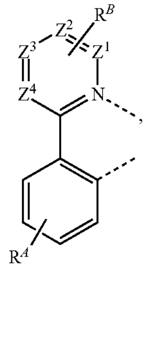

ligand $L_B$ is

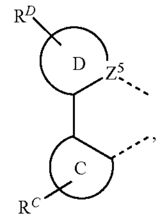

and ligand $L_C$ is

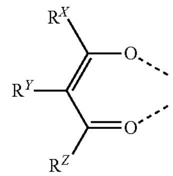

In addition:

M is a metal having an atomic mass greater than 40;

x is 1, 2, or 3;

y is 0, 1, or 2;

z is 0, 1, or 2;

x+y+z is the oxidation state of the metal M;

$Z^5$ is carbon or nitrogen;

one of $Z^1$ to $Z^4$ is nitrogen and three of $Z^1$ to $Z^4$ are carbon substituted by $R^B$;

rings C and D are each independently a 5 or 6-membered carbocyclic or heterocyclic ring;

$R^A$, $R^B$, $R^C$, and $R^D$ each independently represent mono to the possible maximum number of substitution, or no substitution;

each of $R^A$, $R^B$, $R^C$, $R^D$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

at least one $R^B$ is heteroaryl, which can be further substituted; and any adjacent substitutents are optionally joined or fused into a ring.

In some embodiments, M is selected from the group consisting of Ir, Rh, Re, Ru, Os, Pt, Au, and Cu. In some embodiments, M is Ir.

In some embodiments, the compound has the formula $M(L_A)_2(L_C)$.

In some embodiments, the compound has the formula $M(L_A)(L_B)_2$.

In some embodiments, at least one $R^B$ is a six-membered heteroaryl ring, which can be further substituted. In some embodiments, at least one $R^B$ is a five-member heteroaryl ring, which can be further substituted.

In some embodiments, $Z^2$ is nitrogen. In other embodiments, $Z^3$ is nitrogen. In still other embodiments, $Z^4$ is nitrogen.

In some embodiments, z is 1 or 2, and $L_C$ has the formula

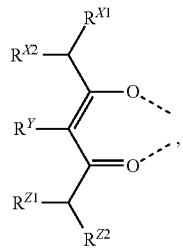

where $R^{X1}$, $R^{X2}$, $R^{Z1}$, and $R^{Z2}$ are independently selected from group consisting of alkyl, cycloalkyl, aryl, and heteroaryl; and at least one of $R^{X1}$, $R^{X2}$, $R^{Z1}$, and $R^{Z2}$ has at least two carbon atoms.

In some embodiments, each of $R^A$, $R^C$, $R^D$, $R^X$, $R^Y$, and $R^Z$ are independently selected from the group consisting of hydrogen, deuterium, alkyl, cycloalkyl, and combinations thereof. In some embodiments, $R^Y$ is hydrogen.

In some embodiments, ring C is benzene, ring D is pyridine, and $Z_5$ is nitrogen.

In some embodiments, $R^B$ is a heteroaryl selected from the group consisting of:

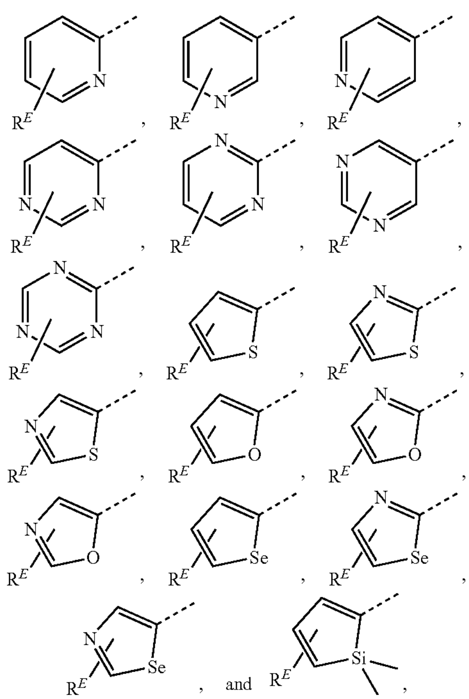

where $R^E$ represents mono substitution to the possible maximum number of substitution, or no substitution;

each $R^E$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and any adjacent substitutents are optionally joined or fused into a ring.

In some embodiments, at least one of $R^A$, $R^B$, $R^C$, and $R^D$ is selected from the group consisting of:

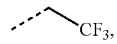

$R^{A1}$

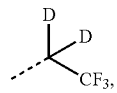

$R^{A2}$

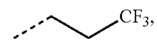

$R^{A3}$

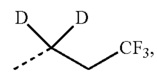

$R^{A4}$

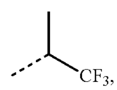

$R^{A5}$

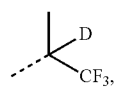

$R^{A6}$

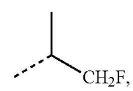

$R^{A7}$

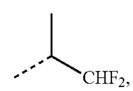

$R^{A8}$

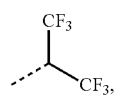

$R^{A9}$

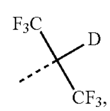

$R^{A10}$

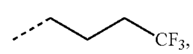

$R^{A11}$

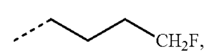

$R^{A12}$

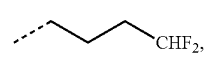

$R^{A13}$

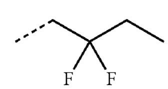

$R^{A14}$

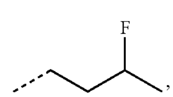

$R^{A15}$

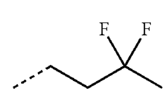

$R^{A16}$

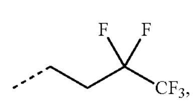

$R^{A17}$

-continued
$R^{A18}$
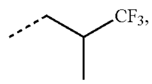
$R^{A19}$
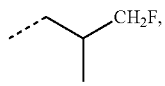
$R^{A20}$
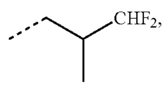
$R^{A21}$
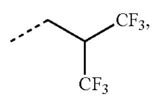
$R^{A22}$
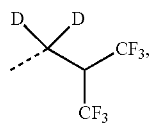
$R^{A23}$
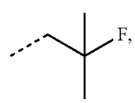
$R^{A24}$
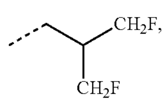
$R^{A25}$
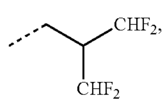
$R^{A26}$
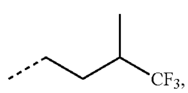
$R^{A27}$
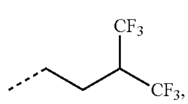
$R^{A28}$
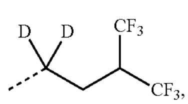
$R^{A29}$
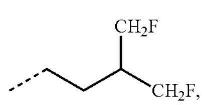
$R^{A30}$
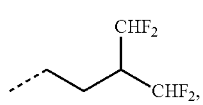
$R^{A31}$
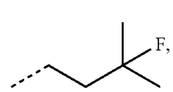
-continued
$R^{A32}$
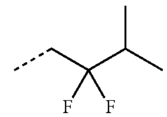
$R^{A33}$
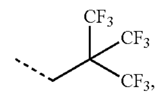
$R^{A34}$
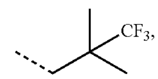
$R^{A35}$
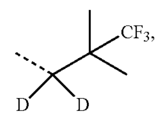
$R^{A36}$
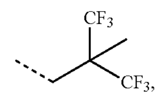
$R^{A37}$
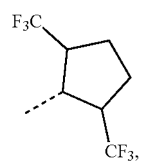
$R^{A38}$
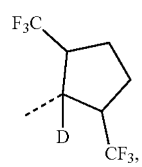
$R^{A39}$
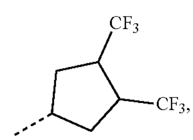
$R^{A40}$
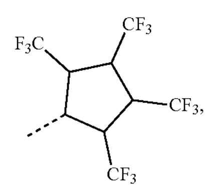
$R^{A41}$
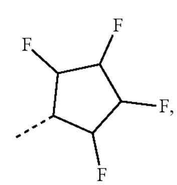
$R^{A42}$
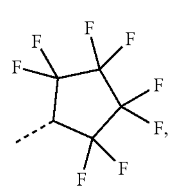

-continued
$R^{A443}$
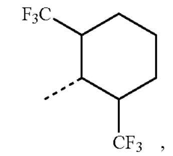
$R^{A444}$
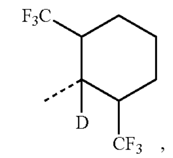
$R^{A445}$
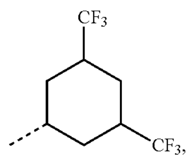
$R^{A446}$
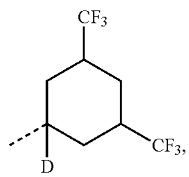
$R^{A447}$
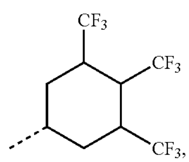
$R^{A448}$
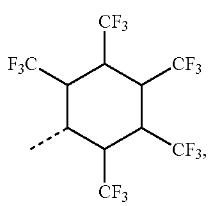
$R^{A449}$
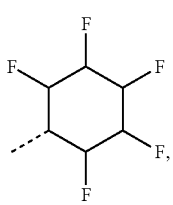
$R^{A450}$
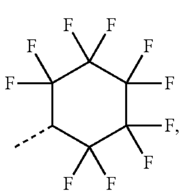
and
$R^{A451}$
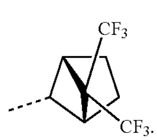
In some embodiments, ligand $L_A$ is selected from the group consisting of:
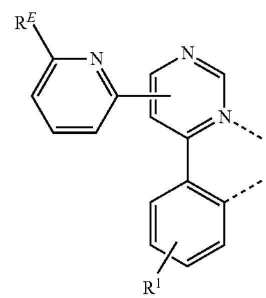
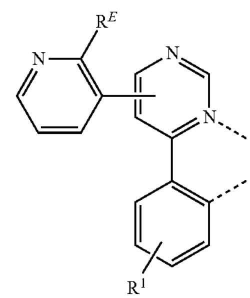
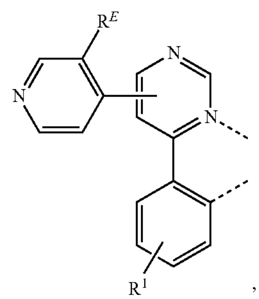
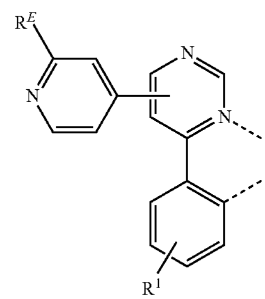
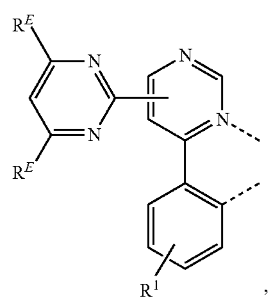
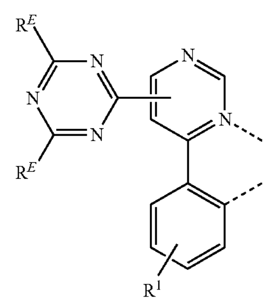
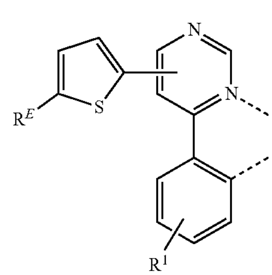
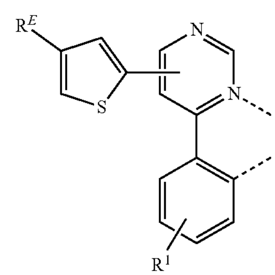
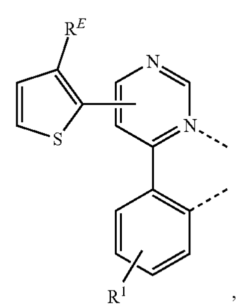
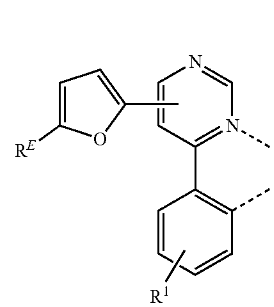

-continued

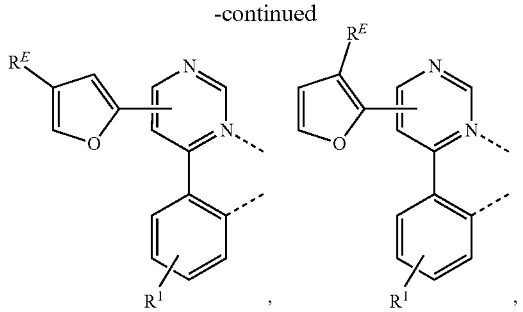

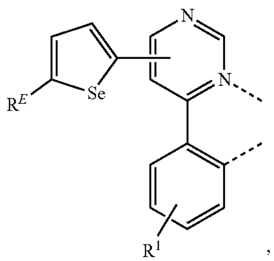

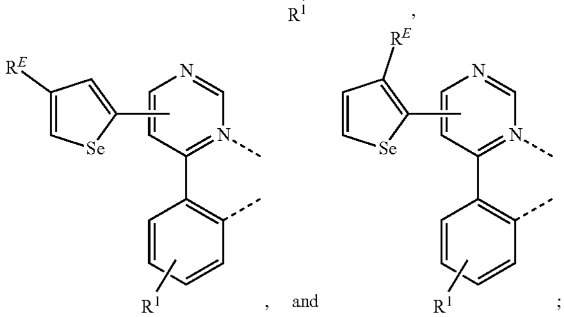

wherein $R^1$ represents mono-, di-, tri, or tetra-substitutions, or no substitution;

wherein each $R^1$ and $R^E$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any adjacent substitutents are optionally joined or fused into a ring.

In some embodiments, ligand $L_A$ is selected from the group consisting of $L_{A1}$ to $L_{A5256}$ defined as follows:

for $L_{A1}$ through $L_{A192}$, $L_A$ has a structure of

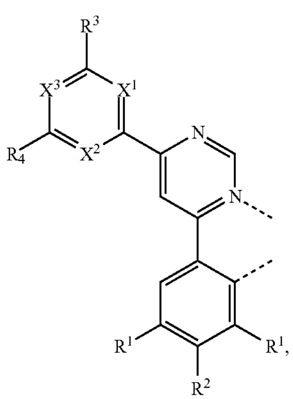

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A1}$ | $R^{B1}$ | $R^{B1}$ | $R^{B1}$ | $R^{B1}$ | N | C | C |
| $L_{A2}$ | $R^{B1}$ | $R^{B1}$ | $R^{B2}$ | $R^{B1}$ | N | C | C |
| $L_{A3}$ | $R^{B1}$ | $R^{B1}$ | $R^{B3}$ | $R^{B1}$ | N | C | C |
| $L_{A4}$ | $R^{B1}$ | $R^{B1}$ | $R^{B4}$ | $R^{B1}$ | N | C | C |
| $L_{A5}$ | $R^{B1}$ | $R^{B1}$ | $R^{B5}$ | $R^{B1}$ | N | C | C |
| $L_{A6}$ | $R^{B1}$ | $R^{B1}$ | $R^{B6}$ | $R^{B1}$ | N | C | C |
| $L_{A7}$ | $R^{B1}$ | $R^{B1}$ | $R^{B7}$ | $R^{B1}$ | N | C | C |
| $L_{A8}$ | $R^{B1}$ | $R^{B1}$ | $R^{B8}$ | $R^{B1}$ | N | C | C |
| $L_{A9}$ | $R^{B1}$ | $R^{B1}$ | $R^{B9}$ | $R^{B1}$ | N | C | C |
| $L_{A10}$ | $R^{B1}$ | $R^{B1}$ | $R^{A2}$ | $R^{B1}$ | N | C | C |
| $L_{A11}$ | $R^{B1}$ | $R^{B1}$ | $R^{A27}$ | $R^{B1}$ | N | C | C |
| $L_{A12}$ | $R^{B1}$ | $R^{B1}$ | $R^{A34}$ | $R^{B1}$ | N | C | C |
| $L_{A13}$ | $R^{B2}$ | $R^{B1}$ | $R^{B1}$ | $R^{B1}$ | N | C | C |
| $L_{A14}$ | $R^{B2}$ | $R^{B1}$ | $R^{B2}$ | $R^{B1}$ | N | C | C |
| $L_{A15}$ | $R^{B2}$ | $R^{B1}$ | $R^{B3}$ | $R^{B1}$ | N | C | C |
| $L_{A16}$ | $R^{B2}$ | $R^{B1}$ | $R^{B4}$ | $R^{B1}$ | N | C | C |
| $L_{A17}$ | $R^{B2}$ | $R^{B1}$ | $R^{B5}$ | $R^{B1}$ | N | C | C |
| $L_{A18}$ | $R^{B2}$ | $R^{B1}$ | $R^{B6}$ | $R^{B1}$ | N | C | C |
| $L_{A19}$ | $R^{B2}$ | $R^{B1}$ | $R^{B7}$ | $R^{B1}$ | N | C | C |
| $L_{A20}$ | $R^{B2}$ | $R^{B1}$ | $R^{B8}$ | $R^{B1}$ | N | C | C |
| $L_{A21}$ | $R^{B2}$ | $R^{B1}$ | $R^{B9}$ | $R^{B1}$ | N | C | C |
| $L_{A22}$ | $R^{B2}$ | $R^{B1}$ | $R^{A2}$ | $R^{B1}$ | N | C | C |
| $L_{A23}$ | $R^{B2}$ | $R^{B1}$ | $R^{A27}$ | $R^{B1}$ | N | C | C |
| $L_{A24}$ | $R^{B2}$ | $R^{B1}$ | $R^{A34}$ | $R^{B1}$ | N | C | C |
| $L_{A25}$ | $R^{B2}$ | F | $R^{B1}$ | $R^{B1}$ | N | C | C |
| $L_{A26}$ | $R^{B2}$ | F | $R^{B2}$ | $R^{B1}$ | N | C | C |
| $L_{A27}$ | $R^{B2}$ | F | $R^{B3}$ | $R^{B1}$ | N | C | C |
| $L_{A28}$ | $R^{B2}$ | F | $R^{B4}$ | $R^{B1}$ | N | C | C |
| $L_{A29}$ | $R^{B2}$ | F | $R^{B5}$ | $R^{B1}$ | N | C | C |
| $L_{A30}$ | $R^{B2}$ | F | $R^{B6}$ | $R^{B1}$ | N | C | C |
| $L_{A31}$ | $R^{B2}$ | F | $R^{B7}$ | $R^{B1}$ | N | C | C |
| $L_{A32}$ | $R^{B2}$ | F | $R^{B8}$ | $R^{B1}$ | N | C | C |
| $L_{A33}$ | $R^{B2}$ | F | $R^{B9}$ | $R^{B1}$ | N | C | C |
| $L_{A34}$ | $R^{B2}$ | F | $R^{A2}$ | $R^{B1}$ | N | C | C |
| $L_{A35}$ | $R^{B2}$ | F | $R^{A27}$ | $R^{B1}$ | N | C | C |
| $L_{A36}$ | $R^{B2}$ | F | $R^{A34}$ | $R^{B1}$ | N | C | C |
| $L_{A37}$ | $R^{B3}$ | $R^{B1}$ | $R^{B1}$ | $R^{B1}$ | N | C | C |
| $L_{A38}$ | $R^{B3}$ | $R^{B1}$ | $R^{B2}$ | $R^{B1}$ | N | C | C |
| $L_{A39}$ | $R^{B3}$ | $R^{B1}$ | $R^{B3}$ | $R^{B1}$ | N | C | C |
| $L_{A40}$ | $R^{B3}$ | $R^{B1}$ | $R^{B4}$ | $R^{B1}$ | N | C | C |
| $L_{A41}$ | $R^{B3}$ | $R^{B1}$ | $R^{B5}$ | $R^{B1}$ | N | C | C |
| $L_{A42}$ | $R^{B3}$ | $R^{B1}$ | $R^{B6}$ | $R^{B1}$ | N | C | C |
| $L_{A43}$ | $R^{B3}$ | $R^{B1}$ | $R^{B7}$ | $R^{B1}$ | N | C | C |
| $L_{A44}$ | $R^{B3}$ | $R^{B1}$ | $R^{B8}$ | $R^{B1}$ | N | C | C |
| $L_{A45}$ | $R^{B3}$ | $R^{B1}$ | $R^{B9}$ | $R^{B1}$ | N | C | C |
| $L_{A46}$ | $R^{B3}$ | $R^{B1}$ | $R^{A2}$ | $R^{B1}$ | N | C | C |
| $L_{A47}$ | $R^{B3}$ | $R^{B1}$ | $R^{A27}$ | $R^{B1}$ | N | C | C |
| $L_{A48}$ | $R^{B3}$ | $R^{B1}$ | $R^{A34}$ | $R^{B1}$ | N | C | C |
| $L_{A49}$ | $R^{B1}$ | $R^{B1}$ | $R^{B1}$ | $R^{B1}$ | N | N | C |
| $L_{A50}$ | $R^{B1}$ | $R^{B1}$ | $R^{B2}$ | $R^{B2}$ | N | N | C |
| $L_{A51}$ | $R^{B1}$ | $R^{B1}$ | $R^{B3}$ | $R^{B3}$ | N | N | C |
| $L_{A52}$ | $R^{B1}$ | $R^{B1}$ | $R^{B4}$ | $R^{B4}$ | N | N | C |
| $L_{A53}$ | $R^{B1}$ | $R^{B1}$ | $R^{B5}$ | $R^{B5}$ | N | N | C |
| $L_{A54}$ | $R^{B1}$ | $R^{B1}$ | $R^{B6}$ | $R^{B6}$ | N | N | C |
| $L_{A55}$ | $R^{B1}$ | $R^{B1}$ | $R^{B7}$ | $R^{B7}$ | N | N | C |
| $L_{A56}$ | $R^{B1}$ | $R^{B1}$ | $R^{B8}$ | $R^{B8}$ | N | N | C |
| $L_{A57}$ | $R^{B1}$ | $R^{B1}$ | $R^{B9}$ | $R^{B9}$ | N | N | C |
| $L_{A58}$ | $R^{B1}$ | $R^{B1}$ | $R^{A2}$ | $R^{A2}$ | N | N | C |
| $L_{A59}$ | $R^{B1}$ | $R^{B1}$ | $R^{A27}$ | $R^{A27}$ | N | N | C |
| $L_{A60}$ | $R^{B1}$ | $R^{B1}$ | $R^{A34}$ | $R^{A34}$ | N | N | C |
| $L_{A61}$ | $R^{B2}$ | $R^{B1}$ | $R^{B1}$ | $R^{B1}$ | N | N | C |
| $L_{A62}$ | $R^{B2}$ | $R^{B1}$ | $R^{B2}$ | $R^{B2}$ | N | N | C |
| $L_{A63}$ | $R^{B2}$ | $R^{B1}$ | $R^{B3}$ | $R^{B3}$ | N | N | C |
| $L_{A64}$ | $R^{B2}$ | $R^{B1}$ | $R^{B4}$ | $R^{B4}$ | N | N | C |
| $L_{A65}$ | $R^{B2}$ | $R^{B1}$ | $R^{B5}$ | $R^{B5}$ | N | N | C |
| $L_{A66}$ | $R^{B2}$ | $R^{B1}$ | $R^{B6}$ | $R^{B6}$ | N | N | C |
| $L_{A67}$ | $R^{B2}$ | $R^{B1}$ | $R^{B7}$ | $R^{B7}$ | N | N | C |
| $L_{A68}$ | $R^{B2}$ | $R^{B1}$ | $R^{B8}$ | $R^{B8}$ | N | N | C |
| $L_{A69}$ | $R^{B2}$ | $R^{B1}$ | $R^{B9}$ | $R^{B9}$ | N | N | C |
| $L_{A70}$ | $R^{B2}$ | $R^{B1}$ | $R^{A2}$ | $R^{A2}$ | N | N | C |
| $L_{A71}$ | $R^{B2}$ | $R^{B1}$ | $R^{A27}$ | $R^{A27}$ | N | N | C |
| $L_{A72}$ | $R^{B2}$ | $R^{B1}$ | $R^{A34}$ | $R^{A34}$ | N | N | C |
| $L_{A73}$ | $R^{B2}$ | F | $R^{B1}$ | $R^{B1}$ | N | N | C |
| $L_{A74}$ | $R^{B2}$ | F | $R^{B2}$ | $R^{B2}$ | N | N | C |
| $L_{A75}$ | $R^{B2}$ | F | $R^{B3}$ | $R^{B3}$ | N | N | C |

-continued

| | $R^1$ | $R^2$ | $R^3$ | $R^4$ | $X^1$ | $X^2$ | $X^3$ |
|---|---|---|---|---|---|---|---|
| $L_{A76}$ | $R^{B2}$ | F | $R^{B4}$ | $R^{B4}$ | N | N | C |
| $L_{A77}$ | $R^{B2}$ | F | $R^{B5}$ | $R^{B5}$ | N | N | C |
| $L_{A78}$ | $R^{B2}$ | F | $R^{B6}$ | $R^{B6}$ | N | N | C |
| $L_{A79}$ | $R^{B2}$ | F | $R^{B7}$ | $R^{B7}$ | N | N | C |
| $L_{A80}$ | $R^{B2}$ | F | $R^{B8}$ | $R^{B8}$ | N | N | C |
| $L_{A81}$ | $R^{B2}$ | F | $R^{B9}$ | $R^{B9}$ | N | N | C |
| $L_{A82}$ | $R^{B2}$ | F | $R^{A2}$ | $R^{A2}$ | N | N | C |
| $L_{A83}$ | $R^{B2}$ | F | $R^{A27}$ | $R^{A27}$ | N | N | C |
| $L_{A84}$ | $R^{B2}$ | F | $R^{A34}$ | $R^{A34}$ | N | N | C |
| $L_{A85}$ | $R^{B3}$ | $R^{B1}$ | $R^{B1}$ | $R^{B1}$ | N | N | C |
| $L_{A86}$ | $R^{B3}$ | $R^{B1}$ | $R^{B2}$ | $R^{B2}$ | N | N | C |
| $L_{A87}$ | $R^{B3}$ | $R^{B1}$ | $R^{B3}$ | $R^{B3}$ | N | N | C |
| $L_{A88}$ | $R^{B3}$ | $R^{B1}$ | $R^{B4}$ | $R^{B4}$ | N | N | C |
| $L_{A89}$ | $R^{B3}$ | $R^{B1}$ | $R^{B5}$ | $R^{B5}$ | N | N | C |
| $L_{A90}$ | $R^{B3}$ | $R^{B1}$ | $R^{B6}$ | $R^{B6}$ | N | N | C |
| $L_{A91}$ | $R^{B3}$ | $R^{B1}$ | $R^{B7}$ | $R^{B7}$ | N | N | C |
| $L_{A92}$ | $R^{B3}$ | $R^{B1}$ | $R^{B8}$ | $R^{B8}$ | N | N | C |
| $L_{A93}$ | $R^{B3}$ | $R^{B1}$ | $R^{B9}$ | $R^{B9}$ | N | N | C |
| $L_{A94}$ | $R^{B3}$ | $R^{B1}$ | $R^{A2}$ | $R^{A2}$ | N | N | C |
| $L_{A95}$ | $R^{B3}$ | $R^{B1}$ | $R^{A27}$ | $R^{A27}$ | N | N | C |
| $L_{A96}$ | $R^{B3}$ | $R^{B1}$ | $R^{A34}$ | $R^{A34}$ | N | N | C |
| $L_{A97}$ | $R^{B1}$ | $R^{B1}$ | $R^{B1}$ | $R^{B1}$ | N | N | N |
| $L_{A98}$ | $R^{B1}$ | $R^{B1}$ | $R^{B2}$ | $R^{B2}$ | N | N | N |
| $L_{A99}$ | $R^{B1}$ | $R^{B1}$ | $R^{B3}$ | $R^{B3}$ | N | N | N |
| $L_{A100}$ | $R^{B1}$ | $R^{B1}$ | $R^{B4}$ | $R^{B4}$ | N | N | N |
| $L_{A101}$ | $R^{B1}$ | $R^{B1}$ | $R^{B5}$ | $R^{B5}$ | N | N | N |
| $L_{A102}$ | $R^{B1}$ | $R^{B1}$ | $R^{B6}$ | $R^{B6}$ | N | N | N |
| $L_{A103}$ | $R^{B1}$ | $R^{B1}$ | $R^{B7}$ | $R^{B7}$ | N | N | N |
| $L_{A104}$ | $R^{B1}$ | $R^{B1}$ | $R^{B8}$ | $R^{B8}$ | N | N | N |
| $L_{A105}$ | $R^{B1}$ | $R^{B1}$ | $R^{B9}$ | $R^{B9}$ | N | N | N |
| $L_{A106}$ | $R^{B1}$ | $R^{B1}$ | $R^{A2}$ | $R^{A2}$ | N | N | N |
| $L_{A107}$ | $R^{B1}$ | $R^{B1}$ | $R^{A27}$ | $R^{A27}$ | N | N | N |
| $L_{A108}$ | $R^{B1}$ | $R^{B1}$ | $R^{A34}$ | $R^{A34}$ | N | N | N |
| $L_{A109}$ | $R^{B2}$ | $R^{B1}$ | $R^{B1}$ | $R^{B1}$ | N | N | N |
| $L_{A110}$ | $R^{B2}$ | $R^{B1}$ | $R^{B2}$ | $R^{B2}$ | N | N | N |
| $L_{A111}$ | $R^{B2}$ | $R^{B1}$ | $R^{B3}$ | $R^{B3}$ | N | N | N |
| $L_{A112}$ | $R^{B2}$ | $R^{B1}$ | $R^{B4}$ | $R^{B4}$ | N | N | N |
| $L_{A113}$ | $R^{B2}$ | $R^{B1}$ | $R^{B5}$ | $R^{B5}$ | N | N | N |
| $L_{A114}$ | $R^{B2}$ | $R^{B1}$ | $R^{B6}$ | $R^{B6}$ | N | N | N |
| $L_{A115}$ | $R^{B2}$ | $R^{B1}$ | $R^{B7}$ | $R^{B7}$ | N | N | N |
| $L_{A116}$ | $R^{B2}$ | $R^{B1}$ | $R^{B8}$ | $R^{B8}$ | N | N | N |
| $L_{A117}$ | $R^{B2}$ | $R^{B1}$ | $R^{B9}$ | $R^{B9}$ | N | N | N |
| $L_{A118}$ | $R^{B2}$ | $R^{B1}$ | $R^{A2}$ | $R^{A2}$ | N | N | N |
| $L_{A119}$ | $R^{B2}$ | $R^{B1}$ | $R^{A27}$ | $R^{A27}$ | N | N | N |
| $L_{A120}$ | $R^{B2}$ | $R^{B1}$ | $R^{A34}$ | $R^{A34}$ | N | N | N |
| $L_{A121}$ | $R^{B2}$ | F | $R^{B1}$ | $R^{B1}$ | N | N | N |
| $L_{A122}$ | $R^{B2}$ | F | $R^{B2}$ | $R^{B2}$ | N | N | N |
| $L_{A123}$ | $R^{B2}$ | F | $R^{B3}$ | $R^{B3}$ | N | N | N |
| $L_{A124}$ | $R^{B2}$ | F | $R^{B4}$ | $R^{B4}$ | N | N | N |
| $L_{A125}$ | $R^{B2}$ | F | $R^{B5}$ | $R^{B5}$ | N | N | N |
| $L_{A126}$ | $R^{B2}$ | F | $R^{B6}$ | $R^{B6}$ | N | N | N |
| $L_{A127}$ | $R^{B2}$ | F | $R^{B7}$ | $R^{B7}$ | N | N | N |
| $L_{A128}$ | $R^{B2}$ | F | $R^{B8}$ | $R^{B8}$ | N | N | N |
| $L_{A129}$ | $R^{B2}$ | F | $R^{B9}$ | $R^{B9}$ | N | N | N |
| $L_{A130}$ | $R^{B2}$ | F | $R^{A2}$ | $R^{A2}$ | N | N | N |
| $L_{A131}$ | $R^{B2}$ | F | $R^{A27}$ | $R^{A27}$ | N | N | N |
| $L_{A132}$ | $R^{B2}$ | F | $R^{A34}$ | $R^{A34}$ | N | N | N |
| $L_{A133}$ | $R^{B3}$ | $R^{B1}$ | $R^{B1}$ | $R^{B1}$ | N | N | N |
| $L_{A134}$ | $R^{B3}$ | $R^{B1}$ | $R^{B2}$ | $R^{B2}$ | N | N | N |
| $L_{A135}$ | $R^{B3}$ | $R^{B1}$ | $R^{B3}$ | $R^{B3}$ | N | N | N |
| $L_{A136}$ | $R^{B3}$ | $R^{B1}$ | $R^{B4}$ | $R^{B4}$ | N | N | N |
| $L_{A137}$ | $R^{B3}$ | $R^{B1}$ | $R^{B5}$ | $R^{B5}$ | N | N | N |
| $L_{A138}$ | $R^{B3}$ | $R^{B1}$ | $R^{B6}$ | $R^{B6}$ | N | N | N |
| $L_{A139}$ | $R^{B3}$ | $R^{B1}$ | $R^{B7}$ | $R^{B7}$ | N | N | N |
| $L_{A140}$ | $R^{B3}$ | $R^{B1}$ | $R^{B8}$ | $R^{B8}$ | N | N | N |
| $L_{A141}$ | $R^{B3}$ | $R^{B1}$ | $R^{B9}$ | $R^{B9}$ | N | N | N |
| $L_{A142}$ | $R^{B3}$ | $R^{B1}$ | $R^{A2}$ | $R^{A2}$ | N | N | N |
| $L_{A143}$ | $R^{B3}$ | $R^{B1}$ | $R^{A27}$ | $R^{A27}$ | N | N | N |
| $L_{A144}$ | $R^{B3}$ | $R^{B1}$ | $R^{A34}$ | $R^{A34}$ | N | N | N |
| $L_{A145}$ | $R^{B1}$ | $R^{B1}$ | $R^{B1}$ | $R^{B1}$ | C | C | N |
| $L_{A146}$ | $R^{B1}$ | $R^{B1}$ | $R^{B2}$ | $R^{B2}$ | C | C | N |
| $L_{A147}$ | $R^{B1}$ | $R^{B1}$ | $R^{B3}$ | $R^{B3}$ | C | C | N |
| $L_{A148}$ | $R^{B1}$ | $R^{B1}$ | $R^{B4}$ | $R^{B4}$ | C | C | N |
| $L_{A149}$ | $R^{B1}$ | $R^{B1}$ | $R^{B5}$ | $R^{B5}$ | C | C | N |
| $L_{A150}$ | $R^{B1}$ | $R^{B1}$ | $R^{B6}$ | $R^{B6}$ | C | C | N |
| $L_{A151}$ | $R^{B1}$ | $R^{B1}$ | $R^{B7}$ | $R^{B7}$ | C | C | N |
| $L_{A152}$ | $R^{B1}$ | $R^{B1}$ | $R^{B8}$ | $R^{B8}$ | C | C | N |
| $L_{A153}$ | $R^{B1}$ | $R^{B1}$ | $R^{B9}$ | $R^{B9}$ | C | C | N |
| $L_{A154}$ | $R^{B1}$ | $R^{B1}$ | $R^{A2}$ | $R^{A2}$ | C | C | N |
| $L_{A155}$ | $R^{B1}$ | $R^{B1}$ | $R^{A27}$ | $R^{A27}$ | C | C | N |
| $L_{A156}$ | $R^{B1}$ | $R^{B1}$ | $R^{A34}$ | $R^{A34}$ | C | C | N |
| $L_{A157}$ | $R^{B2}$ | $R^{B1}$ | $R^{B1}$ | $R^{B1}$ | C | C | N |
| $L_{A158}$ | $R^{B2}$ | $R^{B1}$ | $R^{B2}$ | $R^{B2}$ | C | C | N |
| $L_{A159}$ | $R^{B2}$ | $R^{B1}$ | $R^{B3}$ | $R^{B3}$ | C | C | N |
| $L_{A160}$ | $R^{B2}$ | $R^{B1}$ | $R^{B4}$ | $R^{B4}$ | C | C | N |
| $L_{A161}$ | $R^{B2}$ | $R^{B1}$ | $R^{B5}$ | $R^{B5}$ | C | C | N |
| $L_{A162}$ | $R^{B2}$ | $R^{B1}$ | $R^{B6}$ | $R^{B6}$ | C | C | N |
| $L_{A163}$ | $R^{B2}$ | $R^{B1}$ | $R^{B7}$ | $R^{B7}$ | C | C | N |
| $L_{A164}$ | $R^{B2}$ | $R^{B1}$ | $R^{B8}$ | $R^{B8}$ | C | C | N |
| $L_{A165}$ | $R^{B2}$ | $R^{B1}$ | $R^{B9}$ | $R^{B9}$ | C | C | N |
| $L_{A166}$ | $R^{B2}$ | $R^{B1}$ | $R^{A2}$ | $R^{A2}$ | C | C | N |
| $L_{A167}$ | $R^{B2}$ | $R^{B1}$ | $R^{A27}$ | $R^{A27}$ | C | C | N |
| $L_{A168}$ | $R^{B2}$ | $R^{B1}$ | $R^{A34}$ | $R^{A34}$ | C | C | N |
| $L_{A169}$ | $R^{B2}$ | F | $R^{B1}$ | $R^{B1}$ | C | C | N |
| $L_{A170}$ | $R^{B2}$ | F | $R^{B2}$ | $R^{B2}$ | C | C | N |
| $L_{A171}$ | $R^{B2}$ | F | $R^{B3}$ | $R^{B3}$ | C | C | N |
| $L_{A172}$ | $R^{B2}$ | F | $R^{B4}$ | $R^{B4}$ | C | C | N |
| $L_{A173}$ | $R^{B2}$ | F | $R^{B5}$ | $R^{B5}$ | C | C | N |
| $L_{A174}$ | $R^{B2}$ | F | $R^{B6}$ | $R^{B6}$ | C | C | N |
| $L_{A175}$ | $R^{B2}$ | F | $R^{B7}$ | $R^{B7}$ | C | C | N |
| $L_{A176}$ | $R^{B2}$ | F | $R^{B8}$ | $R^{B8}$ | C | C | N |
| $L_{A177}$ | $R^{B2}$ | F | $R^{B9}$ | $R^{B9}$ | C | C | N |
| $L_{A178}$ | $R^{B2}$ | F | $R^{A2}$ | $R^{A2}$ | C | C | N |
| $L_{A179}$ | $R^{B2}$ | F | $R^{A27}$ | $R^{A27}$ | C | C | N |
| $L_{A180}$ | $R^{B2}$ | F | $R^{A34}$ | $R^{A34}$ | C | C | N |
| $L_{A181}$ | $R^{B3}$ | $R^{B1}$ | $R^{B1}$ | $R^{B1}$ | C | C | N |
| $L_{A182}$ | $R^{B3}$ | $R^{B1}$ | $R^{B2}$ | $R^{B2}$ | C | C | N |
| $L_{A183}$ | $R^{B3}$ | $R^{B1}$ | $R^{B3}$ | $R^{B3}$ | C | C | N |
| $L_{A184}$ | $R^{B3}$ | $R^{B1}$ | $R^{B4}$ | $R^{B4}$ | C | C | N |
| $L_{A185}$ | $R^{B3}$ | $R^{B1}$ | $R^{B5}$ | $R^{B5}$ | C | C | N |
| $L_{A186}$ | $R^{B3}$ | $R^{B1}$ | $R^{B6}$ | $R^{B6}$ | C | C | N |
| $L_{A187}$ | $R^{B3}$ | $R^{B1}$ | $R^{B7}$ | $R^{B7}$ | C | C | N |
| $L_{A188}$ | $R^{B3}$ | $R^{B1}$ | $R^{B8}$ | $R^{B8}$ | C | C | N |
| $L_{A189}$ | $R^{B3}$ | $R^{B1}$ | $R^{B9}$ | $R^{B9}$ | C | C | N |
| $L_{A190}$ | $R^{B3}$ | $R^{B1}$ | $R^{A2}$ | $R^{A2}$ | C | C | N |
| $L_{A191}$ | $R^{B3}$ | $R^{B1}$ | $R^{A27}$ | $R^{A27}$ | C | C | N |
| $L_{A192}$ | $R^{B3}$ | $R^{B1}$ | $R^{A34}$ | $R^{A34}$ | C | C | N |

for $L_{A193}$ through $L_{A376}$, $L_A$ has a structure of

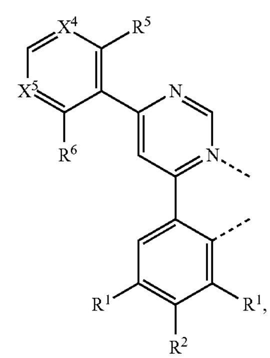

wherein $R^1$, $R^2$, $R^5$, $R^6$, $X^4$, and $X^5$ are defined as provided below,

| | $R^1$ | $R^2$ | $R^5$ | $R^6$ | $X^4$ | $X^5$ |
|---|---|---|---|---|---|---|
| $L_{A193}$ | $R^{B1}$ | $R^{B1}$ | $R^{B1}$ | $R^{B1}$ | N | C |
| $L_{A194}$ | $R^{B1}$ | $R^{B1}$ | $R^{B2}$ | $R^{B1}$ | N | C |
| $L_{A195}$ | $R^{B1}$ | $R^{B1}$ | $R^{B3}$ | $R^{B1}$ | N | C |
| $L_{A196}$ | $R^{B1}$ | $R^{B1}$ | $R^{B4}$ | $R^{B1}$ | N | C |
| $L_{A197}$ | $R^{B1}$ | $R^{B1}$ | $R^{B5}$ | $R^{B1}$ | N | C |
| $L_{A198}$ | $R^{B1}$ | $R^{B1}$ | $R^{B6}$ | $R^{B1}$ | N | C |
| $L_{A199}$ | $R^{B1}$ | $R^{B1}$ | $R^{B7}$ | $R^{B1}$ | N | C |

-continued

| | $R^1$ | $R^2$ | $R^5$ | $R^6$ | $X^4$ | $X^5$ |
|---|---|---|---|---|---|---|
| $L_{A200}$ | $R^{B1}$ | $R^{B1}$ | $R^{B8}$ | $R^{B1}$ | N | C |
| $L_{A201}$ | $R^{B1}$ | $R^{B1}$ | $R^{B9}$ | $R^{B1}$ | N | C |
| $L_{A202}$ | $R^{B1}$ | $R^{B1}$ | $R^{A2}$ | $R^{B1}$ | N | C |
| $L_{A203}$ | $R^{B1}$ | $R^{B1}$ | $R^{A27}$ | $R^{B1}$ | N | C |
| $L_{A204}$ | $R^{B1}$ | $R^{B1}$ | $R^{A34}$ | $R^{B1}$ | N | C |
| $L_{A205}$ | $R^{B2}$ | $R^{B1}$ | $R^{B1}$ | $R^{B1}$ | N | C |
| $L_{A206}$ | $R^{B2}$ | $R^{B1}$ | $R^{B2}$ | $R^{B1}$ | N | C |
| $L_{A207}$ | $R^{B2}$ | $R^{B1}$ | $R^{B3}$ | $R^{B1}$ | N | C |
| $L_{A208}$ | $R^{B2}$ | $R^{B1}$ | $R^{B4}$ | $R^{B1}$ | N | C |
| $L_{A209}$ | $R^{B2}$ | $R^{B1}$ | $R^{B5}$ | $R^{B1}$ | N | C |
| $L_{A210}$ | $R^{B2}$ | $R^{B1}$ | $R^{B6}$ | $R^{B1}$ | N | C |
| $L_{A211}$ | $R^{B2}$ | $R^{B1}$ | $R^{B7}$ | $R^{B1}$ | N | C |
| $L_{A212}$ | $R^{B2}$ | $R^{B1}$ | $R^{B8}$ | $R^{B1}$ | N | C |
| $L_{A213}$ | $R^{B2}$ | $R^{B1}$ | $R^{B9}$ | $R^{B1}$ | N | C |
| $L_{A214}$ | $R^{B2}$ | $R^{B1}$ | $R^{A2}$ | $R^{B1}$ | N | C |
| $L_{A215}$ | $R^{B2}$ | $R^{B1}$ | $R^{A27}$ | $R^{B1}$ | N | C |
| $L_{A216}$ | $R^{B2}$ | $R^{B1}$ | $R^{A34}$ | $R^{B1}$ | N | C |
| $L_{A217}$ | $R^{B2}$ | F | $R^{B1}$ | $R^{B1}$ | N | C |
| $L_{A218}$ | $R^{B2}$ | F | $R^{B2}$ | $R^{B1}$ | N | C |
| $L_{A219}$ | $R^{B2}$ | F | $R^{B3}$ | $R^{B1}$ | N | C |
| $L_{A220}$ | $R^{B2}$ | F | $R^{B4}$ | $R^{B1}$ | N | C |
| $L_{A221}$ | $R^{B2}$ | F | $R^{B5}$ | $R^{B1}$ | N | C |
| $L_{A222}$ | $R^{B2}$ | F | $R^{B6}$ | $R^{B1}$ | N | C |
| $L_{A223}$ | $R^{B2}$ | F | $R^{B7}$ | $R^{B1}$ | N | C |
| $L_{A224}$ | $R^{B2}$ | F | $R^{B8}$ | $R^{B1}$ | N | C |
| $L_{A225}$ | $R^{B2}$ | F | $R^{B9}$ | $R^{B1}$ | N | C |
| $L_{A226}$ | $R^{B2}$ | F | $R^{A2}$ | $R^{B1}$ | N | C |
| $L_{A227}$ | $R^{B2}$ | F | $R^{A27}$ | $R^{B1}$ | N | C |
| $L_{A228}$ | $R^{B2}$ | F | $R^{A34}$ | $R^{B1}$ | N | C |
| $L_{A229}$ | $R^{B3}$ | $R^{B1}$ | $R^{B1}$ | $R^{B1}$ | N | C |
| $L_{A230}$ | $R^{B3}$ | $R^{B1}$ | $R^{B2}$ | $R^{B1}$ | N | C |
| $L_{A231}$ | $R^{B3}$ | $R^{B1}$ | $R^{B3}$ | $R^{B1}$ | N | C |
| $L_{A232}$ | $R^{B3}$ | $R^{B1}$ | $R^{B4}$ | $R^{B1}$ | N | C |
| $L_{A233}$ | $R^{B3}$ | $R^{B1}$ | $R^{B5}$ | $R^{B1}$ | N | C |
| $L_{A234}$ | $R^{B3}$ | $R^{B1}$ | $R^{B6}$ | $R^{B1}$ | N | C |
| $L_{A235}$ | $R^{B3}$ | $R^{B1}$ | $R^{B7}$ | $R^{B1}$ | N | C |
| $L_{A236}$ | $R^{B3}$ | $R^{B1}$ | $R^{B8}$ | $R^{B1}$ | N | C |
| $L_{A237}$ | $R^{B3}$ | $R^{B1}$ | $R^{B9}$ | $R^{B1}$ | N | C |
| $L_{A238}$ | $R^{B3}$ | $R^{B1}$ | $R^{A2}$ | $R^{B1}$ | N | C |
| $L_{A239}$ | $R^{B3}$ | $R^{B1}$ | $R^{A27}$ | $R^{B1}$ | N | C |
| $L_{A240}$ | $R^{B3}$ | $R^{B1}$ | $R^{A34}$ | $R^{B1}$ | N | C |
| $L_{A241}$ | $R^{B1}$ | $R^{B1}$ | $R^{B2}$ | $R^{B2}$ | N | C |
| $L_{A242}$ | $R^{B1}$ | $R^{B1}$ | $R^{B3}$ | $R^{B3}$ | N | C |
| $L_{A243}$ | $R^{B1}$ | $R^{B1}$ | $R^{B4}$ | $R^{B4}$ | N | C |
| $L_{A244}$ | $R^{B1}$ | $R^{B1}$ | $R^{B5}$ | $R^{B5}$ | N | C |
| $L_{A245}$ | $R^{B1}$ | $R^{B1}$ | $R^{B6}$ | $R^{B6}$ | N | C |
| $L_{A246}$ | $R^{B1}$ | $R^{B1}$ | $R^{B7}$ | $R^{B7}$ | N | C |
| $L_{A247}$ | $R^{B1}$ | $R^{B1}$ | $R^{B8}$ | $R^{B8}$ | N | C |
| $L_{A248}$ | $R^{B1}$ | $R^{B1}$ | $R^{B9}$ | $R^{B9}$ | N | C |
| $L_{A249}$ | $R^{B1}$ | $R^{B1}$ | $R^{A2}$ | $R^{A2}$ | N | C |
| $L_{A250}$ | $R^{B1}$ | $R^{B1}$ | $R^{A27}$ | $R^{A27}$ | N | C |
| $L_{A251}$ | $R^{B1}$ | $R^{B1}$ | $R^{A34}$ | $R^{A34}$ | N | C |
| $L_{A252}$ | $R^{B2}$ | $R^{B1}$ | $R^{B2}$ | $R^{B2}$ | N | C |
| $L_{A253}$ | $R^{B2}$ | $R^{B1}$ | $R^{B3}$ | $R^{B3}$ | N | C |
| $L_{A254}$ | $R^{B2}$ | $R^{B1}$ | $R^{B4}$ | $R^{B4}$ | N | C |
| $L_{A255}$ | $R^{B2}$ | $R^{B1}$ | $R^{B5}$ | $R^{B5}$ | N | C |
| $L_{A256}$ | $R^{B2}$ | $R^{B1}$ | $R^{B6}$ | $R^{B6}$ | N | C |
| $L_{A257}$ | $R^{B2}$ | $R^{B1}$ | $R^{B7}$ | $R^{B7}$ | N | C |
| $L_{A258}$ | $R^{B2}$ | $R^{B1}$ | $R^{B8}$ | $R^{B8}$ | N | C |
| $L_{A259}$ | $R^{B2}$ | $R^{B1}$ | $R^{B9}$ | $R^{B9}$ | N | C |
| $L_{A260}$ | $R^{B2}$ | $R^{B1}$ | $R^{A2}$ | $R^{A2}$ | N | C |
| $L_{A261}$ | $R^{B2}$ | $R^{B1}$ | $R^{A27}$ | $R^{A27}$ | N | C |
| $L_{A262}$ | $R^{B2}$ | $R^{B1}$ | $R^{A34}$ | $R^{A34}$ | N | C |
| $L_{A263}$ | $R^{B2}$ | F | $R^{B2}$ | $R^{B2}$ | N | C |
| $L_{A264}$ | $R^{B2}$ | F | $R^{B3}$ | $R^{B3}$ | N | C |
| $L_{A265}$ | $R^{B2}$ | F | $R^{B4}$ | $R^{B4}$ | N | C |
| $L_{A266}$ | $R^{B2}$ | F | $R^{B5}$ | $R^{B5}$ | N | C |
| $L_{A267}$ | $R^{B2}$ | F | $R^{B6}$ | $R^{B6}$ | N | C |
| $L_{A268}$ | $R^{B2}$ | F | $R^{B7}$ | $R^{B7}$ | N | C |
| $L_{A269}$ | $R^{B2}$ | F | $R^{B8}$ | $R^{B8}$ | N | C |
| $L_{A270}$ | $R^{B2}$ | F | $R^{B9}$ | $R^{B9}$ | N | C |
| $L_{A271}$ | $R^{B2}$ | F | $R^{A2}$ | $R^{A2}$ | N | C |
| $L_{A272}$ | $R^{B2}$ | F | $R^{A27}$ | $R^{A27}$ | N | C |
| $L_{A273}$ | $R^{B2}$ | F | $R^{A34}$ | $R^{A34}$ | N | C |
| $L_{A274}$ | $R^{B3}$ | $R^{B1}$ | $R^{B2}$ | $R^{B2}$ | N | C |
| $L_{A275}$ | $R^{B3}$ | $R^{B1}$ | $R^{B3}$ | $R^{B3}$ | N | C |
| $L_{A276}$ | $R^{B3}$ | $R^{B1}$ | $R^{B4}$ | $R^{B4}$ | N | C |
| $L_{A277}$ | $R^{B3}$ | $R^{B1}$ | $R^{B5}$ | $R^{B5}$ | N | C |
| $L_{A278}$ | $R^{B3}$ | $R^{B1}$ | $R^{B6}$ | $R^{B6}$ | N | C |
| $L_{A279}$ | $R^{B3}$ | $R^{B1}$ | $R^{B7}$ | $R^{B7}$ | N | C |
| $L_{A280}$ | $R^{B3}$ | $R^{B1}$ | $R^{B8}$ | $R^{B8}$ | N | C |
| $L_{A281}$ | $R^{B3}$ | $R^{B1}$ | $R^{B9}$ | $R^{B9}$ | N | C |
| $L_{A282}$ | $R^{B3}$ | $R^{B1}$ | $R^{A2}$ | $R^{A2}$ | N | C |
| $L_{A283}$ | $R^{B3}$ | $R^{B1}$ | $R^{A27}$ | $R^{A27}$ | N | C |
| $L_{A284}$ | $R^{B3}$ | $R^{B1}$ | $R^{A34}$ | $R^{A34}$ | N | C |
| $L_{A285}$ | $R^{B1}$ | $R^{B1}$ | $R^{B1}$ | $R^{B1}$ | N | N |
| $L_{A286}$ | $R^{B1}$ | $R^{B1}$ | $R^{B2}$ | $R^{B1}$ | N | N |
| $L_{A287}$ | $R^{B1}$ | $R^{B1}$ | $R^{B3}$ | $R^{B1}$ | N | N |
| $L_{A288}$ | $R^{B1}$ | $R^{B1}$ | $R^{B4}$ | $R^{B1}$ | N | N |
| $L_{A289}$ | $R^{B1}$ | $R^{B1}$ | $R^{B5}$ | $R^{B1}$ | N | N |
| $L_{A290}$ | $R^{B1}$ | $R^{B1}$ | $R^{B6}$ | $R^{B1}$ | N | N |
| $L_{A291}$ | $R^{B1}$ | $R^{B1}$ | $R^{B7}$ | $R^{B1}$ | N | N |
| $L_{A292}$ | $R^{B1}$ | $R^{B1}$ | $R^{B8}$ | $R^{B1}$ | N | N |
| $L_{A293}$ | $R^{B1}$ | $R^{B1}$ | $R^{B9}$ | $R^{B1}$ | N | N |
| $L_{A294}$ | $R^{B1}$ | $R^{B1}$ | $R^{A2}$ | $R^{B1}$ | N | N |
| $L_{A295}$ | $R^{B1}$ | $R^{B1}$ | $R^{A27}$ | $R^{B1}$ | N | N |
| $L_{A296}$ | $R^{B1}$ | $R^{B1}$ | $R^{A34}$ | $R^{B1}$ | N | N |
| $L_{A297}$ | $R^{B2}$ | $R^{B1}$ | $R^{B1}$ | $R^{B1}$ | N | N |
| $L_{A298}$ | $R^{B2}$ | $R^{B1}$ | $R^{B2}$ | $R^{B1}$ | N | N |
| $L_{A299}$ | $R^{B2}$ | $R^{B1}$ | $R^{B3}$ | $R^{B1}$ | N | N |
| $L_{A300}$ | $R^{B2}$ | $R^{B1}$ | $R^{B4}$ | $R^{B1}$ | N | N |
| $L_{A301}$ | $R^{B2}$ | $R^{B1}$ | $R^{B5}$ | $R^{B1}$ | N | N |
| $L_{A302}$ | $R^{B2}$ | $R^{B1}$ | $R^{B6}$ | $R^{B1}$ | N | N |
| $L_{A303}$ | $R^{B2}$ | $R^{B1}$ | $R^{B7}$ | $R^{B1}$ | N | N |
| $L_{A304}$ | $R^{B2}$ | $R^{B1}$ | $R^{B8}$ | $R^{B1}$ | N | N |
| $L_{A305}$ | $R^{B2}$ | $R^{B1}$ | $R^{B9}$ | $R^{B1}$ | N | N |
| $L_{A306}$ | $R^{B2}$ | $R^{B1}$ | $R^{A2}$ | $R^{B1}$ | N | N |
| $L_{A307}$ | $R^{B2}$ | $R^{B1}$ | $R^{A27}$ | $R^{B1}$ | N | N |
| $L_{A308}$ | $R^{B2}$ | $R^{B1}$ | $R^{A34}$ | $R^{B1}$ | N | N |
| $L_{A309}$ | $R^{B2}$ | F | $R^{B1}$ | $R^{B1}$ | N | N |
| $L_{A310}$ | $R^{B2}$ | F | $R^{B2}$ | $R^{B1}$ | N | N |
| $L_{A311}$ | $R^{B2}$ | F | $R^{B3}$ | $R^{B1}$ | N | N |
| $L_{A312}$ | $R^{B2}$ | F | $R^{B4}$ | $R^{B1}$ | N | N |
| $L_{A313}$ | $R^{B2}$ | F | $R^{B5}$ | $R^{B1}$ | N | N |
| $L_{A314}$ | $R^{B2}$ | F | $R^{B6}$ | $R^{B1}$ | N | N |
| $L_{A315}$ | $R^{B2}$ | F | $R^{B7}$ | $R^{B1}$ | N | N |
| $L_{A316}$ | $R^{B2}$ | F | $R^{B8}$ | $R^{B1}$ | N | N |
| $L_{A317}$ | $R^{B2}$ | F | $R^{B9}$ | $R^{B1}$ | N | N |
| $L_{A318}$ | $R^{B2}$ | F | $R^{A2}$ | $R^{B1}$ | N | N |
| $L_{A319}$ | $R^{B2}$ | F | $R^{A27}$ | $R^{B1}$ | N | N |
| $L_{A320}$ | $R^{B2}$ | F | $R^{A34}$ | $R^{B1}$ | N | N |
| $L_{A321}$ | $R^{B3}$ | $R^{B1}$ | $R^{B1}$ | $R^{B1}$ | N | N |
| $L_{A322}$ | $R^{B3}$ | $R^{B1}$ | $R^{B2}$ | $R^{B1}$ | N | N |
| $L_{A323}$ | $R^{B3}$ | $R^{B1}$ | $R^{B3}$ | $R^{B1}$ | N | N |
| $L_{A324}$ | $R^{B3}$ | $R^{B1}$ | $R^{B4}$ | $R^{B1}$ | N | N |
| $L_{A325}$ | $R^{B3}$ | $R^{B1}$ | $R^{B5}$ | $R^{B1}$ | N | N |
| $L_{A326}$ | $R^{B3}$ | $R^{B1}$ | $R^{B6}$ | $R^{B1}$ | N | N |
| $L_{A327}$ | $R^{B3}$ | $R^{B1}$ | $R^{B7}$ | $R^{B1}$ | N | N |
| $L_{A328}$ | $R^{B3}$ | $R^{B1}$ | $R^{B8}$ | $R^{B1}$ | N | N |
| $L_{A329}$ | $R^{B3}$ | $R^{B1}$ | $R^{B9}$ | $R^{B1}$ | N | N |
| $L_{A330}$ | $R^{B3}$ | $R^{B1}$ | $R^{A2}$ | $R^{B1}$ | N | N |
| $L_{A331}$ | $R^{B3}$ | $R^{B1}$ | $R^{A27}$ | $R^{B1}$ | N | N |
| $L_{A332}$ | $R^{B3}$ | $R^{B1}$ | $R^{A34}$ | $R^{B1}$ | N | N |
| $L_{A333}$ | $R^{B1}$ | $R^{B1}$ | $R^{B2}$ | $R^{B2}$ | N | N |
| $L_{A334}$ | $R^{B1}$ | $R^{B1}$ | $R^{B3}$ | $R^{B3}$ | N | N |
| $L_{A335}$ | $R^{B1}$ | $R^{B1}$ | $R^{B4}$ | $R^{B4}$ | N | N |
| $L_{A336}$ | $R^{B1}$ | $R^{B1}$ | $R^{B5}$ | $R^{B5}$ | N | N |
| $L_{A337}$ | $R^{B1}$ | $R^{B1}$ | $R^{B6}$ | $R^{B6}$ | N | N |
| $L_{A338}$ | $R^{B1}$ | $R^{B1}$ | $R^{B7}$ | $R^{B7}$ | N | N |
| $L_{A339}$ | $R^{B1}$ | $R^{B1}$ | $R^{B8}$ | $R^{B8}$ | N | N |
| $L_{A340}$ | $R^{B1}$ | $R^{B1}$ | $R^{B9}$ | $R^{B9}$ | N | N |
| $L_{A341}$ | $R^{B1}$ | $R^{B1}$ | $R^{A2}$ | $R^{A2}$ | N | N |
| $L_{A342}$ | $R^{B1}$ | $R^{B1}$ | $R^{A27}$ | $R^{A27}$ | N | N |
| $L_{A343}$ | $R^{B1}$ | $R^{B1}$ | $R^{A34}$ | $R^{A34}$ | N | N |
| $L_{A344}$ | $R^{B2}$ | $R^{B1}$ | $R^{B2}$ | $R^{B2}$ | N | N |
| $L_{A345}$ | $R^{B2}$ | $R^{B1}$ | $R^{B3}$ | $R^{B3}$ | N | N |
| $L_{A346}$ | $R^{B2}$ | $R^{B1}$ | $R^{B4}$ | $R^{B4}$ | N | N |
| $L_{A347}$ | $R^{B2}$ | $R^{B1}$ | $R^{B5}$ | $R^{B5}$ | N | N |
| $L_{A348}$ | $R^{B2}$ | $R^{B1}$ | $R^{B6}$ | $R^{B6}$ | N | N |
| $L_{A349}$ | $R^{B2}$ | $R^{B1}$ | $R^{B7}$ | $R^{B7}$ | N | N |
| $L_{A350}$ | $R^{B2}$ | $R^{B1}$ | $R^{B8}$ | $R^{B8}$ | N | N |
| $L_{A351}$ | $R^{B2}$ | $R^{B1}$ | $R^{B9}$ | $R^{B9}$ | N | N |
| $L_{A352}$ | $R^{B2}$ | $R^{B1}$ | $R^{A2}$ | $R^{A2}$ | N | N |
| $L_{A353}$ | $R^{B2}$ | $R^{B1}$ | $R^{A27}$ | $R^{A27}$ | N | N |

-continued

| | $R^1$ | $R^2$ | $R^5$ | $R^6$ | $X^4$ | $X^5$ |
|---|---|---|---|---|---|---|
| $L_{A354}$ | $R^{B2}$ | $R^{B1}$ | $R^{A34}$ | $R^{A34}$ | N | N |
| $L_{A355}$ | $R^{B2}$ | F | $R^{B2}$ | $R^{B2}$ | N | N |
| $L_{A356}$ | $R^{B2}$ | F | $R^{B3}$ | $R^{B3}$ | N | N |
| $L_{A357}$ | $R^{B2}$ | F | $R^{B4}$ | $R^{B4}$ | N | N |
| $L_{A358}$ | $R^{B2}$ | F | $R^{B5}$ | $R^{B5}$ | N | N |
| $L_{A359}$ | $R^{B2}$ | F | $R^{B6}$ | $R^{B6}$ | N | N |
| $L_{A360}$ | $R^{B2}$ | F | $R^{B7}$ | $R^{B7}$ | N | N |
| $L_{A361}$ | $R^{B2}$ | F | $R^{B8}$ | $R^{B8}$ | N | N |
| $L_{A362}$ | $R^{B2}$ | F | $R^{B9}$ | $R^{B9}$ | N | N |
| $L_{A363}$ | $R^{B2}$ | F | $R^{A2}$ | $R^{A2}$ | N | N |
| $L_{A364}$ | $R^{B2}$ | F | $R^{A27}$ | $R^{A27}$ | N | N |
| $L_{A365}$ | $R^{B2}$ | F | $R^{A34}$ | $R^{A34}$ | N | N |
| $L_{A366}$ | $R^{B3}$ | $R^{B1}$ | $R^{B2}$ | $R^{B2}$ | N | N |
| $L_{A367}$ | $R^{B3}$ | $R^{B1}$ | $R^{B3}$ | $R^{B3}$ | N | N |
| $L_{A368}$ | $R^{B3}$ | $R^{B1}$ | $R^{B4}$ | $R^{B4}$ | N | N |
| $L_{A369}$ | $R^{B3}$ | $R^{B1}$ | $R^{B5}$ | $R^{B5}$ | N | N |
| $L_{A370}$ | $R^{B3}$ | $R^{B1}$ | $R^{B6}$ | $R^{B6}$ | N | N |
| $L_{A371}$ | $R^{B3}$ | $R^{B1}$ | $R^{B7}$ | $R^{B7}$ | N | N |
| $L_{A372}$ | $R^{B3}$ | $R^{B1}$ | $R^{B8}$ | $R^{B8}$ | N | N |
| $L_{A373}$ | $R^{B3}$ | $R^{B1}$ | $R^{B9}$ | $R^{B9}$ | N | N |
| $L_{A374}$ | $R^{B3}$ | $R^{B1}$ | $R^{A2}$ | $R^{A2}$ | N | N |
| $L_{A375}$ | $R^{B3}$ | $R^{B1}$ | $R^{A27}$ | $R^{A27}$ | N | N |
| $L_{A376}$ | $R^{B3}$ | $R^{B1}$ | $R^{A34}$ | $R^{A34}$ | N | N |

for $L_{A377}$ through $L_{A952}$, $L_A$ has a structure of

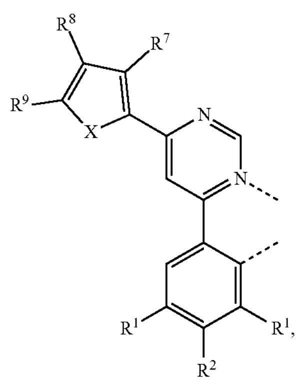

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A377}$ | $R^{B1}$ | $R^{B1}$ | $R^{B1}$ | $R^{B1}$ | $R^{B1}$ | S |
| $L_{A378}$ | $R^{B1}$ | $R^{B1}$ | $R^{B1}$ | $R^{B1}$ | $R^{B2}$ | S |
| $L_{A379}$ | $R^{B1}$ | $R^{B1}$ | $R^{B1}$ | $R^{B1}$ | $R^{B3}$ | S |
| $L_{A380}$ | $R^{B1}$ | $R^{B1}$ | $R^{B1}$ | $R^{B1}$ | $R^{B4}$ | S |
| $L_{A381}$ | $R^{B1}$ | $R^{B1}$ | $R^{B1}$ | $R^{B1}$ | $R^{B5}$ | S |
| $L_{A382}$ | $R^{B1}$ | $R^{B1}$ | $R^{B1}$ | $R^{B1}$ | $R^{B6}$ | S |
| $L_{A383}$ | $R^{B1}$ | $R^{B1}$ | $R^{B1}$ | $R^{B1}$ | $R^{B7}$ | S |
| $L_{A384}$ | $R^{B1}$ | $R^{B1}$ | $R^{B1}$ | $R^{B1}$ | $R^{B8}$ | S |
| $L_{A385}$ | $R^{B1}$ | $R^{B1}$ | $R^{B1}$ | $R^{B1}$ | $R^{B9}$ | S |
| $L_{A386}$ | $R^{B1}$ | $R^{B1}$ | $R^{B1}$ | $R^{B1}$ | $R^{A2}$ | S |
| $L_{A387}$ | $R^{B1}$ | $R^{B1}$ | $R^{B1}$ | $R^{B1}$ | $R^{A27}$ | S |
| $L_{A388}$ | $R^{B1}$ | $R^{B1}$ | $R^{B1}$ | $R^{B1}$ | $R^{A34}$ | S |
| $L_{A389}$ | $R^{B2}$ | $R^{B1}$ | $R^{B1}$ | $R^{B1}$ | $R^{B1}$ | S |
| $L_{A390}$ | $R^{B2}$ | $R^{B1}$ | $R^{B1}$ | $R^{B1}$ | $R^{B2}$ | S |
| $L_{A391}$ | $R^{B2}$ | $R^{B1}$ | $R^{B1}$ | $R^{B1}$ | $R^{B3}$ | S |
| $L_{A392}$ | $R^{B2}$ | $R^{B1}$ | $R^{B1}$ | $R^{B1}$ | $R^{B4}$ | S |
| $L_{A393}$ | $R^{B2}$ | $R^{B1}$ | $R^{B1}$ | $R^{B1}$ | $R^{B5}$ | S |
| $L_{A394}$ | $R^{B2}$ | $R^{B1}$ | $R^{B1}$ | $R^{B1}$ | $R^{B6}$ | S |
| $L_{A395}$ | $R^{B2}$ | $R^{B1}$ | $R^{B1}$ | $R^{B1}$ | $R^{B7}$ | S |
| $L_{A396}$ | $R^{B2}$ | $R^{B1}$ | $R^{B1}$ | $R^{B1}$ | $R^{B8}$ | S |
| $L_{A397}$ | $R^{B2}$ | $R^{B1}$ | $R^{B1}$ | $R^{B1}$ | $R^{B9}$ | S |
| $L_{A398}$ | $R^{B2}$ | $R^{B1}$ | $R^{B1}$ | $R^{B1}$ | $R^{A2}$ | S |
| $L_{A399}$ | $R^{B2}$ | $R^{B1}$ | $R^{B1}$ | $R^{B1}$ | $R^{A27}$ | S |
| $L_{A400}$ | $R^{B2}$ | $R^{B1}$ | $R^{B1}$ | $R^{B1}$ | $R^{A34}$ | S |
| $L_{A401}$ | $R^{B2}$ | F | $R^{B1}$ | $R^{B1}$ | $R^{B1}$ | S |
| $L_{A402}$ | $R^{B2}$ | F | $R^{B1}$ | $R^{B1}$ | $R^{B2}$ | S |
| $L_{A403}$ | $R^{B2}$ | F | $R^{B1}$ | $R^{B1}$ | $R^{B3}$ | S |
| $L_{A404}$ | $R^{B2}$ | F | $R^{B1}$ | $R^{B1}$ | $R^{B4}$ | S |
| $L_{A405}$ | $R^{B2}$ | F | $R^{B1}$ | $R^{B1}$ | $R^{B5}$ | S |
| $L_{A406}$ | $R^{B2}$ | F | $R^{B1}$ | $R^{B1}$ | $R^{B6}$ | S |
| $L_{A407}$ | $R^{B2}$ | F | $R^{B1}$ | $R^{B1}$ | $R^{B7}$ | S |
| $L_{A408}$ | $R^{B2}$ | F | $R^{B1}$ | $R^{B1}$ | $R^{B8}$ | S |
| $L_{A409}$ | $R^{B2}$ | F | $R^{B1}$ | $R^{B1}$ | $R^{B9}$ | S |
| $L_{A410}$ | $R^{B2}$ | F | $R^{B1}$ | $R^{B1}$ | $R^{A2}$ | S |
| $L_{A411}$ | $R^{B2}$ | F | $R^{B1}$ | $R^{B1}$ | $R^{A27}$ | S |
| $L_{A412}$ | $R^{B2}$ | F | $R^{B1}$ | $R^{B1}$ | $R^{A34}$ | S |
| $L_{A413}$ | $R^{B3}$ | $R^{B1}$ | $R^{B1}$ | $R^{B1}$ | $R^{B1}$ | S |
| $L_{A414}$ | $R^{B3}$ | $R^{B1}$ | $R^{B1}$ | $R^{B1}$ | $R^{B2}$ | S |
| $L_{A415}$ | $R^{B3}$ | $R^{B1}$ | $R^{B1}$ | $R^{B1}$ | $R^{B3}$ | S |
| $L_{A416}$ | $R^{B3}$ | $R^{B1}$ | $R^{B1}$ | $R^{B1}$ | $R^{B4}$ | S |
| $L_{A417}$ | $R^{B3}$ | $R^{B1}$ | $R^{B1}$ | $R^{B1}$ | $R^{B5}$ | S |
| $L_{A418}$ | $R^{B3}$ | $R^{B1}$ | $R^{B1}$ | $R^{B1}$ | $R^{B6}$ | S |
| $L_{A419}$ | $R^{B3}$ | $R^{B1}$ | $R^{B1}$ | $R^{B1}$ | $R^{B7}$ | S |
| $L_{A420}$ | $R^{B3}$ | $R^{B1}$ | $R^{B1}$ | $R^{B1}$ | $R^{B8}$ | S |
| $L_{A421}$ | $R^{B3}$ | $R^{B1}$ | $R^{B1}$ | $R^{B1}$ | $R^{B9}$ | S |
| $L_{A422}$ | $R^{B3}$ | $R^{B1}$ | $R^{B1}$ | $R^{B1}$ | $R^{A2}$ | S |
| $L_{A423}$ | $R^{B3}$ | $R^{B1}$ | $R^{B1}$ | $R^{B1}$ | $R^{A27}$ | S |
| $L_{A424}$ | $R^{B3}$ | $R^{B1}$ | $R^{B1}$ | $R^{B1}$ | $R^{A34}$ | S |
| $L_{A425}$ | $R^{B1}$ | $R^{B1}$ | $R^{B1}$ | $R^{B1}$ | $R^{B1}$ | S |
| $L_{A426}$ | $R^{B1}$ | $R^{B1}$ | $R^{B1}$ | $R^{B2}$ | $R^{B1}$ | S |
| $L_{A427}$ | $R^{B1}$ | $R^{B1}$ | $R^{B1}$ | $R^{B3}$ | $R^{B1}$ | S |
| $L_{A428}$ | $R^{B1}$ | $R^{B1}$ | $R^{B1}$ | $R^{B4}$ | $R^{B1}$ | S |
| $L_{A429}$ | $R^{B1}$ | $R^{B1}$ | $R^{B1}$ | $R^{B5}$ | $R^{B1}$ | S |
| $L_{A430}$ | $R^{B1}$ | $R^{B1}$ | $R^{B1}$ | $R^{B6}$ | $R^{B1}$ | S |
| $L_{A431}$ | $R^{B1}$ | $R^{B1}$ | $R^{B1}$ | $R^{B7}$ | $R^{B1}$ | S |
| $L_{A432}$ | $R^{B1}$ | $R^{B1}$ | $R^{B1}$ | $R^{B8}$ | $R^{B1}$ | S |
| $L_{A433}$ | $R^{B1}$ | $R^{B1}$ | $R^{B1}$ | $R^{B9}$ | $R^{B1}$ | S |
| $L_{A434}$ | $R^{B1}$ | $R^{B1}$ | $R^{B1}$ | $R^{A2}$ | $R^{B1}$ | S |
| $L_{A435}$ | $R^{B1}$ | $R^{B1}$ | $R^{B1}$ | $R^{A27}$ | $R^{B1}$ | S |
| $L_{A436}$ | $R^{B1}$ | $R^{B1}$ | $R^{B1}$ | $R^{A34}$ | $R^{B1}$ | S |
| $L_{A437}$ | $R^{B2}$ | $R^{B1}$ | $R^{B1}$ | $R^{B1}$ | $R^{B1}$ | S |
| $L_{A438}$ | $R^{B2}$ | $R^{B1}$ | $R^{B1}$ | $R^{B2}$ | $R^{B1}$ | S |
| $L_{A439}$ | $R^{B2}$ | $R^{B1}$ | $R^{B1}$ | $R^{B3}$ | $R^{B1}$ | S |
| $L_{A440}$ | $R^{B2}$ | $R^{B1}$ | $R^{B1}$ | $R^{B4}$ | $R^{B1}$ | S |
| $L_{A441}$ | $R^{B2}$ | $R^{B1}$ | $R^{B1}$ | $R^{B5}$ | $R^{B1}$ | S |
| $L_{A442}$ | $R^{B2}$ | $R^{B1}$ | $R^{B1}$ | $R^{B6}$ | $R^{B1}$ | S |
| $L_{A443}$ | $R^{B2}$ | $R^{B1}$ | $R^{B1}$ | $R^{B7}$ | $R^{B1}$ | S |
| $L_{A444}$ | $R^{B2}$ | $R^{B1}$ | $R^{B1}$ | $R^{B8}$ | $R^{B1}$ | S |
| $L_{A445}$ | $R^{B2}$ | $R^{B1}$ | $R^{B1}$ | $R^{B9}$ | $R^{B1}$ | S |
| $L_{A446}$ | $R^{B2}$ | $R^{B1}$ | $R^{B1}$ | $R^{A2}$ | $R^{B1}$ | S |
| $L_{A447}$ | $R^{B2}$ | $R^{B1}$ | $R^{B1}$ | $R^{A27}$ | $R^{B1}$ | S |
| $L_{A448}$ | $R^{B2}$ | $R^{B1}$ | $R^{B1}$ | $R^{A34}$ | $R^{B1}$ | S |
| $L_{A449}$ | $R^{B2}$ | F | $R^{B1}$ | $R^{B1}$ | $R^{B1}$ | S |
| $L_{A450}$ | $R^{B2}$ | F | $R^{B1}$ | $R^{B2}$ | $R^{B1}$ | S |
| $L_{A451}$ | $R^{B2}$ | F | $R^{B1}$ | $R^{B3}$ | $R^{B1}$ | S |
| $L_{A452}$ | $R^{B2}$ | F | $R^{B1}$ | $R^{B4}$ | $R^{B1}$ | S |
| $L_{A453}$ | $R^{B2}$ | F | $R^{B1}$ | $R^{B5}$ | $R^{B1}$ | S |
| $L_{A454}$ | $R^{B2}$ | F | $R^{B1}$ | $R^{B6}$ | $R^{B1}$ | S |
| $L_{A455}$ | $R^{B2}$ | F | $R^{B1}$ | $R^{B7}$ | $R^{B1}$ | S |
| $L_{A456}$ | $R^{B2}$ | F | $R^{B1}$ | $R^{B8}$ | $R^{B1}$ | S |
| $L_{A457}$ | $R^{B2}$ | F | $R^{B1}$ | $R^{B9}$ | $R^{B1}$ | S |
| $L_{A458}$ | $R^{B2}$ | F | $R^{B1}$ | $R^{A2}$ | $R^{B1}$ | S |
| $L_{A459}$ | $R^{B2}$ | F | $R^{B1}$ | $R^{A27}$ | $R^{B1}$ | S |
| $L_{A460}$ | $R^{B2}$ | F | $R^{B1}$ | $R^{A34}$ | $R^{B1}$ | S |
| $L_{A461}$ | $R^{B3}$ | $R^{B1}$ | $R^{B1}$ | $R^{B1}$ | $R^{B1}$ | S |
| $L_{A462}$ | $R^{B3}$ | $R^{B1}$ | $R^{B1}$ | $R^{B2}$ | $R^{B1}$ | S |
| $L_{A463}$ | $R^{B3}$ | $R^{B1}$ | $R^{B1}$ | $R^{B3}$ | $R^{B1}$ | S |
| $L_{A464}$ | $R^{B3}$ | $R^{B1}$ | $R^{B1}$ | $R^{B4}$ | $R^{B1}$ | S |
| $L_{A465}$ | $R^{B3}$ | $R^{B1}$ | $R^{B1}$ | $R^{B5}$ | $R^{B1}$ | S |
| $L_{A466}$ | $R^{B3}$ | $R^{B1}$ | $R^{B1}$ | $R^{B6}$ | $R^{B1}$ | S |
| $L_{A467}$ | $R^{B3}$ | $R^{B1}$ | $R^{B1}$ | $R^{B7}$ | $R^{B1}$ | S |
| $L_{A468}$ | $R^{B3}$ | $R^{B1}$ | $R^{B1}$ | $R^{B8}$ | $R^{B1}$ | S |
| $L_{A469}$ | $R^{B3}$ | $R^{B1}$ | $R^{B1}$ | $R^{B9}$ | $R^{B1}$ | S |
| $L_{A470}$ | $R^{B3}$ | $R^{B1}$ | $R^{B1}$ | $R^{A2}$ | $R^{B1}$ | S |
| $L_{A471}$ | $R^{B3}$ | $R^{B1}$ | $R^{B1}$ | $R^{A27}$ | $R^{B1}$ | S |
| $L_{A472}$ | $R^{B3}$ | $R^{B1}$ | $R^{B1}$ | $R^{A34}$ | $R^{B1}$ | S |
| $L_{A473}$ | $R^{B1}$ | $R^{B1}$ | $R^{B1}$ | $R^{B1}$ | $R^{B1}$ | S |
| $L_{A474}$ | $R^{B1}$ | $R^{B1}$ | $R^{B2}$ | $R^{B1}$ | $R^{B1}$ | S |
| $L_{A475}$ | $R^{B1}$ | $R^{B1}$ | $R^{B3}$ | $R^{B1}$ | $R^{B1}$ | S |
| $L_{A476}$ | $R^{B1}$ | $R^{B1}$ | $R^{B4}$ | $R^{B1}$ | $R^{B1}$ | S |

-continued

| | $R^1$ | $R^2$ | $R^7$ | $R^8$ | $R^9$ | X |
|---|---|---|---|---|---|---|
| $L_{4477}$ | $R^{B1}$ | $R^{B1}$ | $R^{B5}$ | $R^{B1}$ | $R^{B1}$ | S |
| $L_{4478}$ | $R^{B1}$ | $R^{B1}$ | $R^{B6}$ | $R^{B1}$ | $R^{B1}$ | S |
| $L_{4479}$ | $R^{B1}$ | $R^{B1}$ | $R^{B7}$ | $R^{B1}$ | $R^{B1}$ | S |
| $L_{4480}$ | $R^{B1}$ | $R^{B1}$ | $R^{B8}$ | $R^{B1}$ | $R^{B1}$ | S |
| $L_{4481}$ | $R^{B1}$ | $R^{B1}$ | $R^{B9}$ | $R^{B1}$ | $R^{B1}$ | S |
| $L_{4482}$ | $R^{B1}$ | $R^{B1}$ | $R^{A2}$ | $R^{B1}$ | $R^{B1}$ | S |
| $L_{4483}$ | $R^{B1}$ | $R^{B1}$ | $R^{A27}$ | $R^{B1}$ | $R^{B1}$ | S |
| $L_{4484}$ | $R^{B1}$ | $R^{B1}$ | $R^{A34}$ | $R^{B1}$ | $R^{B1}$ | S |
| $L_{4485}$ | $R^{B2}$ | $R^{B1}$ | $R^{B1}$ | $R^{B1}$ | $R^{B1}$ | S |
| $L_{4486}$ | $R^{B2}$ | $R^{B1}$ | $R^{B2}$ | $R^{B1}$ | $R^{B1}$ | S |
| $L_{4487}$ | $R^{B2}$ | $R^{B1}$ | $R^{B3}$ | $R^{B1}$ | $R^{B1}$ | S |
| $L_{4488}$ | $R^{B2}$ | $R^{B1}$ | $R^{B4}$ | $R^{B1}$ | $R^{B1}$ | S |
| $L_{4489}$ | $R^{B2}$ | $R^{B1}$ | $R^{B5}$ | $R^{B1}$ | $R^{B1}$ | S |
| $L_{4490}$ | $R^{B2}$ | $R^{B1}$ | $R^{B6}$ | $R^{B1}$ | $R^{B1}$ | S |
| $L_{4491}$ | $R^{B2}$ | $R^{B1}$ | $R^{B7}$ | $R^{B1}$ | $R^{B1}$ | S |
| $L_{4492}$ | $R^{B2}$ | $R^{B1}$ | $R^{B8}$ | $R^{B1}$ | $R^{B1}$ | S |
| $L_{4493}$ | $R^{B2}$ | $R^{B1}$ | $R^{B9}$ | $R^{B1}$ | $R^{B1}$ | S |
| $L_{4494}$ | $R^{B2}$ | $R^{B1}$ | $R^{A2}$ | $R^{B1}$ | $R^{B1}$ | S |
| $L_{4495}$ | $R^{B2}$ | $R^{B1}$ | $R^{A27}$ | $R^{B1}$ | $R^{B1}$ | S |
| $L_{4496}$ | $R^{B2}$ | $R^{B1}$ | $R^{A34}$ | $R^{B1}$ | $R^{B1}$ | S |
| $L_{4497}$ | $R^{B2}$ | F | $R^{B1}$ | $R^{B1}$ | $R^{B1}$ | S |
| $L_{4498}$ | $R^{B2}$ | F | $R^{B2}$ | $R^{B1}$ | $R^{B1}$ | S |
| $L_{4499}$ | $R^{B2}$ | F | $R^{B3}$ | $R^{B1}$ | $R^{B1}$ | S |
| $L_{4500}$ | $R^{B2}$ | F | $R^{B4}$ | $R^{B1}$ | $R^{B1}$ | S |
| $L_{4501}$ | $R^{B2}$ | F | $R^{B5}$ | $R^{B1}$ | $R^{B1}$ | S |
| $L_{4502}$ | $R^{B2}$ | F | $R^{B6}$ | $R^{B1}$ | $R^{B1}$ | S |
| $L_{4503}$ | $R^{B2}$ | F | $R^{B7}$ | $R^{B1}$ | $R^{B1}$ | S |
| $L_{4504}$ | $R^{B2}$ | F | $R^{B8}$ | $R^{B1}$ | $R^{B1}$ | S |
| $L_{4505}$ | $R^{B2}$ | F | $R^{B9}$ | $R^{B1}$ | $R^{B1}$ | S |
| $L_{4506}$ | $R^{B2}$ | F | $R^{A2}$ | $R^{B1}$ | $R^{B1}$ | S |
| $L_{4507}$ | $R^{B2}$ | F | $R^{A27}$ | $R^{B1}$ | $R^{B1}$ | S |
| $L_{4508}$ | $R^{B2}$ | F | $R^{A34}$ | $R^{B1}$ | $R^{B1}$ | S |
| $L_{4509}$ | $R^{B3}$ | $R^{B1}$ | $R^{B1}$ | $R^{B1}$ | $R^{B1}$ | S |
| $L_{4510}$ | $R^{B3}$ | $R^{B1}$ | $R^{B2}$ | $R^{B1}$ | $R^{B1}$ | S |
| $L_{4511}$ | $R^{B3}$ | $R^{B1}$ | $R^{B3}$ | $R^{B1}$ | $R^{B1}$ | S |
| $L_{4512}$ | $R^{B3}$ | $R^{B1}$ | $R^{B4}$ | $R^{B1}$ | $R^{B1}$ | S |
| $L_{4513}$ | $R^{B3}$ | $R^{B1}$ | $R^{B5}$ | $R^{B1}$ | $R^{B1}$ | S |
| $L_{4514}$ | $R^{B3}$ | $R^{B1}$ | $R^{B6}$ | $R^{B1}$ | $R^{B1}$ | S |
| $L_{4515}$ | $R^{B3}$ | $R^{B1}$ | $R^{B7}$ | $R^{B1}$ | $R^{B1}$ | S |
| $L_{4516}$ | $R^{B3}$ | $R^{B1}$ | $R^{B8}$ | $R^{B1}$ | $R^{B1}$ | S |
| $L_{4517}$ | $R^{B3}$ | $R^{B1}$ | $R^{B9}$ | $R^{B1}$ | $R^{B1}$ | S |
| $L_{4518}$ | $R^{B3}$ | $R^{B1}$ | $R^{A2}$ | $R^{B1}$ | $R^{B1}$ | S |
| $L_{4519}$ | $R^{B3}$ | $R^{B1}$ | $R^{A27}$ | $R^{B1}$ | $R^{B1}$ | S |
| $L_{4520}$ | $R^{B3}$ | $R^{B1}$ | $R^{A34}$ | $R^{B1}$ | $R^{B1}$ | S |
| $L_{4521}$ | $R^{B1}$ | $R^{B1}$ | $R^{B1}$ | $R^{B1}$ | $R^{B1}$ | S |
| $L_{4522}$ | $R^{B1}$ | $R^{B1}$ | $R^{B2}$ | $R^{B1}$ | $R^{B2}$ | S |
| $L_{4523}$ | $R^{B1}$ | $R^{B1}$ | $R^{B3}$ | $R^{B1}$ | $R^{B3}$ | S |
| $L_{4524}$ | $R^{B1}$ | $R^{B1}$ | $R^{B4}$ | $R^{B1}$ | $R^{B4}$ | S |
| $L_{4525}$ | $R^{B1}$ | $R^{B1}$ | $R^{B5}$ | $R^{B1}$ | $R^{B5}$ | S |
| $L_{4526}$ | $R^{B1}$ | $R^{B1}$ | $R^{B6}$ | $R^{B1}$ | $R^{B6}$ | S |
| $L_{4527}$ | $R^{B1}$ | $R^{B1}$ | $R^{B7}$ | $R^{B1}$ | $R^{B7}$ | S |
| $L_{4528}$ | $R^{B1}$ | $R^{B1}$ | $R^{B8}$ | $R^{B1}$ | $R^{B8}$ | S |
| $L_{4529}$ | $R^{B1}$ | $R^{B1}$ | $R^{B9}$ | $R^{B1}$ | $R^{B9}$ | S |
| $L_{4530}$ | $R^{B1}$ | $R^{B1}$ | $R^{A2}$ | $R^{B1}$ | $R^{A2}$ | S |
| $L_{4531}$ | $R^{B1}$ | $R^{B1}$ | $R^{A27}$ | $R^{B1}$ | $R^{A27}$ | S |
| $L_{4532}$ | $R^{B1}$ | $R^{B1}$ | $R^{A34}$ | $R^{B1}$ | $R^{A34}$ | S |
| $L_{4533}$ | $R^{B2}$ | $R^{B1}$ | $R^{B1}$ | $R^{B1}$ | $R^{B1}$ | S |
| $L_{4534}$ | $R^{B2}$ | $R^{B1}$ | $R^{B2}$ | $R^{B1}$ | $R^{B2}$ | S |
| $L_{4535}$ | $R^{B2}$ | $R^{B1}$ | $R^{B3}$ | $R^{B1}$ | $R^{B3}$ | S |
| $L_{4536}$ | $R^{B2}$ | $R^{B1}$ | $R^{B4}$ | $R^{B1}$ | $R^{B4}$ | S |
| $L_{4537}$ | $R^{B2}$ | $R^{B1}$ | $R^{B5}$ | $R^{B1}$ | $R^{B5}$ | S |
| $L_{4538}$ | $R^{B2}$ | $R^{B1}$ | $R^{B6}$ | $R^{B1}$ | $R^{B6}$ | S |
| $L_{4539}$ | $R^{B2}$ | $R^{B1}$ | $R^{B7}$ | $R^{B1}$ | $R^{B7}$ | S |
| $L_{4540}$ | $R^{B2}$ | $R^{B1}$ | $R^{B8}$ | $R^{B1}$ | $R^{B8}$ | S |
| $L_{4541}$ | $R^{B2}$ | $R^{B1}$ | $R^{B9}$ | $R^{B1}$ | $R^{B9}$ | S |
| $L_{4542}$ | $R^{B2}$ | $R^{B1}$ | $R^{A2}$ | $R^{B1}$ | $R^{A2}$ | S |
| $L_{4543}$ | $R^{B2}$ | $R^{B1}$ | $R^{A27}$ | $R^{B1}$ | $R^{A27}$ | S |
| $L_{4544}$ | $R^{B2}$ | $R^{B1}$ | $R^{A34}$ | $R^{B1}$ | $R^{A34}$ | S |
| $L_{4545}$ | $R^{B2}$ | F | $R^{B1}$ | $R^{B1}$ | $R^{B1}$ | S |
| $L_{4546}$ | $R^{B2}$ | F | $R^{B2}$ | $R^{B1}$ | $R^{B2}$ | S |
| $L_{4547}$ | $R^{B2}$ | F | $R^{B3}$ | $R^{B1}$ | $R^{B3}$ | S |
| $L_{4548}$ | $R^{B2}$ | F | $R^{B4}$ | $R^{B1}$ | $R^{B4}$ | S |
| $L_{4549}$ | $R^{B2}$ | F | $R^{B5}$ | $R^{B1}$ | $R^{B5}$ | S |
| $L_{4550}$ | $R^{B2}$ | F | $R^{B6}$ | $R^{B1}$ | $R^{B6}$ | S |
| $L_{4551}$ | $R^{B2}$ | F | $R^{B7}$ | $R^{B1}$ | $R^{B7}$ | S |
| $L_{4552}$ | $R^{B2}$ | F | $R^{B8}$ | $R^{B1}$ | $R^{B8}$ | S |
| $L_{4553}$ | $R^{B2}$ | F | $R^{B9}$ | $R^{B1}$ | $R^{B9}$ | S |

-continued

| | $R^1$ | $R^2$ | $R^7$ | $R^8$ | $R^9$ | X |
|---|---|---|---|---|---|---|
| $L_{4554}$ | $R^{B2}$ | F | $R^{A2}$ | $R^{B1}$ | $R^{A2}$ | S |
| $L_{4555}$ | $R^{B2}$ | F | $R^{A27}$ | $R^{B1}$ | $R^{A27}$ | S |
| $L_{4556}$ | $R^{B2}$ | F | $R^{A34}$ | $R^{B1}$ | $R^{A34}$ | S |
| $L_{4557}$ | $R^{B3}$ | $R^{B1}$ | $R^{B1}$ | $R^{B1}$ | $R^{B1}$ | S |
| $L_{4558}$ | $R^{B3}$ | $R^{B1}$ | $R^{B2}$ | $R^{B1}$ | $R^{B2}$ | S |
| $L_{4559}$ | $R^{B3}$ | $R^{B1}$ | $R^{B3}$ | $R^{B1}$ | $R^{B3}$ | S |
| $L_{4560}$ | $R^{B3}$ | $R^{B1}$ | $R^{B4}$ | $R^{B1}$ | $R^{B4}$ | S |
| $L_{4561}$ | $R^{B3}$ | $R^{B1}$ | $R^{B5}$ | $R^{B1}$ | $R^{B5}$ | S |
| $L_{4562}$ | $R^{B3}$ | $R^{B1}$ | $R^{B6}$ | $R^{B1}$ | $R^{B6}$ | S |
| $L_{4563}$ | $R^{B3}$ | $R^{B1}$ | $R^{B7}$ | $R^{B1}$ | $R^{B7}$ | S |
| $L_{4564}$ | $R^{B3}$ | $R^{B1}$ | $R^{B8}$ | $R^{B1}$ | $R^{B8}$ | S |
| $L_{4565}$ | $R^{B3}$ | $R^{B1}$ | $R^{B9}$ | $R^{B1}$ | $R^{B9}$ | S |
| $L_{4566}$ | $R^{B3}$ | $R^{B1}$ | $R^{A2}$ | $R^{B1}$ | $R^{A2}$ | S |
| $L_{4567}$ | $R^{B3}$ | $R^{B1}$ | $R^{A27}$ | $R^{B1}$ | $R^{A27}$ | S |
| $L_{4568}$ | $R^{B3}$ | $R^{B1}$ | $R^{A34}$ | $R^{B1}$ | $R^{A34}$ | S |
| $L_{4569}$ | $R^{B1}$ | $R^{B1}$ | $R^{B1}$ | $R^{B1}$ | $R^{B1}$ | S |
| $L_{4570}$ | $R^{B1}$ | $R^{B1}$ | $R^{B1}$ | $R^{B2}$ | $R^{B2}$ | S |
| $L_{4571}$ | $R^{B1}$ | $R^{B1}$ | $R^{B1}$ | $R^{B3}$ | $R^{B3}$ | S |
| $L_{4572}$ | $R^{B1}$ | $R^{B1}$ | $R^{B1}$ | $R^{B4}$ | $R^{B4}$ | S |
| $L_{4573}$ | $R^{B1}$ | $R^{B1}$ | $R^{B1}$ | $R^{B5}$ | $R^{B5}$ | S |
| $L_{4574}$ | $R^{B1}$ | $R^{B1}$ | $R^{B1}$ | $R^{B6}$ | $R^{B6}$ | S |
| $L_{4575}$ | $R^{B1}$ | $R^{B1}$ | $R^{B1}$ | $R^{B7}$ | $R^{B7}$ | S |
| $L_{4576}$ | $R^{B1}$ | $R^{B1}$ | $R^{B1}$ | $R^{B8}$ | $R^{B8}$ | S |
| $L_{4577}$ | $R^{B1}$ | $R^{B1}$ | $R^{B1}$ | $R^{B9}$ | $R^{B9}$ | S |
| $L_{4578}$ | $R^{B1}$ | $R^{B1}$ | $R^{B1}$ | $R^{A2}$ | $R^{A2}$ | S |
| $L_{4579}$ | $R^{B1}$ | $R^{B1}$ | $R^{B1}$ | $R^{A27}$ | $R^{A27}$ | S |
| $L_{4580}$ | $R^{B1}$ | $R^{B1}$ | $R^{B1}$ | $R^{A34}$ | $R^{A34}$ | S |
| $L_{4581}$ | $R^{B2}$ | $R^{B1}$ | $R^{B1}$ | $R^{B1}$ | $R^{B1}$ | S |
| $L_{4582}$ | $R^{B2}$ | $R^{B1}$ | $R^{B1}$ | $R^{B2}$ | $R^{B2}$ | S |
| $L_{4583}$ | $R^{B2}$ | $R^{B1}$ | $R^{B1}$ | $R^{B3}$ | $R^{B3}$ | S |
| $L_{4584}$ | $R^{B2}$ | $R^{B1}$ | $R^{B1}$ | $R^{B4}$ | $R^{B4}$ | S |
| $L_{4585}$ | $R^{B2}$ | $R^{B1}$ | $R^{B1}$ | $R^{B5}$ | $R^{B5}$ | S |
| $L_{4586}$ | $R^{B2}$ | $R^{B1}$ | $R^{B1}$ | $R^{B6}$ | $R^{B6}$ | S |
| $L_{4587}$ | $R^{B2}$ | $R^{B1}$ | $R^{B1}$ | $R^{B7}$ | $R^{B7}$ | S |
| $L_{4588}$ | $R^{B2}$ | $R^{B1}$ | $R^{B1}$ | $R^{B8}$ | $R^{B8}$ | S |
| $L_{4589}$ | $R^{B2}$ | $R^{B1}$ | $R^{B1}$ | $R^{B9}$ | $R^{B9}$ | S |
| $L_{4590}$ | $R^{B2}$ | $R^{B1}$ | $R^{B1}$ | $R^{A2}$ | $R^{A2}$ | S |
| $L_{4591}$ | $R^{B2}$ | $R^{B1}$ | $R^{B1}$ | $R^{A27}$ | $R^{A27}$ | S |
| $L_{4592}$ | $R^{B2}$ | $R^{B1}$ | $R^{B1}$ | $R^{A34}$ | $R^{A34}$ | S |
| $L_{4593}$ | $R^{B2}$ | F | $R^{B1}$ | $R^{B1}$ | $R^{B1}$ | S |
| $L_{4594}$ | $R^{B2}$ | F | $R^{B1}$ | $R^{B2}$ | $R^{B2}$ | S |
| $L_{4595}$ | $R^{B2}$ | F | $R^{B1}$ | $R^{B3}$ | $R^{B3}$ | S |
| $L_{4596}$ | $R^{B2}$ | F | $R^{B1}$ | $R^{B4}$ | $R^{B4}$ | S |
| $L_{4597}$ | $R^{B2}$ | F | $R^{B1}$ | $R^{B5}$ | $R^{B5}$ | S |
| $L_{4598}$ | $R^{B2}$ | F | $R^{B1}$ | $R^{B6}$ | $R^{B6}$ | S |
| $L_{4599}$ | $R^{B2}$ | F | $R^{B1}$ | $R^{B7}$ | $R^{B7}$ | S |
| $L_{4600}$ | $R^{B2}$ | F | $R^{B1}$ | $R^{B8}$ | $R^{B8}$ | S |
| $L_{4601}$ | $R^{B2}$ | F | $R^{B1}$ | $R^{B9}$ | $R^{B9}$ | S |
| $L_{4602}$ | $R^{B2}$ | F | $R^{B1}$ | $R^{A2}$ | $R^{A2}$ | S |
| $L_{4603}$ | $R^{B2}$ | F | $R^{B1}$ | $R^{A27}$ | $R^{A27}$ | S |
| $L_{4604}$ | $R^{B2}$ | F | $R^{B1}$ | $R^{A34}$ | $R^{A34}$ | S |
| $L_{4605}$ | $R^{B3}$ | $R^{B1}$ | $R^{B1}$ | $R^{B1}$ | $R^{B1}$ | S |
| $L_{4606}$ | $R^{B3}$ | $R^{B1}$ | $R^{B1}$ | $R^{B2}$ | $R^{B2}$ | S |
| $L_{4607}$ | $R^{B3}$ | $R^{B1}$ | $R^{B1}$ | $R^{B3}$ | $R^{B3}$ | S |
| $L_{4608}$ | $R^{B3}$ | $R^{B1}$ | $R^{B1}$ | $R^{B4}$ | $R^{B4}$ | S |
| $L_{4609}$ | $R^{B3}$ | $R^{B1}$ | $R^{B1}$ | $R^{B5}$ | $R^{B5}$ | S |
| $L_{4610}$ | $R^{B3}$ | $R^{B1}$ | $R^{B1}$ | $R^{B6}$ | $R^{B6}$ | S |
| $L_{4611}$ | $R^{B3}$ | $R^{B1}$ | $R^{B1}$ | $R^{B7}$ | $R^{B7}$ | S |
| $L_{4612}$ | $R^{B3}$ | $R^{B1}$ | $R^{B1}$ | $R^{B8}$ | $R^{B8}$ | S |
| $L_{4613}$ | $R^{B3}$ | $R^{B1}$ | $R^{B1}$ | $R^{B9}$ | $R^{B9}$ | S |
| $L_{4614}$ | $R^{B3}$ | $R^{B1}$ | $R^{B1}$ | $R^{A2}$ | $R^{A2}$ | S |
| $L_{4615}$ | $R^{B3}$ | $R^{B1}$ | $R^{B1}$ | $R^{A27}$ | $R^{A27}$ | S |
| $L_{4616}$ | $R^{B3}$ | $R^{B1}$ | $R^{B1}$ | $R^{A34}$ | $R^{A34}$ | S |
| $L_{4617}$ | $R^{B1}$ | $R^{B1}$ | $R^{B1}$ | $R^{B1}$ | $R^{B1}$ | S |
| $L_{4618}$ | $R^{B1}$ | $R^{B1}$ | $R^{B2}$ | $R^{B2}$ | $R^{B1}$ | S |
| $L_{4619}$ | $R^{B1}$ | $R^{B1}$ | $R^{B3}$ | $R^{B3}$ | $R^{B1}$ | S |
| $L_{4620}$ | $R^{B1}$ | $R^{B1}$ | $R^{B4}$ | $R^{B4}$ | $R^{B1}$ | S |
| $L_{4621}$ | $R^{B1}$ | $R^{B1}$ | $R^{B5}$ | $R^{B5}$ | $R^{B1}$ | S |
| $L_{4622}$ | $R^{B1}$ | $R^{B1}$ | $R^{B6}$ | $R^{B6}$ | $R^{B1}$ | S |
| $L_{4623}$ | $R^{B1}$ | $R^{B1}$ | $R^{B7}$ | $R^{B7}$ | $R^{B1}$ | S |
| $L_{4624}$ | $R^{B1}$ | $R^{B1}$ | $R^{B8}$ | $R^{B8}$ | $R^{B1}$ | S |
| $L_{4625}$ | $R^{B1}$ | $R^{B1}$ | $R^{B9}$ | $R^{B9}$ | $R^{B1}$ | S |
| $L_{4626}$ | $R^{B1}$ | $R^{B1}$ | $R^{A2}$ | $R^{A2}$ | $R^{B1}$ | S |
| $L_{4627}$ | $R^{B1}$ | $R^{B1}$ | $R^{A27}$ | $R^{A27}$ | $R^{B1}$ | S |
| $L_{4628}$ | $R^{B1}$ | $R^{B1}$ | $R^{A34}$ | $R^{A34}$ | $R^{B1}$ | S |
| $L_{4629}$ | $R^{B2}$ | $R^{B1}$ | $R^{B1}$ | $R^{B1}$ | $R^{B1}$ | S |
| $L_{4630}$ | $R^{B2}$ | $R^{B1}$ | $R^{B2}$ | $R^{B2}$ | $R^{B1}$ | S |

-continued

| | $R^1$ | $R^2$ | $R^7$ | $R^8$ | $R^9$ | X |
|---|---|---|---|---|---|---|
| $L_{A631}$ | $R^{B2}$ | $R^{B1}$ | $R^{B3}$ | $R^{B3}$ | $R^{B1}$ | S |
| $L_{A632}$ | $R^{B2}$ | $R^{B1}$ | $R^{B4}$ | $R^{B4}$ | $R^{B1}$ | S |
| $L_{A633}$ | $R^{B2}$ | $R^{B1}$ | $R^{B5}$ | $R^{B5}$ | $R^{B1}$ | S |
| $L_{A634}$ | $R^{B2}$ | $R^{B1}$ | $R^{B6}$ | $R^{B6}$ | $R^{B1}$ | S |
| $L_{A635}$ | $R^{B2}$ | $R^{B1}$ | $R^{B7}$ | $R^{B7}$ | $R^{B1}$ | S |
| $L_{A636}$ | $R^{B2}$ | $R^{B1}$ | $R^{B8}$ | $R^{B8}$ | $R^{B1}$ | S |
| $L_{A637}$ | $R^{B2}$ | $R^{B1}$ | $R^{B9}$ | $R^{B9}$ | $R^{B1}$ | S |
| $L_{A638}$ | $R^{B2}$ | $R^{B1}$ | $R^{A2}$ | $R^{A2}$ | $R^{B1}$ | S |
| $L_{A639}$ | $R^{B2}$ | $R^{B1}$ | $R^{A27}$ | $R^{A27}$ | $R^{B1}$ | S |
| $L_{A640}$ | $R^{B2}$ | $R^{B1}$ | $R^{A34}$ | $R^{A34}$ | $R^{B1}$ | S |
| $L_{A641}$ | $R^{B2}$ | F | $R^{B1}$ | $R^{B1}$ | $R^{B1}$ | S |
| $L_{A642}$ | $R^{B2}$ | F | $R^{B2}$ | $R^{B2}$ | $R^{B1}$ | S |
| $L_{A643}$ | $R^{B2}$ | F | $R^{B3}$ | $R^{B3}$ | $R^{B1}$ | S |
| $L_{A644}$ | $R^{B2}$ | F | $R^{B4}$ | $R^{B4}$ | $R^{B1}$ | S |
| $L_{A645}$ | $R^{B2}$ | F | $R^{B5}$ | $R^{B5}$ | $R^{B1}$ | S |
| $L_{A646}$ | $R^{B2}$ | F | $R^{B6}$ | $R^{B6}$ | $R^{B1}$ | S |
| $L_{A647}$ | $R^{B2}$ | F | $R^{B7}$ | $R^{B7}$ | $R^{B1}$ | S |
| $L_{A648}$ | $R^{B2}$ | F | $R^{B8}$ | $R^{B8}$ | $R^{B1}$ | S |
| $L_{A649}$ | $R^{B2}$ | F | $R^{B9}$ | $R^{B9}$ | $R^{B1}$ | S |
| $L_{A650}$ | $R^{B2}$ | F | $R^{A2}$ | $R^{A2}$ | $R^{B1}$ | S |
| $L_{A651}$ | $R^{B2}$ | F | $R^{A27}$ | $R^{A27}$ | $R^{B1}$ | S |
| $L_{A652}$ | $R^{B2}$ | F | $R^{A34}$ | $R^{A34}$ | $R^{B1}$ | S |
| $L_{A653}$ | $R^{B3}$ | $R^{B1}$ | $R^{B1}$ | $R^{B1}$ | $R^{B1}$ | S |
| $L_{A654}$ | $R^{B3}$ | $R^{B1}$ | $R^{B2}$ | $R^{B2}$ | $R^{B1}$ | S |
| $L_{A655}$ | $R^{B3}$ | $R^{B1}$ | $R^{B3}$ | $R^{B3}$ | $R^{B1}$ | S |
| $L_{A656}$ | $R^{B3}$ | $R^{B1}$ | $R^{B4}$ | $R^{B4}$ | $R^{B1}$ | S |
| $L_{A657}$ | $R^{B3}$ | $R^{B1}$ | $R^{B5}$ | $R^{B5}$ | $R^{B1}$ | S |
| $L_{A658}$ | $R^{B3}$ | $R^{B1}$ | $R^{B6}$ | $R^{B6}$ | $R^{B1}$ | S |
| $L_{A659}$ | $R^{B3}$ | $R^{B1}$ | $R^{B7}$ | $R^{B7}$ | $R^{B1}$ | S |
| $L_{A660}$ | $R^{B3}$ | $R^{B1}$ | $R^{B8}$ | $R^{B8}$ | $R^{B1}$ | S |
| $L_{A661}$ | $R^{B3}$ | $R^{B1}$ | $R^{B9}$ | $R^{B9}$ | $R^{B1}$ | S |
| $L_{A662}$ | $R^{B3}$ | $R^{B1}$ | $R^{A2}$ | $R^{A2}$ | $R^{B1}$ | S |
| $L_{A663}$ | $R^{B3}$ | $R^{B1}$ | $R^{A27}$ | $R^{A27}$ | $R^{B1}$ | S |
| $L_{A664}$ | $R^{B3}$ | $R^{B1}$ | $R^{A34}$ | $R^{A34}$ | $R^{B1}$ | S |
| $L_{A665}$ | $R^{B1}$ | $R^{B1}$ | $R^{B1}$ | $R^{B1}$ | $R^{B1}$ | O |
| $L_{A666}$ | $R^{B1}$ | $R^{B1}$ | $R^{B1}$ | $R^{B1}$ | $R^{B2}$ | O |
| $L_{A667}$ | $R^{B1}$ | $R^{B1}$ | $R^{B1}$ | $R^{B1}$ | $R^{B3}$ | O |
| $L_{A668}$ | $R^{B1}$ | $R^{B1}$ | $R^{B1}$ | $R^{B1}$ | $R^{B4}$ | O |
| $L_{A669}$ | $R^{B1}$ | $R^{B1}$ | $R^{B1}$ | $R^{B1}$ | $R^{B5}$ | O |
| $L_{A670}$ | $R^{B1}$ | $R^{B1}$ | $R^{B1}$ | $R^{B1}$ | $R^{B6}$ | O |
| $L_{A671}$ | $R^{B1}$ | $R^{B1}$ | $R^{B1}$ | $R^{B1}$ | $R^{B7}$ | O |
| $L_{A672}$ | $R^{B1}$ | $R^{B1}$ | $R^{B1}$ | $R^{B1}$ | $R^{B8}$ | O |
| $L_{A673}$ | $R^{B1}$ | $R^{B1}$ | $R^{B1}$ | $R^{B1}$ | $R^{B9}$ | O |
| $L_{A674}$ | $R^{B1}$ | $R^{B1}$ | $R^{B1}$ | $R^{B1}$ | $R^{A2}$ | O |
| $L_{A675}$ | $R^{B1}$ | $R^{B1}$ | $R^{B1}$ | $R^{B1}$ | $R^{A27}$ | O |
| $L_{A676}$ | $R^{B1}$ | $R^{B1}$ | $R^{B1}$ | $R^{B1}$ | $R^{A34}$ | O |
| $L_{A677}$ | $R^{B2}$ | $R^{B1}$ | $R^{B1}$ | $R^{B1}$ | $R^{B1}$ | O |
| $L_{A678}$ | $R^{B2}$ | $R^{B1}$ | $R^{B1}$ | $R^{B1}$ | $R^{B2}$ | O |
| $L_{A679}$ | $R^{B2}$ | $R^{B1}$ | $R^{B1}$ | $R^{B1}$ | $R^{B3}$ | O |
| $L_{A680}$ | $R^{B2}$ | $R^{B1}$ | $R^{B1}$ | $R^{B1}$ | $R^{B4}$ | O |
| $L_{A681}$ | $R^{B2}$ | $R^{B1}$ | $R^{B1}$ | $R^{B1}$ | $R^{B5}$ | O |
| $L_{A682}$ | $R^{B2}$ | $R^{B1}$ | $R^{B1}$ | $R^{B1}$ | $R^{B6}$ | O |
| $L_{A683}$ | $R^{B2}$ | $R^{B1}$ | $R^{B1}$ | $R^{B1}$ | $R^{B7}$ | O |
| $L_{A684}$ | $R^{B2}$ | $R^{B1}$ | $R^{B1}$ | $R^{B1}$ | $R^{B8}$ | O |
| $L_{A685}$ | $R^{B2}$ | $R^{B1}$ | $R^{B1}$ | $R^{B1}$ | $R^{B9}$ | O |
| $L_{A686}$ | $R^{B2}$ | $R^{B1}$ | $R^{B1}$ | $R^{B1}$ | $R^{A2}$ | O |
| $L_{A687}$ | $R^{B2}$ | $R^{B1}$ | $R^{B1}$ | $R^{B1}$ | $R^{A27}$ | O |
| $L_{A688}$ | $R^{B2}$ | $R^{B1}$ | $R^{B1}$ | $R^{B1}$ | $R^{A34}$ | O |
| $L_{A689}$ | $R^{B2}$ | F | $R^{B1}$ | $R^{B1}$ | $R^{B1}$ | O |
| $L_{A690}$ | $R^{B2}$ | F | $R^{B1}$ | $R^{B1}$ | $R^{B2}$ | O |
| $L_{A691}$ | $R^{B2}$ | F | $R^{B1}$ | $R^{B1}$ | $R^{B3}$ | O |
| $L_{A692}$ | $R^{B2}$ | F | $R^{B1}$ | $R^{B1}$ | $R^{B4}$ | O |
| $L_{A693}$ | $R^{B2}$ | F | $R^{B1}$ | $R^{B1}$ | $R^{B5}$ | O |
| $L_{A694}$ | $R^{B2}$ | F | $R^{B1}$ | $R^{B1}$ | $R^{B6}$ | O |
| $L_{A695}$ | $R^{B2}$ | F | $R^{B1}$ | $R^{B1}$ | $R^{B7}$ | O |
| $L_{A696}$ | $R^{B2}$ | F | $R^{B1}$ | $R^{B1}$ | $R^{B8}$ | O |
| $L_{A697}$ | $R^{B2}$ | F | $R^{B1}$ | $R^{B1}$ | $R^{B9}$ | O |
| $L_{A698}$ | $R^{B2}$ | F | $R^{B1}$ | $R^{B1}$ | $R^{A2}$ | O |
| $L_{A699}$ | $R^{B2}$ | F | $R^{B1}$ | $R^{B1}$ | $R^{A27}$ | O |
| $L_{A700}$ | $R^{B2}$ | F | $R^{B1}$ | $R^{B1}$ | $R^{A34}$ | O |
| $L_{A701}$ | $R^{B3}$ | $R^{B1}$ | $R^{B1}$ | $R^{B1}$ | $R^{B1}$ | O |
| $L_{A702}$ | $R^{B3}$ | $R^{B1}$ | $R^{B1}$ | $R^{B1}$ | $R^{B2}$ | O |
| $L_{A703}$ | $R^{B3}$ | $R^{B1}$ | $R^{B1}$ | $R^{B1}$ | $R^{B3}$ | O |
| $L_{A704}$ | $R^{B3}$ | $R^{B1}$ | $R^{B1}$ | $R^{B1}$ | $R^{B4}$ | O |
| $L_{A705}$ | $R^{B3}$ | $R^{B1}$ | $R^{B1}$ | $R^{B1}$ | $R^{B5}$ | O |
| $L_{A706}$ | $R^{B3}$ | $R^{B1}$ | $R^{B1}$ | $R^{B1}$ | $R^{B6}$ | O |
| $L_{A707}$ | $R^{B3}$ | $R^{B1}$ | $R^{B1}$ | $R^{B1}$ | $R^{B7}$ | O |

-continued

| | $R^1$ | $R^2$ | $R^7$ | $R^8$ | $R^9$ | X |
|---|---|---|---|---|---|---|
| $L_{A708}$ | $R^{B3}$ | $R^{B1}$ | $R^{B1}$ | $R^{B1}$ | $R^{B8}$ | O |
| $L_{A709}$ | $R^{B3}$ | $R^{B1}$ | $R^{B1}$ | $R^{B1}$ | $R^{B9}$ | O |
| $L_{A710}$ | $R^{B3}$ | $R^{B1}$ | $R^{B1}$ | $R^{B1}$ | $R^{A2}$ | O |
| $L_{A711}$ | $R^{B3}$ | $R^{B1}$ | $R^{B1}$ | $R^{B1}$ | $R^{A27}$ | O |
| $L_{A712}$ | $R^{B3}$ | $R^{B1}$ | $R^{B1}$ | $R^{B1}$ | $R^{A34}$ | O |
| $L_{A713}$ | $R^{B1}$ | $R^{B1}$ | $R^{B1}$ | $R^{B1}$ | $R^{B1}$ | O |
| $L_{A714}$ | $R^{B1}$ | $R^{B1}$ | $R^{B1}$ | $R^{B2}$ | $R^{B1}$ | O |
| $L_{A715}$ | $R^{B1}$ | $R^{B1}$ | $R^{B1}$ | $R^{B3}$ | $R^{B1}$ | O |
| $L_{A716}$ | $R^{B1}$ | $R^{B1}$ | $R^{B1}$ | $R^{B4}$ | $R^{B1}$ | O |
| $L_{A717}$ | $R^{B1}$ | $R^{B1}$ | $R^{B1}$ | $R^{B5}$ | $R^{B1}$ | O |
| $L_{A718}$ | $R^{B1}$ | $R^{B1}$ | $R^{B1}$ | $R^{B6}$ | $R^{B1}$ | O |
| $L_{A719}$ | $R^{B1}$ | $R^{B1}$ | $R^{B1}$ | $R^{B7}$ | $R^{B1}$ | O |
| $L_{A720}$ | $R^{B1}$ | $R^{B1}$ | $R^{B1}$ | $R^{B8}$ | $R^{B1}$ | O |
| $L_{A721}$ | $R^{B1}$ | $R^{B1}$ | $R^{B1}$ | $R^{B9}$ | $R^{B1}$ | O |
| $L_{A722}$ | $R^{B1}$ | $R^{B1}$ | $R^{B1}$ | $R^{A2}$ | $R^{B1}$ | O |
| $L_{A723}$ | $R^{B1}$ | $R^{B1}$ | $R^{B1}$ | $R^{A27}$ | $R^{B1}$ | O |
| $L_{A724}$ | $R^{B1}$ | $R^{B1}$ | $R^{B1}$ | $R^{A34}$ | $R^{B1}$ | O |
| $L_{A725}$ | $R^{B2}$ | $R^{B1}$ | $R^{B1}$ | $R^{B1}$ | $R^{B1}$ | O |
| $L_{A726}$ | $R^{B2}$ | $R^{B1}$ | $R^{B1}$ | $R^{B2}$ | $R^{B1}$ | O |
| $L_{A727}$ | $R^{B2}$ | $R^{B1}$ | $R^{B1}$ | $R^{B3}$ | $R^{B1}$ | O |
| $L_{A728}$ | $R^{B2}$ | $R^{B1}$ | $R^{B1}$ | $R^{B4}$ | $R^{B1}$ | O |
| $L_{A729}$ | $R^{B2}$ | $R^{B1}$ | $R^{B1}$ | $R^{B5}$ | $R^{B1}$ | O |
| $L_{A730}$ | $R^{B2}$ | $R^{B1}$ | $R^{B1}$ | $R^{B6}$ | $R^{B1}$ | O |
| $L_{A731}$ | $R^{B2}$ | $R^{B1}$ | $R^{B1}$ | $R^{B7}$ | $R^{B1}$ | O |
| $L_{A732}$ | $R^{B2}$ | $R^{B1}$ | $R^{B1}$ | $R^{B8}$ | $R^{B1}$ | O |
| $L_{A733}$ | $R^{B2}$ | $R^{B1}$ | $R^{B1}$ | $R^{B9}$ | $R^{B1}$ | O |
| $L_{A734}$ | $R^{B2}$ | $R^{B1}$ | $R^{B1}$ | $R^{A2}$ | $R^{B1}$ | O |
| $L_{A735}$ | $R^{B2}$ | $R^{B1}$ | $R^{B1}$ | $R^{A27}$ | $R^{B1}$ | O |
| $L_{A736}$ | $R^{B2}$ | $R^{B1}$ | $R^{B1}$ | $R^{A34}$ | $R^{B1}$ | O |
| $L_{A737}$ | $R^{B2}$ | F | $R^{B1}$ | $R^{B1}$ | $R^{B1}$ | O |
| $L_{A738}$ | $R^{B2}$ | F | $R^{B1}$ | $R^{B2}$ | $R^{B1}$ | O |
| $L_{A739}$ | $R^{B2}$ | F | $R^{B1}$ | $R^{B3}$ | $R^{B1}$ | O |
| $L_{A740}$ | $R^{B2}$ | F | $R^{B1}$ | $R^{B4}$ | $R^{B1}$ | O |
| $L_{A741}$ | $R^{B2}$ | F | $R^{B1}$ | $R^{B5}$ | $R^{B1}$ | O |
| $L_{A742}$ | $R^{B2}$ | F | $R^{B1}$ | $R^{B6}$ | $R^{B1}$ | O |
| $L_{A743}$ | $R^{B2}$ | F | $R^{B1}$ | $R^{B7}$ | $R^{B1}$ | O |
| $L_{A744}$ | $R^{B2}$ | F | $R^{B1}$ | $R^{B8}$ | $R^{B1}$ | O |
| $L_{A745}$ | $R^{B2}$ | F | $R^{B1}$ | $R^{B9}$ | $R^{B1}$ | O |
| $L_{A746}$ | $R^{B2}$ | F | $R^{B1}$ | $R^{A2}$ | $R^{B1}$ | O |
| $L_{A747}$ | $R^{B2}$ | F | $R^{B1}$ | $R^{A27}$ | $R^{B1}$ | O |
| $L_{A748}$ | $R^{B2}$ | F | $R^{B1}$ | $R^{A34}$ | $R^{B1}$ | O |
| $L_{A749}$ | $R^{B3}$ | $R^{B1}$ | $R^{B1}$ | $R^{B1}$ | $R^{B1}$ | O |
| $L_{A750}$ | $R^{B3}$ | $R^{B1}$ | $R^{B1}$ | $R^{B2}$ | $R^{B1}$ | O |
| $L_{A751}$ | $R^{B3}$ | $R^{B1}$ | $R^{B1}$ | $R^{B3}$ | $R^{B1}$ | O |
| $L_{A752}$ | $R^{B3}$ | $R^{B1}$ | $R^{B1}$ | $R^{B4}$ | $R^{B1}$ | O |
| $L_{A753}$ | $R^{B3}$ | $R^{B1}$ | $R^{B1}$ | $R^{B5}$ | $R^{B1}$ | O |
| $L_{A754}$ | $R^{B3}$ | $R^{B1}$ | $R^{B1}$ | $R^{B6}$ | $R^{B1}$ | O |
| $L_{A755}$ | $R^{B3}$ | $R^{B1}$ | $R^{B1}$ | $R^{B7}$ | $R^{B1}$ | O |
| $L_{A756}$ | $R^{B3}$ | $R^{B1}$ | $R^{B1}$ | $R^{B8}$ | $R^{B1}$ | O |
| $L_{A757}$ | $R^{B3}$ | $R^{B1}$ | $R^{B1}$ | $R^{B9}$ | $R^{B1}$ | O |
| $L_{A758}$ | $R^{B3}$ | $R^{B1}$ | $R^{B1}$ | $R^{A2}$ | $R^{B1}$ | O |
| $L_{A759}$ | $R^{B3}$ | $R^{B1}$ | $R^{B1}$ | $R^{A27}$ | $R^{B1}$ | O |
| $L_{A760}$ | $R^{B3}$ | $R^{B1}$ | $R^{B1}$ | $R^{A34}$ | $R^{B1}$ | O |
| $L_{A761}$ | $R^{B1}$ | $R^{B1}$ | $R^{B1}$ | $R^{B1}$ | $R^{B1}$ | O |
| $L_{A762}$ | $R^{B1}$ | $R^{B1}$ | $R^{B2}$ | $R^{B1}$ | $R^{B1}$ | O |
| $L_{A763}$ | $R^{B1}$ | $R^{B1}$ | $R^{B3}$ | $R^{B1}$ | $R^{B1}$ | O |
| $L_{A764}$ | $R^{B1}$ | $R^{B1}$ | $R^{B4}$ | $R^{B1}$ | $R^{B1}$ | O |
| $L_{A765}$ | $R^{B1}$ | $R^{B1}$ | $R^{B5}$ | $R^{B1}$ | $R^{B1}$ | O |
| $L_{A766}$ | $R^{B1}$ | $R^{B1}$ | $R^{B6}$ | $R^{B1}$ | $R^{B1}$ | O |
| $L_{A767}$ | $R^{B1}$ | $R^{B1}$ | $R^{B7}$ | $R^{B1}$ | $R^{B1}$ | O |
| $L_{A768}$ | $R^{B1}$ | $R^{B1}$ | $R^{B8}$ | $R^{B1}$ | $R^{B1}$ | O |
| $L_{A769}$ | $R^{B1}$ | $R^{B1}$ | $R^{B9}$ | $R^{B1}$ | $R^{B1}$ | O |
| $L_{A770}$ | $R^{B1}$ | $R^{B1}$ | $R^{A2}$ | $R^{B1}$ | $R^{B1}$ | O |
| $L_{A771}$ | $R^{B1}$ | $R^{B1}$ | $R^{A27}$ | $R^{B1}$ | $R^{B1}$ | O |
| $L_{A772}$ | $R^{B1}$ | $R^{B1}$ | $R^{A34}$ | $R^{B1}$ | $R^{B1}$ | O |
| $L_{A773}$ | $R^{B2}$ | $R^{B1}$ | $R^{B1}$ | $R^{B1}$ | $R^{B1}$ | O |
| $L_{A774}$ | $R^{B2}$ | $R^{B1}$ | $R^{B2}$ | $R^{B1}$ | $R^{B1}$ | O |
| $L_{A775}$ | $R^{B2}$ | $R^{B1}$ | $R^{B3}$ | $R^{B1}$ | $R^{B1}$ | O |
| $L_{A776}$ | $R^{B2}$ | $R^{B1}$ | $R^{B4}$ | $R^{B1}$ | $R^{B1}$ | O |
| $L_{A777}$ | $R^{B2}$ | $R^{B1}$ | $R^{B5}$ | $R^{B1}$ | $R^{B1}$ | O |
| $L_{A778}$ | $R^{B2}$ | $R^{B1}$ | $R^{B6}$ | $R^{B1}$ | $R^{B1}$ | O |
| $L_{A779}$ | $R^{B2}$ | $R^{B1}$ | $R^{B7}$ | $R^{B1}$ | $R^{B1}$ | O |
| $L_{A780}$ | $R^{B2}$ | $R^{B1}$ | $R^{B8}$ | $R^{B1}$ | $R^{B1}$ | O |
| $L_{A781}$ | $R^{B2}$ | $R^{B1}$ | $R^{B9}$ | $R^{B1}$ | $R^{B1}$ | O |
| $L_{A782}$ | $R^{B2}$ | $R^{B1}$ | $R^{A2}$ | $R^{B1}$ | $R^{B1}$ | O |
| $L_{A783}$ | $R^{B2}$ | $R^{B1}$ | $R^{A27}$ | $R^{B1}$ | $R^{B1}$ | O |
| $L_{A784}$ | $R^{B2}$ | $R^{B1}$ | $R^{A34}$ | $R^{B1}$ | $R^{B1}$ | O |

-continued

| | $R^1$ | $R^2$ | $R^7$ | $R^8$ | $R^9$ | X |
|---|---|---|---|---|---|---|
| $L_{4785}$ | $R^{B2}$ | F | $R^{B1}$ | $R^{B1}$ | $R^{B1}$ | O |
| $L_{4786}$ | $R^{B2}$ | F | $R^{B2}$ | $R^{B1}$ | $R^{B1}$ | O |
| $L_{4787}$ | $R^{B2}$ | F | $R^{B3}$ | $R^{B1}$ | $R^{B1}$ | O |
| $L_{4788}$ | $R^{B2}$ | F | $R^{B4}$ | $R^{B1}$ | $R^{B1}$ | O |
| $L_{4789}$ | $R^{B2}$ | F | $R^{B5}$ | $R^{B1}$ | $R^{B1}$ | O |
| $L_{4790}$ | $R^{B2}$ | F | $R^{B6}$ | $R^{B1}$ | $R^{B1}$ | O |
| $L_{4791}$ | $R^{B2}$ | F | $R^{B7}$ | $R^{B1}$ | $R^{B1}$ | O |
| $L_{4792}$ | $R^{B2}$ | F | $R^{B8}$ | $R^{B1}$ | $R^{B1}$ | O |
| $L_{4793}$ | $R^{B2}$ | F | $R^{B9}$ | $R^{B1}$ | $R^{B1}$ | O |
| $L_{4794}$ | $R^{B2}$ | F | $R^{A2}$ | $R^{B1}$ | $R^{B1}$ | O |
| $L_{4795}$ | $R^{B2}$ | F | $R^{A27}$ | $R^{B1}$ | $R^{B1}$ | O |
| $L_{4796}$ | $R^{B2}$ | F | $R^{A34}$ | $R^{B1}$ | $R^{B1}$ | O |
| $L_{4797}$ | $R^{B3}$ | $R^{B1}$ | $R^{B1}$ | $R^{B1}$ | $R^{B1}$ | O |
| $L_{4798}$ | $R^{B3}$ | $R^{B1}$ | $R^{B2}$ | $R^{B1}$ | $R^{B1}$ | O |
| $L_{4799}$ | $R^{B3}$ | $R^{B1}$ | $R^{B3}$ | $R^{B1}$ | $R^{B1}$ | O |
| $L_{4800}$ | $R^{B3}$ | $R^{B1}$ | $R^{B4}$ | $R^{B1}$ | $R^{B1}$ | O |
| $L_{4801}$ | $R^{B3}$ | $R^{B1}$ | $R^{B5}$ | $R^{B1}$ | $R^{B1}$ | O |
| $L_{4802}$ | $R^{B3}$ | $R^{B1}$ | $R^{B6}$ | $R^{B1}$ | $R^{B1}$ | O |
| $L_{4803}$ | $R^{B3}$ | $R^{B1}$ | $R^{B7}$ | $R^{B1}$ | $R^{B1}$ | O |
| $L_{4804}$ | $R^{B3}$ | $R^{B1}$ | $R^{B8}$ | $R^{B1}$ | $R^{B1}$ | O |
| $L_{4805}$ | $R^{B3}$ | $R^{B1}$ | $R^{B9}$ | $R^{B1}$ | $R^{B1}$ | O |
| $L_{4806}$ | $R^{B3}$ | $R^{B1}$ | $R^{A2}$ | $R^{B1}$ | $R^{B1}$ | O |
| $L_{4807}$ | $R^{B3}$ | $R^{B1}$ | $R^{A27}$ | $R^{B1}$ | $R^{B1}$ | O |
| $L_{4808}$ | $R^{B3}$ | $R^{B1}$ | $R^{A34}$ | $R^{B1}$ | $R^{B1}$ | O |
| $L_{4809}$ | $R^{B1}$ | $R^{B1}$ | $R^{B1}$ | $R^{B1}$ | $R^{B1}$ | O |
| $L_{4810}$ | $R^{B1}$ | $R^{B1}$ | $R^{B2}$ | $R^{B1}$ | $R^{B2}$ | O |
| $L_{4811}$ | $R^{B1}$ | $R^{B1}$ | $R^{B3}$ | $R^{B1}$ | $R^{B3}$ | O |
| $L_{4812}$ | $R^{B1}$ | $R^{B1}$ | $R^{B4}$ | $R^{B1}$ | $R^{B4}$ | O |
| $L_{4813}$ | $R^{B1}$ | $R^{B1}$ | $R^{B5}$ | $R^{B1}$ | $R^{B5}$ | O |
| $L_{4814}$ | $R^{B1}$ | $R^{B1}$ | $R^{B6}$ | $R^{B1}$ | $R^{B6}$ | O |
| $L_{4815}$ | $R^{B1}$ | $R^{B1}$ | $R^{B7}$ | $R^{B1}$ | $R^{B7}$ | O |
| $L_{4816}$ | $R^{B1}$ | $R^{B1}$ | $R^{B8}$ | $R^{B1}$ | $R^{B8}$ | O |
| $L_{4817}$ | $R^{B1}$ | $R^{B1}$ | $R^{B9}$ | $R^{B1}$ | $R^{B9}$ | O |
| $L_{4818}$ | $R^{B1}$ | $R^{B1}$ | $R^{A2}$ | $R^{B1}$ | $R^{A2}$ | O |
| $L_{4819}$ | $R^{B1}$ | $R^{B1}$ | $R^{A27}$ | $R^{B1}$ | $R^{A27}$ | O |
| $L_{4820}$ | $R^{B1}$ | $R^{B1}$ | $R^{A34}$ | $R^{B1}$ | $R^{A34}$ | O |
| $L_{4821}$ | $R^{B2}$ | $R^{B1}$ | $R^{B1}$ | $R^{B1}$ | $R^{B1}$ | O |
| $L_{4822}$ | $R^{B2}$ | $R^{B1}$ | $R^{B2}$ | $R^{B1}$ | $R^{B2}$ | O |
| $L_{4823}$ | $R^{B2}$ | $R^{B1}$ | $R^{B3}$ | $R^{B1}$ | $R^{B3}$ | O |
| $L_{4824}$ | $R^{B2}$ | $R^{B1}$ | $R^{B4}$ | $R^{B1}$ | $R^{B4}$ | O |
| $L_{4825}$ | $R^{B2}$ | $R^{B1}$ | $R^{B5}$ | $R^{B1}$ | $R^{B5}$ | O |
| $L_{4826}$ | $R^{B2}$ | $R^{B1}$ | $R^{B6}$ | $R^{B1}$ | $R^{B6}$ | O |
| $L_{4827}$ | $R^{B2}$ | $R^{B1}$ | $R^{B7}$ | $R^{B1}$ | $R^{B7}$ | O |
| $L_{4828}$ | $R^{B2}$ | $R^{B1}$ | $R^{B8}$ | $R^{B1}$ | $R^{B8}$ | O |
| $L_{4829}$ | $R^{B2}$ | $R^{B1}$ | $R^{B9}$ | $R^{B1}$ | $R^{B9}$ | O |
| $L_{4830}$ | $R^{B2}$ | $R^{B1}$ | $R^{A2}$ | $R^{B1}$ | $R^{A2}$ | O |
| $L_{4831}$ | $R^{B2}$ | $R^{B1}$ | $R^{A27}$ | $R^{B1}$ | $R^{A27}$ | O |
| $L_{4832}$ | $R^{B2}$ | $R^{B1}$ | $R^{A34}$ | $R^{B1}$ | $R^{A34}$ | O |
| $L_{4833}$ | $R^{B2}$ | F | $R^{B1}$ | $R^{B1}$ | $R^{B1}$ | O |
| $L_{4834}$ | $R^{B2}$ | F | $R^{B2}$ | $R^{B1}$ | $R^{B2}$ | O |
| $L_{4835}$ | $R^{B2}$ | F | $R^{B3}$ | $R^{B1}$ | $R^{B3}$ | O |
| $L_{4836}$ | $R^{B2}$ | F | $R^{B4}$ | $R^{B1}$ | $R^{B4}$ | O |
| $L_{4837}$ | $R^{B2}$ | F | $R^{B5}$ | $R^{B1}$ | $R^{B5}$ | O |
| $L_{4838}$ | $R^{B2}$ | F | $R^{B6}$ | $R^{B1}$ | $R^{B6}$ | O |
| $L_{4839}$ | $R^{B2}$ | F | $R^{B7}$ | $R^{B1}$ | $R^{B7}$ | O |
| $L_{4840}$ | $R^{B2}$ | F | $R^{B8}$ | $R^{B1}$ | $R^{B8}$ | O |
| $L_{4841}$ | $R^{B2}$ | F | $R^{B9}$ | $R^{B1}$ | $R^{B9}$ | O |
| $L_{4842}$ | $R^{B2}$ | F | $R^{A2}$ | $R^{B1}$ | $R^{A2}$ | O |
| $L_{4843}$ | $R^{B2}$ | F | $R^{A27}$ | $R^{B1}$ | $R^{A27}$ | O |
| $L_{4844}$ | $R^{B2}$ | F | $R^{A34}$ | $R^{B1}$ | $R^{A34}$ | O |
| $L_{4845}$ | $R^{B3}$ | $R^{B1}$ | $R^{B1}$ | $R^{B1}$ | $R^{B1}$ | O |
| $L_{4846}$ | $R^{B3}$ | $R^{B1}$ | $R^{B2}$ | $R^{B1}$ | $R^{B2}$ | O |
| $L_{4847}$ | $R^{B3}$ | $R^{B1}$ | $R^{B3}$ | $R^{B1}$ | $R^{B3}$ | O |
| $L_{4848}$ | $R^{B3}$ | $R^{B1}$ | $R^{B4}$ | $R^{B1}$ | $R^{B4}$ | O |
| $L_{4849}$ | $R^{B3}$ | $R^{B1}$ | $R^{B5}$ | $R^{B1}$ | $R^{B5}$ | O |
| $L_{4850}$ | $R^{B3}$ | $R^{B1}$ | $R^{B6}$ | $R^{B1}$ | $R^{B6}$ | O |
| $L_{4851}$ | $R^{B3}$ | $R^{B1}$ | $R^{B7}$ | $R^{B1}$ | $R^{B7}$ | O |
| $L_{4852}$ | $R^{B3}$ | $R^{B1}$ | $R^{B8}$ | $R^{B1}$ | $R^{B8}$ | O |
| $L_{4853}$ | $R^{B3}$ | $R^{B1}$ | $R^{B9}$ | $R^{B1}$ | $R^{B9}$ | O |
| $L_{4854}$ | $R^{B3}$ | $R^{B1}$ | $R^{A2}$ | $R^{B1}$ | $R^{A2}$ | O |
| $L_{4855}$ | $R^{B3}$ | $R^{B1}$ | $R^{A27}$ | $R^{B1}$ | $R^{A27}$ | O |
| $L_{4856}$ | $R^{B3}$ | $R^{B1}$ | $R^{A34}$ | $R^{B1}$ | $R^{A34}$ | O |
| $L_{4857}$ | $R^{B1}$ | $R^{B1}$ | $R^{B1}$ | $R^{B1}$ | $R^{B1}$ | O |
| $L_{4858}$ | $R^{B1}$ | $R^{B1}$ | $R^{B1}$ | $R^{B2}$ | $R^{B2}$ | O |
| $L_{4859}$ | $R^{B1}$ | $R^{B1}$ | $R^{B1}$ | $R^{B3}$ | $R^{B3}$ | O |
| $L_{4860}$ | $R^{B1}$ | $R^{B1}$ | $R^{B1}$ | $R^{B4}$ | $R^{B4}$ | O |
| $L_{4861}$ | $R^{B1}$ | $R^{B1}$ | $R^{B1}$ | $R^{B5}$ | $R^{B5}$ | O |

-continued

| | $R^1$ | $R^2$ | $R^7$ | $R^8$ | $R^9$ | X |
|---|---|---|---|---|---|---|
| $L_{4862}$ | $R^{B1}$ | $R^{B1}$ | $R^{B1}$ | $R^{B6}$ | $R^{B6}$ | O |
| $L_{4863}$ | $R^{B1}$ | $R^{B1}$ | $R^{B1}$ | $R^{B7}$ | $R^{B7}$ | O |
| $L_{4864}$ | $R^{B1}$ | $R^{B1}$ | $R^{B1}$ | $R^{B8}$ | $R^{B8}$ | O |
| $L_{4865}$ | $R^{B1}$ | $R^{B1}$ | $R^{B1}$ | $R^{B9}$ | $R^{B9}$ | O |
| $L_{4866}$ | $R^{B1}$ | $R^{B1}$ | $R^{B1}$ | $R^{A2}$ | $R^{A2}$ | O |
| $L_{4867}$ | $R^{B1}$ | $R^{B1}$ | $R^{B1}$ | $R^{A27}$ | $R^{A27}$ | O |
| $L_{4868}$ | $R^{B1}$ | $R^{B1}$ | $R^{B1}$ | $R^{A34}$ | $R^{A34}$ | O |
| $L_{4869}$ | $R^{B2}$ | $R^{B1}$ | $R^{B1}$ | $R^{B1}$ | $R^{B1}$ | O |
| $L_{4870}$ | $R^{B2}$ | $R^{B1}$ | $R^{B1}$ | $R^{B2}$ | $R^{B2}$ | O |
| $L_{4871}$ | $R^{B2}$ | $R^{B1}$ | $R^{B1}$ | $R^{B3}$ | $R^{B3}$ | O |
| $L_{4872}$ | $R^{B2}$ | $R^{B1}$ | $R^{B1}$ | $R^{B4}$ | $R^{B4}$ | O |
| $L_{4873}$ | $R^{B2}$ | $R^{B1}$ | $R^{B1}$ | $R^{B5}$ | $R^{B5}$ | O |
| $L_{4874}$ | $R^{B2}$ | $R^{B1}$ | $R^{B1}$ | $R^{B6}$ | $R^{B6}$ | O |
| $L_{4875}$ | $R^{B2}$ | $R^{B1}$ | $R^{B1}$ | $R^{B7}$ | $R^{B7}$ | O |
| $L_{4876}$ | $R^{B2}$ | $R^{B1}$ | $R^{B1}$ | $R^{B8}$ | $R^{B8}$ | O |
| $L_{4877}$ | $R^{B2}$ | $R^{B1}$ | $R^{B1}$ | $R^{B9}$ | $R^{B9}$ | O |
| $L_{4878}$ | $R^{B2}$ | $R^{B1}$ | $R^{B1}$ | $R^{A2}$ | $R^{A2}$ | O |
| $L_{4879}$ | $R^{B2}$ | $R^{B1}$ | $R^{B1}$ | $R^{A27}$ | $R^{A27}$ | O |
| $L_{4880}$ | $R^{B2}$ | $R^{B1}$ | $R^{B1}$ | $R^{A34}$ | $R^{A34}$ | O |
| $L_{4881}$ | $R^{B2}$ | F | $R^{B1}$ | $R^{B1}$ | $R^{B1}$ | O |
| $L_{4882}$ | $R^{B2}$ | F | $R^{B1}$ | $R^{B2}$ | $R^{B2}$ | O |
| $L_{4883}$ | $R^{B2}$ | F | $R^{B1}$ | $R^{B3}$ | $R^{B3}$ | O |
| $L_{4884}$ | $R^{B2}$ | F | $R^{B1}$ | $R^{B4}$ | $R^{B4}$ | O |
| $L_{4885}$ | $R^{B2}$ | F | $R^{B1}$ | $R^{B5}$ | $R^{B5}$ | O |
| $L_{4886}$ | $R^{B2}$ | F | $R^{B1}$ | $R^{B6}$ | $R^{B6}$ | O |
| $L_{4887}$ | $R^{B2}$ | F | $R^{B1}$ | $R^{B7}$ | $R^{B7}$ | O |
| $L_{4888}$ | $R^{B2}$ | F | $R^{B1}$ | $R^{B8}$ | $R^{B8}$ | O |
| $L_{4889}$ | $R^{B2}$ | F | $R^{B1}$ | $R^{B9}$ | $R^{B9}$ | O |
| $L_{4890}$ | $R^{B2}$ | F | $R^{B1}$ | $R^{A2}$ | $R^{A2}$ | O |
| $L_{4891}$ | $R^{B2}$ | F | $R^{B1}$ | $R^{A27}$ | $R^{A27}$ | O |
| $L_{4892}$ | $R^{B2}$ | F | $R^{B1}$ | $R^{A34}$ | $R^{A34}$ | O |
| $L_{4893}$ | $R^{B3}$ | $R^{B1}$ | $R^{B1}$ | $R^{B1}$ | $R^{B1}$ | O |
| $L_{4894}$ | $R^{B3}$ | $R^{B1}$ | $R^{B1}$ | $R^{B2}$ | $R^{B2}$ | O |
| $L_{4895}$ | $R^{B3}$ | $R^{B1}$ | $R^{B1}$ | $R^{B3}$ | $R^{B3}$ | O |
| $L_{4896}$ | $R^{B3}$ | $R^{B1}$ | $R^{B1}$ | $R^{B4}$ | $R^{B4}$ | O |
| $L_{4897}$ | $R^{B3}$ | $R^{B1}$ | $R^{B1}$ | $R^{B5}$ | $R^{B5}$ | O |
| $L_{4898}$ | $R^{B3}$ | $R^{B1}$ | $R^{B1}$ | $R^{B6}$ | $R^{B6}$ | O |
| $L_{4899}$ | $R^{B3}$ | $R^{B1}$ | $R^{B1}$ | $R^{B7}$ | $R^{B7}$ | O |
| $L_{4900}$ | $R^{B3}$ | $R^{B1}$ | $R^{B1}$ | $R^{B8}$ | $R^{B8}$ | O |
| $L_{4901}$ | $R^{B3}$ | $R^{B1}$ | $R^{B1}$ | $R^{B9}$ | $R^{B9}$ | O |
| $L_{4902}$ | $R^{B3}$ | $R^{B1}$ | $R^{B1}$ | $R^{A2}$ | $R^{A2}$ | O |
| $L_{4903}$ | $R^{B3}$ | $R^{B1}$ | $R^{B1}$ | $R^{A27}$ | $R^{A27}$ | O |
| $L_{4904}$ | $R^{B3}$ | $R^{B1}$ | $R^{B1}$ | $R^{A34}$ | $R^{A34}$ | O |
| $L_{4905}$ | $R^{B1}$ | $R^{B1}$ | $R^{B1}$ | $R^{B1}$ | $R^{B1}$ | O |
| $L_{4906}$ | $R^{B1}$ | $R^{B1}$ | $R^{B2}$ | $R^{B2}$ | $R^{B1}$ | O |
| $L_{4907}$ | $R^{B1}$ | $R^{B1}$ | $R^{B3}$ | $R^{B3}$ | $R^{B1}$ | O |
| $L_{4908}$ | $R^{B1}$ | $R^{B1}$ | $R^{B4}$ | $R^{B4}$ | $R^{B1}$ | O |
| $L_{4909}$ | $R^{B1}$ | $R^{B1}$ | $R^{B5}$ | $R^{B5}$ | $R^{B1}$ | O |
| $L_{4910}$ | $R^{B1}$ | $R^{B1}$ | $R^{B6}$ | $R^{B6}$ | $R^{B1}$ | O |
| $L_{4911}$ | $R^{B1}$ | $R^{B1}$ | $R^{B7}$ | $R^{B7}$ | $R^{B1}$ | O |
| $L_{4912}$ | $R^{B1}$ | $R^{B1}$ | $R^{B8}$ | $R^{B8}$ | $R^{B1}$ | O |
| $L_{4913}$ | $R^{B1}$ | $R^{B1}$ | $R^{B9}$ | $R^{B9}$ | $R^{B1}$ | O |
| $L_{4914}$ | $R^{B1}$ | $R^{B1}$ | $R^{A2}$ | $R^{A2}$ | $R^{B1}$ | O |
| $L_{4915}$ | $R^{B1}$ | $R^{B1}$ | $R^{A27}$ | $R^{A27}$ | $R^{B1}$ | O |
| $L_{4916}$ | $R^{B1}$ | $R^{B1}$ | $R^{A34}$ | $R^{A34}$ | $R^{B1}$ | O |
| $L_{4917}$ | $R^{B2}$ | $R^{B1}$ | $R^{B1}$ | $R^{B1}$ | $R^{B1}$ | O |
| $L_{4918}$ | $R^{B2}$ | $R^{B1}$ | $R^{B2}$ | $R^{B2}$ | $R^{B1}$ | O |
| $L_{4919}$ | $R^{B2}$ | $R^{B1}$ | $R^{B3}$ | $R^{B3}$ | $R^{B1}$ | O |
| $L_{4920}$ | $R^{B2}$ | $R^{B1}$ | $R^{B4}$ | $R^{B4}$ | $R^{B1}$ | O |
| $L_{4921}$ | $R^{B2}$ | $R^{B1}$ | $R^{B5}$ | $R^{B5}$ | $R^{B1}$ | O |
| $L_{4922}$ | $R^{B2}$ | $R^{B1}$ | $R^{B6}$ | $R^{B6}$ | $R^{B1}$ | O |
| $L_{4923}$ | $R^{B2}$ | $R^{B1}$ | $R^{B7}$ | $R^{B7}$ | $R^{B1}$ | O |
| $L_{4924}$ | $R^{B2}$ | $R^{B1}$ | $R^{B8}$ | $R^{B8}$ | $R^{B1}$ | O |
| $L_{4925}$ | $R^{B2}$ | $R^{B1}$ | $R^{B9}$ | $R^{B9}$ | $R^{B1}$ | O |
| $L_{4926}$ | $R^{B2}$ | $R^{B1}$ | $R^{A2}$ | $R^{A2}$ | $R^{B1}$ | O |
| $L_{4927}$ | $R^{B2}$ | $R^{B1}$ | $R^{A27}$ | $R^{A27}$ | $R^{B1}$ | O |
| $L_{4928}$ | $R^{B2}$ | $R^{B1}$ | $R^{A34}$ | $R^{A34}$ | $R^{B1}$ | O |
| $L_{4929}$ | $R^{B2}$ | F | $R^{B1}$ | $R^{B1}$ | $R^{B1}$ | O |
| $L_{4930}$ | $R^{B2}$ | F | $R^{B2}$ | $R^{B2}$ | $R^{B1}$ | O |
| $L_{4931}$ | $R^{B2}$ | F | $R^{B3}$ | $R^{B3}$ | $R^{B1}$ | O |
| $L_{4932}$ | $R^{B2}$ | F | $R^{B4}$ | $R^{B4}$ | $R^{B1}$ | O |
| $L_{4933}$ | $R^{B2}$ | F | $R^{B5}$ | $R^{B5}$ | $R^{B1}$ | O |
| $L_{4934}$ | $R^{B2}$ | F | $R^{B6}$ | $R^{B6}$ | $R^{B1}$ | O |
| $L_{4935}$ | $R^{B2}$ | F | $R^{B7}$ | $R^{B7}$ | $R^{B1}$ | O |
| $L_{4936}$ | $R^{B2}$ | F | $R^{B8}$ | $R^{B8}$ | $R^{B1}$ | O |
| $L_{4937}$ | $R^{B2}$ | F | $R^{B9}$ | $R^{B9}$ | $R^{B1}$ | O |
| $L_{4938}$ | $R^{B2}$ | F | $R^{A2}$ | $R^{A2}$ | $R^{B1}$ | O |

-continued

| | $R^1$ | $R^2$ | $R^7$ | $R^8$ | $R^9$ | X |
|---|---|---|---|---|---|---|
| $L_{A939}$ | $R^{B2}$ | F | $R^{A27}$ | $R^{A27}$ | $R^{B1}$ | O |
| $L_{A940}$ | $R^{B2}$ | F | $R^{A34}$ | $R^{A34}$ | $R^{B1}$ | O |
| $L_{A941}$ | $R^{B3}$ | $R^{B1}$ | $R^{B1}$ | $R^{B1}$ | $R^{B1}$ | O |
| $L_{A942}$ | $R^{B3}$ | $R^{B1}$ | $R^{B2}$ | $R^{B2}$ | $R^{B1}$ | O |
| $L_{A943}$ | $R^{B3}$ | $R^{B1}$ | $R^{B3}$ | $R^{B3}$ | $R^{B1}$ | O |
| $L_{A944}$ | $R^{B3}$ | $R^{B1}$ | $R^{B4}$ | $R^{B4}$ | $R^{B1}$ | O |
| $L_{A945}$ | $R^{B3}$ | $R^{B1}$ | $R^{B5}$ | $R^{B5}$ | $R^{B1}$ | O |
| $L_{A946}$ | $R^{B3}$ | $R^{B1}$ | $R^{B6}$ | $R^{B6}$ | $R^{B1}$ | O |
| $L_{A947}$ | $R^{B3}$ | $R^{B1}$ | $R^{B7}$ | $R^{B7}$ | $R^{B1}$ | O |
| $L_{A948}$ | $R^{B3}$ | $R^{B1}$ | $R^{B8}$ | $R^{B8}$ | $R^{B1}$ | O |
| $L_{A949}$ | $R^{B3}$ | $R^{B1}$ | $R^{B9}$ | $R^{B9}$ | $R^{B1}$ | O |
| $L_{A950}$ | $R^{B3}$ | $R^{B1}$ | $R^{A2}$ | $R^{A2}$ | $R^{B1}$ | O |
| $L_{A951}$ | $R^{B3}$ | $R^{B1}$ | $R^{A27}$ | $R^{A27}$ | $R^{B1}$ | O |
| $L_{A952}$ | $R^{B3}$ | $R^{B1}$ | $R^{A34}$ | $R^{A34}$ | $R^{B1}$ | O |

for $L_{A953}$ through $L_{A1144}$, $L_A$ has a structure of

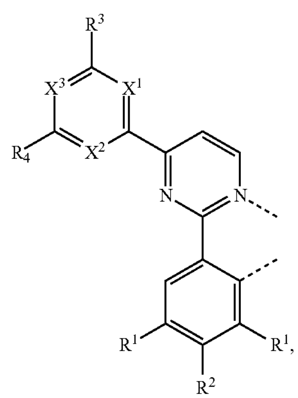

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A953}$ | $R^{B1}$ | $R^{B1}$ | $R^{B1}$ | $R^{B1}$ | N | C | C |
| $L_{A954}$ | $R^{B1}$ | $R^{B1}$ | $R^{B2}$ | $R^{B1}$ | N | C | C |
| $L_{A955}$ | $R^{B1}$ | $R^{B1}$ | $R^{B3}$ | $R^{B1}$ | N | C | C |
| $L_{A956}$ | $R^{B1}$ | $R^{B1}$ | $R^{B4}$ | $R^{B1}$ | N | C | C |
| $L_{A957}$ | $R^{B1}$ | $R^{B1}$ | $R^{B5}$ | $R^{B1}$ | N | C | C |
| $L_{A958}$ | $R^{B1}$ | $R^{B1}$ | $R^{B6}$ | $R^{B1}$ | N | C | C |
| $L_{A959}$ | $R^{B1}$ | $R^{B1}$ | $R^{B7}$ | $R^{B1}$ | N | C | C |
| $L_{A960}$ | $R^{B1}$ | $R^{B1}$ | $R^{B8}$ | $R^{B1}$ | N | C | C |
| $L_{A961}$ | $R^{B1}$ | $R^{B1}$ | $R^{B9}$ | $R^{B1}$ | N | C | C |
| $L_{A962}$ | $R^{B1}$ | $R^{B1}$ | $R^{A2}$ | $R^{B1}$ | N | C | C |
| $L_{A963}$ | $R^{B1}$ | $R^{B1}$ | $R^{A27}$ | $R^{B1}$ | N | C | C |
| $L_{A964}$ | $R^{B1}$ | $R^{B1}$ | $R^{A34}$ | $R^{B1}$ | N | C | C |
| $L_{A965}$ | $R^{B2}$ | $R^{B1}$ | $R^{B1}$ | $R^{B1}$ | N | C | C |
| $L_{A966}$ | $R^{B2}$ | $R^{B1}$ | $R^{B2}$ | $R^{B1}$ | N | C | C |
| $L_{A967}$ | $R^{B2}$ | $R^{B1}$ | $R^{B3}$ | $R^{B1}$ | N | C | C |
| $L_{A968}$ | $R^{B2}$ | $R^{B1}$ | $R^{B4}$ | $R^{B1}$ | N | C | C |
| $L_{A969}$ | $R^{B2}$ | $R^{B1}$ | $R^{B5}$ | $R^{B1}$ | N | C | C |
| $L_{A970}$ | $R^{B2}$ | $R^{B1}$ | $R^{B6}$ | $R^{B1}$ | N | C | C |
| $L_{A971}$ | $R^{B2}$ | $R^{B1}$ | $R^{B7}$ | $R^{B1}$ | N | C | C |
| $L_{A972}$ | $R^{B2}$ | $R^{B1}$ | $R^{B8}$ | $R^{B1}$ | N | C | C |
| $L_{A973}$ | $R^{B2}$ | $R^{B1}$ | $R^{B9}$ | $R^{B1}$ | N | C | C |
| $L_{A974}$ | $R^{B2}$ | $R^{B1}$ | $R^{A2}$ | $R^{B1}$ | N | C | C |
| $L_{A975}$ | $R^{B2}$ | $R^{B1}$ | $R^{A27}$ | $R^{B1}$ | N | C | C |
| $L_{A976}$ | $R^{B2}$ | $R^{B1}$ | $R^{A34}$ | $R^{B1}$ | N | C | C |
| $L_{A977}$ | $R^{B2}$ | F | $R^{B1}$ | $R^{B1}$ | N | C | C |
| $L_{A978}$ | $R^{B2}$ | F | $R^{B2}$ | $R^{B1}$ | N | C | C |
| $L_{A979}$ | $R^{B2}$ | F | $R^{B3}$ | $R^{B1}$ | N | C | C |
| $L_{A980}$ | $R^{B2}$ | F | $R^{B4}$ | $R^{B1}$ | N | C | C |
| $L_{A981}$ | $R^{B2}$ | F | $R^{B5}$ | $R^{B1}$ | N | C | C |
| $L_{A982}$ | $R^{B2}$ | F | $R^{B6}$ | $R^{B1}$ | N | C | C |
| $L_{A983}$ | $R^{B2}$ | F | $R^{B7}$ | $R^{B1}$ | N | C | C |
| $L_{A984}$ | $R^{B2}$ | F | $R^{B8}$ | $R^{B1}$ | N | C | C |
| $L_{A985}$ | $R^{B2}$ | F | $R^{B9}$ | $R^{B1}$ | N | C | C |
| $L_{A986}$ | $R^{B2}$ | F | $R^{A2}$ | $R^{B1}$ | N | C | C |
| $L_{A987}$ | $R^{B2}$ | F | $R^{A27}$ | $R^{B1}$ | N | C | C |
| $L_{A988}$ | $R^{B2}$ | F | $R^{A34}$ | $R^{B1}$ | N | C | C |
| $L_{A989}$ | $R^{B3}$ | $R^{B1}$ | $R^{B1}$ | $R^{B1}$ | N | C | C |
| $L_{A990}$ | $R^{B3}$ | $R^{B1}$ | $R^{B2}$ | $R^{B1}$ | N | C | C |
| $L_{A991}$ | $R^{B3}$ | $R^{B1}$ | $R^{B3}$ | $R^{B1}$ | N | C | C |
| $L_{A992}$ | $R^{B3}$ | $R^{B1}$ | $R^{B4}$ | $R^{B1}$ | N | C | C |
| $L_{A993}$ | $R^{B3}$ | $R^{B1}$ | $R^{B5}$ | $R^{B1}$ | N | C | C |
| $L_{A994}$ | $R^{B3}$ | $R^{B1}$ | $R^{B6}$ | $R^{B1}$ | N | C | C |
| $L_{A995}$ | $R^{B3}$ | $R^{B1}$ | $R^{B7}$ | $R^{B1}$ | N | C | C |
| $L_{A996}$ | $R^{B3}$ | $R^{B1}$ | $R^{B8}$ | $R^{B1}$ | N | C | C |
| $L_{A997}$ | $R^{B3}$ | $R^{B1}$ | $R^{B9}$ | $R^{B1}$ | N | C | C |
| $L_{A998}$ | $R^{B3}$ | $R^{B1}$ | $R^{A2}$ | $R^{B1}$ | N | C | C |
| $L_{A999}$ | $R^{B3}$ | $R^{B1}$ | $R^{A27}$ | $R^{B1}$ | N | C | C |
| $L_{A1000}$ | $R^{B3}$ | $R^{B1}$ | $R^{A34}$ | $R^{B1}$ | N | C | C |
| $L_{A1001}$ | $R^{B1}$ | $R^{B1}$ | $R^{B1}$ | $R^{B1}$ | N | N | C |
| $L_{A1002}$ | $R^{B1}$ | $R^{B1}$ | $R^{B2}$ | $R^{B2}$ | N | N | C |
| $L_{A1003}$ | $R^{B1}$ | $R^{B1}$ | $R^{B3}$ | $R^{B3}$ | N | N | C |
| $L_{A1004}$ | $R^{B1}$ | $R^{B1}$ | $R^{B4}$ | $R^{B4}$ | N | N | C |
| $L_{A1005}$ | $R^{B1}$ | $R^{B1}$ | $R^{B5}$ | $R^{B5}$ | N | N | C |
| $L_{A1006}$ | $R^{B1}$ | $R^{B1}$ | $R^{B6}$ | $R^{B6}$ | N | N | C |
| $L_{A1007}$ | $R^{B1}$ | $R^{B1}$ | $R^{B7}$ | $R^{B7}$ | N | N | C |
| $L_{A1008}$ | $R^{B1}$ | $R^{B1}$ | $R^{B8}$ | $R^{B8}$ | N | N | C |
| $L_{A1009}$ | $R^{B1}$ | $R^{B1}$ | $R^{B9}$ | $R^{B9}$ | N | N | C |
| $L_{A1010}$ | $R^{B1}$ | $R^{B1}$ | $R^{A2}$ | $R^{A2}$ | N | N | C |
| $L_{A1011}$ | $R^{B1}$ | $R^{B1}$ | $R^{A27}$ | $R^{A27}$ | N | N | C |
| $L_{A1012}$ | $R^{B1}$ | $R^{B1}$ | $R^{A34}$ | $R^{A34}$ | N | N | C |
| $L_{A1013}$ | $R^{B2}$ | $R^{B1}$ | $R^{B1}$ | $R^{B1}$ | N | N | C |
| $L_{A1014}$ | $R^{B2}$ | $R^{B1}$ | $R^{B2}$ | $R^{B2}$ | N | N | C |
| $L_{A1015}$ | $R^{B2}$ | $R^{B1}$ | $R^{B3}$ | $R^{B3}$ | N | N | C |
| $L_{A1016}$ | $R^{B2}$ | $R^{B1}$ | $R^{B4}$ | $R^{B4}$ | N | N | C |
| $L_{A1017}$ | $R^{B2}$ | $R^{B1}$ | $R^{B5}$ | $R^{B5}$ | N | N | C |
| $L_{A1018}$ | $R^{B2}$ | $R^{B1}$ | $R^{B6}$ | $R^{B6}$ | N | N | C |
| $L_{A1019}$ | $R^{B2}$ | $R^{B1}$ | $R^{B7}$ | $R^{B7}$ | N | N | C |
| $L_{A1020}$ | $R^{B2}$ | $R^{B1}$ | $R^{B8}$ | $R^{B8}$ | N | N | C |
| $L_{A1021}$ | $R^{B2}$ | $R^{B1}$ | $R^{B9}$ | $R^{B9}$ | N | N | C |
| $L_{A1022}$ | $R^{B2}$ | $R^{B1}$ | $R^{A2}$ | $R^{A2}$ | N | N | C |
| $L_{A1023}$ | $R^{B2}$ | $R^{B1}$ | $R^{A27}$ | $R^{A27}$ | N | N | C |
| $L_{A1024}$ | $R^{B2}$ | $R^{B1}$ | $R^{A34}$ | $R^{A34}$ | N | N | C |
| $L_{A1025}$ | $R^{B2}$ | F | $R^{B1}$ | $R^{B1}$ | N | N | C |
| $L_{A1026}$ | $R^{B2}$ | F | $R^{B2}$ | $R^{B2}$ | N | N | C |
| $L_{A1027}$ | $R^{B2}$ | F | $R^{B3}$ | $R^{B3}$ | N | N | C |
| $L_{A1028}$ | $R^{B2}$ | F | $R^{B4}$ | $R^{B4}$ | N | N | C |
| $L_{A1029}$ | $R^{B2}$ | F | $R^{B5}$ | $R^{B5}$ | N | N | C |
| $L_{A1030}$ | $R^{B2}$ | F | $R^{B6}$ | $R^{B6}$ | N | N | C |
| $L_{A1031}$ | $R^{B2}$ | F | $R^{B7}$ | $R^{B7}$ | N | N | C |
| $L_{A1032}$ | $R^{B2}$ | F | $R^{B8}$ | $R^{B8}$ | N | N | C |
| $L_{A1033}$ | $R^{B2}$ | F | $R^{B9}$ | $R^{B9}$ | N | N | C |
| $L_{A1034}$ | $R^{B2}$ | F | $R^{A2}$ | $R^{A2}$ | N | N | C |
| $L_{A1035}$ | $R^{B2}$ | F | $R^{A27}$ | $R^{A27}$ | N | N | C |
| $L_{A1036}$ | $R^{B2}$ | F | $R^{A34}$ | $R^{A34}$ | N | N | C |
| $L_{A1037}$ | $R^{B3}$ | $R^{B1}$ | $R^{B1}$ | $R^{B1}$ | N | N | C |
| $L_{A1038}$ | $R^{B3}$ | $R^{B1}$ | $R^{B2}$ | $R^{B2}$ | N | N | C |
| $L_{A1039}$ | $R^{B3}$ | $R^{B1}$ | $R^{B3}$ | $R^{B3}$ | N | N | C |
| $L_{A1040}$ | $R^{B3}$ | $R^{B1}$ | $R^{B4}$ | $R^{B4}$ | N | N | C |
| $L_{A1041}$ | $R^{B3}$ | $R^{B1}$ | $R^{B5}$ | $R^{B5}$ | N | N | C |
| $L_{A1042}$ | $R^{B3}$ | $R^{B1}$ | $R^{B6}$ | $R^{B6}$ | N | N | C |
| $L_{A1043}$ | $R^{B3}$ | $R^{B1}$ | $R^{B7}$ | $R^{B7}$ | N | N | C |
| $L_{A1044}$ | $R^{B3}$ | $R^{B1}$ | $R^{B8}$ | $R^{B8}$ | N | N | C |
| $L_{A1045}$ | $R^{B3}$ | $R^{B1}$ | $R^{B9}$ | $R^{B9}$ | N | N | C |
| $L_{A1046}$ | $R^{B3}$ | $R^{B1}$ | $R^{A2}$ | $R^{A2}$ | N | N | C |
| $L_{A1047}$ | $R^{B3}$ | $R^{B1}$ | $R^{A27}$ | $R^{A27}$ | N | N | C |
| $L_{A1048}$ | $R^{B3}$ | $R^{B1}$ | $R^{A34}$ | $R^{A34}$ | N | N | C |
| $L_{A1049}$ | $R^{B1}$ | $R^{B1}$ | $R^{B1}$ | $R^{B1}$ | N | N | N |
| $L_{A1050}$ | $R^{B1}$ | $R^{B1}$ | $R^{B2}$ | $R^{B2}$ | N | N | N |
| $L_{A1051}$ | $R^{B1}$ | $R^{B1}$ | $R^{B3}$ | $R^{B3}$ | N | N | N |
| $L_{A1052}$ | $R^{B1}$ | $R^{B1}$ | $R^{B4}$ | $R^{B4}$ | N | N | N |
| $L_{A1053}$ | $R^{B1}$ | $R^{B1}$ | $R^{B5}$ | $R^{B5}$ | N | N | N |
| $L_{A1054}$ | $R^{B1}$ | $R^{B1}$ | $R^{B6}$ | $R^{B6}$ | N | N | N |
| $L_{A1055}$ | $R^{B1}$ | $R^{B1}$ | $R^{B7}$ | $R^{B7}$ | N | N | N |
| $L_{A1056}$ | $R^{B1}$ | $R^{B1}$ | $R^{B8}$ | $R^{B8}$ | N | N | N |
| $L_{A1057}$ | $R^{B1}$ | $R^{B1}$ | $R^{B9}$ | $R^{B9}$ | N | N | N |
| $L_{A1058}$ | $R^{B1}$ | $R^{B1}$ | $R^{A2}$ | $R^{A2}$ | N | N | N |
| $L_{A1059}$ | $R^{B1}$ | $R^{B1}$ | $R^{A27}$ | $R^{A27}$ | N | N | N |
| $L_{A1060}$ | $R^{B1}$ | $R^{B1}$ | $R^{A34}$ | $R^{A34}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A1061}$ | $R^{B2}$ | $R^{B1}$ | $R^{B1}$ | $R^{B1}$ | N | N | N |
| $L_{A1062}$ | $R^{B2}$ | $R^{B1}$ | $R^{B2}$ | $R^{B2}$ | N | N | N |
| $L_{A1063}$ | $R^{B2}$ | $R^{B1}$ | $R^{B3}$ | $R^{B3}$ | N | N | N |
| $L_{A1064}$ | $R^{B2}$ | $R^{B1}$ | $R^{B4}$ | $R^{B4}$ | N | N | N |
| $L_{A1065}$ | $R^{B2}$ | $R^{B1}$ | $R^{B5}$ | $R^{B5}$ | N | N | N |
| $L_{A1066}$ | $R^{B2}$ | $R^{B1}$ | $R^{B6}$ | $R^{B6}$ | N | N | N |
| $L_{A1067}$ | $R^{B2}$ | $R^{B1}$ | $R^{B7}$ | $R^{B7}$ | N | N | N |
| $L_{A1068}$ | $R^{B2}$ | $R^{B1}$ | $R^{B8}$ | $R^{B8}$ | N | N | N |
| $L_{A1069}$ | $R^{B2}$ | $R^{B1}$ | $R^{B9}$ | $R^{B9}$ | N | N | N |
| $L_{A1070}$ | $R^{B2}$ | $R^{B1}$ | $R^{A2}$ | $R^{A2}$ | N | N | N |
| $L_{A1071}$ | $R^{B2}$ | $R^{B1}$ | $R^{A27}$ | $R^{A27}$ | N | N | N |
| $L_{A1072}$ | $R^{B2}$ | $R^{B1}$ | $R^{A34}$ | $R^{A34}$ | N | N | N |
| $L_{A1073}$ | $R^{B2}$ | F | $R^{B1}$ | $R^{B1}$ | N | N | N |
| $L_{A1074}$ | $R^{B2}$ | F | $R^{B2}$ | $R^{B2}$ | N | N | N |
| $L_{A1075}$ | $R^{B2}$ | F | $R^{B3}$ | $R^{B3}$ | N | N | N |
| $L_{A1076}$ | $R^{B2}$ | F | $R^{B4}$ | $R^{B4}$ | N | N | N |
| $L_{A1077}$ | $R^{B2}$ | F | $R^{B5}$ | $R^{B5}$ | N | N | N |
| $L_{A1078}$ | $R^{B2}$ | F | $R^{B6}$ | $R^{B6}$ | N | N | N |
| $L_{A1079}$ | $R^{B2}$ | F | $R^{B7}$ | $R^{B7}$ | N | N | N |
| $L_{A1080}$ | $R^{B2}$ | F | $R^{B8}$ | $R^{B8}$ | N | N | N |
| $L_{A1081}$ | $R^{B2}$ | F | $R^{B9}$ | $R^{B9}$ | N | N | N |
| $L_{A1082}$ | $R^{B2}$ | F | $R^{A2}$ | $R^{A2}$ | N | N | N |
| $L_{A1083}$ | $R^{B2}$ | F | $R^{A27}$ | $R^{A27}$ | N | N | N |
| $L_{A1084}$ | $R^{B2}$ | F | $R^{A34}$ | $R^{A34}$ | N | N | N |
| $L_{A1085}$ | $R^{B3}$ | $R^{B1}$ | $R^{B1}$ | $R^{B1}$ | N | N | N |
| $L_{A1086}$ | $R^{B3}$ | $R^{B1}$ | $R^{B2}$ | $R^{B2}$ | N | N | N |
| $L_{A1087}$ | $R^{B3}$ | $R^{B1}$ | $R^{B3}$ | $R^{B3}$ | N | N | N |
| $L_{A1088}$ | $R^{B3}$ | $R^{B1}$ | $R^{B4}$ | $R^{B4}$ | N | N | N |
| $L_{A1089}$ | $R^{B3}$ | $R^{B1}$ | $R^{B5}$ | $R^{B5}$ | N | N | N |
| $L_{A1090}$ | $R^{B3}$ | $R^{B1}$ | $R^{B6}$ | $R^{B6}$ | N | N | N |
| $L_{A1091}$ | $R^{B3}$ | $R^{B1}$ | $R^{B7}$ | $R^{B7}$ | N | N | N |
| $L_{A1092}$ | $R^{B3}$ | $R^{B1}$ | $R^{B8}$ | $R^{B8}$ | N | N | N |
| $L_{A1093}$ | $R^{B3}$ | $R^{B1}$ | $R^{B9}$ | $R^{B9}$ | N | N | N |
| $L_{A1094}$ | $R^{B3}$ | $R^{B1}$ | $R^{A2}$ | $R^{A2}$ | N | N | N |
| $L_{A1095}$ | $R^{B3}$ | $R^{B1}$ | $R^{A27}$ | $R^{A27}$ | N | N | N |
| $L_{A1096}$ | $R^{B3}$ | $R^{B1}$ | $R^{A34}$ | $R^{A34}$ | N | N | N |
| $L_{A1097}$ | $R^{B1}$ | $R^{B1}$ | $R^{B1}$ | $R^{B1}$ | C | C | N |
| $L_{A1098}$ | $R^{B1}$ | $R^{B1}$ | $R^{B2}$ | $R^{B2}$ | C | C | N |
| $L_{A1099}$ | $R^{B1}$ | $R^{B1}$ | $R^{B3}$ | $R^{B3}$ | C | C | N |
| $L_{A1100}$ | $R^{B1}$ | $R^{B1}$ | $R^{B4}$ | $R^{B4}$ | C | C | N |
| $L_{A1101}$ | $R^{B1}$ | $R^{B1}$ | $R^{B5}$ | $R^{B5}$ | C | C | N |
| $L_{A1102}$ | $R^{B1}$ | $R^{B1}$ | $R^{B6}$ | $R^{B6}$ | C | C | N |
| $L_{A1103}$ | $R^{B1}$ | $R^{B1}$ | $R^{B7}$ | $R^{B7}$ | C | C | N |
| $L_{A1104}$ | $R^{B1}$ | $R^{B1}$ | $R^{B8}$ | $R^{B8}$ | C | C | N |
| $L_{A1105}$ | $R^{B1}$ | $R^{B1}$ | $R^{B9}$ | $R^{B9}$ | C | C | N |
| $L_{A1106}$ | $R^{B1}$ | $R^{B1}$ | $R^{A2}$ | $R^{A2}$ | C | C | N |
| $L_{A1107}$ | $R^{B1}$ | $R^{B1}$ | $R^{A27}$ | $R^{A27}$ | C | C | N |
| $L_{A1108}$ | $R^{B1}$ | $R^{B1}$ | $R^{A34}$ | $R^{A34}$ | C | C | N |
| $L_{A1109}$ | $R^{B2}$ | $R^{B1}$ | $R^{B1}$ | $R^{B1}$ | C | C | N |
| $L_{A1110}$ | $R^{B2}$ | $R^{B1}$ | $R^{B2}$ | $R^{B2}$ | C | C | N |
| $L_{A1111}$ | $R^{B2}$ | $R^{B1}$ | $R^{B3}$ | $R^{B3}$ | C | C | N |
| $L_{A1112}$ | $R^{B2}$ | $R^{B1}$ | $R^{B4}$ | $R^{B4}$ | C | C | N |
| $L_{A1113}$ | $R^{B2}$ | $R^{B1}$ | $R^{B5}$ | $R^{B5}$ | C | C | N |
| $L_{A1114}$ | $R^{B2}$ | $R^{B1}$ | $R^{B6}$ | $R^{B6}$ | C | C | N |
| $L_{A1115}$ | $R^{B2}$ | $R^{B1}$ | $R^{B7}$ | $R^{B7}$ | C | C | N |
| $L_{A1116}$ | $R^{B2}$ | $R^{B1}$ | $R^{B8}$ | $R^{B8}$ | C | C | N |
| $L_{A1117}$ | $R^{B2}$ | $R^{B1}$ | $R^{B9}$ | $R^{B9}$ | C | C | N |
| $L_{A1118}$ | $R^{B2}$ | $R^{B1}$ | $R^{A2}$ | $R^{A2}$ | C | C | N |
| $L_{A1119}$ | $R^{B2}$ | $R^{B1}$ | $R^{A27}$ | $R^{A27}$ | C | C | N |
| $L_{A1120}$ | $R^{B2}$ | $R^{B1}$ | $R^{A34}$ | $R^{A34}$ | C | C | N |
| $L_{A1121}$ | $R^{B2}$ | F | $R^{B1}$ | $R^{B1}$ | C | C | N |
| $L_{A1122}$ | $R^{B2}$ | F | $R^{B2}$ | $R^{B2}$ | C | C | N |
| $L_{A1123}$ | $R^{B2}$ | F | $R^{B3}$ | $R^{B3}$ | C | C | N |
| $L_{A1124}$ | $R^{B2}$ | F | $R^{B4}$ | $R^{B4}$ | C | C | N |
| $L_{A1125}$ | $R^{B2}$ | F | $R^{B5}$ | $R^{B5}$ | C | C | N |
| $L_{A1126}$ | $R^{B2}$ | F | $R^{B6}$ | $R^{B6}$ | C | C | N |
| $L_{A1127}$ | $R^{B2}$ | F | $R^{B7}$ | $R^{B7}$ | C | C | N |
| $L_{A1128}$ | $R^{B2}$ | F | $R^{B8}$ | $R^{B8}$ | C | C | N |
| $L_{A1129}$ | $R^{B2}$ | F | $R^{B9}$ | $R^{B9}$ | C | C | N |
| $L_{A1130}$ | $R^{B2}$ | F | $R^{A2}$ | $R^{A2}$ | C | C | N |
| $L_{A1131}$ | $R^{B2}$ | F | $R^{A27}$ | $R^{A27}$ | C | C | N |
| $L_{A1132}$ | $R^{B2}$ | F | $R^{A34}$ | $R^{A34}$ | C | C | N |
| $L_{A1133}$ | $R^{B3}$ | $R^{B1}$ | $R^{B1}$ | $R^{B1}$ | C | C | N |
| $L_{A1134}$ | $R^{B3}$ | $R^{B1}$ | $R^{B2}$ | $R^{B2}$ | C | C | N |
| $L_{A1135}$ | $R^{B3}$ | $R^{B1}$ | $R^{B3}$ | $R^{B3}$ | C | C | N |
| $L_{A1136}$ | $R^{B3}$ | $R^{B1}$ | $R^{B4}$ | $R^{B4}$ | C | C | N |
| $L_{A1137}$ | $R^{B3}$ | $R^{B1}$ | $R^{B5}$ | $R^{B5}$ | C | C | N |

-continued

| | $R^1$ | $R^2$ | $R^3$ | $R^4$ | $X^1$ | $X^2$ | $X^3$ |
|---|---|---|---|---|---|---|---|
| $L_{A1138}$ | $R^{B3}$ | $R^{B1}$ | $R^{B6}$ | $R^{B6}$ | C | C | N |
| $L_{A1139}$ | $R^{B3}$ | $R^{B1}$ | $R^{B7}$ | $R^{B7}$ | C | C | N |
| $L_{A1140}$ | $R^{B3}$ | $R^{B1}$ | $R^{B8}$ | $R^{B8}$ | C | C | N |
| $L_{A1141}$ | $R^{B3}$ | $R^{B1}$ | $R^{B9}$ | $R^{B9}$ | C | C | N |
| $L_{A1142}$ | $R^{B3}$ | $R^{B1}$ | $R^{A2}$ | $R^{A2}$ | C | C | N |
| $L_{A1143}$ | $R^{B3}$ | $R^{B1}$ | $R^{A27}$ | $R^{A27}$ | C | C | N |
| $L_{A1144}$ | $R^{B3}$ | $R^{B1}$ | $R^{A34}$ | $R^{A34}$ | C | C | N |

for $L_{A1145}$ through $L_{A1328}$, $L_A$ has a structure of

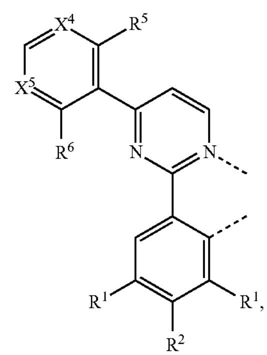

wherein $R^1$, $R^2$, $R^5$, $R^6$, $X^4$, and $X^5$ are defined as provided below,

| | $R^1$ | $R^2$ | $R^5$ | $R^6$ | $X^4$ | $X^5$ |
|---|---|---|---|---|---|---|
| $L_{A1145}$ | $R^{B1}$ | $R^{B1}$ | $R^{B1}$ | $R^{B1}$ | N | C |
| $L_{A1146}$ | $R^{B1}$ | $R^{B1}$ | $R^{B2}$ | $R^{B1}$ | N | C |
| $L_{A1147}$ | $R^{B1}$ | $R^{B1}$ | $R^{B3}$ | $R^{B1}$ | N | C |
| $L_{A1148}$ | $R^{B1}$ | $R^{B1}$ | $R^{B4}$ | $R^{B1}$ | N | C |
| $L_{A1149}$ | $R^{B1}$ | $R^{B1}$ | $R^{B5}$ | $R^{B1}$ | N | C |
| $L_{A1150}$ | $R^{B1}$ | $R^{B1}$ | $R^{B6}$ | $R^{B1}$ | N | C |
| $L_{A1151}$ | $R^{B1}$ | $R^{B1}$ | $R^{B7}$ | $R^{B1}$ | N | C |
| $L_{A1152}$ | $R^{B1}$ | $R^{B1}$ | $R^{B8}$ | $R^{B1}$ | N | C |
| $L_{A1153}$ | $R^{B1}$ | $R^{B1}$ | $R^{B9}$ | $R^{B1}$ | N | C |
| $L_{A1154}$ | $R^{B1}$ | $R^{B1}$ | $R^{A2}$ | $R^{B1}$ | N | C |
| $L_{A1155}$ | $R^{B1}$ | $R^{B1}$ | $R^{A27}$ | $R^{B1}$ | N | C |
| $L_{A1156}$ | $R^{B1}$ | $R^{B1}$ | $R^{A34}$ | $R^{B1}$ | N | C |
| $L_{A1157}$ | $R^{B2}$ | $R^{B1}$ | $R^{B1}$ | $R^{B1}$ | N | C |
| $L_{A1158}$ | $R^{B2}$ | $R^{B1}$ | $R^{B2}$ | $R^{B1}$ | N | C |
| $L_{A1159}$ | $R^{B2}$ | $R^{B1}$ | $R^{B3}$ | $R^{B1}$ | N | C |
| $L_{A1160}$ | $R^{B2}$ | $R^{B1}$ | $R^{B4}$ | $R^{B1}$ | N | C |
| $L_{A1161}$ | $R^{B2}$ | $R^{B1}$ | $R^{B5}$ | $R^{B1}$ | N | C |
| $L_{A1162}$ | $R^{B2}$ | $R^{B1}$ | $R^{B6}$ | $R^{B1}$ | N | C |
| $L_{A1163}$ | $R^{B2}$ | $R^{B1}$ | $R^{B7}$ | $R^{B1}$ | N | C |
| $L_{A1164}$ | $R^{B2}$ | $R^{B1}$ | $R^{B8}$ | $R^{B1}$ | N | C |
| $L_{A1165}$ | $R^{B2}$ | $R^{B1}$ | $R^{B9}$ | $R^{B1}$ | N | C |
| $L_{A1166}$ | $R^{B2}$ | $R^{B1}$ | $R^{A2}$ | $R^{B1}$ | N | C |
| $L_{A1167}$ | $R^{B2}$ | $R^{B1}$ | $R^{A27}$ | $R^{B1}$ | N | C |
| $L_{A1168}$ | $R^{B2}$ | $R^{B1}$ | $R^{A34}$ | $R^{B1}$ | N | C |
| $L_{A1169}$ | $R^{B2}$ | F | $R^{B1}$ | $R^{B1}$ | N | C |
| $L_{A1170}$ | $R^{B2}$ | F | $R^{B2}$ | $R^{B1}$ | N | C |
| $L_{A1171}$ | $R^{B2}$ | F | $R^{B3}$ | $R^{B1}$ | N | C |
| $L_{A1172}$ | $R^{B2}$ | F | $R^{B4}$ | $R^{B1}$ | N | C |
| $L_{A1173}$ | $R^{B2}$ | F | $R^{B5}$ | $R^{B1}$ | N | C |
| $L_{A1174}$ | $R^{B2}$ | F | $R^{B6}$ | $R^{B1}$ | N | C |
| $L_{A1175}$ | $R^{B2}$ | F | $R^{B7}$ | $R^{B1}$ | N | C |
| $L_{A1176}$ | $R^{B2}$ | F | $R^{B8}$ | $R^{B1}$ | N | C |
| $L_{A1177}$ | $R^{B2}$ | F | $R^{B9}$ | $R^{B1}$ | N | C |
| $L_{A1178}$ | $R^{B2}$ | F | $R^{A2}$ | $R^{B1}$ | N | C |
| $L_{A1179}$ | $R^{B2}$ | F | $R^{A27}$ | $R^{B1}$ | N | C |
| $L_{A1180}$ | $R^{B2}$ | F | $R^{A34}$ | $R^{B1}$ | N | C |
| $L_{A1181}$ | $R^{B3}$ | $R^{B1}$ | $R^{B1}$ | $R^{B1}$ | N | C |
| $L_{A1182}$ | $R^{B3}$ | $R^{B1}$ | $R^{B2}$ | $R^{B1}$ | N | C |
| $L_{A1183}$ | $R^{B3}$ | $R^{B1}$ | $R^{B3}$ | $R^{B1}$ | N | C |
| $L_{A1184}$ | $R^{B3}$ | $R^{B1}$ | $R^{B4}$ | $R^{B1}$ | N | C |

-continued

| | $R^1$ | $R^2$ | $R^5$ | $R^6$ | $X^4$ | $X^5$ |
|---|---|---|---|---|---|---|
| $L_{A1185}$ | $R^{B3}$ | $R^{B1}$ | $R^{B5}$ | $R^{B1}$ | N | C |
| $L_{A1186}$ | $R^{B3}$ | $R^{B1}$ | $R^{B6}$ | $R^{B1}$ | N | C |
| $L_{A1187}$ | $R^{B3}$ | $R^{B1}$ | $R^{B7}$ | $R^{B1}$ | N | C |
| $L_{A1188}$ | $R^{B3}$ | $R^{B1}$ | $R^{B8}$ | $R^{B1}$ | N | C |
| $L_{A1189}$ | $R^{B3}$ | $R^{B1}$ | $R^{B9}$ | $R^{B1}$ | N | C |
| $L_{A1190}$ | $R^{B3}$ | $R^{B1}$ | $R^{A2}$ | $R^{B1}$ | N | C |
| $L_{A1191}$ | $R^{B3}$ | $R^{B1}$ | $R^{A27}$ | $R^{B1}$ | N | C |
| $L_{A1192}$ | $R^{B3}$ | $R^{B1}$ | $R^{A34}$ | $R^{B1}$ | N | C |
| $L_{A1193}$ | $R^{B1}$ | $R^{B1}$ | $R^{B2}$ | $R^{B2}$ | N | C |
| $L_{A1194}$ | $R^{B1}$ | $R^{B1}$ | $R^{B3}$ | $R^{B3}$ | N | C |
| $L_{A1195}$ | $R^{B1}$ | $R^{B1}$ | $R^{B4}$ | $R^{B4}$ | N | C |
| $L_{A1196}$ | $R^{B1}$ | $R^{B1}$ | $R^{B5}$ | $R^{B5}$ | N | C |
| $L_{A1197}$ | $R^{B1}$ | $R^{B1}$ | $R^{B6}$ | $R^{B6}$ | N | C |
| $L_{A1198}$ | $R^{B1}$ | $R^{B1}$ | $R^{B7}$ | $R^{B7}$ | N | C |
| $L_{A1199}$ | $R^{B1}$ | $R^{B1}$ | $R^{B8}$ | $R^{B8}$ | N | C |
| $L_{A1200}$ | $R^{B1}$ | $R^{B1}$ | $R^{B9}$ | $R^{B9}$ | N | C |
| $L_{A1201}$ | $R^{B1}$ | $R^{B1}$ | $R^{A2}$ | $R^{A2}$ | N | C |
| $L_{A1202}$ | $R^{B1}$ | $R^{B1}$ | $R^{A27}$ | $R^{A27}$ | N | C |
| $L_{A1203}$ | $R^{B1}$ | $R^{B1}$ | $R^{A34}$ | $R^{A34}$ | N | C |
| $L_{A1204}$ | $R^{B2}$ | $R^{B1}$ | $R^{B2}$ | $R^{B2}$ | N | C |
| $L_{A1205}$ | $R^{B2}$ | $R^{B1}$ | $R^{B3}$ | $R^{B3}$ | N | C |
| $L_{A1206}$ | $R^{B2}$ | $R^{B1}$ | $R^{B4}$ | $R^{B4}$ | N | C |
| $L_{A1207}$ | $R^{B2}$ | $R^{B1}$ | $R^{B5}$ | $R^{B5}$ | N | C |
| $L_{A1208}$ | $R^{B2}$ | $R^{B1}$ | $R^{B6}$ | $R^{B6}$ | N | C |
| $L_{A1209}$ | $R^{B2}$ | $R^{B1}$ | $R^{B7}$ | $R^{B7}$ | N | C |
| $L_{A1210}$ | $R^{B2}$ | $R^{B1}$ | $R^{B8}$ | $R^{B8}$ | N | C |
| $L_{A1211}$ | $R^{B2}$ | $R^{B1}$ | $R^{B9}$ | $R^{B9}$ | N | C |
| $L_{A1212}$ | $R^{B2}$ | $R^{B1}$ | $R^{A2}$ | $R^{A2}$ | N | C |
| $L_{A1213}$ | $R^{B2}$ | $R^{B1}$ | $R^{A27}$ | $R^{A27}$ | N | C |
| $L_{A1214}$ | $R^{B2}$ | $R^{B1}$ | $R^{A34}$ | $R^{A34}$ | N | C |
| $L_{A1215}$ | $R^{B2}$ | F | $R^{B2}$ | $R^{B2}$ | N | C |
| $L_{A1216}$ | $R^{B2}$ | F | $R^{B3}$ | $R^{B3}$ | N | C |
| $L_{A1217}$ | $R^{B2}$ | F | $R^{B4}$ | $R^{B4}$ | N | C |
| $L_{A1218}$ | $R^{B2}$ | F | $R^{B5}$ | $R^{B5}$ | N | C |
| $L_{A1219}$ | $R^{B2}$ | F | $R^{B6}$ | $R^{B6}$ | N | C |
| $L_{A1220}$ | $R^{B2}$ | F | $R^{B7}$ | $R^{B7}$ | N | C |
| $L_{A1221}$ | $R^{B2}$ | F | $R^{B8}$ | $R^{B8}$ | N | C |
| $L_{A1222}$ | $R^{B2}$ | F | $R^{B9}$ | $R^{B9}$ | N | C |
| $L_{A1223}$ | $R^{B2}$ | F | $R^{A2}$ | $R^{A2}$ | N | C |
| $L_{A1224}$ | $R^{B2}$ | F | $R^{A27}$ | $R^{A27}$ | N | C |
| $L_{A1225}$ | $R^{B2}$ | F | $R^{A34}$ | $R^{A34}$ | N | C |
| $L_{A1226}$ | $R^{B3}$ | $R^{B1}$ | $R^{B2}$ | $R^{B2}$ | N | C |
| $L_{A1227}$ | $R^{B3}$ | $R^{B1}$ | $R^{B3}$ | $R^{B3}$ | N | C |
| $L_{A1228}$ | $R^{B3}$ | $R^{B1}$ | $R^{B4}$ | $R^{B4}$ | N | C |
| $L_{A1229}$ | $R^{B3}$ | $R^{B1}$ | $R^{B5}$ | $R^{B5}$ | N | C |
| $L_{A1230}$ | $R^{B3}$ | $R^{B1}$ | $R^{B6}$ | $R^{B6}$ | N | C |
| $L_{A1231}$ | $R^{B3}$ | $R^{B1}$ | $R^{B7}$ | $R^{B7}$ | N | C |
| $L_{A1232}$ | $R^{B3}$ | $R^{B1}$ | $R^{B8}$ | $R^{B8}$ | N | C |
| $L_{A1233}$ | $R^{B3}$ | $R^{B1}$ | $R^{B9}$ | $R^{B9}$ | N | C |
| $L_{A1234}$ | $R^{B3}$ | $R^{B1}$ | $R^{A2}$ | $R^{A2}$ | N | C |
| $L_{A1235}$ | $R^{B3}$ | $R^{B1}$ | $R^{A27}$ | $R^{A27}$ | N | C |
| $L_{A1236}$ | $R^{B3}$ | $R^{B1}$ | $R^{A34}$ | $R^{A34}$ | N | C |
| $L_{A1237}$ | $R^{B1}$ | $R^{B1}$ | $R^{B1}$ | $R^{B1}$ | N | N |
| $L_{A1238}$ | $R^{B1}$ | $R^{B1}$ | $R^{B2}$ | $R^{B1}$ | N | N |
| $L_{A1239}$ | $R^{B1}$ | $R^{B1}$ | $R^{B3}$ | $R^{B1}$ | N | N |
| $L_{A1240}$ | $R^{B1}$ | $R^{B1}$ | $R^{B4}$ | $R^{B1}$ | N | N |
| $L_{A1241}$ | $R^{B1}$ | $R^{B1}$ | $R^{B5}$ | $R^{B1}$ | N | N |
| $L_{A1242}$ | $R^{B1}$ | $R^{B1}$ | $R^{B6}$ | $R^{B1}$ | N | N |
| $L_{A1243}$ | $R^{B1}$ | $R^{B1}$ | $R^{B7}$ | $R^{B1}$ | N | N |
| $L_{A1244}$ | $R^{B1}$ | $R^{B1}$ | $R^{B8}$ | $R^{B1}$ | N | N |
| $L_{A1245}$ | $R^{B1}$ | $R^{B1}$ | $R^{B9}$ | $R^{B1}$ | N | N |
| $L_{A1246}$ | $R^{B1}$ | $R^{B1}$ | $R^{A2}$ | $R^{B1}$ | N | N |
| $L_{A1247}$ | $R^{B1}$ | $R^{B1}$ | $R^{A27}$ | $R^{B1}$ | N | N |
| $L_{A1248}$ | $R^{B1}$ | $R^{B1}$ | $R^{A34}$ | $R^{B1}$ | N | N |
| $L_{A1249}$ | $R^{B2}$ | $R^{B1}$ | $R^{B1}$ | $R^{B1}$ | N | N |
| $L_{A1250}$ | $R^{B2}$ | $R^{B1}$ | $R^{B2}$ | $R^{B1}$ | N | N |
| $L_{A1251}$ | $R^{B2}$ | $R^{B1}$ | $R^{B3}$ | $R^{B1}$ | N | N |
| $L_{A1252}$ | $R^{B2}$ | $R^{B1}$ | $R^{B4}$ | $R^{B1}$ | N | N |
| $L_{A1253}$ | $R^{B2}$ | $R^{B1}$ | $R^{B5}$ | $R^{B1}$ | N | N |
| $L_{A1254}$ | $R^{B2}$ | $R^{B1}$ | $R^{B6}$ | $R^{B1}$ | N | N |
| $L_{A1255}$ | $R^{B2}$ | $R^{B1}$ | $R^{B7}$ | $R^{B1}$ | N | N |
| $L_{A1256}$ | $R^{B2}$ | $R^{B1}$ | $R^{B8}$ | $R^{B1}$ | N | N |
| $L_{A1257}$ | $R^{B2}$ | $R^{B1}$ | $R^{B9}$ | $R^{B1}$ | N | N |
| $L_{A1258}$ | $R^{B2}$ | $R^{B1}$ | $R^{A2}$ | $R^{B1}$ | N | N |
| $L_{A1259}$ | $R^{B2}$ | $R^{B1}$ | $R^{A27}$ | $R^{B1}$ | N | N |
| $L_{A1260}$ | $R^{B2}$ | $R^{B1}$ | $R^{A34}$ | $R^{B1}$ | N | N |
| $L_{A1261}$ | $R^{B2}$ | F | $R^{B1}$ | $R^{B1}$ | N | N |

-continued

| | $R^1$ | $R^2$ | $R^5$ | $R^6$ | $X^4$ | $X^5$ |
|---|---|---|---|---|---|---|
| $L_{A1262}$ | $R^{B2}$ | F | $R^{B2}$ | $R^{B1}$ | N | N |
| $L_{A1263}$ | $R^{B2}$ | F | $R^{B3}$ | $R^{B1}$ | N | N |
| $L_{A1264}$ | $R^{B2}$ | F | $R^{B4}$ | $R^{B1}$ | N | N |
| $L_{A1265}$ | $R^{B2}$ | F | $R^{B5}$ | $R^{B1}$ | N | N |
| $L_{A1266}$ | $R^{B2}$ | F | $R^{B6}$ | $R^{B1}$ | N | N |
| $L_{A1267}$ | $R^{B2}$ | F | $R^{B7}$ | $R^{B1}$ | N | N |
| $L_{A1268}$ | $R^{B2}$ | F | $R^{B8}$ | $R^{B1}$ | N | N |
| $L_{A1269}$ | $R^{B2}$ | F | $R^{B9}$ | $R^{B1}$ | N | N |
| $L_{A1270}$ | $R^{B2}$ | F | $R^{A2}$ | $R^{B1}$ | N | N |
| $L_{A1271}$ | $R^{B2}$ | F | $R^{A27}$ | $R^{B1}$ | N | N |
| $L_{A1272}$ | $R^{B2}$ | F | $R^{A34}$ | $R^{B1}$ | N | N |
| $L_{A1273}$ | $R^{B3}$ | $R^{B1}$ | $R^{B1}$ | $R^{B1}$ | N | N |
| $L_{A1274}$ | $R^{B3}$ | $R^{B1}$ | $R^{B2}$ | $R^{B1}$ | N | N |
| $L_{A1275}$ | $R^{B3}$ | $R^{B1}$ | $R^{B3}$ | $R^{B1}$ | N | N |
| $L_{A1276}$ | $R^{B3}$ | $R^{B1}$ | $R^{B4}$ | $R^{B1}$ | N | N |
| $L_{A1277}$ | $R^{B3}$ | $R^{B1}$ | $R^{B5}$ | $R^{B1}$ | N | N |
| $L_{A1278}$ | $R^{B3}$ | $R^{B1}$ | $R^{B6}$ | $R^{B1}$ | N | N |
| $L_{A1279}$ | $R^{B3}$ | $R^{B1}$ | $R^{B7}$ | $R^{B1}$ | N | N |
| $L_{A1280}$ | $R^{B3}$ | $R^{B1}$ | $R^{B8}$ | $R^{B1}$ | N | N |
| $L_{A1281}$ | $R^{B3}$ | $R^{B1}$ | $R^{B9}$ | $R^{B1}$ | N | N |
| $L_{A1282}$ | $R^{B3}$ | $R^{B1}$ | $R^{A2}$ | $R^{B1}$ | N | N |
| $L_{A1283}$ | $R^{B3}$ | $R^{B1}$ | $R^{A27}$ | $R^{B1}$ | N | N |
| $L_{A1284}$ | $R^{B3}$ | $R^{B1}$ | $R^{A34}$ | $R^{B1}$ | N | N |
| $L_{A1285}$ | $R^{B1}$ | $R^{B1}$ | $R^{B2}$ | $R^{B2}$ | N | N |
| $L_{A1286}$ | $R^{B1}$ | $R^{B1}$ | $R^{B3}$ | $R^{B3}$ | N | N |
| $L_{A1287}$ | $R^{B1}$ | $R^{B1}$ | $R^{B4}$ | $R^{B4}$ | N | N |
| $L_{A1288}$ | $R^{B1}$ | $R^{B1}$ | $R^{B5}$ | $R^{B5}$ | N | N |
| $L_{A1289}$ | $R^{B1}$ | $R^{B1}$ | $R^{B6}$ | $R^{B6}$ | N | N |
| $L_{A1290}$ | $R^{B1}$ | $R^{B1}$ | $R^{B7}$ | $R^{B7}$ | N | N |
| $L_{A1291}$ | $R^{B1}$ | $R^{B1}$ | $R^{B8}$ | $R^{B8}$ | N | N |
| $L_{A1292}$ | $R^{B1}$ | $R^{B1}$ | $R^{B9}$ | $R^{B9}$ | N | N |
| $L_{A1293}$ | $R^{B1}$ | $R^{B1}$ | $R^{A2}$ | $R^{A2}$ | N | N |
| $L_{A1294}$ | $R^{B1}$ | $R^{B1}$ | $R^{A27}$ | $R^{A27}$ | N | N |
| $L_{A1295}$ | $R^{B1}$ | $R^{B1}$ | $R^{A34}$ | $R^{A34}$ | N | N |
| $L_{A1296}$ | $R^{B2}$ | $R^{B1}$ | $R^{B2}$ | $R^{B2}$ | N | N |
| $L_{A1297}$ | $R^{B2}$ | $R^{B1}$ | $R^{B3}$ | $R^{B3}$ | N | N |
| $L_{A1298}$ | $R^{B2}$ | $R^{B1}$ | $R^{B4}$ | $R^{B4}$ | N | N |
| $L_{A1299}$ | $R^{B2}$ | $R^{B1}$ | $R^{B5}$ | $R^{B5}$ | N | N |
| $L_{A1300}$ | $R^{B2}$ | $R^{B1}$ | $R^{B6}$ | $R^{B6}$ | N | N |
| $L_{A1301}$ | $R^{B2}$ | $R^{B1}$ | $R^{B7}$ | $R^{B7}$ | N | N |
| $L_{A1302}$ | $R^{B2}$ | $R^{B1}$ | $R^{B8}$ | $R^{B8}$ | N | N |
| $L_{A1303}$ | $R^{B2}$ | $R^{B1}$ | $R^{B9}$ | $R^{B9}$ | N | N |
| $L_{A1304}$ | $R^{B2}$ | $R^{B1}$ | $R^{A2}$ | $R^{A2}$ | N | N |
| $L_{A1305}$ | $R^{B2}$ | $R^{B1}$ | $R^{A27}$ | $R^{A27}$ | N | N |
| $L_{A1306}$ | $R^{B2}$ | $R^{B1}$ | $R^{A34}$ | $R^{A34}$ | N | N |
| $L_{A1307}$ | $R^{B2}$ | F | $R^{B2}$ | $R^{B2}$ | N | N |
| $L_{A1308}$ | $R^{B2}$ | F | $R^{B3}$ | $R^{B3}$ | N | N |
| $L_{A1309}$ | $R^{B2}$ | F | $R^{B4}$ | $R^{B4}$ | N | N |
| $L_{A1310}$ | $R^{B2}$ | F | $R^{B5}$ | $R^{B5}$ | N | N |
| $L_{A1311}$ | $R^{B2}$ | F | $R^{B6}$ | $R^{B6}$ | N | N |
| $L_{A1312}$ | $R^{B2}$ | F | $R^{B7}$ | $R^{B7}$ | N | N |
| $L_{A1313}$ | $R^{B2}$ | F | $R^{B8}$ | $R^{B8}$ | N | N |
| $L_{A1314}$ | $R^{B2}$ | F | $R^{B9}$ | $R^{B9}$ | N | N |
| $L_{A1315}$ | $R^{B2}$ | F | $R^{A2}$ | $R^{A2}$ | N | N |
| $L_{A1316}$ | $R^{B2}$ | F | $R^{A27}$ | $R^{A27}$ | N | N |
| $L_{A1317}$ | $R^{B2}$ | F | $R^{A34}$ | $R^{A34}$ | N | N |
| $L_{A1318}$ | $R^{B3}$ | $R^{B1}$ | $R^{B2}$ | $R^{B2}$ | N | N |
| $L_{A1319}$ | $R^{B3}$ | $R^{B1}$ | $R^{B3}$ | $R^{B3}$ | N | N |
| $L_{A1320}$ | $R^{B3}$ | $R^{B1}$ | $R^{B4}$ | $R^{B4}$ | N | N |
| $L_{A1321}$ | $R^{B3}$ | $R^{B1}$ | $R^{B5}$ | $R^{B5}$ | N | N |
| $L_{A1322}$ | $R^{B3}$ | $R^{B1}$ | $R^{B6}$ | $R^{B6}$ | N | N |
| $L_{A1323}$ | $R^{B3}$ | $R^{B1}$ | $R^{B7}$ | $R^{B7}$ | N | N |
| $L_{A1324}$ | $R^{B3}$ | $R^{B1}$ | $R^{B8}$ | $R^{B8}$ | N | N |
| $L_{A1325}$ | $R^{B3}$ | $R^{B1}$ | $R^{B9}$ | $R^{B9}$ | N | N |
| $L_{A1326}$ | $R^{B3}$ | $R^{B1}$ | $R^{A2}$ | $R^{A2}$ | N | N |
| $L_{A1327}$ | $R^{B3}$ | $R^{B1}$ | $R^{A27}$ | $R^{A27}$ | N | N |
| $L_{A1328}$ | $R^{B3}$ | $R^{B1}$ | $R^{A34}$ | $R^{A34}$ | N | N |

for $L_{A1329}$ through $L_{A1904}$, $L_A$ has a structure of

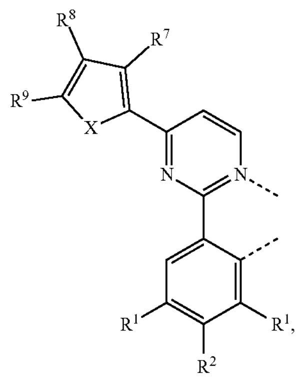

wherein $R^1$, $R^2$, $R^7$, $R^8$, $R^9$, and X are defined as provided below,

-continued

| | $R^1$ | $R^2$ | $R^7$ | $R^8$ | $R^9$ | X |
|---|---|---|---|---|---|---|
| $L_{A1329}$ | $R^{B1}$ | $R^{B1}$ | $R^{B1}$ | $R^{B1}$ | $R^{B1}$ | S |
| $L_{A1330}$ | $R^{B1}$ | $R^{B1}$ | $R^{B1}$ | $R^{B1}$ | $R^{B2}$ | S |
| $L_{A1331}$ | $R^{B1}$ | $R^{B1}$ | $R^{B1}$ | $R^{B1}$ | $R^{B3}$ | S |
| $L_{A1332}$ | $R^{B1}$ | $R^{B1}$ | $R^{B1}$ | $R^{B1}$ | $R^{B4}$ | S |
| $L_{A1333}$ | $R^{B1}$ | $R^{B1}$ | $R^{B1}$ | $R^{B1}$ | $R^{B5}$ | S |
| $L_{A1334}$ | $R^{B1}$ | $R^{B1}$ | $R^{B1}$ | $R^{B1}$ | $R^{B6}$ | S |
| $L_{A1335}$ | $R^{B1}$ | $R^{B1}$ | $R^{B1}$ | $R^{B1}$ | $R^{B7}$ | S |
| $L_{A1336}$ | $R^{B1}$ | $R^{B1}$ | $R^{B1}$ | $R^{B1}$ | $R^{B8}$ | S |
| $L_{A1337}$ | $R^{B1}$ | $R^{B1}$ | $R^{B1}$ | $R^{B1}$ | $R^{B9}$ | S |
| $L_{A1338}$ | $R^{B1}$ | $R^{B1}$ | $R^{B1}$ | $R^{B1}$ | $R^{A2}$ | S |
| $L_{A1339}$ | $R^{B1}$ | $R^{B1}$ | $R^{B1}$ | $R^{B1}$ | $R^{A27}$ | S |
| $L_{A1340}$ | $R^{B1}$ | $R^{B1}$ | $R^{B1}$ | $R^{B1}$ | $R^{A34}$ | S |
| $L_{A1341}$ | $R^{B2}$ | $R^{B1}$ | $R^{B1}$ | $R^{B1}$ | $R^{B1}$ | S |
| $L_{A1342}$ | $R^{B2}$ | $R^{B1}$ | $R^{B1}$ | $R^{B1}$ | $R^{B2}$ | S |
| $L_{A1343}$ | $R^{B2}$ | $R^{B1}$ | $R^{B1}$ | $R^{B1}$ | $R^{B3}$ | S |
| $L_{A1344}$ | $R^{B2}$ | $R^{B1}$ | $R^{B1}$ | $R^{B1}$ | $R^{B4}$ | S |
| $L_{A1345}$ | $R^{B2}$ | $R^{B1}$ | $R^{B1}$ | $R^{B1}$ | $R^{B5}$ | S |
| $L_{A1346}$ | $R^{B2}$ | $R^{B1}$ | $R^{B1}$ | $R^{B1}$ | $R^{B6}$ | S |
| $L_{A1347}$ | $R^{B2}$ | $R^{B1}$ | $R^{B1}$ | $R^{B1}$ | $R^{B7}$ | S |
| $L_{A1348}$ | $R^{B2}$ | $R^{B1}$ | $R^{B1}$ | $R^{B1}$ | $R^{B8}$ | S |
| $L_{A1349}$ | $R^{B2}$ | $R^{B1}$ | $R^{B1}$ | $R^{B1}$ | $R^{B9}$ | S |
| $L_{A1350}$ | $R^{B2}$ | $R^{B1}$ | $R^{B1}$ | $R^{B1}$ | $R^{A2}$ | S |
| $L_{A1351}$ | $R^{B2}$ | $R^{B1}$ | $R^{B1}$ | $R^{B1}$ | $R^{A27}$ | S |
| $L_{A1352}$ | $R^{B2}$ | $R^{B1}$ | $R^{B1}$ | $R^{B1}$ | $R^{A34}$ | S |
| $L_{A1353}$ | $R^{B2}$ | F | $R^{B1}$ | $R^{B1}$ | $R^{B1}$ | S |
| $L_{A1354}$ | $R^{B2}$ | F | $R^{B1}$ | $R^{B1}$ | $R^{B2}$ | S |
| $L_{A1355}$ | $R^{B2}$ | F | $R^{B1}$ | $R^{B1}$ | $R^{B3}$ | S |
| $L_{A1356}$ | $R^{B2}$ | F | $R^{B1}$ | $R^{B1}$ | $R^{B4}$ | S |
| $L_{A1357}$ | $R^{B2}$ | F | $R^{B1}$ | $R^{B1}$ | $R^{B5}$ | S |
| $L_{A1358}$ | $R^{B2}$ | F | $R^{B1}$ | $R^{B1}$ | $R^{B6}$ | S |
| $L_{A1359}$ | $R^{B2}$ | F | $R^{B1}$ | $R^{B1}$ | $R^{B7}$ | S |
| $L_{A1360}$ | $R^{B2}$ | F | $R^{B1}$ | $R^{B1}$ | $R^{B8}$ | S |
| $L_{A1361}$ | $R^{B2}$ | F | $R^{B1}$ | $R^{B1}$ | $R^{B9}$ | S |
| $L_{A1362}$ | $R^{B2}$ | F | $R^{B1}$ | $R^{B1}$ | $R^{A2}$ | S |
| $L_{A1363}$ | $R^{B2}$ | F | $R^{B1}$ | $R^{B1}$ | $R^{A27}$ | S |
| $L_{A1364}$ | $R^{B2}$ | F | $R^{B1}$ | $R^{B1}$ | $R^{A34}$ | S |
| $L_{A1365}$ | $R^{B3}$ | $R^{B1}$ | $R^{B1}$ | $R^{B1}$ | $R^{B1}$ | S |
| $L_{A1366}$ | $R^{B3}$ | $R^{B1}$ | $R^{B1}$ | $R^{B1}$ | $R^{B2}$ | S |
| $L_{A1367}$ | $R^{B3}$ | $R^{B1}$ | $R^{B1}$ | $R^{B1}$ | $R^{B3}$ | S |
| $L_{A1368}$ | $R^{B3}$ | $R^{B1}$ | $R^{B1}$ | $R^{B1}$ | $R^{B4}$ | S |
| $L_{A1369}$ | $R^{B3}$ | $R^{B1}$ | $R^{B1}$ | $R^{B1}$ | $R^{B5}$ | S |
| $L_{A1370}$ | $R^{B3}$ | $R^{B1}$ | $R^{B1}$ | $R^{B1}$ | $R^{B6}$ | S |
| $L_{A1371}$ | $R^{B3}$ | $R^{B1}$ | $R^{B1}$ | $R^{B1}$ | $R^{B7}$ | S |
| $L_{A1372}$ | $R^{B3}$ | $R^{B1}$ | $R^{B1}$ | $R^{B1}$ | $R^{B8}$ | S |
| $L_{A1373}$ | $R^{B3}$ | $R^{B1}$ | $R^{B1}$ | $R^{B1}$ | $R^{B9}$ | S |
| $L_{A1374}$ | $R^{B3}$ | $R^{B1}$ | $R^{B1}$ | $R^{B1}$ | $R^{A2}$ | S |
| $L_{A1375}$ | $R^{B3}$ | $R^{B1}$ | $R^{B1}$ | $R^{B1}$ | $R^{A27}$ | S |
| $L_{A1376}$ | $R^{B3}$ | $R^{B1}$ | $R^{B1}$ | $R^{B1}$ | $R^{A34}$ | S |
| $L_{A1377}$ | $R^{B1}$ | $R^{B1}$ | $R^{B1}$ | $R^{B1}$ | $R^{B1}$ | S |
| $L_{A1378}$ | $R^{B1}$ | $R^{B1}$ | $R^{B1}$ | $R^{B2}$ | $R^{B1}$ | S |
| $L_{A1379}$ | $R^{B1}$ | $R^{B1}$ | $R^{B1}$ | $R^{B3}$ | $R^{B1}$ | S |
| $L_{A1380}$ | $R^{B1}$ | $R^{B1}$ | $R^{B1}$ | $R^{B4}$ | $R^{B1}$ | S |
| $L_{A1381}$ | $R^{B1}$ | $R^{B1}$ | $R^{B1}$ | $R^{B5}$ | $R^{B1}$ | S |
| $L_{A1382}$ | $R^{B1}$ | $R^{B1}$ | $R^{B1}$ | $R^{B6}$ | $R^{B1}$ | S |
| $L_{A1383}$ | $R^{B1}$ | $R^{B1}$ | $R^{B1}$ | $R^{B7}$ | $R^{B1}$ | S |
| $L_{A1384}$ | $R^{B1}$ | $R^{B1}$ | $R^{B1}$ | $R^{B8}$ | $R^{B1}$ | S |
| $L_{A1385}$ | $R^{B1}$ | $R^{B1}$ | $R^{B1}$ | $R^{B9}$ | $R^{B1}$ | S |
| $L_{A1386}$ | $R^{B1}$ | $R^{B1}$ | $R^{B1}$ | $R^{A2}$ | $R^{B1}$ | S |
| $L_{A1387}$ | $R^{B1}$ | $R^{B1}$ | $R^{B1}$ | $R^{A27}$ | $R^{B1}$ | S |
| $L_{A1388}$ | $R^{B1}$ | $R^{B1}$ | $R^{B1}$ | $R^{A34}$ | $R^{B1}$ | S |
| $L_{A1389}$ | $R^{B2}$ | $R^{B1}$ | $R^{B1}$ | $R^{B1}$ | $R^{B1}$ | S |
| $L_{A1390}$ | $R^{B2}$ | $R^{B1}$ | $R^{B1}$ | $R^{B2}$ | $R^{B1}$ | S |
| $L_{A1391}$ | $R^{B2}$ | $R^{B1}$ | $R^{B1}$ | $R^{B3}$ | $R^{B1}$ | S |
| $L_{A1392}$ | $R^{B2}$ | $R^{B1}$ | $R^{B1}$ | $R^{B4}$ | $R^{B1}$ | S |
| $L_{A1393}$ | $R^{B2}$ | $R^{B1}$ | $R^{B1}$ | $R^{B5}$ | $R^{B1}$ | S |
| $L_{A1394}$ | $R^{B2}$ | $R^{B1}$ | $R^{B1}$ | $R^{B6}$ | $R^{B1}$ | S |
| $L_{A1395}$ | $R^{B2}$ | $R^{B1}$ | $R^{B1}$ | $R^{B7}$ | $R^{B1}$ | S |
| $L_{A1396}$ | $R^{B2}$ | $R^{B1}$ | $R^{B1}$ | $R^{B8}$ | $R^{B1}$ | S |
| $L_{A1397}$ | $R^{B2}$ | $R^{B1}$ | $R^{B1}$ | $R^{B9}$ | $R^{B1}$ | S |
| $L_{A1398}$ | $R^{B2}$ | $R^{B1}$ | $R^{B1}$ | $R^{A2}$ | $R^{B1}$ | S |
| $L_{A1399}$ | $R^{B2}$ | $R^{B1}$ | $R^{B1}$ | $R^{A27}$ | $R^{B1}$ | S |
| $L_{A1400}$ | $R^{B2}$ | $R^{B1}$ | $R^{B1}$ | $R^{A34}$ | $R^{B1}$ | S |
| $L_{A1401}$ | $R^{B2}$ | F | $R^{B1}$ | $R^{B1}$ | $R^{B1}$ | S |
| $L_{A1402}$ | $R^{B2}$ | F | $R^{B1}$ | $R^{B2}$ | $R^{B1}$ | S |
| $L_{A1403}$ | $R^{B2}$ | F | $R^{B1}$ | $R^{B3}$ | $R^{B1}$ | S |
| $L_{A1404}$ | $R^{B2}$ | F | $R^{B1}$ | $R^{B4}$ | $R^{B1}$ | S |
| $L_{A1405}$ | $R^{B2}$ | F | $R^{B1}$ | $R^{B5}$ | $R^{B1}$ | S |
| $L_{A1406}$ | $R^{B2}$ | F | $R^{B1}$ | $R^{B6}$ | $R^{B1}$ | S |
| $L_{A1407}$ | $R^{B2}$ | F | $R^{B1}$ | $R^{B7}$ | $R^{B1}$ | S |
| $L_{A1408}$ | $R^{B2}$ | F | $R^{B1}$ | $R^{B8}$ | $R^{B1}$ | S |
| $L_{A1409}$ | $R^{B2}$ | F | $R^{B1}$ | $R^{B9}$ | $R^{B1}$ | S |
| $L_{A1410}$ | $R^{B2}$ | F | $R^{B1}$ | $R^{A2}$ | $R^{B1}$ | S |
| $L_{A1411}$ | $R^{B2}$ | F | $R^{B1}$ | $R^{A27}$ | $R^{B1}$ | S |
| $L_{A1412}$ | $R^{B2}$ | F | $R^{B1}$ | $R^{A34}$ | $R^{B1}$ | S |
| $L_{A1413}$ | $R^{B3}$ | $R^{B1}$ | $R^{B1}$ | $R^{B1}$ | $R^{B1}$ | S |
| $L_{A1414}$ | $R^{B3}$ | $R^{B1}$ | $R^{B1}$ | $R^{B2}$ | $R^{B1}$ | S |
| $L_{A1415}$ | $R^{B3}$ | $R^{B1}$ | $R^{B1}$ | $R^{B3}$ | $R^{B1}$ | S |
| $L_{A1416}$ | $R^{B3}$ | $R^{B1}$ | $R^{B1}$ | $R^{B4}$ | $R^{B1}$ | S |
| $L_{A1417}$ | $R^{B3}$ | $R^{B1}$ | $R^{B1}$ | $R^{B5}$ | $R^{B1}$ | S |
| $L_{A1418}$ | $R^{B3}$ | $R^{B1}$ | $R^{B1}$ | $R^{B6}$ | $R^{B1}$ | S |
| $L_{A1419}$ | $R^{B3}$ | $R^{B1}$ | $R^{B1}$ | $R^{B7}$ | $R^{B1}$ | S |
| $L_{A1420}$ | $R^{B3}$ | $R^{B1}$ | $R^{B1}$ | $R^{B8}$ | $R^{B1}$ | S |
| $L_{A1421}$ | $R^{B3}$ | $R^{B1}$ | $R^{B1}$ | $R^{B9}$ | $R^{B1}$ | S |
| $L_{A1422}$ | $R^{B3}$ | $R^{B1}$ | $R^{B1}$ | $R^{A2}$ | $R^{B1}$ | S |
| $L_{A1423}$ | $R^{B3}$ | $R^{B1}$ | $R^{B1}$ | $R^{A27}$ | $R^{B1}$ | S |
| $L_{A1424}$ | $R^{B3}$ | $R^{B1}$ | $R^{B1}$ | $R^{A34}$ | $R^{B1}$ | S |
| $L_{A1425}$ | $R^{B1}$ | $R^{B1}$ | $R^{B1}$ | $R^{B1}$ | $R^{B1}$ | S |
| $L_{A1426}$ | $R^{B1}$ | $R^{B1}$ | $R^{B2}$ | $R^{B1}$ | $R^{B1}$ | S |
| $L_{A1427}$ | $R^{B1}$ | $R^{B1}$ | $R^{B3}$ | $R^{B1}$ | $R^{B1}$ | S |
| $L_{A1428}$ | $R^{B1}$ | $R^{B1}$ | $R^{B4}$ | $R^{B1}$ | $R^{B1}$ | S |
| $L_{A1429}$ | $R^{B1}$ | $R^{B1}$ | $R^{B5}$ | $R^{B1}$ | $R^{B1}$ | S |
| $L_{A1430}$ | $R^{B1}$ | $R^{B1}$ | $R^{B6}$ | $R^{B1}$ | $R^{B1}$ | S |
| $L_{A1431}$ | $R^{B1}$ | $R^{B1}$ | $R^{B7}$ | $R^{B1}$ | $R^{B1}$ | S |
| $L_{A1432}$ | $R^{B1}$ | $R^{B1}$ | $R^{B8}$ | $R^{B1}$ | $R^{B1}$ | S |
| $L_{A1433}$ | $R^{B1}$ | $R^{B1}$ | $R^{B9}$ | $R^{B1}$ | $R^{B1}$ | S |
| $L_{A1434}$ | $R^{B1}$ | $R^{B1}$ | $R^{A2}$ | $R^{B1}$ | $R^{B1}$ | S |
| $L_{A1435}$ | $R^{B1}$ | $R^{B1}$ | $R^{A27}$ | $R^{B1}$ | $R^{B1}$ | S |
| $L_{A1436}$ | $R^{B1}$ | $R^{B1}$ | $R^{A34}$ | $R^{B1}$ | $R^{B1}$ | S |
| $L_{A1437}$ | $R^{B2}$ | $R^{B1}$ | $R^{B1}$ | $R^{B1}$ | $R^{B1}$ | S |
| $L_{A1438}$ | $R^{B2}$ | $R^{B1}$ | $R^{B2}$ | $R^{B1}$ | $R^{B1}$ | S |
| $L_{A1439}$ | $R^{B2}$ | $R^{B1}$ | $R^{B3}$ | $R^{B1}$ | $R^{B1}$ | S |
| $L_{A1440}$ | $R^{B2}$ | $R^{B1}$ | $R^{B4}$ | $R^{B1}$ | $R^{B1}$ | S |
| $L_{A1441}$ | $R^{B2}$ | $R^{B1}$ | $R^{B5}$ | $R^{B1}$ | $R^{B1}$ | S |
| $L_{A1442}$ | $R^{B2}$ | $R^{B1}$ | $R^{B6}$ | $R^{B1}$ | $R^{B1}$ | S |
| $L_{A1443}$ | $R^{B2}$ | $R^{B1}$ | $R^{B7}$ | $R^{B1}$ | $R^{B1}$ | S |
| $L_{A1444}$ | $R^{B2}$ | $R^{B1}$ | $R^{B8}$ | $R^{B1}$ | $R^{B1}$ | S |
| $L_{A1445}$ | $R^{B2}$ | $R^{B1}$ | $R^{B9}$ | $R^{B1}$ | $R^{B1}$ | S |
| $L_{A1446}$ | $R^{B2}$ | $R^{B1}$ | $R^{A2}$ | $R^{B1}$ | $R^{B1}$ | S |
| $L_{A1447}$ | $R^{B2}$ | $R^{B1}$ | $R^{A27}$ | $R^{B1}$ | $R^{B1}$ | S |
| $L_{A1448}$ | $R^{B2}$ | $R^{B1}$ | $R^{A34}$ | $R^{B1}$ | $R^{B1}$ | S |
| $L_{A1449}$ | $R^{B2}$ | F | $R^{B1}$ | $R^{B1}$ | $R^{B1}$ | S |
| $L_{A1450}$ | $R^{B2}$ | F | $R^{B2}$ | $R^{B1}$ | $R^{B1}$ | S |
| $L_{A1451}$ | $R^{B2}$ | F | $R^{B3}$ | $R^{B1}$ | $R^{B1}$ | S |
| $L_{A1452}$ | $R^{B2}$ | F | $R^{B4}$ | $R^{B1}$ | $R^{B1}$ | S |
| $L_{A1453}$ | $R^{B2}$ | F | $R^{B5}$ | $R^{B1}$ | $R^{B1}$ | S |
| $L_{A1454}$ | $R^{B2}$ | F | $R^{B6}$ | $R^{B1}$ | $R^{B1}$ | S |
| $L_{A1455}$ | $R^{B2}$ | F | $R^{B7}$ | $R^{B1}$ | $R^{B1}$ | S |
| $L_{A1456}$ | $R^{B2}$ | F | $R^{B8}$ | $R^{B1}$ | $R^{B1}$ | S |
| $L_{A1457}$ | $R^{B2}$ | F | $R^{B9}$ | $R^{B1}$ | $R^{B1}$ | S |

-continued

| | $R^1$ | $R^2$ | $R^7$ | $R^8$ | $R^9$ | X |
|---|---|---|---|---|---|---|
| $L_{A1458}$ | $R^{B2}$ | F | $R^{A2}$ | $R^{B1}$ | $R^{B1}$ | S |
| $L_{A1459}$ | $R^{B2}$ | F | $R^{A27}$ | $R^{B1}$ | $R^{B1}$ | S |
| $L_{A1460}$ | $R^{B2}$ | F | $R^{A34}$ | $R^{B1}$ | $R^{B1}$ | S |
| $L_{A1461}$ | $R^{B3}$ | $R^{B1}$ | $R^{B1}$ | $R^{B1}$ | $R^{B1}$ | S |
| $L_{A1462}$ | $R^{B3}$ | $R^{B1}$ | $R^{B2}$ | $R^{B1}$ | $R^{B1}$ | S |
| $L_{A1463}$ | $R^{B3}$ | $R^{B1}$ | $R^{B3}$ | $R^{B1}$ | $R^{B1}$ | S |
| $L_{A1464}$ | $R^{B3}$ | $R^{B1}$ | $R^{B4}$ | $R^{B1}$ | $R^{B1}$ | S |
| $L_{A1465}$ | $R^{B3}$ | $R^{B1}$ | $R^{B5}$ | $R^{B1}$ | $R^{B1}$ | S |
| $L_{A1466}$ | $R^{B3}$ | $R^{B1}$ | $R^{B6}$ | $R^{B1}$ | $R^{B1}$ | S |
| $L_{A1467}$ | $R^{B3}$ | $R^{B1}$ | $R^{B7}$ | $R^{B1}$ | $R^{B1}$ | S |
| $L_{A1468}$ | $R^{B3}$ | $R^{B1}$ | $R^{B8}$ | $R^{B1}$ | $R^{B1}$ | S |
| $L_{A1469}$ | $R^{B3}$ | $R^{B1}$ | $R^{B9}$ | $R^{B1}$ | $R^{B1}$ | S |
| $L_{A1470}$ | $R^{B3}$ | $R^{B1}$ | $R^{A2}$ | $R^{B1}$ | $R^{B1}$ | S |
| $L_{A1471}$ | $R^{B3}$ | $R^{B1}$ | $R^{A27}$ | $R^{B1}$ | $R^{B1}$ | S |
| $L_{A1472}$ | $R^{B3}$ | $R^{B1}$ | $R^{A34}$ | $R^{B1}$ | $R^{B1}$ | S |
| $L_{A1473}$ | $R^{B1}$ | $R^{B1}$ | $R^{B1}$ | $R^{B1}$ | $R^{B1}$ | S |
| $L_{A1474}$ | $R^{B1}$ | $R^{B1}$ | $R^{B2}$ | $R^{B1}$ | $R^{B2}$ | S |
| $L_{A1475}$ | $R^{B1}$ | $R^{B1}$ | $R^{B3}$ | $R^{B1}$ | $R^{B3}$ | S |
| $L_{A1476}$ | $R^{B1}$ | $R^{B1}$ | $R^{B4}$ | $R^{B1}$ | $R^{B4}$ | S |
| $L_{A1477}$ | $R^{B1}$ | $R^{B1}$ | $R^{B5}$ | $R^{B1}$ | $R^{B5}$ | S |
| $L_{A1478}$ | $R^{B1}$ | $R^{B1}$ | $R^{B6}$ | $R^{B1}$ | $R^{B6}$ | S |
| $L_{A1479}$ | $R^{B1}$ | $R^{B1}$ | $R^{B7}$ | $R^{B1}$ | $R^{B7}$ | S |
| $L_{A1480}$ | $R^{B1}$ | $R^{B1}$ | $R^{B8}$ | $R^{B1}$ | $R^{B8}$ | S |
| $L_{A1481}$ | $R^{B1}$ | $R^{B1}$ | $R^{B9}$ | $R^{B1}$ | $R^{B9}$ | S |
| $L_{A1482}$ | $R^{B1}$ | $R^{B1}$ | $R^{A2}$ | $R^{B1}$ | $R^{A2}$ | S |
| $L_{A1483}$ | $R^{B1}$ | $R^{B1}$ | $R^{A27}$ | $R^{B1}$ | $R^{A27}$ | S |
| $L_{A1484}$ | $R^{B1}$ | $R^{B1}$ | $R^{A34}$ | $R^{B1}$ | $R^{A34}$ | S |
| $L_{A1485}$ | $R^{B2}$ | $R^{B1}$ | $R^{B1}$ | $R^{B1}$ | $R^{B1}$ | S |
| $L_{A1486}$ | $R^{B2}$ | $R^{B1}$ | $R^{B2}$ | $R^{B1}$ | $R^{B2}$ | S |
| $L_{A1487}$ | $R^{B2}$ | $R^{B1}$ | $R^{B3}$ | $R^{B1}$ | $R^{B3}$ | S |
| $L_{A1488}$ | $R^{B2}$ | $R^{B1}$ | $R^{B4}$ | $R^{B1}$ | $R^{B4}$ | S |
| $L_{A1489}$ | $R^{B2}$ | $R^{B1}$ | $R^{B5}$ | $R^{B1}$ | $R^{B5}$ | S |
| $L_{A1490}$ | $R^{B2}$ | $R^{B1}$ | $R^{B6}$ | $R^{B1}$ | $R^{B6}$ | S |
| $L_{A1491}$ | $R^{B2}$ | $R^{B1}$ | $R^{B7}$ | $R^{B1}$ | $R^{B7}$ | S |
| $L_{A1492}$ | $R^{B2}$ | $R^{B1}$ | $R^{B8}$ | $R^{B1}$ | $R^{B8}$ | S |
| $L_{A1493}$ | $R^{B2}$ | $R^{B1}$ | $R^{B9}$ | $R^{B1}$ | $R^{B9}$ | S |
| $L_{A1494}$ | $R^{B2}$ | $R^{B1}$ | $R^{A2}$ | $R^{B1}$ | $R^{A2}$ | S |
| $L_{A1495}$ | $R^{B2}$ | $R^{B1}$ | $R^{A27}$ | $R^{B1}$ | $R^{A27}$ | S |
| $L_{A1496}$ | $R^{B2}$ | $R^{B1}$ | $R^{A34}$ | $R^{B1}$ | $R^{A34}$ | S |
| $L_{A1497}$ | $R^{B2}$ | F | $R^{B1}$ | $R^{B1}$ | $R^{B1}$ | S |
| $L_{A1498}$ | $R^{B2}$ | F | $R^{B2}$ | $R^{B1}$ | $R^{B2}$ | S |
| $L_{A1499}$ | $R^{B2}$ | F | $R^{B3}$ | $R^{B1}$ | $R^{B3}$ | S |
| $L_{A1500}$ | $R^{B2}$ | F | $R^{B4}$ | $R^{B1}$ | $R^{B4}$ | S |
| $L_{A1501}$ | $R^{B2}$ | F | $R^{B5}$ | $R^{B1}$ | $R^{B5}$ | S |
| $L_{A1502}$ | $R^{B2}$ | F | $R^{B6}$ | $R^{B1}$ | $R^{B6}$ | S |
| $L_{A1503}$ | $R^{B2}$ | F | $R^{B7}$ | $R^{B1}$ | $R^{B7}$ | S |
| $L_{A1504}$ | $R^{B2}$ | F | $R^{B8}$ | $R^{B1}$ | $R^{B8}$ | S |
| $L_{A1505}$ | $R^{B2}$ | F | $R^{B9}$ | $R^{B1}$ | $R^{B9}$ | S |
| $L_{A1506}$ | $R^{B2}$ | F | $R^{A2}$ | $R^{B1}$ | $R^{A2}$ | S |
| $L_{A1507}$ | $R^{B2}$ | F | $R^{A27}$ | $R^{B1}$ | $R^{A27}$ | S |
| $L_{A1508}$ | $R^{B2}$ | F | $R^{A34}$ | $R^{B1}$ | $R^{A34}$ | S |
| $L_{A1509}$ | $R^{B3}$ | $R^{B1}$ | $R^{B1}$ | $R^{B1}$ | $R^{B1}$ | S |
| $L_{A1510}$ | $R^{B3}$ | $R^{B1}$ | $R^{B2}$ | $R^{B1}$ | $R^{B2}$ | S |
| $L_{A1511}$ | $R^{B3}$ | $R^{B1}$ | $R^{B3}$ | $R^{B1}$ | $R^{B3}$ | S |
| $L_{A1512}$ | $R^{B3}$ | $R^{B1}$ | $R^{B4}$ | $R^{B1}$ | $R^{B4}$ | S |
| $L_{A1513}$ | $R^{B3}$ | $R^{B1}$ | $R^{B5}$ | $R^{B1}$ | $R^{B5}$ | S |
| $L_{A1514}$ | $R^{B3}$ | $R^{B1}$ | $R^{B6}$ | $R^{B1}$ | $R^{B6}$ | S |
| $L_{A1515}$ | $R^{B3}$ | $R^{B1}$ | $R^{B7}$ | $R^{B1}$ | $R^{B7}$ | S |
| $L_{A1516}$ | $R^{B3}$ | $R^{B1}$ | $R^{B8}$ | $R^{B1}$ | $R^{B8}$ | S |
| $L_{A1517}$ | $R^{B3}$ | $R^{B1}$ | $R^{B9}$ | $R^{B1}$ | $R^{B9}$ | S |
| $L_{A1518}$ | $R^{B3}$ | $R^{B1}$ | $R^{A2}$ | $R^{B1}$ | $R^{A2}$ | S |
| $L_{A1519}$ | $R^{B3}$ | $R^{B1}$ | $R^{A27}$ | $R^{B1}$ | $R^{A27}$ | S |
| $L_{A1520}$ | $R^{B3}$ | $R^{B1}$ | $R^{A34}$ | $R^{B1}$ | $R^{A34}$ | S |
| $L_{A1521}$ | $R^{B1}$ | $R^{B1}$ | $R^{B1}$ | $R^{B1}$ | $R^{B1}$ | S |
| $L_{A1522}$ | $R^{B1}$ | $R^{B1}$ | $R^{B1}$ | $R^{B2}$ | $R^{B2}$ | S |
| $L_{A1523}$ | $R^{B1}$ | $R^{B1}$ | $R^{B1}$ | $R^{B3}$ | $R^{B3}$ | S |
| $L_{A1524}$ | $R^{B1}$ | $R^{B1}$ | $R^{B1}$ | $R^{B4}$ | $R^{B4}$ | S |
| $L_{A1525}$ | $R^{B1}$ | $R^{B1}$ | $R^{B1}$ | $R^{B5}$ | $R^{B5}$ | S |
| $L_{A1526}$ | $R^{B1}$ | $R^{B1}$ | $R^{B1}$ | $R^{B6}$ | $R^{B6}$ | S |
| $L_{A1527}$ | $R^{B1}$ | $R^{B1}$ | $R^{B1}$ | $R^{B7}$ | $R^{B7}$ | S |
| $L_{A1528}$ | $R^{B1}$ | $R^{B1}$ | $R^{B1}$ | $R^{B8}$ | $R^{B8}$ | S |
| $L_{A1529}$ | $R^{B1}$ | $R^{B1}$ | $R^{B1}$ | $R^{B9}$ | $R^{B9}$ | S |
| $L_{A1530}$ | $R^{B1}$ | $R^{B1}$ | $R^{B1}$ | $R^{A2}$ | $R^{A2}$ | S |
| $L_{A1531}$ | $R^{B1}$ | $R^{B1}$ | $R^{B1}$ | $R^{A27}$ | $R^{A27}$ | S |
| $L_{A1532}$ | $R^{B1}$ | $R^{B1}$ | $R^{B1}$ | $R^{A34}$ | $R^{A34}$ | S |
| $L_{A1533}$ | $R^{B2}$ | $R^{B1}$ | $R^{B1}$ | $R^{B1}$ | $R^{B1}$ | S |
| $L_{A1534}$ | $R^{B2}$ | $R^{B1}$ | $R^{B1}$ | $R^{B2}$ | $R^{B2}$ | S |

-continued

| | $R^1$ | $R^2$ | $R^7$ | $R^8$ | $R^9$ | X |
|---|---|---|---|---|---|---|
| $L_{A1535}$ | $R^{B2}$ | $R^{B1}$ | $R^{B1}$ | $R^{B3}$ | $R^{B3}$ | S |
| $L_{A1536}$ | $R^{B2}$ | $R^{B1}$ | $R^{B1}$ | $R^{B4}$ | $R^{B4}$ | S |
| $L_{A1537}$ | $R^{B2}$ | $R^{B1}$ | $R^{B1}$ | $R^{B5}$ | $R^{B5}$ | S |
| $L_{A1538}$ | $R^{B2}$ | $R^{B1}$ | $R^{B1}$ | $R^{B6}$ | $R^{B6}$ | S |
| $L_{A1539}$ | $R^{B2}$ | $R^{B1}$ | $R^{B1}$ | $R^{B7}$ | $R^{B7}$ | S |
| $L_{A1540}$ | $R^{B2}$ | $R^{B1}$ | $R^{B1}$ | $R^{B8}$ | $R^{B8}$ | S |
| $L_{A1541}$ | $R^{B2}$ | $R^{B1}$ | $R^{B1}$ | $R^{B9}$ | $R^{B9}$ | S |
| $L_{A1542}$ | $R^{B2}$ | $R^{B1}$ | $R^{B1}$ | $R^{A2}$ | $R^{A2}$ | S |
| $L_{A1543}$ | $R^{B2}$ | $R^{B1}$ | $R^{B1}$ | $R^{A27}$ | $R^{A27}$ | S |
| $L_{A1544}$ | $R^{B2}$ | $R^{B1}$ | $R^{B1}$ | $R^{A34}$ | $R^{A34}$ | S |
| $L_{A1545}$ | $R^{B2}$ | F | $R^{B1}$ | $R^{B1}$ | $R^{B1}$ | S |
| $L_{A1546}$ | $R^{B2}$ | F | $R^{B1}$ | $R^{B2}$ | $R^{B2}$ | S |
| $L_{A1547}$ | $R^{B2}$ | F | $R^{B1}$ | $R^{B3}$ | $R^{B3}$ | S |
| $L_{A1548}$ | $R^{B2}$ | F | $R^{B1}$ | $R^{B4}$ | $R^{B4}$ | S |
| $L_{A1549}$ | $R^{B2}$ | F | $R^{B1}$ | $R^{B5}$ | $R^{B5}$ | S |
| $L_{A1550}$ | $R^{B2}$ | F | $R^{B1}$ | $R^{B6}$ | $R^{B6}$ | S |
| $L_{A1551}$ | $R^{B2}$ | F | $R^{B1}$ | $R^{B7}$ | $R^{B7}$ | S |
| $L_{A1552}$ | $R^{B2}$ | F | $R^{B1}$ | $R^{B8}$ | $R^{B8}$ | S |
| $L_{A1553}$ | $R^{B2}$ | F | $R^{B1}$ | $R^{B9}$ | $R^{B9}$ | S |
| $L_{A1554}$ | $R^{B2}$ | F | $R^{B1}$ | $R^{A2}$ | $R^{A2}$ | S |
| $L_{A1555}$ | $R^{B2}$ | F | $R^{B1}$ | $R^{A27}$ | $R^{A27}$ | S |
| $L_{A1556}$ | $R^{B2}$ | F | $R^{B1}$ | $R^{A34}$ | $R^{A34}$ | S |
| $L_{A1557}$ | $R^{B3}$ | $R^{B1}$ | $R^{B1}$ | $R^{B1}$ | $R^{B1}$ | S |
| $L_{A1558}$ | $R^{B3}$ | $R^{B1}$ | $R^{B1}$ | $R^{B2}$ | $R^{B2}$ | S |
| $L_{A1559}$ | $R^{B3}$ | $R^{B1}$ | $R^{B1}$ | $R^{B3}$ | $R^{B3}$ | S |
| $L_{A1560}$ | $R^{B3}$ | $R^{B1}$ | $R^{B1}$ | $R^{B4}$ | $R^{B4}$ | S |
| $L_{A1561}$ | $R^{B3}$ | $R^{B1}$ | $R^{B1}$ | $R^{B5}$ | $R^{B5}$ | S |
| $L_{A1562}$ | $R^{B3}$ | $R^{B1}$ | $R^{B1}$ | $R^{B6}$ | $R^{B6}$ | S |
| $L_{A1563}$ | $R^{B3}$ | $R^{B1}$ | $R^{B1}$ | $R^{B7}$ | $R^{B7}$ | S |
| $L_{A1564}$ | $R^{B3}$ | $R^{B1}$ | $R^{B1}$ | $R^{B8}$ | $R^{B8}$ | S |
| $L_{A1565}$ | $R^{B3}$ | $R^{B1}$ | $R^{B1}$ | $R^{B9}$ | $R^{B9}$ | S |
| $L_{A1566}$ | $R^{B3}$ | $R^{B1}$ | $R^{B1}$ | $R^{A2}$ | $R^{A2}$ | S |
| $L_{A1567}$ | $R^{B3}$ | $R^{B1}$ | $R^{B1}$ | $R^{A27}$ | $R^{A27}$ | S |
| $L_{A1568}$ | $R^{B3}$ | $R^{B1}$ | $R^{B1}$ | $R^{A34}$ | $R^{A34}$ | S |
| $L_{A1569}$ | $R^{B1}$ | $R^{B1}$ | $R^{B1}$ | $R^{B1}$ | $R^{B1}$ | S |
| $L_{A1570}$ | $R^{B1}$ | $R^{B1}$ | $R^{B2}$ | $R^{B2}$ | $R^{B1}$ | S |
| $L_{A1571}$ | $R^{B1}$ | $R^{B1}$ | $R^{B3}$ | $R^{B3}$ | $R^{B1}$ | S |
| $L_{A1572}$ | $R^{B1}$ | $R^{B1}$ | $R^{B4}$ | $R^{B4}$ | $R^{B1}$ | S |
| $L_{A1573}$ | $R^{B1}$ | $R^{B1}$ | $R^{B5}$ | $R^{B5}$ | $R^{B1}$ | S |
| $L_{A1574}$ | $R^{B1}$ | $R^{B1}$ | $R^{B6}$ | $R^{B6}$ | $R^{B1}$ | S |
| $L_{A1575}$ | $R^{B1}$ | $R^{B1}$ | $R^{B7}$ | $R^{B7}$ | $R^{B1}$ | S |
| $L_{A1576}$ | $R^{B1}$ | $R^{B1}$ | $R^{B8}$ | $R^{B8}$ | $R^{B1}$ | S |
| $L_{A1577}$ | $R^{B1}$ | $R^{B1}$ | $R^{B9}$ | $R^{B9}$ | $R^{B1}$ | S |
| $L_{A1578}$ | $R^{B1}$ | $R^{B1}$ | $R^{A2}$ | $R^{A2}$ | $R^{B1}$ | S |
| $L_{A1579}$ | $R^{B1}$ | $R^{B1}$ | $R^{A27}$ | $R^{A27}$ | $R^{B1}$ | S |
| $L_{A1580}$ | $R^{B1}$ | $R^{B1}$ | $R^{A34}$ | $R^{A34}$ | $R^{B1}$ | S |
| $L_{A1581}$ | $R^{B2}$ | $R^{B1}$ | $R^{B1}$ | $R^{B1}$ | $R^{B1}$ | S |
| $L_{A1582}$ | $R^{B2}$ | $R^{B1}$ | $R^{B2}$ | $R^{B2}$ | $R^{B1}$ | S |
| $L_{A1583}$ | $R^{B2}$ | $R^{B1}$ | $R^{B3}$ | $R^{B3}$ | $R^{B1}$ | S |
| $L_{A1584}$ | $R^{B2}$ | $R^{B1}$ | $R^{B4}$ | $R^{B4}$ | $R^{B1}$ | S |
| $L_{A1585}$ | $R^{B2}$ | $R^{B1}$ | $R^{B5}$ | $R^{B5}$ | $R^{B1}$ | S |
| $L_{A1586}$ | $R^{B2}$ | $R^{B1}$ | $R^{B6}$ | $R^{B6}$ | $R^{B1}$ | S |
| $L_{A1587}$ | $R^{B2}$ | $R^{B1}$ | $R^{B7}$ | $R^{B7}$ | $R^{B1}$ | S |
| $L_{A1588}$ | $R^{B2}$ | $R^{B1}$ | $R^{B8}$ | $R^{B8}$ | $R^{B1}$ | S |
| $L_{A1589}$ | $R^{B2}$ | $R^{B1}$ | $R^{B9}$ | $R^{B9}$ | $R^{B1}$ | S |
| $L_{A1590}$ | $R^{B2}$ | $R^{B1}$ | $R^{A2}$ | $R^{A2}$ | $R^{B1}$ | S |
| $L_{A1591}$ | $R^{B2}$ | $R^{B1}$ | $R^{A27}$ | $R^{A27}$ | $R^{B1}$ | S |
| $L_{A1592}$ | $R^{B2}$ | $R^{B1}$ | $R^{A34}$ | $R^{A34}$ | $R^{B1}$ | S |
| $L_{A1593}$ | $R^{B2}$ | F | $R^{B1}$ | $R^{B1}$ | $R^{B1}$ | S |
| $L_{A1594}$ | $R^{B2}$ | F | $R^{B2}$ | $R^{B2}$ | $R^{B1}$ | S |
| $L_{A1595}$ | $R^{B2}$ | F | $R^{B3}$ | $R^{B3}$ | $R^{B1}$ | S |
| $L_{A1596}$ | $R^{B2}$ | F | $R^{B4}$ | $R^{B4}$ | $R^{B1}$ | S |
| $L_{A1597}$ | $R^{B2}$ | F | $R^{B5}$ | $R^{B5}$ | $R^{B1}$ | S |
| $L_{A1598}$ | $R^{B2}$ | F | $R^{B6}$ | $R^{B6}$ | $R^{B1}$ | S |
| $L_{A1599}$ | $R^{B2}$ | F | $R^{B7}$ | $R^{B7}$ | $R^{B1}$ | S |
| $L_{A1600}$ | $R^{B2}$ | F | $R^{B8}$ | $R^{B8}$ | $R^{B1}$ | S |
| $L_{A1601}$ | $R^{B2}$ | F | $R^{B9}$ | $R^{B9}$ | $R^{B1}$ | S |
| $L_{A1602}$ | $R^{B2}$ | F | $R^{A2}$ | $R^{A2}$ | $R^{B1}$ | S |
| $L_{A1603}$ | $R^{B2}$ | F | $R^{A27}$ | $R^{A27}$ | $R^{B1}$ | S |
| $L_{A1604}$ | $R^{B2}$ | F | $R^{A34}$ | $R^{A34}$ | $R^{B1}$ | S |
| $L_{A1605}$ | $R^{B3}$ | $R^{B1}$ | $R^{B1}$ | $R^{B1}$ | $R^{B1}$ | S |
| $L_{A1606}$ | $R^{B3}$ | $R^{B1}$ | $R^{B2}$ | $R^{B2}$ | $R^{B1}$ | S |
| $L_{A1607}$ | $R^{B3}$ | $R^{B1}$ | $R^{B3}$ | $R^{B3}$ | $R^{B1}$ | S |
| $L_{A1608}$ | $R^{B3}$ | $R^{B1}$ | $R^{B4}$ | $R^{B4}$ | $R^{B1}$ | S |
| $L_{A1609}$ | $R^{B3}$ | $R^{B1}$ | $R^{B5}$ | $R^{B5}$ | $R^{B1}$ | S |
| $L_{A1610}$ | $R^{B3}$ | $R^{B1}$ | $R^{B6}$ | $R^{B6}$ | $R^{B1}$ | S |
| $L_{A1611}$ | $R^{B3}$ | $R^{B1}$ | $R^{B7}$ | $R^{B7}$ | $R^{B1}$ | S |

-continued

| | $R^1$ | $R^2$ | $R^7$ | $R^8$ | $R^9$ | X |
|---|---|---|---|---|---|---|
| $L_{A1612}$ | $R^{B3}$ | $R^{B1}$ | $R^{B8}$ | $R^{B8}$ | $R^{B1}$ | S |
| $L_{A1613}$ | $R^{B3}$ | $R^{B1}$ | $R^{B9}$ | $R^{B9}$ | $R^{B1}$ | S |
| $L_{A1614}$ | $R^{B3}$ | $R^{B1}$ | $R^{A2}$ | $R^{A2}$ | $R^{B1}$ | S |
| $L_{A1615}$ | $R^{B3}$ | $R^{B1}$ | $R^{A27}$ | $R^{A27}$ | $R^{B1}$ | S |
| $L_{A1616}$ | $R^{B3}$ | $R^{B1}$ | $R^{A34}$ | $R^{A34}$ | $R^{B1}$ | S |
| $L_{A1617}$ | $R^{B1}$ | $R^{B1}$ | $R^{B1}$ | $R^{B1}$ | $R^{B1}$ | O |
| $L_{A1618}$ | $R^{B1}$ | $R^{B1}$ | $R^{B1}$ | $R^{B1}$ | $R^{B2}$ | O |
| $L_{A1619}$ | $R^{B1}$ | $R^{B1}$ | $R^{B1}$ | $R^{B1}$ | $R^{B3}$ | O |
| $L_{A1620}$ | $R^{B1}$ | $R^{B1}$ | $R^{B1}$ | $R^{B1}$ | $R^{B4}$ | O |
| $L_{A1621}$ | $R^{B1}$ | $R^{B1}$ | $R^{B1}$ | $R^{B1}$ | $R^{B5}$ | O |
| $L_{A1622}$ | $R^{B1}$ | $R^{B1}$ | $R^{B1}$ | $R^{B1}$ | $R^{B6}$ | O |
| $L_{A1623}$ | $R^{B1}$ | $R^{B1}$ | $R^{B1}$ | $R^{B1}$ | $R^{B7}$ | O |
| $L_{A1624}$ | $R^{B1}$ | $R^{B1}$ | $R^{B1}$ | $R^{B1}$ | $R^{B8}$ | O |
| $L_{A1625}$ | $R^{B1}$ | $R^{B1}$ | $R^{B1}$ | $R^{B1}$ | $R^{B9}$ | O |
| $L_{A1626}$ | $R^{B1}$ | $R^{B1}$ | $R^{B1}$ | $R^{B1}$ | $R^{A2}$ | O |
| $L_{A1627}$ | $R^{B1}$ | $R^{B1}$ | $R^{B1}$ | $R^{B1}$ | $R^{A27}$ | O |
| $L_{A1628}$ | $R^{B1}$ | $R^{B1}$ | $R^{B1}$ | $R^{B1}$ | $R^{A34}$ | O |
| $L_{A1629}$ | $R^{B2}$ | $R^{B1}$ | $R^{B1}$ | $R^{B1}$ | $R^{B1}$ | O |
| $L_{A1630}$ | $R^{B2}$ | $R^{B1}$ | $R^{B1}$ | $R^{B1}$ | $R^{B2}$ | O |
| $L_{A1631}$ | $R^{B2}$ | $R^{B1}$ | $R^{B1}$ | $R^{B1}$ | $R^{B3}$ | O |
| $L_{A1632}$ | $R^{B2}$ | $R^{B1}$ | $R^{B1}$ | $R^{B1}$ | $R^{B4}$ | O |
| $L_{A1633}$ | $R^{B2}$ | $R^{B1}$ | $R^{B1}$ | $R^{B1}$ | $R^{B5}$ | O |
| $L_{A1634}$ | $R^{B2}$ | $R^{B1}$ | $R^{B1}$ | $R^{B1}$ | $R^{B6}$ | O |
| $L_{A1635}$ | $R^{B2}$ | $R^{B1}$ | $R^{B1}$ | $R^{B1}$ | $R^{B7}$ | O |
| $L_{A1636}$ | $R^{B2}$ | $R^{B1}$ | $R^{B1}$ | $R^{B1}$ | $R^{B8}$ | O |
| $L_{A1637}$ | $R^{B2}$ | $R^{B1}$ | $R^{B1}$ | $R^{B1}$ | $R^{B9}$ | O |
| $L_{A1638}$ | $R^{B2}$ | $R^{B1}$ | $R^{B1}$ | $R^{B1}$ | $R^{A2}$ | O |
| $L_{A1639}$ | $R^{B2}$ | $R^{B1}$ | $R^{B1}$ | $R^{B1}$ | $R^{A27}$ | O |
| $L_{A1640}$ | $R^{B2}$ | $R^{B1}$ | $R^{B1}$ | $R^{B1}$ | $R^{A34}$ | O |
| $L_{A1641}$ | $R^{B2}$ | F | $R^{B1}$ | $R^{B1}$ | $R^{B1}$ | O |
| $L_{A1642}$ | $R^{B2}$ | F | $R^{B1}$ | $R^{B1}$ | $R^{B2}$ | O |
| $L_{A1643}$ | $R^{B2}$ | F | $R^{B1}$ | $R^{B1}$ | $R^{B3}$ | O |
| $L_{A1644}$ | $R^{B2}$ | F | $R^{B1}$ | $R^{B1}$ | $R^{B4}$ | O |
| $L_{A1645}$ | $R^{B2}$ | F | $R^{B1}$ | $R^{B1}$ | $R^{B5}$ | O |
| $L_{A1646}$ | $R^{B2}$ | F | $R^{B1}$ | $R^{B1}$ | $R^{B6}$ | O |
| $L_{A1647}$ | $R^{B2}$ | F | $R^{B1}$ | $R^{B1}$ | $R^{B7}$ | O |
| $L_{A1648}$ | $R^{B2}$ | F | $R^{B1}$ | $R^{B1}$ | $R^{B8}$ | O |
| $L_{A1649}$ | $R^{B2}$ | F | $R^{B1}$ | $R^{B1}$ | $R^{B9}$ | O |
| $L_{A1650}$ | $R^{B2}$ | F | $R^{B1}$ | $R^{B1}$ | $R^{A2}$ | O |
| $L_{A1651}$ | $R^{B2}$ | F | $R^{B1}$ | $R^{B1}$ | $R^{A27}$ | O |
| $L_{A1652}$ | $R^{B2}$ | F | $R^{B1}$ | $R^{B1}$ | $R^{A34}$ | O |
| $L_{A1653}$ | $R^{B3}$ | $R^{B1}$ | $R^{B1}$ | $R^{B1}$ | $R^{B1}$ | O |
| $L_{A1654}$ | $R^{B3}$ | $R^{B1}$ | $R^{B1}$ | $R^{B1}$ | $R^{B2}$ | O |
| $L_{A1655}$ | $R^{B3}$ | $R^{B1}$ | $R^{B1}$ | $R^{B1}$ | $R^{B3}$ | O |
| $L_{A1656}$ | $R^{B3}$ | $R^{B1}$ | $R^{B1}$ | $R^{B1}$ | $R^{B4}$ | O |
| $L_{A1657}$ | $R^{B3}$ | $R^{B1}$ | $R^{B1}$ | $R^{B1}$ | $R^{B5}$ | O |
| $L_{A1658}$ | $R^{B3}$ | $R^{B1}$ | $R^{B1}$ | $R^{B1}$ | $R^{B6}$ | O |
| $L_{A1659}$ | $R^{B3}$ | $R^{B1}$ | $R^{B1}$ | $R^{B1}$ | $R^{B7}$ | O |
| $L_{A1660}$ | $R^{B3}$ | $R^{B1}$ | $R^{B1}$ | $R^{B1}$ | $R^{B8}$ | O |
| $L_{A1661}$ | $R^{B3}$ | $R^{B1}$ | $R^{B1}$ | $R^{B1}$ | $R^{B9}$ | O |
| $L_{A1662}$ | $R^{B3}$ | $R^{B1}$ | $R^{B1}$ | $R^{B1}$ | $R^{A2}$ | O |
| $L_{A1663}$ | $R^{B3}$ | $R^{B1}$ | $R^{B1}$ | $R^{B1}$ | $R^{A27}$ | O |
| $L_{A1664}$ | $R^{B3}$ | $R^{B1}$ | $R^{B1}$ | $R^{B1}$ | $R^{A34}$ | O |
| $L_{A1665}$ | $R^{B1}$ | $R^{B1}$ | $R^{B1}$ | $R^{B1}$ | $R^{B1}$ | O |
| $L_{A1666}$ | $R^{B1}$ | $R^{B1}$ | $R^{B1}$ | $R^{B2}$ | $R^{B1}$ | O |
| $L_{A1667}$ | $R^{B1}$ | $R^{B1}$ | $R^{B1}$ | $R^{B3}$ | $R^{B1}$ | O |
| $L_{A1668}$ | $R^{B1}$ | $R^{B1}$ | $R^{B1}$ | $R^{B4}$ | $R^{B1}$ | O |
| $L_{A1669}$ | $R^{B1}$ | $R^{B1}$ | $R^{B1}$ | $R^{B5}$ | $R^{B1}$ | O |
| $L_{A1670}$ | $R^{B1}$ | $R^{B1}$ | $R^{B1}$ | $R^{B6}$ | $R^{B1}$ | O |
| $L_{A1671}$ | $R^{B1}$ | $R^{B1}$ | $R^{B1}$ | $R^{B7}$ | $R^{B1}$ | O |
| $L_{A1672}$ | $R^{B1}$ | $R^{B1}$ | $R^{B1}$ | $R^{B8}$ | $R^{B1}$ | O |
| $L_{A1673}$ | $R^{B1}$ | $R^{B1}$ | $R^{B1}$ | $R^{B9}$ | $R^{B1}$ | O |
| $L_{A1674}$ | $R^{B1}$ | $R^{B1}$ | $R^{B1}$ | $R^{A2}$ | $R^{B1}$ | O |
| $L_{A1675}$ | $R^{B1}$ | $R^{B1}$ | $R^{B1}$ | $R^{A27}$ | $R^{B1}$ | O |
| $L_{A1676}$ | $R^{B1}$ | $R^{B1}$ | $R^{B1}$ | $R^{A34}$ | $R^{B1}$ | O |
| $L_{A1677}$ | $R^{B2}$ | $R^{B1}$ | $R^{B1}$ | $R^{B1}$ | $R^{B1}$ | O |
| $L_{A1678}$ | $R^{B2}$ | $R^{B1}$ | $R^{B1}$ | $R^{B2}$ | $R^{B1}$ | O |
| $L_{A1679}$ | $R^{B2}$ | $R^{B1}$ | $R^{B1}$ | $R^{B3}$ | $R^{B1}$ | O |
| $L_{A1680}$ | $R^{B2}$ | $R^{B1}$ | $R^{B1}$ | $R^{B4}$ | $R^{B1}$ | O |
| $L_{A1681}$ | $R^{B2}$ | $R^{B1}$ | $R^{B1}$ | $R^{B5}$ | $R^{B1}$ | O |
| $L_{A1682}$ | $R^{B2}$ | $R^{B1}$ | $R^{B1}$ | $R^{B6}$ | $R^{B1}$ | O |
| $L_{A1683}$ | $R^{B2}$ | $R^{B1}$ | $R^{B1}$ | $R^{B7}$ | $R^{B1}$ | O |
| $L_{A1684}$ | $R^{B2}$ | $R^{B1}$ | $R^{B1}$ | $R^{B8}$ | $R^{B1}$ | O |
| $L_{A1685}$ | $R^{B2}$ | $R^{B1}$ | $R^{B1}$ | $R^{B9}$ | $R^{B1}$ | O |
| $L_{A1686}$ | $R^{B2}$ | $R^{B1}$ | $R^{B1}$ | $R^{A2}$ | $R^{B1}$ | O |
| $L_{A1687}$ | $R^{B2}$ | $R^{B1}$ | $R^{B1}$ | $R^{A27}$ | $R^{B1}$ | O |
| $L_{A1688}$ | $R^{B2}$ | $R^{B1}$ | $R^{B1}$ | $R^{A34}$ | $R^{B1}$ | O |

-continued

| | $R^1$ | $R^2$ | $R^7$ | $R^8$ | $R^9$ | X |
|---|---|---|---|---|---|---|
| $L_{A1689}$ | $R^{B2}$ | F | $R^{B1}$ | $R^{B1}$ | $R^{B1}$ | O |
| $L_{A1690}$ | $R^{B2}$ | F | $R^{B1}$ | $R^{B2}$ | $R^{B1}$ | O |
| $L_{A1691}$ | $R^{B2}$ | F | $R^{B1}$ | $R^{B3}$ | $R^{B1}$ | O |
| $L_{A1692}$ | $R^{B2}$ | F | $R^{B1}$ | $R^{B4}$ | $R^{B1}$ | O |
| $L_{A1693}$ | $R^{B2}$ | F | $R^{B1}$ | $R^{B5}$ | $R^{B1}$ | O |
| $L_{A1694}$ | $R^{B2}$ | F | $R^{B1}$ | $R^{B6}$ | $R^{B1}$ | O |
| $L_{A1695}$ | $R^{B2}$ | F | $R^{B1}$ | $R^{B7}$ | $R^{B1}$ | O |
| $L_{A1696}$ | $R^{B2}$ | F | $R^{B1}$ | $R^{B8}$ | $R^{B1}$ | O |
| $L_{A1697}$ | $R^{B2}$ | F | $R^{B1}$ | $R^{B9}$ | $R^{B1}$ | O |
| $L_{A1698}$ | $R^{B2}$ | F | $R^{B1}$ | $R^{A2}$ | $R^{B1}$ | O |
| $L_{A1699}$ | $R^{B2}$ | F | $R^{B1}$ | $R^{A27}$ | $R^{B1}$ | O |
| $L_{A1700}$ | $R^{B2}$ | F | $R^{B1}$ | $R^{A34}$ | $R^{B1}$ | O |
| $L_{A1701}$ | $R^{B3}$ | $R^{B1}$ | $R^{B1}$ | $R^{B1}$ | $R^{B1}$ | O |
| $L_{A1702}$ | $R^{B3}$ | $R^{B1}$ | $R^{B1}$ | $R^{B2}$ | $R^{B1}$ | O |
| $L_{A1703}$ | $R^{B3}$ | $R^{B1}$ | $R^{B1}$ | $R^{B3}$ | $R^{B1}$ | O |
| $L_{A1704}$ | $R^{B3}$ | $R^{B1}$ | $R^{B1}$ | $R^{B4}$ | $R^{B1}$ | O |
| $L_{A1705}$ | $R^{B3}$ | $R^{B1}$ | $R^{B1}$ | $R^{B5}$ | $R^{B1}$ | O |
| $L_{A1706}$ | $R^{B3}$ | $R^{B1}$ | $R^{B1}$ | $R^{B6}$ | $R^{B1}$ | O |
| $L_{A1707}$ | $R^{B3}$ | $R^{B1}$ | $R^{B1}$ | $R^{B7}$ | $R^{B1}$ | O |
| $L_{A1708}$ | $R^{B3}$ | $R^{B1}$ | $R^{B1}$ | $R^{B8}$ | $R^{B1}$ | O |
| $L_{A1709}$ | $R^{B3}$ | $R^{B1}$ | $R^{B1}$ | $R^{B9}$ | $R^{B1}$ | O |
| $L_{A1710}$ | $R^{B3}$ | $R^{B1}$ | $R^{B1}$ | $R^{A2}$ | $R^{B1}$ | O |
| $L_{A1711}$ | $R^{B3}$ | $R^{B1}$ | $R^{B1}$ | $R^{A27}$ | $R^{B1}$ | O |
| $L_{A1712}$ | $R^{B3}$ | $R^{B1}$ | $R^{B1}$ | $R^{A34}$ | $R^{B1}$ | O |
| $L_{A1713}$ | $R^{B1}$ | $R^{B1}$ | $R^{B1}$ | $R^{B1}$ | $R^{B1}$ | O |
| $L_{A1714}$ | $R^{B1}$ | $R^{B1}$ | $R^{B2}$ | $R^{B1}$ | $R^{B1}$ | O |
| $L_{A1715}$ | $R^{B1}$ | $R^{B1}$ | $R^{B3}$ | $R^{B1}$ | $R^{B1}$ | O |
| $L_{A1716}$ | $R^{B1}$ | $R^{B1}$ | $R^{B4}$ | $R^{B1}$ | $R^{B1}$ | O |
| $L_{A1717}$ | $R^{B1}$ | $R^{B1}$ | $R^{B5}$ | $R^{B1}$ | $R^{B1}$ | O |
| $L_{A1718}$ | $R^{B1}$ | $R^{B1}$ | $R^{B6}$ | $R^{B1}$ | $R^{B1}$ | O |
| $L_{A1719}$ | $R^{B1}$ | $R^{B1}$ | $R^{B7}$ | $R^{B1}$ | $R^{B1}$ | O |
| $L_{A1720}$ | $R^{B1}$ | $R^{B1}$ | $R^{B8}$ | $R^{B1}$ | $R^{B1}$ | O |
| $L_{A1721}$ | $R^{B1}$ | $R^{B1}$ | $R^{B9}$ | $R^{B1}$ | $R^{B1}$ | O |
| $L_{A1722}$ | $R^{B1}$ | $R^{B1}$ | $R^{A2}$ | $R^{B1}$ | $R^{B1}$ | O |
| $L_{A1723}$ | $R^{B1}$ | $R^{B1}$ | $R^{A27}$ | $R^{B1}$ | $R^{B1}$ | O |
| $L_{A1724}$ | $R^{B1}$ | $R^{B1}$ | $R^{A34}$ | $R^{B1}$ | $R^{B1}$ | O |
| $L_{A1725}$ | $R^{B2}$ | $R^{B1}$ | $R^{B1}$ | $R^{B1}$ | $R^{B1}$ | O |
| $L_{A1726}$ | $R^{B2}$ | $R^{B1}$ | $R^{B2}$ | $R^{B1}$ | $R^{B1}$ | O |
| $L_{A1727}$ | $R^{B2}$ | $R^{B1}$ | $R^{B3}$ | $R^{B1}$ | $R^{B1}$ | O |
| $L_{A1728}$ | $R^{B2}$ | $R^{B1}$ | $R^{B4}$ | $R^{B1}$ | $R^{B1}$ | O |
| $L_{A1729}$ | $R^{B2}$ | $R^{B1}$ | $R^{B5}$ | $R^{B1}$ | $R^{B1}$ | O |
| $L_{A1730}$ | $R^{B2}$ | $R^{B1}$ | $R^{B6}$ | $R^{B1}$ | $R^{B1}$ | O |
| $L_{A1731}$ | $R^{B2}$ | $R^{B1}$ | $R^{B7}$ | $R^{B1}$ | $R^{B1}$ | O |
| $L_{A1732}$ | $R^{B2}$ | $R^{B1}$ | $R^{B8}$ | $R^{B1}$ | $R^{B1}$ | O |
| $L_{A1733}$ | $R^{B2}$ | $R^{B1}$ | $R^{B9}$ | $R^{B1}$ | $R^{B1}$ | O |
| $L_{A1734}$ | $R^{B2}$ | $R^{B1}$ | $R^{A2}$ | $R^{B1}$ | $R^{B1}$ | O |
| $L_{A1735}$ | $R^{B2}$ | $R^{B1}$ | $R^{A27}$ | $R^{B1}$ | $R^{B1}$ | O |
| $L_{A1736}$ | $R^{B2}$ | $R^{B1}$ | $R^{A34}$ | $R^{B1}$ | $R^{B1}$ | O |
| $L_{A1737}$ | $R^{B2}$ | F | $R^{B1}$ | $R^{B1}$ | $R^{B1}$ | O |
| $L_{A1738}$ | $R^{B2}$ | F | $R^{B2}$ | $R^{B1}$ | $R^{B1}$ | O |
| $L_{A1739}$ | $R^{B2}$ | F | $R^{B3}$ | $R^{B1}$ | $R^{B1}$ | O |
| $L_{A1740}$ | $R^{B2}$ | F | $R^{B4}$ | $R^{B1}$ | $R^{B1}$ | O |
| $L_{A1741}$ | $R^{B2}$ | F | $R^{B5}$ | $R^{B1}$ | $R^{B1}$ | O |
| $L_{A1742}$ | $R^{B2}$ | F | $R^{B6}$ | $R^{B1}$ | $R^{B1}$ | O |
| $L_{A1743}$ | $R^{B2}$ | F | $R^{B7}$ | $R^{B1}$ | $R^{B1}$ | O |
| $L_{A1744}$ | $R^{B2}$ | F | $R^{B8}$ | $R^{B1}$ | $R^{B1}$ | O |
| $L_{A1745}$ | $R^{B2}$ | F | $R^{B9}$ | $R^{B1}$ | $R^{B1}$ | O |
| $L_{A1746}$ | $R^{B2}$ | F | $R^{A2}$ | $R^{B1}$ | $R^{B1}$ | O |
| $L_{A1747}$ | $R^{B2}$ | F | $R^{A27}$ | $R^{B1}$ | $R^{B1}$ | O |
| $L_{A1748}$ | $R^{B2}$ | F | $R^{A34}$ | $R^{B1}$ | $R^{B1}$ | O |
| $L_{A1749}$ | $R^{B3}$ | $R^{B1}$ | $R^{B1}$ | $R^{B1}$ | $R^{B1}$ | O |
| $L_{A1750}$ | $R^{B3}$ | $R^{B1}$ | $R^{B2}$ | $R^{B1}$ | $R^{B1}$ | O |
| $L_{A1751}$ | $R^{B3}$ | $R^{B1}$ | $R^{B3}$ | $R^{B1}$ | $R^{B1}$ | O |
| $L_{A1752}$ | $R^{B3}$ | $R^{B1}$ | $R^{B4}$ | $R^{B1}$ | $R^{B1}$ | O |
| $L_{A1753}$ | $R^{B3}$ | $R^{B1}$ | $R^{B5}$ | $R^{B1}$ | $R^{B1}$ | O |
| $L_{A1754}$ | $R^{B3}$ | $R^{B1}$ | $R^{B6}$ | $R^{B1}$ | $R^{B1}$ | O |
| $L_{A1755}$ | $R^{B3}$ | $R^{B1}$ | $R^{B7}$ | $R^{B1}$ | $R^{B1}$ | O |
| $L_{A1756}$ | $R^{B3}$ | $R^{B1}$ | $R^{B8}$ | $R^{B1}$ | $R^{B1}$ | O |
| $L_{A1757}$ | $R^{B3}$ | $R^{B1}$ | $R^{B9}$ | $R^{B1}$ | $R^{B1}$ | O |
| $L_{A1758}$ | $R^{B3}$ | $R^{B1}$ | $R^{A2}$ | $R^{B1}$ | $R^{B1}$ | O |
| $L_{A1759}$ | $R^{B3}$ | $R^{B1}$ | $R^{A27}$ | $R^{B1}$ | $R^{B1}$ | O |
| $L_{A1760}$ | $R^{B3}$ | $R^{B1}$ | $R^{A34}$ | $R^{B1}$ | $R^{B1}$ | O |
| $L_{A1761}$ | $R^{B1}$ | $R^{B1}$ | $R^{B1}$ | $R^{B1}$ | $R^{B1}$ | O |
| $L_{A1762}$ | $R^{B1}$ | $R^{B1}$ | $R^{B2}$ | $R^{B1}$ | $R^{B2}$ | O |
| $L_{A1763}$ | $R^{B1}$ | $R^{B1}$ | $R^{B3}$ | $R^{B1}$ | $R^{B3}$ | O |
| $L_{A1764}$ | $R^{B1}$ | $R^{B1}$ | $R^{B4}$ | $R^{B1}$ | $R^{B4}$ | O |
| $L_{A1765}$ | $R^{B1}$ | $R^{B1}$ | $R^{B5}$ | $R^{B1}$ | $R^{B5}$ | O |

-continued

| | $R^1$ | $R^2$ | $R^7$ | $R^8$ | $R^9$ | X |
|---|---|---|---|---|---|---|
| $L_{A1766}$ | $R^{B1}$ | $R^{B1}$ | $R^{B6}$ | $R^{B1}$ | $R^{B6}$ | O |
| $L_{A1767}$ | $R^{B1}$ | $R^{B1}$ | $R^{B7}$ | $R^{B1}$ | $R^{B7}$ | O |
| $L_{A1768}$ | $R^{B1}$ | $R^{B1}$ | $R^{B8}$ | $R^{B1}$ | $R^{B8}$ | O |
| $L_{A1769}$ | $R^{B1}$ | $R^{B1}$ | $R^{B9}$ | $R^{B1}$ | $R^{B9}$ | O |
| $L_{A1770}$ | $R^{B1}$ | $R^{B1}$ | $R^{A2}$ | $R^{B1}$ | $R^{A2}$ | O |
| $L_{A1771}$ | $R^{B1}$ | $R^{B1}$ | $R^{A27}$ | $R^{B1}$ | $R^{A27}$ | O |
| $L_{A1772}$ | $R^{B1}$ | $R^{B1}$ | $R^{A34}$ | $R^{B1}$ | $R^{A34}$ | O |
| $L_{A1773}$ | $R^{B2}$ | $R^{B1}$ | $R^{B1}$ | $R^{B1}$ | $R^{B1}$ | O |
| $L_{A1774}$ | $R^{B2}$ | $R^{B1}$ | $R^{B2}$ | $R^{B1}$ | $R^{B2}$ | O |
| $L_{A1775}$ | $R^{B2}$ | $R^{B1}$ | $R^{B3}$ | $R^{B1}$ | $R^{B3}$ | O |
| $L_{A1776}$ | $R^{B2}$ | $R^{B1}$ | $R^{B4}$ | $R^{B1}$ | $R^{B4}$ | O |
| $L_{A1777}$ | $R^{B2}$ | $R^{B1}$ | $R^{B5}$ | $R^{B1}$ | $R^{B5}$ | O |
| $L_{A1778}$ | $R^{B2}$ | $R^{B1}$ | $R^{B6}$ | $R^{B1}$ | $R^{B6}$ | O |
| $L_{A1779}$ | $R^{B2}$ | $R^{B1}$ | $R^{B7}$ | $R^{B1}$ | $R^{B7}$ | O |
| $L_{A1780}$ | $R^{B2}$ | $R^{B1}$ | $R^{B8}$ | $R^{B1}$ | $R^{B8}$ | O |
| $L_{A1781}$ | $R^{B2}$ | $R^{B1}$ | $R^{B9}$ | $R^{B1}$ | $R^{B9}$ | O |
| $L_{A1782}$ | $R^{B2}$ | $R^{B1}$ | $R^{A2}$ | $R^{B1}$ | $R^{A2}$ | O |
| $L_{A1783}$ | $R^{B2}$ | $R^{B1}$ | $R^{A27}$ | $R^{B1}$ | $R^{A27}$ | O |
| $L_{A1784}$ | $R^{B2}$ | $R^{B1}$ | $R^{A34}$ | $R^{B1}$ | $R^{A34}$ | O |
| $L_{A1785}$ | $R^{B2}$ | F | $R^{B1}$ | $R^{B1}$ | $R^{B1}$ | O |
| $L_{A1786}$ | $R^{B2}$ | F | $R^{B2}$ | $R^{B1}$ | $R^{B2}$ | O |
| $L_{A1787}$ | $R^{B2}$ | F | $R^{B3}$ | $R^{B1}$ | $R^{B3}$ | O |
| $L_{A1788}$ | $R^{B2}$ | F | $R^{B4}$ | $R^{B1}$ | $R^{B4}$ | O |
| $L_{A1789}$ | $R^{B2}$ | F | $R^{B5}$ | $R^{B1}$ | $R^{B5}$ | O |
| $L_{A1790}$ | $R^{B2}$ | F | $R^{B6}$ | $R^{B1}$ | $R^{B6}$ | O |
| $L_{A1791}$ | $R^{B2}$ | F | $R^{B7}$ | $R^{B1}$ | $R^{B7}$ | O |
| $L_{A1792}$ | $R^{B2}$ | F | $R^{B8}$ | $R^{B1}$ | $R^{B8}$ | O |
| $L_{A1793}$ | $R^{B2}$ | F | $R^{B9}$ | $R^{B1}$ | $R^{B9}$ | O |
| $L_{A1794}$ | $R^{B2}$ | F | $R^{A2}$ | $R^{B1}$ | $R^{A2}$ | O |
| $L_{A1795}$ | $R^{B2}$ | F | $R^{A27}$ | $R^{B1}$ | $R^{A27}$ | O |
| $L_{A1796}$ | $R^{B2}$ | F | $R^{A34}$ | $R^{B1}$ | $R^{A34}$ | O |
| $L_{A1797}$ | $R^{B3}$ | $R^{B1}$ | $R^{B1}$ | $R^{B1}$ | $R^{B1}$ | O |
| $L_{A1798}$ | $R^{B3}$ | $R^{B1}$ | $R^{B2}$ | $R^{B1}$ | $R^{B2}$ | O |
| $L_{A1799}$ | $R^{B3}$ | $R^{B1}$ | $R^{B3}$ | $R^{B1}$ | $R^{B3}$ | O |
| $L_{A1800}$ | $R^{B3}$ | $R^{B1}$ | $R^{B4}$ | $R^{B1}$ | $R^{B4}$ | O |
| $L_{A1801}$ | $R^{B3}$ | $R^{B1}$ | $R^{B5}$ | $R^{B1}$ | $R^{B5}$ | O |
| $L_{A1802}$ | $R^{B3}$ | $R^{B1}$ | $R^{B6}$ | $R^{B1}$ | $R^{B6}$ | O |
| $L_{A1803}$ | $R^{B3}$ | $R^{B1}$ | $R^{B7}$ | $R^{B1}$ | $R^{B7}$ | O |
| $L_{A1804}$ | $R^{B3}$ | $R^{B1}$ | $R^{B8}$ | $R^{B1}$ | $R^{B8}$ | O |
| $L_{A1805}$ | $R^{B3}$ | $R^{B1}$ | $R^{B9}$ | $R^{B1}$ | $R^{B9}$ | O |
| $L_{A1806}$ | $R^{B3}$ | $R^{B1}$ | $R^{A2}$ | $R^{B1}$ | $R^{A2}$ | O |
| $L_{A1807}$ | $R^{B3}$ | $R^{B1}$ | $R^{A27}$ | $R^{B1}$ | $R^{A27}$ | O |
| $L_{A1808}$ | $R^{B3}$ | $R^{B1}$ | $R^{A34}$ | $R^{B1}$ | $R^{A34}$ | O |
| $L_{A1809}$ | $R^{B1}$ | $R^{B1}$ | $R^{B1}$ | $R^{B1}$ | $R^{B1}$ | O |
| $L_{A1810}$ | $R^{B1}$ | $R^{B1}$ | $R^{B1}$ | $R^{B2}$ | $R^{B2}$ | O |
| $L_{A1811}$ | $R^{B1}$ | $R^{B1}$ | $R^{B1}$ | $R^{B3}$ | $R^{B3}$ | O |
| $L_{A1812}$ | $R^{B1}$ | $R^{B1}$ | $R^{B1}$ | $R^{B4}$ | $R^{B4}$ | O |
| $L_{A1813}$ | $R^{B1}$ | $R^{B1}$ | $R^{B1}$ | $R^{B5}$ | $R^{B5}$ | O |
| $L_{A1814}$ | $R^{B1}$ | $R^{B1}$ | $R^{B1}$ | $R^{B6}$ | $R^{B6}$ | O |
| $L_{A1815}$ | $R^{B1}$ | $R^{B1}$ | $R^{B1}$ | $R^{B7}$ | $R^{B7}$ | O |
| $L_{A1816}$ | $R^{B1}$ | $R^{B1}$ | $R^{B1}$ | $R^{B8}$ | $R^{B8}$ | O |
| $L_{A1817}$ | $R^{B1}$ | $R^{B1}$ | $R^{B1}$ | $R^{B9}$ | $R^{B9}$ | O |
| $L_{A1818}$ | $R^{B1}$ | $R^{B1}$ | $R^{B1}$ | $R^{A2}$ | $R^{A2}$ | O |
| $L_{A1819}$ | $R^{B1}$ | $R^{B1}$ | $R^{B1}$ | $R^{A27}$ | $R^{A27}$ | O |
| $L_{A1820}$ | $R^{B1}$ | $R^{B1}$ | $R^{B1}$ | $R^{A34}$ | $R^{A34}$ | O |
| $L_{A1821}$ | $R^{B2}$ | $R^{B1}$ | $R^{B1}$ | $R^{B1}$ | $R^{B1}$ | O |
| $L_{A1822}$ | $R^{B2}$ | $R^{B1}$ | $R^{B1}$ | $R^{B2}$ | $R^{B2}$ | O |
| $L_{A1823}$ | $R^{B2}$ | $R^{B1}$ | $R^{B1}$ | $R^{B3}$ | $R^{B3}$ | O |
| $L_{A1824}$ | $R^{B2}$ | $R^{B1}$ | $R^{B1}$ | $R^{B4}$ | $R^{B4}$ | O |
| $L_{A1825}$ | $R^{B2}$ | $R^{B1}$ | $R^{B1}$ | $R^{B5}$ | $R^{B5}$ | O |
| $L_{A1826}$ | $R^{B2}$ | $R^{B1}$ | $R^{B1}$ | $R^{B6}$ | $R^{B6}$ | O |
| $L_{A1827}$ | $R^{B2}$ | $R^{B1}$ | $R^{B1}$ | $R^{B7}$ | $R^{B7}$ | O |
| $L_{A1828}$ | $R^{B2}$ | $R^{B1}$ | $R^{B1}$ | $R^{B8}$ | $R^{B8}$ | O |
| $L_{A1829}$ | $R^{B2}$ | $R^{B1}$ | $R^{B1}$ | $R^{B9}$ | $R^{B9}$ | O |
| $L_{A1830}$ | $R^{B2}$ | $R^{B1}$ | $R^{B1}$ | $R^{A2}$ | $R^{A2}$ | O |
| $L_{A1831}$ | $R^{B2}$ | $R^{B1}$ | $R^{B1}$ | $R^{A27}$ | $R^{A27}$ | O |
| $L_{A1832}$ | $R^{B2}$ | $R^{B1}$ | $R^{B1}$ | $R^{A34}$ | $R^{A34}$ | O |
| $L_{A1833}$ | $R^{B2}$ | F | $R^{B1}$ | $R^{B1}$ | $R^{B1}$ | O |
| $L_{A1834}$ | $R^{B2}$ | F | $R^{B1}$ | $R^{B2}$ | $R^{B2}$ | O |
| $L_{A1835}$ | $R^{B2}$ | F | $R^{B1}$ | $R^{B3}$ | $R^{B3}$ | O |
| $L_{A1836}$ | $R^{B2}$ | F | $R^{B1}$ | $R^{B4}$ | $R^{B4}$ | O |
| $L_{A1837}$ | $R^{B2}$ | F | $R^{B1}$ | $R^{B5}$ | $R^{B5}$ | O |
| $L_{A1838}$ | $R^{B2}$ | F | $R^{B1}$ | $R^{B6}$ | $R^{B6}$ | O |
| $L_{A1839}$ | $R^{B2}$ | F | $R^{B1}$ | $R^{B7}$ | $R^{B7}$ | O |
| $L_{A1840}$ | $R^{B2}$ | F | $R^{B1}$ | $R^{B8}$ | $R^{B8}$ | O |
| $L_{A1841}$ | $R^{B2}$ | F | $R^{B1}$ | $R^{B9}$ | $R^{B9}$ | O |
| $L_{A1842}$ | $R^{B2}$ | F | $R^{B1}$ | $R^{A2}$ | $R^{A2}$ | O |

-continued

| | $R^1$ | $R^2$ | $R^7$ | $R^8$ | $R^9$ | X |
|---|---|---|---|---|---|---|
| $L_{A1843}$ | $R^{B2}$ | F | $R^{B1}$ | $R^{A27}$ | $R^{A27}$ | O |
| $L_{A1844}$ | $R^{B2}$ | F | $R^{B1}$ | $R^{A34}$ | $R^{A34}$ | O |
| $L_{A1845}$ | $R^{B3}$ | $R^{B1}$ | $R^{B1}$ | $R^{B1}$ | $R^{B1}$ | O |
| $L_{A1846}$ | $R^{B3}$ | $R^{B1}$ | $R^{B1}$ | $R^{B2}$ | $R^{B2}$ | O |
| $L_{A1847}$ | $R^{B3}$ | $R^{B1}$ | $R^{B1}$ | $R^{B3}$ | $R^{B3}$ | O |
| $L_{A1848}$ | $R^{B3}$ | $R^{B1}$ | $R^{B1}$ | $R^{B4}$ | $R^{B4}$ | O |
| $L_{A1849}$ | $R^{B3}$ | $R^{B1}$ | $R^{B1}$ | $R^{B5}$ | $R^{B5}$ | O |
| $L_{A1850}$ | $R^{B3}$ | $R^{B1}$ | $R^{B1}$ | $R^{B6}$ | $R^{B6}$ | O |
| $L_{A1851}$ | $R^{B3}$ | $R^{B1}$ | $R^{B1}$ | $R^{B7}$ | $R^{B7}$ | O |
| $L_{A1852}$ | $R^{B3}$ | $R^{B1}$ | $R^{B1}$ | $R^{B8}$ | $R^{B8}$ | O |
| $L_{A1853}$ | $R^{B3}$ | $R^{B1}$ | $R^{B1}$ | $R^{B9}$ | $R^{B9}$ | O |
| $L_{A1854}$ | $R^{B3}$ | $R^{B1}$ | $R^{B1}$ | $R^{A2}$ | $R^{A2}$ | O |
| $L_{A1855}$ | $R^{B3}$ | $R^{B1}$ | $R^{B1}$ | $R^{A27}$ | $R^{A27}$ | O |
| $L_{A1856}$ | $R^{B3}$ | $R^{B1}$ | $R^{B1}$ | $R^{A34}$ | $R^{A34}$ | O |
| $L_{A1857}$ | $R^{B1}$ | $R^{B1}$ | $R^{B1}$ | $R^{B1}$ | $R^{B1}$ | O |
| $L_{A1858}$ | $R^{B1}$ | $R^{B1}$ | $R^{B2}$ | $R^{B2}$ | $R^{B1}$ | O |
| $L_{A1859}$ | $R^{B1}$ | $R^{B1}$ | $R^{B3}$ | $R^{B3}$ | $R^{B1}$ | O |
| $L_{A1860}$ | $R^{B1}$ | $R^{B1}$ | $R^{B4}$ | $R^{B4}$ | $R^{B1}$ | O |
| $L_{A1861}$ | $R^{B1}$ | $R^{B1}$ | $R^{B5}$ | $R^{B5}$ | $R^{B1}$ | O |
| $L_{A1862}$ | $R^{B1}$ | $R^{B1}$ | $R^{B6}$ | $R^{B6}$ | $R^{B1}$ | O |
| $L_{A1863}$ | $R^{B1}$ | $R^{B1}$ | $R^{B7}$ | $R^{B7}$ | $R^{B1}$ | O |
| $L_{A1864}$ | $R^{B1}$ | $R^{B1}$ | $R^{B8}$ | $R^{B8}$ | $R^{B1}$ | O |
| $L_{A1865}$ | $R^{B1}$ | $R^{B1}$ | $R^{B9}$ | $R^{B9}$ | $R^{B1}$ | O |
| $L_{A1866}$ | $R^{B1}$ | $R^{B1}$ | $R^{A2}$ | $R^{A2}$ | $R^{B1}$ | O |
| $L_{A1867}$ | $R^{B1}$ | $R^{B1}$ | $R^{A27}$ | $R^{A27}$ | $R^{B1}$ | O |
| $L_{A1868}$ | $R^{B1}$ | $R^{B1}$ | $R^{A34}$ | $R^{A34}$ | $R^{B1}$ | O |
| $L_{A1869}$ | $R^{B2}$ | $R^{B1}$ | $R^{B1}$ | $R^{B1}$ | $R^{B1}$ | O |
| $L_{A1870}$ | $R^{B2}$ | $R^{B1}$ | $R^{B2}$ | $R^{B2}$ | $R^{B1}$ | O |
| $L_{A1871}$ | $R^{B2}$ | $R^{B1}$ | $R^{B3}$ | $R^{B3}$ | $R^{B1}$ | O |
| $L_{A1872}$ | $R^{B2}$ | $R^{B1}$ | $R^{B4}$ | $R^{B4}$ | $R^{B1}$ | O |
| $L_{A1873}$ | $R^{B2}$ | $R^{B1}$ | $R^{B5}$ | $R^{B5}$ | $R^{B1}$ | O |
| $L_{A1874}$ | $R^{B2}$ | $R^{B1}$ | $R^{B6}$ | $R^{B6}$ | $R^{B1}$ | O |
| $L_{A1875}$ | $R^{B2}$ | $R^{B1}$ | $R^{B7}$ | $R^{B7}$ | $R^{B1}$ | O |
| $L_{A1876}$ | $R^{B2}$ | $R^{B1}$ | $R^{B8}$ | $R^{B8}$ | $R^{B1}$ | O |
| $L_{A1877}$ | $R^{B2}$ | $R^{B1}$ | $R^{B9}$ | $R^{B9}$ | $R^{B1}$ | O |
| $L_{A1878}$ | $R^{B2}$ | $R^{B1}$ | $R^{A2}$ | $R^{A2}$ | $R^{B1}$ | O |
| $L_{A1879}$ | $R^{B2}$ | $R^{B1}$ | $R^{A27}$ | $R^{A27}$ | $R^{B1}$ | O |
| $L_{A1880}$ | $R^{B2}$ | $R^{B1}$ | $R^{A34}$ | $R^{A34}$ | $R^{B1}$ | O |
| $L_{A1881}$ | $R^{B2}$ | F | $R^{B1}$ | $R^{B1}$ | $R^{B1}$ | O |
| $L_{A1882}$ | $R^{B2}$ | F | $R^{B2}$ | $R^{B2}$ | $R^{B1}$ | O |
| $L_{A1883}$ | $R^{B2}$ | F | $R^{B3}$ | $R^{B3}$ | $R^{B1}$ | O |
| $L_{A1884}$ | $R^{B2}$ | F | $R^{B4}$ | $R^{B4}$ | $R^{B1}$ | O |
| $L_{A1885}$ | $R^{B2}$ | F | $R^{B5}$ | $R^{B5}$ | $R^{B1}$ | O |
| $L_{A1886}$ | $R^{B2}$ | F | $R^{B6}$ | $R^{B6}$ | $R^{B1}$ | O |
| $L_{A1887}$ | $R^{B2}$ | F | $R^{B7}$ | $R^{B7}$ | $R^{B1}$ | O |
| $L_{A1888}$ | $R^{B2}$ | F | $R^{B8}$ | $R^{B8}$ | $R^{B1}$ | O |
| $L_{A1889}$ | $R^{B2}$ | F | $R^{B9}$ | $R^{B9}$ | $R^{B1}$ | O |
| $L_{A1890}$ | $R^{B2}$ | F | $R^{A2}$ | $R^{A2}$ | $R^{B1}$ | O |
| $L_{A1891}$ | $R^{B2}$ | F | $R^{A27}$ | $R^{A27}$ | $R^{B1}$ | O |
| $L_{A1892}$ | $R^{B2}$ | F | $R^{A34}$ | $R^{A34}$ | $R^{B1}$ | O |
| $L_{A1893}$ | $R^{B3}$ | $R^{B1}$ | $R^{B1}$ | $R^{B1}$ | $R^{B1}$ | O |
| $L_{A1894}$ | $R^{B3}$ | $R^{B1}$ | $R^{B2}$ | $R^{B2}$ | $R^{B1}$ | O |
| $L_{A1895}$ | $R^{B3}$ | $R^{B1}$ | $R^{B3}$ | $R^{B3}$ | $R^{B1}$ | O |
| $L_{A1896}$ | $R^{B3}$ | $R^{B1}$ | $R^{B4}$ | $R^{B4}$ | $R^{B1}$ | O |
| $L_{A1897}$ | $R^{B3}$ | $R^{B1}$ | $R^{B5}$ | $R^{B5}$ | $R^{B1}$ | O |
| $L_{A1898}$ | $R^{B3}$ | $R^{B1}$ | $R^{B6}$ | $R^{B6}$ | $R^{B1}$ | O |
| $L_{A1899}$ | $R^{B3}$ | $R^{B1}$ | $R^{B7}$ | $R^{B7}$ | $R^{B1}$ | O |
| $L_{A1900}$ | $R^{B3}$ | $R^{B1}$ | $R^{B8}$ | $R^{B8}$ | $R^{B1}$ | O |
| $L_{A1901}$ | $R^{B3}$ | $R^{B1}$ | $R^{B9}$ | $R^{B9}$ | $R^{B1}$ | O |
| $L_{A1902}$ | $R^{B3}$ | $R^{B1}$ | $R^{A2}$ | $R^{A2}$ | $R^{B1}$ | O |
| $L_{A1903}$ | $R^{B3}$ | $R^{B1}$ | $R^{A27}$ | $R^{A27}$ | $R^{B1}$ | O |
| $L_{A1904}$ | $R^{B3}$ | $R^{B1}$ | $R^{A34}$ | $R^{A34}$ | $R^{B1}$ | O |

for $L_{A1905}$ through $L_{A2096}$, $L_A$ has a structure of

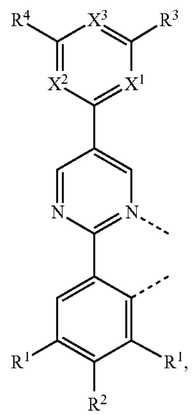

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A1905}$ | $R^{B1}$ | $R^{B1}$ | $R^{B1}$ | $R^{B1}$ | N | C | C |
| $L_{A1906}$ | $R^{B1}$ | $R^{B1}$ | $R^{B2}$ | $R^{B1}$ | N | C | C |
| $L_{A1907}$ | $R^{B1}$ | $R^{B1}$ | $R^{B3}$ | $R^{B1}$ | N | C | C |
| $L_{A1908}$ | $R^{B1}$ | $R^{B1}$ | $R^{B4}$ | $R^{B1}$ | N | C | C |
| $L_{A1909}$ | $R^{B1}$ | $R^{B1}$ | $R^{B5}$ | $R^{B1}$ | N | C | C |
| $L_{A1910}$ | $R^{B1}$ | $R^{B1}$ | $R^{B6}$ | $R^{B1}$ | N | C | C |
| $L_{A1911}$ | $R^{B1}$ | $R^{B1}$ | $R^{B7}$ | $R^{B1}$ | N | C | C |
| $L_{A1912}$ | $R^{B1}$ | $R^{B1}$ | $R^{B8}$ | $R^{B1}$ | N | C | C |
| $L_{A1913}$ | $R^{B1}$ | $R^{B1}$ | $R^{B9}$ | $R^{B1}$ | N | C | C |
| $L_{A1914}$ | $R^{B1}$ | $R^{B1}$ | $R^{A2}$ | $R^{B1}$ | N | C | C |
| $L_{A1915}$ | $R^{B1}$ | $R^{B1}$ | $R^{A27}$ | $R^{B1}$ | N | C | C |
| $L_{A1916}$ | $R^{B1}$ | $R^{B1}$ | $R^{A34}$ | $R^{B1}$ | N | C | C |
| $L_{A1917}$ | $R^{B2}$ | $R^{B1}$ | $R^{B1}$ | $R^{B1}$ | N | C | C |
| $L_{A1918}$ | $R^{B2}$ | $R^{B1}$ | $R^{B2}$ | $R^{B1}$ | N | C | C |
| $L_{A1919}$ | $R^{B2}$ | $R^{B1}$ | $R^{B3}$ | $R^{B1}$ | N | C | C |
| $L_{A1920}$ | $R^{B2}$ | $R^{B1}$ | $R^{B4}$ | $R^{B1}$ | N | C | C |
| $L_{A1921}$ | $R^{B2}$ | $R^{B1}$ | $R^{B5}$ | $R^{B1}$ | N | C | C |
| $L_{A1922}$ | $R^{B2}$ | $R^{B1}$ | $R^{B6}$ | $R^{B1}$ | N | C | C |
| $L_{A1923}$ | $R^{B2}$ | $R^{B1}$ | $R^{B7}$ | $R^{B1}$ | N | C | C |
| $L_{A1924}$ | $R^{B2}$ | $R^{B1}$ | $R^{B8}$ | $R^{B1}$ | N | C | C |
| $L_{A1925}$ | $R^{B2}$ | $R^{B1}$ | $R^{B9}$ | $R^{B1}$ | N | C | C |
| $L_{A1926}$ | $R^{B2}$ | $R^{B1}$ | $R^{A2}$ | $R^{B1}$ | N | C | C |
| $L_{A1927}$ | $R^{B2}$ | $R^{B1}$ | $R^{A27}$ | $R^{B1}$ | N | C | C |
| $L_{A1928}$ | $R^{B2}$ | $R^{B1}$ | $R^{A34}$ | $R^{B1}$ | N | C | C |
| $L_{A1929}$ | $R^{B2}$ | F | $R^{B1}$ | $R^{B1}$ | N | C | C |
| $L_{A1930}$ | $R^{B2}$ | F | $R^{B2}$ | $R^{B1}$ | N | C | C |
| $L_{A1931}$ | $R^{B2}$ | F | $R^{B3}$ | $R^{B1}$ | N | C | C |
| $L_{A1932}$ | $R^{B2}$ | F | $R^{B4}$ | $R^{B1}$ | N | C | C |
| $L_{A1933}$ | $R^{B2}$ | F | $R^{B5}$ | $R^{B1}$ | N | C | C |
| $L_{A1934}$ | $R^{B2}$ | F | $R^{B6}$ | $R^{B1}$ | N | C | C |
| $L_{A1935}$ | $R^{B2}$ | F | $R^{B7}$ | $R^{B1}$ | N | C | C |
| $L_{A1936}$ | $R^{B2}$ | F | $R^{B8}$ | $R^{B1}$ | N | C | C |
| $L_{A1937}$ | $R^{B2}$ | F | $R^{B9}$ | $R^{B1}$ | N | C | C |
| $L_{A1938}$ | $R^{B2}$ | F | $R^{A2}$ | $R^{B1}$ | N | C | C |
| $L_{A1939}$ | $R^{B2}$ | F | $R^{A27}$ | $R^{B1}$ | N | C | C |
| $L_{A1940}$ | $R^{B2}$ | F | $R^{A34}$ | $R^{B1}$ | N | C | C |
| $L_{A1941}$ | $R^{B3}$ | $R^{B1}$ | $R^{B1}$ | $R^{B1}$ | N | C | C |
| $L_{A1942}$ | $R^{B3}$ | $R^{B1}$ | $R^{B2}$ | $R^{B1}$ | N | C | C |
| $L_{A1943}$ | $R^{B3}$ | $R^{B1}$ | $R^{B3}$ | $R^{B1}$ | N | C | C |
| $L_{A1944}$ | $R^{B3}$ | $R^{B1}$ | $R^{B4}$ | $R^{B1}$ | N | C | C |
| $L_{A1945}$ | $R^{B3}$ | $R^{B1}$ | $R^{B5}$ | $R^{B1}$ | N | C | C |
| $L_{A1946}$ | $R^{B3}$ | $R^{B1}$ | $R^{B6}$ | $R^{B1}$ | N | C | C |
| $L_{A1947}$ | $R^{B3}$ | $R^{B1}$ | $R^{B7}$ | $R^{B1}$ | N | C | C |
| $L_{A1948}$ | $R^{B3}$ | $R^{B1}$ | $R^{B8}$ | $R^{B1}$ | N | C | C |
| $L_{A1949}$ | $R^{B3}$ | $R^{B1}$ | $R^{B9}$ | $R^{B1}$ | N | C | C |
| $L_{A1950}$ | $R^{B3}$ | $R^{B1}$ | $R^{A2}$ | $R^{B1}$ | N | C | C |
| $L_{A1951}$ | $R^{B3}$ | $R^{B1}$ | $R^{A27}$ | $R^{B1}$ | N | C | C |
| $L_{A1952}$ | $R^{B3}$ | $R^{B1}$ | $R^{A34}$ | $R^{B1}$ | N | C | C |
| $L_{A1953}$ | $R^{B1}$ | $R^{B1}$ | $R^{B1}$ | $R^{B1}$ | N | N | C |
| $L_{A1954}$ | $R^{B1}$ | $R^{B1}$ | $R^{B2}$ | $R^{B2}$ | N | N | C |
| $L_{A1955}$ | $R^{B1}$ | $R^{B1}$ | $R^{B3}$ | $R^{B3}$ | N | N | C |
| $L_{A1956}$ | $R^{B1}$ | $R^{B1}$ | $R^{B4}$ | $R^{B4}$ | N | N | C |

-continued

| | $R^1$ | $R^2$ | $R^3$ | $R^4$ | $X^1$ | $X^2$ | $X^3$ |
|---|---|---|---|---|---|---|---|
| $L_{A1957}$ | $R^{B1}$ | $R^{B1}$ | $R^{B5}$ | $R^{B5}$ | N | N | C |
| $L_{A1958}$ | $R^{B1}$ | $R^{B1}$ | $R^{B6}$ | $R^{B6}$ | N | N | C |
| $L_{A1959}$ | $R^{B1}$ | $R^{B1}$ | $R^{B7}$ | $R^{B7}$ | N | N | C |
| $L_{A1960}$ | $R^{B1}$ | $R^{B1}$ | $R^{B8}$ | $R^{B8}$ | N | N | C |
| $L_{A1961}$ | $R^{B1}$ | $R^{B1}$ | $R^{B9}$ | $R^{B9}$ | N | N | C |
| $L_{A1962}$ | $R^{B1}$ | $R^{B1}$ | $R^{A2}$ | $R^{A2}$ | N | N | C |
| $L_{A1963}$ | $R^{B1}$ | $R^{B1}$ | $R^{A27}$ | $R^{A27}$ | N | N | C |
| $L_{A1964}$ | $R^{B1}$ | $R^{B1}$ | $R^{A34}$ | $R^{A34}$ | N | N | C |
| $L_{A1965}$ | $R^{B2}$ | $R^{B1}$ | $R^{B1}$ | $R^{B1}$ | N | N | C |
| $L_{A1966}$ | $R^{B2}$ | $R^{B1}$ | $R^{B2}$ | $R^{B2}$ | N | N | C |
| $L_{A1967}$ | $R^{B2}$ | $R^{B1}$ | $R^{B3}$ | $R^{B3}$ | N | N | C |
| $L_{A1968}$ | $R^{B2}$ | $R^{B1}$ | $R^{B4}$ | $R^{B4}$ | N | N | C |
| $L_{A1969}$ | $R^{B2}$ | $R^{B1}$ | $R^{B5}$ | $R^{B5}$ | N | N | C |
| $L_{A1970}$ | $R^{B2}$ | $R^{B1}$ | $R^{B6}$ | $R^{B6}$ | N | N | C |
| $L_{A1971}$ | $R^{B2}$ | $R^{B1}$ | $R^{B7}$ | $R^{B7}$ | N | N | C |
| $L_{A1972}$ | $R^{B2}$ | $R^{B1}$ | $R^{B8}$ | $R^{B8}$ | N | N | C |
| $L_{A1973}$ | $R^{B2}$ | $R^{B1}$ | $R^{B9}$ | $R^{B9}$ | N | N | C |
| $L_{A1974}$ | $R^{B2}$ | $R^{B1}$ | $R^{A2}$ | $R^{A2}$ | N | N | C |
| $L_{A1975}$ | $R^{B2}$ | $R^{B1}$ | $R^{A27}$ | $R^{A27}$ | N | N | C |
| $L_{A1976}$ | $R^{B2}$ | $R^{B1}$ | $R^{A34}$ | $R^{A34}$ | N | N | C |
| $L_{A1977}$ | $R^{B2}$ | F | $R^{B1}$ | $R^{B1}$ | N | N | C |
| $L_{A1978}$ | $R^{B2}$ | F | $R^{B2}$ | $R^{B2}$ | N | N | C |
| $L_{A1979}$ | $R^{B2}$ | F | $R^{B3}$ | $R^{B3}$ | N | N | C |
| $L_{A1980}$ | $R^{B2}$ | F | $R^{B4}$ | $R^{B4}$ | N | N | C |
| $L_{A1981}$ | $R^{B2}$ | F | $R^{B5}$ | $R^{B5}$ | N | N | C |
| $L_{A1982}$ | $R^{B2}$ | F | $R^{B6}$ | $R^{B6}$ | N | N | C |
| $L_{A1983}$ | $R^{B2}$ | F | $R^{B7}$ | $R^{B7}$ | N | N | C |
| $L_{A1984}$ | $R^{B2}$ | F | $R^{B8}$ | $R^{B8}$ | N | N | C |
| $L_{A1985}$ | $R^{B2}$ | F | $R^{B9}$ | $R^{B9}$ | N | N | C |
| $L_{A1986}$ | $R^{B2}$ | F | $R^{A2}$ | $R^{A2}$ | N | N | C |
| $L_{A1987}$ | $R^{B2}$ | F | $R^{A27}$ | $R^{A27}$ | N | N | C |
| $L_{A1988}$ | $R^{B2}$ | F | $R^{A34}$ | $R^{A34}$ | N | N | C |
| $L_{A1989}$ | $R^{B3}$ | $R^{B1}$ | $R^{B1}$ | $R^{B1}$ | N | N | C |
| $L_{A1990}$ | $R^{B3}$ | $R^{B1}$ | $R^{B2}$ | $R^{B2}$ | N | N | C |
| $L_{A1991}$ | $R^{B3}$ | $R^{B1}$ | $R^{B3}$ | $R^{B3}$ | N | N | C |
| $L_{A1992}$ | $R^{B3}$ | $R^{B1}$ | $R^{B4}$ | $R^{B4}$ | N | N | C |
| $L_{A1993}$ | $R^{B3}$ | $R^{B1}$ | $R^{B5}$ | $R^{B5}$ | N | N | C |
| $L_{A1994}$ | $R^{B3}$ | $R^{B1}$ | $R^{B6}$ | $R^{B6}$ | N | N | C |
| $L_{A1995}$ | $R^{B3}$ | $R^{B1}$ | $R^{B7}$ | $R^{B7}$ | N | N | C |
| $L_{A1996}$ | $R^{B3}$ | $R^{B1}$ | $R^{B8}$ | $R^{B8}$ | N | N | C |
| $L_{A1997}$ | $R^{B3}$ | $R^{B1}$ | $R^{B9}$ | $R^{B9}$ | N | N | C |
| $L_{A1998}$ | $R^{B3}$ | $R^{B1}$ | $R^{A2}$ | $R^{A2}$ | N | N | C |
| $L_{A1999}$ | $R^{B3}$ | $R^{B1}$ | $R^{A27}$ | $R^{A27}$ | N | N | C |
| $L_{A2000}$ | $R^{B3}$ | $R^{B1}$ | $R^{A34}$ | $R^{A34}$ | N | N | C |
| $L_{A2001}$ | $R^{B1}$ | $R^{B1}$ | $R^{B1}$ | $R^{B1}$ | N | N | N |
| $L_{A2002}$ | $R^{B1}$ | $R^{B1}$ | $R^{B2}$ | $R^{B2}$ | N | N | N |
| $L_{A2003}$ | $R^{B1}$ | $R^{B1}$ | $R^{B3}$ | $R^{B3}$ | N | N | N |
| $L_{A2004}$ | $R^{B1}$ | $R^{B1}$ | $R^{B4}$ | $R^{B4}$ | N | N | N |
| $L_{A2005}$ | $R^{B1}$ | $R^{B1}$ | $R^{B5}$ | $R^{B5}$ | N | N | N |
| $L_{A2006}$ | $R^{B1}$ | $R^{B1}$ | $R^{B6}$ | $R^{B6}$ | N | N | N |
| $L_{A2007}$ | $R^{B1}$ | $R^{B1}$ | $R^{B7}$ | $R^{B7}$ | N | N | N |
| $L_{A2008}$ | $R^{B1}$ | $R^{B1}$ | $R^{B8}$ | $R^{B8}$ | N | N | N |
| $L_{A2009}$ | $R^{B1}$ | $R^{B1}$ | $R^{B9}$ | $R^{B9}$ | N | N | N |
| $L_{A2010}$ | $R^{B1}$ | $R^{B1}$ | $R^{A2}$ | $R^{A2}$ | N | N | N |
| $L_{A2011}$ | $R^{B1}$ | $R^{B1}$ | $R^{A27}$ | $R^{A27}$ | N | N | N |
| $L_{A2012}$ | $R^{B1}$ | $R^{B1}$ | $R^{A34}$ | $R^{A34}$ | N | N | N |
| $L_{A2013}$ | $R^{B2}$ | $R^{B1}$ | $R^{B1}$ | $R^{B1}$ | N | N | N |
| $L_{A2014}$ | $R^{B2}$ | $R^{B1}$ | $R^{B2}$ | $R^{B2}$ | N | N | N |
| $L_{A2015}$ | $R^{B2}$ | $R^{B1}$ | $R^{B3}$ | $R^{B3}$ | N | N | N |
| $L_{A2016}$ | $R^{B2}$ | $R^{B1}$ | $R^{B4}$ | $R^{B4}$ | N | N | N |
| $L_{A2017}$ | $R^{B2}$ | $R^{B1}$ | $R^{B5}$ | $R^{B5}$ | N | N | N |
| $L_{A2018}$ | $R^{B2}$ | $R^{B1}$ | $R^{B6}$ | $R^{B6}$ | N | N | N |
| $L_{A2019}$ | $R^{B2}$ | $R^{B1}$ | $R^{B7}$ | $R^{B7}$ | N | N | N |
| $L_{A2020}$ | $R^{B2}$ | $R^{B1}$ | $R^{B8}$ | $R^{B8}$ | N | N | N |
| $L_{A2021}$ | $R^{B2}$ | $R^{B1}$ | $R^{B9}$ | $R^{B9}$ | N | N | N |
| $L_{A2022}$ | $R^{B2}$ | $R^{B1}$ | $R^{A2}$ | $R^{A2}$ | N | N | N |
| $L_{A2023}$ | $R^{B2}$ | $R^{B1}$ | $R^{A27}$ | $R^{A27}$ | N | N | N |
| $L_{A2024}$ | $R^{B2}$ | $R^{B1}$ | $R^{A34}$ | $R^{A34}$ | N | N | N |
| $L_{A2025}$ | $R^{B2}$ | F | $R^{B1}$ | $R^{B1}$ | N | N | N |
| $L_{A2026}$ | $R^{B2}$ | F | $R^{B2}$ | $R^{B2}$ | N | N | N |
| $L_{A2027}$ | $R^{B2}$ | F | $R^{B3}$ | $R^{B3}$ | N | N | N |
| $L_{A2028}$ | $R^{B2}$ | F | $R^{B4}$ | $R^{B4}$ | N | N | N |
| $L_{A2029}$ | $R^{B2}$ | F | $R^{B5}$ | $R^{B5}$ | N | N | N |
| $L_{A2030}$ | $R^{B2}$ | F | $R^{B6}$ | $R^{B6}$ | N | N | N |
| $L_{A2031}$ | $R^{B2}$ | F | $R^{B7}$ | $R^{B7}$ | N | N | N |
| $L_{A2032}$ | $R^{B2}$ | F | $R^{B8}$ | $R^{B8}$ | N | N | N |
| $L_{A2033}$ | $R^{B2}$ | F | $R^{B9}$ | $R^{B9}$ | N | N | N |
| $L_{A2034}$ | $R^{B2}$ | F | $R^{A2}$ | $R^{A2}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A2035}$ | $R^{B2}$ | F | $R^{A27}$ | $R^{A27}$ | N | N | N |
| $L_{A2036}$ | $R^{B2}$ | F | $R^{A34}$ | $R^{A34}$ | N | N | N |
| $L_{A2037}$ | $R^{B3}$ | $R^{B1}$ | $R^{B1}$ | $R^{B1}$ | N | N | N |
| $L_{A2038}$ | $R^{B3}$ | $R^{B1}$ | $R^{B2}$ | $R^{B2}$ | N | N | N |
| $L_{A2039}$ | $R^{B3}$ | $R^{B1}$ | $R^{B3}$ | $R^{B3}$ | N | N | N |
| $L_{A2040}$ | $R^{B3}$ | $R^{B1}$ | $R^{B4}$ | $R^{B4}$ | N | N | N |
| $L_{A2041}$ | $R^{B3}$ | $R^{B1}$ | $R^{B5}$ | $R^{B5}$ | N | N | N |
| $L_{A2042}$ | $R^{B3}$ | $R^{B1}$ | $R^{B6}$ | $R^{B6}$ | N | N | N |
| $L_{A2043}$ | $R^{B3}$ | $R^{B1}$ | $R^{B7}$ | $R^{B7}$ | N | N | N |
| $L_{A2044}$ | $R^{B3}$ | $R^{B1}$ | $R^{B8}$ | $R^{B8}$ | N | N | N |
| $L_{A2045}$ | $R^{B3}$ | $R^{B1}$ | $R^{B9}$ | $R^{B9}$ | N | N | N |
| $L_{A2046}$ | $R^{B3}$ | $R^{B1}$ | $R^{A2}$ | $R^{A2}$ | N | N | N |
| $L_{A2047}$ | $R^{B3}$ | $R^{B1}$ | $R^{A27}$ | $R^{A27}$ | N | N | N |
| $L_{A2048}$ | $R^{B3}$ | $R^{B1}$ | $R^{A34}$ | $R^{A34}$ | N | N | N |
| $L_{A2049}$ | $R^{B1}$ | $R^{B1}$ | $R^{B1}$ | $R^{B1}$ | C | C | N |
| $L_{A2050}$ | $R^{B1}$ | $R^{B1}$ | $R^{B2}$ | $R^{B2}$ | C | C | N |
| $L_{A2051}$ | $R^{B1}$ | $R^{B1}$ | $R^{B3}$ | $R^{B3}$ | C | C | N |
| $L_{A2052}$ | $R^{B1}$ | $R^{B1}$ | $R^{B4}$ | $R^{B4}$ | C | C | N |
| $L_{A2053}$ | $R^{B1}$ | $R^{B1}$ | $R^{B5}$ | $R^{B5}$ | C | C | N |
| $L_{A2054}$ | $R^{B1}$ | $R^{B1}$ | $R^{B6}$ | $R^{B6}$ | C | C | N |
| $L_{A2055}$ | $R^{B1}$ | $R^{B1}$ | $R^{B7}$ | $R^{B7}$ | C | C | N |
| $L_{A2056}$ | $R^{B1}$ | $R^{B1}$ | $R^{B8}$ | $R^{B8}$ | C | C | N |
| $L_{A2057}$ | $R^{B1}$ | $R^{B1}$ | $R^{B9}$ | $R^{B9}$ | C | C | N |
| $L_{A2058}$ | $R^{B1}$ | $R^{B1}$ | $R^{A2}$ | $R^{A2}$ | C | C | N |
| $L_{A2059}$ | $R^{B1}$ | $R^{B1}$ | $R^{A27}$ | $R^{A27}$ | C | C | N |
| $L_{A2060}$ | $R^{B1}$ | $R^{B1}$ | $R^{A34}$ | $R^{A34}$ | C | C | N |
| $L_{A2061}$ | $R^{B2}$ | $R^{B1}$ | $R^{B1}$ | $R^{B1}$ | C | C | N |
| $L_{A2062}$ | $R^{B2}$ | $R^{B1}$ | $R^{B2}$ | $R^{B2}$ | C | C | N |
| $L_{A2063}$ | $R^{B2}$ | $R^{B1}$ | $R^{B3}$ | $R^{B3}$ | C | C | N |
| $L_{A2064}$ | $R^{B2}$ | $R^{B1}$ | $R^{B4}$ | $R^{B4}$ | C | C | N |
| $L_{A2065}$ | $R^{B2}$ | $R^{B1}$ | $R^{B5}$ | $R^{B5}$ | C | C | N |
| $L_{A2066}$ | $R^{B2}$ | $R^{B1}$ | $R^{B6}$ | $R^{B6}$ | C | C | N |
| $L_{A2067}$ | $R^{B2}$ | $R^{B1}$ | $R^{B7}$ | $R^{B7}$ | C | C | N |
| $L_{A2068}$ | $R^{B2}$ | $R^{B1}$ | $R^{B8}$ | $R^{B8}$ | C | C | N |
| $L_{A2069}$ | $R^{B2}$ | $R^{B1}$ | $R^{B9}$ | $R^{B9}$ | C | C | N |
| $L_{A2070}$ | $R^{B2}$ | $R^{B1}$ | $R^{A2}$ | $R^{A2}$ | C | C | N |
| $L_{A2071}$ | $R^{B2}$ | $R^{B1}$ | $R^{A27}$ | $R^{A27}$ | C | C | N |
| $L_{A2072}$ | $R^{B2}$ | $R^{B1}$ | $R^{A34}$ | $R^{A34}$ | C | C | N |
| $L_{A2073}$ | $R^{B2}$ | F | $R^{B1}$ | $R^{B1}$ | C | C | N |
| $L_{A2074}$ | $R^{B2}$ | F | $R^{B2}$ | $R^{B2}$ | C | C | N |
| $L_{A2075}$ | $R^{B2}$ | F | $R^{B3}$ | $R^{B3}$ | C | C | N |
| $L_{A2076}$ | $R^{B2}$ | F | $R^{B4}$ | $R^{B4}$ | C | C | N |
| $L_{A2077}$ | $R^{B2}$ | F | $R^{B5}$ | $R^{B5}$ | C | C | N |
| $L_{A2078}$ | $R^{B2}$ | F | $R^{B6}$ | $R^{B6}$ | C | C | N |
| $L_{A2079}$ | $R^{B2}$ | F | $R^{B7}$ | $R^{B7}$ | C | C | N |
| $L_{A2080}$ | $R^{B2}$ | F | $R^{B8}$ | $R^{B8}$ | C | C | N |
| $L_{A2081}$ | $R^{B2}$ | F | $R^{B9}$ | $R^{B9}$ | C | C | N |
| $L_{A2082}$ | $R^{B2}$ | F | $R^{A2}$ | $R^{A2}$ | C | C | N |
| $L_{A2083}$ | $R^{B2}$ | F | $R^{A27}$ | $R^{A27}$ | C | C | N |
| $L_{A2084}$ | $R^{B2}$ | F | $R^{A34}$ | $R^{A34}$ | C | C | N |
| $L_{A2085}$ | $R^{B3}$ | $R^{B1}$ | $R^{B1}$ | $R^{B1}$ | C | C | N |
| $L_{A2086}$ | $R^{B3}$ | $R^{B1}$ | $R^{B2}$ | $R^{B2}$ | C | C | N |
| $L_{A2087}$ | $R^{B3}$ | $R^{B1}$ | $R^{B3}$ | $R^{B3}$ | C | C | N |
| $L_{A2088}$ | $R^{B3}$ | $R^{B1}$ | $R^{B4}$ | $R^{B4}$ | C | C | N |
| $L_{A2089}$ | $R^{B3}$ | $R^{B1}$ | $R^{B5}$ | $R^{B5}$ | C | C | N |
| $L_{A2090}$ | $R^{B3}$ | $R^{B1}$ | $R^{B6}$ | $R^{B6}$ | C | C | N |
| $L_{A2091}$ | $R^{B3}$ | $R^{B1}$ | $R^{B7}$ | $R^{B7}$ | C | C | N |
| $L_{A2092}$ | $R^{B3}$ | $R^{B1}$ | $R^{B8}$ | $R^{B8}$ | C | C | N |
| $L_{A2093}$ | $R^{B3}$ | $R^{B1}$ | $R^{B9}$ | $R^{B9}$ | C | C | N |
| $L_{A2094}$ | $R^{B3}$ | $R^{B1}$ | $R^{A2}$ | $R^{A2}$ | C | C | N |
| $L_{A2095}$ | $R^{B3}$ | $R^{B1}$ | $R^{A27}$ | $R^{A27}$ | C | C | N |
| $L_{A2096}$ | $R^{B3}$ | $R^{B1}$ | $R^{A34}$ | $R^{A34}$ | C | C | N |

for $L_{A2097}$ through $L_{A2280}$, $L_A$ has a structure of

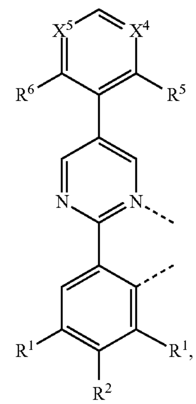

wherein $R^1$, $R^2$, $R^5$, $R^6$, $X^4$, and $X^5$ are defined as provided below,

| | $R^1$ | $R^2$ | $R^5$ | $R^6$ | $X^4$ | $X^5$ |
|---|---|---|---|---|---|---|
| $L_{A2097}$ | $R^{B1}$ | $R^{B1}$ | $R^{B1}$ | $R^{B1}$ | N | C |
| $L_{A2098}$ | $R^{B1}$ | $R^{B1}$ | $R^{B2}$ | $R^{B1}$ | N | C |
| $L_{A2099}$ | $R^{B1}$ | $R^{B1}$ | $R^{B3}$ | $R^{B1}$ | N | C |
| $L_{A2100}$ | $R^{B1}$ | $R^{B1}$ | $R^{B4}$ | $R^{B1}$ | N | C |
| $L_{A2101}$ | $R^{B1}$ | $R^{B1}$ | $R^{B5}$ | $R^{B1}$ | N | C |
| $L_{A2102}$ | $R^{B1}$ | $R^{B1}$ | $R^{B6}$ | $R^{B1}$ | N | C |
| $L_{A2103}$ | $R^{B1}$ | $R^{B1}$ | $R^{B7}$ | $R^{B1}$ | N | C |
| $L_{A2104}$ | $R^{B1}$ | $R^{B1}$ | $R^{B8}$ | $R^{B1}$ | N | C |
| $L_{A2105}$ | $R^{B1}$ | $R^{B1}$ | $R^{B9}$ | $R^{B1}$ | N | C |
| $L_{A2106}$ | $R^{B1}$ | $R^{B1}$ | $R^{A2}$ | $R^{B1}$ | N | C |
| $L_{A2107}$ | $R^{B1}$ | $R^{B1}$ | $R^{A27}$ | $R^{B1}$ | N | C |
| $L_{A2108}$ | $R^{B1}$ | $R^{B1}$ | $R^{A34}$ | $R^{B1}$ | N | C |
| $L_{A2109}$ | $R^{B2}$ | $R^{B1}$ | $R^{B1}$ | $R^{B1}$ | N | C |
| $L_{A2110}$ | $R^{B2}$ | $R^{B1}$ | $R^{B2}$ | $R^{B1}$ | N | C |
| $L_{A2111}$ | $R^{B2}$ | $R^{B1}$ | $R^{B3}$ | $R^{B1}$ | N | C |
| $L_{A2112}$ | $R^{B2}$ | $R^{B1}$ | $R^{B4}$ | $R^{B1}$ | N | C |
| $L_{A2113}$ | $R^{B2}$ | $R^{B1}$ | $R^{B5}$ | $R^{B1}$ | N | C |
| $L_{A2114}$ | $R^{B2}$ | $R^{B1}$ | $R^{B6}$ | $R^{B1}$ | N | C |
| $L_{A2115}$ | $R^{B2}$ | $R^{B1}$ | $R^{B7}$ | $R^{B1}$ | N | C |
| $L_{A2116}$ | $R^{B2}$ | $R^{B1}$ | $R^{B8}$ | $R^{B1}$ | N | C |
| $L_{A2117}$ | $R^{B2}$ | $R^{B1}$ | $R^{B9}$ | $R^{B1}$ | N | C |
| $L_{A2118}$ | $R^{B2}$ | $R^{B1}$ | $R^{A2}$ | $R^{B1}$ | N | C |
| $L_{A2119}$ | $R^{B2}$ | $R^{B1}$ | $R^{A27}$ | $R^{B1}$ | N | C |
| $L_{A2120}$ | $R^{B2}$ | $R^{B1}$ | $R^{A34}$ | $R^{B1}$ | N | C |
| $L_{A2121}$ | $R^{B2}$ | F | $R^{B1}$ | $R^{B1}$ | N | C |
| $L_{A2122}$ | $R^{B2}$ | F | $R^{B2}$ | $R^{B1}$ | N | C |
| $L_{A2123}$ | $R^{B2}$ | F | $R^{B3}$ | $R^{B1}$ | N | C |
| $L_{A2124}$ | $R^{B2}$ | F | $R^{B4}$ | $R^{B1}$ | N | C |
| $L_{A2125}$ | $R^{B2}$ | F | $R^{B5}$ | $R^{B1}$ | N | C |
| $L_{A2126}$ | $R^{B2}$ | F | $R^{B6}$ | $R^{B1}$ | N | C |
| $L_{A2127}$ | $R^{B2}$ | F | $R^{B7}$ | $R^{B1}$ | N | C |
| $L_{A2128}$ | $R^{B2}$ | F | $R^{B8}$ | $R^{B1}$ | N | C |
| $L_{A2129}$ | $R^{B2}$ | F | $R^{B9}$ | $R^{B1}$ | N | C |
| $L_{A2130}$ | $R^{B2}$ | F | $R^{A2}$ | $R^{B1}$ | N | C |
| $L_{A2131}$ | $R^{B2}$ | F | $R^{A27}$ | $R^{B1}$ | N | C |
| $L_{A2132}$ | $R^{B2}$ | F | $R^{A34}$ | $R^{B1}$ | N | C |
| $L_{A2133}$ | $R^{B3}$ | $R^{B1}$ | $R^{B1}$ | $R^{B1}$ | N | C |
| $L_{A2134}$ | $R^{B3}$ | $R^{B1}$ | $R^{B2}$ | $R^{B1}$ | N | C |
| $L_{A2135}$ | $R^{B3}$ | $R^{B1}$ | $R^{B3}$ | $R^{B1}$ | N | C |
| $L_{A2136}$ | $R^{B3}$ | $R^{B1}$ | $R^{B4}$ | $R^{B1}$ | N | C |
| $L_{A2137}$ | $R^{B3}$ | $R^{B1}$ | $R^{B5}$ | $R^{B1}$ | N | C |
| $L_{A2138}$ | $R^{B3}$ | $R^{B1}$ | $R^{B6}$ | $R^{B1}$ | N | C |
| $L_{A2139}$ | $R^{B3}$ | $R^{B1}$ | $R^{B7}$ | $R^{B1}$ | N | C |
| $L_{A2140}$ | $R^{B3}$ | $R^{B1}$ | $R^{B8}$ | $R^{B1}$ | N | C |
| $L_{A2141}$ | $R^{B3}$ | $R^{B1}$ | $R^{B9}$ | $R^{B1}$ | N | C |
| $L_{A2142}$ | $R^{B3}$ | $R^{B1}$ | $R^{A2}$ | $R^{B1}$ | N | C |
| $L_{A2143}$ | $R^{B3}$ | $R^{B1}$ | $R^{A27}$ | $R^{B1}$ | N | C |
| $L_{A2144}$ | $R^{B3}$ | $R^{B1}$ | $R^{A34}$ | $R^{B1}$ | N | C |
| $L_{A2145}$ | $R^{B1}$ | $R^{B1}$ | $R^{B2}$ | $R^{B2}$ | N | C |
| $L_{A2146}$ | $R^{B1}$ | $R^{B1}$ | $R^{B3}$ | $R^{B3}$ | N | C |
| $L_{A2147}$ | $R^{B1}$ | $R^{B1}$ | $R^{B4}$ | $R^{B4}$ | N | C |
| $L_{A2148}$ | $R^{B1}$ | $R^{B1}$ | $R^{B5}$ | $R^{B5}$ | N | C |
| $L_{A2149}$ | $R^{B1}$ | $R^{B1}$ | $R^{B6}$ | $R^{B6}$ | N | C |

-continued

| | $R^1$ | $R^2$ | $R^5$ | $R^6$ | $X^4$ | $X^5$ |
|---|---|---|---|---|---|---|
| $L_{A2150}$ | $R^{B1}$ | $R^{B1}$ | $R^{B7}$ | $R^{B7}$ | N | C |
| $L_{A2151}$ | $R^{B1}$ | $R^{B1}$ | $R^{B8}$ | $R^{B8}$ | N | C |
| $L_{A2152}$ | $R^{B1}$ | $R^{B1}$ | $R^{B9}$ | $R^{B9}$ | N | C |
| $L_{A2153}$ | $R^{B1}$ | $R^{B1}$ | $R^{A2}$ | $R^{A2}$ | N | C |
| $L_{A2154}$ | $R^{B1}$ | $R^{B1}$ | $R^{A27}$ | $R^{A27}$ | N | C |
| $L_{A2155}$ | $R^{B1}$ | $R^{B1}$ | $R^{A34}$ | $R^{A34}$ | N | C |
| $L_{A2156}$ | $R^{B2}$ | $R^{B1}$ | $R^{B2}$ | $R^{B2}$ | N | C |
| $L_{A2157}$ | $R^{B2}$ | $R^{B1}$ | $R^{B3}$ | $R^{B3}$ | N | C |
| $L_{A2158}$ | $R^{B2}$ | $R^{B1}$ | $R^{B4}$ | $R^{B4}$ | N | C |
| $L_{A2159}$ | $R^{B2}$ | $R^{B1}$ | $R^{B5}$ | $R^{B5}$ | N | C |
| $L_{A2160}$ | $R^{B2}$ | $R^{B1}$ | $R^{B6}$ | $R^{B6}$ | N | C |
| $L_{A2161}$ | $R^{B2}$ | $R^{B1}$ | $R^{B7}$ | $R^{B7}$ | N | C |
| $L_{A2162}$ | $R^{B2}$ | $R^{B1}$ | $R^{B8}$ | $R^{B8}$ | N | C |
| $L_{A2163}$ | $R^{B2}$ | $R^{B1}$ | $R^{B9}$ | $R^{B9}$ | N | C |
| $L_{A2164}$ | $R^{B2}$ | $R^{B1}$ | $R^{A2}$ | $R^{A2}$ | N | C |
| $L_{A2165}$ | $R^{B2}$ | $R^{B1}$ | $R^{A27}$ | $R^{A27}$ | N | C |
| $L_{A2166}$ | $R^{B2}$ | $R^{B1}$ | $R^{A34}$ | $R^{A34}$ | N | C |
| $L_{A2167}$ | $R^{B2}$ | F | $R^{B2}$ | $R^{B2}$ | N | C |
| $L_{A2168}$ | $R^{B2}$ | F | $R^{B3}$ | $R^{B3}$ | N | C |
| $L_{A2169}$ | $R^{B2}$ | F | $R^{B4}$ | $R^{B4}$ | N | C |
| $L_{A2170}$ | $R^{B2}$ | F | $R^{B5}$ | $R^{B5}$ | N | C |
| $L_{A2171}$ | $R^{B2}$ | F | $R^{B6}$ | $R^{B6}$ | N | C |
| $L_{A2172}$ | $R^{B2}$ | F | $R^{B7}$ | $R^{B7}$ | N | C |
| $L_{A2173}$ | $R^{B2}$ | F | $R^{B8}$ | $R^{B8}$ | N | C |
| $L_{A2174}$ | $R^{B2}$ | F | $R^{B9}$ | $R^{B9}$ | N | C |
| $L_{A2175}$ | $R^{B2}$ | F | $R^{A2}$ | $R^{A2}$ | N | C |
| $L_{A2176}$ | $R^{B2}$ | F | $R^{A27}$ | $R^{A27}$ | N | C |
| $L_{A2177}$ | $R^{B2}$ | F | $R^{A34}$ | $R^{A34}$ | N | C |
| $L_{A2178}$ | $R^{B3}$ | $R^{B1}$ | $R^{B2}$ | $R^{B2}$ | N | C |
| $L_{A2179}$ | $R^{B3}$ | $R^{B1}$ | $R^{B3}$ | $R^{B3}$ | N | C |
| $L_{A2180}$ | $R^{B3}$ | $R^{B1}$ | $R^{B4}$ | $R^{B4}$ | N | C |
| $L_{A2181}$ | $R^{B3}$ | $R^{B1}$ | $R^{B5}$ | $R^{B5}$ | N | C |
| $L_{A2182}$ | $R^{B3}$ | $R^{B1}$ | $R^{B6}$ | $R^{B6}$ | N | C |
| $L_{A2183}$ | $R^{B3}$ | $R^{B1}$ | $R^{B7}$ | $R^{B7}$ | N | C |
| $L_{A2184}$ | $R^{B3}$ | $R^{B1}$ | $R^{B8}$ | $R^{B8}$ | N | C |
| $L_{A2185}$ | $R^{B3}$ | $R^{B1}$ | $R^{B9}$ | $R^{B9}$ | N | C |
| $L_{A2186}$ | $R^{B3}$ | $R^{B1}$ | $R^{A2}$ | $R^{A2}$ | N | C |
| $L_{A2187}$ | $R^{B3}$ | $R^{B1}$ | $R^{A27}$ | $R^{A27}$ | N | C |
| $L_{A2188}$ | $R^{B3}$ | $R^{B1}$ | $R^{A34}$ | $R^{A34}$ | N | C |
| $L_{A2189}$ | $R^{B1}$ | $R^{B1}$ | $R^{B1}$ | $R^{B1}$ | N | N |
| $L_{A2190}$ | $R^{B1}$ | $R^{B1}$ | $R^{B2}$ | $R^{B1}$ | N | N |
| $L_{A2191}$ | $R^{B1}$ | $R^{B1}$ | $R^{B3}$ | $R^{B1}$ | N | N |
| $L_{A2192}$ | $R^{B1}$ | $R^{B1}$ | $R^{B4}$ | $R^{B1}$ | N | N |
| $L_{A2193}$ | $R^{B1}$ | $R^{B1}$ | $R^{B5}$ | $R^{B1}$ | N | N |
| $L_{A2194}$ | $R^{B1}$ | $R^{B1}$ | $R^{B6}$ | $R^{B1}$ | N | N |
| $L_{A2195}$ | $R^{B1}$ | $R^{B1}$ | $R^{B7}$ | $R^{B1}$ | N | N |
| $L_{A2196}$ | $R^{B1}$ | $R^{B1}$ | $R^{B8}$ | $R^{B1}$ | N | N |
| $L_{A2197}$ | $R^{B1}$ | $R^{B1}$ | $R^{B9}$ | $R^{B1}$ | N | N |
| $L_{A2198}$ | $R^{B1}$ | $R^{B1}$ | $R^{A2}$ | $R^{B1}$ | N | N |
| $L_{A2199}$ | $R^{B1}$ | $R^{B1}$ | $R^{A27}$ | $R^{B1}$ | N | N |
| $L_{A2200}$ | $R^{B1}$ | $R^{B1}$ | $R^{A34}$ | $R^{B1}$ | N | N |
| $L_{A2201}$ | $R^{B2}$ | $R^{B1}$ | $R^{B1}$ | $R^{B1}$ | N | N |
| $L_{A2202}$ | $R^{B2}$ | $R^{B1}$ | $R^{B2}$ | $R^{B1}$ | N | N |
| $L_{A2203}$ | $R^{B2}$ | $R^{B1}$ | $R^{B3}$ | $R^{B1}$ | N | N |
| $L_{A2204}$ | $R^{B2}$ | $R^{B1}$ | $R^{B4}$ | $R^{B1}$ | N | N |
| $L_{A2205}$ | $R^{B2}$ | $R^{B1}$ | $R^{B5}$ | $R^{B1}$ | N | N |
| $L_{A2206}$ | $R^{B2}$ | $R^{B1}$ | $R^{B6}$ | $R^{B1}$ | N | N |
| $L_{A2207}$ | $R^{B2}$ | $R^{B1}$ | $R^{B7}$ | $R^{B1}$ | N | N |
| $L_{A2208}$ | $R^{B2}$ | $R^{B1}$ | $R^{B8}$ | $R^{B1}$ | N | N |
| $L_{A2209}$ | $R^{B2}$ | $R^{B1}$ | $R^{B9}$ | $R^{B1}$ | N | N |
| $L_{A2210}$ | $R^{B2}$ | $R^{B1}$ | $R^{A2}$ | $R^{B1}$ | N | N |
| $L_{A2211}$ | $R^{B2}$ | $R^{B1}$ | $R^{A27}$ | $R^{B1}$ | N | N |
| $L_{A2212}$ | $R^{B2}$ | $R^{B1}$ | $R^{A34}$ | $R^{B1}$ | N | N |
| $L_{A2213}$ | $R^{B2}$ | F | $R^{B1}$ | $R^{B1}$ | N | N |
| $L_{A2214}$ | $R^{B2}$ | F | $R^{B2}$ | $R^{B1}$ | N | N |
| $L_{A2215}$ | $R^{B2}$ | F | $R^{B3}$ | $R^{B1}$ | N | N |
| $L_{A2216}$ | $R^{B2}$ | F | $R^{B4}$ | $R^{B1}$ | N | N |
| $L_{A2217}$ | $R^{B2}$ | F | $R^{B5}$ | $R^{B1}$ | N | N |
| $L_{A2218}$ | $R^{B2}$ | F | $R^{B6}$ | $R^{B1}$ | N | N |
| $L_{A2219}$ | $R^{B2}$ | F | $R^{B7}$ | $R^{B1}$ | N | N |
| $L_{A2220}$ | $R^{B2}$ | F | $R^{B8}$ | $R^{B1}$ | N | N |
| $L_{A2221}$ | $R^{B2}$ | F | $R^{B9}$ | $R^{B1}$ | N | N |
| $L_{A2222}$ | $R^{B2}$ | F | $R^{A2}$ | $R^{B1}$ | N | N |
| $L_{A2223}$ | $R^{B2}$ | F | $R^{A27}$ | $R^{B1}$ | N | N |
| $L_{A2224}$ | $R^{B2}$ | F | $R^{A34}$ | $R^{B1}$ | N | N |
| $L_{A2225}$ | $R^{B3}$ | $R^{B1}$ | $R^{B1}$ | $R^{B1}$ | N | N |
| $L_{A2226}$ | $R^{B3}$ | $R^{B1}$ | $R^{B2}$ | $R^{B1}$ | N | N |
| $L_{A2227}$ | $R^{B3}$ | $R^{B1}$ | $R^{B3}$ | $R^{B1}$ | N | N |
| $L_{A2228}$ | $R^{B3}$ | $R^{B1}$ | $R^{B4}$ | $R^{B1}$ | N | N |
| $L_{A2229}$ | $R^{B3}$ | $R^{B1}$ | $R^{B5}$ | $R^{B1}$ | N | N |
| $L_{A2230}$ | $R^{B3}$ | $R^{B1}$ | $R^{B6}$ | $R^{B1}$ | N | N |
| $L_{A2231}$ | $R^{B3}$ | $R^{B1}$ | $R^{B7}$ | $R^{B1}$ | N | N |
| $L_{A2232}$ | $R^{B3}$ | $R^{B1}$ | $R^{B8}$ | $R^{B1}$ | N | N |
| $L_{A2233}$ | $R^{B3}$ | $R^{B1}$ | $R^{B9}$ | $R^{B1}$ | N | N |
| $L_{A2234}$ | $R^{B3}$ | $R^{B1}$ | $R^{A2}$ | $R^{B1}$ | N | N |
| $L_{A2235}$ | $R^{B3}$ | $R^{B1}$ | $R^{A27}$ | $R^{B1}$ | N | N |
| $L_{A2236}$ | $R^{B3}$ | $R^{B1}$ | $R^{A34}$ | $R^{B1}$ | N | N |
| $L_{A2237}$ | $R^{B1}$ | $R^{B1}$ | $R^{B2}$ | $R^{B2}$ | N | N |
| $L_{A2238}$ | $R^{B1}$ | $R^{B1}$ | $R^{B3}$ | $R^{B3}$ | N | N |
| $L_{A2239}$ | $R^{B1}$ | $R^{B1}$ | $R^{B4}$ | $R^{B4}$ | N | N |
| $L_{A2240}$ | $R^{B1}$ | $R^{B1}$ | $R^{B5}$ | $R^{B5}$ | N | N |
| $L_{A2241}$ | $R^{B1}$ | $R^{B1}$ | $R^{B6}$ | $R^{B6}$ | N | N |
| $L_{A2242}$ | $R^{B1}$ | $R^{B1}$ | $R^{B7}$ | $R^{B7}$ | N | N |
| $L_{A2243}$ | $R^{B1}$ | $R^{B1}$ | $R^{B8}$ | $R^{B8}$ | N | N |
| $L_{A2244}$ | $R^{B1}$ | $R^{B1}$ | $R^{B9}$ | $R^{B9}$ | N | N |
| $L_{A2245}$ | $R^{B1}$ | $R^{B1}$ | $R^{A2}$ | $R^{A2}$ | N | N |
| $L_{A2246}$ | $R^{B1}$ | $R^{B1}$ | $R^{A27}$ | $R^{A27}$ | N | N |
| $L_{A2247}$ | $R^{B1}$ | $R^{B1}$ | $R^{A34}$ | $R^{A34}$ | N | N |
| $L_{A2248}$ | $R^{B2}$ | $R^{B1}$ | $R^{B2}$ | $R^{B2}$ | N | N |
| $L_{A2249}$ | $R^{B2}$ | $R^{B1}$ | $R^{B3}$ | $R^{B3}$ | N | N |
| $L_{A2250}$ | $R^{B2}$ | $R^{B1}$ | $R^{B4}$ | $R^{B4}$ | N | N |
| $L_{A2251}$ | $R^{B2}$ | $R^{B1}$ | $R^{B5}$ | $R^{B5}$ | N | N |
| $L_{A2252}$ | $R^{B2}$ | $R^{B1}$ | $R^{B6}$ | $R^{B6}$ | N | N |
| $L_{A2253}$ | $R^{B2}$ | $R^{B1}$ | $R^{B7}$ | $R^{B7}$ | N | N |
| $L_{A2254}$ | $R^{B2}$ | $R^{B1}$ | $R^{B8}$ | $R^{B8}$ | N | N |
| $L_{A2255}$ | $R^{B2}$ | $R^{B1}$ | $R^{B9}$ | $R^{B9}$ | N | N |
| $L_{A2256}$ | $R^{B2}$ | $R^{B1}$ | $R^{A2}$ | $R^{A2}$ | N | N |
| $L_{A2257}$ | $R^{B2}$ | $R^{B1}$ | $R^{A27}$ | $R^{A27}$ | N | N |
| $L_{A2258}$ | $R^{B2}$ | $R^{B1}$ | $R^{A34}$ | $R^{A34}$ | N | N |
| $L_{A2259}$ | $R^{B2}$ | F | $R^{B2}$ | $R^{B2}$ | N | N |
| $L_{A2260}$ | $R^{B2}$ | F | $R^{B3}$ | $R^{B3}$ | N | N |
| $L_{A2261}$ | $R^{B2}$ | F | $R^{B4}$ | $R^{B4}$ | N | N |
| $L_{A2262}$ | $R^{B2}$ | F | $R^{B5}$ | $R^{B5}$ | N | N |
| $L_{A2263}$ | $R^{B2}$ | F | $R^{B6}$ | $R^{B6}$ | N | N |
| $L_{A2264}$ | $R^{B2}$ | F | $R^{B7}$ | $R^{B7}$ | N | N |
| $L_{A2265}$ | $R^{B2}$ | F | $R^{B8}$ | $R^{B8}$ | N | N |
| $L_{A2266}$ | $R^{B2}$ | F | $R^{B9}$ | $R^{B9}$ | N | N |
| $L_{A2267}$ | $R^{B2}$ | F | $R^{A2}$ | $R^{A2}$ | N | N |
| $L_{A2268}$ | $R^{B2}$ | F | $R^{A27}$ | $R^{A27}$ | N | N |
| $L_{A2269}$ | $R^{B2}$ | F | $R^{A34}$ | $R^{A34}$ | N | N |
| $L_{A2270}$ | $R^{B3}$ | $R^{B1}$ | $R^{B2}$ | $R^{B2}$ | N | N |
| $L_{A2271}$ | $R^{B3}$ | $R^{B1}$ | $R^{B3}$ | $R^{B3}$ | N | N |
| $L_{A2272}$ | $R^{B3}$ | $R^{B1}$ | $R^{B4}$ | $R^{B4}$ | N | N |
| $L_{A2273}$ | $R^{B3}$ | $R^{B1}$ | $R^{B5}$ | $R^{B5}$ | N | N |
| $L_{A2274}$ | $R^{B3}$ | $R^{B1}$ | $R^{B6}$ | $R^{B6}$ | N | N |
| $L_{A2275}$ | $R^{B3}$ | $R^{B1}$ | $R^{B7}$ | $R^{B7}$ | N | N |
| $L_{A2276}$ | $R^{B3}$ | $R^{B1}$ | $R^{B8}$ | $R^{B8}$ | N | N |
| $L_{A2277}$ | $R^{B3}$ | $R^{B1}$ | $R^{B9}$ | $R^{B9}$ | N | N |
| $L_{A2278}$ | $R^{B3}$ | $R^{B1}$ | $R^{A2}$ | $R^{A2}$ | N | N |
| $L_{A2279}$ | $R^{B3}$ | $R^{B1}$ | $R^{A27}$ | $R^{A27}$ | N | N |
| $L_{A2280}$ | $R^{B3}$ | $R^{B1}$ | $R^{A34}$ | $R^{A34}$ | N | N |

for $L_{A2281}$ through $L_{A2856}$, $L_A$ has a structure of

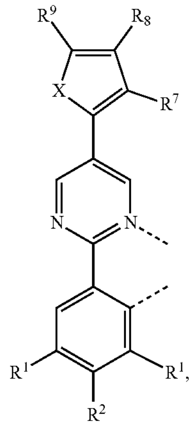

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A2281}$ | $R^{B1}$ | $R^{B1}$ | $R^{B1}$ | $R^{B1}$ | $R^{B1}$ | S |
| $L_{A2282}$ | $R^{B1}$ | $R^{B1}$ | $R^{B1}$ | $R^{B1}$ | $R^{B2}$ | S |
| $L_{A2283}$ | $R^{B1}$ | $R^{B1}$ | $R^{B1}$ | $R^{B1}$ | $R^{B3}$ | S |
| $L_{A2284}$ | $R^{B1}$ | $R^{B1}$ | $R^{B1}$ | $R^{B1}$ | $R^{B4}$ | S |
| $L_{A2285}$ | $R^{B1}$ | $R^{B1}$ | $R^{B1}$ | $R^{B1}$ | $R^{B5}$ | S |
| $L_{A2286}$ | $R^{B1}$ | $R^{B1}$ | $R^{B1}$ | $R^{B1}$ | $R^{B6}$ | S |
| $L_{A2287}$ | $R^{B1}$ | $R^{B1}$ | $R^{B1}$ | $R^{B1}$ | $R^{B7}$ | S |
| $L_{A2288}$ | $R^{B1}$ | $R^{B1}$ | $R^{B1}$ | $R^{B1}$ | $R^{B8}$ | S |
| $L_{A2289}$ | $R^{B1}$ | $R^{B1}$ | $R^{B1}$ | $R^{B1}$ | $R^{B9}$ | S |
| $L_{A2290}$ | $R^{B1}$ | $R^{B1}$ | $R^{B1}$ | $R^{B1}$ | $R^{A2}$ | S |
| $L_{A2291}$ | $R^{B1}$ | $R^{B1}$ | $R^{B1}$ | $R^{B1}$ | $R^{A27}$ | S |
| $L_{A2292}$ | $R^{B1}$ | $R^{B1}$ | $R^{B1}$ | $R^{B1}$ | $R^{A34}$ | S |
| $L_{A2293}$ | $R^{B2}$ | $R^{B1}$ | $R^{B1}$ | $R^{B1}$ | $R^{B1}$ | S |
| $L_{A2294}$ | $R^{B2}$ | $R^{B1}$ | $R^{B1}$ | $R^{B1}$ | $R^{B2}$ | S |
| $L_{A2295}$ | $R^{B2}$ | $R^{B1}$ | $R^{B1}$ | $R^{B1}$ | $R^{B3}$ | S |
| $L_{A2296}$ | $R^{B2}$ | $R^{B1}$ | $R^{B1}$ | $R^{B1}$ | $R^{B4}$ | S |
| $L_{A2297}$ | $R^{B2}$ | $R^{B1}$ | $R^{B1}$ | $R^{B1}$ | $R^{B5}$ | S |
| $L_{A2298}$ | $R^{B2}$ | $R^{B1}$ | $R^{B1}$ | $R^{B1}$ | $R^{B6}$ | S |
| $L_{A2299}$ | $R^{B2}$ | $R^{B1}$ | $R^{B1}$ | $R^{B1}$ | $R^{B7}$ | S |
| $L_{A2300}$ | $R^{B2}$ | $R^{B1}$ | $R^{B1}$ | $R^{B1}$ | $R^{B8}$ | S |
| $L_{A2301}$ | $R^{B2}$ | $R^{B1}$ | $R^{B1}$ | $R^{B1}$ | $R^{B9}$ | S |
| $L_{A2302}$ | $R^{B2}$ | $R^{B1}$ | $R^{B1}$ | $R^{B1}$ | $R^{A2}$ | S |
| $L_{A2303}$ | $R^{B2}$ | $R^{B1}$ | $R^{B1}$ | $R^{B1}$ | $R^{A27}$ | S |
| $L_{A2304}$ | $R^{B2}$ | $R^{B1}$ | $R^{B1}$ | $R^{B1}$ | $R^{A34}$ | S |
| $L_{A2305}$ | $R^{B2}$ | F | $R^{B1}$ | $R^{B1}$ | $R^{B1}$ | S |
| $L_{A2306}$ | $R^{B2}$ | F | $R^{B1}$ | $R^{B1}$ | $R^{B2}$ | S |
| $L_{A2307}$ | $R^{B2}$ | F | $R^{B1}$ | $R^{B1}$ | $R^{B3}$ | S |
| $L_{A2308}$ | $R^{B2}$ | F | $R^{B1}$ | $R^{B1}$ | $R^{B4}$ | S |
| $L_{A2309}$ | $R^{B2}$ | F | $R^{B1}$ | $R^{B1}$ | $R^{B5}$ | S |
| $L_{A2310}$ | $R^{B2}$ | F | $R^{B1}$ | $R^{B1}$ | $R^{B6}$ | S |
| $L_{A2311}$ | $R^{B2}$ | F | $R^{B1}$ | $R^{B1}$ | $R^{B7}$ | S |
| $L_{A2312}$ | $R^{B2}$ | F | $R^{B1}$ | $R^{B1}$ | $R^{B8}$ | S |
| $L_{A2313}$ | $R^{B2}$ | F | $R^{B1}$ | $R^{B1}$ | $R^{B9}$ | S |
| $L_{A2314}$ | $R^{B2}$ | F | $R^{B1}$ | $R^{B1}$ | $R^{A2}$ | S |
| $L_{A2315}$ | $R^{B2}$ | F | $R^{B1}$ | $R^{B1}$ | $R^{A27}$ | S |
| $L_{A2316}$ | $R^{B2}$ | F | $R^{B1}$ | $R^{B1}$ | $R^{A34}$ | S |
| $L_{A2317}$ | $R^{B3}$ | $R^{B1}$ | $R^{B1}$ | $R^{B1}$ | $R^{B1}$ | S |
| $L_{A2318}$ | $R^{B3}$ | $R^{B1}$ | $R^{B1}$ | $R^{B1}$ | $R^{B2}$ | S |
| $L_{A2319}$ | $R^{B3}$ | $R^{B1}$ | $R^{B1}$ | $R^{B1}$ | $R^{B3}$ | S |
| $L_{A2320}$ | $R^{B3}$ | $R^{B1}$ | $R^{B1}$ | $R^{B1}$ | $R^{B4}$ | S |
| $L_{A2321}$ | $R^{B3}$ | $R^{B1}$ | $R^{B1}$ | $R^{B1}$ | $R^{B5}$ | S |
| $L_{A2322}$ | $R^{B3}$ | $R^{B1}$ | $R^{B1}$ | $R^{B1}$ | $R^{B6}$ | S |
| $L_{A2323}$ | $R^{B3}$ | $R^{B1}$ | $R^{B1}$ | $R^{B1}$ | $R^{B7}$ | S |
| $L_{A2324}$ | $R^{B3}$ | $R^{B1}$ | $R^{B1}$ | $R^{B1}$ | $R^{B8}$ | S |
| $L_{A2325}$ | $R^{B3}$ | $R^{B1}$ | $R^{B1}$ | $R^{B1}$ | $R^{B9}$ | S |
| $L_{A2326}$ | $R^{B3}$ | $R^{B1}$ | $R^{B1}$ | $R^{B1}$ | $R^{A2}$ | S |
| $L_{A2327}$ | $R^{B3}$ | $R^{B1}$ | $R^{B1}$ | $R^{B1}$ | $R^{A27}$ | S |
| $L_{A2328}$ | $R^{B3}$ | $R^{B1}$ | $R^{B1}$ | $R^{B1}$ | $R^{A34}$ | S |
| $L_{A2329}$ | $R^{B1}$ | $R^{B1}$ | $R^{B1}$ | $R^{B1}$ | $R^{B1}$ | S |
| $L_{A2330}$ | $R^{B1}$ | $R^{B1}$ | $R^{B1}$ | $R^{B2}$ | $R^{B1}$ | S |
| $L_{A2331}$ | $R^{B1}$ | $R^{B1}$ | $R^{B1}$ | $R^{B3}$ | $R^{B1}$ | S |

-continued

| | $R^1$ | $R^2$ | $R^7$ | $R^8$ | $R^9$ | X |
|---|---|---|---|---|---|---|
| $L_{A2332}$ | $R^{B1}$ | $R^{B1}$ | $R^{B1}$ | $R^{B4}$ | $R^{B1}$ | S |
| $L_{A2333}$ | $R^{B1}$ | $R^{B1}$ | $R^{B1}$ | $R^{B5}$ | $R^{B1}$ | S |
| $L_{A2334}$ | $R^{B1}$ | $R^{B1}$ | $R^{B1}$ | $R^{B6}$ | $R^{B1}$ | S |
| $L_{A2335}$ | $R^{B1}$ | $R^{B1}$ | $R^{B1}$ | $R^{B7}$ | $R^{B1}$ | S |
| $L_{A2336}$ | $R^{B1}$ | $R^{B1}$ | $R^{B1}$ | $R^{B8}$ | $R^{B1}$ | S |
| $L_{A2337}$ | $R^{B1}$ | $R^{B1}$ | $R^{B1}$ | $R^{B9}$ | $R^{B1}$ | S |
| $L_{A2338}$ | $R^{B1}$ | $R^{B1}$ | $R^{B1}$ | $R^{A2}$ | $R^{B1}$ | S |
| $L_{A2339}$ | $R^{B1}$ | $R^{B1}$ | $R^{B1}$ | $R^{A27}$ | $R^{B1}$ | S |
| $L_{A2340}$ | $R^{B1}$ | $R^{B1}$ | $R^{B1}$ | $R^{A34}$ | $R^{B1}$ | S |
| $L_{A2341}$ | $R^{B2}$ | $R^{B1}$ | $R^{B1}$ | $R^{B1}$ | $R^{B1}$ | S |
| $L_{A2342}$ | $R^{B2}$ | $R^{B1}$ | $R^{B1}$ | $R^{B2}$ | $R^{B1}$ | S |
| $L_{A2343}$ | $R^{B2}$ | $R^{B1}$ | $R^{B1}$ | $R^{B3}$ | $R^{B1}$ | S |
| $L_{A2344}$ | $R^{B2}$ | $R^{B1}$ | $R^{B1}$ | $R^{B4}$ | $R^{B1}$ | S |
| $L_{A2345}$ | $R^{B2}$ | $R^{B1}$ | $R^{B1}$ | $R^{B5}$ | $R^{B1}$ | S |
| $L_{A2346}$ | $R^{B2}$ | $R^{B1}$ | $R^{B1}$ | $R^{B6}$ | $R^{B1}$ | S |
| $L_{A2347}$ | $R^{B2}$ | $R^{B1}$ | $R^{B1}$ | $R^{B7}$ | $R^{B1}$ | S |
| $L_{A2348}$ | $R^{B2}$ | $R^{B1}$ | $R^{B1}$ | $R^{B8}$ | $R^{B1}$ | S |
| $L_{A2349}$ | $R^{B2}$ | $R^{B1}$ | $R^{B1}$ | $R^{B9}$ | $R^{B1}$ | S |
| $L_{A2350}$ | $R^{B2}$ | $R^{B1}$ | $R^{B1}$ | $R^{A2}$ | $R^{B1}$ | S |
| $L_{A2351}$ | $R^{B2}$ | $R^{B1}$ | $R^{B1}$ | $R^{A27}$ | $R^{B1}$ | S |
| $L_{A2352}$ | $R^{B2}$ | $R^{B1}$ | $R^{B1}$ | $R^{A54}$ | $R^{B1}$ | S |
| $L_{A2353}$ | $R^{B2}$ | F | $R^{B1}$ | $R^{B1}$ | $R^{B1}$ | S |
| $L_{A2354}$ | $R^{B2}$ | F | $R^{B1}$ | $R^{B2}$ | $R^{B1}$ | S |
| $L_{A2355}$ | $R^{B2}$ | F | $R^{B1}$ | $R^{B3}$ | $R^{B1}$ | S |
| $L_{A2356}$ | $R^{B2}$ | F | $R^{B1}$ | $R^{B4}$ | $R^{B1}$ | S |
| $L_{A2357}$ | $R^{B2}$ | F | $R^{B1}$ | $R^{B5}$ | $R^{B1}$ | S |
| $L_{A2358}$ | $R^{B2}$ | F | $R^{B1}$ | $R^{B6}$ | $R^{B1}$ | S |
| $L_{A2359}$ | $R^{B2}$ | F | $R^{B1}$ | $R^{B7}$ | $R^{B1}$ | S |
| $L_{A2360}$ | $R^{B2}$ | F | $R^{B1}$ | $R^{B8}$ | $R^{B1}$ | S |
| $L_{A2361}$ | $R^{B2}$ | F | $R^{B1}$ | $R^{B9}$ | $R^{B1}$ | S |
| $L_{A2362}$ | $R^{B2}$ | F | $R^{B1}$ | $R^{A2}$ | $R^{B1}$ | S |
| $L_{A2363}$ | $R^{B2}$ | F | $R^{B1}$ | $R^{A27}$ | $R^{B1}$ | S |
| $L_{A2364}$ | $R^{B2}$ | F | $R^{B1}$ | $R^{A34}$ | $R^{B1}$ | S |
| $L_{A2365}$ | $R^{B3}$ | $R^{B1}$ | $R^{B1}$ | $R^{B1}$ | $R^{B1}$ | S |
| $L_{A2366}$ | $R^{B3}$ | $R^{B1}$ | $R^{B1}$ | $R^{B2}$ | $R^{B1}$ | S |
| $L_{A2367}$ | $R^{B3}$ | $R^{B1}$ | $R^{B1}$ | $R^{B3}$ | $R^{B1}$ | S |
| $L_{A2368}$ | $R^{B3}$ | $R^{B1}$ | $R^{B1}$ | $R^{B4}$ | $R^{B1}$ | S |
| $L_{A2369}$ | $R^{B3}$ | $R^{B1}$ | $R^{B1}$ | $R^{B5}$ | $R^{B1}$ | S |
| $L_{A2370}$ | $R^{B3}$ | $R^{B1}$ | $R^{B1}$ | $R^{B6}$ | $R^{B1}$ | S |
| $L_{A2371}$ | $R^{B3}$ | $R^{B1}$ | $R^{B1}$ | $R^{B7}$ | $R^{B1}$ | S |
| $L_{A2372}$ | $R^{B3}$ | $R^{B1}$ | $R^{B1}$ | $R^{B8}$ | $R^{B1}$ | S |
| $L_{A2373}$ | $R^{B3}$ | $R^{B1}$ | $R^{B1}$ | $R^{B9}$ | $R^{B1}$ | S |
| $L_{A2374}$ | $R^{B3}$ | $R^{B1}$ | $R^{B1}$ | $R^{A2}$ | $R^{B1}$ | S |
| $L_{A2375}$ | $R^{B3}$ | $R^{B1}$ | $R^{B1}$ | $R^{A27}$ | $R^{B1}$ | S |
| $L_{A2376}$ | $R^{B3}$ | $R^{B1}$ | $R^{B1}$ | $R^{A34}$ | $R^{B1}$ | S |
| $L_{A2377}$ | $R^{B1}$ | $R^{B1}$ | $R^{B1}$ | $R^{B1}$ | $R^{B1}$ | S |
| $L_{A2378}$ | $R^{B1}$ | $R^{B1}$ | $R^{B2}$ | $R^{B1}$ | $R^{B1}$ | S |
| $L_{A2379}$ | $R^{B1}$ | $R^{B1}$ | $R^{B3}$ | $R^{B1}$ | $R^{B1}$ | S |
| $L_{A2380}$ | $R^{B1}$ | $R^{B1}$ | $R^{B4}$ | $R^{B1}$ | $R^{B1}$ | S |
| $L_{A2381}$ | $R^{B1}$ | $R^{B1}$ | $R^{B5}$ | $R^{B1}$ | $R^{B1}$ | S |
| $L_{A2382}$ | $R^{B1}$ | $R^{B1}$ | $R^{B6}$ | $R^{B1}$ | $R^{B1}$ | S |
| $L_{A2383}$ | $R^{B1}$ | $R^{B1}$ | $R^{B7}$ | $R^{B1}$ | $R^{B1}$ | S |
| $L_{A2384}$ | $R^{B1}$ | $R^{B1}$ | $R^{B8}$ | $R^{B1}$ | $R^{B1}$ | S |
| $L_{A2385}$ | $R^{B1}$ | $R^{B1}$ | $R^{B9}$ | $R^{B1}$ | $R^{B1}$ | S |
| $L_{A2386}$ | $R^{B1}$ | $R^{B1}$ | $R^{A2}$ | $R^{B1}$ | $R^{B1}$ | S |
| $L_{A2387}$ | $R^{B1}$ | $R^{B1}$ | $R^{A27}$ | $R^{B1}$ | $R^{B1}$ | S |
| $L_{A2388}$ | $R^{B1}$ | $R^{B1}$ | $R^{A34}$ | $R^{B1}$ | $R^{B1}$ | S |
| $L_{A2389}$ | $R^{B2}$ | $R^{B1}$ | $R^{B1}$ | $R^{B1}$ | $R^{B1}$ | S |
| $L_{A2390}$ | $R^{B2}$ | $R^{B1}$ | $R^{B2}$ | $R^{B1}$ | $R^{B1}$ | S |
| $L_{A2391}$ | $R^{B2}$ | $R^{B1}$ | $R^{B3}$ | $R^{B1}$ | $R^{B1}$ | S |
| $L_{A2392}$ | $R^{B2}$ | $R^{B1}$ | $R^{B4}$ | $R^{B1}$ | $R^{B1}$ | S |
| $L_{A2393}$ | $R^{B2}$ | $R^{B1}$ | $R^{B5}$ | $R^{B1}$ | $R^{B1}$ | S |
| $L_{A2394}$ | $R^{B2}$ | $R^{B1}$ | $R^{B6}$ | $R^{B1}$ | $R^{B1}$ | S |
| $L_{A2395}$ | $R^{B2}$ | $R^{B1}$ | $R^{B7}$ | $R^{B1}$ | $R^{B1}$ | S |
| $L_{A2396}$ | $R^{B2}$ | $R^{B1}$ | $R^{B8}$ | $R^{B1}$ | $R^{B1}$ | S |
| $L_{A2397}$ | $R^{B2}$ | $R^{B1}$ | $R^{B9}$ | $R^{B1}$ | $R^{B1}$ | S |
| $L_{A2398}$ | $R^{B2}$ | $R^{B1}$ | $R^{A2}$ | $R^{B1}$ | $R^{B1}$ | S |
| $L_{A2399}$ | $R^{B2}$ | $R^{B1}$ | $R^{A27}$ | $R^{B1}$ | $R^{B1}$ | S |
| $L_{A2400}$ | $R^{B2}$ | $R^{B1}$ | $R^{A34}$ | $R^{B1}$ | $R^{B1}$ | S |
| $L_{A2401}$ | $R^{B2}$ | F | $R^{B1}$ | $R^{B1}$ | $R^{B1}$ | S |
| $L_{A2402}$ | $R^{B2}$ | F | $R^{B2}$ | $R^{B1}$ | $R^{B1}$ | S |
| $L_{A2403}$ | $R^{B2}$ | F | $R^{B3}$ | $R^{B1}$ | $R^{B1}$ | S |
| $L_{A2404}$ | $R^{B2}$ | F | $R^{B4}$ | $R^{B1}$ | $R^{B1}$ | S |
| $L_{A2405}$ | $R^{B2}$ | F | $R^{B5}$ | $R^{B1}$ | $R^{B1}$ | S |
| $L_{A2406}$ | $R^{B2}$ | F | $R^{B6}$ | $R^{B1}$ | $R^{B1}$ | S |
| $L_{A2407}$ | $R^{B2}$ | F | $R^{B7}$ | $R^{B1}$ | $R^{B1}$ | S |
| $L_{A2408}$ | $R^{B2}$ | F | $R^{B8}$ | $R^{B1}$ | $R^{B1}$ | S |
| $L_{A2409}$ | $R^{B2}$ | F | $R^{B9}$ | $R^{B1}$ | $R^{B1}$ | S |

-continued

| | $R^1$ | $R^2$ | $R^7$ | $R^8$ | $R^9$ | X |
|---|---|---|---|---|---|---|
| $L_{A2410}$ | $R^{B2}$ | F | $R^{A2}$ | $R^{B1}$ | $R^{B1}$ | S |
| $L_{A2411}$ | $R^{B2}$ | F | $R^{A27}$ | $R^{B1}$ | $R^{B1}$ | S |
| $L_{A2412}$ | $R^{B2}$ | F | $R^{A34}$ | $R^{B1}$ | $R^{B1}$ | S |
| $L_{A2413}$ | $R^{B3}$ | $R^{B1}$ | $R^{B1}$ | $R^{B1}$ | $R^{B1}$ | S |
| $L_{A2414}$ | $R^{B3}$ | $R^{B1}$ | $R^{B2}$ | $R^{B1}$ | $R^{B1}$ | S |
| $L_{A2415}$ | $R^{B3}$ | $R^{B1}$ | $R^{B3}$ | $R^{B1}$ | $R^{B1}$ | S |
| $L_{A2416}$ | $R^{B3}$ | $R^{B1}$ | $R^{B4}$ | $R^{B1}$ | $R^{B1}$ | S |
| $L_{A2417}$ | $R^{B3}$ | $R^{B1}$ | $R^{B5}$ | $R^{B1}$ | $R^{B1}$ | S |
| $L_{A2418}$ | $R^{B3}$ | $R^{B1}$ | $R^{B6}$ | $R^{B1}$ | $R^{B1}$ | S |
| $L_{A2419}$ | $R^{B3}$ | $R^{B1}$ | $R^{B7}$ | $R^{B1}$ | $R^{B1}$ | S |
| $L_{A2420}$ | $R^{B3}$ | $R^{B1}$ | $R^{B8}$ | $R^{B1}$ | $R^{B1}$ | S |
| $L_{A2421}$ | $R^{B3}$ | $R^{B1}$ | $R^{B9}$ | $R^{B1}$ | $R^{B1}$ | S |
| $L_{A2422}$ | $R^{B3}$ | $R^{B1}$ | $R^{A2}$ | $R^{B1}$ | $R^{B1}$ | S |
| $L_{A2423}$ | $R^{B3}$ | $R^{B1}$ | $R^{A27}$ | $R^{B1}$ | $R^{B1}$ | S |
| $L_{A2424}$ | $R^{B3}$ | $R^{B1}$ | $R^{A34}$ | $R^{B1}$ | $R^{B1}$ | S |
| $L_{A2425}$ | $R^{B1}$ | $R^{B1}$ | $R^{B1}$ | $R^{B1}$ | $R^{B1}$ | S |
| $L_{A2426}$ | $R^{B1}$ | $R^{B1}$ | $R^{B2}$ | $R^{B1}$ | $R^{B2}$ | S |
| $L_{A2427}$ | $R^{B1}$ | $R^{B1}$ | $R^{B3}$ | $R^{B1}$ | $R^{B3}$ | S |
| $L_{A2428}$ | $R^{B1}$ | $R^{B1}$ | $R^{B4}$ | $R^{B1}$ | $R^{B4}$ | S |
| $L_{A2429}$ | $R^{B1}$ | $R^{B1}$ | $R^{B5}$ | $R^{B1}$ | $R^{B5}$ | S |
| $L_{A2430}$ | $R^{B1}$ | $R^{B1}$ | $R^{B6}$ | $R^{B1}$ | $R^{B6}$ | S |
| $L_{A2431}$ | $R^{B1}$ | $R^{B1}$ | $R^{B7}$ | $R^{B1}$ | $R^{B7}$ | S |
| $L_{A2432}$ | $R^{B1}$ | $R^{B1}$ | $R^{B8}$ | $R^{B1}$ | $R^{B8}$ | S |
| $L_{A2433}$ | $R^{B1}$ | $R^{B1}$ | $R^{B9}$ | $R^{B1}$ | $R^{B9}$ | S |
| $L_{A2434}$ | $R^{B1}$ | $R^{B1}$ | $R^{A2}$ | $R^{B1}$ | $R^{A2}$ | S |
| $L_{A2435}$ | $R^{B1}$ | $R^{B1}$ | $R^{A27}$ | $R^{B1}$ | $R^{A27}$ | S |
| $L_{A2436}$ | $R^{B1}$ | $R^{B1}$ | $R^{A34}$ | $R^{B1}$ | $R^{A34}$ | S |
| $L_{A2437}$ | $R^{B2}$ | $R^{B1}$ | $R^{B1}$ | $R^{B1}$ | $R^{B1}$ | S |
| $L_{A2438}$ | $R^{B2}$ | $R^{B1}$ | $R^{B2}$ | $R^{B1}$ | $R^{B2}$ | S |
| $L_{A2439}$ | $R^{B2}$ | $R^{B1}$ | $R^{B3}$ | $R^{B1}$ | $R^{B3}$ | S |
| $L_{A2440}$ | $R^{B2}$ | $R^{B1}$ | $R^{B4}$ | $R^{B1}$ | $R^{B4}$ | S |
| $L_{A2441}$ | $R^{B2}$ | $R^{B1}$ | $R^{B5}$ | $R^{B1}$ | $R^{B5}$ | S |
| $L_{A2442}$ | $R^{B2}$ | $R^{B1}$ | $R^{B6}$ | $R^{B1}$ | $R^{B6}$ | S |
| $L_{A2443}$ | $R^{B2}$ | $R^{B1}$ | $R^{B7}$ | $R^{B1}$ | $R^{B7}$ | S |
| $L_{A2444}$ | $R^{B2}$ | $R^{B1}$ | $R^{B8}$ | $R^{B1}$ | $R^{B8}$ | S |
| $L_{A2445}$ | $R^{B2}$ | $R^{B1}$ | $R^{B9}$ | $R^{B1}$ | $R^{B9}$ | S |
| $L_{A2446}$ | $R^{B2}$ | $R^{B1}$ | $R^{A2}$ | $R^{B1}$ | $R^{A2}$ | S |
| $L_{A2447}$ | $R^{B2}$ | $R^{B1}$ | $R^{A27}$ | $R^{B1}$ | $R^{A27}$ | S |
| $L_{A2448}$ | $R^{B2}$ | $R^{B1}$ | $R^{A34}$ | $R^{B1}$ | $R^{A34}$ | S |
| $L_{A2449}$ | $R^{B2}$ | F | $R^{B1}$ | $R^{B1}$ | $R^{B1}$ | S |
| $L_{A2450}$ | $R^{B2}$ | F | $R^{B2}$ | $R^{B1}$ | $R^{B2}$ | S |
| $L_{A2451}$ | $R^{B2}$ | F | $R^{B3}$ | $R^{B1}$ | $R^{B3}$ | S |
| $L_{A2452}$ | $R^{B2}$ | F | $R^{B4}$ | $R^{B1}$ | $R^{B4}$ | S |
| $L_{A2453}$ | $R^{B2}$ | F | $R^{B5}$ | $R^{B1}$ | $R^{B5}$ | S |
| $L_{A2454}$ | $R^{B2}$ | F | $R^{B6}$ | $R^{B1}$ | $R^{B6}$ | S |
| $L_{A2455}$ | $R^{B2}$ | F | $R^{B7}$ | $R^{B1}$ | $R^{B7}$ | S |
| $L_{A2456}$ | $R^{B2}$ | F | $R^{B8}$ | $R^{B1}$ | $R^{B8}$ | S |
| $L_{A2457}$ | $R^{B2}$ | F | $R^{B9}$ | $R^{B1}$ | $R^{B9}$ | S |
| $L_{A2458}$ | $R^{B2}$ | F | $R^{A2}$ | $R^{B1}$ | $R^{A2}$ | S |
| $L_{A2459}$ | $R^{B2}$ | F | $R^{A27}$ | $R^{B1}$ | $R^{A27}$ | S |
| $L_{A2460}$ | $R^{B2}$ | F | $R^{A34}$ | $R^{B1}$ | $R^{A34}$ | S |
| $L_{A2461}$ | $R^{B3}$ | $R^{B1}$ | $R^{B1}$ | $R^{B1}$ | $R^{B1}$ | S |
| $L_{A2462}$ | $R^{B3}$ | $R^{B1}$ | $R^{B2}$ | $R^{B1}$ | $R^{B2}$ | S |
| $L_{A2463}$ | $R^{B3}$ | $R^{B1}$ | $R^{B3}$ | $R^{B1}$ | $R^{B3}$ | S |
| $L_{A2464}$ | $R^{B3}$ | $R^{B1}$ | $R^{B4}$ | $R^{B1}$ | $R^{B4}$ | S |
| $L_{A2465}$ | $R^{B3}$ | $R^{B1}$ | $R^{B5}$ | $R^{B1}$ | $R^{B5}$ | S |
| $L_{A2466}$ | $R^{B3}$ | $R^{B1}$ | $R^{B6}$ | $R^{B1}$ | $R^{B6}$ | S |
| $L_{A2467}$ | $R^{B3}$ | $R^{B1}$ | $R^{B7}$ | $R^{B1}$ | $R^{B7}$ | S |
| $L_{A2468}$ | $R^{B3}$ | $R^{B1}$ | $R^{B8}$ | $R^{B1}$ | $R^{B8}$ | S |
| $L_{A2469}$ | $R^{B3}$ | $R^{B1}$ | $R^{B9}$ | $R^{B1}$ | $R^{B9}$ | S |
| $L_{A2470}$ | $R^{B3}$ | $R^{B1}$ | $R^{A2}$ | $R^{B1}$ | $R^{A2}$ | S |
| $L_{A2471}$ | $R^{B3}$ | $R^{B1}$ | $R^{A27}$ | $R^{B1}$ | $R^{A27}$ | S |
| $L_{A2472}$ | $R^{B3}$ | $R^{B1}$ | $R^{A34}$ | $R^{B1}$ | $R^{A34}$ | S |
| $L_{A2473}$ | $R^{B1}$ | $R^{B1}$ | $R^{B1}$ | $R^{B1}$ | $R^{B1}$ | S |
| $L_{A2474}$ | $R^{B1}$ | $R^{B1}$ | $R^{B1}$ | $R^{B2}$ | $R^{B2}$ | S |
| $L_{A2475}$ | $R^{B1}$ | $R^{B1}$ | $R^{B1}$ | $R^{B3}$ | $R^{B3}$ | S |
| $L_{A2476}$ | $R^{B1}$ | $R^{B1}$ | $R^{B1}$ | $R^{B4}$ | $R^{B4}$ | S |
| $L_{A2477}$ | $R^{B1}$ | $R^{B1}$ | $R^{B1}$ | $R^{B5}$ | $R^{B5}$ | S |
| $L_{A2478}$ | $R^{B1}$ | $R^{B1}$ | $R^{B1}$ | $R^{B6}$ | $R^{B6}$ | S |
| $L_{A2479}$ | $R^{B1}$ | $R^{B1}$ | $R^{B1}$ | $R^{B7}$ | $R^{B7}$ | S |
| $L_{A2480}$ | $R^{B1}$ | $R^{B1}$ | $R^{B1}$ | $R^{B8}$ | $R^{B8}$ | S |
| $L_{A2481}$ | $R^{B1}$ | $R^{B1}$ | $R^{B1}$ | $R^{B9}$ | $R^{B9}$ | S |
| $L_{A2482}$ | $R^{B1}$ | $R^{B1}$ | $R^{B1}$ | $R^{A2}$ | $R^{A2}$ | S |
| $L_{A2483}$ | $R^{B1}$ | $R^{B1}$ | $R^{B1}$ | $R^{A27}$ | $R^{A27}$ | S |
| $L_{A2484}$ | $R^{B1}$ | $R^{B1}$ | $R^{B1}$ | $R^{A34}$ | $R^{A34}$ | S |
| $L_{A2485}$ | $R^{B2}$ | $R^{B1}$ | $R^{B1}$ | $R^{B1}$ | $R^{B1}$ | S |
| $L_{A2486}$ | $R^{B2}$ | $R^{B1}$ | $R^{B1}$ | $R^{B2}$ | $R^{B2}$ | S |

-continued

| | $R^1$ | $R^2$ | $R^7$ | $R^8$ | $R^9$ | X |
|---|---|---|---|---|---|---|
| $L_{A2487}$ | $R^{B2}$ | $R^{B1}$ | $R^{B1}$ | $R^{B3}$ | $R^{B3}$ | S |
| $L_{A2488}$ | $R^{B2}$ | $R^{B1}$ | $R^{B1}$ | $R^{B4}$ | $R^{B4}$ | S |
| $L_{A2489}$ | $R^{B2}$ | $R^{B1}$ | $R^{B1}$ | $R^{B5}$ | $R^{B5}$ | S |
| $L_{A2490}$ | $R^{B2}$ | $R^{B1}$ | $R^{B1}$ | $R^{B6}$ | $R^{B6}$ | S |
| $L_{A2491}$ | $R^{B2}$ | $R^{B1}$ | $R^{B1}$ | $R^{B7}$ | $R^{B7}$ | S |
| $L_{A2492}$ | $R^{B2}$ | $R^{B1}$ | $R^{B1}$ | $R^{B8}$ | $R^{B8}$ | S |
| $L_{A2493}$ | $R^{B2}$ | $R^{B1}$ | $R^{B1}$ | $R^{B9}$ | $R^{B9}$ | S |
| $L_{A2494}$ | $R^{B2}$ | $R^{B1}$ | $R^{B1}$ | $R^{A2}$ | $R^{A2}$ | S |
| $L_{A2495}$ | $R^{B2}$ | $R^{B1}$ | $R^{B1}$ | $R^{A27}$ | $R^{A27}$ | S |
| $L_{A2496}$ | $R^{B2}$ | $R^{B1}$ | $R^{B1}$ | $R^{A34}$ | $R^{A34}$ | S |
| $L_{A2497}$ | $R^{B2}$ | F | $R^{B1}$ | $R^{B1}$ | $R^{B1}$ | S |
| $L_{A2498}$ | $R^{B2}$ | F | $R^{B1}$ | $R^{B2}$ | $R^{B2}$ | S |
| $L_{A2499}$ | $R^{B2}$ | F | $R^{B1}$ | $R^{B3}$ | $R^{B3}$ | S |
| $L_{A2500}$ | $R^{B2}$ | F | $R^{B1}$ | $R^{B4}$ | $R^{B4}$ | S |
| $L_{A2501}$ | $R^{B2}$ | F | $R^{B1}$ | $R^{B5}$ | $R^{B5}$ | S |
| $L_{A2502}$ | $R^{B2}$ | F | $R^{B1}$ | $R^{B6}$ | $R^{B6}$ | S |
| $L_{A2503}$ | $R^{B2}$ | F | $R^{B1}$ | $R^{B7}$ | $R^{B7}$ | S |
| $L_{A2504}$ | $R^{B2}$ | F | $R^{B1}$ | $R^{B8}$ | $R^{B8}$ | S |
| $L_{A2505}$ | $R^{B2}$ | F | $R^{B1}$ | $R^{B9}$ | $R^{B9}$ | S |
| $L_{A2506}$ | $R^{B2}$ | F | $R^{B1}$ | $R^{A2}$ | $R^{A2}$ | S |
| $L_{A2507}$ | $R^{B2}$ | F | $R^{B1}$ | $R^{A27}$ | $R^{A27}$ | S |
| $L_{A2508}$ | $R^{B2}$ | F | $R^{B1}$ | $R^{A34}$ | $R^{A34}$ | S |
| $L_{A2509}$ | $R^{B3}$ | $R^{B1}$ | $R^{B1}$ | $R^{B1}$ | $R^{B1}$ | S |
| $L_{A2510}$ | $R^{B3}$ | $R^{B1}$ | $R^{B1}$ | $R^{B2}$ | $R^{B2}$ | S |
| $L_{A2511}$ | $R^{B3}$ | $R^{B1}$ | $R^{B1}$ | $R^{B3}$ | $R^{B3}$ | S |
| $L_{A2512}$ | $R^{B3}$ | $R^{B1}$ | $R^{B1}$ | $R^{B4}$ | $R^{B4}$ | S |
| $L_{A2513}$ | $R^{B3}$ | $R^{B1}$ | $R^{B1}$ | $R^{B5}$ | $R^{B5}$ | S |
| $L_{A2514}$ | $R^{B3}$ | $R^{B1}$ | $R^{B1}$ | $R^{B6}$ | $R^{B6}$ | S |
| $L_{A2515}$ | $R^{B3}$ | $R^{B1}$ | $R^{B1}$ | $R^{B7}$ | $R^{B7}$ | S |
| $L_{A2516}$ | $R^{B3}$ | $R^{B1}$ | $R^{B1}$ | $R^{B8}$ | $R^{B8}$ | S |
| $L_{A2517}$ | $R^{B3}$ | $R^{B1}$ | $R^{B1}$ | $R^{B9}$ | $R^{B9}$ | S |
| $L_{A2518}$ | $R^{B3}$ | $R^{B1}$ | $R^{B1}$ | $R^{A2}$ | $R^{A2}$ | S |
| $L_{A2519}$ | $R^{B3}$ | $R^{B1}$ | $R^{B1}$ | $R^{A27}$ | $R^{A27}$ | S |
| $L_{A2520}$ | $R^{B3}$ | $R^{B1}$ | $R^{B1}$ | $R^{A34}$ | $R^{A34}$ | S |
| $L_{A2521}$ | $R^{B1}$ | $R^{B1}$ | $R^{B1}$ | $R^{B1}$ | $R^{B1}$ | S |
| $L_{A2522}$ | $R^{B1}$ | $R^{B1}$ | $R^{B2}$ | $R^{B2}$ | $R^{B1}$ | S |
| $L_{A2523}$ | $R^{B1}$ | $R^{B1}$ | $R^{B3}$ | $R^{B3}$ | $R^{B1}$ | S |
| $L_{A2524}$ | $R^{B1}$ | $R^{B1}$ | $R^{B4}$ | $R^{B4}$ | $R^{B1}$ | S |
| $L_{A2525}$ | $R^{B1}$ | $R^{B1}$ | $R^{B5}$ | $R^{B5}$ | $R^{B1}$ | S |
| $L_{A2526}$ | $R^{B1}$ | $R^{B1}$ | $R^{B6}$ | $R^{B6}$ | $R^{B1}$ | S |
| $L_{A2527}$ | $R^{B1}$ | $R^{B1}$ | $R^{B7}$ | $R^{B7}$ | $R^{B1}$ | S |
| $L_{A2528}$ | $R^{B1}$ | $R^{B1}$ | $R^{B8}$ | $R^{B8}$ | $R^{B1}$ | S |
| $L_{A2529}$ | $R^{B1}$ | $R^{B1}$ | $R^{B9}$ | $R^{B9}$ | $R^{B1}$ | S |
| $L_{A2530}$ | $R^{B1}$ | $R^{B1}$ | $R^{A2}$ | $R^{A2}$ | $R^{B1}$ | S |
| $L_{A2531}$ | $R^{B1}$ | $R^{B1}$ | $R^{A27}$ | $R^{A27}$ | $R^{B1}$ | S |
| $L_{A2532}$ | $R^{B1}$ | $R^{B1}$ | $R^{A34}$ | $R^{A34}$ | $R^{B1}$ | S |
| $L_{A2533}$ | $R^{B2}$ | $R^{B1}$ | $R^{B1}$ | $R^{B1}$ | $R^{B1}$ | S |
| $L_{A2534}$ | $R^{B2}$ | $R^{B1}$ | $R^{B2}$ | $R^{B2}$ | $R^{B1}$ | S |
| $L_{A2535}$ | $R^{B2}$ | $R^{B1}$ | $R^{B3}$ | $R^{B3}$ | $R^{B1}$ | S |
| $L_{A2536}$ | $R^{B2}$ | $R^{B1}$ | $R^{B4}$ | $R^{B4}$ | $R^{B1}$ | S |
| $L_{A2537}$ | $R^{B2}$ | $R^{B1}$ | $R^{B5}$ | $R^{B5}$ | $R^{B1}$ | S |
| $L_{A2538}$ | $R^{B2}$ | $R^{B1}$ | $R^{B6}$ | $R^{B6}$ | $R^{B1}$ | S |
| $L_{A2539}$ | $R^{B2}$ | $R^{B1}$ | $R^{B7}$ | $R^{B7}$ | $R^{B1}$ | S |
| $L_{A2540}$ | $R^{B2}$ | $R^{B1}$ | $R^{B8}$ | $R^{B8}$ | $R^{B1}$ | S |
| $L_{A2541}$ | $R^{B2}$ | $R^{B1}$ | $R^{B9}$ | $R^{B9}$ | $R^{B1}$ | S |
| $L_{A2542}$ | $R^{B2}$ | $R^{B1}$ | $R^{A2}$ | $R^{A2}$ | $R^{B1}$ | S |
| $L_{A2543}$ | $R^{B2}$ | $R^{B1}$ | $R^{A27}$ | $R^{A27}$ | $R^{B1}$ | S |
| $L_{A2544}$ | $R^{B2}$ | $R^{B1}$ | $R^{A34}$ | $R^{A34}$ | $R^{B1}$ | S |
| $L_{A2545}$ | $R^{B2}$ | F | $R^{B1}$ | $R^{B1}$ | $R^{B1}$ | S |
| $L_{A2546}$ | $R^{B2}$ | F | $R^{B2}$ | $R^{B2}$ | $R^{B1}$ | S |
| $L_{A2547}$ | $R^{B2}$ | F | $R^{B3}$ | $R^{B3}$ | $R^{B1}$ | S |
| $L_{A2548}$ | $R^{B2}$ | F | $R^{B4}$ | $R^{B4}$ | $R^{B1}$ | S |
| $L_{A2549}$ | $R^{B2}$ | F | $R^{B5}$ | $R^{B5}$ | $R^{B1}$ | S |
| $L_{A2550}$ | $R^{B2}$ | F | $R^{B6}$ | $R^{B6}$ | $R^{B1}$ | S |
| $L_{A2551}$ | $R^{B2}$ | F | $R^{B7}$ | $R^{B7}$ | $R^{B1}$ | S |
| $L_{A2552}$ | $R^{B2}$ | F | $R^{B8}$ | $R^{B8}$ | $R^{B1}$ | S |
| $L_{A2553}$ | $R^{B2}$ | F | $R^{B9}$ | $R^{B9}$ | $R^{B1}$ | S |
| $L_{A2554}$ | $R^{B2}$ | F | $R^{A2}$ | $R^{A2}$ | $R^{B1}$ | S |
| $L_{A2555}$ | $R^{B2}$ | F | $R^{A27}$ | $R^{A27}$ | $R^{B1}$ | S |
| $L_{A2556}$ | $R^{B2}$ | F | $R^{A34}$ | $R^{A34}$ | $R^{B1}$ | S |
| $L_{A2557}$ | $R^{B3}$ | $R^{B1}$ | $R^{B1}$ | $R^{B1}$ | $R^{B1}$ | S |
| $L_{A2558}$ | $R^{B3}$ | $R^{B1}$ | $R^{B2}$ | $R^{B2}$ | $R^{B1}$ | S |
| $L_{A2559}$ | $R^{B3}$ | $R^{B1}$ | $R^{B3}$ | $R^{B3}$ | $R^{B1}$ | S |
| $L_{A2560}$ | $R^{B3}$ | $R^{B1}$ | $R^{B4}$ | $R^{B4}$ | $R^{B1}$ | S |
| $L_{A2561}$ | $R^{B3}$ | $R^{B1}$ | $R^{B5}$ | $R^{B5}$ | $R^{B1}$ | S |
| $L_{A2562}$ | $R^{B3}$ | $R^{B1}$ | $R^{B6}$ | $R^{B6}$ | $R^{B1}$ | S |
| $L_{A2563}$ | $R^{B3}$ | $R^{B1}$ | $R^{B7}$ | $R^{B7}$ | $R^{B1}$ | S |

-continued

| | $R^1$ | $R^2$ | $R^7$ | $R^8$ | $R^9$ | X |
|---|---|---|---|---|---|---|
| $L_{A2564}$ | $R^{B3}$ | $R^{B1}$ | $R^{B8}$ | $R^{B8}$ | $R^{B1}$ | S |
| $L_{A2565}$ | $R^{B3}$ | $R^{B1}$ | $R^{B9}$ | $R^{B9}$ | $R^{B1}$ | S |
| $L_{A2566}$ | $R^{B3}$ | $R^{B1}$ | $R^{A2}$ | $R^{A2}$ | $R^{B1}$ | S |
| $L_{A2567}$ | $R^{B3}$ | $R^{B1}$ | $R^{A27}$ | $R^{A27}$ | $R^{B1}$ | S |
| $L_{A2568}$ | $R^{B3}$ | $R^{B1}$ | $R^{A34}$ | $R^{A34}$ | $R^{B1}$ | S |
| $L_{A2569}$ | $R^{B1}$ | $R^{B1}$ | $R^{B1}$ | $R^{B1}$ | $R^{B1}$ | O |
| $L_{A2570}$ | $R^{B1}$ | $R^{B1}$ | $R^{B1}$ | $R^{B1}$ | $R^{B2}$ | O |
| $L_{A2571}$ | $R^{B1}$ | $R^{B1}$ | $R^{B1}$ | $R^{B1}$ | $R^{B3}$ | O |
| $L_{A2572}$ | $R^{B1}$ | $R^{B1}$ | $R^{B1}$ | $R^{B1}$ | $R^{B4}$ | O |
| $L_{A2573}$ | $R^{B1}$ | $R^{B1}$ | $R^{B1}$ | $R^{B1}$ | $R^{B5}$ | O |
| $L_{A2574}$ | $R^{B1}$ | $R^{B1}$ | $R^{B1}$ | $R^{B1}$ | $R^{B6}$ | O |
| $L_{A2575}$ | $R^{B1}$ | $R^{B1}$ | $R^{B1}$ | $R^{B1}$ | $R^{B7}$ | O |
| $L_{A2576}$ | $R^{B1}$ | $R^{B1}$ | $R^{B1}$ | $R^{B1}$ | $R^{B8}$ | O |
| $L_{A2577}$ | $R^{B1}$ | $R^{B1}$ | $R^{B1}$ | $R^{B1}$ | $R^{B9}$ | O |
| $L_{A2578}$ | $R^{B1}$ | $R^{B1}$ | $R^{B1}$ | $R^{B1}$ | $R^{A2}$ | O |
| $L_{A2579}$ | $R^{B1}$ | $R^{B1}$ | $R^{B1}$ | $R^{B1}$ | $R^{A27}$ | O |
| $L_{A2580}$ | $R^{B1}$ | $R^{B1}$ | $R^{B1}$ | $R^{B1}$ | $R^{A34}$ | O |
| $L_{A2581}$ | $R^{B2}$ | $R^{B1}$ | $R^{B1}$ | $R^{B1}$ | $R^{B1}$ | O |
| $L_{A2582}$ | $R^{B2}$ | $R^{B1}$ | $R^{B1}$ | $R^{B1}$ | $R^{B2}$ | O |
| $L_{A2583}$ | $R^{B2}$ | $R^{B1}$ | $R^{B1}$ | $R^{B1}$ | $R^{B3}$ | O |
| $L_{A2584}$ | $R^{B2}$ | $R^{B1}$ | $R^{B1}$ | $R^{B1}$ | $R^{B4}$ | O |
| $L_{A2585}$ | $R^{B2}$ | $R^{B1}$ | $R^{B1}$ | $R^{B1}$ | $R^{B5}$ | O |
| $L_{A2586}$ | $R^{B2}$ | $R^{B1}$ | $R^{B1}$ | $R^{B1}$ | $R^{B6}$ | O |
| $L_{A2587}$ | $R^{B2}$ | $R^{B1}$ | $R^{B1}$ | $R^{B1}$ | $R^{B7}$ | O |
| $L_{A2588}$ | $R^{B2}$ | $R^{B1}$ | $R^{B1}$ | $R^{B1}$ | $R^{B8}$ | O |
| $L_{A2589}$ | $R^{B2}$ | $R^{B1}$ | $R^{B1}$ | $R^{B1}$ | $R^{B9}$ | O |
| $L_{A2590}$ | $R^{B2}$ | $R^{B1}$ | $R^{B1}$ | $R^{B1}$ | $R^{A2}$ | O |
| $L_{A2591}$ | $R^{B2}$ | $R^{B1}$ | $R^{B1}$ | $R^{B1}$ | $R^{A27}$ | O |
| $L_{A2592}$ | $R^{B2}$ | $R^{B1}$ | $R^{B1}$ | $R^{B1}$ | $R^{A34}$ | O |
| $L_{A2593}$ | $R^{B2}$ | F | $R^{B1}$ | $R^{B1}$ | $R^{B1}$ | O |
| $L_{A2594}$ | $R^{B2}$ | F | $R^{B1}$ | $R^{B1}$ | $R^{B2}$ | O |
| $L_{A2595}$ | $R^{B2}$ | F | $R^{B1}$ | $R^{B1}$ | $R^{B3}$ | O |
| $L_{A2596}$ | $R^{B2}$ | F | $R^{B1}$ | $R^{B1}$ | $R^{B4}$ | O |
| $L_{A2597}$ | $R^{B2}$ | F | $R^{B1}$ | $R^{B1}$ | $R^{B5}$ | O |
| $L_{A2598}$ | $R^{B2}$ | F | $R^{B1}$ | $R^{B1}$ | $R^{B6}$ | O |
| $L_{A2599}$ | $R^{B2}$ | F | $R^{B1}$ | $R^{B1}$ | $R^{B7}$ | O |
| $L_{A2600}$ | $R^{B2}$ | F | $R^{B1}$ | $R^{B1}$ | $R^{B8}$ | O |
| $L_{A2601}$ | $R^{B2}$ | F | $R^{B1}$ | $R^{B1}$ | $R^{B9}$ | O |
| $L_{A2602}$ | $R^{B2}$ | F | $R^{B1}$ | $R^{B1}$ | $R^{A2}$ | O |
| $L_{A2603}$ | $R^{B2}$ | F | $R^{B1}$ | $R^{B1}$ | $R^{A27}$ | O |
| $L_{A2604}$ | $R^{B2}$ | F | $R^{B1}$ | $R^{B1}$ | $R^{A34}$ | O |
| $L_{A2605}$ | $R^{B3}$ | $R^{B1}$ | $R^{B1}$ | $R^{B1}$ | $R^{B1}$ | O |
| $L_{A2606}$ | $R^{B3}$ | $R^{B1}$ | $R^{B1}$ | $R^{B1}$ | $R^{B2}$ | O |
| $L_{A2607}$ | $R^{B3}$ | $R^{B1}$ | $R^{B1}$ | $R^{B1}$ | $R^{B3}$ | O |
| $L_{A2608}$ | $R^{B3}$ | $R^{B1}$ | $R^{B1}$ | $R^{B1}$ | $R^{B4}$ | O |
| $L_{A2609}$ | $R^{B3}$ | $R^{B1}$ | $R^{B1}$ | $R^{B1}$ | $R^{B5}$ | O |
| $L_{A2610}$ | $R^{B3}$ | $R^{B1}$ | $R^{B1}$ | $R^{B1}$ | $R^{B6}$ | O |
| $L_{A2611}$ | $R^{B3}$ | $R^{B1}$ | $R^{B1}$ | $R^{B1}$ | $R^{B7}$ | O |
| $L_{A2612}$ | $R^{B3}$ | $R^{B1}$ | $R^{B1}$ | $R^{B1}$ | $R^{B8}$ | O |
| $L_{A2613}$ | $R^{B3}$ | $R^{B1}$ | $R^{B1}$ | $R^{B1}$ | $R^{B9}$ | O |
| $L_{A2614}$ | $R^{B3}$ | $R^{B1}$ | $R^{B1}$ | $R^{B1}$ | $R^{A2}$ | O |
| $L_{A2615}$ | $R^{B3}$ | $R^{B1}$ | $R^{B1}$ | $R^{B1}$ | $R^{A27}$ | O |
| $L_{A2616}$ | $R^{B3}$ | $R^{B1}$ | $R^{B1}$ | $R^{B1}$ | $R^{A34}$ | O |
| $L_{A2617}$ | $R^{B1}$ | $R^{B1}$ | $R^{B1}$ | $R^{B1}$ | $R^{B1}$ | O |
| $L_{A2618}$ | $R^{B1}$ | $R^{B1}$ | $R^{B1}$ | $R^{B2}$ | $R^{B1}$ | O |
| $L_{A2619}$ | $R^{B1}$ | $R^{B1}$ | $R^{B1}$ | $R^{B3}$ | $R^{B1}$ | O |
| $L_{A2620}$ | $R^{B1}$ | $R^{B1}$ | $R^{B1}$ | $R^{B4}$ | $R^{B1}$ | O |
| $L_{A2621}$ | $R^{B1}$ | $R^{B1}$ | $R^{B1}$ | $R^{B5}$ | $R^{B1}$ | O |
| $L_{A2622}$ | $R^{B1}$ | $R^{B1}$ | $R^{B1}$ | $R^{B6}$ | $R^{B1}$ | O |
| $L_{A2623}$ | $R^{B1}$ | $R^{B1}$ | $R^{B1}$ | $R^{B7}$ | $R^{B1}$ | O |
| $L_{A2624}$ | $R^{B1}$ | $R^{B1}$ | $R^{B1}$ | $R^{B8}$ | $R^{B1}$ | O |
| $L_{A2625}$ | $R^{B1}$ | $R^{B1}$ | $R^{B1}$ | $R^{B9}$ | $R^{B1}$ | O |
| $L_{A2626}$ | $R^{B1}$ | $R^{B1}$ | $R^{B1}$ | $R^{A2}$ | $R^{B1}$ | O |
| $L_{A2627}$ | $R^{B1}$ | $R^{B1}$ | $R^{B1}$ | $R^{A27}$ | $R^{B1}$ | O |
| $L_{A2628}$ | $R^{B1}$ | $R^{B1}$ | $R^{B1}$ | $R^{A34}$ | $R^{B1}$ | O |
| $L_{A2629}$ | $R^{B2}$ | $R^{B1}$ | $R^{B1}$ | $R^{B1}$ | $R^{B1}$ | O |
| $L_{A2630}$ | $R^{B2}$ | $R^{B1}$ | $R^{B1}$ | $R^{B2}$ | $R^{B1}$ | O |
| $L_{A2631}$ | $R^{B2}$ | $R^{B1}$ | $R^{B1}$ | $R^{B3}$ | $R^{B1}$ | O |
| $L_{A2632}$ | $R^{B2}$ | $R^{B1}$ | $R^{B1}$ | $R^{B4}$ | $R^{B1}$ | O |
| $L_{A2633}$ | $R^{B2}$ | $R^{B1}$ | $R^{B1}$ | $R^{B5}$ | $R^{B1}$ | O |
| $L_{A2634}$ | $R^{B2}$ | $R^{B1}$ | $R^{B1}$ | $R^{B6}$ | $R^{B1}$ | O |
| $L_{A2635}$ | $R^{B2}$ | $R^{B1}$ | $R^{B1}$ | $R^{B7}$ | $R^{B1}$ | O |
| $L_{A2636}$ | $R^{B2}$ | $R^{B1}$ | $R^{B1}$ | $R^{B8}$ | $R^{B1}$ | O |
| $L_{A2637}$ | $R^{B2}$ | $R^{B1}$ | $R^{B1}$ | $R^{B9}$ | $R^{B1}$ | O |
| $L_{A2638}$ | $R^{B2}$ | $R^{B1}$ | $R^{B1}$ | $R^{A2}$ | $R^{B1}$ | O |
| $L_{A2639}$ | $R^{B2}$ | $R^{B1}$ | $R^{B1}$ | $R^{A27}$ | $R^{B1}$ | O |
| $L_{A2640}$ | $R^{B2}$ | $R^{B1}$ | $R^{B1}$ | $R^{A34}$ | $R^{B1}$ | O |

-continued

| | $R^1$ | $R^2$ | $R^7$ | $R^8$ | $R^9$ | X |
|---|---|---|---|---|---|---|
| $L_{A2641}$ | $R^{B2}$ | F | $R^{B1}$ | $R^{B1}$ | $R^{B1}$ | O |
| $L_{A2642}$ | $R^{B2}$ | F | $R^{B1}$ | $R^{B2}$ | $R^{B1}$ | O |
| $L_{A2643}$ | $R^{B2}$ | F | $R^{B1}$ | $R^{B3}$ | $R^{B1}$ | O |
| $L_{A2644}$ | $R^{B2}$ | F | $R^{B1}$ | $R^{B4}$ | $R^{B1}$ | O |
| $L_{A2645}$ | $R^{B2}$ | F | $R^{B1}$ | $R^{B5}$ | $R^{B1}$ | O |
| $L_{A2646}$ | $R^{B2}$ | F | $R^{B1}$ | $R^{B6}$ | $R^{B1}$ | O |
| $L_{A2647}$ | $R^{B2}$ | F | $R^{B1}$ | $R^{B7}$ | $R^{B1}$ | O |
| $L_{A2648}$ | $R^{B2}$ | F | $R^{B1}$ | $R^{B8}$ | $R^{B1}$ | O |
| $L_{A2649}$ | $R^{B2}$ | F | $R^{B1}$ | $R^{B9}$ | $R^{B1}$ | O |
| $L_{A2650}$ | $R^{B2}$ | F | $R^{B1}$ | $R^{A2}$ | $R^{B1}$ | O |
| $L_{A2651}$ | $R^{B2}$ | F | $R^{B1}$ | $R^{A27}$ | $R^{B1}$ | O |
| $L_{A2652}$ | $R^{B2}$ | F | $R^{B1}$ | $R^{A34}$ | $R^{B1}$ | O |
| $L_{A2653}$ | $R^{B3}$ | $R^{B1}$ | $R^{B1}$ | $R^{B1}$ | $R^{B1}$ | O |
| $L_{A2654}$ | $R^{B3}$ | $R^{B1}$ | $R^{B1}$ | $R^{B2}$ | $R^{B1}$ | O |
| $L_{A2655}$ | $R^{B3}$ | $R^{B1}$ | $R^{B1}$ | $R^{B3}$ | $R^{B1}$ | O |
| $L_{A2656}$ | $R^{B3}$ | $R^{B1}$ | $R^{B1}$ | $R^{B4}$ | $R^{B1}$ | O |
| $L_{A2657}$ | $R^{B3}$ | $R^{B1}$ | $R^{B1}$ | $R^{B5}$ | $R^{B1}$ | O |
| $L_{A2658}$ | $R^{B3}$ | $R^{B1}$ | $R^{B1}$ | $R^{B6}$ | $R^{B1}$ | O |
| $L_{A2659}$ | $R^{B3}$ | $R^{B1}$ | $R^{B1}$ | $R^{B7}$ | $R^{B1}$ | O |
| $L_{A2660}$ | $R^{B3}$ | $R^{B1}$ | $R^{B1}$ | $R^{B8}$ | $R^{B1}$ | O |
| $L_{A2661}$ | $R^{B3}$ | $R^{B1}$ | $R^{B1}$ | $R^{B9}$ | $R^{B1}$ | O |
| $L_{A2662}$ | $R^{B3}$ | $R^{B1}$ | $R^{B1}$ | $R^{A2}$ | $R^{B1}$ | O |
| $L_{A2663}$ | $R^{B3}$ | $R^{B1}$ | $R^{B1}$ | $R^{A27}$ | $R^{B1}$ | O |
| $L_{A2664}$ | $R^{B3}$ | $R^{B1}$ | $R^{B1}$ | $R^{A34}$ | $R^{B1}$ | O |
| $L_{A2665}$ | $R^{B1}$ | $R^{B1}$ | $R^{B1}$ | $R^{B1}$ | $R^{B1}$ | O |
| $L_{A2666}$ | $R^{B1}$ | $R^{B1}$ | $R^{B2}$ | $R^{B1}$ | $R^{B1}$ | O |
| $L_{A2667}$ | $R^{B1}$ | $R^{B1}$ | $R^{B3}$ | $R^{B1}$ | $R^{B1}$ | O |
| $L_{A2668}$ | $R^{B1}$ | $R^{B1}$ | $R^{B4}$ | $R^{B1}$ | $R^{B1}$ | O |
| $L_{A2669}$ | $R^{B1}$ | $R^{B1}$ | $R^{B5}$ | $R^{B1}$ | $R^{B1}$ | O |
| $L_{A2670}$ | $R^{B1}$ | $R^{B1}$ | $R^{B6}$ | $R^{B1}$ | $R^{B1}$ | O |
| $L_{A2671}$ | $R^{B1}$ | $R^{B1}$ | $R^{B7}$ | $R^{B1}$ | $R^{B1}$ | O |
| $L_{A2672}$ | $R^{B1}$ | $R^{B1}$ | $R^{B8}$ | $R^{B1}$ | $R^{B1}$ | O |
| $L_{A2673}$ | $R^{B1}$ | $R^{B1}$ | $R^{B9}$ | $R^{B1}$ | $R^{B1}$ | O |
| $L_{A2674}$ | $R^{B1}$ | $R^{B1}$ | $R^{A2}$ | $R^{B1}$ | $R^{B1}$ | O |
| $L_{A2675}$ | $R^{B1}$ | $R^{B1}$ | $R^{A27}$ | $R^{B1}$ | $R^{B1}$ | O |
| $L_{A2676}$ | $R^{B1}$ | $R^{B1}$ | $R^{A34}$ | $R^{B1}$ | $R^{B1}$ | O |
| $L_{A2677}$ | $R^{B2}$ | $R^{B1}$ | $R^{B1}$ | $R^{B1}$ | $R^{B1}$ | O |
| $L_{A2678}$ | $R^{B2}$ | $R^{B1}$ | $R^{B2}$ | $R^{B1}$ | $R^{B1}$ | O |
| $L_{A2679}$ | $R^{B2}$ | $R^{B1}$ | $R^{B3}$ | $R^{B1}$ | $R^{B1}$ | O |
| $L_{A2680}$ | $R^{B2}$ | $R^{B1}$ | $R^{B4}$ | $R^{B1}$ | $R^{B1}$ | O |
| $L_{A2681}$ | $R^{B2}$ | $R^{B1}$ | $R^{B5}$ | $R^{B1}$ | $R^{B1}$ | O |
| $L_{A2682}$ | $R^{B2}$ | $R^{B1}$ | $R^{B6}$ | $R^{B1}$ | $R^{B1}$ | O |
| $L_{A2683}$ | $R^{B2}$ | $R^{B1}$ | $R^{B7}$ | $R^{B1}$ | $R^{B1}$ | O |
| $L_{A2684}$ | $R^{B2}$ | $R^{B1}$ | $R^{B8}$ | $R^{B1}$ | $R^{B1}$ | O |
| $L_{A2685}$ | $R^{B2}$ | $R^{B1}$ | $R^{B9}$ | $R^{B1}$ | $R^{B1}$ | O |
| $L_{A2686}$ | $R^{B2}$ | $R^{B1}$ | $R^{A2}$ | $R^{B1}$ | $R^{B1}$ | O |
| $L_{A2687}$ | $R^{B2}$ | $R^{B1}$ | $R^{A27}$ | $R^{B1}$ | $R^{B1}$ | O |
| $L_{A2688}$ | $R^{B2}$ | $R^{B1}$ | $R^{A34}$ | $R^{B1}$ | $R^{B1}$ | O |
| $L_{A2689}$ | $R^{B2}$ | F | $R^{B1}$ | $R^{B1}$ | $R^{B1}$ | O |
| $L_{A2690}$ | $R^{B2}$ | F | $R^{B2}$ | $R^{B1}$ | $R^{B1}$ | O |
| $L_{A2691}$ | $R^{B2}$ | F | $R^{B3}$ | $R^{B1}$ | $R^{B1}$ | O |
| $L_{A2692}$ | $R^{B2}$ | F | $R^{B4}$ | $R^{B1}$ | $R^{B1}$ | O |
| $L_{A2693}$ | $R^{B2}$ | F | $R^{B5}$ | $R^{B1}$ | $R^{B1}$ | O |
| $L_{A2694}$ | $R^{B2}$ | F | $R^{B6}$ | $R^{B1}$ | $R^{B1}$ | O |
| $L_{A2695}$ | $R^{B2}$ | F | $R^{B7}$ | $R^{B1}$ | $R^{B1}$ | O |
| $L_{A2696}$ | $R^{B2}$ | F | $R^{B8}$ | $R^{B1}$ | $R^{B1}$ | O |
| $L_{A2697}$ | $R^{B2}$ | F | $R^{B9}$ | $R^{B1}$ | $R^{B1}$ | O |
| $L_{A2698}$ | $R^{B2}$ | F | $R^{A2}$ | $R^{B1}$ | $R^{B1}$ | O |
| $L_{A2699}$ | $R^{B2}$ | F | $R^{A27}$ | $R^{B1}$ | $R^{B1}$ | O |
| $L_{A2700}$ | $R^{B2}$ | F | $R^{A34}$ | $R^{B1}$ | $R^{B1}$ | O |
| $L_{A2701}$ | $R^{B3}$ | $R^{B1}$ | $R^{B1}$ | $R^{B1}$ | $R^{B1}$ | O |
| $L_{A2702}$ | $R^{B3}$ | $R^{B1}$ | $R^{B2}$ | $R^{B1}$ | $R^{B1}$ | O |
| $L_{A2703}$ | $R^{B3}$ | $R^{B1}$ | $R^{B3}$ | $R^{B1}$ | $R^{B1}$ | O |
| $L_{A2704}$ | $R^{B3}$ | $R^{B1}$ | $R^{B4}$ | $R^{B1}$ | $R^{B1}$ | O |
| $L_{A2705}$ | $R^{B3}$ | $R^{B1}$ | $R^{B5}$ | $R^{B1}$ | $R^{B1}$ | O |
| $L_{A2706}$ | $R^{B3}$ | $R^{B1}$ | $R^{B6}$ | $R^{B1}$ | $R^{B1}$ | O |
| $L_{A2707}$ | $R^{B3}$ | $R^{B1}$ | $R^{B7}$ | $R^{B1}$ | $R^{B1}$ | O |
| $L_{A2708}$ | $R^{B3}$ | $R^{B1}$ | $R^{B8}$ | $R^{B1}$ | $R^{B1}$ | O |
| $L_{A2709}$ | $R^{B3}$ | $R^{B1}$ | $R^{B9}$ | $R^{B1}$ | $R^{B1}$ | O |
| $L_{A2710}$ | $R^{B3}$ | $R^{B1}$ | $R^{A2}$ | $R^{B1}$ | $R^{B1}$ | O |
| $L_{A2711}$ | $R^{B3}$ | $R^{B1}$ | $R^{A27}$ | $R^{B1}$ | $R^{B1}$ | O |
| $L_{A2712}$ | $R^{B3}$ | $R^{B1}$ | $R^{A34}$ | $R^{B1}$ | $R^{B1}$ | O |
| $L_{A2713}$ | $R^{B1}$ | $R^{B1}$ | $R^{B1}$ | $R^{B1}$ | $R^{B1}$ | O |
| $L_{A2714}$ | $R^{B1}$ | $R^{B1}$ | $R^{B2}$ | $R^{B1}$ | $R^{B2}$ | O |
| $L_{A2715}$ | $R^{B1}$ | $R^{B1}$ | $R^{B3}$ | $R^{B1}$ | $R^{B3}$ | O |
| $L_{A2716}$ | $R^{B1}$ | $R^{B1}$ | $R^{B4}$ | $R^{B1}$ | $R^{B4}$ | O |
| $L_{A2717}$ | $R^{B1}$ | $R^{B1}$ | $R^{B5}$ | $R^{B1}$ | $R^{B5}$ | O |

-continued

| | $R^1$ | $R^2$ | $R^7$ | $R^8$ | $R^9$ | X |
|---|---|---|---|---|---|---|
| $L_{A2718}$ | $R^{B1}$ | $R^{B1}$ | $R^{B6}$ | $R^{B1}$ | $R^{B6}$ | O |
| $L_{A2719}$ | $R^{B1}$ | $R^{B1}$ | $R^{B7}$ | $R^{B1}$ | $R^{B7}$ | O |
| $L_{A2720}$ | $R^{B1}$ | $R^{B1}$ | $R^{B8}$ | $R^{B1}$ | $R^{B8}$ | O |
| $L_{A2721}$ | $R^{B1}$ | $R^{B1}$ | $R^{B9}$ | $R^{B1}$ | $R^{B9}$ | O |
| $L_{A2722}$ | $R^{B1}$ | $R^{B1}$ | $R^{A2}$ | $R^{B1}$ | $R^{A2}$ | O |
| $L_{A2723}$ | $R^{B1}$ | $R^{B1}$ | $R^{A27}$ | $R^{B1}$ | $R^{A27}$ | O |
| $L_{A2724}$ | $R^{B1}$ | $R^{B1}$ | $R^{A34}$ | $R^{B1}$ | $R^{A34}$ | O |
| $L_{A2725}$ | $R^{B2}$ | $R^{B1}$ | $R^{B1}$ | $R^{B1}$ | $R^{B1}$ | O |
| $L_{A2726}$ | $R^{B2}$ | $R^{B1}$ | $R^{B2}$ | $R^{B1}$ | $R^{B2}$ | O |
| $L_{A2727}$ | $R^{B2}$ | $R^{B1}$ | $R^{B3}$ | $R^{B1}$ | $R^{B3}$ | O |
| $L_{A2728}$ | $R^{B2}$ | $R^{B1}$ | $R^{B4}$ | $R^{B1}$ | $R^{B4}$ | O |
| $L_{A2729}$ | $R^{B2}$ | $R^{B1}$ | $R^{B5}$ | $R^{B1}$ | $R^{B5}$ | O |
| $L_{A2730}$ | $R^{B2}$ | $R^{B1}$ | $R^{B6}$ | $R^{B1}$ | $R^{B6}$ | O |
| $L_{A2731}$ | $R^{B2}$ | $R^{B1}$ | $R^{B7}$ | $R^{B1}$ | $R^{B7}$ | O |
| $L_{A2732}$ | $R^{B2}$ | $R^{B1}$ | $R^{B8}$ | $R^{B1}$ | $R^{B8}$ | O |
| $L_{A2733}$ | $R^{B2}$ | $R^{B1}$ | $R^{B9}$ | $R^{B1}$ | $R^{B9}$ | O |
| $L_{A2734}$ | $R^{B2}$ | $R^{B1}$ | $R^{A2}$ | $R^{B1}$ | $R^{A2}$ | O |
| $L_{A2735}$ | $R^{B2}$ | $R^{B1}$ | $R^{A27}$ | $R^{B1}$ | $R^{A27}$ | O |
| $L_{A2736}$ | $R^{B2}$ | $R^{B1}$ | $R^{A34}$ | $R^{B1}$ | $R^{A34}$ | O |
| $L_{A2737}$ | $R^{B2}$ | F | $R^{B1}$ | $R^{B1}$ | $R^{B1}$ | O |
| $L_{A2738}$ | $R^{B2}$ | F | $R^{B2}$ | $R^{B1}$ | $R^{B2}$ | O |
| $L_{A2739}$ | $R^{B2}$ | F | $R^{B3}$ | $R^{B1}$ | $R^{B3}$ | O |
| $L_{A2740}$ | $R^{B2}$ | F | $R^{B4}$ | $R^{B1}$ | $R^{B4}$ | O |
| $L_{A2741}$ | $R^{B2}$ | F | $R^{B5}$ | $R^{B1}$ | $R^{B5}$ | O |
| $L_{A2742}$ | $R^{B2}$ | F | $R^{B6}$ | $R^{B1}$ | $R^{B6}$ | O |
| $L_{A2743}$ | $R^{B2}$ | F | $R^{B7}$ | $R^{B1}$ | $R^{B7}$ | O |
| $L_{A2744}$ | $R^{B2}$ | F | $R^{B8}$ | $R^{B1}$ | $R^{B8}$ | O |
| $L_{A2745}$ | $R^{B2}$ | F | $R^{B9}$ | $R^{B1}$ | $R^{B9}$ | O |
| $L_{A2746}$ | $R^{B2}$ | F | $R^{A2}$ | $R^{B1}$ | $R^{A2}$ | O |
| $L_{A2747}$ | $R^{B2}$ | F | $R^{A27}$ | $R^{B1}$ | $R^{A27}$ | O |
| $L_{A2748}$ | $R^{B2}$ | F | $R^{A34}$ | $R^{B1}$ | $R^{A34}$ | O |
| $L_{A2749}$ | $R^{B3}$ | $R^{B1}$ | $R^{B1}$ | $R^{B1}$ | $R^{B1}$ | O |
| $L_{A2750}$ | $R^{B3}$ | $R^{B1}$ | $R^{B2}$ | $R^{B1}$ | $R^{B2}$ | O |
| $L_{A2751}$ | $R^{B3}$ | $R^{B1}$ | $R^{B3}$ | $R^{B1}$ | $R^{B3}$ | O |
| $L_{A2752}$ | $R^{B3}$ | $R^{B1}$ | $R^{B4}$ | $R^{B1}$ | $R^{B4}$ | O |
| $L_{A2753}$ | $R^{B3}$ | $R^{B1}$ | $R^{B5}$ | $R^{B1}$ | $R^{B5}$ | O |
| $L_{A2754}$ | $R^{B3}$ | $R^{B1}$ | $R^{B6}$ | $R^{B1}$ | $R^{B6}$ | O |
| $L_{A2755}$ | $R^{B3}$ | $R^{B1}$ | $R^{B7}$ | $R^{B1}$ | $R^{B7}$ | O |
| $L_{A2756}$ | $R^{B3}$ | $R^{B1}$ | $R^{B8}$ | $R^{B1}$ | $R^{B8}$ | O |
| $L_{A2757}$ | $R^{B3}$ | $R^{B1}$ | $R^{B9}$ | $R^{B1}$ | $R^{B9}$ | O |
| $L_{A2758}$ | $R^{B3}$ | $R^{B1}$ | $R^{A2}$ | $R^{B1}$ | $R^{A2}$ | O |
| $L_{A2759}$ | $R^{B3}$ | $R^{B1}$ | $R^{A27}$ | $R^{B1}$ | $R^{A27}$ | O |
| $L_{A2760}$ | $R^{B3}$ | $R^{B1}$ | $R^{A34}$ | $R^{B1}$ | $R^{A34}$ | O |
| $L_{A2761}$ | $R^{B1}$ | $R^{B1}$ | $R^{B1}$ | $R^{B1}$ | $R^{B1}$ | O |
| $L_{A2762}$ | $R^{B1}$ | $R^{B1}$ | $R^{B1}$ | $R^{B2}$ | $R^{B2}$ | O |
| $L_{A2763}$ | $R^{B1}$ | $R^{B1}$ | $R^{B1}$ | $R^{B3}$ | $R^{B3}$ | O |
| $L_{A2764}$ | $R^{B1}$ | $R^{B1}$ | $R^{B1}$ | $R^{B4}$ | $R^{B4}$ | O |
| $L_{A2765}$ | $R^{B1}$ | $R^{B1}$ | $R^{B1}$ | $R^{B5}$ | $R^{B5}$ | O |
| $L_{A2766}$ | $R^{B1}$ | $R^{B1}$ | $R^{B1}$ | $R^{B6}$ | $R^{B6}$ | O |
| $L_{A2767}$ | $R^{B1}$ | $R^{B1}$ | $R^{B1}$ | $R^{B7}$ | $R^{B7}$ | O |
| $L_{A2768}$ | $R^{B1}$ | $R^{B1}$ | $R^{B1}$ | $R^{B8}$ | $R^{B8}$ | O |
| $L_{A2769}$ | $R^{B1}$ | $R^{B1}$ | $R^{B1}$ | $R^{B9}$ | $R^{B9}$ | O |
| $L_{A2770}$ | $R^{B1}$ | $R^{B1}$ | $R^{B1}$ | $R^{A2}$ | $R^{A2}$ | O |
| $L_{A2771}$ | $R^{B1}$ | $R^{B1}$ | $R^{B1}$ | $R^{A27}$ | $R^{A27}$ | O |
| $L_{A2772}$ | $R^{B1}$ | $R^{B1}$ | $R^{B1}$ | $R^{A34}$ | $R^{A34}$ | O |
| $L_{A2773}$ | $R^{B2}$ | $R^{B1}$ | $R^{B1}$ | $R^{B1}$ | $R^{B1}$ | O |
| $L_{A2774}$ | $R^{B2}$ | $R^{B1}$ | $R^{B1}$ | $R^{B2}$ | $R^{B2}$ | O |
| $L_{A2775}$ | $R^{B2}$ | $R^{B1}$ | $R^{B1}$ | $R^{B3}$ | $R^{B3}$ | O |
| $L_{A2776}$ | $R^{B2}$ | $R^{B1}$ | $R^{B1}$ | $R^{B4}$ | $R^{B4}$ | O |
| $L_{A2777}$ | $R^{B2}$ | $R^{B1}$ | $R^{B1}$ | $R^{B5}$ | $R^{B5}$ | O |
| $L_{A2778}$ | $R^{B2}$ | $R^{B1}$ | $R^{B1}$ | $R^{B6}$ | $R^{B6}$ | O |
| $L_{A2779}$ | $R^{B2}$ | $R^{B1}$ | $R^{B1}$ | $R^{B7}$ | $R^{B7}$ | O |
| $L_{A2780}$ | $R^{B2}$ | $R^{B1}$ | $R^{B1}$ | $R^{B8}$ | $R^{B8}$ | O |
| $L_{A2781}$ | $R^{B2}$ | $R^{B1}$ | $R^{B1}$ | $R^{B9}$ | $R^{B9}$ | O |
| $L_{A2782}$ | $R^{B2}$ | $R^{B1}$ | $R^{B1}$ | $R^{A2}$ | $R^{A2}$ | O |
| $L_{A2783}$ | $R^{B2}$ | $R^{B1}$ | $R^{B1}$ | $R^{A27}$ | $R^{A27}$ | O |
| $L_{A2784}$ | $R^{B2}$ | $R^{B1}$ | $R^{B1}$ | $R^{A34}$ | $R^{A34}$ | O |
| $L_{A2785}$ | $R^{B2}$ | F | $R^{B1}$ | $R^{B1}$ | $R^{B1}$ | O |
| $L_{A2786}$ | $R^{B2}$ | F | $R^{B1}$ | $R^{B2}$ | $R^{B2}$ | O |
| $L_{A2787}$ | $R^{B2}$ | F | $R^{B1}$ | $R^{B3}$ | $R^{B3}$ | O |
| $L_{A2788}$ | $R^{B2}$ | F | $R^{B1}$ | $R^{B4}$ | $R^{B4}$ | O |
| $L_{A2789}$ | $R^{B2}$ | F | $R^{B1}$ | $R^{B5}$ | $R^{B5}$ | O |
| $L_{A2790}$ | $R^{B2}$ | F | $R^{B1}$ | $R^{B6}$ | $R^{B6}$ | O |
| $L_{A2791}$ | $R^{B2}$ | F | $R^{B1}$ | $R^{B7}$ | $R^{B7}$ | O |
| $L_{A2792}$ | $R^{B2}$ | F | $R^{B1}$ | $R^{B8}$ | $R^{B8}$ | O |
| $L_{A2793}$ | $R^{B2}$ | F | $R^{B1}$ | $R^{B9}$ | $R^{B9}$ | O |
| $L_{A2794}$ | $R^{B2}$ | F | $R^{B1}$ | $R^{A2}$ | $R^{A2}$ | O |

-continued

| | $R^1$ | $R^2$ | $R^7$ | $R^8$ | $R^9$ | X |
|---|---|---|---|---|---|---|
| $L_{A2795}$ | $R^{B2}$ | F | $R^{B1}$ | $R^{A27}$ | $R^{A27}$ | O |
| $L_{A2796}$ | $R^{B2}$ | F | $R^{B1}$ | $R^{A34}$ | $R^{A34}$ | O |
| $L_{A2797}$ | $R^{B3}$ | $R^{B1}$ | $R^{B1}$ | $R^{B1}$ | $R^{B1}$ | O |
| $L_{A2798}$ | $R^{B3}$ | $R^{B1}$ | $R^{B1}$ | $R^{B2}$ | $R^{B2}$ | O |
| $L_{A2799}$ | $R^{B3}$ | $R^{B1}$ | $R^{B1}$ | $R^{B3}$ | $R^{B3}$ | O |
| $L_{A2800}$ | $R^{B3}$ | $R^{B1}$ | $R^{B1}$ | $R^{B4}$ | $R^{B4}$ | O |
| $L_{A2801}$ | $R^{B3}$ | $R^{B1}$ | $R^{B1}$ | $R^{B5}$ | $R^{B5}$ | O |
| $L_{A2802}$ | $R^{B3}$ | $R^{B1}$ | $R^{B1}$ | $R^{B6}$ | $R^{B6}$ | O |
| $L_{A2803}$ | $R^{B3}$ | $R^{B1}$ | $R^{B1}$ | $R^{B7}$ | $R^{B7}$ | O |
| $L_{A2804}$ | $R^{B3}$ | $R^{B1}$ | $R^{B1}$ | $R^{B8}$ | $R^{B8}$ | O |
| $L_{A2805}$ | $R^{B3}$ | $R^{B1}$ | $R^{B1}$ | $R^{B9}$ | $R^{B9}$ | O |
| $L_{A2806}$ | $R^{B3}$ | $R^{B1}$ | $R^{B1}$ | $R^{A2}$ | $R^{A2}$ | O |
| $L_{A2807}$ | $R^{B3}$ | $R^{B1}$ | $R^{B1}$ | $R^{A27}$ | $R^{A27}$ | O |
| $L_{A2808}$ | $R^{B3}$ | $R^{B1}$ | $R^{B1}$ | $R^{A34}$ | $R^{A34}$ | O |
| $L_{A2809}$ | $R^{B1}$ | $R^{B1}$ | $R^{B1}$ | $R^{B1}$ | $R^{B1}$ | O |
| $L_{A2810}$ | $R^{B1}$ | $R^{B1}$ | $R^{B2}$ | $R^{B2}$ | $R^{B1}$ | O |
| $L_{A2811}$ | $R^{B1}$ | $R^{B1}$ | $R^{B3}$ | $R^{B3}$ | $R^{B1}$ | O |
| $L_{A2812}$ | $R^{B1}$ | $R^{B1}$ | $R^{B4}$ | $R^{B4}$ | $R^{B1}$ | O |
| $L_{A2813}$ | $R^{B1}$ | $R^{B1}$ | $R^{B5}$ | $R^{B5}$ | $R^{B1}$ | O |
| $L_{A2814}$ | $R^{B1}$ | $R^{B1}$ | $R^{B6}$ | $R^{B6}$ | $R^{B1}$ | O |
| $L_{A2815}$ | $R^{B1}$ | $R^{B1}$ | $R^{B7}$ | $R^{B7}$ | $R^{B1}$ | O |
| $L_{A2816}$ | $R^{B1}$ | $R^{B1}$ | $R^{B8}$ | $R^{B8}$ | $R^{B1}$ | O |
| $L_{A2817}$ | $R^{B1}$ | $R^{B1}$ | $R^{B9}$ | $R^{B9}$ | $R^{B1}$ | O |
| $L_{A2818}$ | $R^{B1}$ | $R^{B1}$ | $R^{A2}$ | $R^{A2}$ | $R^{B1}$ | O |
| $L_{A2819}$ | $R^{B1}$ | $R^{B1}$ | $R^{A27}$ | $R^{A27}$ | $R^{B1}$ | O |
| $L_{A2820}$ | $R^{B1}$ | $R^{B1}$ | $R^{A34}$ | $R^{A34}$ | $R^{B1}$ | O |
| $L_{A2821}$ | $R^{B2}$ | $R^{B1}$ | $R^{B1}$ | $R^{B1}$ | $R^{B1}$ | O |
| $L_{A2822}$ | $R^{B2}$ | $R^{B1}$ | $R^{B2}$ | $R^{B2}$ | $R^{B1}$ | O |
| $L_{A2823}$ | $R^{B2}$ | $R^{B1}$ | $R^{B3}$ | $R^{B3}$ | $R^{B1}$ | O |
| $L_{A2824}$ | $R^{B2}$ | $R^{B1}$ | $R^{B4}$ | $R^{B4}$ | $R^{B1}$ | O |
| $L_{A2825}$ | $R^{B2}$ | $R^{B1}$ | $R^{B5}$ | $R^{B5}$ | $R^{B1}$ | O |
| $L_{A2826}$ | $R^{B2}$ | $R^{B1}$ | $R^{B6}$ | $R^{B6}$ | $R^{B1}$ | O |
| $L_{A2827}$ | $R^{B2}$ | $R^{B1}$ | $R^{B7}$ | $R^{B7}$ | $R^{B1}$ | O |
| $L_{A2828}$ | $R^{B2}$ | $R^{B1}$ | $R^{B8}$ | $R^{B8}$ | $R^{B1}$ | O |
| $L_{A2829}$ | $R^{B2}$ | $R^{B1}$ | $R^{B9}$ | $R^{B9}$ | $R^{B1}$ | O |
| $L_{A2830}$ | $R^{B2}$ | $R^{B1}$ | $R^{A2}$ | $R^{A2}$ | $R^{B1}$ | O |
| $L_{A2831}$ | $R^{B2}$ | $R^{B1}$ | $R^{A27}$ | $R^{A27}$ | $R^{B1}$ | O |
| $L_{A2832}$ | $R^{B2}$ | $R^{B1}$ | $R^{A34}$ | $R^{A34}$ | $R^{B1}$ | O |
| $L_{A2833}$ | $R^{B2}$ | F | $R^{B1}$ | $R^{B1}$ | $R^{B1}$ | O |
| $L_{A2834}$ | $R^{B2}$ | F | $R^{B2}$ | $R^{B2}$ | $R^{B1}$ | O |
| $L_{A2835}$ | $R^{B2}$ | F | $R^{B3}$ | $R^{B3}$ | $R^{B1}$ | O |
| $L_{A2836}$ | $R^{B2}$ | F | $R^{B4}$ | $R^{B4}$ | $R^{B1}$ | O |
| $L_{A2837}$ | $R^{B2}$ | F | $R^{B5}$ | $R^{B5}$ | $R^{B1}$ | O |
| $L_{A2838}$ | $R^{B2}$ | F | $R^{B6}$ | $R^{B6}$ | $R^{B1}$ | O |
| $L_{A2839}$ | $R^{B2}$ | F | $R^{B7}$ | $R^{B7}$ | $R^{B1}$ | O |
| $L_{A2840}$ | $R^{B2}$ | F | $R^{B8}$ | $R^{B8}$ | $R^{B1}$ | O |
| $L_{A2841}$ | $R^{B2}$ | F | $R^{B9}$ | $R^{B9}$ | $R^{B1}$ | O |
| $L_{A2842}$ | $R^{B2}$ | F | $R^{A2}$ | $R^{A2}$ | $R^{B1}$ | O |
| $L_{A2843}$ | $R^{B2}$ | F | $R^{A27}$ | $R^{A27}$ | $R^{B1}$ | O |
| $L_{A2844}$ | $R^{B2}$ | F | $R^{A34}$ | $R^{A34}$ | $R^{B1}$ | O |
| $L_{A2845}$ | $R^{B3}$ | $R^{B1}$ | $R^{B1}$ | $R^{B1}$ | $R^{B1}$ | O |
| $L_{A2846}$ | $R^{B3}$ | $R^{B1}$ | $R^{B2}$ | $R^{B2}$ | $R^{B1}$ | O |
| $L_{A2847}$ | $R^{B3}$ | $R^{B1}$ | $R^{B3}$ | $R^{B3}$ | $R^{B1}$ | O |
| $L_{A2848}$ | $R^{B3}$ | $R^{B1}$ | $R^{B4}$ | $R^{B4}$ | $R^{B1}$ | O |
| $L_{A2849}$ | $R^{B3}$ | $R^{B1}$ | $R^{B5}$ | $R^{B5}$ | $R^{B1}$ | O |
| $L_{A2850}$ | $R^{B3}$ | $R^{B1}$ | $R^{B6}$ | $R^{B6}$ | $R^{B1}$ | O |
| $L_{A2851}$ | $R^{B3}$ | $R^{B1}$ | $R^{B7}$ | $R^{B7}$ | $R^{B1}$ | O |
| $L_{A2852}$ | $R^{B3}$ | $R^{B1}$ | $R^{B8}$ | $R^{B8}$ | $R^{B1}$ | O |
| $L_{A2853}$ | $R^{B3}$ | $R^{B1}$ | $R^{B9}$ | $R^{B9}$ | $R^{B1}$ | O |
| $L_{A2854}$ | $R^{B3}$ | $R^{B1}$ | $R^{A2}$ | $R^{A2}$ | $R^{B1}$ | O |
| $L_{A2855}$ | $R^{B3}$ | $R^{B1}$ | $R^{A27}$ | $R^{A27}$ | $R^{B1}$ | O |
| $L_{A2856}$ | $R^{B3}$ | $R^{B1}$ | $R^{A34}$ | $R^{A34}$ | $R^{B1}$ | O |

for $L_{A2857}$ through $L_{A3048}$, $L_A$ has a structure of

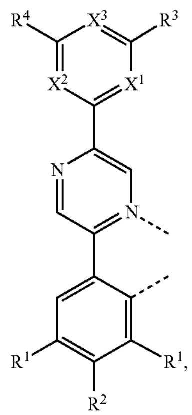

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A2857}$ | $R^{B1}$ | $R^{B1}$ | $R^{B1}$ | $R^{B1}$ | N | C | C |
| $L_{A2858}$ | $R^{B1}$ | $R^{B1}$ | $R^{B2}$ | $R^{B1}$ | N | C | C |
| $L_{A2859}$ | $R^{B1}$ | $R^{B1}$ | $R^{B3}$ | $R^{B1}$ | N | C | C |
| $L_{A2860}$ | $R^{B1}$ | $R^{B1}$ | $R^{B4}$ | $R^{B1}$ | N | C | C |
| $L_{A2861}$ | $R^{B1}$ | $R^{B1}$ | $R^{B5}$ | $R^{B1}$ | N | C | C |
| $L_{A2862}$ | $R^{B1}$ | $R^{B1}$ | $R^{B6}$ | $R^{B1}$ | N | C | C |
| $L_{A2863}$ | $R^{B1}$ | $R^{B1}$ | $R^{B7}$ | $R^{B1}$ | N | C | C |
| $L_{A2864}$ | $R^{B1}$ | $R^{B1}$ | $R^{B8}$ | $R^{B1}$ | N | C | C |
| $L_{A2865}$ | $R^{B1}$ | $R^{B1}$ | $R^{B9}$ | $R^{B1}$ | N | C | C |
| $L_{A2866}$ | $R^{B1}$ | $R^{B1}$ | $R^{A2}$ | $R^{B1}$ | N | C | C |
| $L_{A2867}$ | $R^{B1}$ | $R^{B1}$ | $R^{A27}$ | $R^{B1}$ | N | C | C |
| $L_{A2868}$ | $R^{B1}$ | $R^{B1}$ | $R^{A34}$ | $R^{B1}$ | N | C | C |
| $L_{A2869}$ | $R^{B2}$ | $R^{B1}$ | $R^{B1}$ | $R^{B1}$ | N | C | C |
| $L_{A2870}$ | $R^{B2}$ | $R^{B1}$ | $R^{B2}$ | $R^{B1}$ | N | C | C |
| $L_{A2871}$ | $R^{B2}$ | $R^{B1}$ | $R^{B3}$ | $R^{B1}$ | N | C | C |
| $L_{A2872}$ | $R^{B2}$ | $R^{B1}$ | $R^{B4}$ | $R^{B1}$ | N | C | C |
| $L_{A2873}$ | $R^{B2}$ | $R^{B1}$ | $R^{B5}$ | $R^{B1}$ | N | C | C |
| $L_{A2874}$ | $R^{B2}$ | $R^{B1}$ | $R^{B6}$ | $R^{B1}$ | N | C | C |
| $L_{A2875}$ | $R^{B2}$ | $R^{B1}$ | $R^{B7}$ | $R^{B1}$ | N | C | C |
| $L_{A2876}$ | $R^{B2}$ | $R^{B1}$ | $R^{B8}$ | $R^{B1}$ | N | C | C |
| $L_{A2877}$ | $R^{B2}$ | $R^{B1}$ | $R^{B9}$ | $R^{B1}$ | N | C | C |
| $L_{A2878}$ | $R^{B2}$ | $R^{B1}$ | $R^{A2}$ | $R^{B1}$ | N | C | C |
| $L_{A2879}$ | $R^{B2}$ | $R^{B1}$ | $R^{A27}$ | $R^{B1}$ | N | C | C |
| $L_{A2880}$ | $R^{B2}$ | $R^{B1}$ | $R^{A34}$ | $R^{B1}$ | N | C | C |
| $L_{A2881}$ | $R^{B2}$ | F | $R^{B1}$ | $R^{B1}$ | N | C | C |
| $L_{A2882}$ | $R^{B2}$ | F | $R^{B2}$ | $R^{B1}$ | N | C | C |
| $L_{A2883}$ | $R^{B2}$ | F | $R^{B3}$ | $R^{B1}$ | N | C | C |
| $L_{A2884}$ | $R^{B2}$ | F | $R^{B4}$ | $R^{B1}$ | N | C | C |
| $L_{A2885}$ | $R^{B2}$ | F | $R^{B5}$ | $R^{B1}$ | N | C | C |
| $L_{A2886}$ | $R^{B2}$ | F | $R^{B6}$ | $R^{B1}$ | N | C | C |
| $L_{A2887}$ | $R^{B2}$ | F | $R^{B7}$ | $R^{B1}$ | N | C | C |
| $L_{A2888}$ | $R^{B2}$ | F | $R^{B8}$ | $R^{B1}$ | N | C | C |
| $L_{A2889}$ | $R^{B2}$ | F | $R^{B9}$ | $R^{B1}$ | N | C | C |
| $L_{A2890}$ | $R^{B2}$ | F | $R^{A2}$ | $R^{B1}$ | N | C | C |
| $L_{A2891}$ | $R^{B2}$ | F | $R^{A27}$ | $R^{B1}$ | N | C | C |
| $L_{A2892}$ | $R^{B2}$ | F | $R^{A34}$ | $R^{B1}$ | N | C | C |
| $L_{A2893}$ | $R^{B3}$ | $R^{B1}$ | $R^{B1}$ | $R^{B1}$ | N | C | C |
| $L_{A2894}$ | $R^{B3}$ | $R^{B1}$ | $R^{B2}$ | $R^{B1}$ | N | C | C |
| $L_{A2895}$ | $R^{B3}$ | $R^{B1}$ | $R^{B3}$ | $R^{B1}$ | N | C | C |
| $L_{A2896}$ | $R^{B3}$ | $R^{B1}$ | $R^{B4}$ | $R^{B1}$ | N | C | C |
| $L_{A2897}$ | $R^{B3}$ | $R^{B1}$ | $R^{B5}$ | $R^{B1}$ | N | C | C |
| $L_{A2898}$ | $R^{B3}$ | $R^{B1}$ | $R^{B6}$ | $R^{B1}$ | N | C | C |
| $L_{A2899}$ | $R^{B3}$ | $R^{B1}$ | $R^{B7}$ | $R^{B1}$ | N | C | C |
| $L_{A2900}$ | $R^{B3}$ | $R^{B1}$ | $R^{B8}$ | $R^{B1}$ | N | C | C |
| $L_{A2901}$ | $R^{B3}$ | $R^{B1}$ | $R^{B9}$ | $R^{B1}$ | N | C | C |
| $L_{A2902}$ | $R^{B3}$ | $R^{B1}$ | $R^{A2}$ | $R^{B1}$ | N | C | C |
| $L_{A2903}$ | $R^{B3}$ | $R^{B1}$ | $R^{A27}$ | $R^{B1}$ | N | C | C |
| $L_{A2904}$ | $R^{B3}$ | $R^{B1}$ | $R^{A34}$ | $R^{B1}$ | N | C | C |
| $L_{A2905}$ | $R^{B1}$ | $R^{B1}$ | $R^{B1}$ | $R^{B1}$ | N | N | C |
| $L_{A2906}$ | $R^{B1}$ | $R^{B1}$ | $R^{B2}$ | $R^{B2}$ | N | N | C |
| $L_{A2907}$ | $R^{B1}$ | $R^{B1}$ | $R^{B3}$ | $R^{B3}$ | N | N | C |
| $L_{A2908}$ | $R^{B1}$ | $R^{B1}$ | $R^{B4}$ | $R^{B4}$ | N | N | C |

-continued

| | $R^1$ | $R^2$ | $R^3$ | $R^4$ | $X^1$ | $X^2$ | $X^3$ |
|---|---|---|---|---|---|---|---|
| $L_{A2909}$ | $R^{B1}$ | $R^{B1}$ | $R^{B5}$ | $R^{B5}$ | N | N | C |
| $L_{A2910}$ | $R^{B1}$ | $R^{B1}$ | $R^{B6}$ | $R^{B6}$ | N | N | C |
| $L_{A2911}$ | $R^{B1}$ | $R^{B1}$ | $R^{B7}$ | $R^{B7}$ | N | N | C |
| $L_{A2912}$ | $R^{B1}$ | $R^{B1}$ | $R^{B8}$ | $R^{B8}$ | N | N | C |
| $L_{A2913}$ | $R^{B1}$ | $R^{B1}$ | $R^{B9}$ | $R^{B9}$ | N | N | C |
| $L_{A2914}$ | $R^{B1}$ | $R^{B1}$ | $R^{A2}$ | $R^{A2}$ | N | N | C |
| $L_{A2915}$ | $R^{B1}$ | $R^{B1}$ | $R^{A27}$ | $R^{A27}$ | N | N | C |
| $L_{A2916}$ | $R^{B1}$ | $R^{B1}$ | $R^{A34}$ | $R^{A34}$ | N | N | C |
| $L_{A2917}$ | $R^{B2}$ | $R^{B1}$ | $R^{B1}$ | $R^{B1}$ | N | N | C |
| $L_{A2918}$ | $R^{B2}$ | $R^{B1}$ | $R^{B2}$ | $R^{B2}$ | N | N | C |
| $L_{A2919}$ | $R^{B2}$ | $R^{B1}$ | $R^{B3}$ | $R^{B3}$ | N | N | C |
| $L_{A2920}$ | $R^{B2}$ | $R^{B1}$ | $R^{B4}$ | $R^{B4}$ | N | N | C |
| $L_{A2921}$ | $R^{B2}$ | $R^{B1}$ | $R^{B5}$ | $R^{B5}$ | N | N | C |
| $L_{A2922}$ | $R^{B2}$ | $R^{B1}$ | $R^{B6}$ | $R^{B6}$ | N | N | C |
| $L_{A2923}$ | $R^{B2}$ | $R^{B1}$ | $R^{B7}$ | $R^{B7}$ | N | N | C |
| $L_{A2924}$ | $R^{B2}$ | $R^{B1}$ | $R^{B8}$ | $R^{B8}$ | N | N | C |
| $L_{A2925}$ | $R^{B2}$ | $R^{B1}$ | $R^{B9}$ | $R^{B9}$ | N | N | C |
| $L_{A2926}$ | $R^{B2}$ | $R^{B1}$ | $R^{A2}$ | $R^{A2}$ | N | N | C |
| $L_{A2927}$ | $R^{B2}$ | $R^{B1}$ | $R^{A27}$ | $R^{A27}$ | N | N | C |
| $L_{A2928}$ | $R^{B2}$ | $R^{B1}$ | $R^{A34}$ | $R^{A34}$ | N | N | C |
| $L_{A2929}$ | $R^{B2}$ | F | $R^{B1}$ | $R^{B1}$ | N | N | C |
| $L_{A2930}$ | $R^{B2}$ | F | $R^{B2}$ | $R^{B2}$ | N | N | C |
| $L_{A2931}$ | $R^{B2}$ | F | $R^{B3}$ | $R^{B3}$ | N | N | C |
| $L_{A2932}$ | $R^{B2}$ | F | $R^{B4}$ | $R^{B4}$ | N | N | C |
| $L_{A2933}$ | $R^{B2}$ | F | $R^{B5}$ | $R^{B5}$ | N | N | C |
| $L_{A2934}$ | $R^{B2}$ | F | $R^{B6}$ | $R^{B6}$ | N | N | C |
| $L_{A2935}$ | $R^{B2}$ | F | $R^{B7}$ | $R^{B7}$ | N | N | C |
| $L_{A2936}$ | $R^{B2}$ | F | $R^{B8}$ | $R^{B8}$ | N | N | C |
| $L_{A2937}$ | $R^{B2}$ | F | $R^{B9}$ | $R^{B9}$ | N | N | C |
| $L_{A2938}$ | $R^{B2}$ | F | $R^{A2}$ | $R^{A2}$ | N | N | C |
| $L_{A2939}$ | $R^{B2}$ | F | $R^{A27}$ | $R^{A27}$ | N | N | C |
| $L_{A2940}$ | $R^{B2}$ | F | $R^{A34}$ | $R^{A34}$ | N | N | C |
| $L_{A2941}$ | $R^{B3}$ | $R^{B1}$ | $R^{B1}$ | $R^{B1}$ | N | N | C |
| $L_{A2942}$ | $R^{B3}$ | $R^{B1}$ | $R^{B2}$ | $R^{B2}$ | N | N | C |
| $L_{A2943}$ | $R^{B3}$ | $R^{B1}$ | $R^{B3}$ | $R^{B3}$ | N | N | C |
| $L_{A2944}$ | $R^{B3}$ | $R^{B1}$ | $R^{B4}$ | $R^{B4}$ | N | N | C |
| $L_{A2945}$ | $R^{B3}$ | $R^{B1}$ | $R^{B5}$ | $R^{B5}$ | N | N | C |
| $L_{A2946}$ | $R^{B3}$ | $R^{B1}$ | $R^{B6}$ | $R^{B6}$ | N | N | C |
| $L_{A2947}$ | $R^{B3}$ | $R^{B1}$ | $R^{B7}$ | $R^{B7}$ | N | N | C |
| $L_{A2948}$ | $R^{B3}$ | $R^{B1}$ | $R^{B8}$ | $R^{B8}$ | N | N | C |
| $L_{A2949}$ | $R^{B3}$ | $R^{B1}$ | $R^{B9}$ | $R^{B9}$ | N | N | C |
| $L_{A2950}$ | $R^{B3}$ | $R^{B1}$ | $R^{A2}$ | $R^{A2}$ | N | N | C |
| $L_{A2951}$ | $R^{B3}$ | $R^{B1}$ | $R^{A27}$ | $R^{A27}$ | N | N | C |
| $L_{A2952}$ | $R^{B3}$ | $R^{B1}$ | $R^{A34}$ | $R^{A34}$ | N | N | C |
| $L_{A2953}$ | $R^{B1}$ | $R^{B1}$ | $R^{B1}$ | $R^{B1}$ | N | N | N |
| $L_{A2954}$ | $R^{B1}$ | $R^{B1}$ | $R^{B2}$ | $R^{B2}$ | N | N | N |
| $L_{A2955}$ | $R^{B1}$ | $R^{B1}$ | $R^{B3}$ | $R^{B3}$ | N | N | N |
| $L_{A2956}$ | $R^{B1}$ | $R^{B1}$ | $R^{B4}$ | $R^{B4}$ | N | N | N |
| $L_{A2957}$ | $R^{B1}$ | $R^{B1}$ | $R^{B5}$ | $R^{B5}$ | N | N | N |
| $L_{A2958}$ | $R^{B1}$ | $R^{B1}$ | $R^{B6}$ | $R^{B6}$ | N | N | N |
| $L_{A2959}$ | $R^{B1}$ | $R^{B1}$ | $R^{B7}$ | $R^{B7}$ | N | N | N |
| $L_{A2960}$ | $R^{B1}$ | $R^{B1}$ | $R^{B8}$ | $R^{B8}$ | N | N | N |
| $L_{A2961}$ | $R^{B1}$ | $R^{B1}$ | $R^{B9}$ | $R^{B9}$ | N | N | N |
| $L_{A2962}$ | $R^{B1}$ | $R^{B1}$ | $R^{A2}$ | $R^{A2}$ | N | N | N |
| $L_{A2963}$ | $R^{B1}$ | $R^{B1}$ | $R^{A27}$ | $R^{A27}$ | N | N | N |
| $L_{A2964}$ | $R^{B1}$ | $R^{B1}$ | $R^{A34}$ | $R^{A34}$ | N | N | N |
| $L_{A2965}$ | $R^{B2}$ | $R^{B1}$ | $R^{B1}$ | $R^{B1}$ | N | N | N |
| $L_{A2966}$ | $R^{B2}$ | $R^{B1}$ | $R^{B2}$ | $R^{B2}$ | N | N | N |
| $L_{A2967}$ | $R^{B2}$ | $R^{B1}$ | $R^{B3}$ | $R^{B3}$ | N | N | N |
| $L_{A2968}$ | $R^{B2}$ | $R^{B1}$ | $R^{B4}$ | $R^{B4}$ | N | N | N |
| $L_{A2969}$ | $R^{B2}$ | $R^{B1}$ | $R^{B5}$ | $R^{B5}$ | N | N | N |
| $L_{A2970}$ | $R^{B2}$ | $R^{B1}$ | $R^{B6}$ | $R^{B6}$ | N | N | N |
| $L_{A2971}$ | $R^{B2}$ | $R^{B1}$ | $R^{B7}$ | $R^{B7}$ | N | N | N |
| $L_{A2972}$ | $R^{B2}$ | $R^{B1}$ | $R^{B8}$ | $R^{B8}$ | N | N | N |
| $L_{A2973}$ | $R^{B2}$ | $R^{B1}$ | $R^{B9}$ | $R^{B9}$ | N | N | N |
| $L_{A2974}$ | $R^{B2}$ | $R^{B1}$ | $R^{A2}$ | $R^{A2}$ | N | N | N |
| $L_{A2975}$ | $R^{B2}$ | $R^{B1}$ | $R^{A27}$ | $R^{A27}$ | N | N | N |
| $L_{A2976}$ | $R^{B2}$ | $R^{B1}$ | $R^{A34}$ | $R^{A34}$ | N | N | N |
| $L_{A2977}$ | $R^{B2}$ | F | $R^{B1}$ | $R^{B1}$ | N | N | N |
| $L_{A2978}$ | $R^{B2}$ | F | $R^{B2}$ | $R^{B2}$ | N | N | N |
| $L_{A2979}$ | $R^{B2}$ | F | $R^{B3}$ | $R^{B3}$ | N | N | N |
| $L_{A2980}$ | $R^{B2}$ | F | $R^{B4}$ | $R^{B4}$ | N | N | N |
| $L_{A2981}$ | $R^{B2}$ | F | $R^{B5}$ | $R^{B5}$ | N | N | N |
| $L_{A2982}$ | $R^{B2}$ | F | $R^{B6}$ | $R^{B6}$ | N | N | N |
| $L_{A2983}$ | $R^{B2}$ | F | $R^{B7}$ | $R^{B7}$ | N | N | N |
| $L_{A2984}$ | $R^{B2}$ | F | $R^{B8}$ | $R^{B8}$ | N | N | N |
| $L_{A2985}$ | $R^{B2}$ | F | $R^{B9}$ | $R^{B9}$ | N | N | N |
| $L_{A2986}$ | $R^{B2}$ | F | $R^{A2}$ | $R^{A2}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A2987}$ | $R^{B2}$ | F | $R^{A27}$ | $R^{A27}$ | N | N | N |
| $L_{A2988}$ | $R^{B2}$ | F | $R^{A34}$ | $R^{A34}$ | N | N | N |
| $L_{A2989}$ | $R^{B3}$ | $R^{B1}$ | $R^{B1}$ | $R^{B1}$ | N | N | N |
| $L_{A2990}$ | $R^{B3}$ | $R^{B1}$ | $R^{B2}$ | $R^{B2}$ | N | N | N |
| $L_{A2991}$ | $R^{B3}$ | $R^{B1}$ | $R^{B3}$ | $R^{B3}$ | N | N | N |
| $L_{A2992}$ | $R^{B3}$ | $R^{B1}$ | $R^{B4}$ | $R^{B4}$ | N | N | N |
| $L_{A2993}$ | $R^{B3}$ | $R^{B1}$ | $R^{B5}$ | $R^{B5}$ | N | N | N |
| $L_{A2994}$ | $R^{B3}$ | $R^{B1}$ | $R^{B6}$ | $R^{B6}$ | N | N | N |
| $L_{A2995}$ | $R^{B3}$ | $R^{B1}$ | $R^{B7}$ | $R^{B7}$ | N | N | N |
| $L_{A2996}$ | $R^{B3}$ | $R^{B1}$ | $R^{B8}$ | $R^{B8}$ | N | N | N |
| $L_{A2997}$ | $R^{B3}$ | $R^{B1}$ | $R^{B9}$ | $R^{B9}$ | N | N | N |
| $L_{A2998}$ | $R^{B3}$ | $R^{B1}$ | $R^{A2}$ | $R^{A2}$ | N | N | N |
| $L_{A2999}$ | $R^{B3}$ | $R^{B1}$ | $R^{A27}$ | $R^{A27}$ | N | N | N |
| $L_{A3000}$ | $R^{B3}$ | $R^{B1}$ | $R^{A34}$ | $R^{A34}$ | N | N | N |
| $L_{A3001}$ | $R^{B1}$ | $R^{B1}$ | $R^{B1}$ | $R^{B1}$ | C | C | N |
| $L_{A3002}$ | $R^{B1}$ | $R^{B1}$ | $R^{B2}$ | $R^{B2}$ | C | C | N |
| $L_{A3003}$ | $R^{B1}$ | $R^{B1}$ | $R^{B3}$ | $R^{B3}$ | C | C | N |
| $L_{A3004}$ | $R^{B1}$ | $R^{B1}$ | $R^{B4}$ | $R^{B4}$ | C | C | N |
| $L_{A3005}$ | $R^{B1}$ | $R^{B1}$ | $R^{B5}$ | $R^{B5}$ | C | C | N |
| $L_{A3006}$ | $R^{B1}$ | $R^{B1}$ | $R^{B6}$ | $R^{B6}$ | C | C | N |
| $L_{A3007}$ | $R^{B1}$ | $R^{B1}$ | $R^{B7}$ | $R^{B7}$ | C | C | N |
| $L_{A3008}$ | $R^{B1}$ | $R^{B1}$ | $R^{B8}$ | $R^{B8}$ | C | C | N |
| $L_{A3009}$ | $R^{B1}$ | $R^{B1}$ | $R^{B9}$ | $R^{B9}$ | C | C | N |
| $L_{A3010}$ | $R^{B1}$ | $R^{B1}$ | $R^{A2}$ | $R^{A2}$ | C | C | N |
| $L_{A3011}$ | $R^{B1}$ | $R^{B1}$ | $R^{A27}$ | $R^{A27}$ | C | C | N |
| $L_{A3012}$ | $R^{B1}$ | $R^{B1}$ | $R^{A34}$ | $R^{A34}$ | C | C | N |
| $L_{A3013}$ | $R^{B2}$ | $R^{B1}$ | $R^{B1}$ | $R^{B1}$ | C | C | N |
| $L_{A3014}$ | $R^{B2}$ | $R^{B1}$ | $R^{B2}$ | $R^{B2}$ | C | C | N |
| $L_{A3015}$ | $R^{B2}$ | $R^{B1}$ | $R^{B3}$ | $R^{B3}$ | C | C | N |
| $L_{A3016}$ | $R^{B2}$ | $R^{B1}$ | $R^{B4}$ | $R^{B4}$ | C | C | N |
| $L_{A3017}$ | $R^{B2}$ | $R^{B1}$ | $R^{B5}$ | $R^{B5}$ | C | C | N |
| $L_{A3018}$ | $R^{B2}$ | $R^{B1}$ | $R^{B6}$ | $R^{B6}$ | C | C | N |
| $L_{A3019}$ | $R^{B2}$ | $R^{B1}$ | $R^{B7}$ | $R^{B7}$ | C | C | N |
| $L_{A3020}$ | $R^{B2}$ | $R^{B1}$ | $R^{B8}$ | $R^{B8}$ | C | C | N |
| $L_{A3021}$ | $R^{B2}$ | $R^{B1}$ | $R^{B9}$ | $R^{B9}$ | C | C | N |
| $L_{A3022}$ | $R^{B2}$ | $R^{B1}$ | $R^{A2}$ | $R^{A2}$ | C | C | N |
| $L_{A3023}$ | $R^{B2}$ | $R^{B1}$ | $R^{A27}$ | $R^{A27}$ | C | C | N |
| $L_{A3024}$ | $R^{B2}$ | $R^{B1}$ | $R^{A34}$ | $R^{A34}$ | C | C | N |
| $L_{A3025}$ | $R^{B2}$ | F | $R^{B1}$ | $R^{B1}$ | C | C | N |
| $L_{A3026}$ | $R^{B2}$ | F | $R^{B2}$ | $R^{B2}$ | C | C | N |
| $L_{A3027}$ | $R^{B2}$ | F | $R^{B3}$ | $R^{B3}$ | C | C | N |
| $L_{A3028}$ | $R^{B2}$ | F | $R^{B4}$ | $R^{B4}$ | C | C | N |
| $L_{A3029}$ | $R^{B2}$ | F | $R^{B5}$ | $R^{B5}$ | C | C | N |
| $L_{A3030}$ | $R^{B2}$ | F | $R^{B6}$ | $R^{B6}$ | C | C | N |
| $L_{A3031}$ | $R^{B2}$ | F | $R^{B7}$ | $R^{B7}$ | C | C | N |
| $L_{A3032}$ | $R^{B2}$ | F | $R^{B8}$ | $R^{B8}$ | C | C | N |
| $L_{A3033}$ | $R^{B2}$ | F | $R^{B9}$ | $R^{B9}$ | C | C | N |
| $L_{A3034}$ | $R^{B2}$ | F | $R^{A2}$ | $R^{A2}$ | C | C | N |
| $L_{A3035}$ | $R^{B2}$ | F | $R^{A27}$ | $R^{A27}$ | C | C | N |
| $L_{A3036}$ | $R^{B2}$ | F | $R^{A34}$ | $R^{A34}$ | C | C | N |
| $L_{A3037}$ | $R^{B3}$ | $R^{B1}$ | $R^{B1}$ | $R^{B1}$ | C | C | N |
| $L_{A3038}$ | $R^{B3}$ | $R^{B1}$ | $R^{B2}$ | $R^{B2}$ | C | C | N |
| $L_{A3039}$ | $R^{B3}$ | $R^{B1}$ | $R^{B3}$ | $R^{B3}$ | C | C | N |
| $L_{A3040}$ | $R^{B3}$ | $R^{B1}$ | $R^{B4}$ | $R^{B4}$ | C | C | N |
| $L_{A3041}$ | $R^{B3}$ | $R^{B1}$ | $R^{B5}$ | $R^{B5}$ | C | C | N |
| $L_{A3042}$ | $R^{B3}$ | $R^{B1}$ | $R^{B6}$ | $R^{B6}$ | C | C | N |
| $L_{A3043}$ | $R^{B3}$ | $R^{B1}$ | $R^{B7}$ | $R^{B7}$ | C | C | N |
| $L_{A3044}$ | $R^{B3}$ | $R^{B1}$ | $R^{B8}$ | $R^{B8}$ | C | C | N |
| $L_{A3045}$ | $R^{B3}$ | $R^{B1}$ | $R^{B9}$ | $R^{B9}$ | C | C | N |
| $L_{A3046}$ | $R^{B3}$ | $R^{B1}$ | $R^{A2}$ | $R^{A2}$ | C | C | N |
| $L_{A3047}$ | $R^{B3}$ | $R^{B1}$ | $R^{A27}$ | $R^{A27}$ | C | C | N |
| $L_{A3048}$ | $R^{B3}$ | $R^{B1}$ | $R^{A34}$ | $R^{A34}$ | C | C | N |

for $L_{A3049}$ through $L_{A3232}$, $L_A$ has a structure of

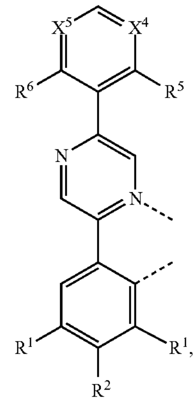

wherein $R^1$, $R^2$, $R^5$, $R^6$, $X^4$, and $X^5$ are defined as provided below,

| | $R^1$ | $R^2$ | $R^5$ | $R^6$ | $X^4$ | $X^5$ |
|---|---|---|---|---|---|---|
| $L_{A3049}$ | $R^{B1}$ | $R^{B1}$ | $R^{B1}$ | $R^{B1}$ | N | C |
| $L_{A3050}$ | $R^{B1}$ | $R^{B1}$ | $R^{B2}$ | $R^{B1}$ | N | C |
| $L_{A3051}$ | $R^{B1}$ | $R^{B1}$ | $R^{B3}$ | $R^{B1}$ | N | C |
| $L_{A3052}$ | $R^{B1}$ | $R^{B1}$ | $R^{B4}$ | $R^{B1}$ | N | C |
| $L_{A3053}$ | $R^{B1}$ | $R^{B1}$ | $R^{B5}$ | $R^{B1}$ | N | C |
| $L_{A3054}$ | $R^{B1}$ | $R^{B1}$ | $R^{B6}$ | $R^{B1}$ | N | C |
| $L_{A3055}$ | $R^{B1}$ | $R^{B1}$ | $R^{B7}$ | $R^{B1}$ | N | C |
| $L_{A3056}$ | $R^{B1}$ | $R^{B1}$ | $R^{B8}$ | $R^{B1}$ | N | C |
| $L_{A3057}$ | $R^{B1}$ | $R^{B1}$ | $R^{B9}$ | $R^{B1}$ | N | C |
| $L_{A3058}$ | $R^{B1}$ | $R^{B1}$ | $R^{A2}$ | $R^{B1}$ | N | C |
| $L_{A3059}$ | $R^{B1}$ | $R^{B1}$ | $R^{A27}$ | $R^{B1}$ | N | C |
| $L_{A3060}$ | $R^{B1}$ | $R^{B1}$ | $R^{A34}$ | $R^{B1}$ | N | C |
| $L_{A3061}$ | $R^{B2}$ | $R^{B1}$ | $R^{B1}$ | $R^{B1}$ | N | C |
| $L_{A3062}$ | $R^{B2}$ | $R^{B1}$ | $R^{B2}$ | $R^{B1}$ | N | C |
| $L_{A3063}$ | $R^{B2}$ | $R^{B1}$ | $R^{B3}$ | $R^{B1}$ | N | C |
| $L_{A3064}$ | $R^{B2}$ | $R^{B1}$ | $R^{B4}$ | $R^{B1}$ | N | C |
| $L_{A3065}$ | $R^{B2}$ | $R^{B1}$ | $R^{B5}$ | $R^{B1}$ | N | C |
| $L_{A3066}$ | $R^{B2}$ | $R^{B1}$ | $R^{B6}$ | $R^{B1}$ | N | C |
| $L_{A3067}$ | $R^{B2}$ | $R^{B1}$ | $R^{B7}$ | $R^{B1}$ | N | C |
| $L_{A3068}$ | $R^{B2}$ | $R^{B1}$ | $R^{B8}$ | $R^{B1}$ | N | C |
| $L_{A3069}$ | $R^{B2}$ | $R^{B1}$ | $R^{B9}$ | $R^{B1}$ | N | C |
| $L_{A3070}$ | $R^{B2}$ | $R^{B1}$ | $R^{A2}$ | $R^{B1}$ | N | C |
| $L_{A3071}$ | $R^{B2}$ | $R^{B1}$ | $R^{A27}$ | $R^{B1}$ | N | C |
| $L_{A3072}$ | $R^{B2}$ | $R^{B1}$ | $R^{A34}$ | $R^{B1}$ | N | C |
| $L_{A3073}$ | $R^{B2}$ | F | $R^{B1}$ | $R^{B1}$ | N | C |
| $L_{A3074}$ | $R^{B2}$ | F | $R^{B2}$ | $R^{B1}$ | N | C |
| $L_{A3075}$ | $R^{B2}$ | F | $R^{B3}$ | $R^{B1}$ | N | C |
| $L_{A3076}$ | $R^{B2}$ | F | $R^{B4}$ | $R^{B1}$ | N | C |
| $L_{A3077}$ | $R^{B2}$ | F | $R^{B5}$ | $R^{B1}$ | N | C |
| $L_{A3078}$ | $R^{B2}$ | F | $R^{B6}$ | $R^{B1}$ | N | C |
| $L_{A3079}$ | $R^{B2}$ | F | $R^{B7}$ | $R^{B1}$ | N | C |
| $L_{A3080}$ | $R^{B2}$ | F | $R^{B8}$ | $R^{B1}$ | N | C |
| $L_{A3081}$ | $R^{B2}$ | F | $R^{B9}$ | $R^{B1}$ | N | C |
| $L_{A3082}$ | $R^{B2}$ | F | $R^{A2}$ | $R^{B1}$ | N | C |
| $L_{A3083}$ | $R^{B2}$ | F | $R^{A27}$ | $R^{B1}$ | N | C |
| $L_{A3084}$ | $R^{B2}$ | F | $R^{A34}$ | $R^{B1}$ | N | C |
| $L_{A3085}$ | $R^{B3}$ | $R^{B1}$ | $R^{B1}$ | $R^{B1}$ | N | C |
| $L_{A3086}$ | $R^{B3}$ | $R^{B1}$ | $R^{B2}$ | $R^{B1}$ | N | C |
| $L_{A3087}$ | $R^{B3}$ | $R^{B1}$ | $R^{B3}$ | $R^{B1}$ | N | C |
| $L_{A3088}$ | $R^{B3}$ | $R^{B1}$ | $R^{B4}$ | $R^{B1}$ | N | C |
| $L_{A3089}$ | $R^{B3}$ | $R^{B1}$ | $R^{B5}$ | $R^{B1}$ | N | C |
| $L_{A3090}$ | $R^{B3}$ | $R^{B1}$ | $R^{B6}$ | $R^{B1}$ | N | C |
| $L_{A3091}$ | $R^{B3}$ | $R^{B1}$ | $R^{B7}$ | $R^{B1}$ | N | C |
| $L_{A3092}$ | $R^{B3}$ | $R^{B1}$ | $R^{B8}$ | $R^{B1}$ | N | C |
| $L_{A3093}$ | $R^{B3}$ | $R^{B1}$ | $R^{B9}$ | $R^{B1}$ | N | C |
| $L_{A3094}$ | $R^{B3}$ | $R^{B1}$ | $R^{A2}$ | $R^{B1}$ | N | C |
| $L_{A3095}$ | $R^{B3}$ | $R^{B1}$ | $R^{A27}$ | $R^{B1}$ | N | C |
| $L_{A3096}$ | $R^{B3}$ | $R^{B1}$ | $R^{A34}$ | $R^{B1}$ | N | C |
| $L_{A3097}$ | $R^{B1}$ | $R^{B1}$ | $R^{B2}$ | $R^{B2}$ | N | C |
| $L_{A3098}$ | $R^{B1}$ | $R^{B1}$ | $R^{B3}$ | $R^{B3}$ | N | C |
| $L_{A3099}$ | $R^{B1}$ | $R^{B1}$ | $R^{B4}$ | $R^{B4}$ | N | C |
| $L_{A3100}$ | $R^{B1}$ | $R^{B1}$ | $R^{B5}$ | $R^{B5}$ | N | C |
| $L_{A3101}$ | $R^{B1}$ | $R^{B1}$ | $R^{B6}$ | $R^{B6}$ | N | C |

-continued

| | $R^1$ | $R^2$ | $R^5$ | $R^6$ | $X^4$ | $X^5$ |
|---|---|---|---|---|---|---|
| $L_{A3102}$ | $R^{B1}$ | $R^{B1}$ | $R^{B7}$ | $R^{B7}$ | N | C |
| $L_{A3103}$ | $R^{B1}$ | $R^{B1}$ | $R^{B8}$ | $R^{B8}$ | N | C |
| $L_{A3104}$ | $R^{B1}$ | $R^{B1}$ | $R^{B9}$ | $R^{B9}$ | N | C |
| $L_{A3105}$ | $R^{B1}$ | $R^{B1}$ | $R^{A2}$ | $R^{A2}$ | N | C |
| $L_{A3106}$ | $R^{B1}$ | $R^{B1}$ | $R^{A27}$ | $R^{A27}$ | N | C |
| $L_{A3107}$ | $R^{B1}$ | $R^{B1}$ | $R^{A34}$ | $R^{A34}$ | N | C |
| $L_{A3108}$ | $R^{B2}$ | $R^{B1}$ | $R^{B2}$ | $R^{B2}$ | N | C |
| $L_{A3109}$ | $R^{B2}$ | $R^{B1}$ | $R^{B3}$ | $R^{B3}$ | N | C |
| $L_{A3110}$ | $R^{B2}$ | $R^{B1}$ | $R^{B4}$ | $R^{B4}$ | N | C |
| $L_{A3111}$ | $R^{B2}$ | $R^{B1}$ | $R^{B5}$ | $R^{B5}$ | N | C |
| $L_{A3112}$ | $R^{B2}$ | $R^{B1}$ | $R^{B6}$ | $R^{B6}$ | N | C |
| $L_{A3113}$ | $R^{B2}$ | $R^{B1}$ | $R^{B7}$ | $R^{B7}$ | N | C |
| $L_{A3114}$ | $R^{B2}$ | $R^{B1}$ | $R^{B8}$ | $R^{B8}$ | N | C |
| $L_{A3115}$ | $R^{B2}$ | $R^{B1}$ | $R^{B9}$ | $R^{B9}$ | N | C |
| $L_{A3116}$ | $R^{B2}$ | $R^{B1}$ | $R^{A2}$ | $R^{A2}$ | N | C |
| $L_{A3117}$ | $R^{B2}$ | $R^{B1}$ | $R^{A27}$ | $R^{A27}$ | N | C |
| $L_{A3118}$ | $R^{B2}$ | $R^{B1}$ | $R^{A34}$ | $R^{A34}$ | N | C |
| $L_{A3119}$ | $R^{B2}$ | F | $R^{B2}$ | $R^{B2}$ | N | C |
| $L_{A3120}$ | $R^{B2}$ | F | $R^{B3}$ | $R^{B3}$ | N | C |
| $L_{A3121}$ | $R^{B2}$ | F | $R^{B4}$ | $R^{B4}$ | N | C |
| $L_{A3122}$ | $R^{B2}$ | F | $R^{B5}$ | $R^{B5}$ | N | C |
| $L_{A3123}$ | $R^{B2}$ | F | $R^{B6}$ | $R^{B6}$ | N | C |
| $L_{A3124}$ | $R^{B2}$ | F | $R^{B7}$ | $R^{B7}$ | N | C |
| $L_{A3125}$ | $R^{B2}$ | F | $R^{B8}$ | $R^{B8}$ | N | C |
| $L_{A3126}$ | $R^{B2}$ | F | $R^{B9}$ | $R^{B9}$ | N | C |
| $L_{A3127}$ | $R^{B2}$ | F | $R^{A2}$ | $R^{A2}$ | N | C |
| $L_{A3128}$ | $R^{B2}$ | F | $R^{A27}$ | $R^{A27}$ | N | C |
| $L_{A3129}$ | $R^{B2}$ | F | $R^{A34}$ | $R^{A34}$ | N | C |
| $L_{A3130}$ | $R^{B3}$ | $R^{B1}$ | $R^{B2}$ | $R^{B2}$ | N | C |
| $L_{A3131}$ | $R^{B3}$ | $R^{B1}$ | $R^{B3}$ | $R^{B3}$ | N | C |
| $L_{A3132}$ | $R^{B3}$ | $R^{B1}$ | $R^{B4}$ | $R^{B4}$ | N | C |
| $L_{A3133}$ | $R^{B3}$ | $R^{B1}$ | $R^{B5}$ | $R^{B5}$ | N | C |
| $L_{A3134}$ | $R^{B3}$ | $R^{B1}$ | $R^{B6}$ | $R^{B6}$ | N | C |
| $L_{A3135}$ | $R^{B3}$ | $R^{B1}$ | $R^{B7}$ | $R^{B7}$ | N | C |
| $L_{A3136}$ | $R^{B3}$ | $R^{B1}$ | $R^{B8}$ | $R^{B8}$ | N | C |
| $L_{A3137}$ | $R^{B3}$ | $R^{B1}$ | $R^{B9}$ | $R^{B9}$ | N | C |
| $L_{A3138}$ | $R^{B3}$ | $R^{B1}$ | $R^{A2}$ | $R^{A2}$ | N | C |
| $L_{A3139}$ | $R^{B3}$ | $R^{B1}$ | $R^{A27}$ | $R^{A27}$ | N | C |
| $L_{A3140}$ | $R^{B3}$ | $R^{B1}$ | $R^{A34}$ | $R^{A34}$ | N | C |
| $L_{A3141}$ | $R^{B1}$ | $R^{B1}$ | $R^{B1}$ | $R^{B1}$ | N | N |
| $L_{A3142}$ | $R^{B1}$ | $R^{B1}$ | $R^{B2}$ | $R^{B1}$ | N | N |
| $L_{A3143}$ | $R^{B1}$ | $R^{B1}$ | $R^{B3}$ | $R^{B1}$ | N | N |
| $L_{A3144}$ | $R^{B1}$ | $R^{B1}$ | $R^{B4}$ | $R^{B1}$ | N | N |
| $L_{A3145}$ | $R^{B1}$ | $R^{B1}$ | $R^{B5}$ | $R^{B1}$ | N | N |
| $L_{A3146}$ | $R^{B1}$ | $R^{B1}$ | $R^{B6}$ | $R^{B1}$ | N | N |
| $L_{A3147}$ | $R^{B1}$ | $R^{B1}$ | $R^{B7}$ | $R^{B1}$ | N | N |
| $L_{A3148}$ | $R^{B1}$ | $R^{B1}$ | $R^{B8}$ | $R^{B1}$ | N | N |
| $L_{A3149}$ | $R^{B1}$ | $R^{B1}$ | $R^{B9}$ | $R^{B1}$ | N | N |
| $L_{A3150}$ | $R^{B1}$ | $R^{B1}$ | $R^{A2}$ | $R^{B1}$ | N | N |
| $L_{A3151}$ | $R^{B1}$ | $R^{B1}$ | $R^{A27}$ | $R^{B1}$ | N | N |
| $L_{A3152}$ | $R^{B1}$ | $R^{B1}$ | $R^{A34}$ | $R^{B1}$ | N | N |
| $L_{A3153}$ | $R^{B2}$ | $R^{B1}$ | $R^{B1}$ | $R^{B1}$ | N | N |
| $L_{A3154}$ | $R^{B2}$ | $R^{B1}$ | $R^{B2}$ | $R^{B1}$ | N | N |
| $L_{A3155}$ | $R^{B2}$ | $R^{B1}$ | $R^{B3}$ | $R^{B1}$ | N | N |
| $L_{A3156}$ | $R^{B2}$ | $R^{B1}$ | $R^{B4}$ | $R^{B1}$ | N | N |
| $L_{A3157}$ | $R^{B2}$ | $R^{B1}$ | $R^{B5}$ | $R^{B1}$ | N | N |
| $L_{A3158}$ | $R^{B2}$ | $R^{B1}$ | $R^{B6}$ | $R^{B1}$ | N | N |
| $L_{A3159}$ | $R^{B2}$ | $R^{B1}$ | $R^{B7}$ | $R^{B1}$ | N | N |
| $L_{A3160}$ | $R^{B2}$ | $R^{B1}$ | $R^{B8}$ | $R^{B1}$ | N | N |
| $L_{A3161}$ | $R^{B2}$ | $R^{B1}$ | $R^{B9}$ | $R^{B1}$ | N | N |
| $L_{A3162}$ | $R^{B2}$ | $R^{B1}$ | $R^{A2}$ | $R^{B1}$ | N | N |
| $L_{A3163}$ | $R^{B2}$ | $R^{B1}$ | $R^{A27}$ | $R^{B1}$ | N | N |
| $L_{A3164}$ | $R^{B2}$ | $R^{B1}$ | $R^{A34}$ | $R^{B1}$ | N | N |
| $L_{A3165}$ | $R^{B2}$ | F | $R^{B1}$ | $R^{B1}$ | N | N |
| $L_{A3166}$ | $R^{B2}$ | F | $R^{B2}$ | $R^{B1}$ | N | N |
| $L_{A3167}$ | $R^{B2}$ | F | $R^{B3}$ | $R^{B1}$ | N | N |
| $L_{A3168}$ | $R^{B2}$ | F | $R^{B4}$ | $R^{B1}$ | N | N |
| $L_{A3169}$ | $R^{B2}$ | F | $R^{B5}$ | $R^{B1}$ | N | N |
| $L_{A3170}$ | $R^{B2}$ | F | $R^{B6}$ | $R^{B1}$ | N | N |
| $L_{A3171}$ | $R^{B2}$ | F | $R^{B7}$ | $R^{B1}$ | N | N |
| $L_{A3172}$ | $R^{B2}$ | F | $R^{B8}$ | $R^{B1}$ | N | N |
| $L_{A3173}$ | $R^{B2}$ | F | $R^{B9}$ | $R^{B1}$ | N | N |
| $L_{A3174}$ | $R^{B2}$ | F | $R^{A2}$ | $R^{B1}$ | N | N |
| $L_{A3175}$ | $R^{B2}$ | F | $R^{A27}$ | $R^{B1}$ | N | N |
| $L_{A3176}$ | $R^{B2}$ | F | $R^{A34}$ | $R^{B1}$ | N | N |
| $L_{A3177}$ | $R^{B3}$ | $R^{B1}$ | $R^{B1}$ | $R^{B1}$ | N | N |
| $L_{A3178}$ | $R^{B3}$ | $R^{B1}$ | $R^{B2}$ | $R^{B1}$ | N | N |

-continued

| | $R^1$ | $R^2$ | $R^5$ | $R^6$ | $X^4$ | $X^5$ |
|---|---|---|---|---|---|---|
| $L_{A3179}$ | $R^{B3}$ | $R^{B1}$ | $R^{B3}$ | $R^{B1}$ | N | N |
| $L_{A3180}$ | $R^{B3}$ | $R^{B1}$ | $R^{B4}$ | $R^{B1}$ | N | N |
| $L_{A3181}$ | $R^{B3}$ | $R^{B1}$ | $R^{B5}$ | $R^{B1}$ | N | N |
| $L_{A3182}$ | $R^{B3}$ | $R^{B1}$ | $R^{B6}$ | $R^{B1}$ | N | N |
| $L_{A3183}$ | $R^{B3}$ | $R^{B1}$ | $R^{B7}$ | $R^{B1}$ | N | N |
| $L_{A3184}$ | $R^{B3}$ | $R^{B1}$ | $R^{B8}$ | $R^{B1}$ | N | N |
| $L_{A3185}$ | $R^{B3}$ | $R^{B1}$ | $R^{B9}$ | $R^{B1}$ | N | N |
| $L_{A3186}$ | $R^{B3}$ | $R^{B1}$ | $R^{A2}$ | $R^{B1}$ | N | N |
| $L_{A3187}$ | $R^{B3}$ | $R^{B1}$ | $R^{A27}$ | $R^{B1}$ | N | N |
| $L_{A3188}$ | $R^{B3}$ | $R^{B1}$ | $R^{A34}$ | $R^{B1}$ | N | N |
| $L_{A3189}$ | $R^{B1}$ | $R^{B1}$ | $R^{B2}$ | $R^{B2}$ | N | N |
| $L_{A3190}$ | $R^{B1}$ | $R^{B1}$ | $R^{B3}$ | $R^{B3}$ | N | N |
| $L_{A3191}$ | $R^{B1}$ | $R^{B1}$ | $R^{B4}$ | $R^{B4}$ | N | N |
| $L_{A3192}$ | $R^{B1}$ | $R^{B1}$ | $R^{B5}$ | $R^{B5}$ | N | N |
| $L_{A3193}$ | $R^{B1}$ | $R^{B1}$ | $R^{B6}$ | $R^{B6}$ | N | N |
| $L_{A3194}$ | $R^{B1}$ | $R^{B1}$ | $R^{B7}$ | $R^{B7}$ | N | N |
| $L_{A3195}$ | $R^{B1}$ | $R^{B1}$ | $R^{B8}$ | $R^{B8}$ | N | N |
| $L_{A3196}$ | $R^{B1}$ | $R^{B1}$ | $R^{B9}$ | $R^{B9}$ | N | N |
| $L_{A3197}$ | $R^{B1}$ | $R^{B1}$ | $R^{A2}$ | $R^{A2}$ | N | N |
| $L_{A3198}$ | $R^{B1}$ | $R^{B1}$ | $R^{A27}$ | $R^{A27}$ | N | N |
| $L_{A3199}$ | $R^{B1}$ | $R^{B1}$ | $R^{A34}$ | $R^{A34}$ | N | N |
| $L_{A3200}$ | $R^{B2}$ | $R^{B1}$ | $R^{B2}$ | $R^{B2}$ | N | N |
| $L_{A3201}$ | $R^{B2}$ | $R^{B1}$ | $R^{B3}$ | $R^{B3}$ | N | N |
| $L_{A3202}$ | $R^{B2}$ | $R^{B1}$ | $R^{B4}$ | $R^{B4}$ | N | N |
| $L_{A3203}$ | $R^{B2}$ | $R^{B1}$ | $R^{B5}$ | $R^{B5}$ | N | N |
| $L_{A3204}$ | $R^{B2}$ | $R^{B1}$ | $R^{B6}$ | $R^{B6}$ | N | N |
| $L_{A3205}$ | $R^{B2}$ | $R^{B1}$ | $R^{B7}$ | $R^{B7}$ | N | N |
| $L_{A3206}$ | $R^{B2}$ | $R^{B1}$ | $R^{B8}$ | $R^{B8}$ | N | N |
| $L_{A3207}$ | $R^{B2}$ | $R^{B1}$ | $R^{B9}$ | $R^{B9}$ | N | N |
| $L_{A3208}$ | $R^{B2}$ | $R^{B1}$ | $R^{A2}$ | $R^{A2}$ | N | N |
| $L_{A3209}$ | $R^{B2}$ | $R^{B1}$ | $R^{A27}$ | $R^{A27}$ | N | N |
| $L_{A3210}$ | $R^{B2}$ | $R^{B1}$ | $R^{A34}$ | $R^{A34}$ | N | N |
| $L_{A3211}$ | $R^{B2}$ | F | $R^{B2}$ | $R^{B2}$ | N | N |
| $L_{A3212}$ | $R^{B2}$ | F | $R^{B3}$ | $R^{B3}$ | N | N |
| $L_{A3213}$ | $R^{B2}$ | F | $R^{B4}$ | $R^{B4}$ | N | N |
| $L_{A3214}$ | $R^{B2}$ | F | $R^{B5}$ | $R^{B5}$ | N | N |
| $L_{A3215}$ | $R^{B2}$ | F | $R^{B6}$ | $R^{B6}$ | N | N |
| $L_{A3216}$ | $R^{B2}$ | F | $R^{B7}$ | $R^{B7}$ | N | N |
| $L_{A3217}$ | $R^{B2}$ | F | $R^{B8}$ | $R^{B8}$ | N | N |
| $L_{A3218}$ | $R^{B2}$ | F | $R^{B9}$ | $R^{B9}$ | N | N |
| $L_{A3219}$ | $R^{B2}$ | F | $R^{A2}$ | $R^{A2}$ | N | N |
| $L_{A3220}$ | $R^{B2}$ | F | $R^{A27}$ | $R^{A27}$ | N | N |
| $L_{A3221}$ | $R^{B2}$ | F | $R^{A34}$ | $R^{A34}$ | N | N |
| $L_{A3222}$ | $R^{B3}$ | $R^{B1}$ | $R^{B2}$ | $R^{B2}$ | N | N |
| $L_{A3223}$ | $R^{B3}$ | $R^{B1}$ | $R^{B3}$ | $R^{B3}$ | N | N |
| $L_{A3224}$ | $R^{B3}$ | $R^{B1}$ | $R^{B4}$ | $R^{B4}$ | N | N |
| $L_{A3225}$ | $R^{B3}$ | $R^{B1}$ | $R^{B5}$ | $R^{B5}$ | N | N |
| $L_{A3226}$ | $R^{B3}$ | $R^{B1}$ | $R^{B6}$ | $R^{B6}$ | N | N |
| $L_{A3227}$ | $R^{B3}$ | $R^{B1}$ | $R^{B7}$ | $R^{B7}$ | N | N |
| $L_{A3228}$ | $R^{B3}$ | $R^{B1}$ | $R^{B8}$ | $R^{B8}$ | N | N |
| $L_{A3229}$ | $R^{B3}$ | $R^{B1}$ | $R^{B9}$ | $R^{B9}$ | N | N |
| $L_{A3230}$ | $R^{B3}$ | $R^{B1}$ | $R^{A2}$ | $R^{A2}$ | N | N |
| $L_{A3231}$ | $R^{B3}$ | $R^{B1}$ | $R^{A27}$ | $R^{A27}$ | N | N |
| $L_{A3232}$ | $R^{B3}$ | $R^{B1}$ | $R^{A34}$ | $R^{A34}$ | N | N |

for $L_{A3233}$ through $L_{A3808}$, $L_A$ has a structure of

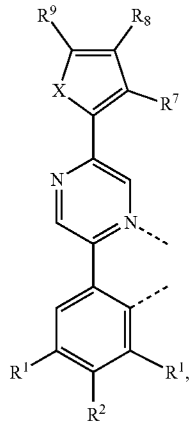

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A3233}$ | $R^{B1}$ | $R^{B1}$ | $R^{B1}$ | $R^{B1}$ | $R^{B1}$ | S |
| $L_{A3234}$ | $R^{B1}$ | $R^{B1}$ | $R^{B1}$ | $R^{B1}$ | $R^{B2}$ | S |
| $L_{A3235}$ | $R^{B1}$ | $R^{B1}$ | $R^{B1}$ | $R^{B1}$ | $R^{B3}$ | S |
| $L_{A3236}$ | $R^{B1}$ | $R^{B1}$ | $R^{B1}$ | $R^{B1}$ | $R^{B4}$ | S |
| $L_{A3237}$ | $R^{B1}$ | $R^{B1}$ | $R^{B1}$ | $R^{B1}$ | $R^{B5}$ | S |
| $L_{A3238}$ | $R^{B1}$ | $R^{B1}$ | $R^{B1}$ | $R^{B1}$ | $R^{B6}$ | S |
| $L_{A3239}$ | $R^{B1}$ | $R^{B1}$ | $R^{B1}$ | $R^{B1}$ | $R^{B7}$ | S |
| $L_{A3240}$ | $R^{B1}$ | $R^{B1}$ | $R^{B1}$ | $R^{B1}$ | $R^{B8}$ | S |
| $L_{A3241}$ | $R^{B1}$ | $R^{B1}$ | $R^{B1}$ | $R^{B1}$ | $R^{B9}$ | S |
| $L_{A3242}$ | $R^{B1}$ | $R^{B1}$ | $R^{B1}$ | $R^{B1}$ | $R^{A2}$ | S |
| $L_{A3243}$ | $R^{B1}$ | $R^{B1}$ | $R^{B1}$ | $R^{B1}$ | $R^{A27}$ | S |
| $L_{A3244}$ | $R^{B1}$ | $R^{B1}$ | $R^{B1}$ | $R^{B1}$ | $R^{A34}$ | S |
| $L_{A3245}$ | $R^{B2}$ | $R^{B1}$ | $R^{B1}$ | $R^{B1}$ | $R^{B1}$ | S |
| $L_{A3246}$ | $R^{B2}$ | $R^{B1}$ | $R^{B1}$ | $R^{B1}$ | $R^{B2}$ | S |
| $L_{A3247}$ | $R^{B2}$ | $R^{B1}$ | $R^{B1}$ | $R^{B1}$ | $R^{B3}$ | S |
| $L_{A3248}$ | $R^{B2}$ | $R^{B1}$ | $R^{B1}$ | $R^{B1}$ | $R^{B4}$ | S |
| $L_{A3249}$ | $R^{B2}$ | $R^{B1}$ | $R^{B1}$ | $R^{B1}$ | $R^{B5}$ | S |
| $L_{A3250}$ | $R^{B2}$ | $R^{B1}$ | $R^{B1}$ | $R^{B1}$ | $R^{B6}$ | S |
| $L_{A3251}$ | $R^{B2}$ | $R^{B1}$ | $R^{B1}$ | $R^{B1}$ | $R^{B7}$ | S |
| $L_{A3252}$ | $R^{B2}$ | $R^{B1}$ | $R^{B1}$ | $R^{B1}$ | $R^{B8}$ | S |
| $L_{A3253}$ | $R^{B2}$ | $R^{B1}$ | $R^{B1}$ | $R^{B1}$ | $R^{B9}$ | S |
| $L_{A3254}$ | $R^{B2}$ | $R^{B1}$ | $R^{B1}$ | $R^{B1}$ | $R^{A2}$ | S |
| $L_{A3255}$ | $R^{B2}$ | $R^{B1}$ | $R^{B1}$ | $R^{B1}$ | $R^{A27}$ | S |
| $L_{A3256}$ | $R^{B2}$ | $R^{B1}$ | $R^{B1}$ | $R^{B1}$ | $R^{A34}$ | S |
| $L_{A3257}$ | $R^{B2}$ | F | $R^{B1}$ | $R^{B1}$ | $R^{B1}$ | S |
| $L_{A3258}$ | $R^{B2}$ | F | $R^{B1}$ | $R^{B1}$ | $R^{B2}$ | S |
| $L_{A3259}$ | $R^{B2}$ | F | $R^{B1}$ | $R^{B1}$ | $R^{B3}$ | S |
| $L_{A3260}$ | $R^{B2}$ | F | $R^{B1}$ | $R^{B1}$ | $R^{B4}$ | S |
| $L_{A3261}$ | $R^{B2}$ | F | $R^{B1}$ | $R^{B1}$ | $R^{B5}$ | S |
| $L_{A3262}$ | $R^{B2}$ | F | $R^{B1}$ | $R^{B1}$ | $R^{B6}$ | S |
| $L_{A3263}$ | $R^{B2}$ | F | $R^{B1}$ | $R^{B1}$ | $R^{B7}$ | S |
| $L_{A3264}$ | $R^{B2}$ | F | $R^{B1}$ | $R^{B1}$ | $R^{B8}$ | S |
| $L_{A3265}$ | $R^{B2}$ | F | $R^{B1}$ | $R^{B1}$ | $R^{B9}$ | S |
| $L_{A3266}$ | $R^{B2}$ | F | $R^{B1}$ | $R^{B1}$ | $R^{A2}$ | S |
| $L_{A3267}$ | $R^{B2}$ | F | $R^{B1}$ | $R^{B1}$ | $R^{A27}$ | S |
| $L_{A3268}$ | $R^{B2}$ | F | $R^{B1}$ | $R^{B1}$ | $R^{A34}$ | S |
| $L_{A3269}$ | $R^{B3}$ | $R^{B1}$ | $R^{B1}$ | $R^{B1}$ | $R^{B1}$ | S |
| $L_{A3270}$ | $R^{B3}$ | $R^{B1}$ | $R^{B1}$ | $R^{B1}$ | $R^{B2}$ | S |
| $L_{A3271}$ | $R^{B3}$ | $R^{B1}$ | $R^{B1}$ | $R^{B1}$ | $R^{B3}$ | S |
| $L_{A3272}$ | $R^{B3}$ | $R^{B1}$ | $R^{B1}$ | $R^{B1}$ | $R^{B4}$ | S |
| $L_{A3273}$ | $R^{B3}$ | $R^{B1}$ | $R^{B1}$ | $R^{B1}$ | $R^{B5}$ | S |
| $L_{A3274}$ | $R^{B3}$ | $R^{B1}$ | $R^{B1}$ | $R^{B1}$ | $R^{B6}$ | S |
| $L_{A3275}$ | $R^{B3}$ | $R^{B1}$ | $R^{B1}$ | $R^{B1}$ | $R^{B7}$ | S |
| $L_{A3276}$ | $R^{B3}$ | $R^{B1}$ | $R^{B1}$ | $R^{B1}$ | $R^{B8}$ | S |
| $L_{A3277}$ | $R^{B3}$ | $R^{B1}$ | $R^{B1}$ | $R^{B1}$ | $R^{B9}$ | S |
| $L_{A3278}$ | $R^{B3}$ | $R^{B1}$ | $R^{B1}$ | $R^{B1}$ | $R^{A2}$ | S |
| $L_{A3279}$ | $R^{B3}$ | $R^{B1}$ | $R^{B1}$ | $R^{B1}$ | $R^{A27}$ | S |
| $L_{A3280}$ | $R^{B3}$ | $R^{B1}$ | $R^{B1}$ | $R^{B1}$ | $R^{A34}$ | S |
| $L_{A3281}$ | $R^{B1}$ | $R^{B1}$ | $R^{B1}$ | $R^{B1}$ | $R^{B1}$ | S |
| $L_{A3282}$ | $R^{B1}$ | $R^{B1}$ | $R^{B1}$ | $R^{B2}$ | $R^{B1}$ | S |
| $L_{A3283}$ | $R^{B1}$ | $R^{B1}$ | $R^{B1}$ | $R^{B3}$ | $R^{B1}$ | S |

-continued

| | $R^1$ | $R^2$ | $R^7$ | $R^8$ | $R^9$ | X |
|---|---|---|---|---|---|---|
| $L_{A3284}$ | $R^{B1}$ | $R^{B1}$ | $R^{B1}$ | $R^{B4}$ | $R^{B1}$ | S |
| $L_{A3285}$ | $R^{B1}$ | $R^{B1}$ | $R^{B1}$ | $R^{B5}$ | $R^{B1}$ | S |
| $L_{A3286}$ | $R^{B1}$ | $R^{B1}$ | $R^{B1}$ | $R^{B6}$ | $R^{B1}$ | S |
| $L_{A3287}$ | $R^{B1}$ | $R^{B1}$ | $R^{B1}$ | $R^{B7}$ | $R^{B1}$ | S |
| $L_{A3288}$ | $R^{B1}$ | $R^{B1}$ | $R^{B1}$ | $R^{B8}$ | $R^{B1}$ | S |
| $L_{A3289}$ | $R^{B1}$ | $R^{B1}$ | $R^{B1}$ | $R^{B9}$ | $R^{B1}$ | S |
| $L_{A3290}$ | $R^{B1}$ | $R^{B1}$ | $R^{B1}$ | $R^{A2}$ | $R^{B1}$ | S |
| $L_{A3291}$ | $R^{B1}$ | $R^{B1}$ | $R^{B1}$ | $R^{A27}$ | $R^{B1}$ | S |
| $L_{A3292}$ | $R^{B1}$ | $R^{B1}$ | $R^{B1}$ | $R^{A34}$ | $R^{B1}$ | S |
| $L_{A3293}$ | $R^{B2}$ | $R^{B1}$ | $R^{B1}$ | $R^{B1}$ | $R^{B1}$ | S |
| $L_{A3294}$ | $R^{B2}$ | $R^{B1}$ | $R^{B1}$ | $R^{B2}$ | $R^{B1}$ | S |
| $L_{A3295}$ | $R^{B2}$ | $R^{B1}$ | $R^{B1}$ | $R^{B3}$ | $R^{B1}$ | S |
| $L_{A3296}$ | $R^{B2}$ | $R^{B1}$ | $R^{B1}$ | $R^{B4}$ | $R^{B1}$ | S |
| $L_{A3297}$ | $R^{B2}$ | $R^{B1}$ | $R^{B1}$ | $R^{B5}$ | $R^{B1}$ | S |
| $L_{A3298}$ | $R^{B2}$ | $R^{B1}$ | $R^{B1}$ | $R^{B6}$ | $R^{B1}$ | S |
| $L_{A3299}$ | $R^{B2}$ | $R^{B1}$ | $R^{B1}$ | $R^{B7}$ | $R^{B1}$ | S |
| $L_{A3300}$ | $R^{B2}$ | $R^{B1}$ | $R^{B1}$ | $R^{B8}$ | $R^{B1}$ | S |
| $L_{A3301}$ | $R^{B2}$ | $R^{B1}$ | $R^{B1}$ | $R^{B9}$ | $R^{B1}$ | S |
| $L_{A3302}$ | $R^{B2}$ | $R^{B1}$ | $R^{B1}$ | $R^{A2}$ | $R^{B1}$ | S |
| $L_{A3303}$ | $R^{B2}$ | $R^{B1}$ | $R^{B1}$ | $R^{A27}$ | $R^{B1}$ | S |
| $L_{A3304}$ | $R^{B2}$ | $R^{B1}$ | $R^{B1}$ | $R^{A34}$ | $R^{B1}$ | S |
| $L_{A3305}$ | $R^{B2}$ | F | $R^{B1}$ | $R^{B1}$ | $R^{B1}$ | S |
| $L_{A3306}$ | $R^{B2}$ | F | $R^{B1}$ | $R^{B2}$ | $R^{B1}$ | S |
| $L_{A3307}$ | $R^{B2}$ | F | $R^{B1}$ | $R^{B3}$ | $R^{B1}$ | S |
| $L_{A3308}$ | $R^{B2}$ | F | $R^{B1}$ | $R^{B4}$ | $R^{B1}$ | S |
| $L_{A3309}$ | $R^{B2}$ | F | $R^{B1}$ | $R^{B5}$ | $R^{B1}$ | S |
| $L_{A3310}$ | $R^{B2}$ | F | $R^{B1}$ | $R^{B6}$ | $R^{B1}$ | S |
| $L_{A3311}$ | $R^{B2}$ | F | $R^{B1}$ | $R^{B7}$ | $R^{B1}$ | S |
| $L_{A3312}$ | $R^{B2}$ | F | $R^{B1}$ | $R^{B8}$ | $R^{B1}$ | S |
| $L_{A3313}$ | $R^{B2}$ | F | $R^{B1}$ | $R^{B9}$ | $R^{B1}$ | S |
| $L_{A3314}$ | $R^{B2}$ | F | $R^{B1}$ | $R^{A2}$ | $R^{B1}$ | S |
| $L_{A3315}$ | $R^{B2}$ | F | $R^{B1}$ | $R^{A27}$ | $R^{B1}$ | S |
| $L_{A3316}$ | $R^{B2}$ | F | $R^{B1}$ | $R^{A34}$ | $R^{B1}$ | S |
| $L_{A3317}$ | $R^{B3}$ | $R^{B1}$ | $R^{B1}$ | $R^{B1}$ | $R^{B1}$ | S |
| $L_{A3318}$ | $R^{B3}$ | $R^{B1}$ | $R^{B1}$ | $R^{B2}$ | $R^{B1}$ | S |
| $L_{A3319}$ | $R^{B3}$ | $R^{B1}$ | $R^{B1}$ | $R^{B3}$ | $R^{B1}$ | S |
| $L_{A3320}$ | $R^{B3}$ | $R^{B1}$ | $R^{B1}$ | $R^{B4}$ | $R^{B1}$ | S |
| $L_{A3321}$ | $R^{B3}$ | $R^{B1}$ | $R^{B1}$ | $R^{B5}$ | $R^{B1}$ | S |
| $L_{A3322}$ | $R^{B3}$ | $R^{B1}$ | $R^{B1}$ | $R^{B6}$ | $R^{B1}$ | S |
| $L_{A3323}$ | $R^{B3}$ | $R^{B1}$ | $R^{B1}$ | $R^{B7}$ | $R^{B1}$ | S |
| $L_{A3324}$ | $R^{B3}$ | $R^{B1}$ | $R^{B1}$ | $R^{B8}$ | $R^{B1}$ | S |
| $L_{A3325}$ | $R^{B3}$ | $R^{B1}$ | $R^{B1}$ | $R^{B9}$ | $R^{B1}$ | S |
| $L_{A3326}$ | $R^{B3}$ | $R^{B1}$ | $R^{B1}$ | $R^{A2}$ | $R^{B1}$ | S |
| $L_{A3327}$ | $R^{B3}$ | $R^{B1}$ | $R^{B1}$ | $R^{A27}$ | $R^{B1}$ | S |
| $L_{A3328}$ | $R^{B3}$ | $R^{B1}$ | $R^{B1}$ | $R^{A34}$ | $R^{B1}$ | S |
| $L_{A3329}$ | $R^{B1}$ | $R^{B1}$ | $R^{B1}$ | $R^{B1}$ | $R^{B1}$ | S |
| $L_{A3330}$ | $R^{B1}$ | $R^{B1}$ | $R^{B2}$ | $R^{B1}$ | $R^{B1}$ | S |
| $L_{A3331}$ | $R^{B1}$ | $R^{B1}$ | $R^{B3}$ | $R^{B1}$ | $R^{B1}$ | S |
| $L_{A3332}$ | $R^{B1}$ | $R^{B1}$ | $R^{B4}$ | $R^{B1}$ | $R^{B1}$ | S |
| $L_{A3333}$ | $R^{B1}$ | $R^{B1}$ | $R^{B5}$ | $R^{B1}$ | $R^{B1}$ | S |
| $L_{A3334}$ | $R^{B1}$ | $R^{B1}$ | $R^{B6}$ | $R^{B1}$ | $R^{B1}$ | S |
| $L_{A3335}$ | $R^{B1}$ | $R^{B1}$ | $R^{B7}$ | $R^{B1}$ | $R^{B1}$ | S |
| $L_{A3336}$ | $R^{B1}$ | $R^{B1}$ | $R^{B8}$ | $R^{B1}$ | $R^{B1}$ | S |
| $L_{A3337}$ | $R^{B1}$ | $R^{B1}$ | $R^{B9}$ | $R^{B1}$ | $R^{B1}$ | S |
| $L_{A3338}$ | $R^{B1}$ | $R^{B1}$ | $R^{A2}$ | $R^{B1}$ | $R^{B1}$ | S |
| $L_{A3339}$ | $R^{B1}$ | $R^{B1}$ | $R^{A27}$ | $R^{B1}$ | $R^{B1}$ | S |
| $L_{A3340}$ | $R^{B1}$ | $R^{B1}$ | $R^{A34}$ | $R^{B1}$ | $R^{B1}$ | S |
| $L_{A3341}$ | $R^{B2}$ | $R^{B1}$ | $R^{B1}$ | $R^{B1}$ | $R^{B1}$ | S |
| $L_{A3342}$ | $R^{B2}$ | $R^{B1}$ | $R^{B2}$ | $R^{B1}$ | $R^{B1}$ | S |
| $L_{A3343}$ | $R^{B2}$ | $R^{B1}$ | $R^{B3}$ | $R^{B1}$ | $R^{B1}$ | S |
| $L_{A3344}$ | $R^{B2}$ | $R^{B1}$ | $R^{B4}$ | $R^{B1}$ | $R^{B1}$ | S |
| $L_{A3345}$ | $R^{B2}$ | $R^{B1}$ | $R^{B5}$ | $R^{B1}$ | $R^{B1}$ | S |
| $L_{A3346}$ | $R^{B2}$ | $R^{B1}$ | $R^{B6}$ | $R^{B1}$ | $R^{B1}$ | S |
| $L_{A3347}$ | $R^{B2}$ | $R^{B1}$ | $R^{B7}$ | $R^{B1}$ | $R^{B1}$ | S |
| $L_{A3348}$ | $R^{B2}$ | $R^{B1}$ | $R^{B8}$ | $R^{B1}$ | $R^{B1}$ | S |
| $L_{A3349}$ | $R^{B2}$ | $R^{B1}$ | $R^{B9}$ | $R^{B1}$ | $R^{B1}$ | S |
| $L_{A3350}$ | $R^{B2}$ | $R^{B1}$ | $R^{A2}$ | $R^{B1}$ | $R^{B1}$ | S |
| $L_{A3351}$ | $R^{B2}$ | $R^{B1}$ | $R^{A27}$ | $R^{B1}$ | $R^{B1}$ | S |
| $L_{A3352}$ | $R^{B2}$ | $R^{B1}$ | $R^{A34}$ | $R^{B1}$ | $R^{B1}$ | S |
| $L_{A3353}$ | $R^{B2}$ | F | $R^{B1}$ | $R^{B1}$ | $R^{B1}$ | S |
| $L_{A3354}$ | $R^{B2}$ | F | $R^{B2}$ | $R^{B1}$ | $R^{B1}$ | S |
| $L_{A3355}$ | $R^{B2}$ | F | $R^{B3}$ | $R^{B1}$ | $R^{B1}$ | S |
| $L_{A3356}$ | $R^{B2}$ | F | $R^{B4}$ | $R^{B1}$ | $R^{B1}$ | S |
| $L_{A3357}$ | $R^{B2}$ | F | $R^{B5}$ | $R^{B1}$ | $R^{B1}$ | S |
| $L_{A3358}$ | $R^{B2}$ | F | $R^{B6}$ | $R^{B1}$ | $R^{B1}$ | S |
| $L_{A3359}$ | $R^{B2}$ | F | $R^{B7}$ | $R^{B1}$ | $R^{B1}$ | S |
| $L_{A3360}$ | $R^{B2}$ | F | $R^{B8}$ | $R^{B1}$ | $R^{B1}$ | S |
| $L_{A3361}$ | $R^{B2}$ | F | $R^{B9}$ | $R^{B1}$ | $R^{B1}$ | S |

-continued

| | $R^1$ | $R^2$ | $R^7$ | $R^8$ | $R^9$ | X |
|---|---|---|---|---|---|---|
| $L_{43362}$ | $R^{B2}$ | F | $R^{A2}$ | $R^{B1}$ | $R^{B1}$ | S |
| $L_{43363}$ | $R^{B2}$ | F | $R^{A27}$ | $R^{B1}$ | $R^{B1}$ | S |
| $L_{43364}$ | $R^{B2}$ | F | $R^{A34}$ | $R^{B1}$ | $R^{B1}$ | S |
| $L_{43365}$ | $R^{B3}$ | $R^{B1}$ | $R^{B1}$ | $R^{B1}$ | $R^{B1}$ | S |
| $L_{43366}$ | $R^{B3}$ | $R^{B1}$ | $R^{B2}$ | $R^{B1}$ | $R^{B1}$ | S |
| $L_{43367}$ | $R^{B3}$ | $R^{B1}$ | $R^{B3}$ | $R^{B1}$ | $R^{B1}$ | S |
| $L_{43368}$ | $R^{B3}$ | $R^{B1}$ | $R^{B4}$ | $R^{B1}$ | $R^{B1}$ | S |
| $L_{43369}$ | $R^{B3}$ | $R^{B1}$ | $R^{B5}$ | $R^{B1}$ | $R^{B1}$ | S |
| $L_{43370}$ | $R^{B3}$ | $R^{B1}$ | $R^{B6}$ | $R^{B1}$ | $R^{B1}$ | S |
| $L_{43371}$ | $R^{B3}$ | $R^{B1}$ | $R^{B7}$ | $R^{B1}$ | $R^{B1}$ | S |
| $L_{43372}$ | $R^{B3}$ | $R^{B1}$ | $R^{B8}$ | $R^{B1}$ | $R^{B1}$ | S |
| $L_{43373}$ | $R^{B3}$ | $R^{B1}$ | $R^{B9}$ | $R^{B1}$ | $R^{B1}$ | S |
| $L_{43374}$ | $R^{B3}$ | $R^{B1}$ | $R^{A2}$ | $R^{B1}$ | $R^{B1}$ | S |
| $L_{43375}$ | $R^{B3}$ | $R^{B1}$ | $R^{A27}$ | $R^{B1}$ | $R^{B1}$ | S |
| $L_{43376}$ | $R^{B3}$ | $R^{B1}$ | $R^{A34}$ | $R^{B1}$ | $R^{B1}$ | S |
| $L_{43377}$ | $R^{B1}$ | $R^{B1}$ | $R^{B1}$ | $R^{B1}$ | $R^{B1}$ | S |
| $L_{43378}$ | $R^{B1}$ | $R^{B1}$ | $R^{B2}$ | $R^{B1}$ | $R^{B2}$ | S |
| $L_{43379}$ | $R^{B1}$ | $R^{B1}$ | $R^{B3}$ | $R^{B1}$ | $R^{B3}$ | S |
| $L_{43380}$ | $R^{B1}$ | $R^{B1}$ | $R^{B4}$ | $R^{B1}$ | $R^{B4}$ | S |
| $L_{43381}$ | $R^{B1}$ | $R^{B1}$ | $R^{B5}$ | $R^{B1}$ | $R^{B5}$ | S |
| $L_{43382}$ | $R^{B1}$ | $R^{B1}$ | $R^{B6}$ | $R^{B1}$ | $R^{B6}$ | S |
| $L_{43383}$ | $R^{B1}$ | $R^{B1}$ | $R^{B7}$ | $R^{B1}$ | $R^{B7}$ | S |
| $L_{43384}$ | $R^{B1}$ | $R^{B1}$ | $R^{B8}$ | $R^{B1}$ | $R^{B8}$ | S |
| $L_{43385}$ | $R^{B1}$ | $R^{B1}$ | $R^{B9}$ | $R^{B1}$ | $R^{B9}$ | S |
| $L_{43386}$ | $R^{B1}$ | $R^{B1}$ | $R^{A2}$ | $R^{B1}$ | $R^{A2}$ | S |
| $L_{43387}$ | $R^{B1}$ | $R^{B1}$ | $R^{A27}$ | $R^{B1}$ | $R^{A27}$ | S |
| $L_{43388}$ | $R^{B1}$ | $R^{B1}$ | $R^{A34}$ | $R^{B1}$ | $R^{A34}$ | S |
| $L_{43389}$ | $R^{B2}$ | $R^{B1}$ | $R^{B1}$ | $R^{B1}$ | $R^{B1}$ | S |
| $L_{43390}$ | $R^{B2}$ | $R^{B1}$ | $R^{B2}$ | $R^{B1}$ | $R^{B2}$ | S |
| $L_{43391}$ | $R^{B2}$ | $R^{B1}$ | $R^{B3}$ | $R^{B1}$ | $R^{B3}$ | S |
| $L_{43392}$ | $R^{B2}$ | $R^{B1}$ | $R^{B4}$ | $R^{B1}$ | $R^{B4}$ | S |
| $L_{43393}$ | $R^{B2}$ | $R^{B1}$ | $R^{B5}$ | $R^{B1}$ | $R^{B5}$ | S |
| $L_{43394}$ | $R^{B2}$ | $R^{B1}$ | $R^{B6}$ | $R^{B1}$ | $R^{B6}$ | S |
| $L_{43395}$ | $R^{B2}$ | $R^{B1}$ | $R^{B7}$ | $R^{B1}$ | $R^{B7}$ | S |
| $L_{43396}$ | $R^{B2}$ | $R^{B1}$ | $R^{B8}$ | $R^{B1}$ | $R^{B8}$ | S |
| $L_{43397}$ | $R^{B2}$ | $R^{B1}$ | $R^{B9}$ | $R^{B1}$ | $R^{B9}$ | S |
| $L_{43398}$ | $R^{B2}$ | $R^{B1}$ | $R^{A2}$ | $R^{B1}$ | $R^{A2}$ | S |
| $L_{43399}$ | $R^{B2}$ | $R^{B1}$ | $R^{A27}$ | $R^{B1}$ | $R^{A27}$ | S |
| $L_{43400}$ | $R^{B2}$ | $R^{B1}$ | $R^{A34}$ | $R^{B1}$ | $R^{A34}$ | S |
| $L_{43401}$ | $R^{B2}$ | F | $R^{B1}$ | $R^{B1}$ | $R^{B1}$ | S |
| $L_{43402}$ | $R^{B2}$ | F | $R^{B2}$ | $R^{B1}$ | $R^{B2}$ | S |
| $L_{43403}$ | $R^{B2}$ | F | $R^{B3}$ | $R^{B1}$ | $R^{B3}$ | S |
| $L_{43404}$ | $R^{B2}$ | F | $R^{B4}$ | $R^{B1}$ | $R^{B4}$ | S |
| $L_{43405}$ | $R^{B2}$ | F | $R^{B5}$ | $R^{B1}$ | $R^{B5}$ | S |
| $L_{43406}$ | $R^{B2}$ | F | $R^{B6}$ | $R^{B1}$ | $R^{B6}$ | S |
| $L_{43407}$ | $R^{B2}$ | F | $R^{B7}$ | $R^{B1}$ | $R^{B7}$ | S |
| $L_{43408}$ | $R^{B2}$ | F | $R^{B8}$ | $R^{B1}$ | $R^{B8}$ | S |
| $L_{43409}$ | $R^{B2}$ | F | $R^{B9}$ | $R^{B1}$ | $R^{B9}$ | S |
| $L_{43410}$ | $R^{B2}$ | F | $R^{A2}$ | $R^{B1}$ | $R^{A2}$ | S |
| $L_{43411}$ | $R^{B2}$ | F | $R^{A27}$ | $R^{B1}$ | $R^{A27}$ | S |
| $L_{43412}$ | $R^{B2}$ | F | $R^{A34}$ | $R^{B1}$ | $R^{A34}$ | S |
| $L_{43413}$ | $R^{B3}$ | $R^{B1}$ | $R^{B1}$ | $R^{B1}$ | $R^{B1}$ | S |
| $L_{43414}$ | $R^{B3}$ | $R^{B1}$ | $R^{B2}$ | $R^{B1}$ | $R^{B2}$ | S |
| $L_{43415}$ | $R^{B3}$ | $R^{B1}$ | $R^{B3}$ | $R^{B1}$ | $R^{B3}$ | S |
| $L_{43416}$ | $R^{B3}$ | $R^{B1}$ | $R^{B4}$ | $R^{B1}$ | $R^{B4}$ | S |
| $L_{43417}$ | $R^{B3}$ | $R^{B1}$ | $R^{B5}$ | $R^{B1}$ | $R^{B5}$ | S |
| $L_{43418}$ | $R^{B3}$ | $R^{B1}$ | $R^{B6}$ | $R^{B1}$ | $R^{B6}$ | S |
| $L_{43419}$ | $R^{B3}$ | $R^{B1}$ | $R^{B7}$ | $R^{B1}$ | $R^{B7}$ | S |
| $L_{43420}$ | $R^{B3}$ | $R^{B1}$ | $R^{B8}$ | $R^{B1}$ | $R^{B8}$ | S |
| $L_{43421}$ | $R^{B3}$ | $R^{B1}$ | $R^{B9}$ | $R^{B1}$ | $R^{B9}$ | S |
| $L_{43422}$ | $R^{B3}$ | $R^{B1}$ | $R^{A2}$ | $R^{B1}$ | $R^{A2}$ | S |
| $L_{43423}$ | $R^{B3}$ | $R^{B1}$ | $R^{A27}$ | $R^{B1}$ | $R^{A27}$ | S |
| $L_{43424}$ | $R^{B3}$ | $R^{B1}$ | $R^{A34}$ | $R^{B1}$ | $R^{A34}$ | S |
| $L_{43425}$ | $R^{B1}$ | $R^{B1}$ | $R^{B1}$ | $R^{B1}$ | $R^{B1}$ | S |
| $L_{43426}$ | $R^{B1}$ | $R^{B1}$ | $R^{B1}$ | $R^{B2}$ | $R^{B2}$ | S |
| $L_{43427}$ | $R^{B1}$ | $R^{B1}$ | $R^{B1}$ | $R^{B3}$ | $R^{B3}$ | S |
| $L_{43428}$ | $R^{B1}$ | $R^{B1}$ | $R^{B1}$ | $R^{B4}$ | $R^{B4}$ | S |
| $L_{43429}$ | $R^{B1}$ | $R^{B1}$ | $R^{B1}$ | $R^{B5}$ | $R^{B5}$ | S |
| $L_{43430}$ | $R^{B1}$ | $R^{B1}$ | $R^{B1}$ | $R^{B6}$ | $R^{B6}$ | S |
| $L_{43431}$ | $R^{B1}$ | $R^{B1}$ | $R^{B1}$ | $R^{B7}$ | $R^{B7}$ | S |
| $L_{43432}$ | $R^{B1}$ | $R^{B1}$ | $R^{B1}$ | $R^{B8}$ | $R^{B8}$ | S |
| $L_{43433}$ | $R^{B1}$ | $R^{B1}$ | $R^{B1}$ | $R^{B9}$ | $R^{B9}$ | S |
| $L_{43434}$ | $R^{B1}$ | $R^{B1}$ | $R^{B1}$ | $R^{A2}$ | $R^{A2}$ | S |
| $L_{43435}$ | $R^{B1}$ | $R^{B1}$ | $R^{B1}$ | $R^{A27}$ | $R^{A27}$ | S |
| $L_{43436}$ | $R^{B1}$ | $R^{B1}$ | $R^{B1}$ | $R^{A34}$ | $R^{A34}$ | S |
| $L_{43437}$ | $R^{B2}$ | $R^{B1}$ | $R^{B1}$ | $R^{B1}$ | $R^{B1}$ | S |
| $L_{43438}$ | $R^{B2}$ | $R^{B1}$ | $R^{B1}$ | $R^{B2}$ | $R^{B2}$ | S |

-continued

| | $R^1$ | $R^2$ | $R^7$ | $R^8$ | $R^9$ | X |
|---|---|---|---|---|---|---|
| $L_{43439}$ | $R^{B2}$ | $R^{B1}$ | $R^{B1}$ | $R^{B3}$ | $R^{B3}$ | S |
| $L_{43440}$ | $R^{B2}$ | $R^{B1}$ | $R^{B1}$ | $R^{B4}$ | $R^{B4}$ | S |
| $L_{43441}$ | $R^{B2}$ | $R^{B1}$ | $R^{B1}$ | $R^{B5}$ | $R^{B5}$ | S |
| $L_{43442}$ | $R^{B2}$ | $R^{B1}$ | $R^{B1}$ | $R^{B6}$ | $R^{B6}$ | S |
| $L_{43443}$ | $R^{B2}$ | $R^{B1}$ | $R^{B1}$ | $R^{B7}$ | $R^{B7}$ | S |
| $L_{43444}$ | $R^{B2}$ | $R^{B1}$ | $R^{B1}$ | $R^{B8}$ | $R^{B8}$ | S |
| $L_{43445}$ | $R^{B2}$ | $R^{B1}$ | $R^{B1}$ | $R^{B9}$ | $R^{B9}$ | S |
| $L_{43446}$ | $R^{B2}$ | $R^{B1}$ | $R^{B1}$ | $R^{A2}$ | $R^{A2}$ | S |
| $L_{43447}$ | $R^{B2}$ | $R^{B1}$ | $R^{B1}$ | $R^{A27}$ | $R^{A27}$ | S |
| $L_{43448}$ | $R^{B2}$ | $R^{B1}$ | $R^{B1}$ | $R^{A34}$ | $R^{A34}$ | S |
| $L_{43449}$ | $R^{B2}$ | F | $R^{B1}$ | $R^{B1}$ | $R^{B1}$ | S |
| $L_{43450}$ | $R^{B2}$ | F | $R^{B1}$ | $R^{B2}$ | $R^{B2}$ | S |
| $L_{43451}$ | $R^{B2}$ | F | $R^{B1}$ | $R^{B3}$ | $R^{B3}$ | S |
| $L_{43452}$ | $R^{B2}$ | F | $R^{B1}$ | $R^{B4}$ | $R^{B4}$ | S |
| $L_{43453}$ | $R^{B2}$ | F | $R^{B1}$ | $R^{B5}$ | $R^{B5}$ | S |
| $L_{43454}$ | $R^{B2}$ | F | $R^{B1}$ | $R^{B6}$ | $R^{B6}$ | S |
| $L_{43455}$ | $R^{B2}$ | F | $R^{B1}$ | $R^{B7}$ | $R^{B7}$ | S |
| $L_{43456}$ | $R^{B2}$ | F | $R^{B1}$ | $R^{B8}$ | $R^{B8}$ | S |
| $L_{43457}$ | $R^{B2}$ | F | $R^{B1}$ | $R^{B9}$ | $R^{B9}$ | S |
| $L_{43458}$ | $R^{B2}$ | F | $R^{B1}$ | $R^{A2}$ | $R^{A2}$ | S |
| $L_{43459}$ | $R^{B2}$ | F | $R^{B1}$ | $R^{A27}$ | $R^{A27}$ | S |
| $L_{43460}$ | $R^{B2}$ | F | $R^{B1}$ | $R^{A34}$ | $R^{A34}$ | S |
| $L_{43461}$ | $R^{B3}$ | $R^{B1}$ | $R^{B1}$ | $R^{B1}$ | $R^{B1}$ | S |
| $L_{43462}$ | $R^{B3}$ | $R^{B1}$ | $R^{B1}$ | $R^{B2}$ | $R^{B2}$ | S |
| $L_{43463}$ | $R^{B3}$ | $R^{B1}$ | $R^{B1}$ | $R^{B3}$ | $R^{B3}$ | S |
| $L_{43464}$ | $R^{B3}$ | $R^{B1}$ | $R^{B1}$ | $R^{B4}$ | $R^{B4}$ | S |
| $L_{43465}$ | $R^{B3}$ | $R^{B1}$ | $R^{B1}$ | $R^{B5}$ | $R^{B5}$ | S |
| $L_{43466}$ | $R^{B3}$ | $R^{B1}$ | $R^{B1}$ | $R^{B6}$ | $R^{B6}$ | S |
| $L_{43467}$ | $R^{B3}$ | $R^{B1}$ | $R^{B1}$ | $R^{B7}$ | $R^{B7}$ | S |
| $L_{43468}$ | $R^{B3}$ | $R^{B1}$ | $R^{B1}$ | $R^{B8}$ | $R^{B8}$ | S |
| $L_{43469}$ | $R^{B3}$ | $R^{B1}$ | $R^{B1}$ | $R^{B9}$ | $R^{B9}$ | S |
| $L_{43470}$ | $R^{B3}$ | $R^{B1}$ | $R^{B1}$ | $R^{A2}$ | $R^{A2}$ | S |
| $L_{43471}$ | $R^{B3}$ | $R^{B1}$ | $R^{B1}$ | $R^{A27}$ | $R^{A27}$ | S |
| $L_{43472}$ | $R^{B3}$ | $R^{B1}$ | $R^{B1}$ | $R^{A34}$ | $R^{A34}$ | S |
| $L_{43473}$ | $R^{B1}$ | $R^{B1}$ | $R^{B1}$ | $R^{B1}$ | $R^{B1}$ | S |
| $L_{43474}$ | $R^{B1}$ | $R^{B1}$ | $R^{B2}$ | $R^{B2}$ | $R^{B1}$ | S |
| $L_{43475}$ | $R^{B1}$ | $R^{B1}$ | $R^{B3}$ | $R^{B3}$ | $R^{B1}$ | S |
| $L_{43476}$ | $R^{B1}$ | $R^{B1}$ | $R^{B4}$ | $R^{B4}$ | $R^{B1}$ | S |
| $L_{43477}$ | $R^{B1}$ | $R^{B1}$ | $R^{B5}$ | $R^{B5}$ | $R^{B1}$ | S |
| $L_{43478}$ | $R^{B1}$ | $R^{B1}$ | $R^{B6}$ | $R^{B6}$ | $R^{B1}$ | S |
| $L_{43479}$ | $R^{B1}$ | $R^{B1}$ | $R^{B7}$ | $R^{B7}$ | $R^{B1}$ | S |
| $L_{43480}$ | $R^{B1}$ | $R^{B1}$ | $R^{B8}$ | $R^{B8}$ | $R^{B1}$ | S |
| $L_{43481}$ | $R^{B1}$ | $R^{B1}$ | $R^{B9}$ | $R^{B9}$ | $R^{B1}$ | S |
| $L_{43482}$ | $R^{B1}$ | $R^{B1}$ | $R^{A2}$ | $R^{A2}$ | $R^{B1}$ | S |
| $L_{43483}$ | $R^{B1}$ | $R^{B1}$ | $R^{A27}$ | $R^{A27}$ | $R^{B1}$ | S |
| $L_{43484}$ | $R^{B1}$ | $R^{B1}$ | $R^{A34}$ | $R^{A34}$ | $R^{B1}$ | S |
| $L_{43485}$ | $R^{B2}$ | $R^{B1}$ | $R^{B1}$ | $R^{B1}$ | $R^{B1}$ | S |
| $L_{43486}$ | $R^{B2}$ | $R^{B1}$ | $R^{B2}$ | $R^{B2}$ | $R^{B1}$ | S |
| $L_{43487}$ | $R^{B2}$ | $R^{B1}$ | $R^{B3}$ | $R^{B3}$ | $R^{B1}$ | S |
| $L_{43488}$ | $R^{B2}$ | $R^{B1}$ | $R^{B4}$ | $R^{B4}$ | $R^{B1}$ | S |
| $L_{43489}$ | $R^{B2}$ | $R^{B1}$ | $R^{B5}$ | $R^{B5}$ | $R^{B1}$ | S |
| $L_{43490}$ | $R^{B2}$ | $R^{B1}$ | $R^{B6}$ | $R^{B6}$ | $R^{B1}$ | S |
| $L_{43491}$ | $R^{B2}$ | $R^{B1}$ | $R^{B7}$ | $R^{B7}$ | $R^{B1}$ | S |
| $L_{43492}$ | $R^{B2}$ | $R^{B1}$ | $R^{B8}$ | $R^{B8}$ | $R^{B1}$ | S |
| $L_{43493}$ | $R^{B2}$ | $R^{B1}$ | $R^{B9}$ | $R^{B9}$ | $R^{B1}$ | S |
| $L_{43494}$ | $R^{B2}$ | $R^{B1}$ | $R^{A2}$ | $R^{A2}$ | $R^{B1}$ | S |
| $L_{43495}$ | $R^{B2}$ | $R^{B1}$ | $R^{A27}$ | $R^{A27}$ | $R^{B1}$ | S |
| $L_{43496}$ | $R^{B2}$ | $R^{B1}$ | $R^{A34}$ | $R^{A34}$ | $R^{B1}$ | S |
| $L_{43497}$ | $R^{B2}$ | F | $R^{B1}$ | $R^{B1}$ | $R^{B1}$ | S |
| $L_{43498}$ | $R^{B2}$ | F | $R^{B2}$ | $R^{B2}$ | $R^{B1}$ | S |
| $L_{43499}$ | $R^{B2}$ | F | $R^{B3}$ | $R^{B3}$ | $R^{B1}$ | S |
| $L_{43500}$ | $R^{B2}$ | F | $R^{B4}$ | $R^{B4}$ | $R^{B1}$ | S |
| $L_{43501}$ | $R^{B2}$ | F | $R^{B5}$ | $R^{B5}$ | $R^{B1}$ | S |
| $L_{43502}$ | $R^{B2}$ | F | $R^{B6}$ | $R^{B6}$ | $R^{B1}$ | S |
| $L_{43503}$ | $R^{B2}$ | F | $R^{B7}$ | $R^{B7}$ | $R^{B1}$ | S |
| $L_{43504}$ | $R^{B2}$ | F | $R^{B8}$ | $R^{B8}$ | $R^{B1}$ | S |
| $L_{43505}$ | $R^{B2}$ | F | $R^{B9}$ | $R^{B9}$ | $R^{B1}$ | S |
| $L_{43506}$ | $R^{B2}$ | F | $R^{A2}$ | $R^{A2}$ | $R^{B1}$ | S |
| $L_{43507}$ | $R^{B2}$ | F | $R^{A27}$ | $R^{A27}$ | $R^{B1}$ | S |
| $L_{43508}$ | $R^{B2}$ | F | $R^{A34}$ | $R^{A34}$ | $R^{B1}$ | S |
| $L_{43509}$ | $R^{B3}$ | $R^{B1}$ | $R^{B1}$ | $R^{B1}$ | $R^{B1}$ | S |
| $L_{43510}$ | $R^{B3}$ | $R^{B1}$ | $R^{B2}$ | $R^{B2}$ | $R^{B1}$ | S |
| $L_{43511}$ | $R^{B3}$ | $R^{B1}$ | $R^{B3}$ | $R^{B3}$ | $R^{B1}$ | S |
| $L_{43512}$ | $R^{B3}$ | $R^{B1}$ | $R^{B4}$ | $R^{B4}$ | $R^{B1}$ | S |
| $L_{43513}$ | $R^{B3}$ | $R^{B1}$ | $R^{B5}$ | $R^{B5}$ | $R^{B1}$ | S |
| $L_{43514}$ | $R^{B3}$ | $R^{B1}$ | $R^{B6}$ | $R^{B6}$ | $R^{B1}$ | S |
| $L_{43515}$ | $R^{B3}$ | $R^{B1}$ | $R^{B7}$ | $R^{B7}$ | $R^{B1}$ | S |

-continued

| | $R^1$ | $R^2$ | $R^7$ | $R^8$ | $R^9$ | X |
|---|---|---|---|---|---|---|
| $L_{43516}$ | $R^{B3}$ | $R^{B1}$ | $R^{B8}$ | $R^{B8}$ | $R^{B1}$ | S |
| $L_{43517}$ | $R^{B3}$ | $R^{B1}$ | $R^{B9}$ | $R^{B9}$ | $R^{B1}$ | S |
| $L_{43518}$ | $R^{B3}$ | $R^{B1}$ | $R^{A2}$ | $R^{A2}$ | $R^{B1}$ | S |
| $L_{43519}$ | $R^{B3}$ | $R^{B1}$ | $R^{A27}$ | $R^{A27}$ | $R^{B1}$ | S |
| $L_{43520}$ | $R^{B3}$ | $R^{B1}$ | $R^{A34}$ | $R^{A34}$ | $R^{B1}$ | S |
| $L_{43521}$ | $R^{B1}$ | $R^{B1}$ | $R^{B1}$ | $R^{B1}$ | $R^{B1}$ | O |
| $L_{43522}$ | $R^{B1}$ | $R^{B1}$ | $R^{B1}$ | $R^{B1}$ | $R^{B2}$ | O |
| $L_{43523}$ | $R^{B1}$ | $R^{B1}$ | $R^{B1}$ | $R^{B1}$ | $R^{B3}$ | O |
| $L_{43524}$ | $R^{B1}$ | $R^{B1}$ | $R^{B1}$ | $R^{B1}$ | $R^{B4}$ | O |
| $L_{43525}$ | $R^{B1}$ | $R^{B1}$ | $R^{B1}$ | $R^{B1}$ | $R^{B5}$ | O |
| $L_{43526}$ | $R^{B1}$ | $R^{B1}$ | $R^{B1}$ | $R^{B1}$ | $R^{B6}$ | O |
| $L_{43527}$ | $R^{B1}$ | $R^{B1}$ | $R^{B1}$ | $R^{B1}$ | $R^{B7}$ | O |
| $L_{43528}$ | $R^{B1}$ | $R^{B1}$ | $R^{B1}$ | $R^{B1}$ | $R^{B8}$ | O |
| $L_{43529}$ | $R^{B1}$ | $R^{B1}$ | $R^{B1}$ | $R^{B1}$ | $R^{B9}$ | O |
| $L_{43530}$ | $R^{B1}$ | $R^{B1}$ | $R^{B1}$ | $R^{B1}$ | $R^{A2}$ | O |
| $L_{43531}$ | $R^{B1}$ | $R^{B1}$ | $R^{B1}$ | $R^{B1}$ | $R^{A27}$ | O |
| $L_{43532}$ | $R^{B1}$ | $R^{B1}$ | $R^{B1}$ | $R^{B1}$ | $R^{A34}$ | O |
| $L_{43533}$ | $R^{B2}$ | $R^{B1}$ | $R^{B1}$ | $R^{B1}$ | $R^{B1}$ | O |
| $L_{43534}$ | $R^{B2}$ | $R^{B1}$ | $R^{B1}$ | $R^{B1}$ | $R^{B2}$ | O |
| $L_{43535}$ | $R^{B2}$ | $R^{B1}$ | $R^{B1}$ | $R^{B1}$ | $R^{B3}$ | O |
| $L_{43536}$ | $R^{B2}$ | $R^{B1}$ | $R^{B1}$ | $R^{B1}$ | $R^{B4}$ | O |
| $L_{43537}$ | $R^{B2}$ | $R^{B1}$ | $R^{B1}$ | $R^{B1}$ | $R^{B5}$ | O |
| $L_{43538}$ | $R^{B2}$ | $R^{B1}$ | $R^{B1}$ | $R^{B1}$ | $R^{B6}$ | O |
| $L_{43539}$ | $R^{B2}$ | $R^{B1}$ | $R^{B1}$ | $R^{B1}$ | $R^{B7}$ | O |
| $L_{43540}$ | $R^{B2}$ | $R^{B1}$ | $R^{B1}$ | $R^{B1}$ | $R^{B8}$ | O |
| $L_{43541}$ | $R^{B2}$ | $R^{B1}$ | $R^{B1}$ | $R^{B1}$ | $R^{B9}$ | O |
| $L_{43542}$ | $R^{B2}$ | $R^{B1}$ | $R^{B1}$ | $R^{B1}$ | $R^{A2}$ | O |
| $L_{43543}$ | $R^{B2}$ | $R^{B1}$ | $R^{B1}$ | $R^{B1}$ | $R^{A27}$ | O |
| $L_{43544}$ | $R^{B2}$ | $R^{B1}$ | $R^{B1}$ | $R^{B1}$ | $R^{A34}$ | O |
| $L_{43545}$ | $R^{B2}$ | F | $R^{B1}$ | $R^{B1}$ | $R^{B1}$ | O |
| $L_{43546}$ | $R^{B2}$ | F | $R^{B1}$ | $R^{B1}$ | $R^{B2}$ | O |
| $L_{43547}$ | $R^{B2}$ | F | $R^{B1}$ | $R^{B1}$ | $R^{B3}$ | O |
| $L_{43548}$ | $R^{B2}$ | F | $R^{B1}$ | $R^{B1}$ | $R^{B4}$ | O |
| $L_{43549}$ | $R^{B2}$ | F | $R^{B1}$ | $R^{B1}$ | $R^{B5}$ | O |
| $L_{43550}$ | $R^{B2}$ | F | $R^{B1}$ | $R^{B1}$ | $R^{B6}$ | O |
| $L_{43551}$ | $R^{B2}$ | F | $R^{B1}$ | $R^{B1}$ | $R^{B7}$ | O |
| $L_{43552}$ | $R^{B2}$ | F | $R^{B1}$ | $R^{B1}$ | $R^{B8}$ | O |
| $L_{43553}$ | $R^{B2}$ | F | $R^{B1}$ | $R^{B1}$ | $R^{B9}$ | O |
| $L_{43554}$ | $R^{B2}$ | F | $R^{B1}$ | $R^{B1}$ | $R^{A2}$ | O |
| $L_{43555}$ | $R^{B2}$ | F | $R^{B1}$ | $R^{B1}$ | $R^{A27}$ | O |
| $L_{43556}$ | $R^{B2}$ | F | $R^{B1}$ | $R^{B1}$ | $R^{A34}$ | O |
| $L_{43557}$ | $R^{B3}$ | $R^{B1}$ | $R^{B1}$ | $R^{B1}$ | $R^{B1}$ | O |
| $L_{43558}$ | $R^{B3}$ | $R^{B1}$ | $R^{B1}$ | $R^{B1}$ | $R^{B2}$ | O |
| $L_{43559}$ | $R^{B3}$ | $R^{B1}$ | $R^{B1}$ | $R^{B1}$ | $R^{B3}$ | O |
| $L_{43560}$ | $R^{B3}$ | $R^{B1}$ | $R^{B1}$ | $R^{B1}$ | $R^{B4}$ | O |
| $L_{43561}$ | $R^{B3}$ | $R^{B1}$ | $R^{B1}$ | $R^{B1}$ | $R^{B5}$ | O |
| $L_{43562}$ | $R^{B3}$ | $R^{B1}$ | $R^{B1}$ | $R^{B1}$ | $R^{B6}$ | O |
| $L_{43563}$ | $R^{B3}$ | $R^{B1}$ | $R^{B1}$ | $R^{B1}$ | $R^{B7}$ | O |
| $L_{43564}$ | $R^{B3}$ | $R^{B1}$ | $R^{B1}$ | $R^{B1}$ | $R^{B8}$ | O |
| $L_{43565}$ | $R^{B3}$ | $R^{B1}$ | $R^{B1}$ | $R^{B1}$ | $R^{B9}$ | O |
| $L_{43566}$ | $R^{B3}$ | $R^{B1}$ | $R^{B1}$ | $R^{B1}$ | $R^{A2}$ | O |
| $L_{43567}$ | $R^{B3}$ | $R^{B1}$ | $R^{B1}$ | $R^{B1}$ | $R^{A27}$ | O |
| $L_{43568}$ | $R^{B3}$ | $R^{B1}$ | $R^{B1}$ | $R^{B1}$ | $R^{A34}$ | O |
| $L_{43569}$ | $R^{B1}$ | $R^{B1}$ | $R^{B1}$ | $R^{B1}$ | $R^{B1}$ | O |
| $L_{43570}$ | $R^{B1}$ | $R^{B1}$ | $R^{B1}$ | $R^{B2}$ | $R^{B1}$ | O |
| $L_{43571}$ | $R^{B1}$ | $R^{B1}$ | $R^{B1}$ | $R^{B3}$ | $R^{B1}$ | O |
| $L_{43572}$ | $R^{B1}$ | $R^{B1}$ | $R^{B1}$ | $R^{B4}$ | $R^{B1}$ | O |
| $L_{43573}$ | $R^{B1}$ | $R^{B1}$ | $R^{B1}$ | $R^{B5}$ | $R^{B1}$ | O |
| $L_{43574}$ | $R^{B1}$ | $R^{B1}$ | $R^{B1}$ | $R^{B6}$ | $R^{B1}$ | O |
| $L_{43575}$ | $R^{B1}$ | $R^{B1}$ | $R^{B1}$ | $R^{B7}$ | $R^{B1}$ | O |
| $L_{43576}$ | $R^{B1}$ | $R^{B1}$ | $R^{B1}$ | $R^{B8}$ | $R^{B1}$ | O |
| $L_{43577}$ | $R^{B1}$ | $R^{B1}$ | $R^{B1}$ | $R^{B9}$ | $R^{B1}$ | O |
| $L_{43578}$ | $R^{B1}$ | $R^{B1}$ | $R^{B1}$ | $R^{A2}$ | $R^{B1}$ | O |
| $L_{43579}$ | $R^{B1}$ | $R^{B1}$ | $R^{B1}$ | $R^{A27}$ | $R^{B1}$ | O |
| $L_{43580}$ | $R^{B1}$ | $R^{B1}$ | $R^{B1}$ | $R^{A34}$ | $R^{B1}$ | O |
| $L_{43581}$ | $R^{B2}$ | $R^{B1}$ | $R^{B1}$ | $R^{B1}$ | $R^{B1}$ | O |
| $L_{43582}$ | $R^{B2}$ | $R^{B1}$ | $R^{B1}$ | $R^{B2}$ | $R^{B1}$ | O |
| $L_{43583}$ | $R^{B2}$ | $R^{B1}$ | $R^{B1}$ | $R^{B3}$ | $R^{B1}$ | O |
| $L_{43584}$ | $R^{B2}$ | $R^{B1}$ | $R^{B1}$ | $R^{B4}$ | $R^{B1}$ | O |
| $L_{43585}$ | $R^{B2}$ | $R^{B1}$ | $R^{B1}$ | $R^{B5}$ | $R^{B1}$ | O |
| $L_{43586}$ | $R^{B2}$ | $R^{B1}$ | $R^{B1}$ | $R^{B6}$ | $R^{B1}$ | O |
| $L_{43587}$ | $R^{B2}$ | $R^{B1}$ | $R^{B1}$ | $R^{B7}$ | $R^{B1}$ | O |
| $L_{43588}$ | $R^{B2}$ | $R^{B1}$ | $R^{B1}$ | $R^{B8}$ | $R^{B1}$ | O |
| $L_{43589}$ | $R^{B2}$ | $R^{B1}$ | $R^{B1}$ | $R^{B9}$ | $R^{B1}$ | O |
| $L_{43590}$ | $R^{B2}$ | $R^{B1}$ | $R^{B1}$ | $R^{A2}$ | $R^{B1}$ | O |
| $L_{43591}$ | $R^{B2}$ | $R^{B1}$ | $R^{B1}$ | $R^{A27}$ | $R^{B1}$ | O |
| $L_{43592}$ | $R^{B2}$ | $R^{B1}$ | $R^{B1}$ | $R^{A34}$ | $R^{B1}$ | O |
| $L_{43593}$ | $R^{B2}$ | F | $R^{B1}$ | $R^{B1}$ | $R^{B1}$ | O |
| $L_{43594}$ | $R^{B2}$ | F | $R^{B1}$ | $R^{B2}$ | $R^{B1}$ | O |
| $L_{43595}$ | $R^{B2}$ | F | $R^{B1}$ | $R^{B3}$ | $R^{B1}$ | O |
| $L_{43596}$ | $R^{B2}$ | F | $R^{B1}$ | $R^{B4}$ | $R^{B1}$ | O |
| $L_{43597}$ | $R^{B2}$ | F | $R^{B1}$ | $R^{B5}$ | $R^{B1}$ | O |
| $L_{43598}$ | $R^{B2}$ | F | $R^{B1}$ | $R^{B6}$ | $R^{B1}$ | O |
| $L_{43599}$ | $R^{B2}$ | F | $R^{B1}$ | $R^{B7}$ | $R^{B1}$ | O |
| $L_{43600}$ | $R^{B2}$ | F | $R^{B1}$ | $R^{B8}$ | $R^{B1}$ | O |
| $L_{43601}$ | $R^{B2}$ | F | $R^{B1}$ | $R^{B9}$ | $R^{B1}$ | O |
| $L_{43602}$ | $R^{B2}$ | F | $R^{B1}$ | $R^{A2}$ | $R^{B1}$ | O |
| $L_{43603}$ | $R^{B2}$ | F | $R^{B1}$ | $R^{A27}$ | $R^{B1}$ | O |
| $L_{43604}$ | $R^{B2}$ | F | $R^{B1}$ | $R^{A34}$ | $R^{B1}$ | O |
| $L_{43605}$ | $R^{B3}$ | $R^{B1}$ | $R^{B1}$ | $R^{B1}$ | $R^{B1}$ | O |
| $L_{43606}$ | $R^{B3}$ | $R^{B1}$ | $R^{B1}$ | $R^{B2}$ | $R^{B1}$ | O |
| $L_{43607}$ | $R^{B3}$ | $R^{B1}$ | $R^{B1}$ | $R^{B3}$ | $R^{B1}$ | O |
| $L_{43608}$ | $R^{B3}$ | $R^{B1}$ | $R^{B1}$ | $R^{B4}$ | $R^{B1}$ | O |
| $L_{43609}$ | $R^{B3}$ | $R^{B1}$ | $R^{B1}$ | $R^{B5}$ | $R^{B1}$ | O |
| $L_{43610}$ | $R^{B3}$ | $R^{B1}$ | $R^{B1}$ | $R^{B6}$ | $R^{B1}$ | O |
| $L_{43611}$ | $R^{B3}$ | $R^{B1}$ | $R^{B1}$ | $R^{B7}$ | $R^{B1}$ | O |
| $L_{43612}$ | $R^{B3}$ | $R^{B1}$ | $R^{B1}$ | $R^{B8}$ | $R^{B1}$ | O |
| $L_{43613}$ | $R^{B3}$ | $R^{B1}$ | $R^{B1}$ | $R^{B9}$ | $R^{B1}$ | O |
| $L_{43614}$ | $R^{B3}$ | $R^{B1}$ | $R^{B1}$ | $R^{A2}$ | $R^{B1}$ | O |
| $L_{43615}$ | $R^{B3}$ | $R^{B1}$ | $R^{B1}$ | $R^{A27}$ | $R^{B1}$ | O |
| $L_{43616}$ | $R^{B3}$ | $R^{B1}$ | $R^{B1}$ | $R^{A34}$ | $R^{B1}$ | O |
| $L_{43617}$ | $R^{B1}$ | $R^{B1}$ | $R^{B1}$ | $R^{B1}$ | $R^{B1}$ | O |
| $L_{43618}$ | $R^{B1}$ | $R^{B1}$ | $R^{B2}$ | $R^{B1}$ | $R^{B1}$ | O |
| $L_{43619}$ | $R^{B1}$ | $R^{B1}$ | $R^{B3}$ | $R^{B1}$ | $R^{B1}$ | O |
| $L_{43620}$ | $R^{B1}$ | $R^{B1}$ | $R^{B4}$ | $R^{B1}$ | $R^{B1}$ | O |
| $L_{43621}$ | $R^{B1}$ | $R^{B1}$ | $R^{B5}$ | $R^{B1}$ | $R^{B1}$ | O |
| $L_{43622}$ | $R^{B1}$ | $R^{B1}$ | $R^{B6}$ | $R^{B1}$ | $R^{B1}$ | O |
| $L_{43623}$ | $R^{B1}$ | $R^{B1}$ | $R^{B7}$ | $R^{B1}$ | $R^{B1}$ | O |
| $L_{43624}$ | $R^{B1}$ | $R^{B1}$ | $R^{B8}$ | $R^{B1}$ | $R^{B1}$ | O |
| $L_{43625}$ | $R^{B1}$ | $R^{B1}$ | $R^{B9}$ | $R^{B1}$ | $R^{B1}$ | O |
| $L_{43626}$ | $R^{B1}$ | $R^{B1}$ | $R^{A2}$ | $R^{B1}$ | $R^{B1}$ | O |
| $L_{43627}$ | $R^{B1}$ | $R^{B1}$ | $R^{A27}$ | $R^{B1}$ | $R^{B1}$ | O |
| $L_{43628}$ | $R^{B1}$ | $R^{B1}$ | $R^{A34}$ | $R^{B1}$ | $R^{B1}$ | O |
| $L_{43629}$ | $R^{B2}$ | $R^{B1}$ | $R^{B1}$ | $R^{B1}$ | $R^{B1}$ | O |
| $L_{43630}$ | $R^{B2}$ | $R^{B1}$ | $R^{B2}$ | $R^{B1}$ | $R^{B1}$ | O |
| $L_{43631}$ | $R^{B2}$ | $R^{B1}$ | $R^{B3}$ | $R^{B1}$ | $R^{B1}$ | O |
| $L_{43632}$ | $R^{B2}$ | $R^{B1}$ | $R^{B4}$ | $R^{B1}$ | $R^{B1}$ | O |
| $L_{43633}$ | $R^{B2}$ | $R^{B1}$ | $R^{B5}$ | $R^{B1}$ | $R^{B1}$ | O |
| $L_{43634}$ | $R^{B2}$ | $R^{B1}$ | $R^{B6}$ | $R^{B1}$ | $R^{B1}$ | O |
| $L_{43635}$ | $R^{B2}$ | $R^{B1}$ | $R^{B7}$ | $R^{B1}$ | $R^{B1}$ | O |
| $L_{43636}$ | $R^{B2}$ | $R^{B1}$ | $R^{B8}$ | $R^{B1}$ | $R^{B1}$ | O |
| $L_{43637}$ | $R^{B2}$ | $R^{B1}$ | $R^{B9}$ | $R^{B1}$ | $R^{B1}$ | O |
| $L_{43638}$ | $R^{B2}$ | $R^{B1}$ | $R^{A2}$ | $R^{B1}$ | $R^{B1}$ | O |
| $L_{43639}$ | $R^{B2}$ | $R^{B1}$ | $R^{A27}$ | $R^{B1}$ | $R^{B1}$ | O |
| $L_{43640}$ | $R^{B2}$ | $R^{B1}$ | $R^{A34}$ | $R^{B1}$ | $R^{B1}$ | O |
| $L_{43641}$ | $R^{B2}$ | F | $R^{B1}$ | $R^{B1}$ | $R^{B1}$ | O |
| $L_{43642}$ | $R^{B2}$ | F | $R^{B2}$ | $R^{B1}$ | $R^{B1}$ | O |
| $L_{43643}$ | $R^{B2}$ | F | $R^{B3}$ | $R^{B1}$ | $R^{B1}$ | O |
| $L_{43644}$ | $R^{B2}$ | F | $R^{B4}$ | $R^{B1}$ | $R^{B1}$ | O |
| $L_{43645}$ | $R^{B2}$ | F | $R^{B5}$ | $R^{B1}$ | $R^{B1}$ | O |
| $L_{43646}$ | $R^{B2}$ | F | $R^{B6}$ | $R^{B1}$ | $R^{B1}$ | O |
| $L_{43647}$ | $R^{B2}$ | F | $R^{B7}$ | $R^{B1}$ | $R^{B1}$ | O |
| $L_{43648}$ | $R^{B2}$ | F | $R^{B8}$ | $R^{B1}$ | $R^{B1}$ | O |
| $L_{43649}$ | $R^{B2}$ | F | $R^{B9}$ | $R^{B1}$ | $R^{B1}$ | O |
| $L_{43650}$ | $R^{B2}$ | F | $R^{A2}$ | $R^{B1}$ | $R^{B1}$ | O |
| $L_{43651}$ | $R^{B2}$ | F | $R^{A27}$ | $R^{B1}$ | $R^{B1}$ | O |
| $L_{43652}$ | $R^{B2}$ | F | $R^{A34}$ | $R^{B1}$ | $R^{B1}$ | O |
| $L_{43653}$ | $R^{B3}$ | $R^{B1}$ | $R^{B1}$ | $R^{B1}$ | $R^{B1}$ | O |
| $L_{43654}$ | $R^{B3}$ | $R^{B1}$ | $R^{B2}$ | $R^{B1}$ | $R^{B1}$ | O |
| $L_{43655}$ | $R^{B3}$ | $R^{B1}$ | $R^{B3}$ | $R^{B1}$ | $R^{B1}$ | O |
| $L_{43656}$ | $R^{B3}$ | $R^{B1}$ | $R^{B4}$ | $R^{B1}$ | $R^{B1}$ | O |
| $L_{43657}$ | $R^{B3}$ | $R^{B1}$ | $R^{B5}$ | $R^{B1}$ | $R^{B1}$ | O |
| $L_{43658}$ | $R^{B3}$ | $R^{B1}$ | $R^{B6}$ | $R^{B1}$ | $R^{B1}$ | O |
| $L_{43659}$ | $R^{B3}$ | $R^{B1}$ | $R^{B7}$ | $R^{B1}$ | $R^{B1}$ | O |
| $L_{43660}$ | $R^{B3}$ | $R^{B1}$ | $R^{B8}$ | $R^{B1}$ | $R^{B1}$ | O |
| $L_{43661}$ | $R^{B3}$ | $R^{B1}$ | $R^{B9}$ | $R^{B1}$ | $R^{B1}$ | O |
| $L_{43662}$ | $R^{B3}$ | $R^{B1}$ | $R^{A2}$ | $R^{B1}$ | $R^{B1}$ | O |
| $L_{43663}$ | $R^{B3}$ | $R^{B1}$ | $R^{A27}$ | $R^{B1}$ | $R^{B1}$ | O |
| $L_{43664}$ | $R^{B3}$ | $R^{B1}$ | $R^{A34}$ | $R^{B1}$ | $R^{B1}$ | O |
| $L_{43665}$ | $R^{B1}$ | $R^{B1}$ | $R^{B1}$ | $R^{B1}$ | $R^{B1}$ | O |
| $L_{43666}$ | $R^{B1}$ | $R^{B1}$ | $R^{B2}$ | $R^{B1}$ | $R^{B2}$ | O |
| $L_{43667}$ | $R^{B1}$ | $R^{B1}$ | $R^{B3}$ | $R^{B1}$ | $R^{B3}$ | O |
| $L_{43668}$ | $R^{B1}$ | $R^{B1}$ | $R^{B4}$ | $R^{B1}$ | $R^{B4}$ | O |
| $L_{43669}$ | $R^{B1}$ | $R^{B1}$ | $R^{B5}$ | $R^{B1}$ | $R^{B5}$ | O |

-continued

| | $R^1$ | $R^2$ | $R^7$ | $R^8$ | $R^9$ | X |
|---|---|---|---|---|---|---|
| $L_{43670}$ | $R^{B1}$ | $R^{B1}$ | $R^{B6}$ | $R^{B1}$ | $R^{B6}$ | O |
| $L_{43671}$ | $R^{B1}$ | $R^{B1}$ | $R^{B7}$ | $R^{B1}$ | $R^{B7}$ | O |
| $L_{43672}$ | $R^{B1}$ | $R^{B1}$ | $R^{B8}$ | $R^{B1}$ | $R^{B8}$ | O |
| $L_{43673}$ | $R^{B1}$ | $R^{B1}$ | $R^{B9}$ | $R^{B1}$ | $R^{B9}$ | O |
| $L_{43674}$ | $R^{B1}$ | $R^{B1}$ | $R^{A2}$ | $R^{B1}$ | $R^{A2}$ | O |
| $L_{43675}$ | $R^{B1}$ | $R^{B1}$ | $R^{A27}$ | $R^{B1}$ | $R^{A27}$ | O |
| $L_{43676}$ | $R^{B1}$ | $R^{B1}$ | $R^{A34}$ | $R^{B1}$ | $R^{A34}$ | O |
| $L_{43677}$ | $R^{B2}$ | $R^{B1}$ | $R^{B1}$ | $R^{B1}$ | $R^{B1}$ | O |
| $L_{43678}$ | $R^{B2}$ | $R^{B1}$ | $R^{B2}$ | $R^{B1}$ | $R^{B2}$ | O |
| $L_{43679}$ | $R^{B2}$ | $R^{B1}$ | $R^{B3}$ | $R^{B1}$ | $R^{B3}$ | O |
| $L_{43680}$ | $R^{B2}$ | $R^{B1}$ | $R^{B4}$ | $R^{B1}$ | $R^{B4}$ | O |
| $L_{43681}$ | $R^{B2}$ | $R^{B1}$ | $R^{B5}$ | $R^{B1}$ | $R^{B5}$ | O |
| $L_{43682}$ | $R^{B2}$ | $R^{B1}$ | $R^{B6}$ | $R^{B1}$ | $R^{B6}$ | O |
| $L_{43683}$ | $R^{B2}$ | $R^{B1}$ | $R^{B7}$ | $R^{B1}$ | $R^{B7}$ | O |
| $L_{43684}$ | $R^{B2}$ | $R^{B1}$ | $R^{B8}$ | $R^{B1}$ | $R^{B8}$ | O |
| $L_{43685}$ | $R^{B2}$ | $R^{B1}$ | $R^{B9}$ | $R^{B1}$ | $R^{B9}$ | O |
| $L_{43686}$ | $R^{B2}$ | $R^{B1}$ | $R^{A2}$ | $R^{B1}$ | $R^{A2}$ | O |
| $L_{43687}$ | $R^{B2}$ | $R^{B1}$ | $R^{A27}$ | $R^{B1}$ | $R^{A27}$ | O |
| $L_{43688}$ | $R^{B2}$ | $R^{B1}$ | $R^{A34}$ | $R^{B1}$ | $R^{A34}$ | O |
| $L_{43689}$ | $R^{B2}$ | F | $R^{B1}$ | $R^{B1}$ | $R^{B1}$ | O |
| $L_{43690}$ | $R^{B2}$ | F | $R^{B2}$ | $R^{B1}$ | $R^{B2}$ | O |
| $L_{43691}$ | $R^{B2}$ | F | $R^{B3}$ | $R^{B1}$ | $R^{B3}$ | O |
| $L_{43692}$ | $R^{B2}$ | F | $R^{B4}$ | $R^{B1}$ | $R^{B4}$ | O |
| $L_{43693}$ | $R^{B2}$ | F | $R^{B5}$ | $R^{B1}$ | $R^{B5}$ | O |
| $L_{43694}$ | $R^{B2}$ | F | $R^{B6}$ | $R^{B1}$ | $R^{B6}$ | O |
| $L_{43695}$ | $R^{B2}$ | F | $R^{B7}$ | $R^{B1}$ | $R^{B7}$ | O |
| $L_{43696}$ | $R^{B2}$ | F | $R^{B8}$ | $R^{B1}$ | $R^{B8}$ | O |
| $L_{43697}$ | $R^{B2}$ | F | $R^{B9}$ | $R^{B1}$ | $R^{B9}$ | O |
| $L_{43698}$ | $R^{B2}$ | F | $R^{A2}$ | $R^{B1}$ | $R^{A2}$ | O |
| $L_{43699}$ | $R^{B2}$ | F | $R^{A27}$ | $R^{B1}$ | $R^{A27}$ | O |
| $L_{43700}$ | $R^{B2}$ | F | $R^{A34}$ | $R^{B1}$ | $R^{A34}$ | O |
| $L_{43701}$ | $R^{B3}$ | $R^{B1}$ | $R^{B1}$ | $R^{B1}$ | $R^{B1}$ | O |
| $L_{43702}$ | $R^{B3}$ | $R^{B1}$ | $R^{B2}$ | $R^{B1}$ | $R^{B2}$ | O |
| $L_{43703}$ | $R^{B3}$ | $R^{B1}$ | $R^{B3}$ | $R^{B1}$ | $R^{B3}$ | O |
| $L_{43704}$ | $R^{B3}$ | $R^{B1}$ | $R^{B4}$ | $R^{B1}$ | $R^{B4}$ | O |
| $L_{43705}$ | $R^{B3}$ | $R^{B1}$ | $R^{B5}$ | $R^{B1}$ | $R^{B5}$ | O |
| $L_{43706}$ | $R^{B3}$ | $R^{B1}$ | $R^{B6}$ | $R^{B1}$ | $R^{B6}$ | O |
| $L_{43707}$ | $R^{B3}$ | $R^{B1}$ | $R^{B7}$ | $R^{B1}$ | $R^{B7}$ | O |
| $L_{43708}$ | $R^{B3}$ | $R^{B1}$ | $R^{B8}$ | $R^{B1}$ | $R^{B8}$ | O |
| $L_{43709}$ | $R^{B3}$ | $R^{B1}$ | $R^{B9}$ | $R^{B1}$ | $R^{B9}$ | O |
| $L_{43710}$ | $R^{B3}$ | $R^{B1}$ | $R^{A2}$ | $R^{B1}$ | $R^{A2}$ | O |
| $L_{43711}$ | $R^{B3}$ | $R^{B1}$ | $R^{A27}$ | $R^{B1}$ | $R^{A27}$ | O |
| $L_{43712}$ | $R^{B3}$ | $R^{B1}$ | $R^{A34}$ | $R^{B1}$ | $R^{A34}$ | O |
| $L_{43713}$ | $R^{B1}$ | $R^{B1}$ | $R^{B1}$ | $R^{B1}$ | $R^{B1}$ | O |
| $L_{43714}$ | $R^{B1}$ | $R^{B1}$ | $R^{B1}$ | $R^{B2}$ | $R^{B2}$ | O |
| $L_{43715}$ | $R^{B1}$ | $R^{B1}$ | $R^{B1}$ | $R^{B3}$ | $R^{B3}$ | O |
| $L_{43716}$ | $R^{B1}$ | $R^{B1}$ | $R^{B1}$ | $R^{B4}$ | $R^{B4}$ | O |
| $L_{43717}$ | $R^{B1}$ | $R^{B1}$ | $R^{B1}$ | $R^{B5}$ | $R^{B5}$ | O |
| $L_{43718}$ | $R^{B1}$ | $R^{B1}$ | $R^{B1}$ | $R^{B6}$ | $R^{B6}$ | O |
| $L_{43719}$ | $R^{B1}$ | $R^{B1}$ | $R^{B1}$ | $R^{B7}$ | $R^{B7}$ | O |
| $L_{43720}$ | $R^{B1}$ | $R^{B1}$ | $R^{B1}$ | $R^{B8}$ | $R^{B8}$ | O |
| $L_{43721}$ | $R^{B1}$ | $R^{B1}$ | $R^{B1}$ | $R^{B9}$ | $R^{B9}$ | O |
| $L_{43722}$ | $R^{B1}$ | $R^{B1}$ | $R^{B1}$ | $R^{A2}$ | $R^{A2}$ | O |
| $L_{43723}$ | $R^{B1}$ | $R^{B1}$ | $R^{B1}$ | $R^{A27}$ | $R^{A27}$ | O |
| $L_{43724}$ | $R^{B1}$ | $R^{B1}$ | $R^{B1}$ | $R^{A34}$ | $R^{A34}$ | O |
| $L_{43725}$ | $R^{B2}$ | $R^{B1}$ | $R^{B1}$ | $R^{B1}$ | $R^{B1}$ | O |
| $L_{43726}$ | $R^{B2}$ | $R^{B1}$ | $R^{B1}$ | $R^{B2}$ | $R^{B2}$ | O |
| $L_{43727}$ | $R^{B2}$ | $R^{B1}$ | $R^{B1}$ | $R^{B3}$ | $R^{B3}$ | O |
| $L_{43728}$ | $R^{B2}$ | $R^{B1}$ | $R^{B1}$ | $R^{B4}$ | $R^{B4}$ | O |
| $L_{43729}$ | $R^{B2}$ | $R^{B1}$ | $R^{B1}$ | $R^{B5}$ | $R^{B5}$ | O |
| $L_{43730}$ | $R^{B2}$ | $R^{B1}$ | $R^{B1}$ | $R^{B6}$ | $R^{B6}$ | O |
| $L_{43731}$ | $R^{B2}$ | $R^{B1}$ | $R^{B1}$ | $R^{B7}$ | $R^{B7}$ | O |
| $L_{43732}$ | $R^{B2}$ | $R^{B1}$ | $R^{B1}$ | $R^{B8}$ | $R^{B8}$ | O |
| $L_{43733}$ | $R^{B2}$ | $R^{B1}$ | $R^{B1}$ | $R^{B9}$ | $R^{B9}$ | O |
| $L_{43734}$ | $R^{B2}$ | $R^{B1}$ | $R^{B1}$ | $R^{A2}$ | $R^{A2}$ | O |
| $L_{43735}$ | $R^{B2}$ | $R^{B1}$ | $R^{B1}$ | $R^{A27}$ | $R^{A27}$ | O |
| $L_{43736}$ | $R^{B2}$ | $R^{B1}$ | $R^{B1}$ | $R^{A34}$ | $R^{A34}$ | O |
| $L_{43737}$ | $R^{B2}$ | F | $R^{B1}$ | $R^{B1}$ | $R^{B1}$ | O |
| $L_{43738}$ | $R^{B2}$ | F | $R^{B1}$ | $R^{B2}$ | $R^{B2}$ | O |
| $L_{43739}$ | $R^{B2}$ | F | $R^{B1}$ | $R^{B3}$ | $R^{B3}$ | O |
| $L_{43740}$ | $R^{B2}$ | F | $R^{B1}$ | $R^{B4}$ | $R^{B4}$ | O |
| $L_{43741}$ | $R^{B2}$ | F | $R^{B1}$ | $R^{B5}$ | $R^{B5}$ | O |
| $L_{43742}$ | $R^{B2}$ | F | $R^{B1}$ | $R^{B6}$ | $R^{B6}$ | O |
| $L_{43743}$ | $R^{B2}$ | F | $R^{B1}$ | $R^{B7}$ | $R^{B7}$ | O |
| $L_{43744}$ | $R^{B2}$ | F | $R^{B1}$ | $R^{B8}$ | $R^{B8}$ | O |
| $L_{43745}$ | $R^{B2}$ | F | $R^{B1}$ | $R^{B9}$ | $R^{B9}$ | O |
| $L_{43746}$ | $R^{B2}$ | F | $R^{B1}$ | $R^{A2}$ | $R^{A2}$ | O |

-continued

| | $R^1$ | $R^2$ | $R^7$ | $R^8$ | $R^9$ | X |
|---|---|---|---|---|---|---|
| $L_{43747}$ | $R^{B2}$ | F | $R^{B1}$ | $R^{A27}$ | $R^{A27}$ | O |
| $L_{43748}$ | $R^{B2}$ | F | $R^{B1}$ | $R^{A34}$ | $R^{A34}$ | O |
| $L_{43749}$ | $R^{B3}$ | $R^{B1}$ | $R^{B1}$ | $R^{B1}$ | $R^{B1}$ | O |
| $L_{43750}$ | $R^{B3}$ | $R^{B1}$ | $R^{B1}$ | $R^{B2}$ | $R^{B2}$ | O |
| $L_{43751}$ | $R^{B3}$ | $R^{B1}$ | $R^{B1}$ | $R^{B3}$ | $R^{B3}$ | O |
| $L_{43752}$ | $R^{B3}$ | $R^{B1}$ | $R^{B1}$ | $R^{B4}$ | $R^{B4}$ | O |
| $L_{43753}$ | $R^{B3}$ | $R^{B1}$ | $R^{B1}$ | $R^{B5}$ | $R^{B5}$ | O |
| $L_{43754}$ | $R^{B3}$ | $R^{B1}$ | $R^{B1}$ | $R^{B6}$ | $R^{B6}$ | O |
| $L_{43755}$ | $R^{B3}$ | $R^{B1}$ | $R^{B1}$ | $R^{B7}$ | $R^{B7}$ | O |
| $L_{43756}$ | $R^{B3}$ | $R^{B1}$ | $R^{B1}$ | $R^{B8}$ | $R^{B8}$ | O |
| $L_{43757}$ | $R^{B3}$ | $R^{B1}$ | $R^{B1}$ | $R^{B9}$ | $R^{B9}$ | O |
| $L_{43758}$ | $R^{B3}$ | $R^{B1}$ | $R^{B1}$ | $R^{A2}$ | $R^{A2}$ | O |
| $L_{43759}$ | $R^{B3}$ | $R^{B1}$ | $R^{B1}$ | $R^{A27}$ | $R^{A27}$ | O |
| $L_{43760}$ | $R^{B3}$ | $R^{B1}$ | $R^{B1}$ | $R^{A34}$ | $R^{A34}$ | O |
| $L_{43761}$ | $R^{B1}$ | $R^{B1}$ | $R^{B1}$ | $R^{B1}$ | $R^{B1}$ | O |
| $L_{43762}$ | $R^{B1}$ | $R^{B1}$ | $R^{B2}$ | $R^{B2}$ | $R^{B1}$ | O |
| $L_{43763}$ | $R^{B1}$ | $R^{B1}$ | $R^{B3}$ | $R^{B3}$ | $R^{B1}$ | O |
| $L_{43764}$ | $R^{B1}$ | $R^{B1}$ | $R^{B4}$ | $R^{B4}$ | $R^{B1}$ | O |
| $L_{43765}$ | $R^{B1}$ | $R^{B1}$ | $R^{B5}$ | $R^{B5}$ | $R^{B1}$ | O |
| $L_{43766}$ | $R^{B1}$ | $R^{B1}$ | $R^{B6}$ | $R^{B6}$ | $R^{B1}$ | O |
| $L_{43767}$ | $R^{B1}$ | $R^{B1}$ | $R^{B7}$ | $R^{B7}$ | $R^{B1}$ | O |
| $L_{43768}$ | $R^{B1}$ | $R^{B1}$ | $R^{B8}$ | $R^{B8}$ | $R^{B1}$ | O |
| $L_{43769}$ | $R^{B1}$ | $R^{B1}$ | $R^{B9}$ | $R^{B9}$ | $R^{B1}$ | O |
| $L_{43770}$ | $R^{B1}$ | $R^{B1}$ | $R^{A2}$ | $R^{A2}$ | $R^{B1}$ | O |
| $L_{43771}$ | $R^{B1}$ | $R^{B1}$ | $R^{A27}$ | $R^{A27}$ | $R^{B1}$ | O |
| $L_{43772}$ | $R^{B1}$ | $R^{B1}$ | $R^{A34}$ | $R^{A34}$ | $R^{B1}$ | O |
| $L_{43773}$ | $R^{B2}$ | $R^{B1}$ | $R^{B1}$ | $R^{B1}$ | $R^{B1}$ | O |
| $L_{43774}$ | $R^{B2}$ | $R^{B1}$ | $R^{B2}$ | $R^{B2}$ | $R^{B1}$ | O |
| $L_{43775}$ | $R^{B2}$ | $R^{B1}$ | $R^{B3}$ | $R^{B3}$ | $R^{B1}$ | O |
| $L_{43776}$ | $R^{B2}$ | $R^{B1}$ | $R^{B4}$ | $R^{B4}$ | $R^{B1}$ | O |
| $L_{43777}$ | $R^{B2}$ | $R^{B1}$ | $R^{B5}$ | $R^{B5}$ | $R^{B1}$ | O |
| $L_{43778}$ | $R^{B2}$ | $R^{B1}$ | $R^{B6}$ | $R^{B6}$ | $R^{B1}$ | O |
| $L_{43779}$ | $R^{B2}$ | $R^{B1}$ | $R^{B7}$ | $R^{B7}$ | $R^{B1}$ | O |
| $L_{43780}$ | $R^{B2}$ | $R^{B1}$ | $R^{B8}$ | $R^{B8}$ | $R^{B1}$ | O |
| $L_{43781}$ | $R^{B2}$ | $R^{B1}$ | $R^{B9}$ | $R^{B9}$ | $R^{B1}$ | O |
| $L_{43782}$ | $R^{B2}$ | $R^{B1}$ | $R^{A2}$ | $R^{A2}$ | $R^{B1}$ | O |
| $L_{43783}$ | $R^{B2}$ | $R^{B1}$ | $R^{A27}$ | $R^{A27}$ | $R^{B1}$ | O |
| $L_{43784}$ | $R^{B2}$ | $R^{B1}$ | $R^{A34}$ | $R^{A34}$ | $R^{B1}$ | O |
| $L_{43785}$ | $R^{B2}$ | F | $R^{B1}$ | $R^{B1}$ | $R^{B1}$ | O |
| $L_{43786}$ | $R^{B2}$ | F | $R^{B2}$ | $R^{B2}$ | $R^{B1}$ | O |
| $L_{43787}$ | $R^{B2}$ | F | $R^{B3}$ | $R^{B3}$ | $R^{B1}$ | O |
| $L_{43788}$ | $R^{B2}$ | F | $R^{B4}$ | $R^{B4}$ | $R^{B1}$ | O |
| $L_{43789}$ | $R^{B2}$ | F | $R^{B5}$ | $R^{B5}$ | $R^{B1}$ | O |
| $L_{43790}$ | $R^{B2}$ | F | $R^{B6}$ | $R^{B6}$ | $R^{B1}$ | O |
| $L_{43791}$ | $R^{B2}$ | F | $R^{B7}$ | $R^{B7}$ | $R^{B1}$ | O |
| $L_{43792}$ | $R^{B2}$ | F | $R^{B8}$ | $R^{B8}$ | $R^{B1}$ | O |
| $L_{43793}$ | $R^{B2}$ | F | $R^{B9}$ | $R^{B9}$ | $R^{B1}$ | O |
| $L_{43794}$ | $R^{B2}$ | F | $R^{A2}$ | $R^{A2}$ | $R^{B1}$ | O |
| $L_{43795}$ | $R^{B2}$ | F | $R^{A27}$ | $R^{A27}$ | $R^{B1}$ | O |
| $L_{43796}$ | $R^{B2}$ | F | $R^{A34}$ | $R^{A34}$ | $R^{B1}$ | O |
| $L_{43797}$ | $R^{B3}$ | $R^{B1}$ | $R^{B1}$ | $R^{B1}$ | $R^{B1}$ | O |
| $L_{43798}$ | $R^{B3}$ | $R^{B1}$ | $R^{B2}$ | $R^{B2}$ | $R^{B1}$ | O |
| $L_{43799}$ | $R^{B3}$ | $R^{B1}$ | $R^{B3}$ | $R^{B3}$ | $R^{B1}$ | O |
| $L_{43800}$ | $R^{B3}$ | $R^{B1}$ | $R^{B4}$ | $R^{B4}$ | $R^{B1}$ | O |
| $L_{43801}$ | $R^{B3}$ | $R^{B1}$ | $R^{B5}$ | $R^{B5}$ | $R^{B1}$ | O |
| $L_{43802}$ | $R^{B3}$ | $R^{B1}$ | $R^{B6}$ | $R^{B6}$ | $R^{B1}$ | O |
| $L_{43803}$ | $R^{B3}$ | $R^{B1}$ | $R^{B7}$ | $R^{B7}$ | $R^{B1}$ | O |
| $L_{43804}$ | $R^{B3}$ | $R^{B1}$ | $R^{B8}$ | $R^{B8}$ | $R^{B1}$ | O |
| $L_{43805}$ | $R^{B3}$ | $R^{B1}$ | $R^{B9}$ | $R^{B9}$ | $R^{B1}$ | O |
| $L_{43806}$ | $R^{B3}$ | $R^{B1}$ | $R^{A2}$ | $R^{A2}$ | $R^{B1}$ | O |
| $L_{43807}$ | $R^{B3}$ | $R^{B1}$ | $R^{A27}$ | $R^{A27}$ | $R^{B1}$ | O |
| $L_{43808}$ | $R^{B3}$ | $R^{B1}$ | $R^{A34}$ | $R^{A34}$ | $R^{B1}$ | O |

for $L_{A3809}$ through $L_{A4000}$, $L_A$ has a structure of

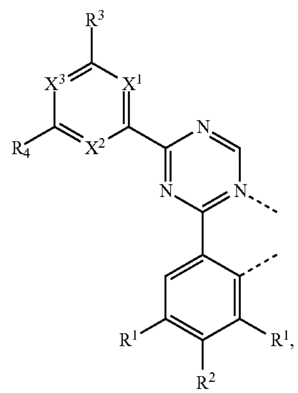

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A3809}$ | $R^{B1}$ | $R^{B1}$ | $R^{B1}$ | $R^{B1}$ | N | C | C |
| $L_{A3810}$ | $R^{B1}$ | $R^{B1}$ | $R^{B2}$ | $R^{B1}$ | N | C | C |
| $L_{A3811}$ | $R^{B1}$ | $R^{B1}$ | $R^{B3}$ | $R^{B1}$ | N | C | C |
| $L_{A3812}$ | $R^{B1}$ | $R^{B1}$ | $R^{B4}$ | $R^{B1}$ | N | C | C |
| $L_{A3813}$ | $R^{B1}$ | $R^{B1}$ | $R^{B5}$ | $R^{B1}$ | N | C | C |
| $L_{A3814}$ | $R^{B1}$ | $R^{B1}$ | $R^{B6}$ | $R^{B1}$ | N | C | C |
| $L_{A3815}$ | $R^{B1}$ | $R^{B1}$ | $R^{B7}$ | $R^{B1}$ | N | C | C |
| $L_{A3816}$ | $R^{B1}$ | $R^{B1}$ | $R^{B8}$ | $R^{B1}$ | N | C | C |
| $L_{A3817}$ | $R^{B1}$ | $R^{B1}$ | $R^{B9}$ | $R^{B1}$ | N | C | C |
| $L_{A3818}$ | $R^{B1}$ | $R^{B1}$ | $R^{A42}$ | $R^{B1}$ | N | C | C |
| $L_{A3819}$ | $R^{B1}$ | $R^{B1}$ | $R^{A427}$ | $R^{B1}$ | N | C | C |
| $L_{A3820}$ | $R^{B1}$ | $R^{B1}$ | $R^{A434}$ | $R^{B1}$ | N | C | C |
| $L_{A3821}$ | $R^{B2}$ | $R^{B1}$ | $R^{B1}$ | $R^{B1}$ | N | C | C |
| $L_{A3822}$ | $R^{B2}$ | $R^{B1}$ | $R^{B2}$ | $R^{B1}$ | N | C | C |
| $L_{A3823}$ | $R^{B2}$ | $R^{B1}$ | $R^{B3}$ | $R^{B1}$ | N | C | C |
| $L_{A3824}$ | $R^{B2}$ | $R^{B1}$ | $R^{B4}$ | $R^{B1}$ | N | C | C |
| $L_{A3825}$ | $R^{B2}$ | $R^{B1}$ | $R^{B5}$ | $R^{B1}$ | N | C | C |
| $L_{A3826}$ | $R^{B2}$ | $R^{B1}$ | $R^{B6}$ | $R^{B1}$ | N | C | C |
| $L_{A3827}$ | $R^{B2}$ | $R^{B1}$ | $R^{B7}$ | $R^{B1}$ | N | C | C |
| $L_{A3828}$ | $R^{B2}$ | $R^{B1}$ | $R^{B8}$ | $R^{B1}$ | N | C | C |
| $L_{A3829}$ | $R^{B2}$ | $R^{B1}$ | $R^{B9}$ | $R^{B1}$ | N | C | C |
| $L_{A3830}$ | $R^{B2}$ | $R^{B1}$ | $R^{A42}$ | $R^{B1}$ | N | C | C |
| $L_{A3831}$ | $R^{B2}$ | $R^{B1}$ | $R^{A427}$ | $R^{B1}$ | N | C | C |
| $L_{A3832}$ | $R^{B2}$ | $R^{B1}$ | $R^{A434}$ | $R^{B1}$ | N | C | C |
| $L_{A3833}$ | $R^{B2}$ | F | $R^{B1}$ | $R^{B1}$ | N | C | C |
| $L_{A3834}$ | $R^{B2}$ | F | $R^{B2}$ | $R^{B1}$ | N | C | C |
| $L_{A3835}$ | $R^{B2}$ | F | $R^{B3}$ | $R^{B1}$ | N | C | C |
| $L_{A3836}$ | $R^{B2}$ | F | $R^{B4}$ | $R^{B1}$ | N | C | C |
| $L_{A3837}$ | $R^{B2}$ | F | $R^{B5}$ | $R^{B1}$ | N | C | C |
| $L_{A3838}$ | $R^{B2}$ | F | $R^{B6}$ | $R^{B1}$ | N | C | C |
| $L_{A3839}$ | $R^{B2}$ | F | $R^{B7}$ | $R^{B1}$ | N | C | C |
| $L_{A3840}$ | $R^{B2}$ | F | $R^{B8}$ | $R^{B1}$ | N | C | C |
| $L_{A3841}$ | $R^{B2}$ | F | $R^{B9}$ | $R^{B1}$ | N | C | C |
| $L_{A3842}$ | $R^{B2}$ | F | $R^{A42}$ | $R^{B1}$ | N | C | C |
| $L_{A3843}$ | $R^{B2}$ | F | $R^{A427}$ | $R^{B1}$ | N | C | C |
| $L_{A3844}$ | $R^{B2}$ | F | $R^{A434}$ | $R^{B1}$ | N | C | C |
| $L_{A3845}$ | $R^{B3}$ | $R^{B1}$ | $R^{B1}$ | $R^{B1}$ | N | C | C |
| $L_{A3846}$ | $R^{B3}$ | $R^{B1}$ | $R^{B2}$ | $R^{B1}$ | N | C | C |
| $L_{A3847}$ | $R^{B3}$ | $R^{B1}$ | $R^{B3}$ | $R^{B1}$ | N | C | C |
| $L_{A3848}$ | $R^{B3}$ | $R^{B1}$ | $R^{B4}$ | $R^{B1}$ | N | C | C |
| $L_{A3849}$ | $R^{B3}$ | $R^{B1}$ | $R^{B5}$ | $R^{B1}$ | N | C | C |
| $L_{A3850}$ | $R^{B3}$ | $R^{B1}$ | $R^{B6}$ | $R^{B1}$ | N | C | C |
| $L_{A3851}$ | $R^{B3}$ | $R^{B1}$ | $R^{B7}$ | $R^{B1}$ | N | C | C |
| $L_{A3852}$ | $R^{B3}$ | $R^{B1}$ | $R^{B8}$ | $R^{B1}$ | N | C | C |
| $L_{A3853}$ | $R^{B3}$ | $R^{B1}$ | $R^{B9}$ | $R^{B1}$ | N | C | C |
| $L_{A3854}$ | $R^{B3}$ | $R^{B1}$ | $R^{A42}$ | $R^{B1}$ | N | C | C |
| $L_{A3855}$ | $R^{B3}$ | $R^{B1}$ | $R^{A427}$ | $R^{B1}$ | N | C | C |
| $L_{A3856}$ | $R^{B3}$ | $R^{B1}$ | $R^{A434}$ | $R^{B1}$ | N | C | C |
| $L_{A3857}$ | $R^{B1}$ | $R^{B1}$ | $R^{B1}$ | $R^{B1}$ | N | N | C |
| $L_{A3858}$ | $R^{B1}$ | $R^{B1}$ | $R^{B2}$ | $R^{B2}$ | N | N | C |
| $L_{A3859}$ | $R^{B1}$ | $R^{B1}$ | $R^{B3}$ | $R^{B3}$ | N | N | C |
| $L_{A3860}$ | $R^{B1}$ | $R^{B1}$ | $R^{B4}$ | $R^{B4}$ | N | N | C |
| $L_{A3861}$ | $R^{B1}$ | $R^{B1}$ | $R^{B5}$ | $R^{B5}$ | N | N | C |

-continued

| | $R^1$ | $R^2$ | $R^3$ | $R^4$ | $X^1$ | $X^2$ | $X^3$ |
|---|---|---|---|---|---|---|---|
| $L_{A3862}$ | $R^{B1}$ | $R^{B1}$ | $R^{B6}$ | $R^{B6}$ | N | N | C |
| $L_{A3863}$ | $R^{B1}$ | $R^{B1}$ | $R^{B7}$ | $R^{B7}$ | N | N | C |
| $L_{A3864}$ | $R^{B1}$ | $R^{B1}$ | $R^{B8}$ | $R^{B8}$ | N | N | C |
| $L_{A3865}$ | $R^{B1}$ | $R^{B1}$ | $R^{B9}$ | $R^{B9}$ | N | N | C |
| $L_{A3866}$ | $R^{B1}$ | $R^{B1}$ | $R^{A42}$ | $R^{A42}$ | N | N | C |
| $L_{A3867}$ | $R^{B1}$ | $R^{B1}$ | $R^{A427}$ | $R^{A427}$ | N | N | C |
| $L_{A3868}$ | $R^{B1}$ | $R^{B1}$ | $R^{A434}$ | $R^{A434}$ | N | N | C |
| $L_{A3869}$ | $R^{B2}$ | $R^{B1}$ | $R^{B1}$ | $R^{B1}$ | N | N | C |
| $L_{A3870}$ | $R^{B2}$ | $R^{B1}$ | $R^{B2}$ | $R^{B2}$ | N | N | C |
| $L_{A3871}$ | $R^{B2}$ | $R^{B1}$ | $R^{B3}$ | $R^{B3}$ | N | N | C |
| $L_{A3872}$ | $R^{B2}$ | $R^{B1}$ | $R^{B4}$ | $R^{B4}$ | N | N | C |
| $L_{A3873}$ | $R^{B2}$ | $R^{B1}$ | $R^{B5}$ | $R^{B5}$ | N | N | C |
| $L_{A3874}$ | $R^{B2}$ | $R^{B1}$ | $R^{B6}$ | $R^{B6}$ | N | N | C |
| $L_{A3875}$ | $R^{B2}$ | $R^{B1}$ | $R^{B7}$ | $R^{B7}$ | N | N | C |
| $L_{A3876}$ | $R^{B2}$ | $R^{B1}$ | $R^{B8}$ | $R^{B8}$ | N | N | C |
| $L_{A3877}$ | $R^{B2}$ | $R^{B1}$ | $R^{B9}$ | $R^{B9}$ | N | N | C |
| $L_{A3878}$ | $R^{B2}$ | $R^{B1}$ | $R^{A42}$ | $R^{A42}$ | N | N | C |
| $L_{A3879}$ | $R^{B2}$ | $R^{B1}$ | $R^{A427}$ | $R^{A427}$ | N | N | C |
| $L_{A3880}$ | $R^{B2}$ | $R^{B1}$ | $R^{A434}$ | $R^{A434}$ | N | N | C |
| $L_{A3881}$ | $R^{B2}$ | F | $R^{B1}$ | $R^{B1}$ | N | N | C |
| $L_{A3882}$ | $R^{B2}$ | F | $R^{B2}$ | $R^{B2}$ | N | N | C |
| $L_{A3883}$ | $R^{B2}$ | F | $R^{B3}$ | $R^{B3}$ | N | N | C |
| $L_{A3884}$ | $R^{B2}$ | F | $R^{B4}$ | $R^{B4}$ | N | N | C |
| $L_{A3885}$ | $R^{B2}$ | F | $R^{B5}$ | $R^{B5}$ | N | N | C |
| $L_{A3886}$ | $R^{B2}$ | F | $R^{B6}$ | $R^{B6}$ | N | N | C |
| $L_{A3887}$ | $R^{B2}$ | F | $R^{B7}$ | $R^{B7}$ | N | N | C |
| $L_{A3888}$ | $R^{B2}$ | F | $R^{B8}$ | $R^{B8}$ | N | N | C |
| $L_{A3889}$ | $R^{B2}$ | F | $R^{B9}$ | $R^{B9}$ | N | N | C |
| $L_{A3890}$ | $R^{B2}$ | F | $R^{A42}$ | $R^{A42}$ | N | N | C |
| $L_{A3891}$ | $R^{B2}$ | F | $R^{A427}$ | $R^{A427}$ | N | N | C |
| $L_{A3892}$ | $R^{B2}$ | F | $R^{A434}$ | $R^{A434}$ | N | N | C |
| $L_{A3893}$ | $R^{B3}$ | $R^{B1}$ | $R^{B1}$ | $R^{B1}$ | N | N | C |
| $L_{A3894}$ | $R^{B3}$ | $R^{B1}$ | $R^{B2}$ | $R^{B2}$ | N | N | C |
| $L_{A3895}$ | $R^{B3}$ | $R^{B1}$ | $R^{B3}$ | $R^{B3}$ | N | N | C |
| $L_{A3896}$ | $R^{B3}$ | $R^{B1}$ | $R^{B4}$ | $R^{B4}$ | N | N | C |
| $L_{A3897}$ | $R^{B3}$ | $R^{B1}$ | $R^{B5}$ | $R^{B5}$ | N | N | C |
| $L_{A3898}$ | $R^{B3}$ | $R^{B1}$ | $R^{B6}$ | $R^{B6}$ | N | N | C |
| $L_{A3899}$ | $R^{B3}$ | $R^{B1}$ | $R^{B7}$ | $R^{B7}$ | N | N | C |
| $L_{A3900}$ | $R^{B3}$ | $R^{B1}$ | $R^{B8}$ | $R^{B8}$ | N | N | C |
| $L_{A3901}$ | $R^{B3}$ | $R^{B1}$ | $R^{B9}$ | $R^{B9}$ | N | N | C |
| $L_{A3902}$ | $R^{B3}$ | $R^{B1}$ | $R^{A42}$ | $R^{A42}$ | N | N | C |
| $L_{A3903}$ | $R^{B3}$ | $R^{B1}$ | $R^{A427}$ | $R^{A427}$ | N | N | C |
| $L_{A3904}$ | $R^{B3}$ | $R^{B1}$ | $R^{A434}$ | $R^{A434}$ | N | N | C |
| $L_{A3905}$ | $R^{B1}$ | $R^{B1}$ | $R^{B1}$ | $R^{B1}$ | N | N | N |
| $L_{A3906}$ | $R^{B1}$ | $R^{B1}$ | $R^{B2}$ | $R^{B2}$ | N | N | N |
| $L_{A3907}$ | $R^{B1}$ | $R^{B1}$ | $R^{B3}$ | $R^{B3}$ | N | N | N |
| $L_{A3908}$ | $R^{B1}$ | $R^{B1}$ | $R^{B4}$ | $R^{B4}$ | N | N | N |
| $L_{A3909}$ | $R^{B1}$ | $R^{B1}$ | $R^{B5}$ | $R^{B5}$ | N | N | N |
| $L_{A3910}$ | $R^{B1}$ | $R^{B1}$ | $R^{B6}$ | $R^{B6}$ | N | N | N |
| $L_{A3911}$ | $R^{B1}$ | $R^{B1}$ | $R^{B7}$ | $R^{B7}$ | N | N | N |
| $L_{A3912}$ | $R^{B1}$ | $R^{B1}$ | $R^{B8}$ | $R^{B8}$ | N | N | N |
| $L_{A3913}$ | $R^{B1}$ | $R^{B1}$ | $R^{B9}$ | $R^{B9}$ | N | N | N |
| $L_{A3914}$ | $R^{B1}$ | $R^{B1}$ | $R^{A42}$ | $R^{A42}$ | N | N | N |
| $L_{A3915}$ | $R^{B1}$ | $R^{B1}$ | $R^{A427}$ | $R^{A427}$ | N | N | N |
| $L_{A3916}$ | $R^{B1}$ | $R^{B1}$ | $R^{A434}$ | $R^{A434}$ | N | N | N |
| $L_{A3917}$ | $R^{B2}$ | $R^{B1}$ | $R^{B1}$ | $R^{B1}$ | N | N | N |
| $L_{A3918}$ | $R^{B2}$ | $R^{B1}$ | $R^{B2}$ | $R^{B2}$ | N | N | N |
| $L_{A3919}$ | $R^{B2}$ | $R^{B1}$ | $R^{B3}$ | $R^{B3}$ | N | N | N |
| $L_{A3920}$ | $R^{B2}$ | $R^{B1}$ | $R^{B4}$ | $R^{B4}$ | N | N | N |
| $L_{A3921}$ | $R^{B2}$ | $R^{B1}$ | $R^{B5}$ | $R^{B5}$ | N | N | N |
| $L_{A3922}$ | $R^{B2}$ | $R^{B1}$ | $R^{B6}$ | $R^{B6}$ | N | N | N |
| $L_{A3923}$ | $R^{B2}$ | $R^{B1}$ | $R^{B7}$ | $R^{B7}$ | N | N | N |
| $L_{A3924}$ | $R^{B2}$ | $R^{B1}$ | $R^{B8}$ | $R^{B8}$ | N | N | N |
| $L_{A3925}$ | $R^{B2}$ | $R^{B1}$ | $R^{B9}$ | $R^{B9}$ | N | N | N |
| $L_{A3926}$ | $R^{B2}$ | $R^{B1}$ | $R^{A42}$ | $R^{A42}$ | N | N | N |
| $L_{A3927}$ | $R^{B2}$ | $R^{B1}$ | $R^{A427}$ | $R^{A427}$ | N | N | N |
| $L_{A3928}$ | $R^{B2}$ | $R^{B1}$ | $R^{A434}$ | $R^{A434}$ | N | N | N |
| $L_{A3929}$ | $R^{B2}$ | F | $R^{B1}$ | $R^{B1}$ | N | N | N |
| $L_{A3930}$ | $R^{B2}$ | F | $R^{B2}$ | $R^{B2}$ | N | N | N |
| $L_{A3931}$ | $R^{B2}$ | F | $R^{B3}$ | $R^{B3}$ | N | N | N |
| $L_{A3932}$ | $R^{B2}$ | F | $R^{B4}$ | $R^{B4}$ | N | N | N |
| $L_{A3933}$ | $R^{B2}$ | F | $R^{B5}$ | $R^{B5}$ | N | N | N |
| $L_{A3934}$ | $R^{B2}$ | F | $R^{B6}$ | $R^{B6}$ | N | N | N |
| $L_{A3935}$ | $R^{B2}$ | F | $R^{B7}$ | $R^{B7}$ | N | N | N |
| $L_{A3936}$ | $R^{B2}$ | F | $R^{B8}$ | $R^{B8}$ | N | N | N |
| $L_{A3937}$ | $R^{B2}$ | F | $R^{B9}$ | $R^{B9}$ | N | N | N |
| $L_{A3938}$ | $R^{B2}$ | F | $R^{A42}$ | $R^{A42}$ | N | N | N |
| $L_{A3939}$ | $R^{B2}$ | F | $R^{A427}$ | $R^{A427}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A43940}$ | $R^{B2}$ | F | $R^{A34}$ | $R^{A34}$ | N | N | N |
| $L_{A43941}$ | $R^{B3}$ | $R^{B1}$ | $R^{B1}$ | $R^{B1}$ | N | N | N |
| $L_{A43942}$ | $R^{B3}$ | $R^{B1}$ | $R^{B2}$ | $R^{B2}$ | N | N | N |
| $L_{A43943}$ | $R^{B3}$ | $R^{B1}$ | $R^{B3}$ | $R^{B3}$ | N | N | N |
| $L_{A43944}$ | $R^{B3}$ | $R^{B1}$ | $R^{B4}$ | $R^{B4}$ | N | N | N |
| $L_{A43945}$ | $R^{B3}$ | $R^{B1}$ | $R^{B5}$ | $R^{B5}$ | N | N | N |
| $L_{A43946}$ | $R^{B3}$ | $R^{B1}$ | $R^{B6}$ | $R^{B6}$ | N | N | N |
| $L_{A43947}$ | $R^{B3}$ | $R^{B1}$ | $R^{B7}$ | $R^{B7}$ | N | N | N |
| $L_{A43948}$ | $R^{B3}$ | $R^{B1}$ | $R^{B8}$ | $R^{B8}$ | N | N | N |
| $L_{A43949}$ | $R^{B3}$ | $R^{B1}$ | $R^{B9}$ | $R^{B9}$ | N | N | N |
| $L_{A43950}$ | $R^{B3}$ | $R^{B1}$ | $R^{A2}$ | $R^{A2}$ | N | N | N |
| $L_{A43951}$ | $R^{B3}$ | $R^{B1}$ | $R^{A27}$ | $R^{A27}$ | N | N | N |
| $L_{A43952}$ | $R^{B3}$ | $R^{B1}$ | $R^{A34}$ | $R^{A34}$ | N | N | N |
| $L_{A43953}$ | $R^{B1}$ | $R^{B1}$ | $R^{B1}$ | $R^{B1}$ | C | C | N |
| $L_{A43954}$ | $R^{B1}$ | $R^{B1}$ | $R^{B2}$ | $R^{B2}$ | C | C | N |
| $L_{A43955}$ | $R^{B1}$ | $R^{B1}$ | $R^{B3}$ | $R^{B3}$ | C | C | N |
| $L_{A43956}$ | $R^{B1}$ | $R^{B1}$ | $R^{B4}$ | $R^{B4}$ | C | C | N |
| $L_{A43957}$ | $R^{B1}$ | $R^{B1}$ | $R^{B5}$ | $R^{B5}$ | C | C | N |
| $L_{A43958}$ | $R^{B1}$ | $R^{B1}$ | $R^{B6}$ | $R^{B6}$ | C | C | N |
| $L_{A43959}$ | $R^{B1}$ | $R^{B1}$ | $R^{B7}$ | $R^{B7}$ | C | C | N |
| $L_{A43960}$ | $R^{B1}$ | $R^{B1}$ | $R^{B8}$ | $R^{B8}$ | C | C | N |
| $L_{A43961}$ | $R^{B1}$ | $R^{B1}$ | $R^{B9}$ | $R^{B9}$ | C | C | N |
| $L_{A43962}$ | $R^{B1}$ | $R^{B1}$ | $R^{A2}$ | $R^{A2}$ | C | C | N |
| $L_{A43963}$ | $R^{B1}$ | $R^{B1}$ | $R^{A27}$ | $R^{A27}$ | C | C | N |
| $L_{A43964}$ | $R^{B1}$ | $R^{B1}$ | $R^{A34}$ | $R^{A34}$ | C | C | N |
| $L_{A43965}$ | $R^{B2}$ | $R^{B1}$ | $R^{B1}$ | $R^{B1}$ | C | C | N |
| $L_{A43966}$ | $R^{B2}$ | $R^{B1}$ | $R^{B2}$ | $R^{B2}$ | C | C | N |
| $L_{A43967}$ | $R^{B2}$ | $R^{B1}$ | $R^{B3}$ | $R^{B3}$ | C | C | N |
| $L_{A43968}$ | $R^{B2}$ | $R^{B1}$ | $R^{B4}$ | $R^{B4}$ | C | C | N |
| $L_{A43969}$ | $R^{B2}$ | $R^{B1}$ | $R^{B5}$ | $R^{B5}$ | C | C | N |
| $L_{A43970}$ | $R^{B2}$ | $R^{B1}$ | $R^{B6}$ | $R^{B6}$ | C | C | N |
| $L_{A43971}$ | $R^{B2}$ | $R^{B1}$ | $R^{B7}$ | $R^{B7}$ | C | C | N |
| $L_{A43972}$ | $R^{B2}$ | $R^{B1}$ | $R^{B8}$ | $R^{B8}$ | C | C | N |
| $L_{A43973}$ | $R^{B2}$ | $R^{B1}$ | $R^{B9}$ | $R^{B9}$ | C | C | N |
| $L_{A43974}$ | $R^{B2}$ | $R^{B1}$ | $R^{A2}$ | $R^{A2}$ | C | C | N |
| $L_{A43975}$ | $R^{B2}$ | $R^{B1}$ | $R^{A27}$ | $R^{A27}$ | C | C | N |
| $L_{A43976}$ | $R^{B2}$ | $R^{B1}$ | $R^{A34}$ | $R^{A34}$ | C | C | N |
| $L_{A43977}$ | $R^{B2}$ | F | $R^{B1}$ | $R^{B1}$ | C | C | N |
| $L_{A43978}$ | $R^{B2}$ | F | $R^{B2}$ | $R^{B2}$ | C | C | N |
| $L_{A43979}$ | $R^{B2}$ | F | $R^{B3}$ | $R^{B3}$ | C | C | N |
| $L_{A43980}$ | $R^{B2}$ | F | $R^{B4}$ | $R^{B4}$ | C | C | N |
| $L_{A43981}$ | $R^{B2}$ | F | $R^{B5}$ | $R^{B5}$ | C | C | N |
| $L_{A43982}$ | $R^{B2}$ | F | $R^{B6}$ | $R^{B6}$ | C | C | N |
| $L_{A43983}$ | $R^{B2}$ | F | $R^{B7}$ | $R^{B7}$ | C | C | N |
| $L_{A43984}$ | $R^{B2}$ | F | $R^{B8}$ | $R^{B8}$ | C | C | N |
| $L_{A43985}$ | $R^{B2}$ | F | $R^{B9}$ | $R^{B9}$ | C | C | N |
| $L_{A43986}$ | $R^{B2}$ | F | $R^{A2}$ | $R^{A2}$ | C | C | N |
| $L_{A43987}$ | $R^{B2}$ | F | $R^{A27}$ | $R^{A27}$ | C | C | N |
| $L_{A43988}$ | $R^{B2}$ | F | $R^{A34}$ | $R^{A34}$ | C | C | N |
| $L_{A43989}$ | $R^{B3}$ | $R^{B1}$ | $R^{B1}$ | $R^{B1}$ | C | C | N |
| $L_{A43990}$ | $R^{B3}$ | $R^{B1}$ | $R^{B2}$ | $R^{B2}$ | C | C | N |
| $L_{A43991}$ | $R^{B3}$ | $R^{B1}$ | $R^{B3}$ | $R^{B3}$ | C | C | N |
| $L_{A43992}$ | $R^{B3}$ | $R^{B1}$ | $R^{B4}$ | $R^{B4}$ | C | C | N |
| $L_{A43993}$ | $R^{B3}$ | $R^{B1}$ | $R^{B5}$ | $R^{B5}$ | C | C | N |
| $L_{A43994}$ | $R^{B3}$ | $R^{B1}$ | $R^{B6}$ | $R^{B6}$ | C | C | N |
| $L_{A43995}$ | $R^{B3}$ | $R^{B1}$ | $R^{B7}$ | $R^{B7}$ | C | C | N |
| $L_{A43996}$ | $R^{B3}$ | $R^{B1}$ | $R^{B8}$ | $R^{B8}$ | C | C | N |
| $L_{A43997}$ | $R^{B3}$ | $R^{B1}$ | $R^{B9}$ | $R^{B9}$ | C | C | N |
| $L_{A43998}$ | $R^{B3}$ | $R^{B1}$ | $R^{A2}$ | $R^{A2}$ | C | C | N |
| $L_{A43999}$ | $R^{B3}$ | $R^{B1}$ | $R^{A27}$ | $R^{A27}$ | C | C | N |
| $L_{A44000}$ | $R^{B3}$ | $R^{B1}$ | $R^{A34}$ | $R^{A34}$ | C | C | N |

for $L_{A44001}$ through $L_{A44184}$, $L_A$ has a structure of

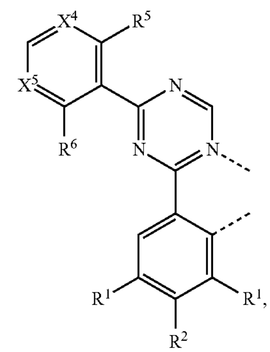

wherein $R^1$, $R^2$, $R^5$, $R^6$, $X^4$, and $X^5$ are defined as provided below,

| | $R^1$ | $R^2$ | $R^5$ | $R^6$ | $X^4$ | $X^5$ |
|---|---|---|---|---|---|---|
| $L_{A44001}$ | $R^{B1}$ | $R^{B1}$ | $R^{B1}$ | $R^{B1}$ | N | C |
| $L_{A44002}$ | $R^{B1}$ | $R^{B1}$ | $R^{B2}$ | $R^{B1}$ | N | C |
| $L_{A44003}$ | $R^{B1}$ | $R^{B1}$ | $R^{B3}$ | $R^{B1}$ | N | C |
| $L_{A44004}$ | $R^{B1}$ | $R^{B1}$ | $R^{B4}$ | $R^{B1}$ | N | C |
| $L_{A44005}$ | $R^{B1}$ | $R^{B1}$ | $R^{B5}$ | $R^{B1}$ | N | C |
| $L_{A44006}$ | $R^{B1}$ | $R^{B1}$ | $R^{B6}$ | $R^{B1}$ | N | C |
| $L_{A44007}$ | $R^{B1}$ | $R^{B1}$ | $R^{B7}$ | $R^{B1}$ | N | C |
| $L_{A44008}$ | $R^{B1}$ | $R^{B1}$ | $R^{B8}$ | $R^{B1}$ | N | C |
| $L_{A44009}$ | $R^{B1}$ | $R^{B1}$ | $R^{B9}$ | $R^{B1}$ | N | C |
| $L_{A44010}$ | $R^{B1}$ | $R^{B1}$ | $R^{A2}$ | $R^{B1}$ | N | C |
| $L_{A44011}$ | $R^{B1}$ | $R^{B1}$ | $R^{A27}$ | $R^{B1}$ | N | C |
| $L_{A44012}$ | $R^{B1}$ | $R^{B1}$ | $R^{A34}$ | $R^{B1}$ | N | C |
| $L_{A44013}$ | $R^{B2}$ | $R^{B1}$ | $R^{B1}$ | $R^{B1}$ | N | C |
| $L_{A44014}$ | $R^{B2}$ | $R^{B1}$ | $R^{B2}$ | $R^{B1}$ | N | C |
| $L_{A44015}$ | $R^{B2}$ | $R^{B1}$ | $R^{B3}$ | $R^{B1}$ | N | C |
| $L_{A44016}$ | $R^{B2}$ | $R^{B1}$ | $R^{B4}$ | $R^{B1}$ | N | C |
| $L_{A44017}$ | $R^{B2}$ | $R^{B1}$ | $R^{B5}$ | $R^{B1}$ | N | C |
| $L_{A44018}$ | $R^{B2}$ | $R^{B1}$ | $R^{B6}$ | $R^{B1}$ | N | C |
| $L_{A44019}$ | $R^{B2}$ | $R^{B1}$ | $R^{B7}$ | $R^{B1}$ | N | C |
| $L_{A44020}$ | $R^{B2}$ | $R^{B1}$ | $R^{B8}$ | $R^{B1}$ | N | C |
| $L_{A44021}$ | $R^{B2}$ | $R^{B1}$ | $R^{B9}$ | $R^{B1}$ | N | C |
| $L_{A44022}$ | $R^{B2}$ | $R^{B1}$ | $R^{A2}$ | $R^{B1}$ | N | C |
| $L_{A44023}$ | $R^{B2}$ | $R^{B1}$ | $R^{A27}$ | $R^{B1}$ | N | C |
| $L_{A44024}$ | $R^{B2}$ | $R^{B1}$ | $R^{A34}$ | $R^{B1}$ | N | C |
| $L_{A44025}$ | $R^{B2}$ | F | $R^{B1}$ | $R^{B1}$ | N | C |
| $L_{A44026}$ | $R^{B2}$ | F | $R^{B2}$ | $R^{B1}$ | N | C |
| $L_{A44027}$ | $R^{B2}$ | F | $R^{B3}$ | $R^{B1}$ | N | C |
| $L_{A44028}$ | $R^{B2}$ | F | $R^{B4}$ | $R^{B1}$ | N | C |
| $L_{A44029}$ | $R^{B2}$ | F | $R^{B5}$ | $R^{B1}$ | N | C |
| $L_{A44030}$ | $R^{B2}$ | F | $R^{B6}$ | $R^{B1}$ | N | C |
| $L_{A44031}$ | $R^{B2}$ | F | $R^{B7}$ | $R^{B1}$ | N | C |
| $L_{A44032}$ | $R^{B2}$ | F | $R^{B8}$ | $R^{B1}$ | N | C |
| $L_{A44033}$ | $R^{B2}$ | F | $R^{B9}$ | $R^{B1}$ | N | C |
| $L_{A44034}$ | $R^{B2}$ | F | $R^{A2}$ | $R^{B1}$ | N | C |
| $L_{A44035}$ | $R^{B2}$ | F | $R^{A27}$ | $R^{B1}$ | N | C |
| $L_{A44036}$ | $R^{B2}$ | F | $R^{A34}$ | $R^{B1}$ | N | C |
| $L_{A44037}$ | $R^{B3}$ | $R^{B1}$ | $R^{B1}$ | $R^{B1}$ | N | C |
| $L_{A44038}$ | $R^{B3}$ | $R^{B1}$ | $R^{B2}$ | $R^{B1}$ | N | C |
| $L_{A44039}$ | $R^{B3}$ | $R^{B1}$ | $R^{B3}$ | $R^{B1}$ | N | C |
| $L_{A44040}$ | $R^{B3}$ | $R^{B1}$ | $R^{B4}$ | $R^{B1}$ | N | C |
| $L_{A44041}$ | $R^{B3}$ | $R^{B1}$ | $R^{B5}$ | $R^{B1}$ | N | C |
| $L_{A44042}$ | $R^{B3}$ | $R^{B1}$ | $R^{B6}$ | $R^{B1}$ | N | C |
| $L_{A44043}$ | $R^{B3}$ | $R^{B1}$ | $R^{B7}$ | $R^{B1}$ | N | C |
| $L_{A44044}$ | $R^{B3}$ | $R^{B1}$ | $R^{B8}$ | $R^{B1}$ | N | C |
| $L_{A44045}$ | $R^{B3}$ | $R^{B1}$ | $R^{B9}$ | $R^{B1}$ | N | C |
| $L_{A44046}$ | $R^{B3}$ | $R^{B1}$ | $R^{A2}$ | $R^{B1}$ | N | C |
| $L_{A44047}$ | $R^{B3}$ | $R^{B1}$ | $R^{A27}$ | $R^{B1}$ | N | C |
| $L_{A44048}$ | $R^{B3}$ | $R^{B1}$ | $R^{A34}$ | $R^{B1}$ | N | C |
| $L_{A44049}$ | $R^{B1}$ | $R^{B1}$ | $R^{B2}$ | $R^{B2}$ | N | C |
| $L_{A44050}$ | $R^{B1}$ | $R^{B1}$ | $R^{B3}$ | $R^{B3}$ | N | C |
| $L_{A44051}$ | $R^{B1}$ | $R^{B1}$ | $R^{B4}$ | $R^{B4}$ | N | C |
| $L_{A44052}$ | $R^{B1}$ | $R^{B1}$ | $R^{B5}$ | $R^{B5}$ | N | C |
| $L_{A44053}$ | $R^{B1}$ | $R^{B1}$ | $R^{B6}$ | $R^{B6}$ | N | C |
| $L_{A44054}$ | $R^{B1}$ | $R^{B1}$ | $R^{B7}$ | $R^{B7}$ | N | C |

-continued

| | $R^1$ | $R^2$ | $R^5$ | $R^6$ | $X^4$ | $X^5$ |
|---|---|---|---|---|---|---|
| $L_{A4055}$ | $R^{B1}$ | $R^{B1}$ | $R^{B8}$ | $R^{B8}$ | N | C |
| $L_{A4056}$ | $R^{B1}$ | $R^{B1}$ | $R^{B9}$ | $R^{B9}$ | N | C |
| $L_{A4057}$ | $R^{B1}$ | $R^{B1}$ | $R^{A2}$ | $R^{A2}$ | N | C |
| $L_{A4058}$ | $R^{B1}$ | $R^{B1}$ | $R^{A27}$ | $R^{A27}$ | N | C |
| $L_{A4059}$ | $R^{B1}$ | $R^{B1}$ | $R^{A34}$ | $R^{A34}$ | N | C |
| $L_{A4060}$ | $R^{B2}$ | $R^{B1}$ | $R^{B2}$ | $R^{B2}$ | N | C |
| $L_{A4061}$ | $R^{B2}$ | $R^{B1}$ | $R^{B3}$ | $R^{B3}$ | N | C |
| $L_{A4062}$ | $R^{B2}$ | $R^{B1}$ | $R^{B4}$ | $R^{B4}$ | N | C |
| $L_{A4063}$ | $R^{B2}$ | $R^{B1}$ | $R^{B5}$ | $R^{B5}$ | N | C |
| $L_{A4064}$ | $R^{B2}$ | $R^{B1}$ | $R^{B6}$ | $R^{B6}$ | N | C |
| $L_{A4065}$ | $R^{B2}$ | $R^{B1}$ | $R^{B7}$ | $R^{B7}$ | N | C |
| $L_{A4066}$ | $R^{B2}$ | $R^{B1}$ | $R^{B8}$ | $R^{B8}$ | N | C |
| $L_{A4067}$ | $R^{B2}$ | $R^{B1}$ | $R^{B9}$ | $R^{B9}$ | N | C |
| $L_{A4068}$ | $R^{B2}$ | $R^{B1}$ | $R^{A2}$ | $R^{A2}$ | N | C |
| $L_{A4069}$ | $R^{B2}$ | $R^{B1}$ | $R^{A27}$ | $R^{A27}$ | N | C |
| $L_{A4070}$ | $R^{B2}$ | $R^{B1}$ | $R^{A34}$ | $R^{A34}$ | N | C |
| $L_{A4071}$ | $R^{B2}$ | F | $R^{B2}$ | $R^{B2}$ | N | C |
| $L_{A4072}$ | $R^{B2}$ | F | $R^{B3}$ | $R^{B3}$ | N | C |
| $L_{A4073}$ | $R^{B2}$ | F | $R^{B4}$ | $R^{B4}$ | N | C |
| $L_{A4074}$ | $R^{B2}$ | F | $R^{B5}$ | $R^{B5}$ | N | C |
| $L_{A4075}$ | $R^{B2}$ | F | $R^{B6}$ | $R^{B6}$ | N | C |
| $L_{A4076}$ | $R^{B2}$ | F | $R^{B7}$ | $R^{B7}$ | N | C |
| $L_{A4077}$ | $R^{B2}$ | F | $R^{B8}$ | $R^{B8}$ | N | C |
| $L_{A4078}$ | $R^{B2}$ | F | $R^{B9}$ | $R^{B9}$ | N | C |
| $L_{A4079}$ | $R^{B2}$ | F | $R^{A2}$ | $R^{A2}$ | N | C |
| $L_{A4080}$ | $R^{B2}$ | F | $R^{A27}$ | $R^{A27}$ | N | C |
| $L_{A4081}$ | $R^{B2}$ | F | $R^{A34}$ | $R^{A34}$ | N | C |
| $L_{A4082}$ | $R^{B3}$ | $R^{B1}$ | $R^{B2}$ | $R^{B2}$ | N | C |
| $L_{A4083}$ | $R^{B3}$ | $R^{B1}$ | $R^{B3}$ | $R^{B3}$ | N | C |
| $L_{A4084}$ | $R^{B3}$ | $R^{B1}$ | $R^{B4}$ | $R^{B4}$ | N | C |
| $L_{A4085}$ | $R^{B3}$ | $R^{B1}$ | $R^{B5}$ | $R^{B5}$ | N | C |
| $L_{A4086}$ | $R^{B5}$ | $R^{B1}$ | $R^{B6}$ | $R^{B6}$ | N | C |
| $L_{A4087}$ | $R^{B5}$ | $R^{B1}$ | $R^{B7}$ | $R^{B7}$ | N | C |
| $L_{A4088}$ | $R^{B3}$ | $R^{B1}$ | $R^{B8}$ | $R^{B8}$ | N | C |
| $L_{A4089}$ | $R^{B5}$ | $R^{B1}$ | $R^{B9}$ | $R^{B9}$ | N | C |
| $L_{A4090}$ | $R^{B5}$ | $R^{B1}$ | $R^{A2}$ | $R^{A2}$ | N | C |
| $L_{A4091}$ | $R^{B5}$ | $R^{B1}$ | $R^{A27}$ | $R^{A27}$ | N | C |
| $L_{A4092}$ | $R^{B3}$ | $R^{B1}$ | $R^{A34}$ | $R^{A34}$ | N | C |
| $L_{A4093}$ | $R^{B1}$ | $R^{B1}$ | $R^{B1}$ | $R^{B1}$ | N | N |
| $L_{A4094}$ | $R^{B1}$ | $R^{B1}$ | $R^{B2}$ | $R^{B1}$ | N | N |
| $L_{A4095}$ | $R^{B1}$ | $R^{B1}$ | $R^{B3}$ | $R^{B1}$ | N | N |
| $L_{A4096}$ | $R^{B1}$ | $R^{B1}$ | $R^{B4}$ | $R^{B1}$ | N | N |
| $L_{A4097}$ | $R^{B1}$ | $R^{B1}$ | $R^{B5}$ | $R^{B1}$ | N | N |
| $L_{A4098}$ | $R^{B1}$ | $R^{B1}$ | $R^{B6}$ | $R^{B1}$ | N | N |
| $L_{A4099}$ | $R^{B1}$ | $R^{B1}$ | $R^{B7}$ | $R^{B1}$ | N | N |
| $L_{A4100}$ | $R^{B1}$ | $R^{B1}$ | $R^{B8}$ | $R^{B1}$ | N | N |
| $L_{A4101}$ | $R^{B1}$ | $R^{B1}$ | $R^{B9}$ | $R^{B1}$ | N | N |
| $L_{A4102}$ | $R^{B1}$ | $R^{B1}$ | $R^{A2}$ | $R^{B1}$ | N | N |
| $L_{A4103}$ | $R^{B1}$ | $R^{B1}$ | $R^{A27}$ | $R^{B1}$ | N | N |
| $L_{A4104}$ | $R^{B1}$ | $R^{B1}$ | $R^{A34}$ | $R^{B1}$ | N | N |
| $L_{A4105}$ | $R^{B2}$ | $R^{B1}$ | $R^{B1}$ | $R^{B1}$ | N | N |
| $L_{A4106}$ | $R^{B2}$ | $R^{B1}$ | $R^{B2}$ | $R^{B1}$ | N | N |
| $L_{A4107}$ | $R^{B2}$ | $R^{B1}$ | $R^{B3}$ | $R^{B1}$ | N | N |
| $L_{A4108}$ | $R^{B2}$ | $R^{B1}$ | $R^{B4}$ | $R^{B1}$ | N | N |
| $L_{A4109}$ | $R^{B2}$ | $R^{B1}$ | $R^{B5}$ | $R^{B1}$ | N | N |
| $L_{A4110}$ | $R^{B2}$ | $R^{B1}$ | $R^{B6}$ | $R^{B1}$ | N | N |
| $L_{A4111}$ | $R^{B2}$ | $R^{B1}$ | $R^{B7}$ | $R^{B1}$ | N | N |
| $L_{A4112}$ | $R^{B2}$ | $R^{B1}$ | $R^{B8}$ | $R^{B1}$ | N | N |
| $L_{A4113}$ | $R^{B2}$ | $R^{B1}$ | $R^{B9}$ | $R^{B1}$ | N | N |
| $L_{A4114}$ | $R^{B2}$ | $R^{B1}$ | $R^{A2}$ | $R^{B1}$ | N | N |
| $L_{A4115}$ | $R^{B2}$ | $R^{B1}$ | $R^{A27}$ | $R^{B1}$ | N | N |
| $L_{A4116}$ | $R^{B2}$ | $R^{B1}$ | $R^{A34}$ | $R^{B1}$ | N | N |
| $L_{A4117}$ | $R^{B2}$ | F | $R^{B1}$ | $R^{B1}$ | N | N |
| $L_{A4118}$ | $R^{B2}$ | F | $R^{B2}$ | $R^{B1}$ | N | N |
| $L_{A4119}$ | $R^{B2}$ | F | $R^{B3}$ | $R^{B1}$ | N | N |
| $L_{A4120}$ | $R^{B2}$ | F | $R^{B4}$ | $R^{B1}$ | N | N |
| $L_{A4121}$ | $R^{B2}$ | F | $R^{B5}$ | $R^{B1}$ | N | N |
| $L_{A4122}$ | $R^{B2}$ | F | $R^{B6}$ | $R^{B1}$ | N | N |
| $L_{A4123}$ | $R^{B2}$ | F | $R^{B7}$ | $R^{B1}$ | N | N |
| $L_{A4124}$ | $R^{B2}$ | F | $R^{B8}$ | $R^{B1}$ | N | N |
| $L_{A4125}$ | $R^{B2}$ | F | $R^{B9}$ | $R^{B1}$ | N | N |
| $L_{A4126}$ | $R^{B2}$ | F | $R^{A2}$ | $R^{B1}$ | N | N |
| $L_{A4127}$ | $R^{B2}$ | F | $R^{A27}$ | $R^{B1}$ | N | N |
| $L_{A4128}$ | $R^{B2}$ | F | $R^{A34}$ | $R^{B1}$ | N | N |
| $L_{A4129}$ | $R^{B3}$ | $R^{B1}$ | $R^{B1}$ | $R^{B1}$ | N | N |
| $L_{A4130}$ | $R^{B3}$ | $R^{B1}$ | $R^{B2}$ | $R^{B1}$ | N | N |
| $L_{A4131}$ | $R^{B3}$ | $R^{B1}$ | $R^{B3}$ | $R^{B1}$ | N | N |

-continued

| | $R^1$ | $R^2$ | $R^5$ | $R^6$ | $X^4$ | $X^5$ |
|---|---|---|---|---|---|---|
| $L_{A4132}$ | $R^{B3}$ | $R^{B1}$ | $R^{B4}$ | $R^{B1}$ | N | N |
| $L_{A4133}$ | $R^{B3}$ | $R^{B1}$ | $R^{B5}$ | $R^{B1}$ | N | N |
| $L_{A4134}$ | $R^{B3}$ | $R^{B1}$ | $R^{B6}$ | $R^{B1}$ | N | N |
| $L_{A4135}$ | $R^{B3}$ | $R^{B1}$ | $R^{B7}$ | $R^{B1}$ | N | N |
| $L_{A4136}$ | $R^{B3}$ | $R^{B1}$ | $R^{B8}$ | $R^{B1}$ | N | N |
| $L_{A4137}$ | $R^{B3}$ | $R^{B1}$ | $R^{B9}$ | $R^{B1}$ | N | N |
| $L_{A4138}$ | $R^{B3}$ | $R^{B1}$ | $R^{A2}$ | $R^{B1}$ | N | N |
| $L_{A4139}$ | $R^{B3}$ | $R^{B1}$ | $R^{A27}$ | $R^{B1}$ | N | N |
| $L_{A4140}$ | $R^{B3}$ | $R^{B1}$ | $R^{A34}$ | $R^{B1}$ | N | N |
| $L_{A4141}$ | $R^{B1}$ | $R^{B1}$ | $R^{B2}$ | $R^{B2}$ | N | N |
| $L_{A4142}$ | $R^{B1}$ | $R^{B1}$ | $R^{B3}$ | $R^{B3}$ | N | N |
| $L_{A4143}$ | $R^{B1}$ | $R^{B1}$ | $R^{B4}$ | $R^{B4}$ | N | N |
| $L_{A4144}$ | $R^{B1}$ | $R^{B1}$ | $R^{B5}$ | $R^{B5}$ | N | N |
| $L_{A4145}$ | $R^{B1}$ | $R^{B1}$ | $R^{B6}$ | $R^{B6}$ | N | N |
| $L_{A4146}$ | $R^{B1}$ | $R^{B1}$ | $R^{B7}$ | $R^{B7}$ | N | N |
| $L_{A4147}$ | $R^{B1}$ | $R^{B1}$ | $R^{B8}$ | $R^{B8}$ | N | N |
| $L_{A4148}$ | $R^{B1}$ | $R^{B1}$ | $R^{B9}$ | $R^{B9}$ | N | N |
| $L_{A4149}$ | $R^{B1}$ | $R^{B1}$ | $R^{A2}$ | $R^{A2}$ | N | N |
| $L_{A4150}$ | $R^{B1}$ | $R^{B1}$ | $R^{A27}$ | $R^{A27}$ | N | N |
| $L_{A4151}$ | $R^{B1}$ | $R^{B1}$ | $R^{A34}$ | $R^{A34}$ | N | N |
| $L_{A4152}$ | $R^{B2}$ | $R^{B1}$ | $R^{B2}$ | $R^{B2}$ | N | N |
| $L_{A4153}$ | $R^{B2}$ | $R^{B1}$ | $R^{B3}$ | $R^{B3}$ | N | N |
| $L_{A4154}$ | $R^{B2}$ | $R^{B1}$ | $R^{B4}$ | $R^{B4}$ | N | N |
| $L_{A4155}$ | $R^{B2}$ | $R^{B1}$ | $R^{B5}$ | $R^{B5}$ | N | N |
| $L_{A4156}$ | $R^{B2}$ | $R^{B1}$ | $R^{B6}$ | $R^{B6}$ | N | N |
| $L_{A4157}$ | $R^{B2}$ | $R^{B1}$ | $R^{B7}$ | $R^{B7}$ | N | N |
| $L_{A4158}$ | $R^{B2}$ | $R^{B1}$ | $R^{B8}$ | $R^{B8}$ | N | N |
| $L_{A4159}$ | $R^{B2}$ | $R^{B1}$ | $R^{B9}$ | $R^{B9}$ | N | N |
| $L_{A4160}$ | $R^{B2}$ | $R^{B1}$ | $R^{A2}$ | $R^{A2}$ | N | N |
| $L_{A4161}$ | $R^{B2}$ | $R^{B1}$ | $R^{A27}$ | $R^{A27}$ | N | N |
| $L_{A4162}$ | $R^{B2}$ | $R^{B1}$ | $R^{A34}$ | $R^{A34}$ | N | N |
| $L_{A4163}$ | $R^{B2}$ | F | $R^{B2}$ | $R^{B2}$ | N | N |
| $L_{A4164}$ | $R^{B2}$ | F | $R^{B3}$ | $R^{B3}$ | N | N |
| $L_{A4165}$ | $R^{B2}$ | F | $R^{B4}$ | $R^{B4}$ | N | N |
| $L_{A4166}$ | $R^{B2}$ | F | $R^{B5}$ | $R^{B5}$ | N | N |
| $L_{A4167}$ | $R^{B2}$ | F | $R^{B6}$ | $R^{B6}$ | N | N |
| $L_{A4168}$ | $R^{B2}$ | F | $R^{B7}$ | $R^{B7}$ | N | N |
| $L_{A4169}$ | $R^{B2}$ | F | $R^{B8}$ | $R^{B8}$ | N | N |
| $L_{A4170}$ | $R^{B2}$ | F | $R^{B9}$ | $R^{B9}$ | N | N |
| $L_{A4171}$ | $R^{B2}$ | F | $R^{A2}$ | $R^{A2}$ | N | N |
| $L_{A4172}$ | $R^{B2}$ | F | $R^{A27}$ | $R^{A27}$ | N | N |
| $L_{A4173}$ | $R^{B2}$ | F | $R^{A34}$ | $R^{A34}$ | N | N |
| $L_{A4174}$ | $R^{B3}$ | $R^{B1}$ | $R^{B2}$ | $R^{B2}$ | N | N |
| $L_{A4175}$ | $R^{B3}$ | $R^{B1}$ | $R^{B3}$ | $R^{B3}$ | N | N |
| $L_{A4176}$ | $R^{B3}$ | $R^{B1}$ | $R^{B4}$ | $R^{B4}$ | N | N |
| $L_{A4177}$ | $R^{B3}$ | $R^{B1}$ | $R^{B5}$ | $R^{B5}$ | N | N |
| $L_{A4178}$ | $R^{B3}$ | $R^{B1}$ | $R^{B6}$ | $R^{B6}$ | N | N |
| $L_{A4179}$ | $R^{B3}$ | $R^{B1}$ | $R^{B7}$ | $R^{B7}$ | N | N |
| $L_{A4180}$ | $R^{B3}$ | $R^{B1}$ | $R^{B8}$ | $R^{B8}$ | N | N |
| $L_{A4181}$ | $R^{B3}$ | $R^{B1}$ | $R^{B9}$ | $R^{B9}$ | N | N |
| $L_{A4182}$ | $R^{B3}$ | $R^{B1}$ | $R^{A2}$ | $R^{A2}$ | N | N |
| $L_{A4183}$ | $R^{B3}$ | $R^{B1}$ | $R^{A27}$ | $R^{A27}$ | N | N |
| $L_{A4184}$ | $R^{B3}$ | $R^{B1}$ | $R^{A34}$ | $R^{A34}$ | N | N |

for $L_{A4185}$ through $L_{A4760}$, $L_A$ has a structure of

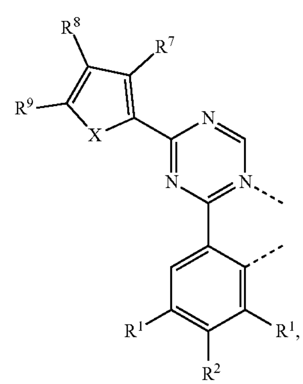

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A4185}$ | $R^{B1}$ | $R^{B1}$ | $R^{B1}$ | $R^{B1}$ | $R^{B1}$ | S |
| $L_{A4186}$ | $R^{B1}$ | $R^{B1}$ | $R^{B1}$ | $R^{B1}$ | $R^{B2}$ | S |
| $L_{A4187}$ | $R^{B1}$ | $R^{B1}$ | $R^{B1}$ | $R^{B1}$ | $R^{B3}$ | S |
| $L_{A4188}$ | $R^{B1}$ | $R^{B1}$ | $R^{B1}$ | $R^{B1}$ | $R^{B4}$ | S |
| $L_{A4189}$ | $R^{B1}$ | $R^{B1}$ | $R^{B1}$ | $R^{B1}$ | $R^{B5}$ | S |
| $L_{A4190}$ | $R^{B1}$ | $R^{B1}$ | $R^{B1}$ | $R^{B1}$ | $R^{B6}$ | S |
| $L_{A4191}$ | $R^{B1}$ | $R^{B1}$ | $R^{B1}$ | $R^{B1}$ | $R^{B7}$ | S |
| $L_{A4192}$ | $R^{B1}$ | $R^{B1}$ | $R^{B1}$ | $R^{B1}$ | $R^{B8}$ | S |
| $L_{A4193}$ | $R^{B1}$ | $R^{B1}$ | $R^{B1}$ | $R^{B1}$ | $R^{B9}$ | S |
| $L_{A4194}$ | $R^{B1}$ | $R^{B1}$ | $R^{B1}$ | $R^{B1}$ | $R^{A2}$ | S |
| $L_{A4195}$ | $R^{B1}$ | $R^{B1}$ | $R^{B1}$ | $R^{B1}$ | $R^{A27}$ | S |
| $L_{A4196}$ | $R^{B1}$ | $R^{B1}$ | $R^{B1}$ | $R^{B1}$ | $R^{A34}$ | S |
| $L_{A4197}$ | $R^{B2}$ | $R^{B1}$ | $R^{B1}$ | $R^{B1}$ | $R^{B1}$ | S |
| $L_{A4198}$ | $R^{B2}$ | $R^{B1}$ | $R^{B1}$ | $R^{B1}$ | $R^{B2}$ | S |
| $L_{A4199}$ | $R^{B2}$ | $R^{B1}$ | $R^{B1}$ | $R^{B1}$ | $R^{B3}$ | S |
| $L_{A4200}$ | $R^{B2}$ | $R^{B1}$ | $R^{B1}$ | $R^{B1}$ | $R^{B4}$ | S |
| $L_{A4201}$ | $R^{B2}$ | $R^{B1}$ | $R^{B1}$ | $R^{B1}$ | $R^{B5}$ | S |
| $L_{A4202}$ | $R^{B2}$ | $R^{B1}$ | $R^{B1}$ | $R^{B1}$ | $R^{B6}$ | S |
| $L_{A4203}$ | $R^{B2}$ | $R^{B1}$ | $R^{B1}$ | $R^{B1}$ | $R^{B7}$ | S |
| $L_{A4204}$ | $R^{B2}$ | $R^{B1}$ | $R^{B1}$ | $R^{B1}$ | $R^{B8}$ | S |
| $L_{A4205}$ | $R^{B2}$ | $R^{B1}$ | $R^{B1}$ | $R^{B1}$ | $R^{B9}$ | S |
| $L_{A4206}$ | $R^{B2}$ | $R^{B1}$ | $R^{B1}$ | $R^{B1}$ | $R^{A2}$ | S |
| $L_{A4207}$ | $R^{B2}$ | $R^{B1}$ | $R^{B1}$ | $R^{B1}$ | $R^{A27}$ | S |
| $L_{A4208}$ | $R^{B2}$ | $R^{B1}$ | $R^{B1}$ | $R^{B1}$ | $R^{A34}$ | S |
| $L_{A4209}$ | $R^{B2}$ | F | $R^{B1}$ | $R^{B1}$ | $R^{B1}$ | S |
| $L_{A4210}$ | $R^{B2}$ | F | $R^{B1}$ | $R^{B1}$ | $R^{B2}$ | S |
| $L_{A4211}$ | $R^{B2}$ | F | $R^{B1}$ | $R^{B1}$ | $R^{B3}$ | S |
| $L_{A4212}$ | $R^{B2}$ | F | $R^{B1}$ | $R^{B1}$ | $R^{B4}$ | S |
| $L_{A4213}$ | $R^{B2}$ | F | $R^{B1}$ | $R^{B1}$ | $R^{B5}$ | S |
| $L_{A4214}$ | $R^{B2}$ | F | $R^{B1}$ | $R^{B1}$ | $R^{B6}$ | S |
| $L_{A4215}$ | $R^{B2}$ | F | $R^{B1}$ | $R^{B1}$ | $R^{B7}$ | S |
| $L_{A4216}$ | $R^{B2}$ | F | $R^{B1}$ | $R^{B1}$ | $R^{B8}$ | S |
| $L_{A4217}$ | $R^{B2}$ | F | $R^{B1}$ | $R^{B1}$ | $R^{B9}$ | S |
| $L_{A4218}$ | $R^{B2}$ | F | $R^{B1}$ | $R^{B1}$ | $R^{A2}$ | S |
| $L_{A4219}$ | $R^{B2}$ | F | $R^{B1}$ | $R^{B1}$ | $R^{A27}$ | S |
| $L_{A4220}$ | $R^{B2}$ | F | $R^{B1}$ | $R^{B1}$ | $R^{A34}$ | S |
| $L_{A4221}$ | $R^{B3}$ | $R^{B1}$ | $R^{B1}$ | $R^{B1}$ | $R^{B1}$ | S |
| $L_{A4222}$ | $R^{B3}$ | $R^{B1}$ | $R^{B1}$ | $R^{B1}$ | $R^{B2}$ | S |
| $L_{A4223}$ | $R^{B3}$ | $R^{B1}$ | $R^{B1}$ | $R^{B1}$ | $R^{B3}$ | S |
| $L_{A4224}$ | $R^{B3}$ | $R^{B1}$ | $R^{B1}$ | $R^{B1}$ | $R^{B4}$ | S |
| $L_{A4225}$ | $R^{B3}$ | $R^{B1}$ | $R^{B1}$ | $R^{B1}$ | $R^{B5}$ | S |
| $L_{A4226}$ | $R^{B3}$ | $R^{B1}$ | $R^{B1}$ | $R^{B1}$ | $R^{B6}$ | S |
| $L_{A4227}$ | $R^{B3}$ | $R^{B1}$ | $R^{B1}$ | $R^{B1}$ | $R^{B7}$ | S |
| $L_{A4228}$ | $R^{B3}$ | $R^{B1}$ | $R^{B1}$ | $R^{B1}$ | $R^{B8}$ | S |
| $L_{A4229}$ | $R^{B3}$ | $R^{B1}$ | $R^{B1}$ | $R^{B1}$ | $R^{B9}$ | S |
| $L_{A4230}$ | $R^{B3}$ | $R^{B1}$ | $R^{B1}$ | $R^{B1}$ | $R^{A2}$ | S |
| $L_{A4231}$ | $R^{B3}$ | $R^{B1}$ | $R^{B1}$ | $R^{B1}$ | $R^{A27}$ | S |
| $L_{A4232}$ | $R^{B3}$ | $R^{B1}$ | $R^{B1}$ | $R^{B1}$ | $R^{A34}$ | S |
| $L_{A4233}$ | $R^{B1}$ | $R^{B1}$ | $R^{B1}$ | $R^{B1}$ | $R^{B1}$ | S |
| $L_{A4234}$ | $R^{B1}$ | $R^{B1}$ | $R^{B1}$ | $R^{B2}$ | $R^{B1}$ | S |
| $L_{A4235}$ | $R^{B1}$ | $R^{B1}$ | $R^{B1}$ | $R^{B3}$ | $R^{B1}$ | S |
| $L_{A4236}$ | $R^{B1}$ | $R^{B1}$ | $R^{B1}$ | $R^{B4}$ | $R^{B1}$ | S |
| $L_{A4237}$ | $R^{B1}$ | $R^{B1}$ | $R^{B1}$ | $R^{B5}$ | $R^{B1}$ | S |
| $L_{A4238}$ | $R^{B1}$ | $R^{B1}$ | $R^{B1}$ | $R^{B6}$ | $R^{B1}$ | S |
| $L_{A4239}$ | $R^{B1}$ | $R^{B1}$ | $R^{B1}$ | $R^{B7}$ | $R^{B1}$ | S |
| $L_{A4240}$ | $R^{B1}$ | $R^{B1}$ | $R^{B1}$ | $R^{B8}$ | $R^{B1}$ | S |
| $L_{A4241}$ | $R^{B1}$ | $R^{B1}$ | $R^{B1}$ | $R^{B9}$ | $R^{B1}$ | S |
| $L_{A4242}$ | $R^{B1}$ | $R^{B1}$ | $R^{B1}$ | $R^{A2}$ | $R^{B1}$ | S |
| $L_{A4243}$ | $R^{B1}$ | $R^{B1}$ | $R^{B1}$ | $R^{A27}$ | $R^{B1}$ | S |
| $L_{A4244}$ | $R^{B1}$ | $R^{B1}$ | $R^{B1}$ | $R^{A34}$ | $R^{B1}$ | S |
| $L_{A4245}$ | $R^{B2}$ | $R^{B1}$ | $R^{B1}$ | $R^{B1}$ | $R^{B1}$ | S |
| $L_{A4246}$ | $R^{B2}$ | $R^{B1}$ | $R^{B1}$ | $R^{B2}$ | $R^{B1}$ | S |
| $L_{A4247}$ | $R^{B2}$ | $R^{B1}$ | $R^{B1}$ | $R^{B3}$ | $R^{B1}$ | S |
| $L_{A4248}$ | $R^{B2}$ | $R^{B1}$ | $R^{B1}$ | $R^{B4}$ | $R^{B1}$ | S |
| $L_{A4249}$ | $R^{B2}$ | $R^{B1}$ | $R^{B1}$ | $R^{B5}$ | $R^{B1}$ | S |
| $L_{A4250}$ | $R^{B2}$ | $R^{B1}$ | $R^{B1}$ | $R^{B6}$ | $R^{B1}$ | S |
| $L_{A4251}$ | $R^{B2}$ | $R^{B1}$ | $R^{B1}$ | $R^{B7}$ | $R^{B1}$ | S |
| $L_{A4252}$ | $R^{B2}$ | $R^{B1}$ | $R^{B1}$ | $R^{B8}$ | $R^{B1}$ | S |
| $L_{A4253}$ | $R^{B2}$ | $R^{B1}$ | $R^{B1}$ | $R^{B9}$ | $R^{B1}$ | S |
| $L_{A4254}$ | $R^{B2}$ | $R^{B1}$ | $R^{B1}$ | $R^{A2}$ | $R^{B1}$ | S |
| $L_{A4255}$ | $R^{B2}$ | $R^{B1}$ | $R^{B1}$ | $R^{A27}$ | $R^{B1}$ | S |
| $L_{A4256}$ | $R^{B2}$ | $R^{B1}$ | $R^{B1}$ | $R^{A34}$ | $R^{B1}$ | S |
| $L_{A4257}$ | $R^{B2}$ | F | $R^{B1}$ | $R^{B1}$ | $R^{B1}$ | S |
| $L_{A4258}$ | $R^{B2}$ | F | $R^{B1}$ | $R^{B2}$ | $R^{B1}$ | S |
| $L_{A4259}$ | $R^{B2}$ | F | $R^{B1}$ | $R^{B3}$ | $R^{B1}$ | S |

-continued

| | $R^1$ | $R^2$ | $R^7$ | $R^8$ | $R^9$ | X |
|---|---|---|---|---|---|---|
| $L_{A4260}$ | $R^{B2}$ | F | $R^{B1}$ | $R^{B4}$ | $R^{B1}$ | S |
| $L_{A4261}$ | $R^{B2}$ | F | $R^{B1}$ | $R^{B5}$ | $R^{B1}$ | S |
| $L_{A4262}$ | $R^{B2}$ | F | $R^{B1}$ | $R^{B6}$ | $R^{B1}$ | S |
| $L_{A4263}$ | $R^{B2}$ | F | $R^{B1}$ | $R^{B7}$ | $R^{B1}$ | S |
| $L_{A4264}$ | $R^{B2}$ | F | $R^{B1}$ | $R^{B8}$ | $R^{B1}$ | S |
| $L_{A4265}$ | $R^{B2}$ | F | $R^{B1}$ | $R^{B9}$ | $R^{B1}$ | S |
| $L_{A4266}$ | $R^{B2}$ | F | $R^{B1}$ | $R^{A2}$ | $R^{B1}$ | S |
| $L_{A4267}$ | $R^{B2}$ | F | $R^{B1}$ | $R^{A27}$ | $R^{B1}$ | S |
| $L_{A4268}$ | $R^{B2}$ | F | $R^{B1}$ | $R^{A34}$ | $R^{B1}$ | S |
| $L_{A4269}$ | $R^{B3}$ | $R^{B1}$ | $R^{B1}$ | $R^{B1}$ | $R^{B1}$ | S |
| $L_{A4270}$ | $R^{B3}$ | $R^{B1}$ | $R^{B1}$ | $R^{B2}$ | $R^{B1}$ | S |
| $L_{A4271}$ | $R^{B3}$ | $R^{B1}$ | $R^{B1}$ | $R^{B3}$ | $R^{B1}$ | S |
| $L_{A4272}$ | $R^{B3}$ | $R^{B1}$ | $R^{B1}$ | $R^{B4}$ | $R^{B1}$ | S |
| $L_{A4273}$ | $R^{B3}$ | $R^{B1}$ | $R^{B1}$ | $R^{B5}$ | $R^{B1}$ | S |
| $L_{A4274}$ | $R^{B3}$ | $R^{B1}$ | $R^{B1}$ | $R^{B6}$ | $R^{B1}$ | S |
| $L_{A4275}$ | $R^{B3}$ | $R^{B1}$ | $R^{B1}$ | $R^{B7}$ | $R^{B1}$ | S |
| $L_{A4276}$ | $R^{B3}$ | $R^{B1}$ | $R^{B1}$ | $R^{B8}$ | $R^{B1}$ | S |
| $L_{A4277}$ | $R^{B3}$ | $R^{B1}$ | $R^{B1}$ | $R^{B9}$ | $R^{B1}$ | S |
| $L_{A4278}$ | $R^{B3}$ | $R^{B1}$ | $R^{B1}$ | $R^{A2}$ | $R^{B1}$ | S |
| $L_{A4279}$ | $R^{B3}$ | $R^{B1}$ | $R^{B1}$ | $R^{A27}$ | $R^{B1}$ | S |
| $L_{A4280}$ | $R^{B3}$ | $R^{B1}$ | $R^{B1}$ | $R^{A34}$ | $R^{B1}$ | S |
| $L_{A4281}$ | $R^{B1}$ | $R^{B1}$ | $R^{B1}$ | $R^{B1}$ | $R^{B1}$ | S |
| $L_{A4282}$ | $R^{B1}$ | $R^{B1}$ | $R^{B2}$ | $R^{B1}$ | $R^{B1}$ | S |
| $L_{A4283}$ | $R^{B1}$ | $R^{B1}$ | $R^{B3}$ | $R^{B1}$ | $R^{B1}$ | S |
| $L_{A4284}$ | $R^{B1}$ | $R^{B1}$ | $R^{B4}$ | $R^{B1}$ | $R^{B1}$ | S |
| $L_{A4285}$ | $R^{B1}$ | $R^{B1}$ | $R^{B5}$ | $R^{B1}$ | $R^{B1}$ | S |
| $L_{A4286}$ | $R^{B1}$ | $R^{B1}$ | $R^{B6}$ | $R^{B1}$ | $R^{B1}$ | S |
| $L_{A4287}$ | $R^{B1}$ | $R^{B1}$ | $R^{B7}$ | $R^{B1}$ | $R^{B1}$ | S |
| $L_{A4288}$ | $R^{B1}$ | $R^{B1}$ | $R^{B8}$ | $R^{B1}$ | $R^{B1}$ | S |
| $L_{A4289}$ | $R^{B1}$ | $R^{B1}$ | $R^{B9}$ | $R^{B1}$ | $R^{B1}$ | S |
| $L_{A4290}$ | $R^{B1}$ | $R^{B1}$ | $R^{A2}$ | $R^{B1}$ | $R^{B1}$ | S |
| $L_{A4291}$ | $R^{B1}$ | $R^{B1}$ | $R^{A27}$ | $R^{B1}$ | $R^{B1}$ | S |
| $L_{A4292}$ | $R^{B1}$ | $R^{B1}$ | $R^{A34}$ | $R^{B1}$ | $R^{B1}$ | S |
| $L_{A4293}$ | $R^{B2}$ | $R^{B1}$ | $R^{B1}$ | $R^{B1}$ | $R^{B1}$ | S |
| $L_{A4294}$ | $R^{B2}$ | $R^{B1}$ | $R^{B2}$ | $R^{B1}$ | $R^{B1}$ | S |
| $L_{A4295}$ | $R^{B2}$ | $R^{B1}$ | $R^{B3}$ | $R^{B1}$ | $R^{B1}$ | S |
| $L_{A4296}$ | $R^{B2}$ | $R^{B1}$ | $R^{B4}$ | $R^{B1}$ | $R^{B1}$ | S |
| $L_{A4297}$ | $R^{B2}$ | $R^{B1}$ | $R^{B5}$ | $R^{B1}$ | $R^{B1}$ | S |
| $L_{A4298}$ | $R^{B2}$ | $R^{B1}$ | $R^{B6}$ | $R^{B1}$ | $R^{B1}$ | S |
| $L_{A4299}$ | $R^{B2}$ | $R^{B1}$ | $R^{B7}$ | $R^{B1}$ | $R^{B1}$ | S |
| $L_{A4300}$ | $R^{B2}$ | $R^{B1}$ | $R^{B8}$ | $R^{B1}$ | $R^{B1}$ | S |
| $L_{A4301}$ | $R^{B2}$ | $R^{B1}$ | $R^{B9}$ | $R^{B1}$ | $R^{B1}$ | S |
| $L_{A4302}$ | $R^{B2}$ | $R^{B1}$ | $R^{A2}$ | $R^{B1}$ | $R^{B1}$ | S |
| $L_{A4303}$ | $R^{B2}$ | $R^{B1}$ | $R^{A27}$ | $R^{B1}$ | $R^{B1}$ | S |
| $L_{A4304}$ | $R^{B2}$ | $R^{B1}$ | $R^{A34}$ | $R^{B1}$ | $R^{B1}$ | S |
| $L_{A4305}$ | $R^{B2}$ | F | $R^{B1}$ | $R^{B1}$ | $R^{B1}$ | S |
| $L_{A4306}$ | $R^{B2}$ | F | $R^{B2}$ | $R^{B1}$ | $R^{B1}$ | S |
| $L_{A4307}$ | $R^{B2}$ | F | $R^{B3}$ | $R^{B1}$ | $R^{B1}$ | S |
| $L_{A4308}$ | $R^{B2}$ | F | $R^{B4}$ | $R^{B1}$ | $R^{B1}$ | S |
| $L_{A4309}$ | $R^{B2}$ | F | $R^{B5}$ | $R^{B1}$ | $R^{B1}$ | S |
| $L_{A4310}$ | $R^{B2}$ | F | $R^{B6}$ | $R^{B1}$ | $R^{B1}$ | S |
| $L_{A4311}$ | $R^{B2}$ | F | $R^{B7}$ | $R^{B1}$ | $R^{B1}$ | S |
| $L_{A4312}$ | $R^{B2}$ | F | $R^{B8}$ | $R^{B1}$ | $R^{B1}$ | S |
| $L_{A4313}$ | $R^{B2}$ | F | $R^{B9}$ | $R^{B1}$ | $R^{B1}$ | S |
| $L_{A4314}$ | $R^{B2}$ | F | $R^{A2}$ | $R^{B1}$ | $R^{B1}$ | S |
| $L_{A4315}$ | $R^{B2}$ | F | $R^{A27}$ | $R^{B1}$ | $R^{B1}$ | S |
| $L_{A4316}$ | $R^{B2}$ | F | $R^{A34}$ | $R^{B1}$ | $R^{B1}$ | S |
| $L_{A4317}$ | $R^{B3}$ | $R^{B1}$ | $R^{B1}$ | $R^{B1}$ | $R^{B1}$ | S |
| $L_{A4318}$ | $R^{B3}$ | $R^{B1}$ | $R^{B2}$ | $R^{B1}$ | $R^{B1}$ | S |
| $L_{A4319}$ | $R^{B3}$ | $R^{B1}$ | $R^{B3}$ | $R^{B1}$ | $R^{B1}$ | S |
| $L_{A4320}$ | $R^{B3}$ | $R^{B1}$ | $R^{B4}$ | $R^{B1}$ | $R^{B1}$ | S |
| $L_{A4321}$ | $R^{B3}$ | $R^{B1}$ | $R^{B5}$ | $R^{B1}$ | $R^{B1}$ | S |
| $L_{A4322}$ | $R^{B3}$ | $R^{B1}$ | $R^{B6}$ | $R^{B1}$ | $R^{B1}$ | S |
| $L_{A4323}$ | $R^{B3}$ | $R^{B1}$ | $R^{B7}$ | $R^{B1}$ | $R^{B1}$ | S |
| $L_{A4324}$ | $R^{B3}$ | $R^{B1}$ | $R^{B8}$ | $R^{B1}$ | $R^{B1}$ | S |
| $L_{A4325}$ | $R^{B3}$ | $R^{B1}$ | $R^{B9}$ | $R^{B1}$ | $R^{B1}$ | S |
| $L_{A4326}$ | $R^{B3}$ | $R^{B1}$ | $R^{A2}$ | $R^{B1}$ | $R^{B1}$ | S |
| $L_{A4327}$ | $R^{B3}$ | $R^{B1}$ | $R^{A27}$ | $R^{B1}$ | $R^{B1}$ | S |
| $L_{A4328}$ | $R^{B3}$ | $R^{B1}$ | $R^{A34}$ | $R^{B1}$ | $R^{B1}$ | S |
| $L_{A4329}$ | $R^{B1}$ | $R^{B1}$ | $R^{B1}$ | $R^{B1}$ | $R^{B1}$ | S |
| $L_{A4330}$ | $R^{B1}$ | $R^{B1}$ | $R^{B2}$ | $R^{B1}$ | $R^{B2}$ | S |
| $L_{A4331}$ | $R^{B1}$ | $R^{B1}$ | $R^{B3}$ | $R^{B1}$ | $R^{B3}$ | S |
| $L_{A4332}$ | $R^{B1}$ | $R^{B1}$ | $R^{B4}$ | $R^{B1}$ | $R^{B4}$ | S |
| $L_{A4333}$ | $R^{B1}$ | $R^{B1}$ | $R^{B5}$ | $R^{B1}$ | $R^{B5}$ | S |
| $L_{A4334}$ | $R^{B1}$ | $R^{B1}$ | $R^{B6}$ | $R^{B1}$ | $R^{B6}$ | S |
| $L_{A4335}$ | $R^{B1}$ | $R^{B1}$ | $R^{B7}$ | $R^{B1}$ | $R^{B7}$ | S |
| $L_{A4336}$ | $R^{B1}$ | $R^{B1}$ | $R^{B8}$ | $R^{B1}$ | $R^{B8}$ | S |

-continued

| | $R^1$ | $R^2$ | $R^7$ | $R^8$ | $R^9$ | X |
|---|---|---|---|---|---|---|
| $L_{44337}$ | $R^{B1}$ | $R^{B1}$ | $R^{B9}$ | $R^{B1}$ | $R^{B9}$ | S |
| $L_{44338}$ | $R^{B1}$ | $R^{B1}$ | $R^{A2}$ | $R^{B1}$ | $R^{A2}$ | S |
| $L_{44339}$ | $R^{B1}$ | $R^{B1}$ | $R^{A27}$ | $R^{B1}$ | $R^{A27}$ | S |
| $L_{44340}$ | $R^{B1}$ | $R^{B1}$ | $R^{A34}$ | $R^{B1}$ | $R^{A34}$ | S |
| $L_{44341}$ | $R^{B2}$ | $R^{B1}$ | $R^{B1}$ | $R^{B1}$ | $R^{B1}$ | S |
| $L_{44342}$ | $R^{B2}$ | $R^{B1}$ | $R^{B2}$ | $R^{B1}$ | $R^{B2}$ | S |
| $L_{44343}$ | $R^{B2}$ | $R^{B1}$ | $R^{B3}$ | $R^{B1}$ | $R^{B3}$ | S |
| $L_{44344}$ | $R^{B2}$ | $R^{B1}$ | $R^{B4}$ | $R^{B1}$ | $R^{B4}$ | S |
| $L_{44345}$ | $R^{B2}$ | $R^{B1}$ | $R^{B5}$ | $R^{B1}$ | $R^{B5}$ | S |
| $L_{44346}$ | $R^{B2}$ | $R^{B1}$ | $R^{B6}$ | $R^{B1}$ | $R^{B6}$ | S |
| $L_{44347}$ | $R^{B2}$ | $R^{B1}$ | $R^{B7}$ | $R^{B1}$ | $R^{B7}$ | S |
| $L_{44348}$ | $R^{B2}$ | $R^{B1}$ | $R^{B8}$ | $R^{B1}$ | $R^{B8}$ | S |
| $L_{44349}$ | $R^{B2}$ | $R^{B1}$ | $R^{B9}$ | $R^{B1}$ | $R^{B9}$ | S |
| $L_{44350}$ | $R^{B2}$ | $R^{B1}$ | $R^{A2}$ | $R^{B1}$ | $R^{A2}$ | S |
| $L_{44351}$ | $R^{B2}$ | $R^{B1}$ | $R^{A27}$ | $R^{B1}$ | $R^{A27}$ | S |
| $L_{44352}$ | $R^{B2}$ | $R^{B1}$ | $R^{A34}$ | $R^{B1}$ | $R^{A34}$ | S |
| $L_{44353}$ | $R^{B2}$ | F | $R^{B1}$ | $R^{B1}$ | $R^{B1}$ | S |
| $L_{44354}$ | $R^{B2}$ | F | $R^{B2}$ | $R^{B1}$ | $R^{B2}$ | S |
| $L_{44355}$ | $R^{B2}$ | F | $R^{B3}$ | $R^{B1}$ | $R^{B3}$ | S |
| $L_{44356}$ | $R^{B2}$ | F | $R^{B4}$ | $R^{B1}$ | $R^{B4}$ | S |
| $L_{44357}$ | $R^{B2}$ | F | $R^{B5}$ | $R^{B1}$ | $R^{B5}$ | S |
| $L_{44358}$ | $R^{B2}$ | F | $R^{B6}$ | $R^{B1}$ | $R^{B6}$ | S |
| $L_{44359}$ | $R^{B2}$ | F | $R^{B7}$ | $R^{B1}$ | $R^{B7}$ | S |
| $L_{44360}$ | $R^{B2}$ | F | $R^{B8}$ | $R^{B1}$ | $R^{B8}$ | S |
| $L_{44361}$ | $R^{B2}$ | F | $R^{B9}$ | $R^{B1}$ | $R^{B9}$ | S |
| $L_{44362}$ | $R^{B2}$ | F | $R^{A2}$ | $R^{B1}$ | $R^{A2}$ | S |
| $L_{44363}$ | $R^{B2}$ | F | $R^{A27}$ | $R^{B1}$ | $R^{A27}$ | S |
| $L_{44364}$ | $R^{B2}$ | F | $R^{A34}$ | $R^{B1}$ | $R^{A34}$ | S |
| $L_{44365}$ | $R^{B3}$ | $R^{B1}$ | $R^{B1}$ | $R^{B1}$ | $R^{B1}$ | S |
| $L_{44366}$ | $R^{B3}$ | $R^{B1}$ | $R^{B2}$ | $R^{B1}$ | $R^{B2}$ | S |
| $L_{44367}$ | $R^{B3}$ | $R^{B1}$ | $R^{B3}$ | $R^{B1}$ | $R^{B3}$ | S |
| $L_{44368}$ | $R^{B3}$ | $R^{B1}$ | $R^{B4}$ | $R^{B1}$ | $R^{B4}$ | S |
| $L_{44369}$ | $R^{B3}$ | $R^{B1}$ | $R^{B5}$ | $R^{B1}$ | $R^{B5}$ | S |
| $L_{44370}$ | $R^{B3}$ | $R^{B1}$ | $R^{B6}$ | $R^{B1}$ | $R^{B6}$ | S |
| $L_{44371}$ | $R^{B3}$ | $R^{B1}$ | $R^{B7}$ | $R^{B1}$ | $R^{B7}$ | S |
| $L_{44372}$ | $R^{B3}$ | $R^{B1}$ | $R^{B8}$ | $R^{B1}$ | $R^{B8}$ | S |
| $L_{44373}$ | $R^{B3}$ | $R^{B1}$ | $R^{B9}$ | $R^{B1}$ | $R^{B9}$ | S |
| $L_{44374}$ | $R^{B3}$ | $R^{B1}$ | $R^{A2}$ | $R^{B1}$ | $R^{A2}$ | S |
| $L_{44375}$ | $R^{B3}$ | $R^{B1}$ | $R^{A27}$ | $R^{B1}$ | $R^{A27}$ | S |
| $L_{44376}$ | $R^{B3}$ | $R^{B1}$ | $R^{A34}$ | $R^{B1}$ | $R^{A34}$ | S |
| $L_{44377}$ | $R^{B1}$ | $R^{B1}$ | $R^{B1}$ | $R^{B1}$ | $R^{B1}$ | S |
| $L_{44378}$ | $R^{B1}$ | $R^{B1}$ | $R^{B1}$ | $R^{B2}$ | $R^{B2}$ | S |
| $L_{44379}$ | $R^{B1}$ | $R^{B1}$ | $R^{B1}$ | $R^{B3}$ | $R^{B3}$ | S |
| $L_{44380}$ | $R^{B1}$ | $R^{B1}$ | $R^{B1}$ | $R^{B4}$ | $R^{B4}$ | S |
| $L_{44381}$ | $R^{B1}$ | $R^{B1}$ | $R^{B1}$ | $R^{B5}$ | $R^{B5}$ | S |
| $L_{44382}$ | $R^{B1}$ | $R^{B1}$ | $R^{B1}$ | $R^{B6}$ | $R^{B6}$ | S |
| $L_{44383}$ | $R^{B1}$ | $R^{B1}$ | $R^{B1}$ | $R^{B7}$ | $R^{B7}$ | S |
| $L_{44384}$ | $R^{B1}$ | $R^{B1}$ | $R^{B1}$ | $R^{B8}$ | $R^{B8}$ | S |
| $L_{44385}$ | $R^{B1}$ | $R^{B1}$ | $R^{B1}$ | $R^{B9}$ | $R^{B9}$ | S |
| $L_{44386}$ | $R^{B1}$ | $R^{B1}$ | $R^{B1}$ | $R^{A2}$ | $R^{A2}$ | S |
| $L_{44387}$ | $R^{B1}$ | $R^{B1}$ | $R^{B1}$ | $R^{A27}$ | $R^{A27}$ | S |
| $L_{44388}$ | $R^{B1}$ | $R^{B1}$ | $R^{B1}$ | $R^{A34}$ | $R^{A34}$ | S |
| $L_{44389}$ | $R^{B2}$ | $R^{B1}$ | $R^{B1}$ | $R^{B1}$ | $R^{B1}$ | S |
| $L_{44390}$ | $R^{B2}$ | $R^{B1}$ | $R^{B1}$ | $R^{B2}$ | $R^{B2}$ | S |
| $L_{44391}$ | $R^{B2}$ | $R^{B1}$ | $R^{B1}$ | $R^{B3}$ | $R^{B3}$ | S |
| $L_{44392}$ | $R^{B2}$ | $R^{B1}$ | $R^{B1}$ | $R^{B4}$ | $R^{B4}$ | S |
| $L_{44393}$ | $R^{B2}$ | $R^{B1}$ | $R^{B1}$ | $R^{B5}$ | $R^{B5}$ | S |
| $L_{44394}$ | $R^{B2}$ | $R^{B1}$ | $R^{B1}$ | $R^{B6}$ | $R^{B6}$ | S |
| $L_{44395}$ | $R^{B2}$ | $R^{B1}$ | $R^{B1}$ | $R^{B7}$ | $R^{B7}$ | S |
| $L_{44396}$ | $R^{B2}$ | $R^{B1}$ | $R^{B1}$ | $R^{B8}$ | $R^{B8}$ | S |
| $L_{44397}$ | $R^{B2}$ | $R^{B1}$ | $R^{B1}$ | $R^{B9}$ | $R^{B9}$ | S |
| $L_{44398}$ | $R^{B2}$ | $R^{B1}$ | $R^{B1}$ | $R^{A2}$ | $R^{A2}$ | S |
| $L_{44399}$ | $R^{B2}$ | $R^{B1}$ | $R^{B1}$ | $R^{A27}$ | $R^{A27}$ | S |
| $L_{44400}$ | $R^{B2}$ | $R^{B1}$ | $R^{B1}$ | $R^{A34}$ | $R^{A34}$ | S |
| $L_{44401}$ | $R^{B2}$ | F | $R^{B1}$ | $R^{B1}$ | $R^{B1}$ | S |
| $L_{44402}$ | $R^{B2}$ | F | $R^{B1}$ | $R^{B2}$ | $R^{B2}$ | S |
| $L_{44403}$ | $R^{B2}$ | F | $R^{B1}$ | $R^{B3}$ | $R^{B3}$ | S |
| $L_{44404}$ | $R^{B2}$ | F | $R^{B1}$ | $R^{B4}$ | $R^{B4}$ | S |
| $L_{44405}$ | $R^{B2}$ | F | $R^{B1}$ | $R^{B5}$ | $R^{B5}$ | S |
| $L_{44406}$ | $R^{B2}$ | F | $R^{B1}$ | $R^{B6}$ | $R^{B6}$ | S |
| $L_{44407}$ | $R^{B2}$ | F | $R^{B1}$ | $R^{B7}$ | $R^{B7}$ | S |
| $L_{44408}$ | $R^{B2}$ | F | $R^{B1}$ | $R^{B8}$ | $R^{B8}$ | S |
| $L_{44409}$ | $R^{B2}$ | F | $R^{B1}$ | $R^{B9}$ | $R^{B9}$ | S |
| $L_{44410}$ | $R^{B2}$ | F | $R^{B1}$ | $R^{A2}$ | $R^{A2}$ | S |
| $L_{44411}$ | $R^{B2}$ | F | $R^{B1}$ | $R^{A27}$ | $R^{A27}$ | S |
| $L_{44412}$ | $R^{B2}$ | F | $R^{B1}$ | $R^{A34}$ | $R^{A34}$ | S |
| $L_{44413}$ | $R^{B3}$ | $R^{B1}$ | $R^{B1}$ | $R^{B1}$ | $R^{B1}$ | S |

-continued

| | $R^1$ | $R^2$ | $R^7$ | $R^8$ | $R^9$ | X |
|---|---|---|---|---|---|---|
| $L_{44414}$ | $R^{B3}$ | $R^{B1}$ | $R^{B1}$ | $R^{B2}$ | $R^{B2}$ | S |
| $L_{44415}$ | $R^{B3}$ | $R^{B1}$ | $R^{B1}$ | $R^{B3}$ | $R^{B3}$ | S |
| $L_{44416}$ | $R^{B3}$ | $R^{B1}$ | $R^{B1}$ | $R^{B4}$ | $R^{B4}$ | S |
| $L_{44417}$ | $R^{B3}$ | $R^{B1}$ | $R^{B1}$ | $R^{B5}$ | $R^{B5}$ | S |
| $L_{44418}$ | $R^{B3}$ | $R^{B1}$ | $R^{B1}$ | $R^{B6}$ | $R^{B6}$ | S |
| $L_{44419}$ | $R^{B3}$ | $R^{B1}$ | $R^{B1}$ | $R^{B7}$ | $R^{B7}$ | S |
| $L_{44420}$ | $R^{B3}$ | $R^{B1}$ | $R^{B1}$ | $R^{B8}$ | $R^{B8}$ | S |
| $L_{44421}$ | $R^{B3}$ | $R^{B1}$ | $R^{B1}$ | $R^{B9}$ | $R^{B9}$ | S |
| $L_{44422}$ | $R^{B3}$ | $R^{B1}$ | $R^{B1}$ | $R^{A2}$ | $R^{A2}$ | S |
| $L_{44423}$ | $R^{B3}$ | $R^{B1}$ | $R^{B1}$ | $R^{A27}$ | $R^{A27}$ | S |
| $L_{44424}$ | $R^{B3}$ | $R^{B1}$ | $R^{B1}$ | $R^{A34}$ | $R^{A34}$ | S |
| $L_{44425}$ | $R^{B1}$ | $R^{B1}$ | $R^{B1}$ | $R^{B1}$ | $R^{B1}$ | S |
| $L_{44426}$ | $R^{B1}$ | $R^{B1}$ | $R^{B2}$ | $R^{B2}$ | $R^{B1}$ | S |
| $L_{44427}$ | $R^{B1}$ | $R^{B1}$ | $R^{B3}$ | $R^{B3}$ | $R^{B1}$ | S |
| $L_{44428}$ | $R^{B1}$ | $R^{B1}$ | $R^{B4}$ | $R^{B4}$ | $R^{B1}$ | S |
| $L_{44429}$ | $R^{B1}$ | $R^{B1}$ | $R^{B5}$ | $R^{B5}$ | $R^{B1}$ | S |
| $L_{44430}$ | $R^{B1}$ | $R^{B1}$ | $R^{B6}$ | $R^{B6}$ | $R^{B1}$ | S |
| $L_{44431}$ | $R^{B1}$ | $R^{B1}$ | $R^{B7}$ | $R^{B7}$ | $R^{B1}$ | S |
| $L_{44432}$ | $R^{B1}$ | $R^{B1}$ | $R^{B8}$ | $R^{B8}$ | $R^{B1}$ | S |
| $L_{44433}$ | $R^{B1}$ | $R^{B1}$ | $R^{B9}$ | $R^{B9}$ | $R^{B1}$ | S |
| $L_{44434}$ | $R^{B1}$ | $R^{B1}$ | $R^{A2}$ | $R^{A2}$ | $R^{B1}$ | S |
| $L_{44435}$ | $R^{B1}$ | $R^{B1}$ | $R^{A27}$ | $R^{A27}$ | $R^{B1}$ | S |
| $L_{44436}$ | $R^{B1}$ | $R^{B1}$ | $R^{A34}$ | $R^{A34}$ | $R^{B1}$ | S |
| $L_{44437}$ | $R^{B2}$ | $R^{B1}$ | $R^{B1}$ | $R^{B1}$ | $R^{B1}$ | S |
| $L_{44438}$ | $R^{B2}$ | $R^{B1}$ | $R^{B2}$ | $R^{B2}$ | $R^{B1}$ | S |
| $L_{44439}$ | $R^{B2}$ | $R^{B1}$ | $R^{B3}$ | $R^{B3}$ | $R^{B1}$ | S |
| $L_{44440}$ | $R^{B2}$ | $R^{B1}$ | $R^{B4}$ | $R^{B4}$ | $R^{B1}$ | S |
| $L_{44441}$ | $R^{B2}$ | $R^{B1}$ | $R^{B5}$ | $R^{B5}$ | $R^{B1}$ | S |
| $L_{44442}$ | $R^{B2}$ | $R^{B1}$ | $R^{B6}$ | $R^{B6}$ | $R^{B1}$ | S |
| $L_{44443}$ | $R^{B2}$ | $R^{B1}$ | $R^{B7}$ | $R^{B7}$ | $R^{B1}$ | S |
| $L_{44444}$ | $R^{B2}$ | $R^{B1}$ | $R^{B8}$ | $R^{B8}$ | $R^{B1}$ | S |
| $L_{44445}$ | $R^{B2}$ | $R^{B1}$ | $R^{B9}$ | $R^{B9}$ | $R^{B1}$ | S |
| $L_{44446}$ | $R^{B2}$ | $R^{B1}$ | $R^{A2}$ | $R^{A2}$ | $R^{B1}$ | S |
| $L_{44447}$ | $R^{B2}$ | $R^{B1}$ | $R^{A27}$ | $R^{A27}$ | $R^{B1}$ | S |
| $L_{44448}$ | $R^{B2}$ | $R^{B1}$ | $R^{A34}$ | $R^{A34}$ | $R^{B1}$ | S |
| $L_{44449}$ | $R^{B2}$ | F | $R^{B1}$ | $R^{B1}$ | $R^{B1}$ | S |
| $L_{44450}$ | $R^{B2}$ | F | $R^{B2}$ | $R^{B2}$ | $R^{B1}$ | S |
| $L_{44451}$ | $R^{B2}$ | F | $R^{B3}$ | $R^{B3}$ | $R^{B1}$ | S |
| $L_{44452}$ | $R^{B2}$ | F | $R^{B4}$ | $R^{B4}$ | $R^{B1}$ | S |
| $L_{44453}$ | $R^{B2}$ | F | $R^{B5}$ | $R^{B5}$ | $R^{B1}$ | S |
| $L_{44454}$ | $R^{B2}$ | F | $R^{B6}$ | $R^{B6}$ | $R^{B1}$ | S |
| $L_{44455}$ | $R^{B2}$ | F | $R^{B7}$ | $R^{B7}$ | $R^{B1}$ | S |
| $L_{44456}$ | $R^{B2}$ | F | $R^{B8}$ | $R^{B8}$ | $R^{B1}$ | S |
| $L_{44457}$ | $R^{B2}$ | F | $R^{B9}$ | $R^{B9}$ | $R^{B1}$ | S |
| $L_{44458}$ | $R^{B2}$ | F | $R^{A2}$ | $R^{A2}$ | $R^{B1}$ | S |
| $L_{44459}$ | $R^{B2}$ | F | $R^{A27}$ | $R^{A27}$ | $R^{B1}$ | S |
| $L_{44460}$ | $R^{B2}$ | F | $R^{A34}$ | $R^{A34}$ | $R^{B1}$ | S |
| $L_{44461}$ | $R^{B3}$ | $R^{B1}$ | $R^{B1}$ | $R^{B1}$ | $R^{B1}$ | S |
| $L_{44462}$ | $R^{B3}$ | $R^{B1}$ | $R^{B2}$ | $R^{B2}$ | $R^{B1}$ | S |
| $L_{44463}$ | $R^{B3}$ | $R^{B1}$ | $R^{B3}$ | $R^{B3}$ | $R^{B1}$ | S |
| $L_{44464}$ | $R^{B3}$ | $R^{B1}$ | $R^{B4}$ | $R^{B4}$ | $R^{B1}$ | S |
| $L_{44465}$ | $R^{B3}$ | $R^{B1}$ | $R^{B5}$ | $R^{B5}$ | $R^{B1}$ | S |
| $L_{44466}$ | $R^{B3}$ | $R^{B1}$ | $R^{B6}$ | $R^{B6}$ | $R^{B1}$ | S |
| $L_{44467}$ | $R^{B3}$ | $R^{B1}$ | $R^{B7}$ | $R^{B7}$ | $R^{B1}$ | S |
| $L_{44468}$ | $R^{B3}$ | $R^{B1}$ | $R^{B8}$ | $R^{B8}$ | $R^{B1}$ | S |
| $L_{44469}$ | $R^{B3}$ | $R^{B1}$ | $R^{B9}$ | $R^{B9}$ | $R^{B1}$ | S |
| $L_{44470}$ | $R^{B3}$ | $R^{B1}$ | $R^{A2}$ | $R^{A2}$ | $R^{B1}$ | S |
| $L_{44471}$ | $R^{B3}$ | $R^{B1}$ | $R^{A27}$ | $R^{A27}$ | $R^{B1}$ | S |
| $L_{44472}$ | $R^{B3}$ | $R^{B1}$ | $R^{A34}$ | $R^{A34}$ | $R^{B1}$ | S |
| $L_{44473}$ | $R^{B1}$ | $R^{B1}$ | $R^{B1}$ | $R^{B1}$ | $R^{B1}$ | O |
| $L_{44474}$ | $R^{B1}$ | $R^{B1}$ | $R^{B1}$ | $R^{B1}$ | $R^{B2}$ | O |
| $L_{44475}$ | $R^{B1}$ | $R^{B1}$ | $R^{B1}$ | $R^{B1}$ | $R^{B3}$ | O |
| $L_{44476}$ | $R^{B1}$ | $R^{B1}$ | $R^{B1}$ | $R^{B1}$ | $R^{B4}$ | O |
| $L_{44477}$ | $R^{B1}$ | $R^{B1}$ | $R^{B1}$ | $R^{B1}$ | $R^{B5}$ | O |
| $L_{44478}$ | $R^{B1}$ | $R^{B1}$ | $R^{B1}$ | $R^{B1}$ | $R^{B6}$ | O |
| $L_{44479}$ | $R^{B1}$ | $R^{B1}$ | $R^{B1}$ | $R^{B1}$ | $R^{B7}$ | O |
| $L_{44480}$ | $R^{B1}$ | $R^{B1}$ | $R^{B1}$ | $R^{B1}$ | $R^{B8}$ | O |
| $L_{44481}$ | $R^{B1}$ | $R^{B1}$ | $R^{B1}$ | $R^{B1}$ | $R^{B9}$ | O |
| $L_{44482}$ | $R^{B1}$ | $R^{B1}$ | $R^{B1}$ | $R^{B1}$ | $R^{A2}$ | O |
| $L_{44483}$ | $R^{B1}$ | $R^{B1}$ | $R^{B1}$ | $R^{B1}$ | $R^{A27}$ | O |
| $L_{44484}$ | $R^{B1}$ | $R^{B1}$ | $R^{B1}$ | $R^{B1}$ | $R^{A34}$ | O |
| $L_{44485}$ | $R^{B2}$ | $R^{B1}$ | $R^{B1}$ | $R^{B1}$ | $R^{B1}$ | O |
| $L_{44486}$ | $R^{B2}$ | $R^{B1}$ | $R^{B1}$ | $R^{B1}$ | $R^{B2}$ | O |
| $L_{44487}$ | $R^{B2}$ | $R^{B1}$ | $R^{B1}$ | $R^{B1}$ | $R^{B3}$ | O |
| $L_{44488}$ | $R^{B2}$ | $R^{B1}$ | $R^{B1}$ | $R^{B1}$ | $R^{B4}$ | O |
| $L_{44489}$ | $R^{B2}$ | $R^{B1}$ | $R^{B1}$ | $R^{B1}$ | $R^{B5}$ | O |
| $L_{44490}$ | $R^{B2}$ | $R^{B1}$ | $R^{B1}$ | $R^{B1}$ | $R^{B6}$ | O |

-continued

| | $R^1$ | $R^2$ | $R^7$ | $R^8$ | $R^9$ | X |
|---|---|---|---|---|---|---|
| $L_{A4491}$ | $R^{B2}$ | $R^{B1}$ | $R^{B1}$ | $R^{B1}$ | $R^{B7}$ | O |
| $L_{A4492}$ | $R^{B2}$ | $R^{B1}$ | $R^{B1}$ | $R^{B1}$ | $R^{B8}$ | O |
| $L_{A4493}$ | $R^{B2}$ | $R^{B1}$ | $R^{B1}$ | $R^{B1}$ | $R^{B9}$ | O |
| $L_{A4494}$ | $R^{B2}$ | $R^{B1}$ | $R^{B1}$ | $R^{B1}$ | $R^{A2}$ | O |
| $L_{A4495}$ | $R^{B2}$ | $R^{B1}$ | $R^{B1}$ | $R^{B1}$ | $R^{A27}$ | O |
| $L_{A4496}$ | $R^{B2}$ | $R^{B1}$ | $R^{B1}$ | $R^{B1}$ | $R^{A34}$ | O |
| $L_{A4497}$ | $R^{B2}$ | F | $R^{B1}$ | $R^{B1}$ | $R^{B1}$ | O |
| $L_{A4498}$ | $R^{B2}$ | F | $R^{B1}$ | $R^{B1}$ | $R^{B2}$ | O |
| $L_{A4499}$ | $R^{B2}$ | F | $R^{B1}$ | $R^{B1}$ | $R^{B3}$ | O |
| $L_{A4500}$ | $R^{B2}$ | F | $R^{B1}$ | $R^{B1}$ | $R^{B4}$ | O |
| $L_{A4501}$ | $R^{B2}$ | F | $R^{B1}$ | $R^{B1}$ | $R^{B5}$ | O |
| $L_{A4502}$ | $R^{B2}$ | F | $R^{B1}$ | $R^{B1}$ | $R^{B6}$ | O |
| $L_{A4503}$ | $R^{B2}$ | F | $R^{B1}$ | $R^{B1}$ | $R^{B7}$ | O |
| $L_{A4504}$ | $R^{B2}$ | F | $R^{B1}$ | $R^{B1}$ | $R^{B8}$ | O |
| $L_{A4505}$ | $R^{B2}$ | F | $R^{B1}$ | $R^{B1}$ | $R^{B9}$ | O |
| $L_{A4506}$ | $R^{B2}$ | F | $R^{B1}$ | $R^{B1}$ | $R^{A2}$ | O |
| $L_{A4507}$ | $R^{B2}$ | F | $R^{B1}$ | $R^{B1}$ | $R^{A27}$ | O |
| $L_{A4508}$ | $R^{B2}$ | F | $R^{B1}$ | $R^{B1}$ | $R^{A34}$ | O |
| $L_{A4509}$ | $R^{B3}$ | $R^{B1}$ | $R^{B1}$ | $R^{B1}$ | $R^{B1}$ | O |
| $L_{A4510}$ | $R^{B3}$ | $R^{B1}$ | $R^{B1}$ | $R^{B1}$ | $R^{B2}$ | O |
| $L_{A4511}$ | $R^{B3}$ | $R^{B1}$ | $R^{B1}$ | $R^{B1}$ | $R^{B3}$ | O |
| $L_{A4512}$ | $R^{B3}$ | $R^{B1}$ | $R^{B1}$ | $R^{B1}$ | $R^{B4}$ | O |
| $L_{A4513}$ | $R^{B3}$ | $R^{B1}$ | $R^{B1}$ | $R^{B1}$ | $R^{B5}$ | O |
| $L_{A4514}$ | $R^{B3}$ | $R^{B1}$ | $R^{B1}$ | $R^{B1}$ | $R^{B6}$ | O |
| $L_{A4515}$ | $R^{B3}$ | $R^{B1}$ | $R^{B1}$ | $R^{B1}$ | $R^{B7}$ | O |
| $L_{A4516}$ | $R^{B3}$ | $R^{B1}$ | $R^{B1}$ | $R^{B1}$ | $R^{B8}$ | O |
| $L_{A4517}$ | $R^{B3}$ | $R^{B1}$ | $R^{B1}$ | $R^{B1}$ | $R^{B9}$ | O |
| $L_{A4518}$ | $R^{B3}$ | $R^{B1}$ | $R^{B1}$ | $R^{B1}$ | $R^{A2}$ | O |
| $L_{A4519}$ | $R^{B3}$ | $R^{B1}$ | $R^{B1}$ | $R^{B1}$ | $R^{A27}$ | O |
| $L_{A4520}$ | $R^{B3}$ | $R^{B1}$ | $R^{B1}$ | $R^{B1}$ | $R^{A34}$ | O |
| $L_{A4521}$ | $R^{B1}$ | $R^{B1}$ | $R^{B1}$ | $R^{B1}$ | $R^{B1}$ | O |
| $L_{A4522}$ | $R^{B1}$ | $R^{B1}$ | $R^{B1}$ | $R^{B2}$ | $R^{B1}$ | O |
| $L_{A4523}$ | $R^{B1}$ | $R^{B1}$ | $R^{B1}$ | $R^{B3}$ | $R^{B1}$ | O |
| $L_{A4524}$ | $R^{B1}$ | $R^{B1}$ | $R^{B1}$ | $R^{B4}$ | $R^{B1}$ | O |
| $L_{A4525}$ | $R^{B1}$ | $R^{B1}$ | $R^{B1}$ | $R^{B5}$ | $R^{B1}$ | O |
| $L_{A4526}$ | $R^{B1}$ | $R^{B1}$ | $R^{B1}$ | $R^{B6}$ | $R^{B1}$ | O |
| $L_{A4527}$ | $R^{B1}$ | $R^{B1}$ | $R^{B1}$ | $R^{B7}$ | $R^{B1}$ | O |
| $L_{A4528}$ | $R^{B1}$ | $R^{B1}$ | $R^{B1}$ | $R^{B8}$ | $R^{B1}$ | O |
| $L_{A4529}$ | $R^{B1}$ | $R^{B1}$ | $R^{B1}$ | $R^{B9}$ | $R^{B1}$ | O |
| $L_{A4530}$ | $R^{B1}$ | $R^{B1}$ | $R^{B1}$ | $R^{A2}$ | $R^{B1}$ | O |
| $L_{A4531}$ | $R^{B1}$ | $R^{B1}$ | $R^{B1}$ | $R^{A27}$ | $R^{B1}$ | O |
| $L_{A4532}$ | $R^{B1}$ | $R^{B1}$ | $R^{B1}$ | $R^{A34}$ | $R^{B1}$ | O |
| $L_{A4533}$ | $R^{B2}$ | $R^{B1}$ | $R^{B1}$ | $R^{B1}$ | $R^{B1}$ | O |
| $L_{A4534}$ | $R^{B2}$ | $R^{B1}$ | $R^{B1}$ | $R^{B2}$ | $R^{B1}$ | O |
| $L_{A4535}$ | $R^{B2}$ | $R^{B1}$ | $R^{B1}$ | $R^{B3}$ | $R^{B1}$ | O |
| $L_{A4536}$ | $R^{B2}$ | $R^{B1}$ | $R^{B1}$ | $R^{B4}$ | $R^{B1}$ | O |
| $L_{A4537}$ | $R^{B2}$ | $R^{B1}$ | $R^{B1}$ | $R^{B5}$ | $R^{B1}$ | O |
| $L_{A4538}$ | $R^{B2}$ | $R^{B1}$ | $R^{B1}$ | $R^{B6}$ | $R^{B1}$ | O |
| $L_{A4539}$ | $R^{B2}$ | $R^{B1}$ | $R^{B1}$ | $R^{B7}$ | $R^{B1}$ | O |
| $L_{A4540}$ | $R^{B2}$ | $R^{B1}$ | $R^{B1}$ | $R^{B8}$ | $R^{B1}$ | O |
| $L_{A4541}$ | $R^{B2}$ | $R^{B1}$ | $R^{B1}$ | $R^{B9}$ | $R^{B1}$ | O |
| $L_{A4542}$ | $R^{B2}$ | $R^{B1}$ | $R^{B1}$ | $R^{A2}$ | $R^{B1}$ | O |
| $L_{A4543}$ | $R^{B2}$ | $R^{B1}$ | $R^{B1}$ | $R^{A27}$ | $R^{B1}$ | O |
| $L_{A4544}$ | $R^{B2}$ | $R^{B1}$ | $R^{B1}$ | $R^{A34}$ | $R^{B1}$ | O |
| $L_{A4545}$ | $R^{B2}$ | F | $R^{B1}$ | $R^{B1}$ | $R^{B1}$ | O |
| $L_{A4546}$ | $R^{B2}$ | F | $R^{B1}$ | $R^{B2}$ | $R^{B1}$ | O |
| $L_{A4547}$ | $R^{B2}$ | F | $R^{B1}$ | $R^{B3}$ | $R^{B1}$ | O |
| $L_{A4548}$ | $R^{B2}$ | F | $R^{B1}$ | $R^{B4}$ | $R^{B1}$ | O |
| $L_{A4549}$ | $R^{B2}$ | F | $R^{B1}$ | $R^{B5}$ | $R^{B1}$ | O |
| $L_{A4550}$ | $R^{B2}$ | F | $R^{B1}$ | $R^{B6}$ | $R^{B1}$ | O |
| $L_{A4551}$ | $R^{B2}$ | F | $R^{B1}$ | $R^{B7}$ | $R^{B1}$ | O |
| $L_{A4552}$ | $R^{B2}$ | F | $R^{B1}$ | $R^{B8}$ | $R^{B1}$ | O |
| $L_{A4553}$ | $R^{B2}$ | F | $R^{B1}$ | $R^{B9}$ | $R^{B1}$ | O |
| $L_{A4554}$ | $R^{B2}$ | F | $R^{B1}$ | $R^{A2}$ | $R^{B1}$ | O |
| $L_{A4555}$ | $R^{B2}$ | F | $R^{B1}$ | $R^{A27}$ | $R^{B1}$ | O |
| $L_{A4556}$ | $R^{B2}$ | F | $R^{B1}$ | $R^{A34}$ | $R^{B1}$ | O |
| $L_{A4557}$ | $R^{B3}$ | $R^{B1}$ | $R^{B1}$ | $R^{B1}$ | $R^{B1}$ | O |
| $L_{A4558}$ | $R^{B3}$ | $R^{B1}$ | $R^{B1}$ | $R^{B2}$ | $R^{B1}$ | O |
| $L_{A4559}$ | $R^{B3}$ | $R^{B1}$ | $R^{B1}$ | $R^{B3}$ | $R^{B1}$ | O |
| $L_{A4560}$ | $R^{B3}$ | $R^{B1}$ | $R^{B1}$ | $R^{B4}$ | $R^{B1}$ | O |
| $L_{A4561}$ | $R^{B3}$ | $R^{B1}$ | $R^{B1}$ | $R^{B5}$ | $R^{B1}$ | O |
| $L_{A4562}$ | $R^{B3}$ | $R^{B1}$ | $R^{B1}$ | $R^{B6}$ | $R^{B1}$ | O |
| $L_{A4563}$ | $R^{B3}$ | $R^{B1}$ | $R^{B1}$ | $R^{B7}$ | $R^{B1}$ | O |
| $L_{A4564}$ | $R^{B3}$ | $R^{B1}$ | $R^{B1}$ | $R^{B8}$ | $R^{B1}$ | O |
| $L_{A4565}$ | $R^{B3}$ | $R^{B1}$ | $R^{B1}$ | $R^{B9}$ | $R^{B1}$ | O |
| $L_{A4566}$ | $R^{B3}$ | $R^{B1}$ | $R^{B1}$ | $R^{A2}$ | $R^{B1}$ | O |
| $L_{A4567}$ | $R^{B3}$ | $R^{B1}$ | $R^{B1}$ | $R^{A27}$ | $R^{B1}$ | O |

-continued

| | $R^1$ | $R^2$ | $R^7$ | $R^8$ | $R^9$ | X |
|---|---|---|---|---|---|---|
| $L_{A4568}$ | $R^{B3}$ | $R^{B1}$ | $R^{B1}$ | $R^{A34}$ | $R^{B1}$ | O |
| $L_{A4569}$ | $R^{B1}$ | $R^{B1}$ | $R^{B1}$ | $R^{B1}$ | $R^{B1}$ | O |
| $L_{A4570}$ | $R^{B1}$ | $R^{B1}$ | $R^{B2}$ | $R^{B1}$ | $R^{B1}$ | O |
| $L_{A4571}$ | $R^{B1}$ | $R^{B1}$ | $R^{B3}$ | $R^{B1}$ | $R^{B1}$ | O |
| $L_{A4572}$ | $R^{B1}$ | $R^{B1}$ | $R^{B4}$ | $R^{B1}$ | $R^{B1}$ | O |
| $L_{A4573}$ | $R^{B1}$ | $R^{B1}$ | $R^{B5}$ | $R^{B1}$ | $R^{B1}$ | O |
| $L_{A4574}$ | $R^{B1}$ | $R^{B1}$ | $R^{B6}$ | $R^{B1}$ | $R^{B1}$ | O |
| $L_{A4575}$ | $R^{B1}$ | $R^{B1}$ | $R^{B7}$ | $R^{B1}$ | $R^{B1}$ | O |
| $L_{A4576}$ | $R^{B1}$ | $R^{B1}$ | $R^{B8}$ | $R^{B1}$ | $R^{B1}$ | O |
| $L_{A4577}$ | $R^{B1}$ | $R^{B1}$ | $R^{B9}$ | $R^{B1}$ | $R^{B1}$ | O |
| $L_{A4578}$ | $R^{B1}$ | $R^{B1}$ | $R^{A2}$ | $R^{B1}$ | $R^{B1}$ | O |
| $L_{A4579}$ | $R^{B1}$ | $R^{B1}$ | $R^{A27}$ | $R^{B1}$ | $R^{B1}$ | O |
| $L_{A4580}$ | $R^{B1}$ | $R^{B1}$ | $R^{A34}$ | $R^{B1}$ | $R^{B1}$ | O |
| $L_{A4581}$ | $R^{B2}$ | $R^{B1}$ | $R^{B1}$ | $R^{B1}$ | $R^{B1}$ | O |
| $L_{A4582}$ | $R^{B2}$ | $R^{B1}$ | $R^{B2}$ | $R^{B1}$ | $R^{B1}$ | O |
| $L_{A4583}$ | $R^{B2}$ | $R^{B1}$ | $R^{B3}$ | $R^{B1}$ | $R^{B1}$ | O |
| $L_{A4584}$ | $R^{B2}$ | $R^{B1}$ | $R^{B4}$ | $R^{B1}$ | $R^{B1}$ | O |
| $L_{A4585}$ | $R^{B2}$ | $R^{B1}$ | $R^{B5}$ | $R^{B1}$ | $R^{B1}$ | O |
| $L_{A4586}$ | $R^{B2}$ | $R^{B1}$ | $R^{B6}$ | $R^{B1}$ | $R^{B1}$ | O |
| $L_{A4587}$ | $R^{B2}$ | $R^{B1}$ | $R^{B7}$ | $R^{B1}$ | $R^{B1}$ | O |
| $L_{A4588}$ | $R^{B2}$ | $R^{B1}$ | $R^{B8}$ | $R^{B1}$ | $R^{B1}$ | O |
| $L_{A4589}$ | $R^{B2}$ | $R^{B1}$ | $R^{B9}$ | $R^{B1}$ | $R^{B1}$ | O |
| $L_{A4590}$ | $R^{B2}$ | $R^{B1}$ | $R^{A2}$ | $R^{B1}$ | $R^{B1}$ | O |
| $L_{A4591}$ | $R^{B2}$ | $R^{B1}$ | $R^{A27}$ | $R^{B1}$ | $R^{B1}$ | O |
| $L_{A4592}$ | $R^{B2}$ | $R^{B1}$ | $R^{A34}$ | $R^{B1}$ | $R^{B1}$ | O |
| $L_{A4593}$ | $R^{B2}$ | F | $R^{B1}$ | $R^{B1}$ | $R^{B1}$ | O |
| $L_{A4594}$ | $R^{B2}$ | F | $R^{B2}$ | $R^{B1}$ | $R^{B1}$ | O |
| $L_{A4595}$ | $R^{B2}$ | F | $R^{B3}$ | $R^{B1}$ | $R^{B1}$ | O |
| $L_{A4596}$ | $R^{B2}$ | F | $R^{B4}$ | $R^{B1}$ | $R^{B1}$ | O |
| $L_{A4597}$ | $R^{B2}$ | F | $R^{B5}$ | $R^{B1}$ | $R^{B1}$ | O |
| $L_{A4598}$ | $R^{B2}$ | F | $R^{B6}$ | $R^{B1}$ | $R^{B1}$ | O |
| $L_{A4599}$ | $R^{B2}$ | F | $R^{B7}$ | $R^{B1}$ | $R^{B1}$ | O |
| $L_{A4600}$ | $R^{B2}$ | F | $R^{B8}$ | $R^{B1}$ | $R^{B1}$ | O |
| $L_{A4601}$ | $R^{B2}$ | F | $R^{B9}$ | $R^{B1}$ | $R^{B1}$ | O |
| $L_{A4602}$ | $R^{B2}$ | F | $R^{A2}$ | $R^{B1}$ | $R^{B1}$ | O |
| $L_{A4603}$ | $R^{B2}$ | F | $R^{A27}$ | $R^{B1}$ | $R^{B1}$ | O |
| $L_{A4604}$ | $R^{B2}$ | F | $R^{A34}$ | $R^{B1}$ | $R^{B1}$ | O |
| $L_{A4605}$ | $R^{B3}$ | $R^{B1}$ | $R^{B1}$ | $R^{B1}$ | $R^{B1}$ | O |
| $L_{A4606}$ | $R^{B3}$ | $R^{B1}$ | $R^{B2}$ | $R^{B1}$ | $R^{B1}$ | O |
| $L_{A4607}$ | $R^{B3}$ | $R^{B1}$ | $R^{B3}$ | $R^{B1}$ | $R^{B1}$ | O |
| $L_{A4608}$ | $R^{B3}$ | $R^{B1}$ | $R^{B4}$ | $R^{B1}$ | $R^{B1}$ | O |
| $L_{A4609}$ | $R^{B3}$ | $R^{B1}$ | $R^{B5}$ | $R^{B1}$ | $R^{B1}$ | O |
| $L_{A4610}$ | $R^{B3}$ | $R^{B1}$ | $R^{B6}$ | $R^{B1}$ | $R^{B1}$ | O |
| $L_{A4611}$ | $R^{B3}$ | $R^{B1}$ | $R^{B7}$ | $R^{B1}$ | $R^{B1}$ | O |
| $L_{A4612}$ | $R^{B3}$ | $R^{B1}$ | $R^{B8}$ | $R^{B1}$ | $R^{B1}$ | O |
| $L_{A4613}$ | $R^{B3}$ | $R^{B1}$ | $R^{B9}$ | $R^{B1}$ | $R^{B1}$ | O |
| $L_{A4614}$ | $R^{B3}$ | $R^{B1}$ | $R^{A2}$ | $R^{B1}$ | $R^{B1}$ | O |
| $L_{A4615}$ | $R^{B3}$ | $R^{B1}$ | $R^{A27}$ | $R^{B1}$ | $R^{B1}$ | O |
| $L_{A4616}$ | $R^{B3}$ | $R^{B1}$ | $R^{A34}$ | $R^{B1}$ | $R^{B1}$ | O |
| $L_{A4617}$ | $R^{B1}$ | $R^{B1}$ | $R^{B1}$ | $R^{B1}$ | $R^{B1}$ | O |
| $L_{A4618}$ | $R^{B1}$ | $R^{B1}$ | $R^{B2}$ | $R^{B1}$ | $R^{B2}$ | O |
| $L_{A4619}$ | $R^{B1}$ | $R^{B1}$ | $R^{B3}$ | $R^{B1}$ | $R^{B3}$ | O |
| $L_{A4620}$ | $R^{B1}$ | $R^{B1}$ | $R^{B4}$ | $R^{B1}$ | $R^{B4}$ | O |
| $L_{A4621}$ | $R^{B1}$ | $R^{B1}$ | $R^{B5}$ | $R^{B1}$ | $R^{B5}$ | O |
| $L_{A4622}$ | $R^{B1}$ | $R^{B1}$ | $R^{B6}$ | $R^{B1}$ | $R^{B6}$ | O |
| $L_{A4623}$ | $R^{B1}$ | $R^{B1}$ | $R^{B7}$ | $R^{B1}$ | $R^{B7}$ | O |
| $L_{A4624}$ | $R^{B1}$ | $R^{B1}$ | $R^{B8}$ | $R^{B1}$ | $R^{B8}$ | O |
| $L_{A4625}$ | $R^{B1}$ | $R^{B1}$ | $R^{B9}$ | $R^{B1}$ | $R^{B9}$ | O |
| $L_{A4626}$ | $R^{B1}$ | $R^{B1}$ | $R^{A2}$ | $R^{B1}$ | $R^{A2}$ | O |
| $L_{A4627}$ | $R^{B1}$ | $R^{B1}$ | $R^{A27}$ | $R^{B1}$ | $R^{A27}$ | O |
| $L_{A4628}$ | $R^{B1}$ | $R^{B1}$ | $R^{A34}$ | $R^{B1}$ | $R^{A34}$ | O |
| $L_{A4629}$ | $R^{B2}$ | $R^{B1}$ | $R^{B1}$ | $R^{B1}$ | $R^{B1}$ | O |
| $L_{A4630}$ | $R^{B2}$ | $R^{B1}$ | $R^{B2}$ | $R^{B1}$ | $R^{B2}$ | O |
| $L_{A4631}$ | $R^{B2}$ | $R^{B1}$ | $R^{B3}$ | $R^{B1}$ | $R^{B3}$ | O |
| $L_{A4632}$ | $R^{B2}$ | $R^{B1}$ | $R^{B4}$ | $R^{B1}$ | $R^{B4}$ | O |
| $L_{A4633}$ | $R^{B2}$ | $R^{B1}$ | $R^{B5}$ | $R^{B1}$ | $R^{B5}$ | O |
| $L_{A4634}$ | $R^{B2}$ | $R^{B1}$ | $R^{B6}$ | $R^{B1}$ | $R^{B6}$ | O |
| $L_{A4635}$ | $R^{B2}$ | $R^{B1}$ | $R^{B7}$ | $R^{B1}$ | $R^{B7}$ | O |
| $L_{A4636}$ | $R^{B2}$ | $R^{B1}$ | $R^{B8}$ | $R^{B1}$ | $R^{B8}$ | O |
| $L_{A4637}$ | $R^{B2}$ | $R^{B1}$ | $R^{B9}$ | $R^{B1}$ | $R^{B9}$ | O |
| $L_{A4638}$ | $R^{B2}$ | $R^{B1}$ | $R^{A2}$ | $R^{B1}$ | $R^{A2}$ | O |
| $L_{A4639}$ | $R^{B2}$ | $R^{B1}$ | $R^{A27}$ | $R^{B1}$ | $R^{A27}$ | O |
| $L_{A4640}$ | $R^{B2}$ | $R^{B1}$ | $R^{A34}$ | $R^{B1}$ | $R^{A34}$ | O |
| $L_{A4641}$ | $R^{B2}$ | F | $R^{B1}$ | $R^{B1}$ | $R^{B1}$ | O |
| $L_{A4642}$ | $R^{B2}$ | F | $R^{B2}$ | $R^{B1}$ | $R^{B2}$ | O |
| $L_{A4643}$ | $R^{B2}$ | F | $R^{B3}$ | $R^{B1}$ | $R^{B3}$ | O |
| $L_{A4644}$ | $R^{B2}$ | F | $R^{B4}$ | $R^{B1}$ | $R^{B4}$ | O |

-continued

| | $R^1$ | $R^2$ | $R^7$ | $R^8$ | $R^9$ | X |
|---|---|---|---|---|---|---|
| $L_{A4645}$ | $R^{B2}$ | F | $R^{B5}$ | $R^{B1}$ | $R^{B5}$ | O |
| $L_{A4646}$ | $R^{B2}$ | F | $R^{B6}$ | $R^{B1}$ | $R^{B6}$ | O |
| $L_{A4647}$ | $R^{B2}$ | F | $R^{B7}$ | $R^{B1}$ | $R^{B7}$ | O |
| $L_{A4648}$ | $R^{B2}$ | F | $R^{B8}$ | $R^{B1}$ | $R^{B8}$ | O |
| $L_{A4649}$ | $R^{B2}$ | F | $R^{B9}$ | $R^{B1}$ | $R^{B9}$ | O |
| $L_{A4650}$ | $R^{B2}$ | F | $R^{A2}$ | $R^{B1}$ | $R^{A2}$ | O |
| $L_{A4651}$ | $R^{B2}$ | F | $R^{A27}$ | $R^{B1}$ | $R^{A27}$ | O |
| $L_{A4652}$ | $R^{B2}$ | F | $R^{A34}$ | $R^{B1}$ | $R^{A34}$ | O |
| $L_{A4653}$ | $R^{B3}$ | $R^{B1}$ | $R^{B1}$ | $R^{B1}$ | $R^{B1}$ | O |
| $L_{A4654}$ | $R^{B3}$ | $R^{B1}$ | $R^{B2}$ | $R^{B1}$ | $R^{B2}$ | O |
| $L_{A4655}$ | $R^{B3}$ | $R^{B1}$ | $R^{B3}$ | $R^{B1}$ | $R^{B3}$ | O |
| $L_{A4656}$ | $R^{B3}$ | $R^{B1}$ | $R^{B4}$ | $R^{B1}$ | $R^{B4}$ | O |
| $L_{A4657}$ | $R^{B3}$ | $R^{B1}$ | $R^{B5}$ | $R^{B1}$ | $R^{B5}$ | O |
| $L_{A4658}$ | $R^{B3}$ | $R^{B1}$ | $R^{B6}$ | $R^{B1}$ | $R^{B6}$ | O |
| $L_{A4659}$ | $R^{B3}$ | $R^{B1}$ | $R^{B7}$ | $R^{B1}$ | $R^{B7}$ | O |
| $L_{A4660}$ | $R^{B3}$ | $R^{B1}$ | $R^{B8}$ | $R^{B1}$ | $R^{B8}$ | O |
| $L_{A4661}$ | $R^{B3}$ | $R^{B1}$ | $R^{B9}$ | $R^{B1}$ | $R^{B9}$ | O |
| $L_{A4662}$ | $R^{B3}$ | $R^{B1}$ | $R^{A2}$ | $R^{B1}$ | $R^{A2}$ | O |
| $L_{A4663}$ | $R^{B3}$ | $R^{B1}$ | $R^{A27}$ | $R^{B1}$ | $R^{A27}$ | O |
| $L_{A4664}$ | $R^{B3}$ | $R^{B1}$ | $R^{A34}$ | $R^{B1}$ | $R^{A34}$ | O |
| $L_{A4665}$ | $R^{B1}$ | $R^{B1}$ | $R^{B1}$ | $R^{B1}$ | $R^{B1}$ | O |
| $L_{A4666}$ | $R^{B1}$ | $R^{B1}$ | $R^{B1}$ | $R^{B2}$ | $R^{B2}$ | O |
| $L_{A4667}$ | $R^{B1}$ | $R^{B1}$ | $R^{B1}$ | $R^{B3}$ | $R^{B3}$ | O |
| $L_{A4668}$ | $R^{B1}$ | $R^{B1}$ | $R^{B1}$ | $R^{B4}$ | $R^{B4}$ | O |
| $L_{A4669}$ | $R^{B1}$ | $R^{B1}$ | $R^{B1}$ | $R^{B5}$ | $R^{B5}$ | O |
| $L_{A4670}$ | $R^{B1}$ | $R^{B1}$ | $R^{B1}$ | $R^{B6}$ | $R^{B6}$ | O |
| $L_{A4671}$ | $R^{B1}$ | $R^{B1}$ | $R^{B1}$ | $R^{B7}$ | $R^{B7}$ | O |
| $L_{A4672}$ | $R^{B1}$ | $R^{B1}$ | $R^{B1}$ | $R^{B8}$ | $R^{B8}$ | O |
| $L_{A4673}$ | $R^{B1}$ | $R^{B1}$ | $R^{B1}$ | $R^{B9}$ | $R^{B9}$ | O |
| $L_{A4674}$ | $R^{B1}$ | $R^{B1}$ | $R^{B1}$ | $R^{A2}$ | $R^{A2}$ | O |
| $L_{A4675}$ | $R^{B1}$ | $R^{B1}$ | $R^{B1}$ | $R^{A27}$ | $R^{A27}$ | O |
| $L_{A4676}$ | $R^{B1}$ | $R^{B1}$ | $R^{B1}$ | $R^{A34}$ | $R^{A34}$ | O |
| $L_{A4677}$ | $R^{B2}$ | $R^{B1}$ | $R^{B1}$ | $R^{B1}$ | $R^{B1}$ | O |
| $L_{A4678}$ | $R^{B2}$ | $R^{B1}$ | $R^{B1}$ | $R^{B2}$ | $R^{B2}$ | O |
| $L_{A4679}$ | $R^{B2}$ | $R^{B1}$ | $R^{B1}$ | $R^{B3}$ | $R^{B3}$ | O |
| $L_{A4680}$ | $R^{B2}$ | $R^{B1}$ | $R^{B1}$ | $R^{B4}$ | $R^{B4}$ | O |
| $L_{A4681}$ | $R^{B2}$ | $R^{B1}$ | $R^{B1}$ | $R^{B5}$ | $R^{B5}$ | O |
| $L_{A4682}$ | $R^{B2}$ | $R^{B1}$ | $R^{B1}$ | $R^{B6}$ | $R^{B6}$ | O |
| $L_{A4683}$ | $R^{B2}$ | $R^{B1}$ | $R^{B1}$ | $R^{B7}$ | $R^{B7}$ | O |
| $L_{A4684}$ | $R^{B2}$ | $R^{B1}$ | $R^{B1}$ | $R^{B8}$ | $R^{B8}$ | O |
| $L_{A4685}$ | $R^{B2}$ | $R^{B1}$ | $R^{B1}$ | $R^{B9}$ | $R^{B9}$ | O |
| $L_{A4686}$ | $R^{B2}$ | $R^{B1}$ | $R^{B1}$ | $R^{A2}$ | $R^{A2}$ | O |
| $L_{A4687}$ | $R^{B2}$ | $R^{B1}$ | $R^{B1}$ | $R^{A27}$ | $R^{A27}$ | O |
| $L_{A4688}$ | $R^{B2}$ | $R^{B1}$ | $R^{B1}$ | $R^{A34}$ | $R^{A34}$ | O |
| $L_{A4689}$ | $R^{B2}$ | F | $R^{B1}$ | $R^{B1}$ | $R^{B1}$ | O |
| $L_{A4690}$ | $R^{B2}$ | F | $R^{B1}$ | $R^{B2}$ | $R^{B2}$ | O |
| $L_{A4691}$ | $R^{B2}$ | F | $R^{B1}$ | $R^{B3}$ | $R^{B3}$ | O |
| $L_{A4692}$ | $R^{B2}$ | F | $R^{B1}$ | $R^{B4}$ | $R^{B4}$ | O |
| $L_{A4693}$ | $R^{B2}$ | F | $R^{B1}$ | $R^{B5}$ | $R^{B5}$ | O |
| $L_{A4694}$ | $R^{B2}$ | F | $R^{B1}$ | $R^{B6}$ | $R^{B6}$ | O |
| $L_{A4695}$ | $R^{B2}$ | F | $R^{B1}$ | $R^{B7}$ | $R^{B7}$ | O |
| $L_{A4696}$ | $R^{B2}$ | F | $R^{B1}$ | $R^{B8}$ | $R^{B8}$ | O |
| $L_{A4697}$ | $R^{B2}$ | F | $R^{B1}$ | $R^{B9}$ | $R^{B9}$ | O |
| $L_{A4698}$ | $R^{B2}$ | F | $R^{B1}$ | $R^{A2}$ | $R^{A2}$ | O |
| $L_{A4699}$ | $R^{B2}$ | F | $R^{B1}$ | $R^{A27}$ | $R^{A27}$ | O |
| $L_{A4700}$ | $R^{B2}$ | F | $R^{B1}$ | $R^{A34}$ | $R^{A34}$ | O |
| $L_{A4701}$ | $R^{B3}$ | $R^{B1}$ | $R^{B1}$ | $R^{B1}$ | $R^{B1}$ | O |
| $L_{A4702}$ | $R^{B3}$ | $R^{B1}$ | $R^{B1}$ | $R^{B2}$ | $R^{B2}$ | O |
| $L_{A4703}$ | $R^{B3}$ | $R^{B1}$ | $R^{B1}$ | $R^{B3}$ | $R^{B3}$ | O |
| $L_{A4704}$ | $R^{B3}$ | $R^{B1}$ | $R^{B1}$ | $R^{B4}$ | $R^{B4}$ | O |
| $L_{A4705}$ | $R^{B3}$ | $R^{B1}$ | $R^{B1}$ | $R^{B5}$ | $R^{B5}$ | O |
| $L_{A4706}$ | $R^{B3}$ | $R^{B1}$ | $R^{B1}$ | $R^{B6}$ | $R^{B6}$ | O |
| $L_{A4707}$ | $R^{B3}$ | $R^{B1}$ | $R^{B1}$ | $R^{B7}$ | $R^{B7}$ | O |
| $L_{A4708}$ | $R^{B3}$ | $R^{B1}$ | $R^{B1}$ | $R^{B8}$ | $R^{B8}$ | O |
| $L_{A4709}$ | $R^{B3}$ | $R^{B1}$ | $R^{B1}$ | $R^{B9}$ | $R^{B9}$ | O |
| $L_{A4710}$ | $R^{B3}$ | $R^{B1}$ | $R^{B1}$ | $R^{A2}$ | $R^{A2}$ | O |
| $L_{A4711}$ | $R^{B3}$ | $R^{B1}$ | $R^{B1}$ | $R^{A27}$ | $R^{A27}$ | O |
| $L_{A4712}$ | $R^{B3}$ | $R^{B1}$ | $R^{B1}$ | $R^{A34}$ | $R^{A34}$ | O |
| $L_{A4713}$ | $R^{B1}$ | $R^{B1}$ | $R^{B1}$ | $R^{B1}$ | $R^{B1}$ | O |
| $L_{A4714}$ | $R^{B1}$ | $R^{B1}$ | $R^{B2}$ | $R^{B2}$ | $R^{B1}$ | O |
| $L_{A4715}$ | $R^{B1}$ | $R^{B1}$ | $R^{B3}$ | $R^{B3}$ | $R^{B1}$ | O |
| $L_{A4716}$ | $R^{B1}$ | $R^{B1}$ | $R^{B4}$ | $R^{B4}$ | $R^{B1}$ | O |
| $L_{A4717}$ | $R^{B1}$ | $R^{B1}$ | $R^{B5}$ | $R^{B5}$ | $R^{B1}$ | O |
| $L_{A4718}$ | $R^{B1}$ | $R^{B1}$ | $R^{B6}$ | $R^{B6}$ | $R^{B1}$ | O |
| $L_{A4719}$ | $R^{B1}$ | $R^{B1}$ | $R^{B7}$ | $R^{B7}$ | $R^{B1}$ | O |
| $L_{A4720}$ | $R^{B1}$ | $R^{B1}$ | $R^{B8}$ | $R^{B8}$ | $R^{B1}$ | O |
| $L_{A4721}$ | $R^{B1}$ | $R^{B1}$ | $R^{B9}$ | $R^{B9}$ | $R^{B1}$ | O |

-continued

| | $R^1$ | $R^2$ | $R^7$ | $R^8$ | $R^9$ | X |
|---|---|---|---|---|---|---|
| $L_{A4722}$ | $R^{B1}$ | $R^{B1}$ | $R^{A2}$ | $R^{A2}$ | $R^{B1}$ | O |
| $L_{A4723}$ | $R^{B1}$ | $R^{B1}$ | $R^{A27}$ | $R^{A27}$ | $R^{B1}$ | O |
| $L_{A4724}$ | $R^{B1}$ | $R^{B1}$ | $R^{A34}$ | $R^{A34}$ | $R^{B1}$ | O |
| $L_{A4725}$ | $R^{B2}$ | $R^{B1}$ | $R^{B1}$ | $R^{B1}$ | $R^{B1}$ | O |
| $L_{A4726}$ | $R^{B2}$ | $R^{B1}$ | $R^{B2}$ | $R^{B2}$ | $R^{B1}$ | O |
| $L_{A4727}$ | $R^{B2}$ | $R^{B1}$ | $R^{B3}$ | $R^{B3}$ | $R^{B1}$ | O |
| $L_{A4728}$ | $R^{B2}$ | $R^{B1}$ | $R^{B4}$ | $R^{B4}$ | $R^{B1}$ | O |
| $L_{A4729}$ | $R^{B2}$ | $R^{B1}$ | $R^{B5}$ | $R^{B5}$ | $R^{B1}$ | O |
| $L_{A4730}$ | $R^{B2}$ | $R^{B1}$ | $R^{B6}$ | $R^{B6}$ | $R^{B1}$ | O |
| $L_{A4731}$ | $R^{B2}$ | $R^{B1}$ | $R^{B7}$ | $R^{B7}$ | $R^{B1}$ | O |
| $L_{A4732}$ | $R^{B2}$ | $R^{B1}$ | $R^{B8}$ | $R^{B8}$ | $R^{B1}$ | O |
| $L_{A4733}$ | $R^{B2}$ | $R^{B1}$ | $R^{B9}$ | $R^{B9}$ | $R^{B1}$ | O |
| $L_{A4734}$ | $R^{B2}$ | $R^{B1}$ | $R^{A2}$ | $R^{A2}$ | $R^{B1}$ | O |
| $L_{A4735}$ | $R^{B2}$ | $R^{B1}$ | $R^{A27}$ | $R^{A27}$ | $R^{B1}$ | O |
| $L_{A4736}$ | $R^{B2}$ | $R^{B1}$ | $R^{A34}$ | $R^{A34}$ | $R^{B1}$ | O |
| $L_{A4737}$ | $R^{B2}$ | F | $R^{B1}$ | $R^{B1}$ | $R^{B1}$ | O |
| $L_{A4738}$ | $R^{B2}$ | F | $R^{B2}$ | $R^{B2}$ | $R^{B1}$ | O |
| $L_{A4739}$ | $R^{B2}$ | F | $R^{B3}$ | $R^{B3}$ | $R^{B1}$ | O |
| $L_{A4740}$ | $R^{B2}$ | F | $R^{B4}$ | $R^{B4}$ | $R^{B1}$ | O |
| $L_{A4741}$ | $R^{B2}$ | F | $R^{B5}$ | $R^{B5}$ | $R^{B1}$ | O |
| $L_{A4742}$ | $R^{B2}$ | F | $R^{B6}$ | $R^{B6}$ | $R^{B1}$ | O |
| $L_{A4743}$ | $R^{B2}$ | F | $R^{B7}$ | $R^{B7}$ | $R^{B1}$ | O |
| $L_{A4744}$ | $R^{B2}$ | F | $R^{B8}$ | $R^{B8}$ | $R^{B1}$ | O |
| $L_{A4745}$ | $R^{B2}$ | F | $R^{B9}$ | $R^{B9}$ | $R^{B1}$ | O |
| $L_{A4746}$ | $R^{B2}$ | F | $R^{A2}$ | $R^{A2}$ | $R^{B1}$ | O |
| $L_{A4747}$ | $R^{B2}$ | F | $R^{A27}$ | $R^{A27}$ | $R^{B1}$ | O |
| $L_{A4748}$ | $R^{B2}$ | F | $R^{A34}$ | $R^{A34}$ | $R^{B1}$ | O |
| $L_{A4749}$ | $R^{B3}$ | $R^{B1}$ | $R^{B1}$ | $R^{B1}$ | $R^{B1}$ | O |
| $L_{A4750}$ | $R^{B3}$ | $R^{B1}$ | $R^{B2}$ | $R^{B2}$ | $R^{B1}$ | O |
| $L_{A4751}$ | $R^{B3}$ | $R^{B1}$ | $R^{B3}$ | $R^{B3}$ | $R^{B1}$ | O |
| $L_{A4752}$ | $R^{B3}$ | $R^{B1}$ | $R^{B4}$ | $R^{B4}$ | $R^{B1}$ | O |
| $L_{A4753}$ | $R^{B3}$ | $R^{B1}$ | $R^{B5}$ | $R^{B5}$ | $R^{B1}$ | O |
| $L_{A4754}$ | $R^{B3}$ | $R^{B1}$ | $R^{B6}$ | $R^{B6}$ | $R^{B1}$ | O |
| $L_{A4755}$ | $R^{B3}$ | $R^{B1}$ | $R^{B7}$ | $R^{B7}$ | $R^{B1}$ | O |
| $L_{A4756}$ | $R^{B3}$ | $R^{B1}$ | $R^{B8}$ | $R^{B8}$ | $R^{B1}$ | O |
| $L_{A4757}$ | $R^{B3}$ | $R^{B1}$ | $R^{B9}$ | $R^{B9}$ | $R^{B1}$ | O |
| $L_{A4758}$ | $R^{B3}$ | $R^{B1}$ | $R^{A2}$ | $R^{A2}$ | $R^{B1}$ | O |
| $L_{A4759}$ | $R^{B3}$ | $R^{B1}$ | $R^{A27}$ | $R^{A27}$ | $R^{B1}$ | O |
| $L_{A4760}$ | $R^{B3}$ | $R^{B1}$ | $R^{A34}$ | $R^{A34}$ | $R^{B1}$ | O |

for $L_{A4761}$ through $L_{A5192}$, $L_A$ has a structure of

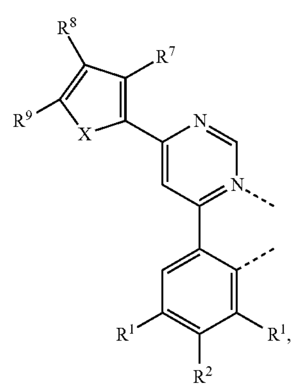

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A4761}$ | $R^{B1}$ | $R^{B1}$ | $R^{B2}$ | $R^{B1}$ | $R^{B2}$ | S |
| $L_{A4762}$ | $R^{B1}$ | $R^{B1}$ | $R^{B3}$ | $R^{B1}$ | $R^{B3}$ | S |
| $L_{A4763}$ | $R^{B1}$ | $R^{B1}$ | $R^{B4}$ | $R^{B1}$ | $R^{B4}$ | S |
| $L_{A4764}$ | $R^{B1}$ | $R^{B1}$ | $R^{B5}$ | $R^{B1}$ | $R^{B5}$ | S |
| $L_{A4765}$ | $R^{B1}$ | $R^{B1}$ | $R^{B6}$ | $R^{B1}$ | $R^{B6}$ | S |
| $L_{A4766}$ | $R^{B1}$ | $R^{B1}$ | $R^{B7}$ | $R^{B1}$ | $R^{B7}$ | S |
| $L_{A4767}$ | $R^{B1}$ | $R^{B1}$ | $R^{B8}$ | $R^{B1}$ | $R^{B8}$ | S |

-continued

| | $R^1$ | $R^2$ | $R^7$ | $R^8$ | $R^9$ | X |
|---|---|---|---|---|---|---|
| $L_{44768}$ | $R^{B1}$ | $R^{B1}$ | $R^{B9}$ | $R^{B1}$ | $R^{B9}$ | S |
| $L_{44769}$ | $R^{B1}$ | $R^{B1}$ | $R^{A2}$ | $R^{B1}$ | $R^{A2}$ | S |
| $L_{44770}$ | $R^{B1}$ | $R^{B1}$ | $R^{A27}$ | $R^{B1}$ | $R^{A27}$ | S |
| $L_{44771}$ | $R^{B1}$ | $R^{B1}$ | $R^{A34}$ | $R^{B1}$ | $R^{A34}$ | S |
| $L_{44772}$ | $R^{B2}$ | $R^{B1}$ | $R^{B2}$ | $R^{B1}$ | $R^{B2}$ | S |
| $L_{44773}$ | $R^{B2}$ | $R^{B1}$ | $R^{B3}$ | $R^{B1}$ | $R^{B3}$ | S |
| $L_{44774}$ | $R^{B2}$ | $R^{B1}$ | $R^{B4}$ | $R^{B1}$ | $R^{B4}$ | S |
| $L_{44775}$ | $R^{B2}$ | $R^{B1}$ | $R^{B5}$ | $R^{B1}$ | $R^{B5}$ | S |
| $L_{44776}$ | $R^{B2}$ | $R^{B1}$ | $R^{B6}$ | $R^{B1}$ | $R^{B6}$ | S |
| $L_{44777}$ | $R^{B2}$ | $R^{B1}$ | $R^{B7}$ | $R^{B1}$ | $R^{B7}$ | S |
| $L_{44778}$ | $R^{B2}$ | $R^{B1}$ | $R^{B8}$ | $R^{B1}$ | $R^{B8}$ | S |
| $L_{44779}$ | $R^{B2}$ | $R^{B1}$ | $R^{B9}$ | $R^{B1}$ | $R^{B9}$ | S |
| $L_{44780}$ | $R^{B2}$ | $R^{B1}$ | $R^{A2}$ | $R^{B1}$ | $R^{A2}$ | S |
| $L_{44781}$ | $R^{B2}$ | $R^{B1}$ | $R^{A27}$ | $R^{B1}$ | $R^{A27}$ | S |
| $L_{44782}$ | $R^{B2}$ | $R^{B1}$ | $R^{A34}$ | $R^{B1}$ | $R^{A34}$ | S |
| $L_{44783}$ | $R^{B2}$ | F | $R^{B2}$ | $R^{B1}$ | $R^{B2}$ | S |
| $L_{44784}$ | $R^{B2}$ | F | $R^{B3}$ | $R^{B1}$ | $R^{B3}$ | S |
| $L_{44785}$ | $R^{B2}$ | F | $R^{B4}$ | $R^{B1}$ | $R^{B4}$ | S |
| $L_{44786}$ | $R^{B2}$ | F | $R^{B5}$ | $R^{B1}$ | $R^{B5}$ | S |
| $L_{44787}$ | $R^{B2}$ | F | $R^{B6}$ | $R^{B1}$ | $R^{B6}$ | S |
| $L_{44788}$ | $R^{B2}$ | F | $R^{B7}$ | $R^{B1}$ | $R^{B7}$ | S |
| $L_{44789}$ | $R^{B2}$ | F | $R^{B8}$ | $R^{B1}$ | $R^{B8}$ | S |
| $L_{44790}$ | $R^{B2}$ | F | $R^{B9}$ | $R^{B1}$ | $R^{B9}$ | S |
| $L_{44791}$ | $R^{B2}$ | F | $R^{A2}$ | $R^{B1}$ | $R^{A2}$ | S |
| $L_{44792}$ | $R^{B2}$ | F | $R^{A27}$ | $R^{B1}$ | $R^{A27}$ | S |
| $L_{44793}$ | $R^{B2}$ | F | $R^{A34}$ | $R^{B1}$ | $R^{A34}$ | S |
| $L_{44794}$ | $R^{B3}$ | $R^{B1}$ | $R^{B2}$ | $R^{B1}$ | $R^{B2}$ | S |
| $L_{44795}$ | $R^{B3}$ | $R^{B1}$ | $R^{B3}$ | $R^{B1}$ | $R^{B3}$ | S |
| $L_{44796}$ | $R^{B3}$ | $R^{B1}$ | $R^{B4}$ | $R^{B1}$ | $R^{B4}$ | S |
| $L_{44797}$ | $R^{B3}$ | $R^{B1}$ | $R^{B5}$ | $R^{B1}$ | $R^{B5}$ | S |
| $L_{44798}$ | $R^{B3}$ | $R^{B1}$ | $R^{B6}$ | $R^{B1}$ | $R^{B6}$ | S |
| $L_{44799}$ | $R^{B3}$ | $R^{B1}$ | $R^{B7}$ | $R^{B1}$ | $R^{B7}$ | S |
| $L_{44800}$ | $R^{B3}$ | $R^{B1}$ | $R^{B8}$ | $R^{B1}$ | $R^{B8}$ | S |
| $L_{44801}$ | $R^{B3}$ | $R^{B1}$ | $R^{B9}$ | $R^{B1}$ | $R^{B9}$ | S |
| $L_{44802}$ | $R^{B3}$ | $R^{B1}$ | $R^{A2}$ | $R^{B1}$ | $R^{A2}$ | S |
| $L_{44803}$ | $R^{B3}$ | $R^{B1}$ | $R^{A27}$ | $R^{B1}$ | $R^{A27}$ | S |
| $L_{44804}$ | $R^{B3}$ | $R^{B1}$ | $R^{A34}$ | $R^{B1}$ | $R^{A34}$ | S |
| $L_{44805}$ | $R^{B1}$ | $R^{B1}$ | $R^{B1}$ | $R^{B2}$ | $R^{B2}$ | S |
| $L_{44806}$ | $R^{B1}$ | $R^{B1}$ | $R^{B1}$ | $R^{B3}$ | $R^{B3}$ | S |
| $L_{44807}$ | $R^{B1}$ | $R^{B1}$ | $R^{B1}$ | $R^{B4}$ | $R^{B4}$ | S |
| $L_{44808}$ | $R^{B1}$ | $R^{B1}$ | $R^{B1}$ | $R^{B5}$ | $R^{B5}$ | S |
| $L_{44809}$ | $R^{B1}$ | $R^{B1}$ | $R^{B1}$ | $R^{B6}$ | $R^{B6}$ | S |
| $L_{44810}$ | $R^{B1}$ | $R^{B1}$ | $R^{B1}$ | $R^{B7}$ | $R^{B7}$ | S |
| $L_{44811}$ | $R^{B1}$ | $R^{B1}$ | $R^{B1}$ | $R^{B8}$ | $R^{B8}$ | S |
| $L_{44812}$ | $R^{B1}$ | $R^{B1}$ | $R^{B1}$ | $R^{B9}$ | $R^{B9}$ | S |
| $L_{44813}$ | $R^{B1}$ | $R^{B1}$ | $R^{B1}$ | $R^{A2}$ | $R^{A2}$ | S |
| $L_{44814}$ | $R^{B1}$ | $R^{B1}$ | $R^{B1}$ | $R^{A27}$ | $R^{A27}$ | S |
| $L_{44815}$ | $R^{B1}$ | $R^{B1}$ | $R^{B1}$ | $R^{A34}$ | $R^{A34}$ | S |
| $L_{44816}$ | $R^{B2}$ | $R^{B1}$ | $R^{B1}$ | $R^{B2}$ | $R^{B2}$ | S |
| $L_{44817}$ | $R^{B2}$ | $R^{B1}$ | $R^{B1}$ | $R^{B3}$ | $R^{B3}$ | S |
| $L_{44818}$ | $R^{B2}$ | $R^{B1}$ | $R^{B1}$ | $R^{B4}$ | $R^{B4}$ | S |
| $L_{44819}$ | $R^{B2}$ | $R^{B1}$ | $R^{B1}$ | $R^{B5}$ | $R^{B5}$ | S |
| $L_{44820}$ | $R^{B2}$ | $R^{B1}$ | $R^{B1}$ | $R^{B6}$ | $R^{B6}$ | S |
| $L_{44821}$ | $R^{B2}$ | $R^{B1}$ | $R^{B1}$ | $R^{B7}$ | $R^{B7}$ | S |
| $L_{44822}$ | $R^{B2}$ | $R^{B1}$ | $R^{B1}$ | $R^{B8}$ | $R^{B8}$ | S |
| $L_{44823}$ | $R^{B2}$ | $R^{B1}$ | $R^{B1}$ | $R^{B9}$ | $R^{B9}$ | S |
| $L_{44824}$ | $R^{B2}$ | $R^{B1}$ | $R^{B1}$ | $R^{A2}$ | $R^{A2}$ | S |
| $L_{44825}$ | $R^{B2}$ | $R^{B1}$ | $R^{B1}$ | $R^{A27}$ | $R^{A27}$ | S |
| $L_{44826}$ | $R^{B2}$ | $R^{B1}$ | $R^{B1}$ | $R^{A34}$ | $R^{A34}$ | S |
| $L_{44827}$ | $R^{B2}$ | F | $R^{B1}$ | $R^{B2}$ | $R^{B2}$ | S |
| $L_{44828}$ | $R^{B2}$ | F | $R^{B1}$ | $R^{B3}$ | $R^{B3}$ | S |
| $L_{44829}$ | $R^{B2}$ | F | $R^{B1}$ | $R^{B4}$ | $R^{B4}$ | S |
| $L_{44830}$ | $R^{B2}$ | F | $R^{B1}$ | $R^{B5}$ | $R^{B5}$ | S |
| $L_{44831}$ | $R^{B2}$ | F | $R^{B1}$ | $R^{B6}$ | $R^{B6}$ | S |
| $L_{44832}$ | $R^{B2}$ | F | $R^{B1}$ | $R^{B7}$ | $R^{B7}$ | S |
| $L_{44833}$ | $R^{B2}$ | F | $R^{B1}$ | $R^{B8}$ | $R^{B8}$ | S |
| $L_{44834}$ | $R^{B2}$ | F | $R^{B1}$ | $R^{B9}$ | $R^{B9}$ | S |
| $L_{44835}$ | $R^{B2}$ | F | $R^{B1}$ | $R^{A2}$ | $R^{A2}$ | S |
| $L_{44836}$ | $R^{B2}$ | F | $R^{B1}$ | $R^{A27}$ | $R^{A27}$ | S |
| $L_{44837}$ | $R^{B2}$ | F | $R^{B1}$ | $R^{A34}$ | $R^{A34}$ | S |
| $L_{44838}$ | $R^{B3}$ | $R^{B1}$ | $R^{B1}$ | $R^{B2}$ | $R^{B2}$ | S |
| $L_{44839}$ | $R^{B3}$ | $R^{B1}$ | $R^{B1}$ | $R^{B3}$ | $R^{B3}$ | S |
| $L_{44840}$ | $R^{B3}$ | $R^{B1}$ | $R^{B1}$ | $R^{B4}$ | $R^{B4}$ | S |
| $L_{44841}$ | $R^{B3}$ | $R^{B1}$ | $R^{B1}$ | $R^{B5}$ | $R^{B5}$ | S |
| $L_{44842}$ | $R^{B3}$ | $R^{B1}$ | $R^{B1}$ | $R^{B6}$ | $R^{B6}$ | S |
| $L_{44843}$ | $R^{B3}$ | $R^{B1}$ | $R^{B1}$ | $R^{B7}$ | $R^{B7}$ | S |
| $L_{44844}$ | $R^{B3}$ | $R^{B1}$ | $R^{B1}$ | $R^{B8}$ | $R^{B8}$ | S |

-continued

| | $R^1$ | $R^2$ | $R^7$ | $R^8$ | $R^9$ | X |
|---|---|---|---|---|---|---|
| $L_{44845}$ | $R^{B3}$ | $R^{B1}$ | $R^{B1}$ | $R^{B9}$ | $R^{B9}$ | S |
| $L_{44846}$ | $R^{B3}$ | $R^{B1}$ | $R^{B1}$ | $R^{A2}$ | $R^{A2}$ | S |
| $L_{44847}$ | $R^{B3}$ | $R^{B1}$ | $R^{B1}$ | $R^{A27}$ | $R^{A27}$ | S |
| $L_{44848}$ | $R^{B3}$ | $R^{B1}$ | $R^{B1}$ | $R^{A34}$ | $R^{A34}$ | S |
| $L_{44849}$ | $R^{B1}$ | $R^{B1}$ | $R^{B2}$ | $R^{B2}$ | $R^{B1}$ | S |
| $L_{44850}$ | $R^{B1}$ | $R^{B1}$ | $R^{B3}$ | $R^{B3}$ | $R^{B1}$ | S |
| $L_{44851}$ | $R^{B1}$ | $R^{B1}$ | $R^{B4}$ | $R^{B4}$ | $R^{B1}$ | S |
| $L_{44852}$ | $R^{B1}$ | $R^{B1}$ | $R^{B5}$ | $R^{B5}$ | $R^{B1}$ | S |
| $L_{44853}$ | $R^{B1}$ | $R^{B1}$ | $R^{B6}$ | $R^{B6}$ | $R^{B1}$ | S |
| $L_{44854}$ | $R^{B1}$ | $R^{B1}$ | $R^{B7}$ | $R^{B7}$ | $R^{B1}$ | S |
| $L_{44855}$ | $R^{B1}$ | $R^{B1}$ | $R^{B8}$ | $R^{B8}$ | $R^{B1}$ | S |
| $L_{44856}$ | $R^{B1}$ | $R^{B1}$ | $R^{B9}$ | $R^{B9}$ | $R^{B1}$ | S |
| $L_{44857}$ | $R^{B1}$ | $R^{B1}$ | $R^{A2}$ | $R^{A2}$ | $R^{B1}$ | S |
| $L_{44858}$ | $R^{B1}$ | $R^{B1}$ | $R^{A27}$ | $R^{A27}$ | $R^{B1}$ | S |
| $L_{44859}$ | $R^{B1}$ | $R^{B1}$ | $R^{A34}$ | $R^{A34}$ | $R^{B1}$ | S |
| $L_{44860}$ | $R^{B2}$ | $R^{B1}$ | $R^{B2}$ | $R^{B2}$ | $R^{B1}$ | S |
| $L_{44861}$ | $R^{B2}$ | $R^{B1}$ | $R^{B3}$ | $R^{B3}$ | $R^{B1}$ | S |
| $L_{44862}$ | $R^{B2}$ | $R^{B1}$ | $R^{B4}$ | $R^{B4}$ | $R^{B1}$ | S |
| $L_{44863}$ | $R^{B2}$ | $R^{B1}$ | $R^{B5}$ | $R^{B5}$ | $R^{B1}$ | S |
| $L_{44864}$ | $R^{B2}$ | $R^{B1}$ | $R^{B6}$ | $R^{B6}$ | $R^{B1}$ | S |
| $L_{44865}$ | $R^{B2}$ | $R^{B1}$ | $R^{B7}$ | $R^{B7}$ | $R^{B1}$ | S |
| $L_{44866}$ | $R^{B2}$ | $R^{B1}$ | $R^{B8}$ | $R^{B8}$ | $R^{B1}$ | S |
| $L_{44867}$ | $R^{B2}$ | $R^{B1}$ | $R^{B9}$ | $R^{B9}$ | $R^{B1}$ | S |
| $L_{44868}$ | $R^{B2}$ | $R^{B1}$ | $R^{A2}$ | $R^{A2}$ | $R^{B1}$ | S |
| $L_{44869}$ | $R^{B2}$ | $R^{B1}$ | $R^{A27}$ | $R^{A27}$ | $R^{B1}$ | S |
| $L_{44870}$ | $R^{B2}$ | $R^{B1}$ | $R^{A34}$ | $R^{A34}$ | $R^{B1}$ | S |
| $L_{44871}$ | $R^{B2}$ | F | $R^{B2}$ | $R^{B2}$ | $R^{B1}$ | S |
| $L_{44872}$ | $R^{B2}$ | F | $R^{B3}$ | $R^{B3}$ | $R^{B1}$ | S |
| $L_{44873}$ | $R^{B2}$ | F | $R^{B4}$ | $R^{B4}$ | $R^{B1}$ | S |
| $L_{44874}$ | $R^{B2}$ | F | $R^{B5}$ | $R^{B5}$ | $R^{B1}$ | S |
| $L_{44875}$ | $R^{B2}$ | F | $R^{B6}$ | $R^{B6}$ | $R^{B1}$ | S |
| $L_{44876}$ | $R^{B2}$ | F | $R^{B7}$ | $R^{B7}$ | $R^{B1}$ | S |
| $L_{44877}$ | $R^{B2}$ | F | $R^{B8}$ | $R^{B8}$ | $R^{B1}$ | S |
| $L_{44878}$ | $R^{B2}$ | F | $R^{B9}$ | $R^{B9}$ | $R^{B1}$ | S |
| $L_{44879}$ | $R^{B2}$ | F | $R^{A2}$ | $R^{A2}$ | $R^{B1}$ | S |
| $L_{44880}$ | $R^{B2}$ | F | $R^{A27}$ | $R^{A27}$ | $R^{B1}$ | S |
| $L_{44881}$ | $R^{B2}$ | F | $R^{A34}$ | $R^{A34}$ | $R^{B1}$ | S |
| $L_{44882}$ | $R^{B3}$ | $R^{B1}$ | $R^{B2}$ | $R^{B2}$ | $R^{B1}$ | S |
| $L_{44883}$ | $R^{B3}$ | $R^{B1}$ | $R^{B3}$ | $R^{B3}$ | $R^{B1}$ | S |
| $L_{44884}$ | $R^{B3}$ | $R^{B1}$ | $R^{B4}$ | $R^{B4}$ | $R^{B1}$ | S |
| $L_{44885}$ | $R^{B3}$ | $R^{B1}$ | $R^{B5}$ | $R^{B5}$ | $R^{B1}$ | S |
| $L_{44886}$ | $R^{B3}$ | $R^{B1}$ | $R^{B6}$ | $R^{B6}$ | $R^{B1}$ | S |
| $L_{44887}$ | $R^{B3}$ | $R^{B1}$ | $R^{B7}$ | $R^{B7}$ | $R^{B1}$ | S |
| $L_{44888}$ | $R^{B3}$ | $R^{B1}$ | $R^{B8}$ | $R^{B8}$ | $R^{B1}$ | S |
| $L_{44889}$ | $R^{B3}$ | $R^{B1}$ | $R^{B9}$ | $R^{B9}$ | $R^{B1}$ | S |
| $L_{44890}$ | $R^{B3}$ | $R^{B1}$ | $R^{A2}$ | $R^{A2}$ | $R^{B1}$ | S |
| $L_{44891}$ | $R^{B3}$ | $R^{B1}$ | $R^{A27}$ | $R^{A27}$ | $R^{B1}$ | S |
| $L_{44892}$ | $R^{B3}$ | $R^{B1}$ | $R^{A34}$ | $R^{A34}$ | $R^{B1}$ | S |
| $L_{44893}$ | $R^{B1}$ | $R^{B1}$ | $R^{B2}$ | $R^{B2}$ | $R^{B2}$ | S |
| $L_{44894}$ | $R^{B1}$ | $R^{B1}$ | $R^{B3}$ | $R^{B3}$ | $R^{B3}$ | S |
| $L_{44895}$ | $R^{B1}$ | $R^{B1}$ | $R^{B4}$ | $R^{B4}$ | $R^{B4}$ | S |
| $L_{44896}$ | $R^{B1}$ | $R^{B1}$ | $R^{B5}$ | $R^{B5}$ | $R^{B5}$ | S |
| $L_{44897}$ | $R^{B1}$ | $R^{B1}$ | $R^{B6}$ | $R^{B6}$ | $R^{B6}$ | S |
| $L_{44898}$ | $R^{B1}$ | $R^{B1}$ | $R^{B7}$ | $R^{B7}$ | $R^{B7}$ | S |
| $L_{44899}$ | $R^{B1}$ | $R^{B1}$ | $R^{B8}$ | $R^{B8}$ | $R^{B8}$ | S |
| $L_{44900}$ | $R^{B1}$ | $R^{B1}$ | $R^{B9}$ | $R^{B9}$ | $R^{B9}$ | S |
| $L_{44901}$ | $R^{B1}$ | $R^{B1}$ | $R^{A2}$ | $R^{A2}$ | $R^{A2}$ | S |
| $L_{44902}$ | $R^{B1}$ | $R^{B1}$ | $R^{A27}$ | $R^{A27}$ | $R^{A27}$ | S |
| $L_{44903}$ | $R^{B1}$ | $R^{B1}$ | $R^{A34}$ | $R^{A34}$ | $R^{A34}$ | S |
| $L_{44904}$ | $R^{B2}$ | $R^{B1}$ | $R^{B2}$ | $R^{B2}$ | $R^{B2}$ | S |
| $L_{44905}$ | $R^{B2}$ | $R^{B1}$ | $R^{B3}$ | $R^{B3}$ | $R^{B3}$ | S |
| $L_{44906}$ | $R^{B2}$ | $R^{B1}$ | $R^{B4}$ | $R^{B4}$ | $R^{B4}$ | S |
| $L_{44907}$ | $R^{B2}$ | $R^{B1}$ | $R^{B5}$ | $R^{B5}$ | $R^{B5}$ | S |
| $L_{44908}$ | $R^{B2}$ | $R^{B1}$ | $R^{B6}$ | $R^{B6}$ | $R^{B6}$ | S |
| $L_{44909}$ | $R^{B2}$ | $R^{B1}$ | $R^{B7}$ | $R^{B7}$ | $R^{B7}$ | S |
| $L_{44910}$ | $R^{B2}$ | $R^{B1}$ | $R^{B8}$ | $R^{B8}$ | $R^{B8}$ | S |
| $L_{44911}$ | $R^{B2}$ | $R^{B1}$ | $R^{B9}$ | $R^{B9}$ | $R^{B9}$ | S |
| $L_{44912}$ | $R^{B2}$ | $R^{B1}$ | $R^{A2}$ | $R^{A2}$ | $R^{A2}$ | S |
| $L_{44913}$ | $R^{B2}$ | $R^{B1}$ | $R^{A27}$ | $R^{A27}$ | $R^{A27}$ | S |
| $L_{44914}$ | $R^{B2}$ | $R^{B1}$ | $R^{A34}$ | $R^{A34}$ | $R^{A34}$ | S |
| $L_{44915}$ | $R^{B2}$ | F | $R^{B2}$ | $R^{B2}$ | $R^{B2}$ | S |
| $L_{44916}$ | $R^{B2}$ | F | $R^{B3}$ | $R^{B3}$ | $R^{B3}$ | S |
| $L_{44917}$ | $R^{B2}$ | F | $R^{B4}$ | $R^{B4}$ | $R^{B4}$ | S |
| $L_{44918}$ | $R^{B2}$ | F | $R^{B5}$ | $R^{B5}$ | $R^{B5}$ | S |
| $L_{44919}$ | $R^{B2}$ | F | $R^{B6}$ | $R^{B6}$ | $R^{B6}$ | S |
| $L_{44920}$ | $R^{B2}$ | F | $R^{B7}$ | $R^{B7}$ | $R^{B7}$ | S |
| $L_{44921}$ | $R^{B2}$ | F | $R^{B8}$ | $R^{B8}$ | $R^{B8}$ | S |

-continued

| | $R^1$ | $R^2$ | $R^7$ | $R^8$ | $R^9$ | X |
|---|---|---|---|---|---|---|
| $L_{44922}$ | $R^{B2}$ | F | $R^{B9}$ | $R^{B9}$ | $R^{B9}$ | S |
| $L_{44923}$ | $R^{B2}$ | F | $R^{A2}$ | $R^{A2}$ | $R^{A2}$ | S |
| $L_{44924}$ | $R^{B2}$ | F | $R^{A27}$ | $R^{A27}$ | $R^{A27}$ | S |
| $L_{44925}$ | $R^{B2}$ | F | $R^{A34}$ | $R^{A34}$ | $R^{A34}$ | S |
| $L_{44926}$ | $R^{B3}$ | $R^{B1}$ | $R^{B2}$ | $R^{B2}$ | $R^{B2}$ | S |
| $L_{44927}$ | $R^{B3}$ | $R^{B1}$ | $R^{B3}$ | $R^{B3}$ | $R^{B3}$ | S |
| $L_{44928}$ | $R^{B3}$ | $R^{B1}$ | $R^{B4}$ | $R^{B4}$ | $R^{B4}$ | S |
| $L_{44929}$ | $R^{B3}$ | $R^{B1}$ | $R^{B5}$ | $R^{B5}$ | $R^{B5}$ | S |
| $L_{44930}$ | $R^{B3}$ | $R^{B1}$ | $R^{B6}$ | $R^{B6}$ | $R^{B6}$ | S |
| $L_{44931}$ | $R^{B3}$ | $R^{B1}$ | $R^{B7}$ | $R^{B7}$ | $R^{B7}$ | S |
| $L_{44932}$ | $R^{B3}$ | $R^{B1}$ | $R^{B8}$ | $R^{B8}$ | $R^{B8}$ | S |
| $L_{44933}$ | $R^{B3}$ | $R^{B1}$ | $R^{B9}$ | $R^{B9}$ | $R^{B9}$ | S |
| $L_{44934}$ | $R^{B3}$ | $R^{B1}$ | $R^{A2}$ | $R^{A2}$ | $R^{A2}$ | S |
| $L_{44935}$ | $R^{B3}$ | $R^{B1}$ | $R^{A27}$ | $R^{A27}$ | $R^{A27}$ | S |
| $L_{44936}$ | $R^{B3}$ | $R^{B1}$ | $R^{A34}$ | $R^{A34}$ | $R^{A34}$ | S |
| $L_{44937}$ | $R^{B1}$ | $R^{B1}$ | $R^{B2}$ | $R^{B1}$ | $R^{B3}$ | S |
| $L_{44938}$ | $R^{B1}$ | $R^{B1}$ | $R^{B2}$ | $R^{B1}$ | $R^{B4}$ | S |
| $L_{44939}$ | $R^{B1}$ | $R^{B1}$ | $R^{B2}$ | $R^{B1}$ | $R^{B5}$ | S |
| $L_{44940}$ | $R^{B1}$ | $R^{B1}$ | $R^{B2}$ | $R^{B1}$ | $R^{B6}$ | S |
| $L_{44941}$ | $R^{B1}$ | $R^{B1}$ | $R^{B2}$ | $R^{B1}$ | $R^{B7}$ | S |
| $L_{44942}$ | $R^{B1}$ | $R^{B1}$ | $R^{B2}$ | $R^{B1}$ | $R^{B8}$ | S |
| $L_{44943}$ | $R^{B1}$ | $R^{B1}$ | $R^{B2}$ | $R^{B1}$ | $R^{B9}$ | S |
| $L_{44944}$ | $R^{B1}$ | $R^{B1}$ | $R^{B2}$ | $R^{B1}$ | $R^{A2}$ | S |
| $L_{44945}$ | $R^{B1}$ | $R^{B1}$ | $R^{B2}$ | $R^{B1}$ | $R^{A27}$ | S |
| $L_{44946}$ | $R^{B1}$ | $R^{B1}$ | $R^{B2}$ | $R^{B1}$ | $R^{A34}$ | S |
| $L_{44947}$ | $R^{B2}$ | $R^{B1}$ | $R^{B2}$ | $R^{B1}$ | $R^{B3}$ | S |
| $L_{44948}$ | $R^{B2}$ | $R^{B1}$ | $R^{B2}$ | $R^{B1}$ | $R^{B4}$ | S |
| $L_{44949}$ | $R^{B2}$ | $R^{B1}$ | $R^{B2}$ | $R^{B1}$ | $R^{B5}$ | S |
| $L_{44950}$ | $R^{B2}$ | $R^{B1}$ | $R^{B2}$ | $R^{B1}$ | $R^{B6}$ | S |
| $L_{44951}$ | $R^{B2}$ | $R^{B1}$ | $R^{B2}$ | $R^{B1}$ | $R^{B7}$ | S |
| $L_{44952}$ | $R^{B2}$ | $R^{B1}$ | $R^{B2}$ | $R^{B1}$ | $R^{B8}$ | S |
| $L_{44953}$ | $R^{B2}$ | $R^{B1}$ | $R^{B2}$ | $R^{B1}$ | $R^{B9}$ | S |
| $L_{44954}$ | $R^{B2}$ | $R^{B1}$ | $R^{B2}$ | $R^{B1}$ | $R^{A2}$ | S |
| $L_{44955}$ | $R^{B2}$ | $R^{B1}$ | $R^{B2}$ | $R^{B1}$ | $R^{A27}$ | S |
| $L_{44956}$ | $R^{B2}$ | $R^{B1}$ | $R^{B2}$ | $R^{B1}$ | $R^{A34}$ | S |
| $L_{44957}$ | $R^{B2}$ | F | $R^{B2}$ | $R^{B1}$ | $R^{B3}$ | S |
| $L_{44958}$ | $R^{B2}$ | F | $R^{B2}$ | $R^{B1}$ | $R^{B4}$ | S |
| $L_{44959}$ | $R^{B2}$ | F | $R^{B2}$ | $R^{B1}$ | $R^{B5}$ | S |
| $L_{44960}$ | $R^{B2}$ | F | $R^{B2}$ | $R^{B1}$ | $R^{B6}$ | S |
| $L_{44961}$ | $R^{B2}$ | F | $R^{B2}$ | $R^{B1}$ | $R^{B7}$ | S |
| $L_{44962}$ | $R^{B2}$ | F | $R^{B2}$ | $R^{B1}$ | $R^{B8}$ | S |
| $L_{44963}$ | $R^{B2}$ | F | $R^{B2}$ | $R^{B1}$ | $R^{B9}$ | S |
| $L_{44964}$ | $R^{B2}$ | F | $R^{B2}$ | $R^{B1}$ | $R^{A2}$ | S |
| $L_{44965}$ | $R^{B2}$ | F | $R^{B2}$ | $R^{B1}$ | $R^{A27}$ | S |
| $L_{44966}$ | $R^{B2}$ | F | $R^{B2}$ | $R^{B1}$ | $R^{A34}$ | S |
| $L_{44967}$ | $R^{B3}$ | $R^{B1}$ | $R^{B2}$ | $R^{B1}$ | $R^{B3}$ | S |
| $L_{44968}$ | $R^{B3}$ | $R^{B1}$ | $R^{B2}$ | $R^{B1}$ | $R^{B4}$ | S |
| $L_{44969}$ | $R^{B3}$ | $R^{B1}$ | $R^{B2}$ | $R^{B1}$ | $R^{B5}$ | S |
| $L_{44970}$ | $R^{B3}$ | $R^{B1}$ | $R^{B2}$ | $R^{B1}$ | $R^{B6}$ | S |
| $L_{44971}$ | $R^{B3}$ | $R^{B1}$ | $R^{B2}$ | $R^{B1}$ | $R^{B7}$ | S |
| $L_{44972}$ | $R^{B3}$ | $R^{B1}$ | $R^{B2}$ | $R^{B1}$ | $R^{B8}$ | S |
| $L_{44973}$ | $R^{B3}$ | $R^{B1}$ | $R^{B2}$ | $R^{B1}$ | $R^{B9}$ | S |
| $L_{44974}$ | $R^{B3}$ | $R^{B1}$ | $R^{B2}$ | $R^{B1}$ | $R^{A2}$ | S |
| $L_{44975}$ | $R^{B3}$ | $R^{B1}$ | $R^{B2}$ | $R^{B1}$ | $R^{A27}$ | S |
| $L_{44976}$ | $R^{B3}$ | $R^{B1}$ | $R^{B2}$ | $R^{B1}$ | $R^{A34}$ | S |
| $L_{44977}$ | $R^{B1}$ | $R^{B1}$ | $R^{B2}$ | $R^{B1}$ | $R^{B2}$ | O |
| $L_{44978}$ | $R^{B1}$ | $R^{B1}$ | $R^{B3}$ | $R^{B1}$ | $R^{B3}$ | O |
| $L_{44979}$ | $R^{B1}$ | $R^{B1}$ | $R^{B4}$ | $R^{B1}$ | $R^{B4}$ | O |
| $L_{44980}$ | $R^{B1}$ | $R^{B1}$ | $R^{B5}$ | $R^{B1}$ | $R^{B5}$ | O |
| $L_{44981}$ | $R^{B1}$ | $R^{B1}$ | $R^{B6}$ | $R^{B1}$ | $R^{B6}$ | O |
| $L_{44982}$ | $R^{B1}$ | $R^{B1}$ | $R^{B7}$ | $R^{B1}$ | $R^{B7}$ | O |
| $L_{44983}$ | $R^{B1}$ | $R^{B1}$ | $R^{B8}$ | $R^{B1}$ | $R^{B8}$ | O |
| $L_{44984}$ | $R^{B1}$ | $R^{B1}$ | $R^{B9}$ | $R^{B1}$ | $R^{B9}$ | O |
| $L_{44985}$ | $R^{B1}$ | $R^{B1}$ | $R^{A2}$ | $R^{B1}$ | $R^{A2}$ | O |
| $L_{44986}$ | $R^{B1}$ | $R^{B1}$ | $R^{A27}$ | $R^{B1}$ | $R^{A27}$ | O |
| $L_{44987}$ | $R^{B1}$ | $R^{B1}$ | $R^{A34}$ | $R^{B1}$ | $R^{A34}$ | O |
| $L_{44988}$ | $R^{B2}$ | $R^{B1}$ | $R^{B2}$ | $R^{B1}$ | $R^{B2}$ | O |
| $L_{44989}$ | $R^{B2}$ | $R^{B1}$ | $R^{B3}$ | $R^{B1}$ | $R^{B3}$ | O |
| $L_{44990}$ | $R^{B2}$ | $R^{B1}$ | $R^{B4}$ | $R^{B1}$ | $R^{B4}$ | O |
| $L_{44991}$ | $R^{B2}$ | $R^{B1}$ | $R^{B5}$ | $R^{B1}$ | $R^{B5}$ | O |
| $L_{44992}$ | $R^{B2}$ | $R^{B1}$ | $R^{B6}$ | $R^{B1}$ | $R^{B6}$ | O |
| $L_{44993}$ | $R^{B2}$ | $R^{B1}$ | $R^{B7}$ | $R^{B1}$ | $R^{B7}$ | O |
| $L_{44994}$ | $R^{B2}$ | $R^{B1}$ | $R^{B8}$ | $R^{B1}$ | $R^{B8}$ | O |
| $L_{44995}$ | $R^{B2}$ | $R^{B1}$ | $R^{B9}$ | $R^{B1}$ | $R^{B9}$ | O |
| $L_{44996}$ | $R^{B2}$ | $R^{B1}$ | $R^{A2}$ | $R^{B1}$ | $R^{A2}$ | O |
| $L_{44997}$ | $R^{B2}$ | $R^{B1}$ | $R^{A27}$ | $R^{B1}$ | $R^{A27}$ | O |
| $L_{44998}$ | $R^{B2}$ | $R^{B1}$ | $R^{A34}$ | $R^{B1}$ | $R^{A34}$ | O |

-continued

| | $R^1$ | $R^2$ | $R^7$ | $R^8$ | $R^9$ | X |
|---|---|---|---|---|---|---|
| $L_{44999}$ | $R^{B2}$ | F | $R^{B2}$ | $R^{B1}$ | $R^{B2}$ | O |
| $L_{45000}$ | $R^{B2}$ | F | $R^{B3}$ | $R^{B1}$ | $R^{B3}$ | O |
| $L_{45001}$ | $R^{B2}$ | F | $R^{B4}$ | $R^{B1}$ | $R^{B4}$ | O |
| $L_{45002}$ | $R^{B2}$ | F | $R^{B5}$ | $R^{B1}$ | $R^{B5}$ | O |
| $L_{45003}$ | $R^{B2}$ | F | $R^{B6}$ | $R^{B1}$ | $R^{B6}$ | O |
| $L_{45004}$ | $R^{B2}$ | F | $R^{B7}$ | $R^{B1}$ | $R^{B7}$ | O |
| $L_{45005}$ | $R^{B2}$ | F | $R^{B8}$ | $R^{B1}$ | $R^{B8}$ | O |
| $L_{45006}$ | $R^{B2}$ | F | $R^{B9}$ | $R^{B1}$ | $R^{B9}$ | O |
| $L_{45007}$ | $R^{B2}$ | F | $R^{A2}$ | $R^{B1}$ | $R^{A2}$ | O |
| $L_{45008}$ | $R^{B2}$ | F | $R^{A27}$ | $R^{B1}$ | $R^{A27}$ | O |
| $L_{45009}$ | $R^{B2}$ | F | $R^{A34}$ | $R^{B1}$ | $R^{A34}$ | O |
| $L_{45010}$ | $R^{B3}$ | $R^{B1}$ | $R^{B2}$ | $R^{B1}$ | $R^{B2}$ | O |
| $L_{45011}$ | $R^{B3}$ | $R^{B1}$ | $R^{B3}$ | $R^{B1}$ | $R^{B3}$ | O |
| $L_{45012}$ | $R^{B3}$ | $R^{B1}$ | $R^{B4}$ | $R^{B1}$ | $R^{B4}$ | O |
| $L_{45013}$ | $R^{B3}$ | $R^{B1}$ | $R^{B5}$ | $R^{B1}$ | $R^{B5}$ | O |
| $L_{45014}$ | $R^{B3}$ | $R^{B1}$ | $R^{B6}$ | $R^{B1}$ | $R^{B6}$ | O |
| $L_{45015}$ | $R^{B3}$ | $R^{B1}$ | $R^{B7}$ | $R^{B1}$ | $R^{B7}$ | O |
| $L_{45016}$ | $R^{B3}$ | $R^{B1}$ | $R^{B8}$ | $R^{B1}$ | $R^{B8}$ | O |
| $L_{45017}$ | $R^{B3}$ | $R^{B1}$ | $R^{B9}$ | $R^{B1}$ | $R^{B9}$ | O |
| $L_{45018}$ | $R^{B3}$ | $R^{B1}$ | $R^{A2}$ | $R^{B1}$ | $R^{A2}$ | O |
| $L_{45019}$ | $R^{B3}$ | $R^{B1}$ | $R^{A27}$ | $R^{B1}$ | $R^{A27}$ | O |
| $L_{45020}$ | $R^{B3}$ | $R^{B1}$ | $R^{A34}$ | $R^{B1}$ | $R^{A34}$ | O |
| $L_{45021}$ | $R^{B1}$ | $R^{B1}$ | $R^{B1}$ | $R^{B2}$ | $R^{B2}$ | O |
| $L_{45022}$ | $R^{B1}$ | $R^{B1}$ | $R^{B1}$ | $R^{B3}$ | $R^{B3}$ | O |
| $L_{45023}$ | $R^{B1}$ | $R^{B1}$ | $R^{B1}$ | $R^{B4}$ | $R^{B4}$ | O |
| $L_{45024}$ | $R^{B1}$ | $R^{B1}$ | $R^{B1}$ | $R^{B5}$ | $R^{B5}$ | O |
| $L_{45025}$ | $R^{B1}$ | $R^{B1}$ | $R^{B1}$ | $R^{B6}$ | $R^{B6}$ | O |
| $L_{45026}$ | $R^{B1}$ | $R^{B1}$ | $R^{B1}$ | $R^{B7}$ | $R^{B7}$ | O |
| $L_{45027}$ | $R^{B1}$ | $R^{B1}$ | $R^{B1}$ | $R^{B8}$ | $R^{B8}$ | O |
| $L_{45028}$ | $R^{B1}$ | $R^{B1}$ | $R^{B1}$ | $R^{B9}$ | $R^{B9}$ | O |
| $L_{45029}$ | $R^{B1}$ | $R^{B1}$ | $R^{B1}$ | $R^{A2}$ | $R^{A2}$ | O |
| $L_{45030}$ | $R^{B1}$ | $R^{B1}$ | $R^{B1}$ | $R^{A27}$ | $R^{A27}$ | O |
| $L_{45031}$ | $R^{B1}$ | $R^{B1}$ | $R^{B1}$ | $R^{A34}$ | $R^{A34}$ | O |
| $L_{45032}$ | $R^{B2}$ | $R^{B1}$ | $R^{B1}$ | $R^{B2}$ | $R^{B2}$ | O |
| $L_{45033}$ | $R^{B2}$ | $R^{B1}$ | $R^{B1}$ | $R^{B3}$ | $R^{B3}$ | O |
| $L_{45034}$ | $R^{B2}$ | $R^{B1}$ | $R^{B1}$ | $R^{B4}$ | $R^{B4}$ | O |
| $L_{45035}$ | $R^{B2}$ | $R^{B1}$ | $R^{B1}$ | $R^{B5}$ | $R^{B5}$ | O |
| $L_{45036}$ | $R^{B2}$ | $R^{B1}$ | $R^{B1}$ | $R^{B6}$ | $R^{B6}$ | O |
| $L_{45037}$ | $R^{B2}$ | $R^{B1}$ | $R^{B1}$ | $R^{B7}$ | $R^{B7}$ | O |
| $L_{45038}$ | $R^{B2}$ | $R^{B1}$ | $R^{B1}$ | $R^{B8}$ | $R^{B8}$ | O |
| $L_{45039}$ | $R^{B2}$ | $R^{B1}$ | $R^{B1}$ | $R^{B9}$ | $R^{B9}$ | O |
| $L_{45040}$ | $R^{B2}$ | $R^{B1}$ | $R^{B1}$ | $R^{A2}$ | $R^{A2}$ | O |
| $L_{45041}$ | $R^{B2}$ | $R^{B1}$ | $R^{B1}$ | $R^{A27}$ | $R^{A27}$ | O |
| $L_{45042}$ | $R^{B2}$ | $R^{B1}$ | $R^{B1}$ | $R^{A34}$ | $R^{A34}$ | O |
| $L_{45043}$ | $R^{B2}$ | F | $R^{B1}$ | $R^{B2}$ | $R^{B2}$ | O |
| $L_{45044}$ | $R^{B2}$ | F | $R^{B1}$ | $R^{B3}$ | $R^{B3}$ | O |
| $L_{45045}$ | $R^{B2}$ | F | $R^{B1}$ | $R^{B4}$ | $R^{B4}$ | O |
| $L_{45046}$ | $R^{B2}$ | F | $R^{B1}$ | $R^{B5}$ | $R^{B5}$ | O |
| $L_{45047}$ | $R^{B2}$ | F | $R^{B1}$ | $R^{B6}$ | $R^{B6}$ | O |
| $L_{45048}$ | $R^{B2}$ | F | $R^{B1}$ | $R^{B7}$ | $R^{B7}$ | O |
| $L_{45049}$ | $R^{B2}$ | F | $R^{B1}$ | $R^{B8}$ | $R^{B8}$ | O |
| $L_{45050}$ | $R^{B2}$ | F | $R^{B1}$ | $R^{B9}$ | $R^{B9}$ | O |
| $L_{45051}$ | $R^{B2}$ | F | $R^{B1}$ | $R^{A2}$ | $R^{A2}$ | O |
| $L_{45052}$ | $R^{B2}$ | F | $R^{B1}$ | $R^{A27}$ | $R^{A27}$ | O |
| $L_{45053}$ | $R^{B2}$ | F | $R^{B1}$ | $R^{A34}$ | $R^{A34}$ | O |
| $L_{45054}$ | $R^{B3}$ | $R^{B1}$ | $R^{B1}$ | $R^{B2}$ | $R^{B2}$ | O |
| $L_{45055}$ | $R^{B3}$ | $R^{B1}$ | $R^{B1}$ | $R^{B3}$ | $R^{B3}$ | O |
| $L_{45056}$ | $R^{B3}$ | $R^{B1}$ | $R^{B1}$ | $R^{B4}$ | $R^{B4}$ | O |
| $L_{45057}$ | $R^{B3}$ | $R^{B1}$ | $R^{B1}$ | $R^{B5}$ | $R^{B5}$ | O |
| $L_{45058}$ | $R^{B3}$ | $R^{B1}$ | $R^{B1}$ | $R^{B6}$ | $R^{B6}$ | O |
| $L_{45059}$ | $R^{B3}$ | $R^{B1}$ | $R^{B1}$ | $R^{B7}$ | $R^{B7}$ | O |
| $L_{45060}$ | $R^{B3}$ | $R^{B1}$ | $R^{B1}$ | $R^{B8}$ | $R^{B8}$ | O |
| $L_{45061}$ | $R^{B3}$ | $R^{B1}$ | $R^{B1}$ | $R^{B9}$ | $R^{B9}$ | O |
| $L_{45062}$ | $R^{B3}$ | $R^{B1}$ | $R^{B1}$ | $R^{A2}$ | $R^{A2}$ | O |
| $L_{45063}$ | $R^{B3}$ | $R^{B1}$ | $R^{B1}$ | $R^{A27}$ | $R^{A27}$ | O |
| $L_{45064}$ | $R^{B3}$ | $R^{B1}$ | $R^{B1}$ | $R^{A34}$ | $R^{A34}$ | O |
| $L_{45065}$ | $R^{B1}$ | $R^{B1}$ | $R^{B2}$ | $R^{B2}$ | $R^{B1}$ | O |
| $L_{45066}$ | $R^{B1}$ | $R^{B1}$ | $R^{B3}$ | $R^{B3}$ | $R^{B1}$ | O |
| $L_{45067}$ | $R^{B1}$ | $R^{B1}$ | $R^{B4}$ | $R^{B4}$ | $R^{B1}$ | O |
| $L_{45068}$ | $R^{B1}$ | $R^{B1}$ | $R^{B5}$ | $R^{B5}$ | $R^{B1}$ | O |
| $L_{45069}$ | $R^{B1}$ | $R^{B1}$ | $R^{B6}$ | $R^{B6}$ | $R^{B1}$ | O |
| $L_{45070}$ | $R^{B1}$ | $R^{B1}$ | $R^{B7}$ | $R^{B7}$ | $R^{B1}$ | O |
| $L_{45071}$ | $R^{B1}$ | $R^{B1}$ | $R^{B8}$ | $R^{B8}$ | $R^{B1}$ | O |
| $L_{45072}$ | $R^{B1}$ | $R^{B1}$ | $R^{B9}$ | $R^{B9}$ | $R^{B1}$ | O |
| $L_{45073}$ | $R^{B1}$ | $R^{B1}$ | $R^{A2}$ | $R^{A2}$ | $R^{B1}$ | O |
| $L_{45074}$ | $R^{B1}$ | $R^{B1}$ | $R^{A27}$ | $R^{A27}$ | $R^{B1}$ | O |
| $L_{45075}$ | $R^{B1}$ | $R^{B1}$ | $R^{A34}$ | $R^{A34}$ | $R^{B1}$ | O |

-continued

| | $R^1$ | $R^2$ | $R^7$ | $R^8$ | $R^9$ | X |
|---|---|---|---|---|---|---|
| $L_{A5076}$ | $R^{B2}$ | $R^{B1}$ | $R^{B2}$ | $R^{B2}$ | $R^{B1}$ | O |
| $L_{A5077}$ | $R^{B2}$ | $R^{B1}$ | $R^{B3}$ | $R^{B3}$ | $R^{B1}$ | O |
| $L_{A5078}$ | $R^{B2}$ | $R^{B1}$ | $R^{B4}$ | $R^{B4}$ | $R^{B1}$ | O |
| $L_{A5079}$ | $R^{B2}$ | $R^{B1}$ | $R^{B5}$ | $R^{B5}$ | $R^{B1}$ | O |
| $L_{A5080}$ | $R^{B2}$ | $R^{B1}$ | $R^{B6}$ | $R^{B6}$ | $R^{B1}$ | O |
| $L_{A5081}$ | $R^{B2}$ | $R^{B1}$ | $R^{B7}$ | $R^{B7}$ | $R^{B1}$ | O |
| $L_{A5082}$ | $R^{B2}$ | $R^{B1}$ | $R^{B8}$ | $R^{B8}$ | $R^{B1}$ | O |
| $L_{A5083}$ | $R^{B2}$ | $R^{B1}$ | $R^{B9}$ | $R^{B9}$ | $R^{B1}$ | O |
| $L_{A5084}$ | $R^{B2}$ | $R^{B1}$ | $R^{A2}$ | $R^{A2}$ | $R^{B1}$ | O |
| $L_{A5085}$ | $R^{B2}$ | $R^{B1}$ | $R^{A27}$ | $R^{A27}$ | $R^{B1}$ | O |
| $L_{A5086}$ | $R^{B2}$ | $R^{B1}$ | $R^{A34}$ | $R^{A34}$ | $R^{B1}$ | O |
| $L_{A5087}$ | $R^{B2}$ | F | $R^{B2}$ | $R^{B2}$ | $R^{B1}$ | O |
| $L_{A5088}$ | $R^{B2}$ | F | $R^{B3}$ | $R^{B3}$ | $R^{B1}$ | O |
| $L_{A5089}$ | $R^{B2}$ | F | $R^{B4}$ | $R^{B4}$ | $R^{B1}$ | O |
| $L_{A5090}$ | $R^{B2}$ | F | $R^{B5}$ | $R^{B5}$ | $R^{B1}$ | O |
| $L_{A5091}$ | $R^{B2}$ | F | $R^{B6}$ | $R^{B6}$ | $R^{B1}$ | O |
| $L_{A5092}$ | $R^{B2}$ | F | $R^{B7}$ | $R^{B7}$ | $R^{B1}$ | O |
| $L_{A5093}$ | $R^{B2}$ | F | $R^{B8}$ | $R^{B8}$ | $R^{B1}$ | O |
| $L_{A5094}$ | $R^{B2}$ | F | $R^{B9}$ | $R^{B9}$ | $R^{B1}$ | O |
| $L_{A5095}$ | $R^{B2}$ | F | $R^{A2}$ | $R^{A2}$ | $R^{B1}$ | O |
| $L_{A5096}$ | $R^{B2}$ | F | $R^{A27}$ | $R^{A27}$ | $R^{B1}$ | O |
| $L_{A5097}$ | $R^{B2}$ | F | $R^{A34}$ | $R^{A34}$ | $R^{B1}$ | O |
| $L_{A5098}$ | $R^{B3}$ | $R^{B1}$ | $R^{B2}$ | $R^{B2}$ | $R^{B1}$ | O |
| $L_{A5099}$ | $R^{B3}$ | $R^{B1}$ | $R^{B3}$ | $R^{B3}$ | $R^{B1}$ | O |
| $L_{A5100}$ | $R^{B3}$ | $R^{B1}$ | $R^{B4}$ | $R^{B4}$ | $R^{B1}$ | O |
| $L_{A5101}$ | $R^{B3}$ | $R^{B1}$ | $R^{B5}$ | $R^{B5}$ | $R^{B1}$ | O |
| $L_{A5102}$ | $R^{B3}$ | $R^{B1}$ | $R^{B6}$ | $R^{B6}$ | $R^{B1}$ | O |
| $L_{A5103}$ | $R^{B3}$ | $R^{B1}$ | $R^{B7}$ | $R^{B7}$ | $R^{B1}$ | O |
| $L_{A5104}$ | $R^{B3}$ | $R^{B1}$ | $R^{B8}$ | $R^{B8}$ | $R^{B1}$ | O |
| $L_{A5105}$ | $R^{B3}$ | $R^{B1}$ | $R^{B9}$ | $R^{B9}$ | $R^{B1}$ | O |
| $L_{A5106}$ | $R^{B3}$ | $R^{B1}$ | $R^{A2}$ | $R^{A2}$ | $R^{B1}$ | O |
| $L_{A5107}$ | $R^{B3}$ | $R^{B1}$ | $R^{A27}$ | $R^{A27}$ | $R^{B1}$ | O |
| $L_{A5108}$ | $R^{B3}$ | $R^{B1}$ | $R^{A34}$ | $R^{A34}$ | $R^{B1}$ | O |
| $L_{A5109}$ | $R^{B1}$ | $R^{B1}$ | $R^{B2}$ | $R^{B2}$ | $R^{B2}$ | O |
| $L_{A5110}$ | $R^{B1}$ | $R^{B1}$ | $R^{B3}$ | $R^{B3}$ | $R^{B3}$ | O |
| $L_{A5111}$ | $R^{B1}$ | $R^{B1}$ | $R^{B4}$ | $R^{B4}$ | $R^{B4}$ | O |
| $L_{A5112}$ | $R^{B1}$ | $R^{B1}$ | $R^{B5}$ | $R^{B5}$ | $R^{B5}$ | O |
| $L_{A5113}$ | $R^{B1}$ | $R^{B1}$ | $R^{B6}$ | $R^{B6}$ | $R^{B6}$ | O |
| $L_{A5114}$ | $R^{B1}$ | $R^{B1}$ | $R^{B7}$ | $R^{B7}$ | $R^{B7}$ | O |
| $L_{A5115}$ | $R^{B1}$ | $R^{B1}$ | $R^{B8}$ | $R^{B8}$ | $R^{B8}$ | O |
| $L_{A5116}$ | $R^{B1}$ | $R^{B1}$ | $R^{B9}$ | $R^{B9}$ | $R^{B9}$ | O |
| $L_{A5117}$ | $R^{B1}$ | $R^{B1}$ | $R^{A2}$ | $R^{A2}$ | $R^{A2}$ | O |
| $L_{A5118}$ | $R^{B1}$ | $R^{B1}$ | $R^{A27}$ | $R^{A27}$ | $R^{A27}$ | O |
| $L_{A5119}$ | $R^{B1}$ | $R^{B1}$ | $R^{A34}$ | $R^{A34}$ | $R^{A34}$ | O |
| $L_{A5120}$ | $R^{B2}$ | $R^{B1}$ | $R^{B2}$ | $R^{B2}$ | $R^{B2}$ | O |
| $L_{A5121}$ | $R^{B2}$ | $R^{B1}$ | $R^{B3}$ | $R^{B3}$ | $R^{B3}$ | O |
| $L_{A5122}$ | $R^{B2}$ | $R^{B1}$ | $R^{B4}$ | $R^{B4}$ | $R^{B4}$ | O |
| $L_{A5123}$ | $R^{B2}$ | $R^{B1}$ | $R^{B5}$ | $R^{B5}$ | $R^{B5}$ | O |
| $L_{A5124}$ | $R^{B2}$ | $R^{B1}$ | $R^{B6}$ | $R^{B6}$ | $R^{B6}$ | O |
| $L_{A5125}$ | $R^{B2}$ | $R^{B1}$ | $R^{B7}$ | $R^{B7}$ | $R^{B7}$ | O |
| $L_{A5126}$ | $R^{B2}$ | $R^{B1}$ | $R^{B8}$ | $R^{B8}$ | $R^{B8}$ | O |
| $L_{A5127}$ | $R^{B2}$ | $R^{B1}$ | $R^{B9}$ | $R^{B9}$ | $R^{B9}$ | O |
| $L_{A5128}$ | $R^{B2}$ | $R^{B1}$ | $R^{A2}$ | $R^{A2}$ | $R^{A2}$ | O |
| $L_{A5129}$ | $R^{B2}$ | $R^{B1}$ | $R^{A27}$ | $R^{A27}$ | $R^{A27}$ | O |
| $L_{A5130}$ | $R^{B2}$ | $R^{B1}$ | $R^{A34}$ | $R^{A34}$ | $R^{A34}$ | O |
| $L_{A5131}$ | $R^{B2}$ | F | $R^{B2}$ | $R^{B2}$ | $R^{B2}$ | O |
| $L_{A5132}$ | $R^{B2}$ | F | $R^{B3}$ | $R^{B3}$ | $R^{B3}$ | O |
| $L_{A5133}$ | $R^{B2}$ | F | $R^{B4}$ | $R^{B4}$ | $R^{B4}$ | O |
| $L_{A5134}$ | $R^{B2}$ | F | $R^{B5}$ | $R^{B5}$ | $R^{B5}$ | O |
| $L_{A5135}$ | $R^{B2}$ | F | $R^{B6}$ | $R^{B6}$ | $R^{B6}$ | O |
| $L_{A5136}$ | $R^{B2}$ | F | $R^{B7}$ | $R^{B7}$ | $R^{B7}$ | O |
| $L_{A5137}$ | $R^{B2}$ | F | $R^{B8}$ | $R^{B8}$ | $R^{B8}$ | O |
| $L_{A5138}$ | $R^{B2}$ | F | $R^{B9}$ | $R^{B9}$ | $R^{B9}$ | O |
| $L_{A5139}$ | $R^{B2}$ | F | $R^{A2}$ | $R^{A2}$ | $R^{A2}$ | O |
| $L_{A5140}$ | $R^{B2}$ | F | $R^{A27}$ | $R^{A27}$ | $R^{A27}$ | O |
| $L_{A5141}$ | $R^{B2}$ | F | $R^{A34}$ | $R^{A34}$ | $R^{A34}$ | O |
| $L_{A5142}$ | $R^{B3}$ | $R^{B1}$ | $R^{B2}$ | $R^{B2}$ | $R^{B2}$ | O |
| $L_{A5143}$ | $R^{B3}$ | $R^{B1}$ | $R^{B3}$ | $R^{B3}$ | $R^{B3}$ | O |
| $L_{A5144}$ | $R^{B3}$ | $R^{B1}$ | $R^{B4}$ | $R^{B4}$ | $R^{B4}$ | O |
| $L_{A5145}$ | $R^{B3}$ | $R^{B1}$ | $R^{B5}$ | $R^{B5}$ | $R^{B5}$ | O |
| $L_{A5146}$ | $R^{B3}$ | $R^{B1}$ | $R^{B6}$ | $R^{B6}$ | $R^{B6}$ | O |
| $L_{A5147}$ | $R^{B3}$ | $R^{B1}$ | $R^{B7}$ | $R^{B7}$ | $R^{B7}$ | O |
| $L_{A5148}$ | $R^{B3}$ | $R^{B1}$ | $R^{B8}$ | $R^{B8}$ | $R^{B8}$ | O |
| $L_{A5149}$ | $R^{B3}$ | $R^{B1}$ | $R^{B9}$ | $R^{B9}$ | $R^{B9}$ | O |
| $L_{A5150}$ | $R^{B3}$ | $R^{B1}$ | $R^{A2}$ | $R^{A2}$ | $R^{A2}$ | O |
| $L_{A5151}$ | $R^{B3}$ | $R^{B1}$ | $R^{A27}$ | $R^{A27}$ | $R^{A27}$ | O |
| $L_{A5152}$ | $R^{B3}$ | $R^{B1}$ | $R^{A34}$ | $R^{A34}$ | $R^{A34}$ | O |

-continued

| | $R^1$ | $R^2$ | $R^7$ | $R^8$ | $R^9$ | X |
|---|---|---|---|---|---|---|
| $L_{A5153}$ | $R^{B1}$ | $R^{B1}$ | $R^{B2}$ | $R^{B1}$ | $R^{B3}$ | O |
| $L_{A5154}$ | $R^{B1}$ | $R^{B1}$ | $R^{B2}$ | $R^{B1}$ | $R^{B4}$ | O |
| $L_{A5155}$ | $R^{B1}$ | $R^{B1}$ | $R^{B2}$ | $R^{B1}$ | $R^{B5}$ | O |
| $L_{A5156}$ | $R^{B1}$ | $R^{B1}$ | $R^{B2}$ | $R^{B1}$ | $R^{B6}$ | O |
| $L_{A5157}$ | $R^{B1}$ | $R^{B1}$ | $R^{B2}$ | $R^{B1}$ | $R^{B7}$ | O |
| $L_{A5158}$ | $R^{B1}$ | $R^{B1}$ | $R^{B2}$ | $R^{B1}$ | $R^{B8}$ | O |
| $L_{A5159}$ | $R^{B1}$ | $R^{B1}$ | $R^{B2}$ | $R^{B1}$ | $R^{B9}$ | O |
| $L_{A5160}$ | $R^{B1}$ | $R^{B1}$ | $R^{B2}$ | $R^{B1}$ | $R^{A2}$ | O |
| $L_{A5161}$ | $R^{B1}$ | $R^{B1}$ | $R^{B2}$ | $R^{B1}$ | $R^{A27}$ | O |
| $L_{A5162}$ | $R^{B1}$ | $R^{B1}$ | $R^{B2}$ | $R^{B1}$ | $R^{A34}$ | O |
| $L_{A5163}$ | $R^{B2}$ | $R^{B1}$ | $R^{B2}$ | $R^{B1}$ | $R^{B3}$ | O |
| $L_{A5164}$ | $R^{B2}$ | $R^{B1}$ | $R^{B2}$ | $R^{B1}$ | $R^{B4}$ | O |
| $L_{A5165}$ | $R^{B2}$ | $R^{B1}$ | $R^{B2}$ | $R^{B1}$ | $R^{B5}$ | O |
| $L_{A5166}$ | $R^{B2}$ | $R^{B1}$ | $R^{B2}$ | $R^{B1}$ | $R^{B6}$ | O |
| $L_{A5167}$ | $R^{B2}$ | $R^{B1}$ | $R^{B2}$ | $R^{B1}$ | $R^{B7}$ | O |
| $L_{A5168}$ | $R^{B2}$ | $R^{B1}$ | $R^{B2}$ | $R^{B1}$ | $R^{B8}$ | O |
| $L_{A5169}$ | $R^{B2}$ | $R^{B1}$ | $R^{B2}$ | $R^{B1}$ | $R^{B9}$ | O |
| $L_{A5170}$ | $R^{B2}$ | $R^{B1}$ | $R^{B2}$ | $R^{B1}$ | $R^{A2}$ | O |
| $L_{A5171}$ | $R^{B2}$ | $R^{B1}$ | $R^{B2}$ | $R^{B1}$ | $R^{A27}$ | O |
| $L_{A5172}$ | $R^{B2}$ | $R^{B1}$ | $R^{B2}$ | $R^{B1}$ | $R^{A34}$ | O |
| $L_{A5173}$ | $R^{B2}$ | F | $R^{B2}$ | $R^{B1}$ | $R^{B3}$ | O |
| $L_{A5174}$ | $R^{B2}$ | F | $R^{B2}$ | $R^{B1}$ | $R^{B4}$ | O |
| $L_{A5175}$ | $R^{B2}$ | F | $R^{B2}$ | $R^{B1}$ | $R^{B5}$ | O |
| $L_{A5176}$ | $R^{B2}$ | F | $R^{B2}$ | $R^{B1}$ | $R^{B6}$ | O |
| $L_{A5177}$ | $R^{B2}$ | F | $R^{B2}$ | $R^{B1}$ | $R^{B7}$ | O |
| $L_{A5178}$ | $R^{B2}$ | F | $R^{B2}$ | $R^{B1}$ | $R^{B8}$ | O |
| $L_{A5179}$ | $R^{B2}$ | F | $R^{B2}$ | $R^{B1}$ | $R^{B9}$ | O |
| $L_{A5180}$ | $R^{B2}$ | F | $R^{B2}$ | $R^{B1}$ | $R^{A2}$ | O |
| $L_{A5181}$ | $R^{B2}$ | F | $R^{B2}$ | $R^{B1}$ | $R^{A27}$ | O |
| $L_{A5182}$ | $R^{B2}$ | F | $R^{B2}$ | $R^{B1}$ | $R^{A34}$ | O |
| $L_{A5183}$ | $R^{B3}$ | $R^{B1}$ | $R^{B2}$ | $R^{B1}$ | $R^{B3}$ | O |
| $L_{A5184}$ | $R^{B3}$ | $R^{B1}$ | $R^{B2}$ | $R^{B1}$ | $R^{B4}$ | O |
| $L_{A5185}$ | $R^{B3}$ | $R^{B1}$ | $R^{B2}$ | $R^{B1}$ | $R^{B5}$ | O |
| $L_{A5186}$ | $R^{B3}$ | $R^{B1}$ | $R^{B2}$ | $R^{B1}$ | $R^{B6}$ | O |
| $L_{A5187}$ | $R^{B3}$ | $R^{B1}$ | $R^{B2}$ | $R^{B1}$ | $R^{B7}$ | O |
| $L_{A5188}$ | $R^{B3}$ | $R^{B1}$ | $R^{B2}$ | $R^{B1}$ | $R^{B8}$ | O |
| $L_{A5189}$ | $R^{B3}$ | $R^{B1}$ | $R^{B2}$ | $R^{B1}$ | $R^{B9}$ | O |
| $L_{A5190}$ | $R^{B3}$ | $R^{B1}$ | $R^{B2}$ | $R^{B1}$ | $R^{A2}$ | O |
| $L_{A5191}$ | $R^{B3}$ | $R^{B1}$ | $R^{B2}$ | $R^{B1}$ | $R^{A27}$ | O |
| $L_{A5192}$ | $R^{B3}$ | $R^{B1}$ | $R^{B2}$ | $R^{B1}$ | $R^{A34}$ | O |

for $L_{A5193}$ through $L_{A5256}$, $L_A$ has a structure of

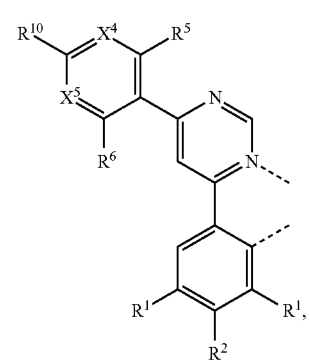

wherein $R^1$, $R^2$, $R^5$, $R^6$, $R^{10}$, $X^4$, and $X^5$ are defined as provided below,

| | $R^1$ | $R^2$ | $R^5$ | $R^6$ | $R^{10}$ | $X^4$ | $X^5$ |
|---|---|---|---|---|---|---|---|
| $L_{A5193}$ | $R^{B1}$ | $R^{B1}$ | $R^{B1}$ | $R^{B1}$ | $R^{B2}$ | N | C |
| $L_{A5194}$ | $R^{B1}$ | $R^{B1}$ | $R^{B1}$ | $R^{B1}$ | $R^{B3}$ | N | C |
| $L_{A5195}$ | $R^{B1}$ | $R^{B1}$ | $R^{B1}$ | $R^{B1}$ | $R^{B4}$ | N | C |
| $L_{A5196}$ | $R^{B1}$ | $R^{B1}$ | $R^{B1}$ | $R^{B1}$ | $R^{B5}$ | N | C |
| $L_{A5197}$ | $R^{B1}$ | $R^{B1}$ | $R^{B1}$ | $R^{B1}$ | $R^{B6}$ | N | C |
| $L_{A5198}$ | $R^{B1}$ | $R^{B1}$ | $R^{B1}$ | $R^{B1}$ | $R^{B7}$ | N | C |
| $L_{A5199}$ | $R^{B1}$ | $R^{B1}$ | $R^{B1}$ | $R^{B1}$ | $R^{B8}$ | N | C |
| $L_{A5200}$ | $R^{B1}$ | $R^{B1}$ | $R^{B1}$ | $R^{B1}$ | $R^{B9}$ | N | C |
| $L_{A5201}$ | $R^{B1}$ | $R^{B1}$ | $R^{B1}$ | $R^{B1}$ | $R^{A2}$ | N | C |
| $L_{A5202}$ | $R^{B1}$ | $R^{B1}$ | $R^{B1}$ | $R^{B1}$ | $R^{A27}$ | N | C |
| $L_{A5203}$ | $R^{B1}$ | $R^{B1}$ | $R^{B1}$ | $R^{B1}$ | $R^{A34}$ | N | C |
| $L_{A5204}$ | $R^{B2}$ | $R^{B1}$ | $R^{B1}$ | $R^{B1}$ | $R^{B2}$ | N | C |
| $L_{A5205}$ | $R^{B2}$ | $R^{B1}$ | $R^{B1}$ | $R^{B1}$ | $R^{B3}$ | N | C |
| $L_{A5206}$ | $R^{B2}$ | $R^{B1}$ | $R^{B1}$ | $R^{B1}$ | $R^{B4}$ | N | C |
| $L_{A5207}$ | $R^{B2}$ | $R^{B1}$ | $R^{B1}$ | $R^{B1}$ | $R^{B5}$ | N | C |
| $L_{A5208}$ | $R^{B2}$ | $R^{B1}$ | $R^{B1}$ | $R^{B1}$ | $R^{B6}$ | N | C |
| $L_{A5209}$ | $R^{B2}$ | $R^{B1}$ | $R^{B1}$ | $R^{B1}$ | $R^{B7}$ | N | C |
| $L_{A5210}$ | $R^{B2}$ | $R^{B1}$ | $R^{B1}$ | $R^{B1}$ | $R^{B8}$ | N | C |
| $L_{A5211}$ | $R^{B2}$ | $R^{B1}$ | $R^{B1}$ | $R^{B1}$ | $R^{B9}$ | N | C |
| $L_{A5212}$ | $R^{B2}$ | $R^{B1}$ | $R^{B1}$ | $R^{B1}$ | $R^{A2}$ | N | C |
| $L_{A5213}$ | $R^{B2}$ | $R^{B1}$ | $R^{B1}$ | $R^{B1}$ | $R^{A27}$ | N | C |
| $L_{A5214}$ | $R^{B2}$ | $R^{B1}$ | $R^{B1}$ | $R^{B1}$ | $R^{A34}$ | N | C |
| $L_{A5215}$ | $R^{B2}$ | F | $R^{B1}$ | $R^{B1}$ | $R^{B2}$ | N | C |
| $L_{A5216}$ | $R^{B2}$ | F | $R^{B1}$ | $R^{B1}$ | $R^{B3}$ | N | C |
| $L_{A5217}$ | $R^{B2}$ | F | $R^{B1}$ | $R^{B1}$ | $R^{B4}$ | N | C |
| $L_{A5218}$ | $R^{B2}$ | F | $R^{B1}$ | $R^{B1}$ | $R^{B5}$ | N | C |
| $L_{A5219}$ | $R^{B2}$ | F | $R^{B1}$ | $R^{B1}$ | $R^{B6}$ | N | C |
| $L_{A5220}$ | $R^{B2}$ | F | $R^{B1}$ | $R^{B1}$ | $R^{B7}$ | N | C |
| $L_{A5221}$ | $R^{B2}$ | F | $R^{B1}$ | $R^{B1}$ | $R^{B8}$ | N | C |
| $L_{A5222}$ | $R^{B2}$ | F | $R^{B1}$ | $R^{B1}$ | $R^{B9}$ | N | C |
| $L_{A5223}$ | $R^{B2}$ | F | $R^{B1}$ | $R^{B1}$ | $R^{A2}$ | N | C |
| $L_{A5224}$ | $R^{B2}$ | F | $R^{B1}$ | $R^{B1}$ | $R^{A27}$ | N | C |
| $L_{A5225}$ | $R^{B2}$ | F | $R^{B1}$ | $R^{B1}$ | $R^{A34}$ | N | C |
| $L_{A5226}$ | $R^{B3}$ | $R^{B1}$ | $R^{B1}$ | $R^{B1}$ | $R^{B2}$ | N | C |
| $L_{A5227}$ | $R^{B3}$ | $R^{B1}$ | $R^{B1}$ | $R^{B1}$ | $R^{B3}$ | N | C |
| $L_{A5228}$ | $R^{B3}$ | $R^{B1}$ | $R^{B1}$ | $R^{B1}$ | $R^{B4}$ | N | C |
| $L_{A5229}$ | $R^{B3}$ | $R^{B1}$ | $R^{B1}$ | $R^{B1}$ | $R^{B5}$ | N | C |
| $L_{A5230}$ | $R^{B3}$ | $R^{B1}$ | $R^{B1}$ | $R^{B1}$ | $R^{B6}$ | N | C |
| $L_{A5231}$ | $R^{B3}$ | $R^{B1}$ | $R^{B1}$ | $R^{B1}$ | $R^{B7}$ | N | C |
| $L_{A5232}$ | $R^{B3}$ | $R^{B1}$ | $R^{B1}$ | $R^{B1}$ | $R^{B8}$ | N | C |
| $L_{A5233}$ | $R^{B3}$ | $R^{B1}$ | $R^{B1}$ | $R^{B1}$ | $R^{B9}$ | N | C |
| $L_{A5234}$ | $R^{B3}$ | $R^{B1}$ | $R^{B1}$ | $R^{B1}$ | $R^{A2}$ | N | C |
| $L_{A5235}$ | $R^{B3}$ | $R^{B1}$ | $R^{B1}$ | $R^{B1}$ | $R^{A27}$ | N | C |
| $L_{A5236}$ | $R^{B3}$ | $R^{B1}$ | $R^{B1}$ | $R^{B1}$ | $R^{A34}$ | N | C |
| $L_{A5237}$ | $R^{B1}$ | $R^{B1}$ | $R^{B2}$ | $R^{B1}$ | $R^{B2}$ | N | C |
| $L_{A5238}$ | $R^{B1}$ | $R^{B1}$ | $R^{B2}$ | $R^{B1}$ | $R^{B3}$ | N | C |
| $L_{A5239}$ | $R^{B1}$ | $R^{B1}$ | $R^{B2}$ | $R^{B1}$ | $R^{B4}$ | N | C |
| $L_{A5240}$ | $R^{B1}$ | $R^{B1}$ | $R^{B2}$ | $R^{B1}$ | $R^{B5}$ | N | C |
| $L_{A5241}$ | $R^{B1}$ | $R^{B1}$ | $R^{B2}$ | $R^{B1}$ | $R^{B6}$ | N | C |
| $L_{A5242}$ | $R^{B1}$ | $R^{B1}$ | $R^{B2}$ | $R^{B1}$ | $R^{B7}$ | N | C |
| $L_{A5243}$ | $R^{B1}$ | $R^{B1}$ | $R^{B2}$ | $R^{B1}$ | $R^{B8}$ | N | C |
| $L_{A5244}$ | $R^{B1}$ | $R^{B1}$ | $R^{B2}$ | $R^{B1}$ | $R^{B9}$ | N | C |
| $L_{A5245}$ | $R^{B1}$ | $R^{B1}$ | $R^{B2}$ | $R^{B1}$ | $R^{A2}$ | N | C |
| $L_{A5246}$ | $R^{B1}$ | $R^{B1}$ | $R^{B2}$ | $R^{B1}$ | $R^{A27}$ | N | C |
| $L_{A5247}$ | $R^{B1}$ | $R^{B1}$ | $R^{B2}$ | $R^{B1}$ | $R^{A34}$ | N | C |
| $L_{A5248}$ | $R^{B2}$ | $R^{B1}$ | $R^{B2}$ | $R^{B1}$ | $R^{B2}$ | N | C |
| $L_{A5249}$ | $R^{B2}$ | $R^{B1}$ | $R^{B2}$ | $R^{B1}$ | $R^{B3}$ | N | C |
| $L_{A5250}$ | $R^{B2}$ | $R^{B1}$ | $R^{B2}$ | $R^{B1}$ | $R^{B4}$ | N | C |
| $L_{A5251}$ | $R^{B2}$ | $R^{B1}$ | $R^{B2}$ | $R^{B1}$ | $R^{B5}$ | N | C |
| $L_{A5252}$ | $R^{B2}$ | $R^{B1}$ | $R^{B2}$ | $R^{B1}$ | $R^{B6}$ | N | C |
| $L_{A5253}$ | $R^{B2}$ | $R^{B1}$ | $R^{B2}$ | $R^{B1}$ | $R^{B7}$ | N | C |
| $L_{A5254}$ | $R^{B2}$ | $R^{B1}$ | $R^{B2}$ | $R^{B1}$ | $R^{B8}$ | N | C |
| $L_{A5255}$ | $R^{B2}$ | $R^{B1}$ | $R^{B2}$ | $R^{B1}$ | $R^{B9}$ | N | C |
| $L_{A5256}$ | $R^{B2}$ | $R^{B1}$ | $R^{B2}$ | $R^{B1}$ | $R^{A2}$ | N | C |
| $L_{A5257}$ | $R^{B2}$ | $R^{B1}$ | $R^{B2}$ | $R^{B1}$ | $R^{A27}$ | N | C |
| $L_{A5258}$ | $R^{B2}$ | $R^{B1}$ | $R^{B2}$ | $R^{B1}$ | $R^{A34}$ | N | C |
| $L_{A5259}$ | $R^{B2}$ | F | $R^{B2}$ | $R^{B1}$ | $R^{B2}$ | N | C |
| $L_{A5260}$ | $R^{B2}$ | F | $R^{B2}$ | $R^{B1}$ | $R^{B3}$ | N | C |
| $L_{A5261}$ | $R^{B2}$ | F | $R^{B2}$ | $R^{B1}$ | $R^{B4}$ | N | C |
| $L_{A5262}$ | $R^{B2}$ | F | $R^{B2}$ | $R^{B1}$ | $R^{B5}$ | N | C |
| $L_{A5263}$ | $R^{B2}$ | F | $R^{B2}$ | $R^{B1}$ | $R^{B6}$ | N | C |
| $L_{A5264}$ | $R^{B2}$ | F | $R^{B2}$ | $R^{B1}$ | $R^{B7}$ | N | C |
| $L_{A5265}$ | $R^{B2}$ | F | $R^{B2}$ | $R^{B1}$ | $R^{B8}$ | N | C |
| $L_{A5266}$ | $R^{B2}$ | F | $R^{B2}$ | $R^{B1}$ | $R^{B9}$ | N | C |
| $L_{A5267}$ | $R^{B2}$ | F | $R^{B2}$ | $R^{B1}$ | $R^{A2}$ | N | C |
| $L_{A5268}$ | $R^{B2}$ | F | $R^{B2}$ | $R^{B1}$ | $R^{A27}$ | N | C |
| $L_{A5269}$ | $R^{B2}$ | F | $R^{B2}$ | $R^{B1}$ | $R^{A34}$ | N | C |
| $L_{A5270}$ | $R^{B3}$ | $R^{B1}$ | $R^{B2}$ | $R^{B1}$ | $R^{B2}$ | N | C |
| $L_{A5271}$ | $R^{B3}$ | $R^{B1}$ | $R^{B2}$ | $R^{B1}$ | $R^{B3}$ | N | C |

| | $R^1$ | $R^2$ | $R^7$ | $R^8$ | $R^9$ | $X^4$ | $X^5$ |
|---|---|---|---|---|---|---|---|
| $L_{A5125}$ | $R^{B1}$ | $R^{B1}$ | $R^{B1}$ | $R^{B1}$ | $R^{B2}$ | N | N |
| $L_{A5126}$ | $R^{B1}$ | $R^{B1}$ | $R^{B1}$ | $R^{B1}$ | $R^{B3}$ | N | N |
| $L_{A5127}$ | $R^{B1}$ | $R^{B1}$ | $R^{B1}$ | $R^{B1}$ | $R^{B4}$ | N | N |
| $L_{A5128}$ | $R^{B1}$ | $R^{B1}$ | $R^{B1}$ | $R^{B1}$ | $R^{B5}$ | N | N |
| $L_{A5129}$ | $R^{B1}$ | $R^{B1}$ | $R^{B1}$ | $R^{B1}$ | $R^{B6}$ | N | N |
| $L_{A5130}$ | $R^{B1}$ | $R^{B1}$ | $R^{B1}$ | $R^{B1}$ | $R^{B7}$ | N | N |
| $L_{A5131}$ | $R^{B1}$ | $R^{B1}$ | $R^{B1}$ | $R^{B1}$ | $R^{B8}$ | N | N |
| $L_{A5132}$ | $R^{B1}$ | $R^{B1}$ | $R^{B1}$ | $R^{B1}$ | $R^{B9}$ | N | N |
| $L_{A5133}$ | $R^{B1}$ | $R^{B1}$ | $R^{B1}$ | $R^{B1}$ | $R^{A2}$ | N | N |
| $L_{A5134}$ | $R^{B1}$ | $R^{B1}$ | $R^{B1}$ | $R^{B1}$ | $R^{A27}$ | N | N |
| $L_{A5135}$ | $R^{B1}$ | $R^{B1}$ | $R^{B1}$ | $R^{B1}$ | $R^{A34}$ | N | N |
| $L_{A5136}$ | $R^{B2}$ | $R^{B1}$ | $R^{B1}$ | $R^{B1}$ | $R^{B2}$ | N | N |
| $L_{A5137}$ | $R^{B2}$ | $R^{B1}$ | $R^{B1}$ | $R^{B1}$ | $R^{B3}$ | N | N |
| $L_{A5138}$ | $R^{B2}$ | $R^{B1}$ | $R^{B1}$ | $R^{B1}$ | $R^{B4}$ | N | N |
| $L_{A5139}$ | $R^{B2}$ | $R^{B1}$ | $R^{B1}$ | $R^{B1}$ | $R^{B5}$ | N | N |
| $L_{A5140}$ | $R^{B2}$ | $R^{B1}$ | $R^{B1}$ | $R^{B1}$ | $R^{B6}$ | N | N |
| $L_{A5141}$ | $R^{B2}$ | $R^{B1}$ | $R^{B1}$ | $R^{B1}$ | $R^{B7}$ | N | N |
| $L_{A5142}$ | $R^{B2}$ | $R^{B1}$ | $R^{B1}$ | $R^{B1}$ | $R^{B8}$ | N | N |
| $L_{A5143}$ | $R^{B2}$ | $R^{B1}$ | $R^{B1}$ | $R^{B1}$ | $R^{B9}$ | N | N |
| $L_{A5144}$ | $R^{B2}$ | $R^{B1}$ | $R^{B1}$ | $R^{B1}$ | $R^{A2}$ | N | N |
| $L_{A5145}$ | $R^{B2}$ | $R^{B1}$ | $R^{B1}$ | $R^{B1}$ | $R^{A27}$ | N | N |
| $L_{A5146}$ | $R^{B2}$ | $R^{B1}$ | $R^{B1}$ | $R^{B1}$ | $R^{A34}$ | N | N |
| $L_{A5147}$ | $R^{B2}$ | F | $R^{B1}$ | $R^{B1}$ | $R^{B2}$ | N | N |
| $L_{A5148}$ | $R^{B2}$ | F | $R^{B1}$ | $R^{B1}$ | $R^{B3}$ | N | N |
| $L_{A5149}$ | $R^{B2}$ | F | $R^{B1}$ | $R^{B1}$ | $R^{B4}$ | N | N |
| $L_{A5150}$ | $R^{B2}$ | F | $R^{B1}$ | $R^{B1}$ | $R^{B5}$ | N | N |
| $L_{A5151}$ | $R^{B2}$ | F | $R^{B1}$ | $R^{B1}$ | $R^{B6}$ | N | N |
| $L_{A5152}$ | $R^{B2}$ | F | $R^{B1}$ | $R^{B1}$ | $R^{B7}$ | N | N |
| $L_{A5153}$ | $R^{B2}$ | F | $R^{B1}$ | $R^{B1}$ | $R^{B8}$ | N | N |
| $L_{A5154}$ | $R^{B2}$ | F | $R^{B1}$ | $R^{B1}$ | $R^{B9}$ | N | N |
| $L_{A5155}$ | $R^{B2}$ | F | $R^{B1}$ | $R^{B1}$ | $R^{A2}$ | N | N |
| $L_{A5156}$ | $R^{B2}$ | F | $R^{B1}$ | $R^{B1}$ | $R^{A27}$ | N | N |
| $L_{A5157}$ | $R^{B2}$ | F | $R^{B1}$ | $R^{B1}$ | $R^{A34}$ | N | N |
| $L_{A5158}$ | $R^{B3}$ | $R^{B1}$ | $R^{B1}$ | $R^{B1}$ | $R^{B2}$ | N | N |
| $L_{A5159}$ | $R^{B3}$ | $R^{B1}$ | $R^{B1}$ | $R^{B1}$ | $R^{B3}$ | N | N |
| $L_{A5160}$ | $R^{B3}$ | $R^{B1}$ | $R^{B1}$ | $R^{B1}$ | $R^{B4}$ | N | N |
| $L_{A5161}$ | $R^{B3}$ | $R^{B1}$ | $R^{B1}$ | $R^{B1}$ | $R^{B5}$ | N | N |
| $L_{A5162}$ | $R^{B3}$ | $R^{B1}$ | $R^{B1}$ | $R^{B1}$ | $R^{B6}$ | N | N |
| $L_{A5163}$ | $R^{B3}$ | $R^{B1}$ | $R^{B1}$ | $R^{B1}$ | $R^{B7}$ | N | N |
| $L_{A5164}$ | $R^{B3}$ | $R^{B1}$ | $R^{B1}$ | $R^{B1}$ | $R^{B8}$ | N | N |
| $L_{A5165}$ | $R^{B3}$ | $R^{B1}$ | $R^{B1}$ | $R^{B1}$ | $R^{B9}$ | N | N |
| $L_{A5166}$ | $R^{B3}$ | $R^{B1}$ | $R^{B1}$ | $R^{B1}$ | $R^{A2}$ | N | N |
| $L_{A5167}$ | $R^{B3}$ | $R^{B1}$ | $R^{B1}$ | $R^{B1}$ | $R^{A27}$ | N | N |
| $L_{A5168}$ | $R^{B3}$ | $R^{B1}$ | $R^{B1}$ | $R^{B1}$ | $R^{A34}$ | N | N |
| $L_{A5169}$ | $R^{B1}$ | $R^{B1}$ | $R^{B2}$ | $R^{B1}$ | $R^{B2}$ | N | N |
| $L_{A5170}$ | $R^{B1}$ | $R^{B1}$ | $R^{B2}$ | $R^{B1}$ | $R^{B3}$ | N | N |
| $L_{A5171}$ | $R^{B1}$ | $R^{B1}$ | $R^{B2}$ | $R^{B1}$ | $R^{B4}$ | N | N |
| $L_{A5172}$ | $R^{B1}$ | $R^{B1}$ | $R^{B2}$ | $R^{B1}$ | $R^{B5}$ | N | N |
| $L_{A5173}$ | $R^{B1}$ | $R^{B1}$ | $R^{B2}$ | $R^{B1}$ | $R^{B6}$ | N | N |
| $L_{A5174}$ | $R^{B1}$ | $R^{B1}$ | $R^{B2}$ | $R^{B1}$ | $R^{B7}$ | N | N |
| $L_{A5175}$ | $R^{B1}$ | $R^{B1}$ | $R^{B2}$ | $R^{B1}$ | $R^{B8}$ | N | N |
| $L_{A5176}$ | $R^{B1}$ | $R^{B1}$ | $R^{B2}$ | $R^{B1}$ | $R^{B9}$ | N | N |
| $L_{A5177}$ | $R^{B1}$ | $R^{B1}$ | $R^{B2}$ | $R^{B1}$ | $R^{A2}$ | N | N |
| $L_{A5178}$ | $R^{B1}$ | $R^{B1}$ | $R^{B2}$ | $R^{B1}$ | $R^{A27}$ | N | N |
| $L_{A5179}$ | $R^{B1}$ | $R^{B1}$ | $R^{B2}$ | $R^{B1}$ | $R^{A34}$ | N | N |
| $L_{A5180}$ | $R^{B2}$ | $R^{B1}$ | $R^{B2}$ | $R^{B1}$ | $R^{B2}$ | N | N |
| $L_{A5181}$ | $R^{B2}$ | $R^{B1}$ | $R^{B2}$ | $R^{B1}$ | $R^{B3}$ | N | N |
| $L_{A5182}$ | $R^{B2}$ | $R^{B1}$ | $R^{B2}$ | $R^{B1}$ | $R^{B4}$ | N | N |
| $L_{A5183}$ | $R^{B2}$ | $R^{B1}$ | $R^{B2}$ | $R^{B1}$ | $R^{B5}$ | N | N |
| $L_{A5184}$ | $R^{B2}$ | $R^{B1}$ | $R^{B2}$ | $R^{B1}$ | $R^{B6}$ | N | N |
| $L_{A5185}$ | $R^{B2}$ | $R^{B1}$ | $R^{B2}$ | $R^{B1}$ | $R^{B7}$ | N | N |
| $L_{A5186}$ | $R^{B2}$ | $R^{B1}$ | $R^{B2}$ | $R^{B1}$ | $R^{B8}$ | N | N |
| $L_{A5187}$ | $R^{B2}$ | $R^{B1}$ | $R^{B2}$ | $R^{B1}$ | $R^{B9}$ | N | N |
| $L_{A5188}$ | $R^{B2}$ | $R^{B1}$ | $R^{B2}$ | $R^{B1}$ | $R^{A2}$ | N | N |
| $L_{A5189}$ | $R^{B2}$ | $R^{B1}$ | $R^{B2}$ | $R^{B1}$ | $R^{A27}$ | N | N |
| $L_{A5190}$ | $R^{B2}$ | $R^{B1}$ | $R^{B2}$ | $R^{B1}$ | $R^{A34}$ | N | N |
| $L_{A5191}$ | $R^{B2}$ | F | $R^{B2}$ | $R^{B1}$ | $R^{B2}$ | N | N |
| $L_{A5192}$ | $R^{B2}$ | F | $R^{B2}$ | $R^{B1}$ | $R^{B3}$ | N | N |
| $L_{A5193}$ | $R^{B2}$ | F | $R^{B2}$ | $R^{B1}$ | $R^{B4}$ | N | N |
| $L_{A5194}$ | $R^{B2}$ | F | $R^{B2}$ | $R^{B1}$ | $R^{B5}$ | N | N |
| $L_{A5195}$ | $R^{B2}$ | F | $R^{B2}$ | $R^{B1}$ | $R^{B6}$ | N | N |
| $L_{A5196}$ | $R^{B2}$ | F | $R^{B2}$ | $R^{B1}$ | $R^{B7}$ | N | N |
| $L_{A5197}$ | $R^{B2}$ | F | $R^{B2}$ | $R^{B1}$ | $R^{B8}$ | N | N |
| $L_{A5198}$ | $R^{B2}$ | F | $R^{B2}$ | $R^{B1}$ | $R^{B9}$ | N | N |
| $L_{A5199}$ | $R^{B2}$ | F | $R^{B2}$ | $R^{B1}$ | $R^{A2}$ | N | N |
| $L_{A5200}$ | $R^{B2}$ | F | $R^{B2}$ | $R^{B1}$ | $R^{A27}$ | N | N |
| $L_{A5201}$ | $R^{B2}$ | F | $R^{B2}$ | $R^{B1}$ | $R^{A34}$ | N | N |
| $L_{A5202}$ | $R^{B3}$ | $R^{B1}$ | $R^{B2}$ | $R^{B1}$ | $R^{B2}$ | N | N |
| $L_{A5203}$ | $R^{B3}$ | $R^{B1}$ | $R^{B2}$ | $R^{B1}$ | $R^{B3}$ | N | N |

-continued

| | $R^1$ | $R^2$ | $R^5$ | $R^6$ | $R^{10}$ | $X^4$ | $X^5$ | | $R^1$ | $R^2$ | $R^7$ | $R^8$ | $R^9$ | $X^4$ | $X^5$ |
|---|---|---|---|---|---|---|---|---|---|---|---|---|---|---|---|
| $L_{A5272}$ | $R^{B3}$ | $R^{B1}$ | $R^{B2}$ | $R^{B1}$ | $R^{B4}$ | N | C | $L_{A5204}$ | $R^{B3}$ | $R^{B1}$ | $R^{B2}$ | $R^{B1}$ | $R^{B4}$ | N | N |
| $L_{A5273}$ | $R^{B3}$ | $R^{B1}$ | $R^{B2}$ | $R^{B1}$ | $R^{B5}$ | N | C | $L_{A5205}$ | $R^{B3}$ | $R^{B1}$ | $R^{B2}$ | $R^{B1}$ | $R^{B5}$ | N | N |
| $L_{A5274}$ | $R^{B3}$ | $R^{B1}$ | $R^{B2}$ | $R^{B1}$ | $R^{B6}$ | N | C | $L_{A5206}$ | $R^{B3}$ | $R^{B1}$ | $R^{B2}$ | $R^{B1}$ | $R^{B6}$ | N | N |
| $L_{A5275}$ | $R^{B3}$ | $R^{B1}$ | $R^{B2}$ | $R^{B1}$ | $R^{B7}$ | N | C | $L_{A5207}$ | $R^{B3}$ | $R^{B1}$ | $R^{B2}$ | $R^{B1}$ | $R^{B7}$ | N | N |
| $L_{A5276}$ | $R^{B3}$ | $R^{B1}$ | $R^{B2}$ | $R^{B1}$ | $R^{B8}$ | N | C | $L_{A5208}$ | $R^{B3}$ | $R^{B1}$ | $R^{B2}$ | $R^{B1}$ | $R^{B8}$ | N | N |
| $L_{A5277}$ | $R^{B3}$ | $R^{B1}$ | $R^{B2}$ | $R^{B1}$ | $R^{B9}$ | N | C | $L_{A5209}$ | $R^{B3}$ | $R^{B1}$ | $R^{B2}$ | $R^{B1}$ | $R^{B9}$ | N | N |
| $L_{A5278}$ | $R^{B3}$ | $R^{B1}$ | $R^{B2}$ | $R^{B1}$ | $R^{A2}$ | N | C | $L_{A5210}$ | $R^{B3}$ | $R^{B1}$ | $R^{B2}$ | $R^{B1}$ | $R^{A2}$ | N | N |
| $L_{A5279}$ | $R^{B3}$ | $R^{B1}$ | $R^{B2}$ | $R^{B1}$ | $R^{A27}$ | N | C | $L_{A5211}$ | $R^{B3}$ | $R^{B1}$ | $R^{B2}$ | $R^{B1}$ | $R^{A27}$ | N | N |
| $L_{A5280}$ | $R^{B3}$ | $R^{B1}$ | $R^{B2}$ | $R^{B1}$ | $R^{A34}$ | N | C | $L_{A5212}$ | $R^{B3}$ | $R^{B1}$ | $R^{B2}$ | $R^{B1}$ | $R^{A34}$ | N | N |
| $L_{A5281}$ | $R^{B1}$ | $R^{B1}$ | $R^{B2}$ | $R^{B2}$ | $R^{B2}$ | N | C | $L_{A5213}$ | $R^{B1}$ | $R^{B1}$ | $R^{B2}$ | $R^{B2}$ | $R^{B2}$ | N | N |
| $L_{A5282}$ | $R^{B1}$ | $R^{B1}$ | $R^{B2}$ | $R^{B2}$ | $R^{B3}$ | N | C | $L_{A5214}$ | $R^{B1}$ | $R^{B1}$ | $R^{B2}$ | $R^{B2}$ | $R^{B3}$ | N | N |
| $L_{A5283}$ | $R^{B1}$ | $R^{B1}$ | $R^{B2}$ | $R^{B2}$ | $R^{B4}$ | N | C | $L_{A5215}$ | $R^{B1}$ | $R^{B1}$ | $R^{B2}$ | $R^{B2}$ | $R^{B4}$ | N | N |
| $L_{A5284}$ | $R^{B1}$ | $R^{B1}$ | $R^{B2}$ | $R^{B2}$ | $R^{B5}$ | N | C | $L_{A5216}$ | $R^{B1}$ | $R^{B1}$ | $R^{B2}$ | $R^{B2}$ | $R^{B5}$ | N | N |
| $L_{A5285}$ | $R^{B1}$ | $R^{B1}$ | $R^{B2}$ | $R^{B2}$ | $R^{B6}$ | N | C | $L_{A5217}$ | $R^{B1}$ | $R^{B1}$ | $R^{B2}$ | $R^{B2}$ | $R^{B6}$ | N | N |
| $L_{A5286}$ | $R^{B1}$ | $R^{B1}$ | $R^{B2}$ | $R^{B2}$ | $R^{B7}$ | N | C | $L_{A5218}$ | $R^{B1}$ | $R^{B1}$ | $R^{B2}$ | $R^{B2}$ | $R^{B7}$ | N | N |
| $L_{A5287}$ | $R^{B1}$ | $R^{B1}$ | $R^{B2}$ | $R^{B2}$ | $R^{B8}$ | N | C | $L_{A5219}$ | $R^{B1}$ | $R^{B1}$ | $R^{B2}$ | $R^{B2}$ | $R^{B8}$ | N | N |
| $L_{A5288}$ | $R^{B1}$ | $R^{B1}$ | $R^{B2}$ | $R^{B2}$ | $R^{B9}$ | N | C | $L_{A5220}$ | $R^{B1}$ | $R^{B1}$ | $R^{B2}$ | $R^{B2}$ | $R^{B9}$ | N | N |
| $L_{A5289}$ | $R^{B1}$ | $R^{B1}$ | $R^{B2}$ | $R^{B2}$ | $R^{A2}$ | N | C | $L_{A5221}$ | $R^{B1}$ | $R^{B1}$ | $R^{B2}$ | $R^{B2}$ | $R^{A2}$ | N | N |
| $L_{A5290}$ | $R^{B1}$ | $R^{B1}$ | $R^{B2}$ | $R^{B2}$ | $R^{A27}$ | N | C | $L_{A5222}$ | $R^{B1}$ | $R^{B1}$ | $R^{B2}$ | $R^{B2}$ | $R^{A27}$ | N | N |
| $L_{A5291}$ | $R^{B1}$ | $R^{B1}$ | $R^{B2}$ | $R^{B2}$ | $R^{A34}$ | N | C | $L_{A5223}$ | $R^{B1}$ | $R^{B1}$ | $R^{B2}$ | $R^{B2}$ | $R^{A34}$ | N | N |
| $L_{A5292}$ | $R^{B2}$ | $R^{B1}$ | $R^{B2}$ | $R^{B2}$ | $R^{B2}$ | N | C | $L_{A5224}$ | $R^{B2}$ | $R^{B1}$ | $R^{B2}$ | $R^{B2}$ | $R^{B2}$ | N | N |
| $L_{A5293}$ | $R^{B2}$ | $R^{B1}$ | $R^{B2}$ | $R^{B2}$ | $R^{B3}$ | N | C | $L_{A5225}$ | $R^{B2}$ | $R^{B1}$ | $R^{B2}$ | $R^{B2}$ | $R^{B3}$ | N | N |
| $L_{A5294}$ | $R^{B2}$ | $R^{B1}$ | $R^{B2}$ | $R^{B2}$ | $R^{B4}$ | N | C | $L_{A5226}$ | $R^{B2}$ | $R^{B1}$ | $R^{B2}$ | $R^{B2}$ | $R^{B4}$ | N | N |
| $L_{A5295}$ | $R^{B2}$ | $R^{B1}$ | $R^{B2}$ | $R^{B2}$ | $R^{B5}$ | N | C | $L_{A5227}$ | $R^{B2}$ | $R^{B1}$ | $R^{B2}$ | $R^{B2}$ | $R^{B5}$ | N | N |
| $L_{A5296}$ | $R^{B2}$ | $R^{B1}$ | $R^{B2}$ | $R^{B2}$ | $R^{B6}$ | N | C | $L_{A5228}$ | $R^{B2}$ | $R^{B1}$ | $R^{B2}$ | $R^{B2}$ | $R^{B6}$ | N | N |
| $L_{A5297}$ | $R^{B2}$ | $R^{B1}$ | $R^{B2}$ | $R^{B2}$ | $R^{B7}$ | N | C | $L_{A5229}$ | $R^{B2}$ | $R^{B1}$ | $R^{B2}$ | $R^{B2}$ | $R^{B7}$ | N | N |
| $L_{A5298}$ | $R^{B2}$ | $R^{B1}$ | $R^{B2}$ | $R^{B2}$ | $R^{B8}$ | N | C | $L_{A5230}$ | $R^{B2}$ | $R^{B1}$ | $R^{B2}$ | $R^{B2}$ | $R^{B8}$ | N | N |
| $L_{A5299}$ | $R^{B2}$ | $R^{B1}$ | $R^{B2}$ | $R^{B2}$ | $R^{B9}$ | N | C | $L_{A5231}$ | $R^{B2}$ | $R^{B1}$ | $R^{B2}$ | $R^{B2}$ | $R^{B9}$ | N | N |
| $L_{A5300}$ | $R^{B2}$ | $R^{B1}$ | $R^{B2}$ | $R^{B2}$ | $R^{A2}$ | N | C | $L_{A5232}$ | $R^{B2}$ | $R^{B1}$ | $R^{B2}$ | $R^{B2}$ | $R^{A2}$ | N | N |
| $L_{A5301}$ | $R^{B2}$ | $R^{B1}$ | $R^{B2}$ | $R^{B2}$ | $R^{A27}$ | N | C | $L_{A5233}$ | $R^{B2}$ | $R^{B1}$ | $R^{B2}$ | $R^{B2}$ | $R^{A27}$ | N | N |
| $L_{A5302}$ | $R^{B2}$ | $R^{B1}$ | $R^{B2}$ | $R^{B2}$ | $R^{A34}$ | N | C | $L_{A5234}$ | $R^{B2}$ | $R^{B1}$ | $R^{B2}$ | $R^{B2}$ | $R^{A34}$ | N | N |
| $L_{A5303}$ | $R^{B2}$ | F | $R^{B2}$ | $R^{B2}$ | $R^{B2}$ | N | C | $L_{A5235}$ | $R^{B2}$ | F | $R^{B2}$ | $R^{B2}$ | $R^{B2}$ | N | N |
| $L_{A5304}$ | $R^{B2}$ | F | $R^{B2}$ | $R^{B2}$ | $R^{B3}$ | N | C | $L_{A5236}$ | $R^{B2}$ | F | $R^{B2}$ | $R^{B2}$ | $R^{B3}$ | N | N |
| $L_{A5305}$ | $R^{B2}$ | F | $R^{B2}$ | $R^{B2}$ | $R^{B4}$ | N | C | $L_{A5237}$ | $R^{B2}$ | F | $R^{B2}$ | $R^{B2}$ | $R^{B4}$ | N | N |
| $L_{A5306}$ | $R^{B2}$ | F | $R^{B2}$ | $R^{B2}$ | $R^{B5}$ | N | C | $L_{A5238}$ | $R^{B2}$ | F | $R^{B2}$ | $R^{B2}$ | $R^{B5}$ | N | N |
| $L_{A5307}$ | $R^{B2}$ | F | $R^{B2}$ | $R^{B2}$ | $R^{B6}$ | N | C | $L_{A5239}$ | $R^{B2}$ | F | $R^{B2}$ | $R^{B2}$ | $R^{B6}$ | N | N |
| $L_{A5308}$ | $R^{B2}$ | F | $R^{B2}$ | $R^{B2}$ | $R^{B7}$ | N | C | $L_{A5240}$ | $R^{B2}$ | F | $R^{B2}$ | $R^{B2}$ | $R^{B7}$ | N | N |
| $L_{A5309}$ | $R^{B2}$ | F | $R^{B2}$ | $R^{B2}$ | $R^{B8}$ | N | C | $L_{A5241}$ | $R^{B2}$ | F | $R^{B2}$ | $R^{B2}$ | $R^{B8}$ | N | N |
| $L_{A5310}$ | $R^{B2}$ | F | $R^{B2}$ | $R^{B2}$ | $R^{B9}$ | N | C | $L_{A5242}$ | $R^{B2}$ | F | $R^{B2}$ | $R^{B2}$ | $R^{B9}$ | N | N |
| $L_{A5311}$ | $R^{B2}$ | F | $R^{B2}$ | $R^{B2}$ | $R^{A2}$ | N | C | $L_{A5243}$ | $R^{B2}$ | F | $R^{B2}$ | $R^{B2}$ | $R^{A2}$ | N | N |
| $L_{A5312}$ | $R^{B2}$ | F | $R^{B2}$ | $R^{B2}$ | $R^{A27}$ | N | C | $L_{A5244}$ | $R^{B2}$ | F | $R^{B2}$ | $R^{B2}$ | $R^{A27}$ | N | N |
| $L_{A5313}$ | $R^{B2}$ | F | $R^{B2}$ | $R^{B2}$ | $R^{A34}$ | N | C | $L_{A5245}$ | $R^{B2}$ | F | $R^{B2}$ | $R^{B2}$ | $R^{A34}$ | N | N |
| $L_{A5314}$ | $R^{B3}$ | $R^{B1}$ | $R^{B2}$ | $R^{B2}$ | $R^{B2}$ | N | C | $L_{A5246}$ | $R^{B3}$ | $R^{B1}$ | $R^{B2}$ | $R^{B2}$ | $R^{B2}$ | N | N |
| $L_{A5315}$ | $R^{B3}$ | $R^{B1}$ | $R^{B2}$ | $R^{B2}$ | $R^{B3}$ | N | C | $L_{A5247}$ | $R^{B3}$ | $R^{B1}$ | $R^{B2}$ | $R^{B2}$ | $R^{B3}$ | N | N |
| $L_{A5316}$ | $R^{B3}$ | $R^{B1}$ | $R^{B2}$ | $R^{B2}$ | $R^{B4}$ | N | C | $L_{A5248}$ | $R^{B3}$ | $R^{B1}$ | $R^{B2}$ | $R^{B2}$ | $R^{B4}$ | N | N |
| $L_{A5317}$ | $R^{B3}$ | $R^{B1}$ | $R^{B2}$ | $R^{B2}$ | $R^{B5}$ | N | C | $L_{A5249}$ | $R^{B3}$ | $R^{B1}$ | $R^{B2}$ | $R^{B2}$ | $R^{B5}$ | N | N |
| $L_{A5318}$ | $R^{B3}$ | $R^{B1}$ | $R^{B2}$ | $R^{B2}$ | $R^{B6}$ | N | C | $L_{A5250}$ | $R^{B3}$ | $R^{B1}$ | $R^{B2}$ | $R^{B2}$ | $R^{B6}$ | N | N |
| $L_{A5319}$ | $R^{B3}$ | $R^{B1}$ | $R^{B2}$ | $R^{B2}$ | $R^{B7}$ | N | C | $L_{A5251}$ | $R^{B3}$ | $R^{B1}$ | $R^{B2}$ | $R^{B2}$ | $R^{B7}$ | N | N |
| $L_{A5320}$ | $R^{B3}$ | $R^{B1}$ | $R^{B2}$ | $R^{B2}$ | $R^{B8}$ | N | C | $L_{A5252}$ | $R^{B3}$ | $R^{B1}$ | $R^{B2}$ | $R^{B2}$ | $R^{B8}$ | N | N |
| $L_{A5321}$ | $R^{B3}$ | $R^{B1}$ | $R^{B2}$ | $R^{B2}$ | $R^{B9}$ | N | C | $L_{A5253}$ | $R^{B3}$ | $R^{B1}$ | $R^{B2}$ | $R^{B2}$ | $R^{B9}$ | N | N |
| $L_{A5322}$ | $R^{B3}$ | $R^{B1}$ | $R^{B2}$ | $R^{B2}$ | $R^{A2}$ | N | C | $L_{A5254}$ | $R^{B3}$ | $R^{B1}$ | $R^{B2}$ | $R^{B2}$ | $R^{A2}$ | N | N |
| $L_{A5323}$ | $R^{B3}$ | $R^{B1}$ | $R^{B2}$ | $R^{B2}$ | $R^{A27}$ | N | C | $L_{A5255}$ | $R^{B3}$ | $R^{B1}$ | $R^{B2}$ | $R^{B2}$ | $R^{A27}$ | N | N |
| $L_{A5324}$ | $R^{B3}$ | $R^{B1}$ | $R^{B2}$ | $R^{B2}$ | $R^{A34}$ | N | C | $L_{A5256}$ | $R^{B3}$ | $R^{B1}$ | $R^{B2}$ | $R^{B2}$ | $R^{A34}$ | N | N |

where $R^{B1}$ to $R^{B9}$ has the following structures:

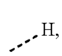

$R^{B1}$

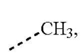

$R^{B2}$

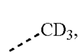

$R^{B3}$

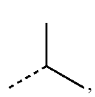

$R^{B4}$

-continued

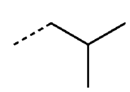

$R^{B5}$

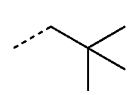

$R^{B6}$

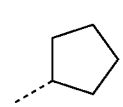

$R^{B7}$ $R^{B8}$
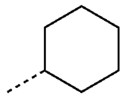
, and
$R^{B9}$
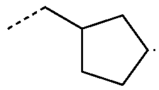
.
In some embodiments, ligand $L_B$ is selected from the group consisting of:
$L_{B1}$
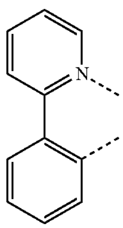
,
$L_{B2}$
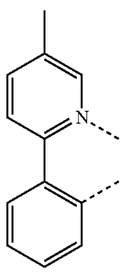
,
$L_{B3}$
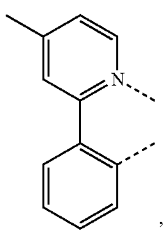
,
$L_{B4}$
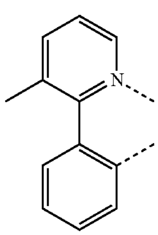
,
$L_{B5}$
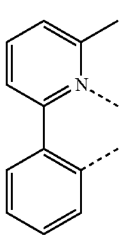
,
$L_{B6}$
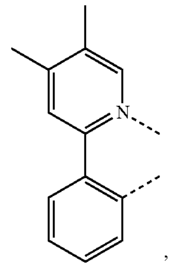
,
$L_{B7}$
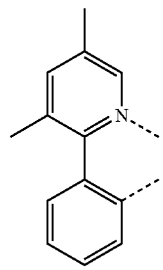
,
$L_{B8}$
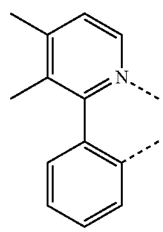
,
$L_{B9}$
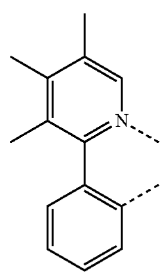
,
$L_{B10}$
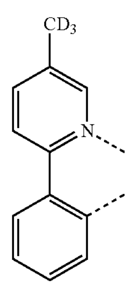
,
$L_{B11}$
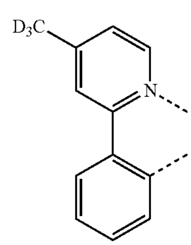
, -continued
$L_{B12}$
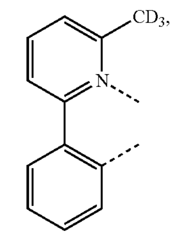
$L_{B13}$
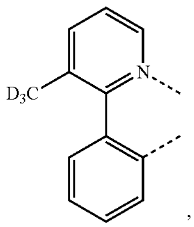
$L_{B14}$
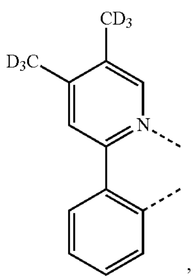
$L_{B15}$
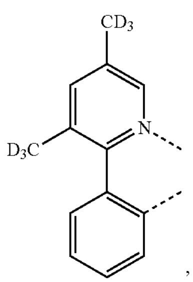
$L_{B16}$
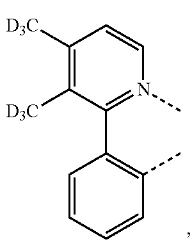
$L_{B17}$
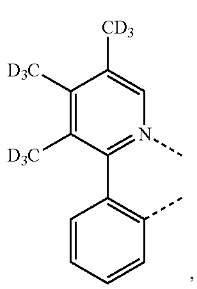
-continued
$L_{B18}$
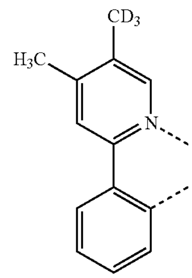
$L_{B19}$
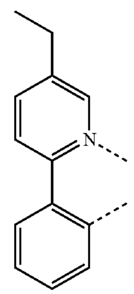
$L_{B20}$
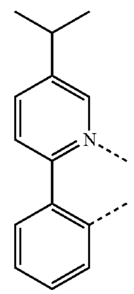
$L_{B21}$
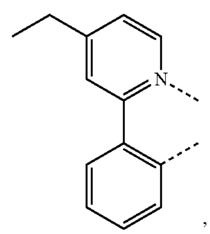
$L_{B22}$
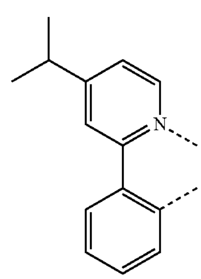
$L_{B23}$
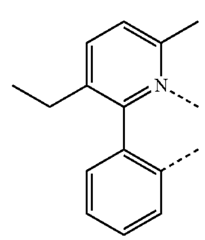

-continued
$L_{B24}$
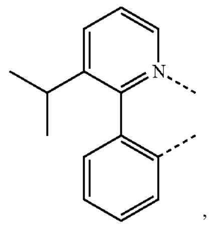
$L_{B25}$
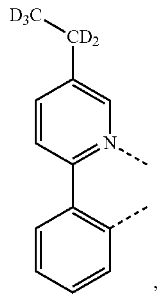
$L_{B26}$
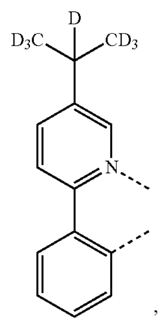
$L_{B27}$
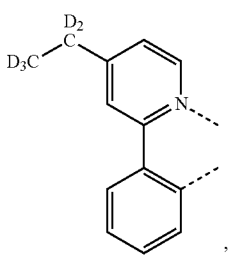
$L_{B28}$
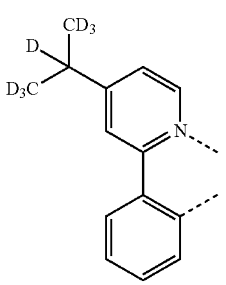
$L_{B30}$
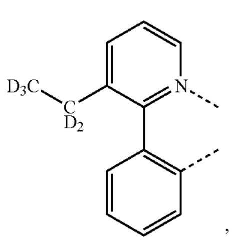
-continued
$L_{B31}$
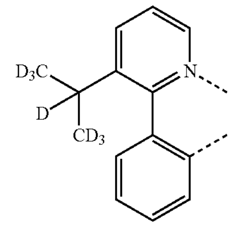
$L_{B32}$
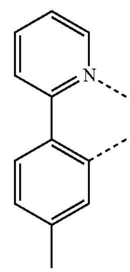
$L_{B33}$
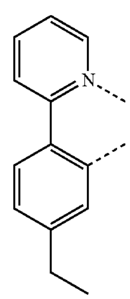
$L_{B34}$
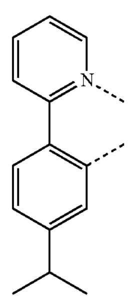
$L_{B35}$
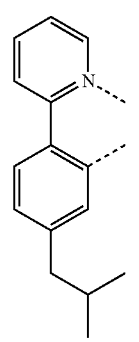

-continued
$L_{B36}$
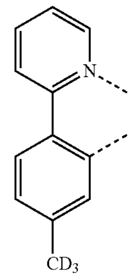
,
$L_{B37}$
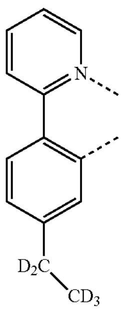
,
$L_{B38}$
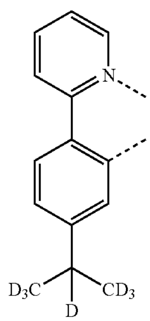
,
$L_{B39}$
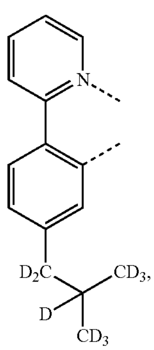
$L_{B40}$
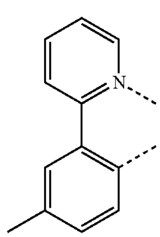
, and
-continued
$L_{B41}$
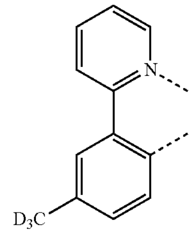
.
In some embodiments, the compound is selected from the group consisting of Compound 1 through Compound 215,496; where each Compound x has the formula $Ir(L_{Ak})(L_{Bj})_2$; x=5256j+k−5256, k is an integer from 1 to 5256, and j is an integer from 1 to 41, where $L_{Bj}$ has the following structure:
$L_{B1}$
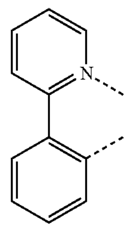
,
$L_{B2}$
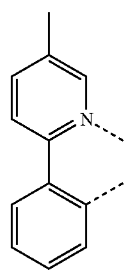
,
$L_{B3}$
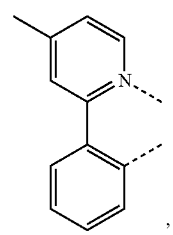
,
$L_{B4}$
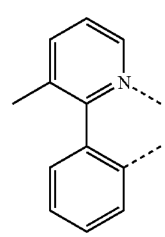
, -continued
$L_{B5}$
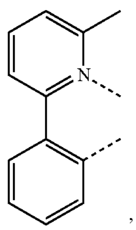
$L_{B6}$
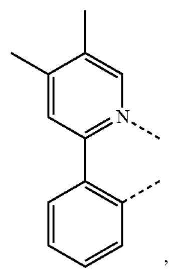
$L_{B7}$
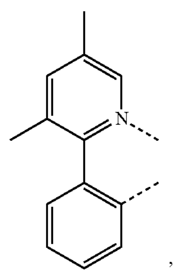
$L_{B8}$
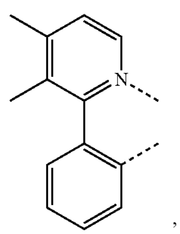
$L_{B9}$
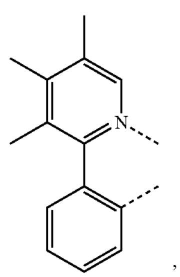
$L_{B10}$
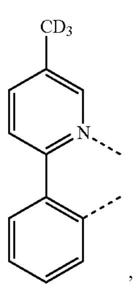
-continued
$L_{B11}$
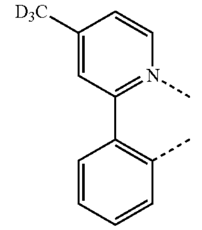
$L_{B12}$
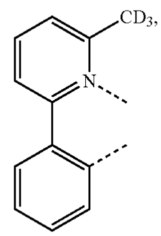
$L_{B13}$
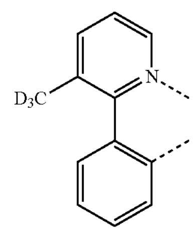
$L_{B14}$
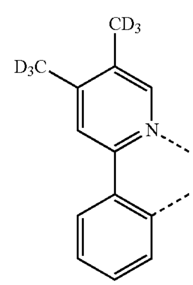
$L_{B15}$
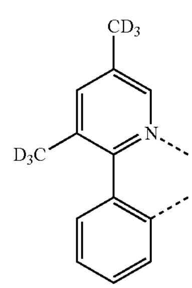
$L_{B16}$
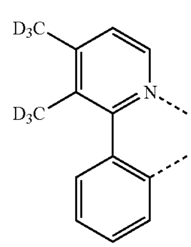

-continued
$L_{B17}$
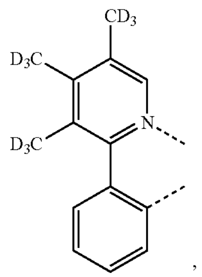
$L_{B18}$
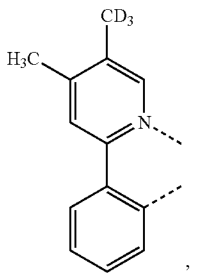
$L_{B19}$
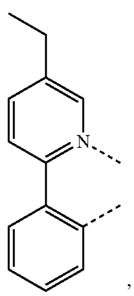
$L_{B20}$
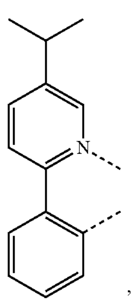
$L_{B21}$
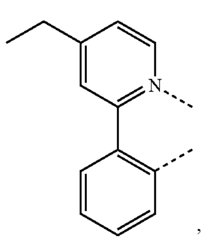
-continued
$L_{B22}$
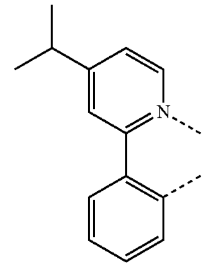
$L_{B23}$
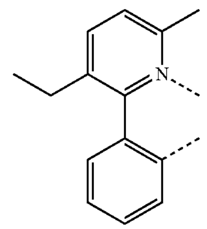
$L_{B24}$
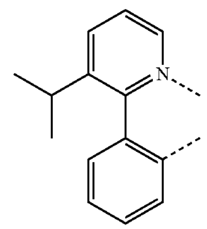
$L_{B25}$
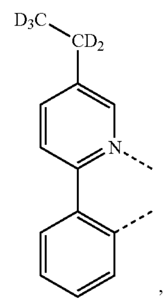
$L_{B26}$
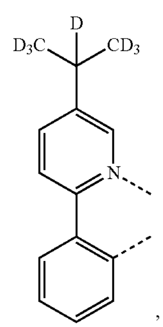
$L_{B27}$
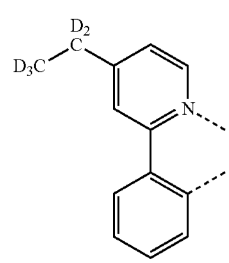

-continued
$L_{B28}$
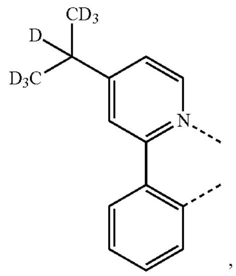
$L_{B30}$
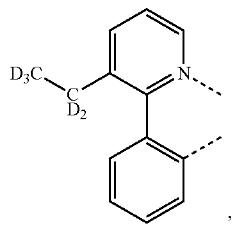
$L_{B31}$
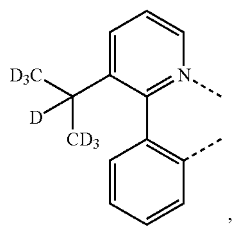
$L_{B32}$
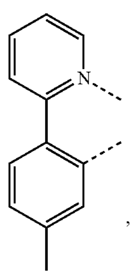
$L_{B33}$
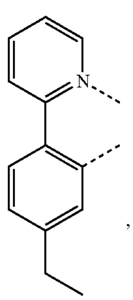
$L_{B34}$
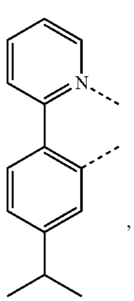
-continued
$L_{B35}$
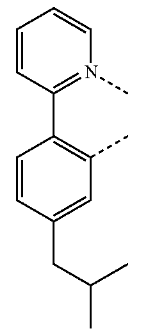
$L_{B36}$
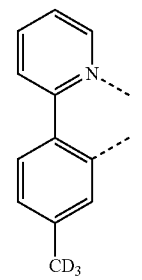
$L_{B37}$
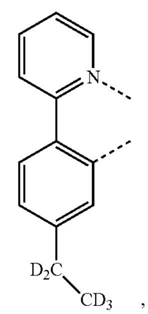
$L_{B38}$
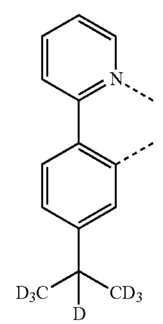
$L_{B39}$
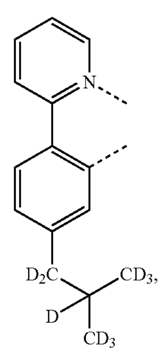

-continued
$L_{B40}$
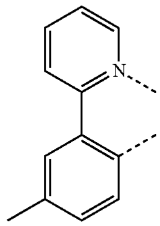
, and
$L_{B41}$
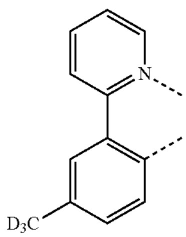
.
In some embodiments, ligand $L_C$ is selected from the group consisting of:
$L_{C1}$
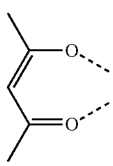
,
$L_{C2}$
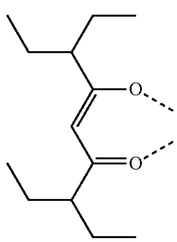
,
$L_{C3}$
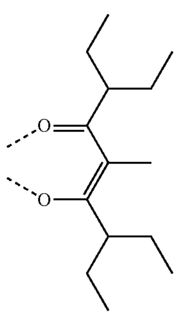
,
$L_{C4}$
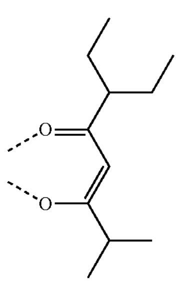
,
-continued
$L_{C5}$
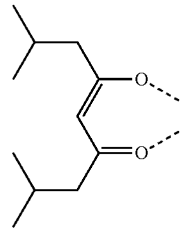
,
$L_{C6}$
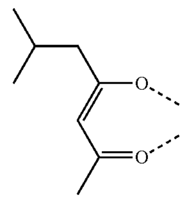
,
$L_{C7}$
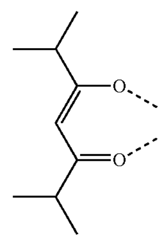
,
$L_{C8}$
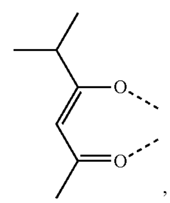
,
$L_{C9}$
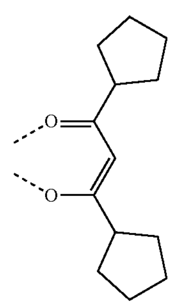
,
$L_{C10}$
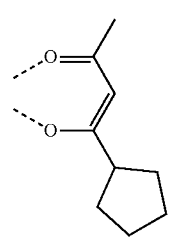
, -continued
L$_{C11}$
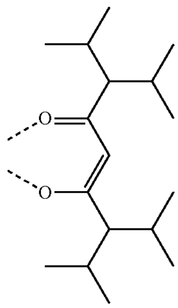
,
L$_{C12}$
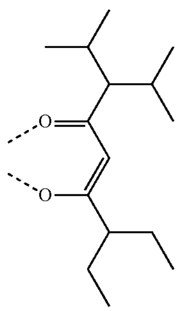
, and
L$_{C13}$
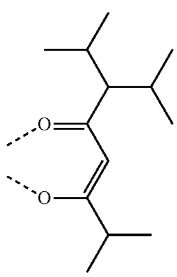
.
In some embodiments, the compound is selected from the group consisting of Compound 215,497 through Compound 283,825; wherein each Compound x has the formula Ir($L_{Ak}$)$_2$($L_{Cj}$); wherein x=(5256j+k−5256)+215,496, k is an integer from 1 to 5256, and j is an integer from 1 to 13, where $L_{Cj}$ has the following structures:
L$_{C1}$
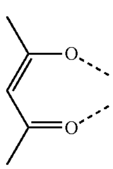
,
L$_{C2}$
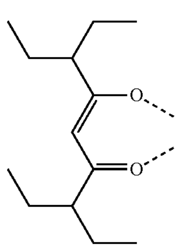
,
-continued
L$_{C3}$
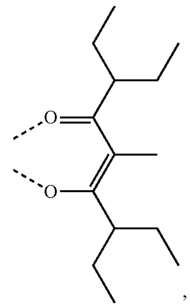
,
L$_{C4}$
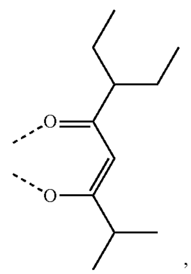
,
L$_{C5}$
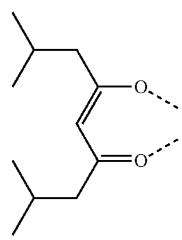
,
L$_{C6}$
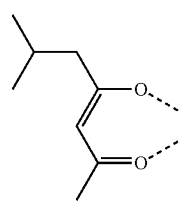
,
L$_{C7}$
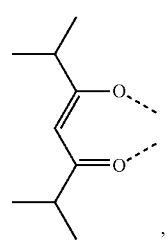
,
L$_{C8}$
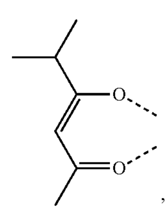
, -continued
$L_{C9}$
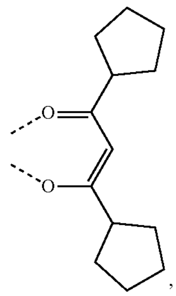
$L_{C10}$
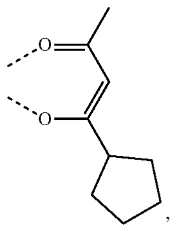
$L_{C11}$
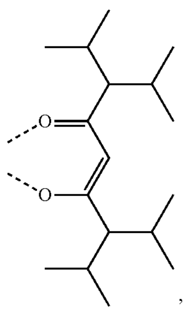
$L_{C12}$
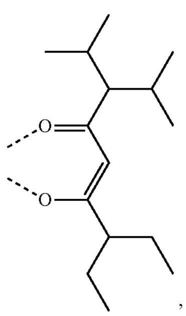
, and
$L_{C13}$
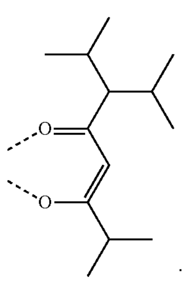
In some embodiments, ligand $L_B$ is selected from the group consisting of:
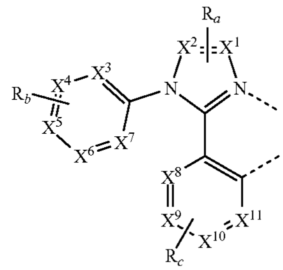
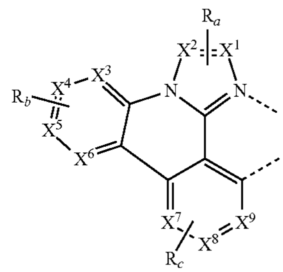
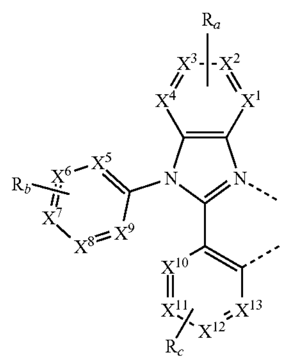
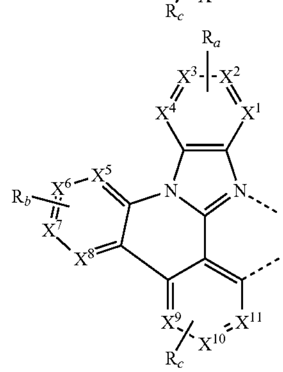
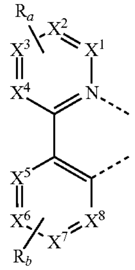
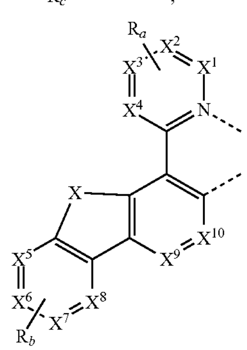

-continued

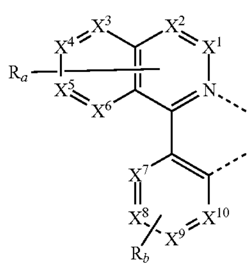

,

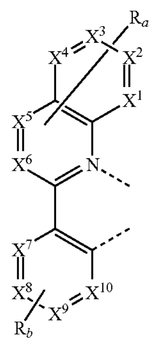

,

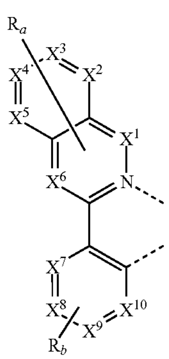

,

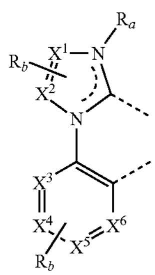

,

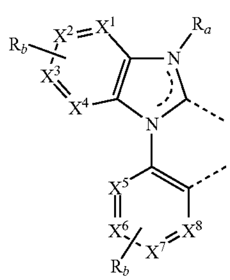

,

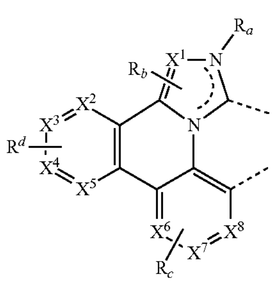

,

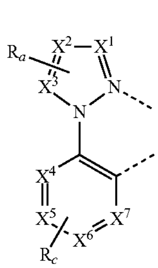

,

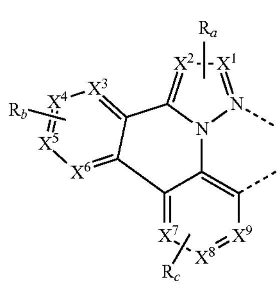

,

-continued

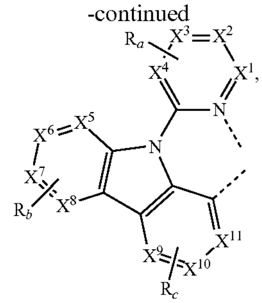

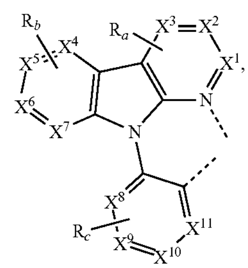

and

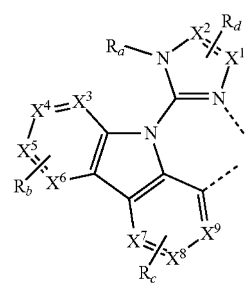

.

In such embodiments:

each $X^1$ to $X^{13}$ are independently selected from the group consisting of carbon and nitrogen;

X is selected from the group consisting of BR', NR', PR', O, S, Se, C═O, S═O, $SO_2$, CR'R", SiR'R", and GeR'R";

R' and R" are optionally fused or joined to form a ring;

each $R_a$, $R_b$, $R_c$, and $R_d$ may represent from mono substitution to the possible maximum number of substitution, or no substitution;

R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and any two adjacent substitutents of $R_a$, $R_b$, $R_c$, and $R_d$ are optionally fused or joined to form a ring or form a multidentate ligand.

In some embodiments, ligand $L_B$ is selected from the group consisting of:
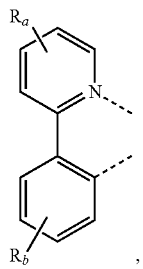
,
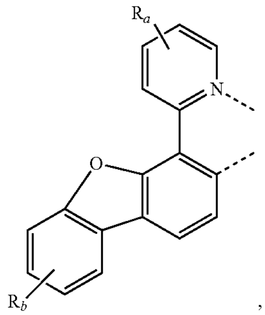
,
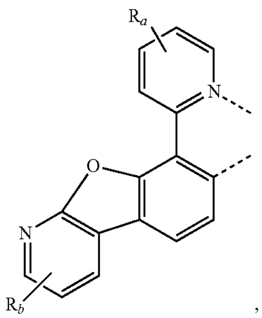
,
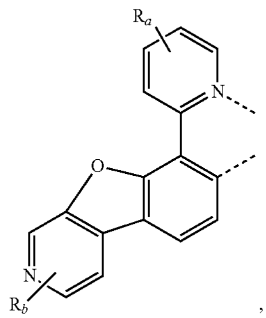
,
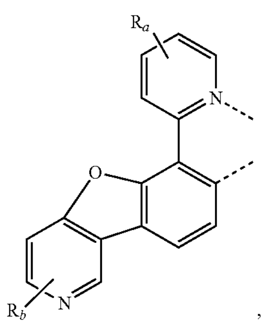
,
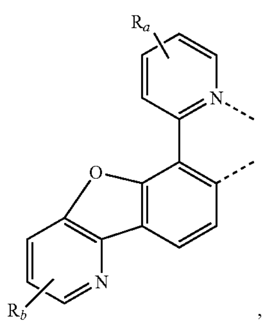
,
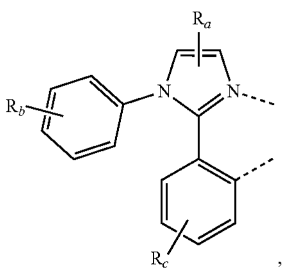
,
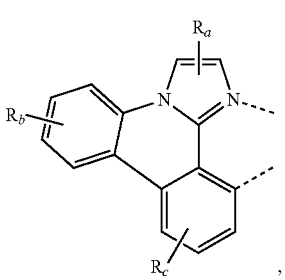
,
-continued
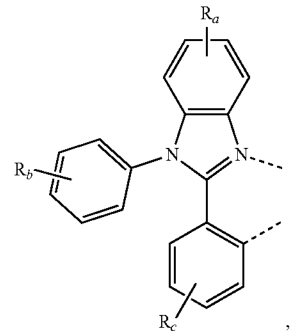
,
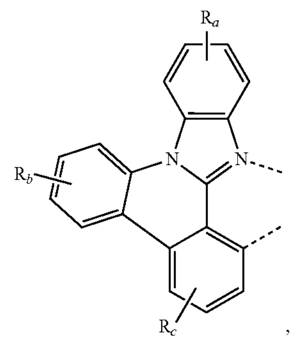
,
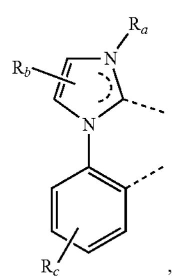
,
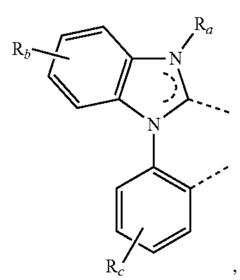
,
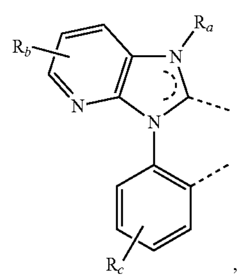
,
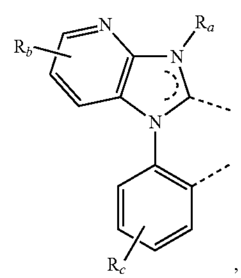
,
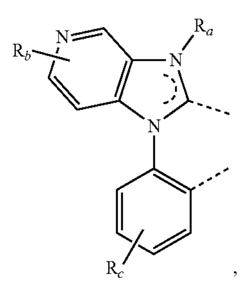
,
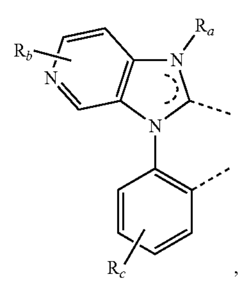
, -continued

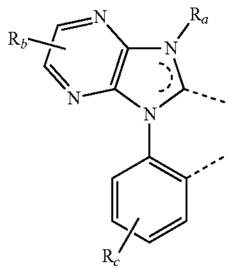
,
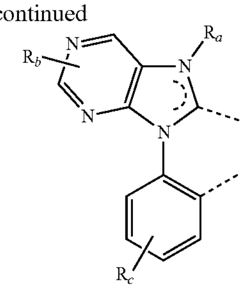
, and
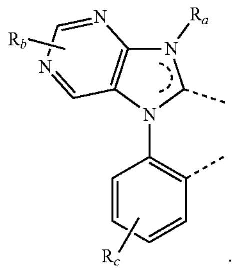
.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

In another embodiments, an OLED is described. The OLED includes an anode; a cathode; and an organic layer, disposed between the anode and the cathode, where the organic layer includes a compound having a formula $M(L_A)_x(L_B)_y(L_C)_z$: as described herein. The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(CH_{2n+1})_2$, $N(Ar_1)(Ar_2)$, $CH{=}CH{-}CH_{2n+1}$, $C{\equiv}C{-}CH_{2n+1}$, $Ar_1$, $Ar_1{-}Ar_2$, and $CH_2{-}Ar_1$, or the host has no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

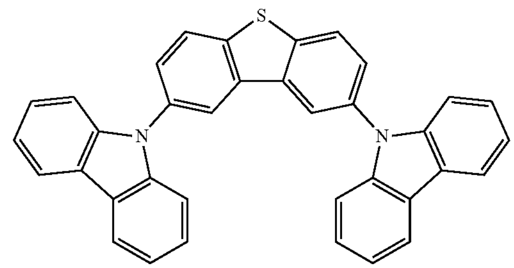
,
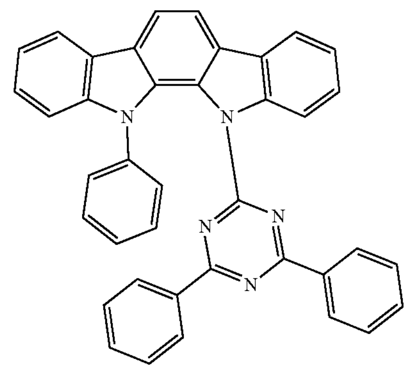
,
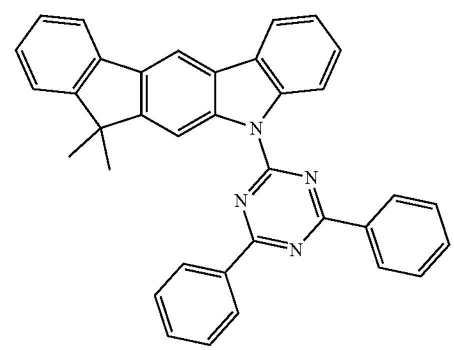
,
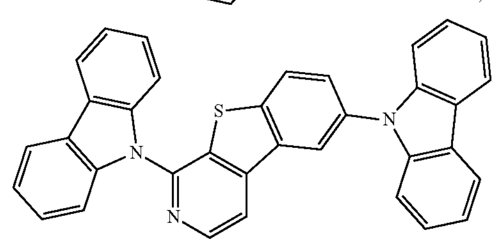
,
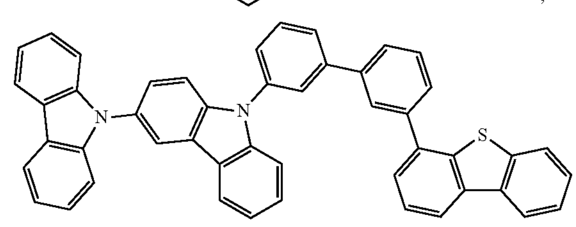
,
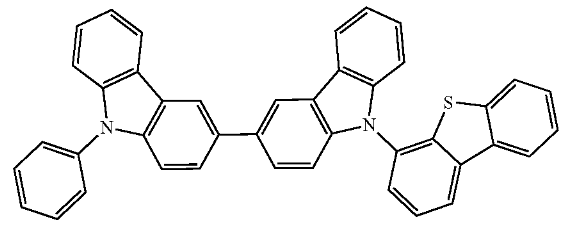
, -continued
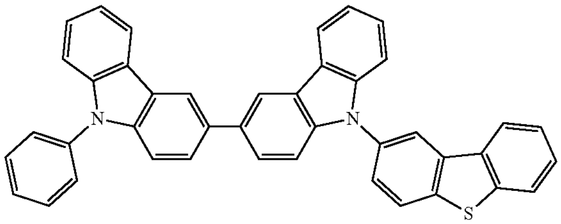
,
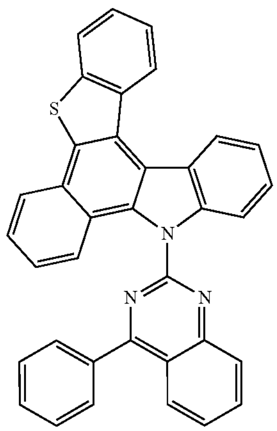
,
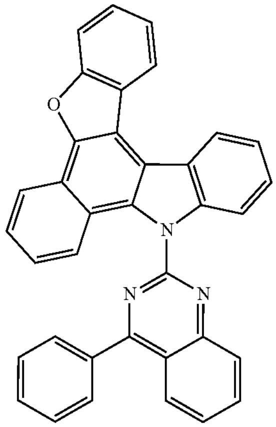
,
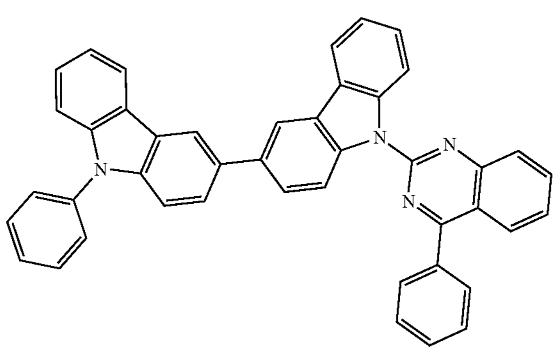
,
-continued
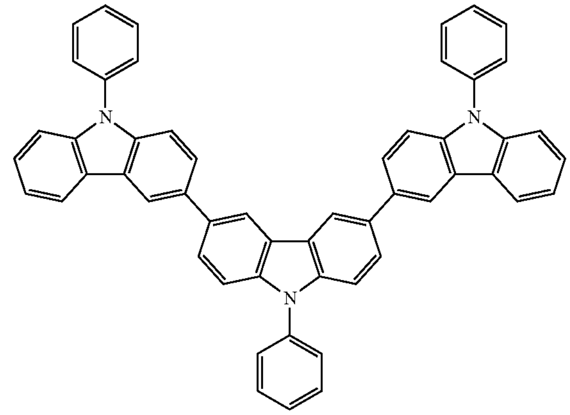
,
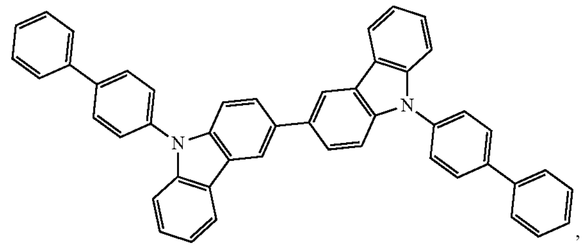
,
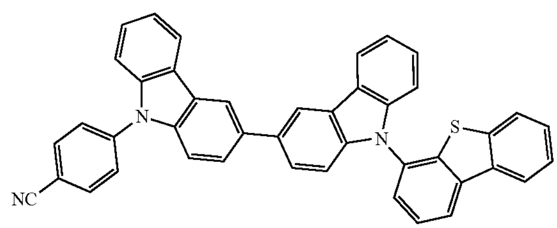
,
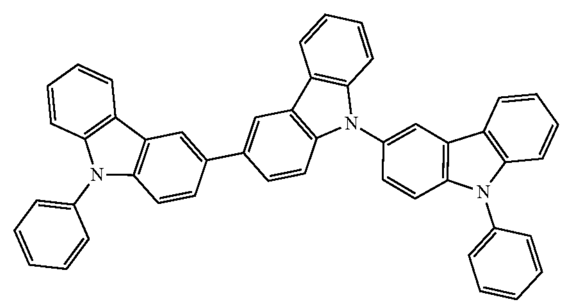
,
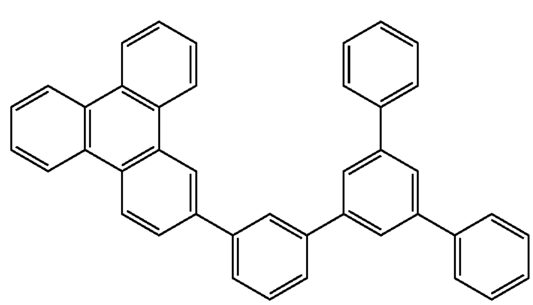
, -continued

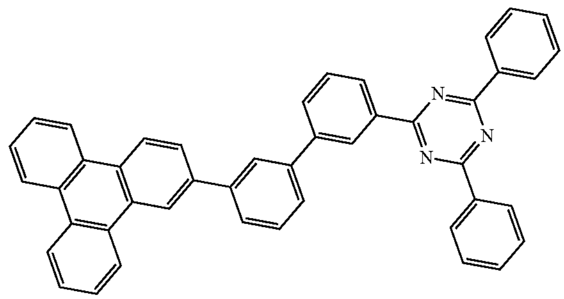

,

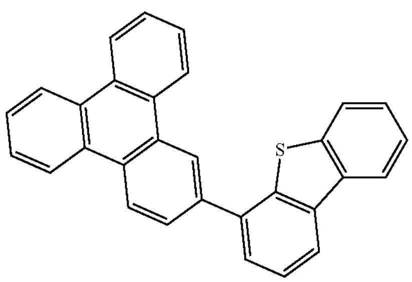

,

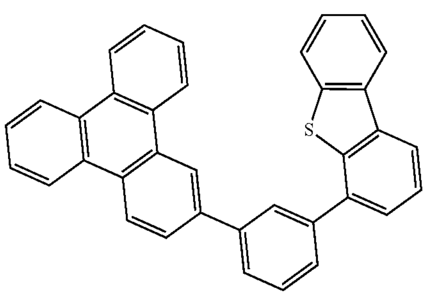

,

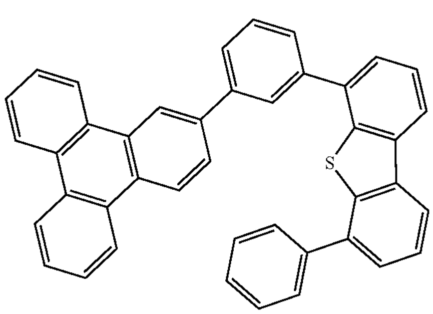

,

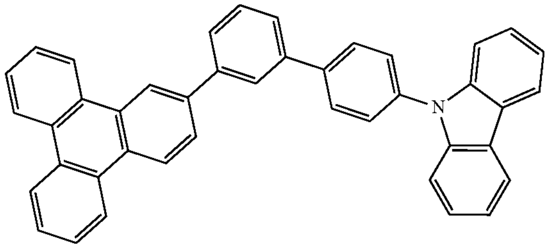

,

-continued

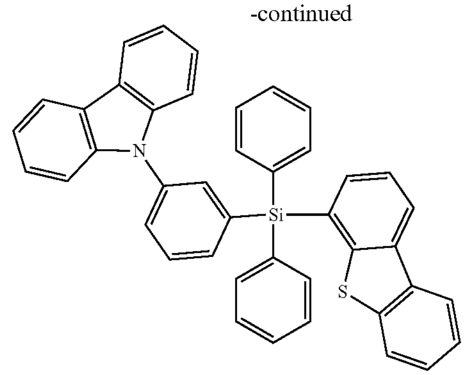

,

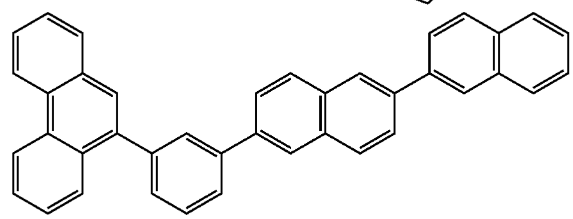

, and combinations thereof.

Additional information on possible hosts is provided below.

In yet another aspect of the present disclosure, a formulation that comprises a compound according to formula $M(L_A)_x(L_B)_y(L_C)_z$: as described herein. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

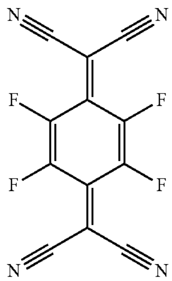
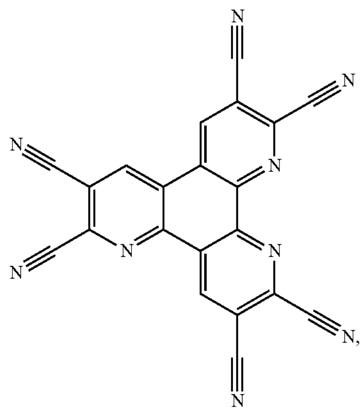
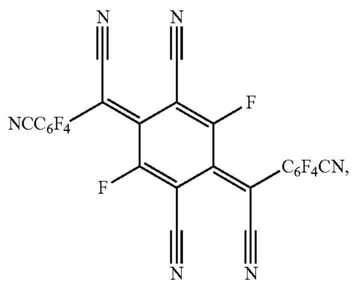
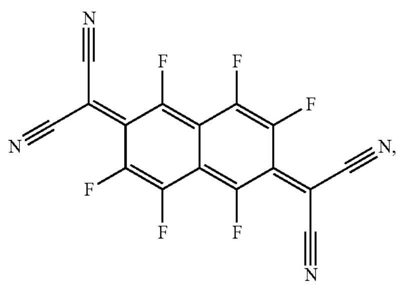
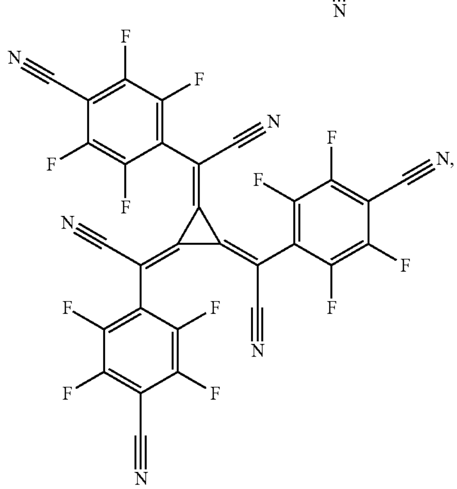
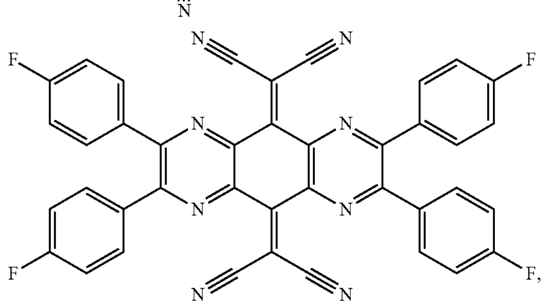
-continued
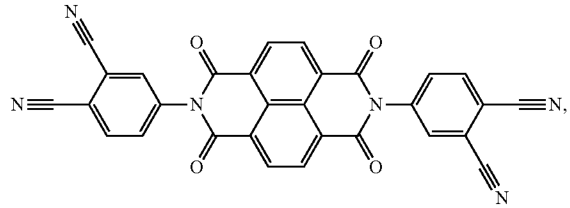
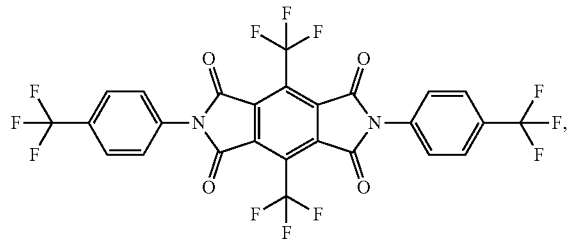
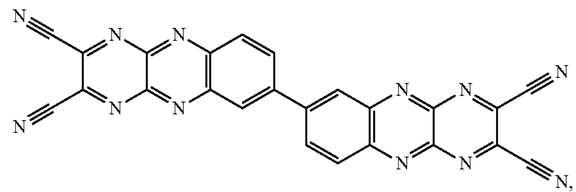
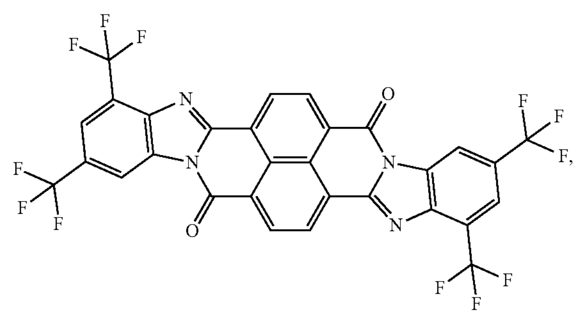
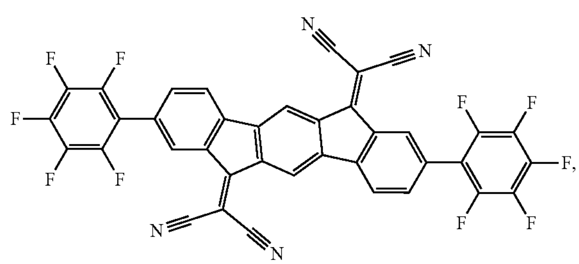
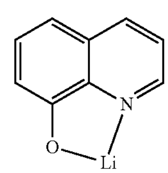
, and
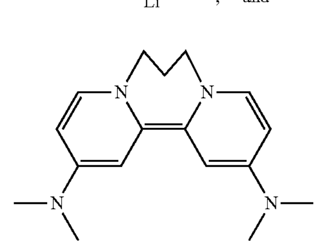

-continued

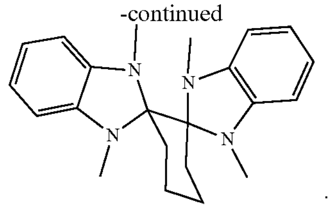

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

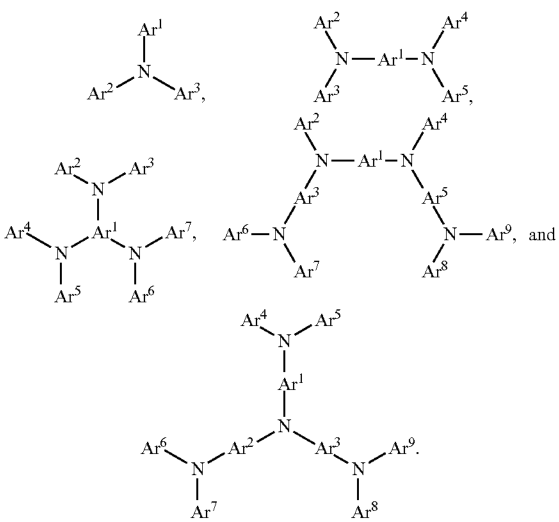

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

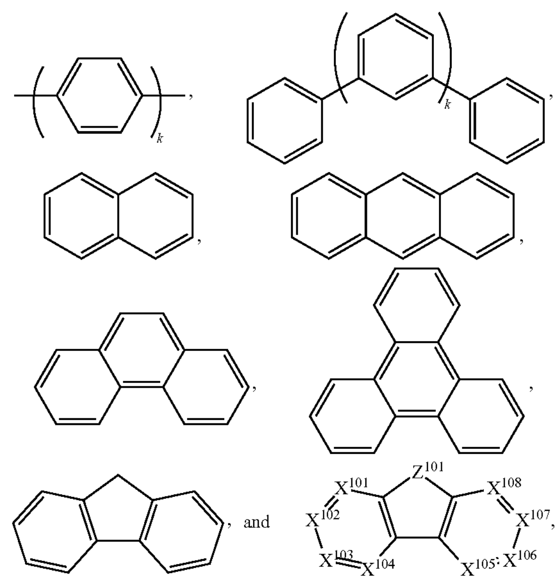

wherein k is an integer from 1 to 20; $X^{111}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

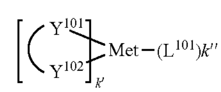

wherein Met is a metal, which can have an atomic weight greater than 40; ($Y^{101}$-$Y^{102}$) is a bidentate ligand, $Y^{111}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

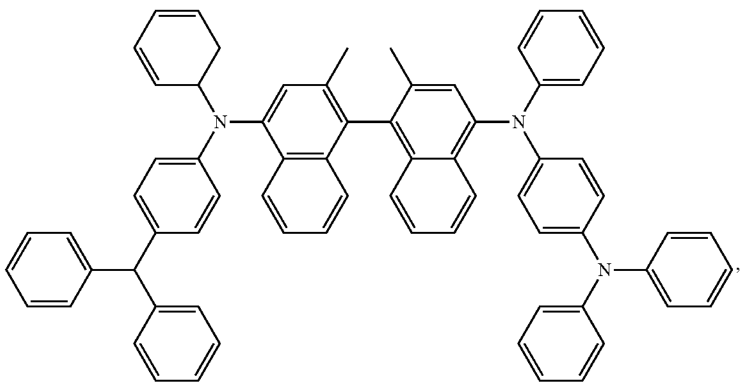

,

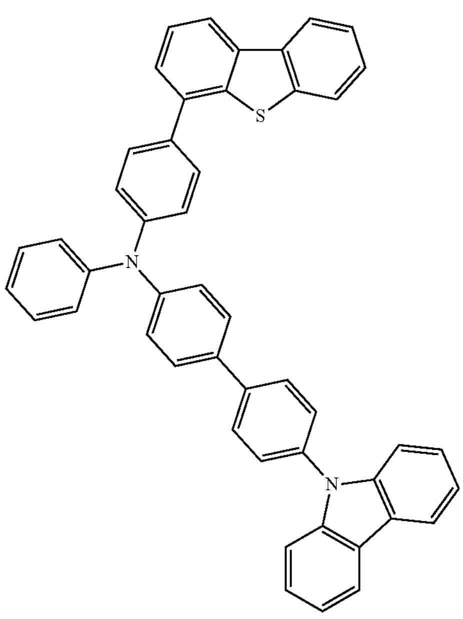

,

-continued
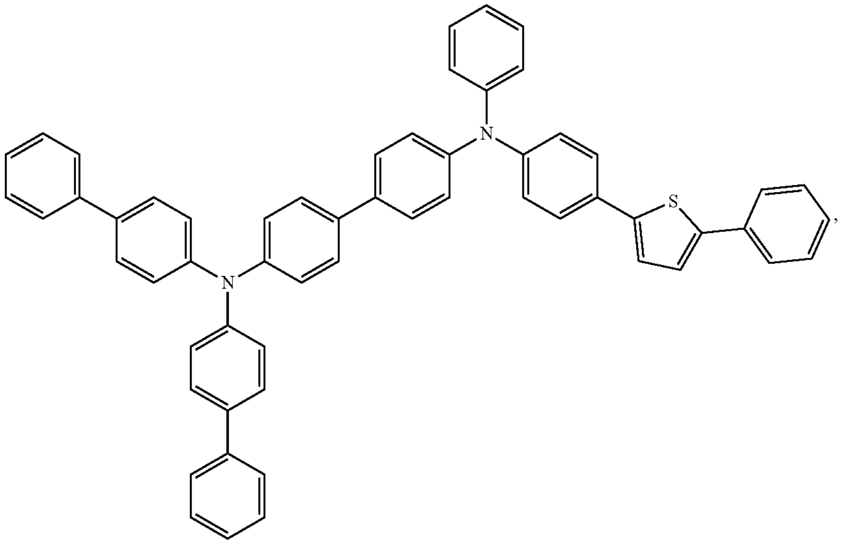,
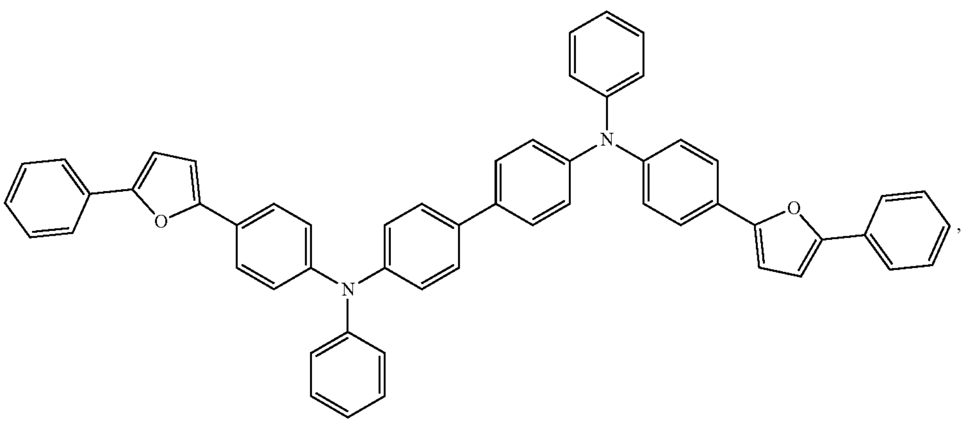,
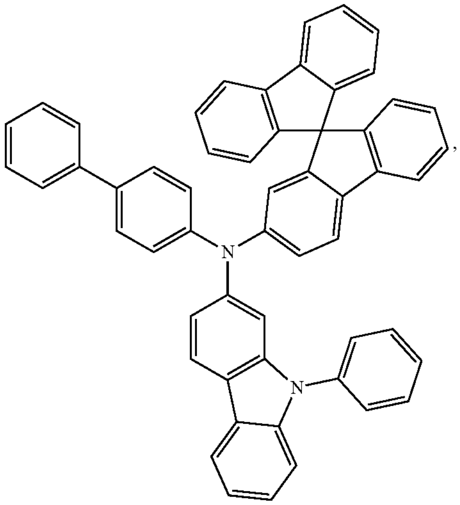,
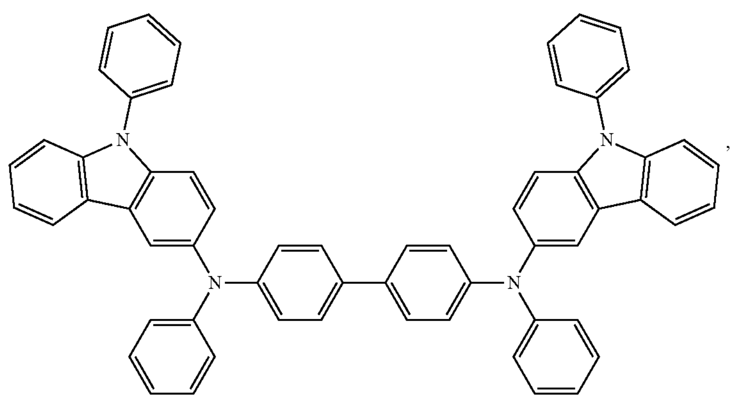,

-continued
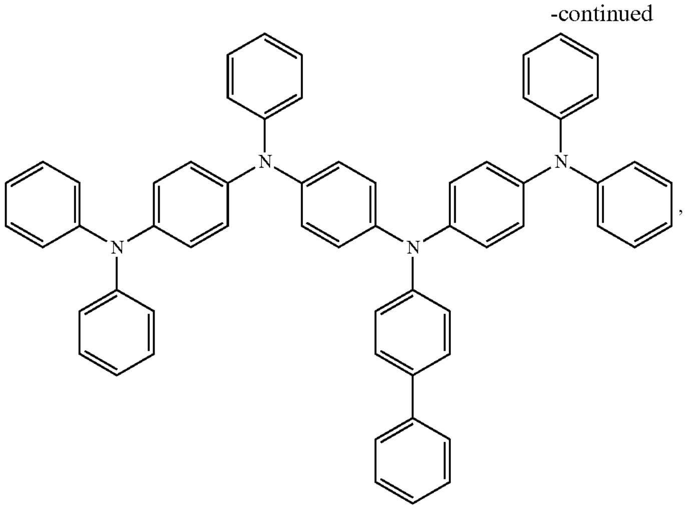
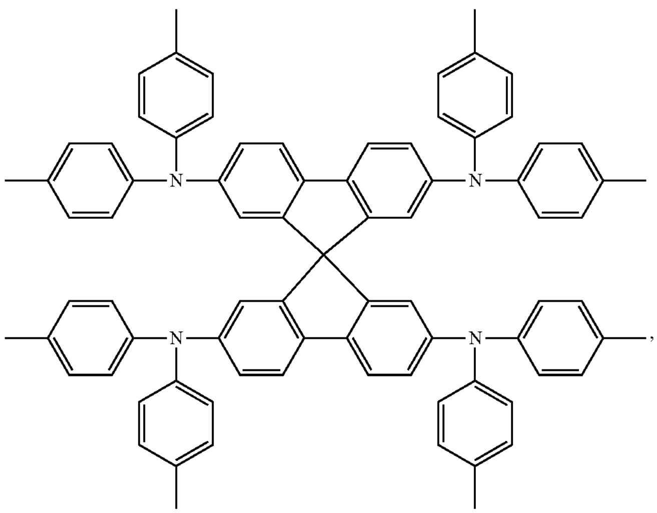
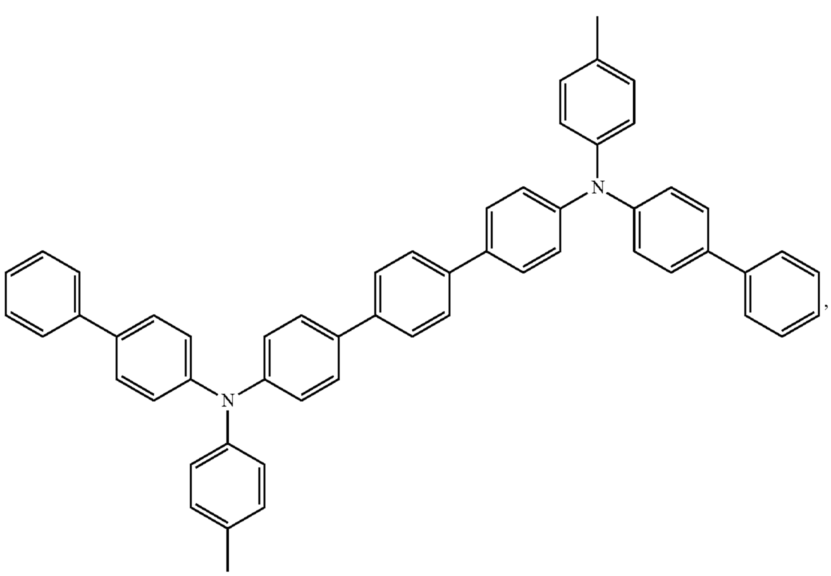

-continued
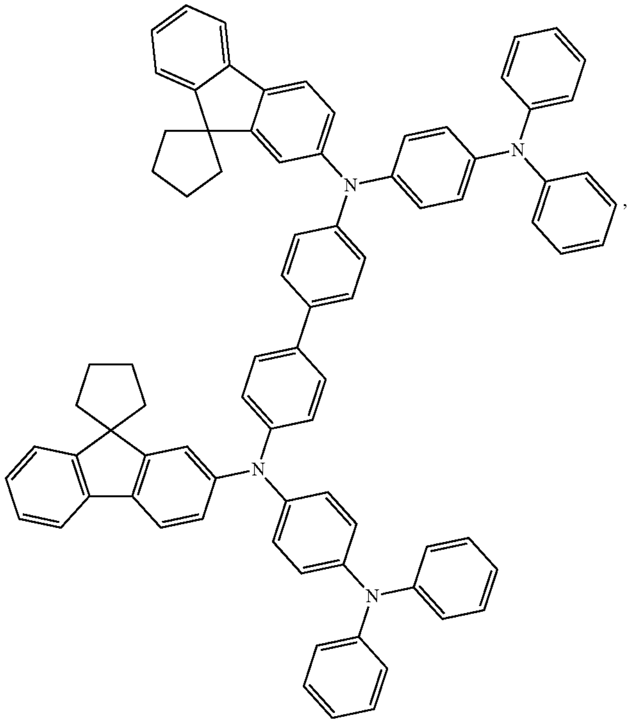
,
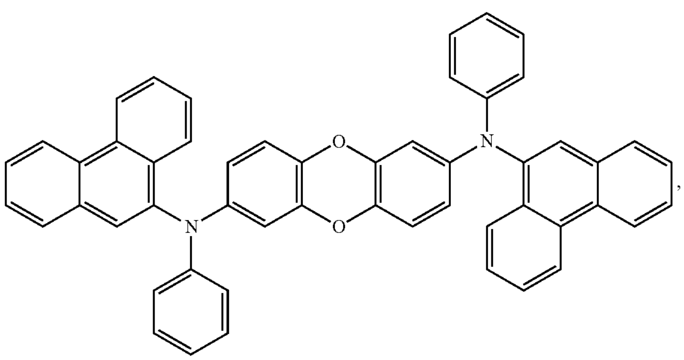
,
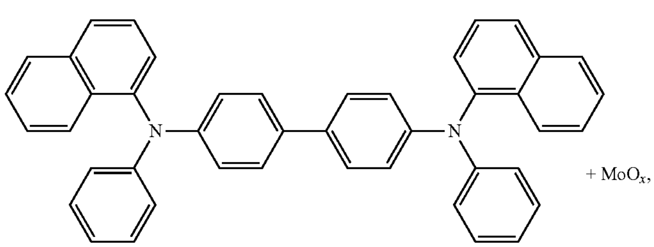
+ $MoO_x$,

-continued
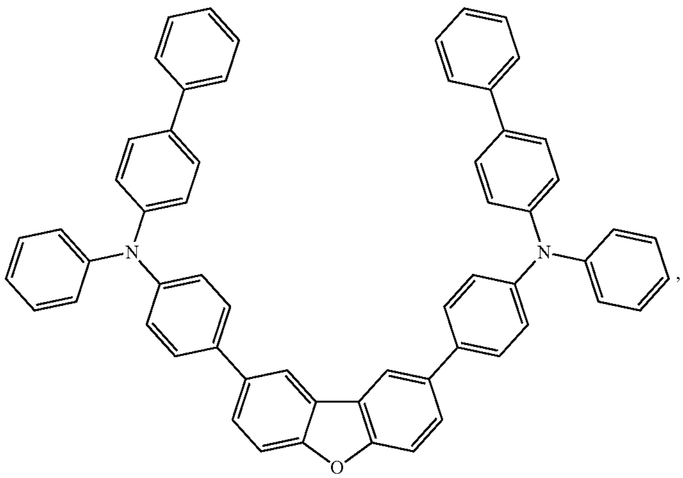
,
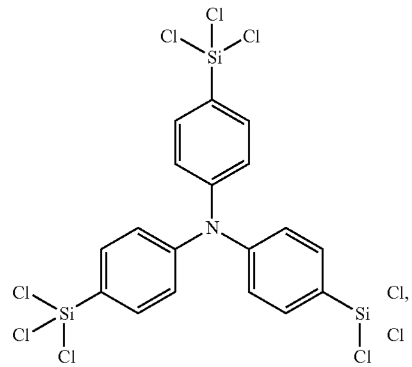
,
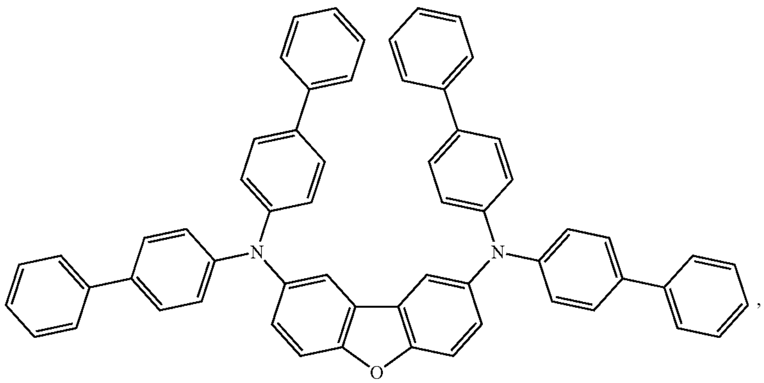
,
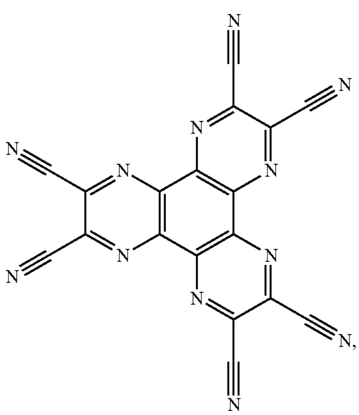
,
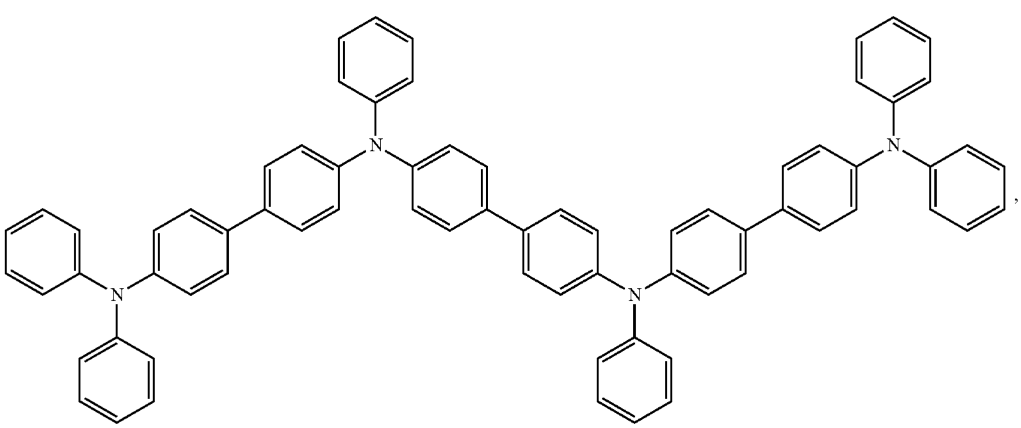
, -continued
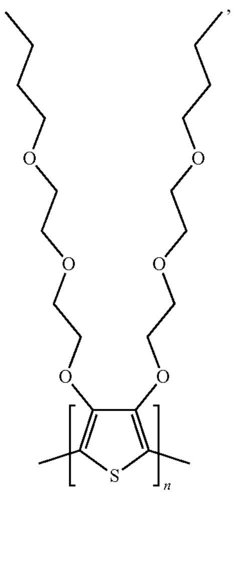
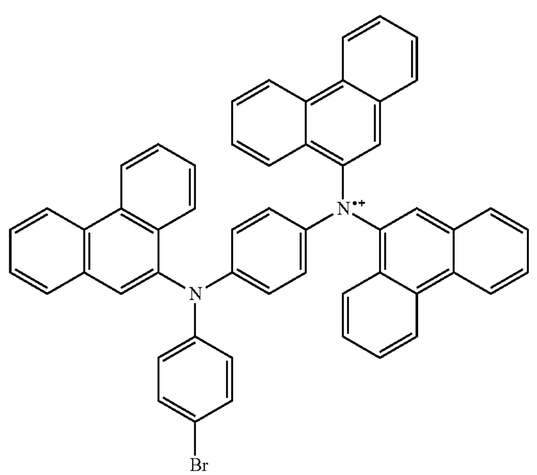
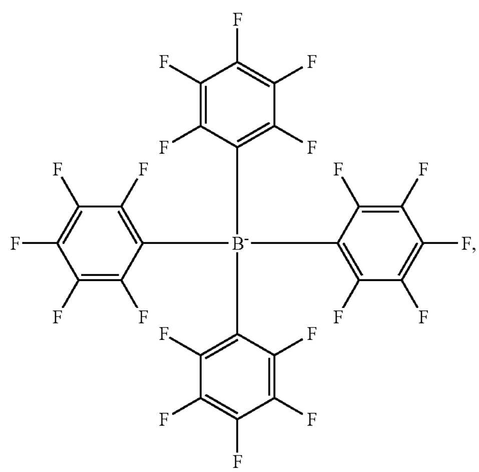
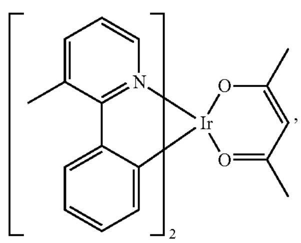
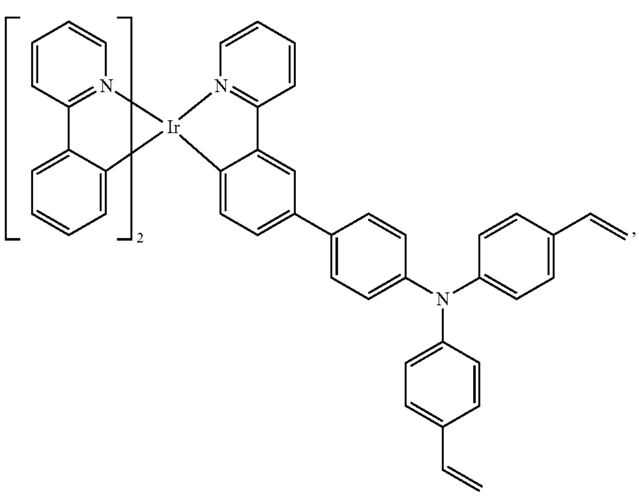

-continued
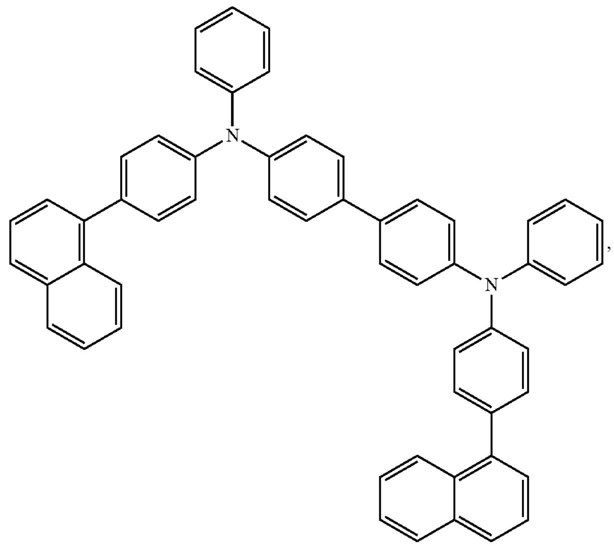
,
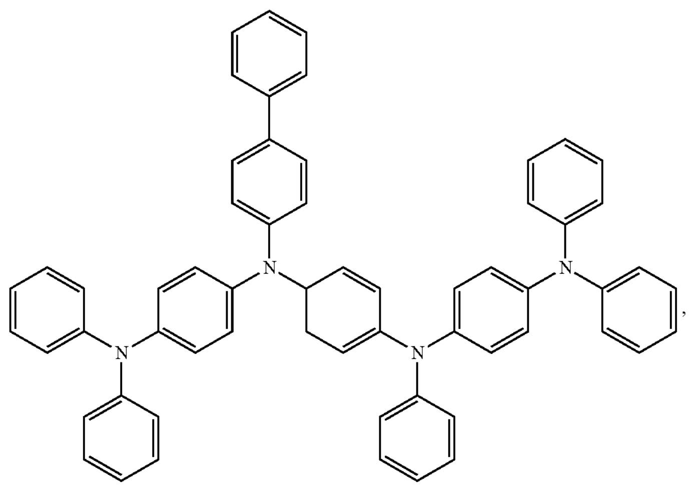
,
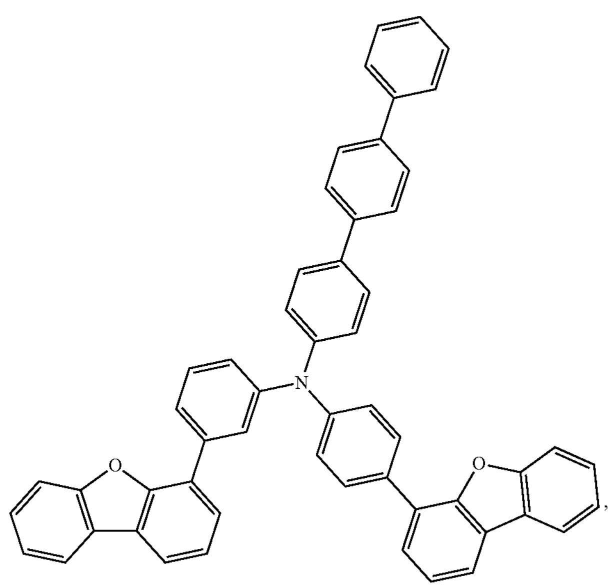
,

-continued
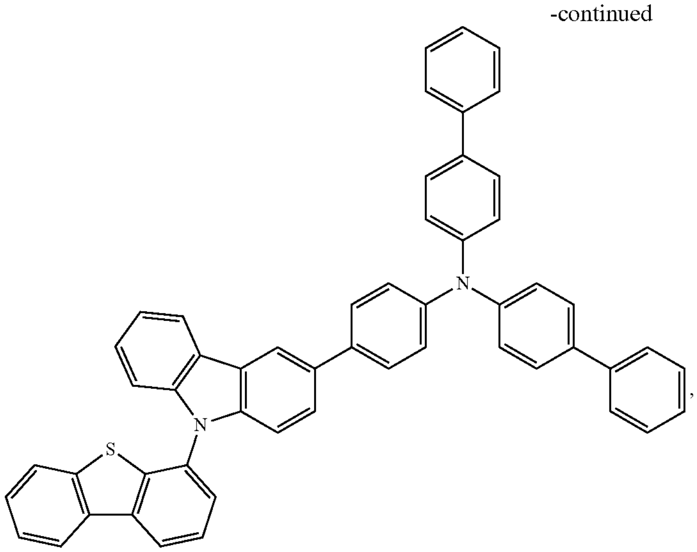
,
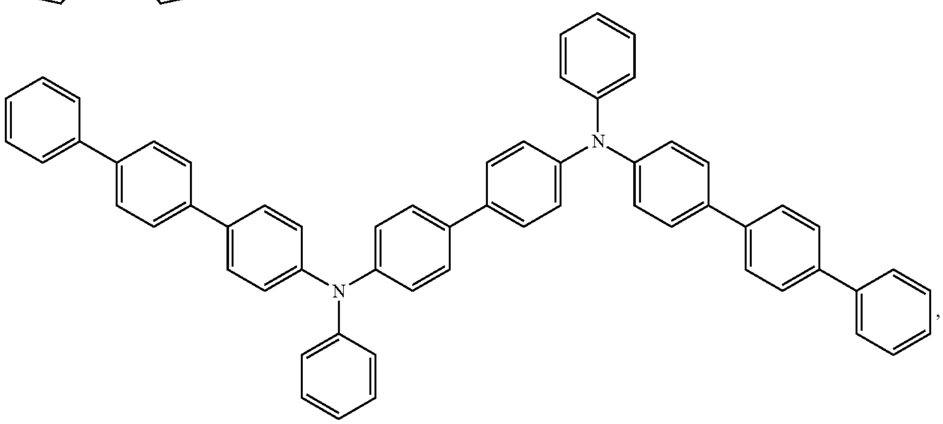
,
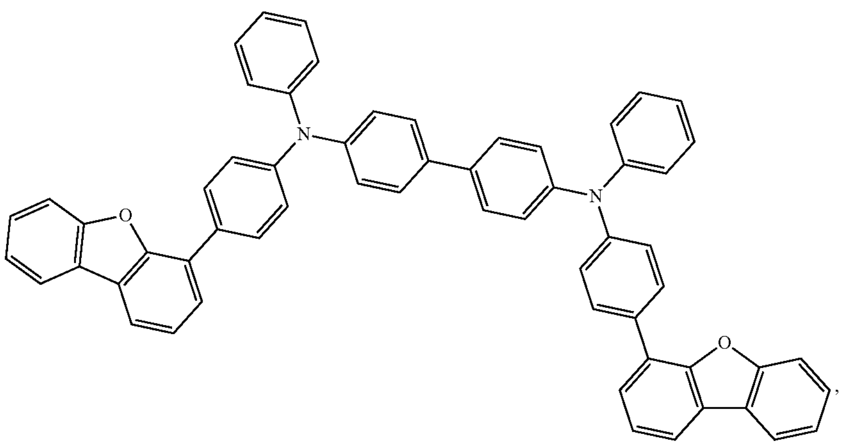
,
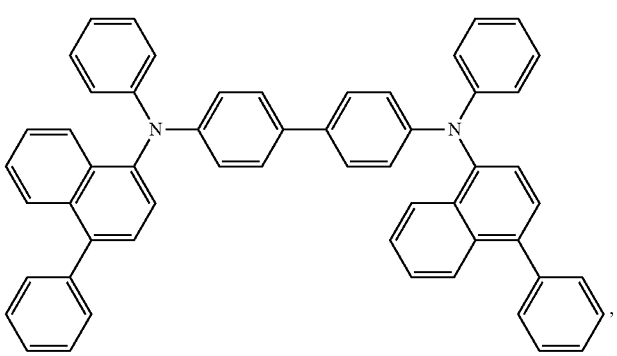
,

-continued
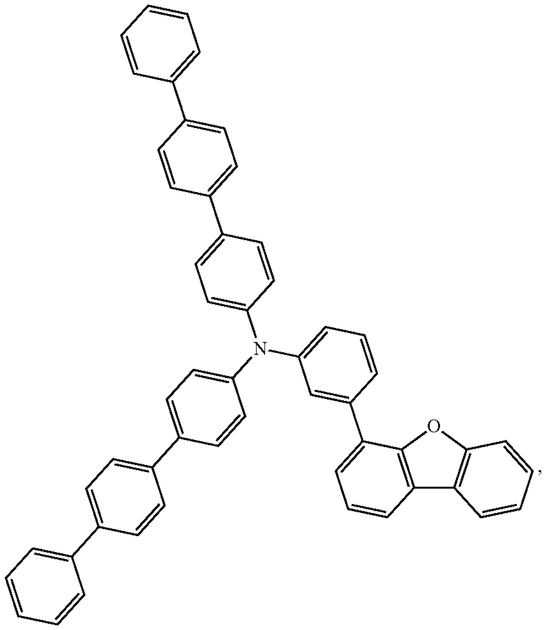,
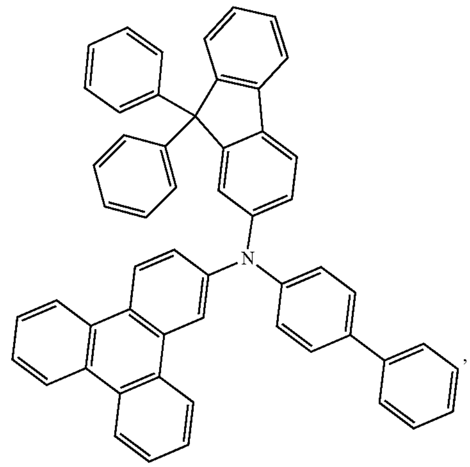,
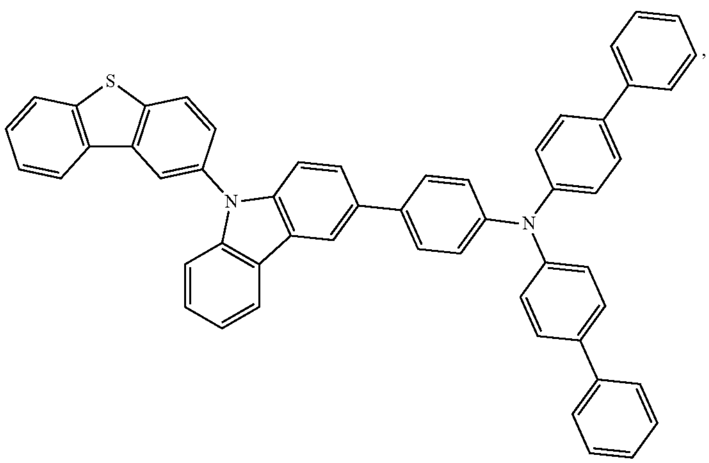,
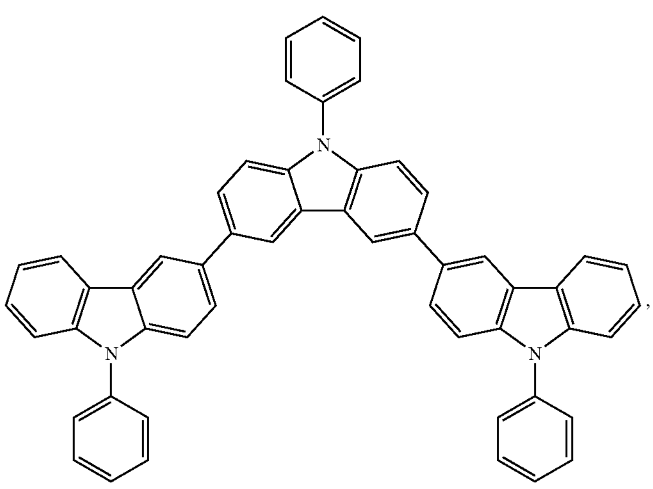,
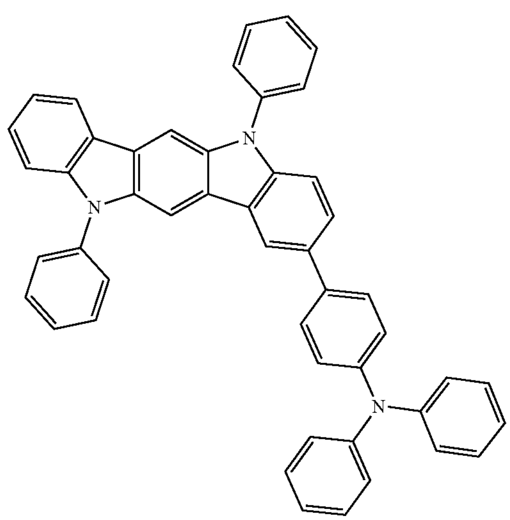,

-continued
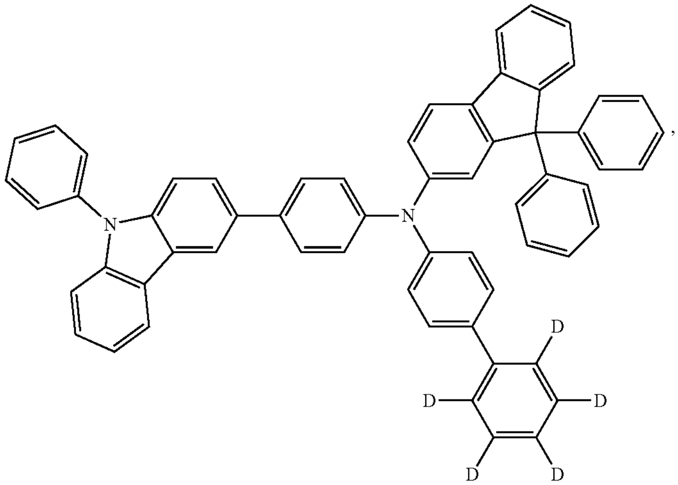
,
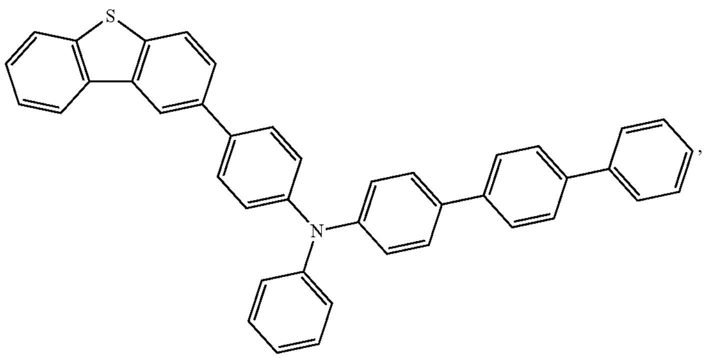
,
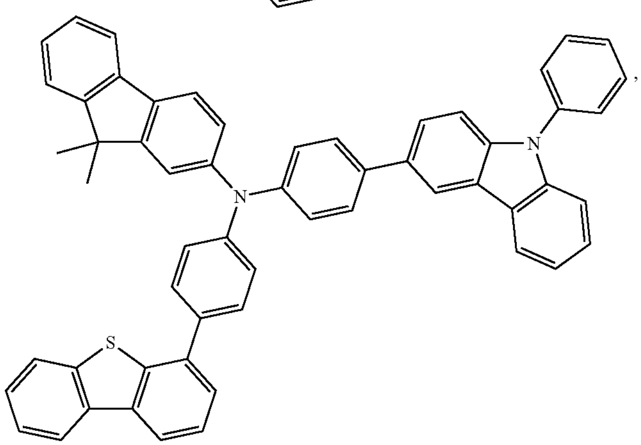
,
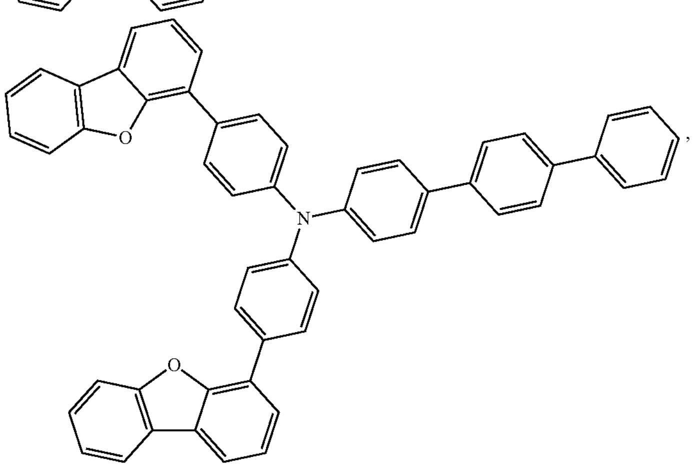
,

-continued
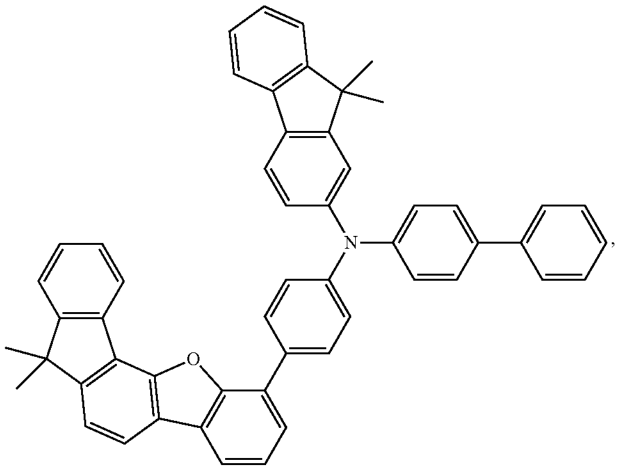
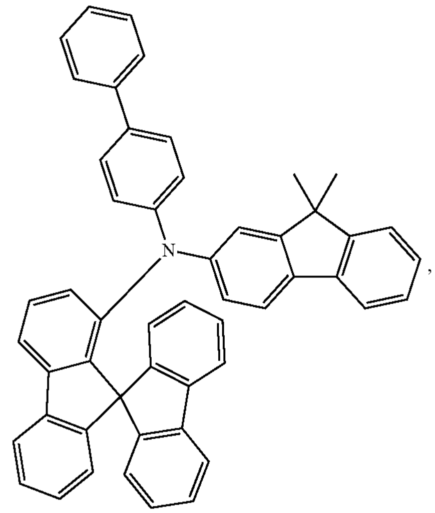
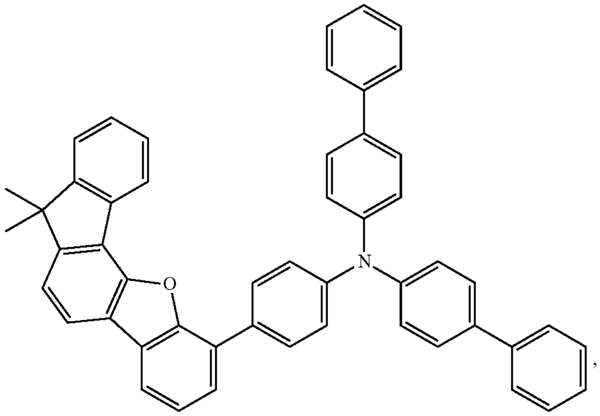
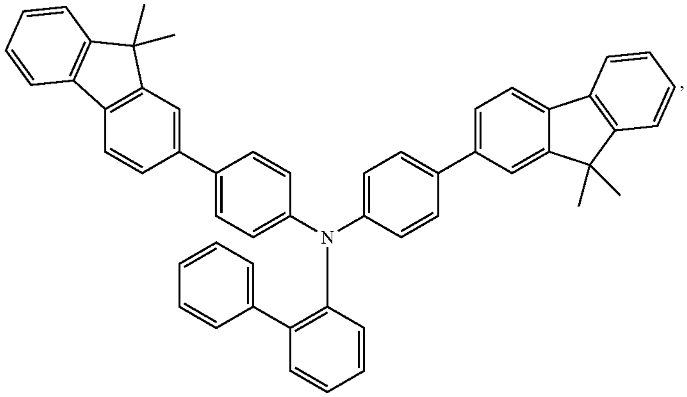

-continued
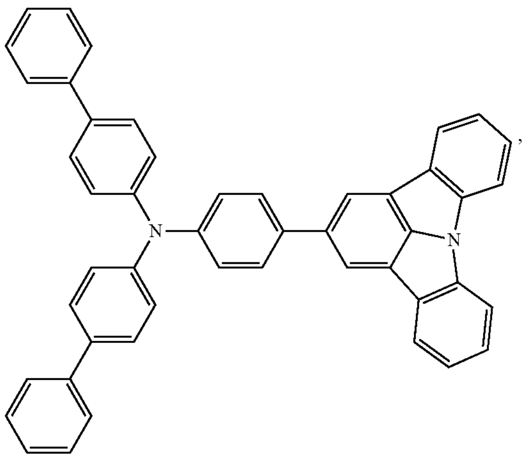
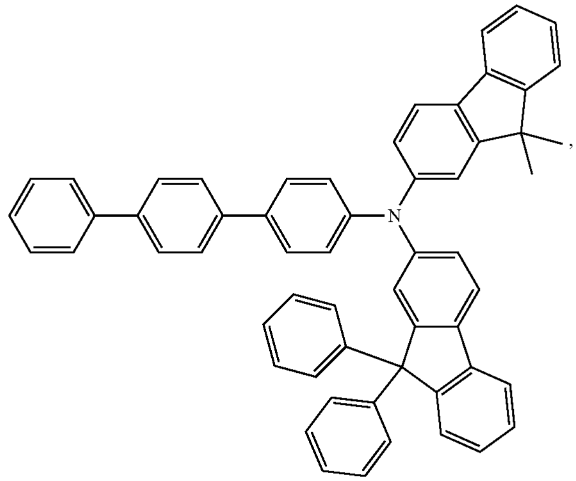
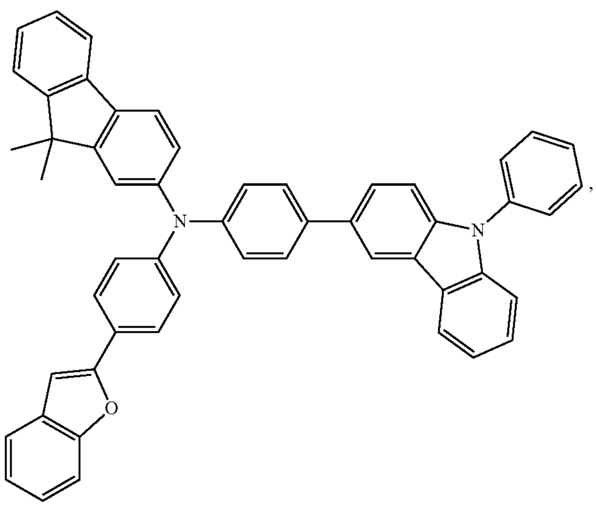
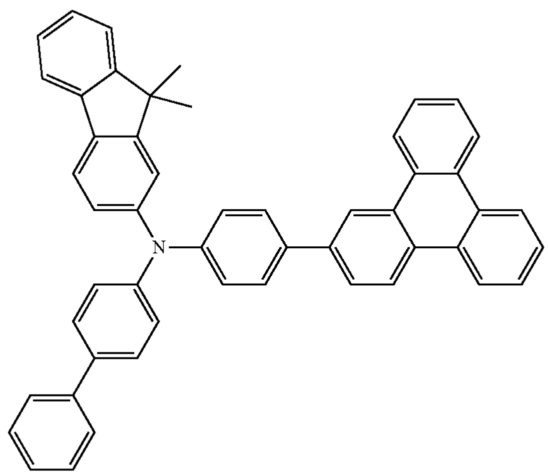
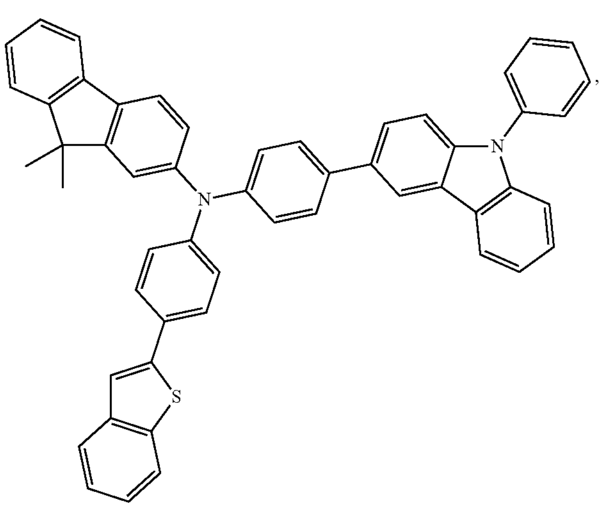

-continued
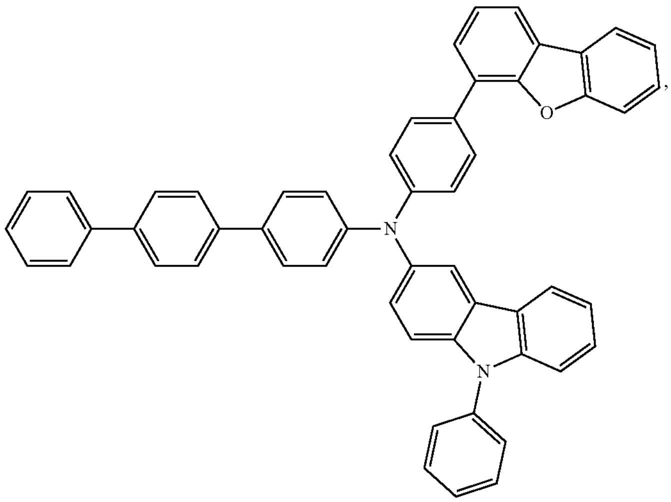
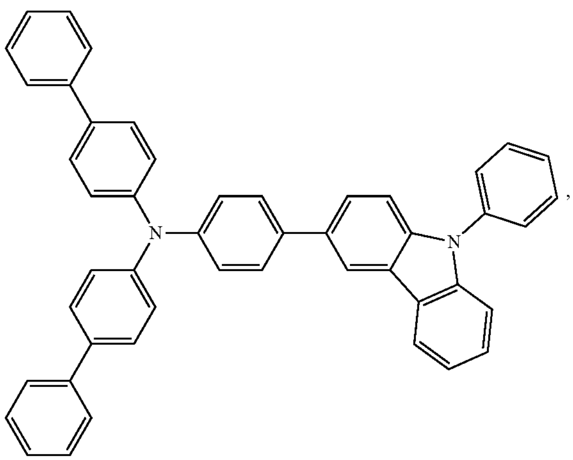
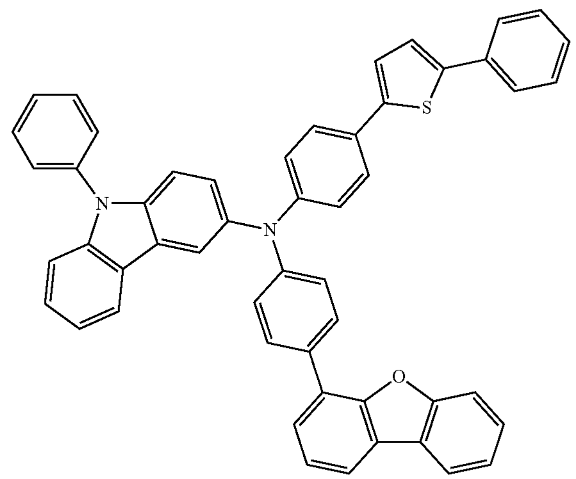
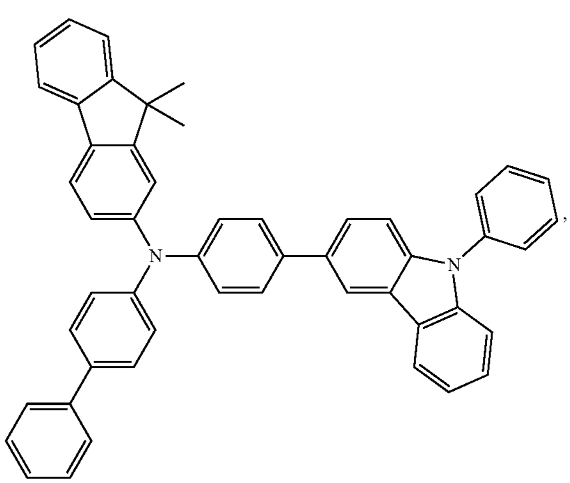
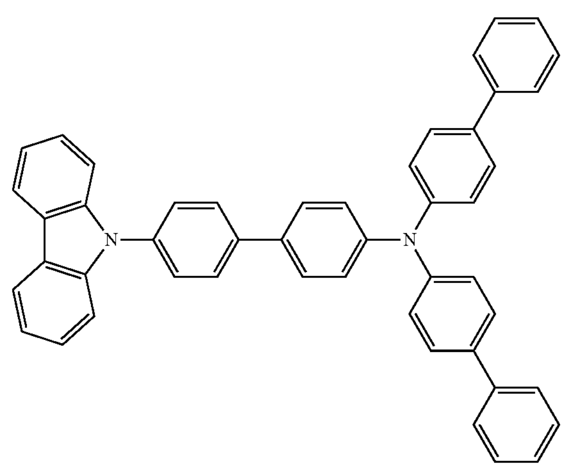

-continued
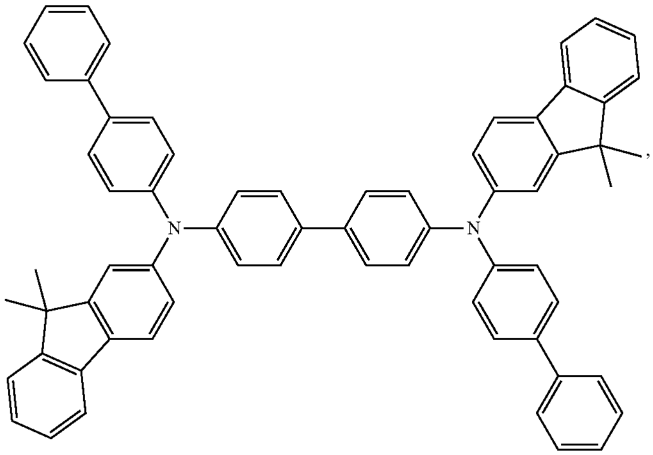
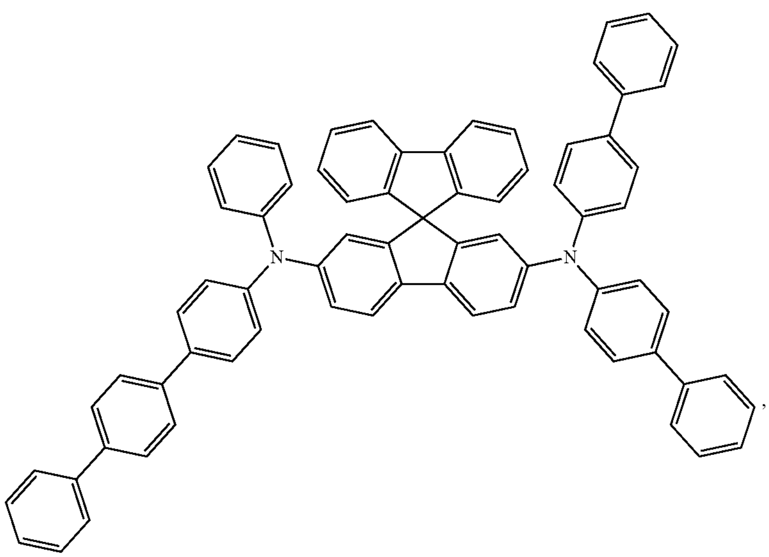
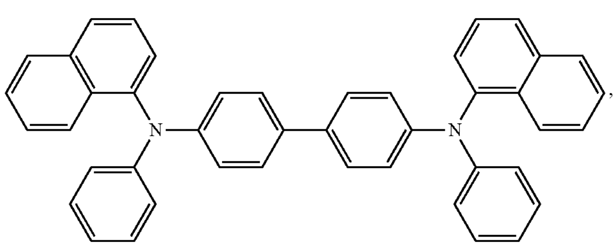
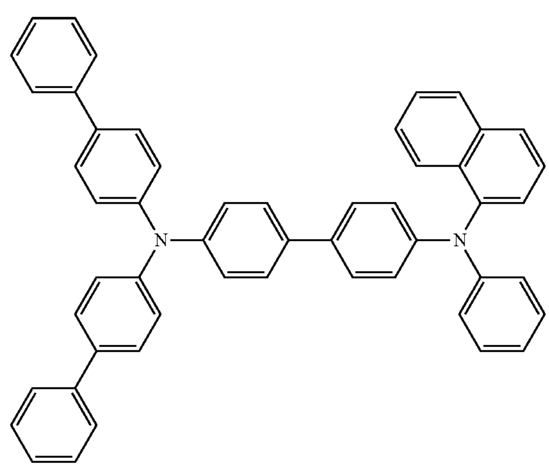

-continued
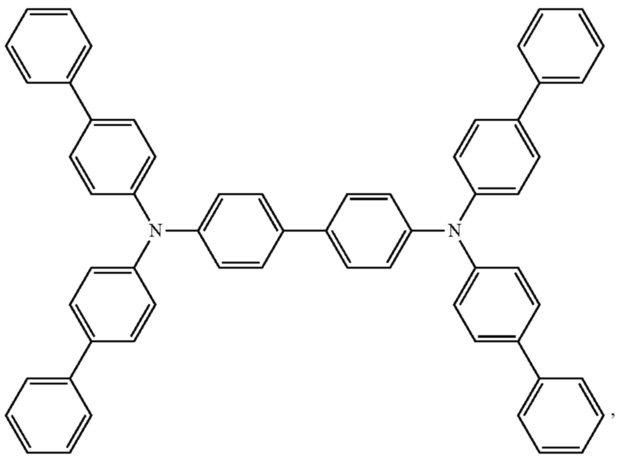
,
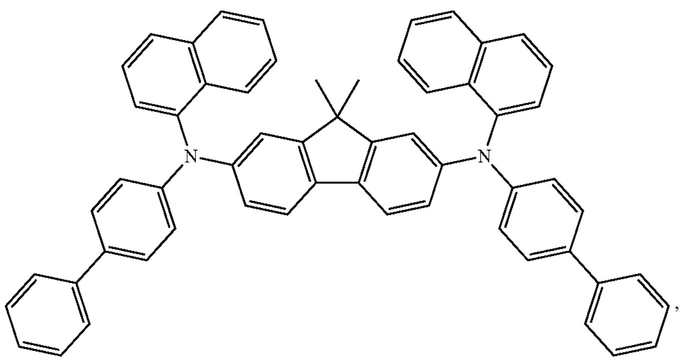
,
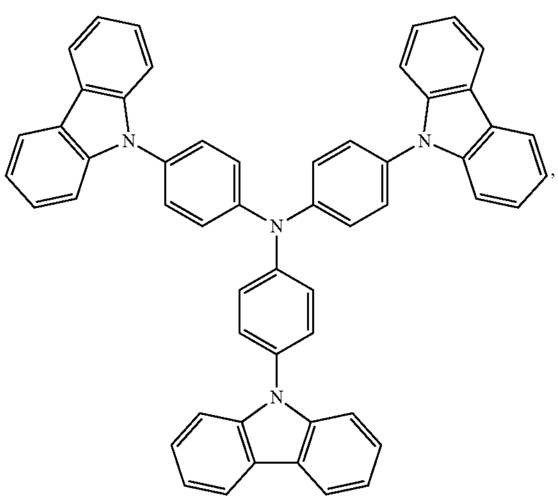
,
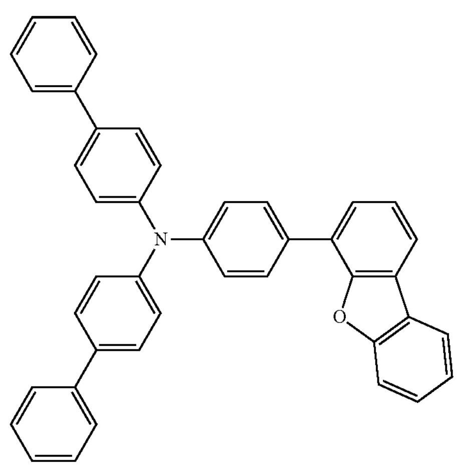
,

-continued

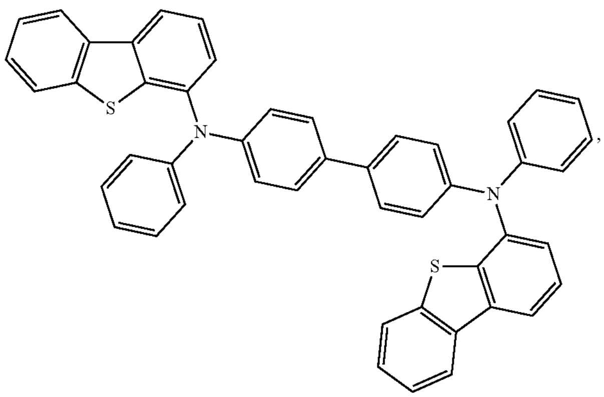,

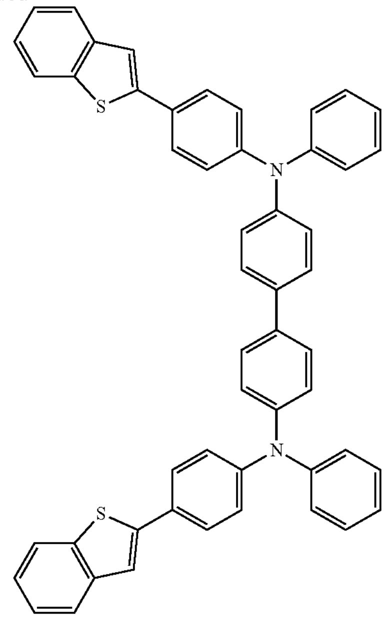, and

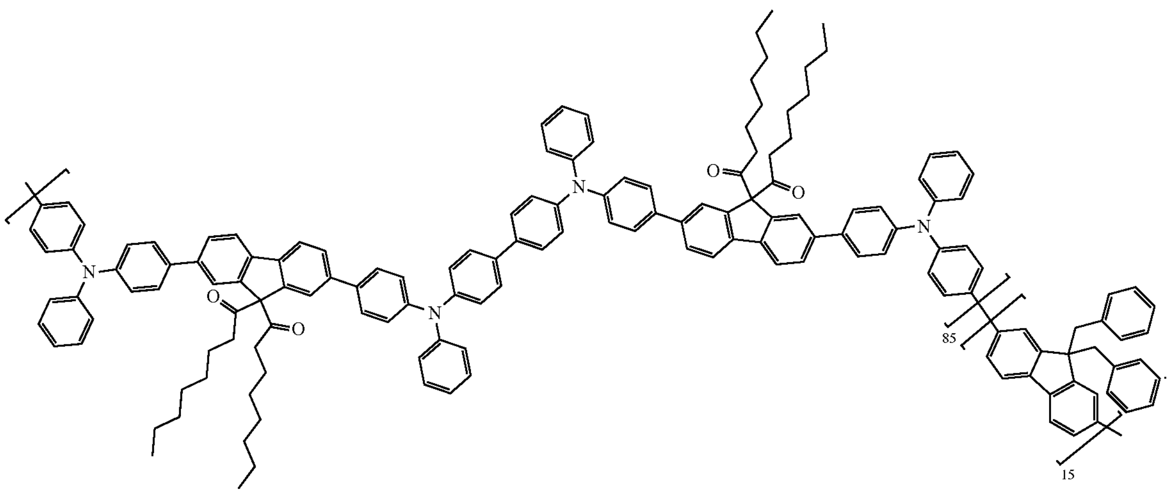.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

$$\left[\left(\begin{matrix} Y^{103} \\ Y^{104} \end{matrix}\right)\right]_{k'} \text{Met} - (L^{101})_{k''}$$

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

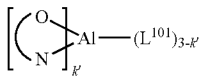 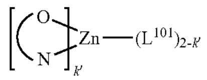

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

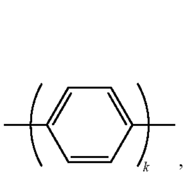, 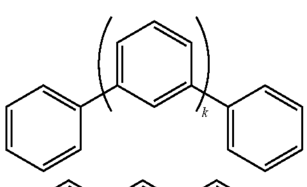,

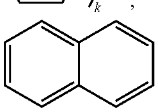, 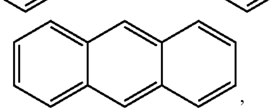,

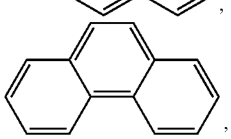, 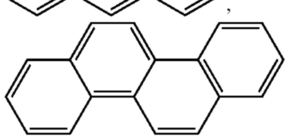,

-continued

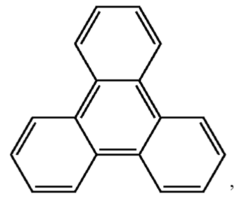, 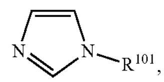, 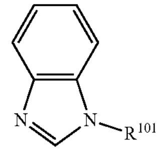,

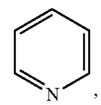, 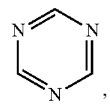, 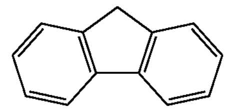,

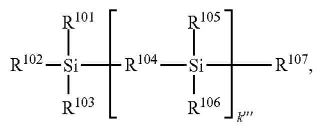

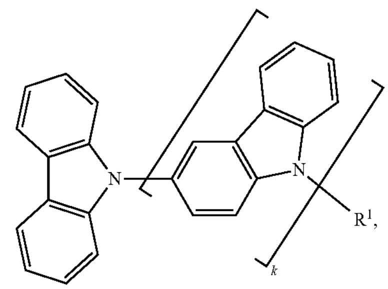

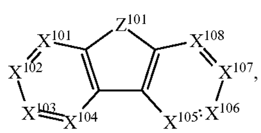

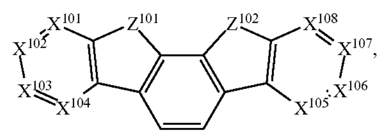

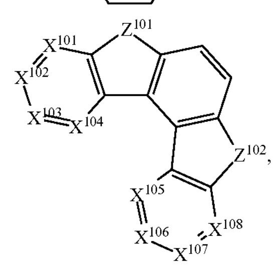

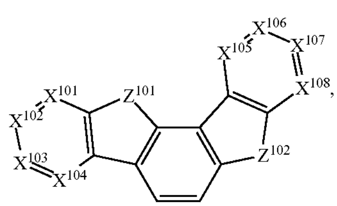

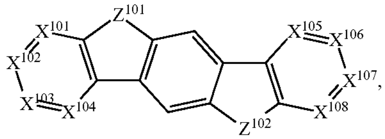 and

-continued

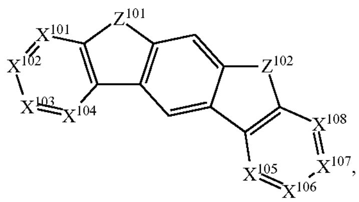

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

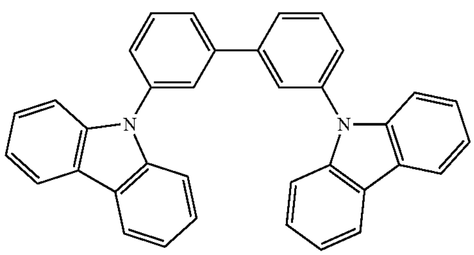,

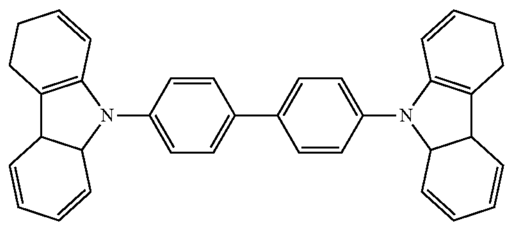,

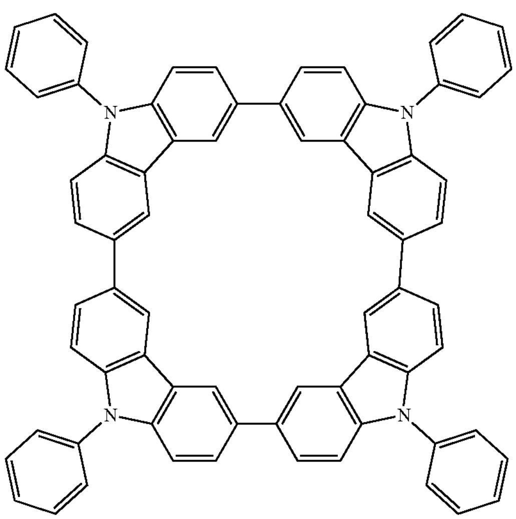,

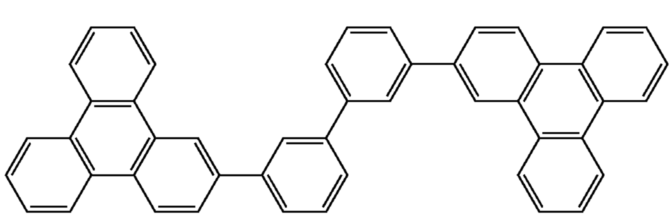,

-continued
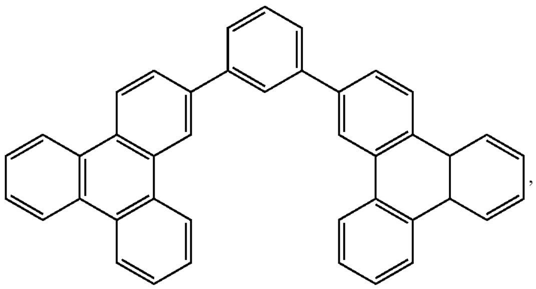
,
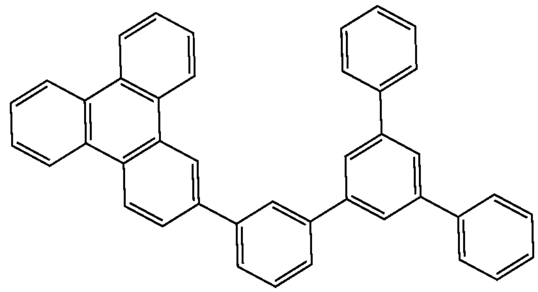
,
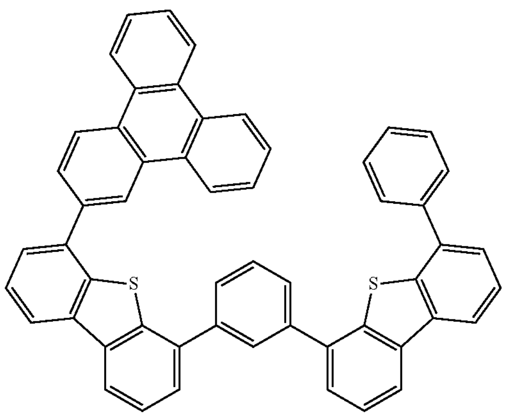
,
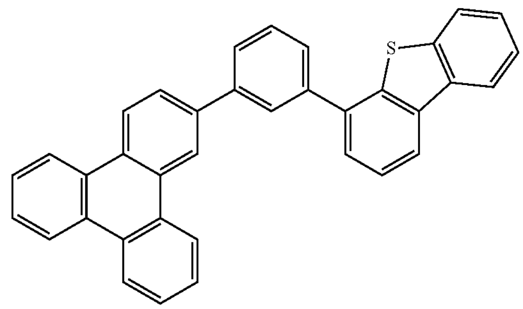
,
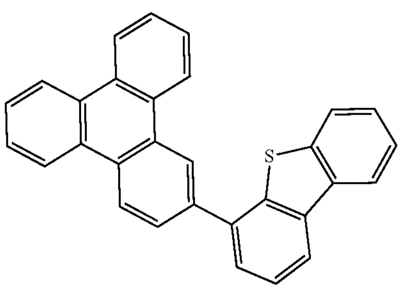
,
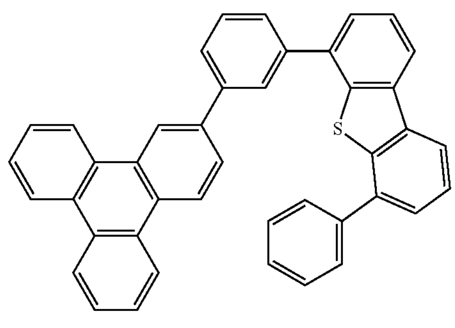
,
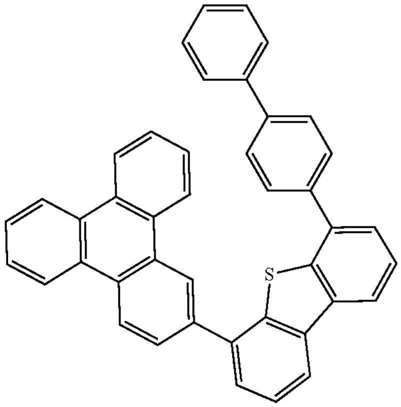
,
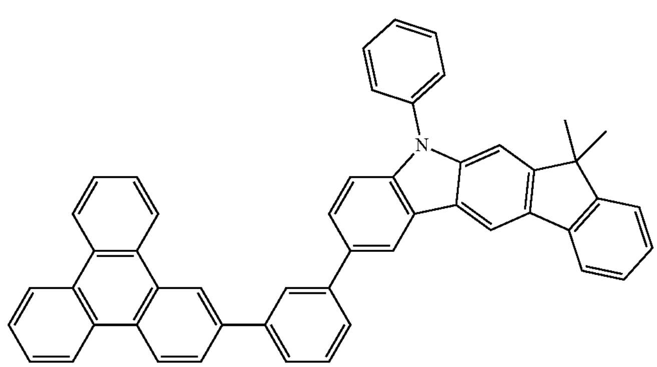
, -continued
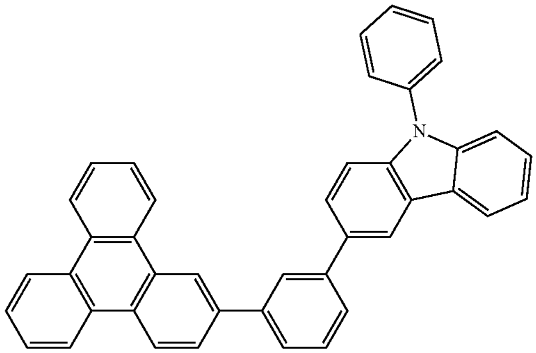
,
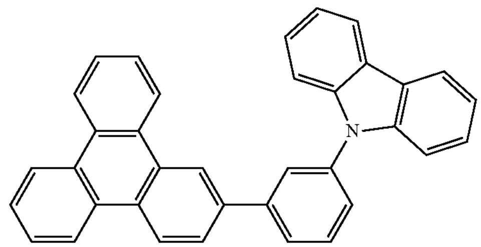
,
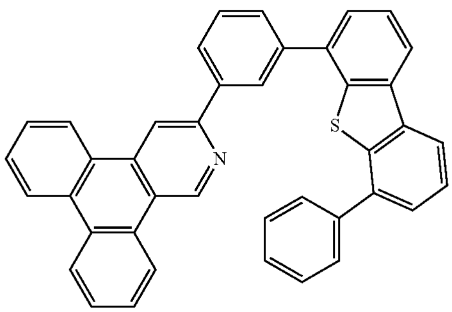
,
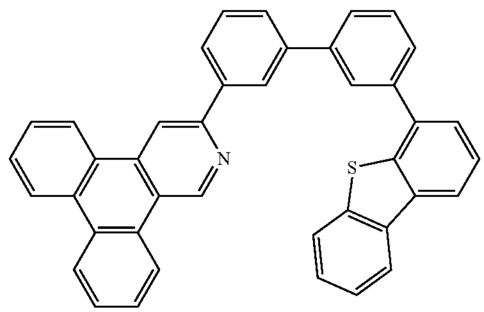
,
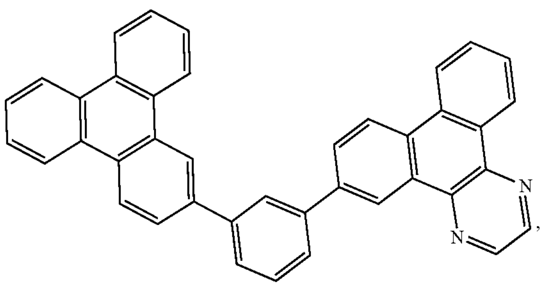
,
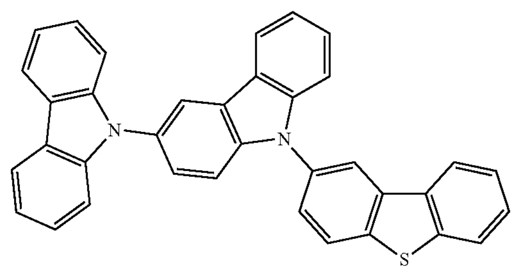
,
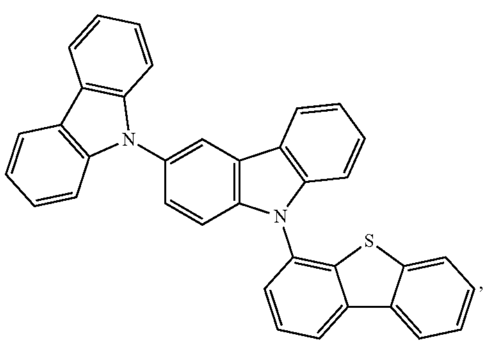
,
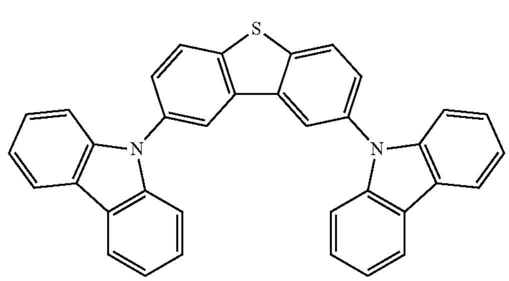
,
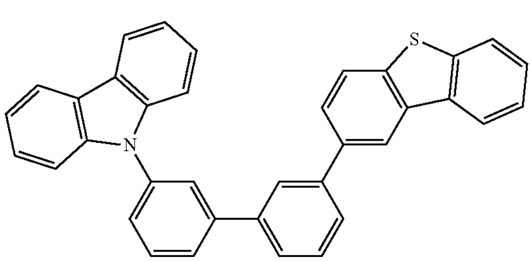
,
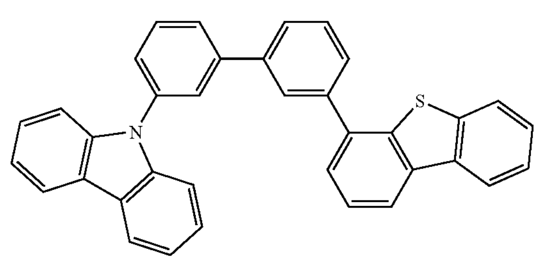
, -continued
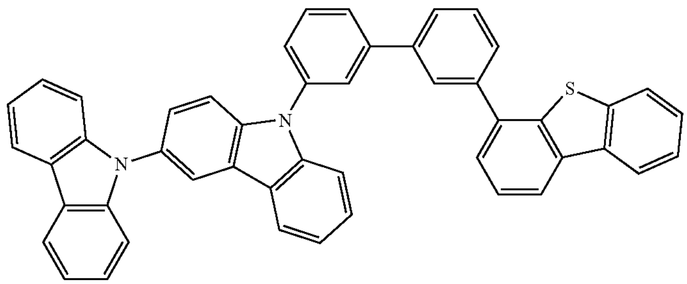
,
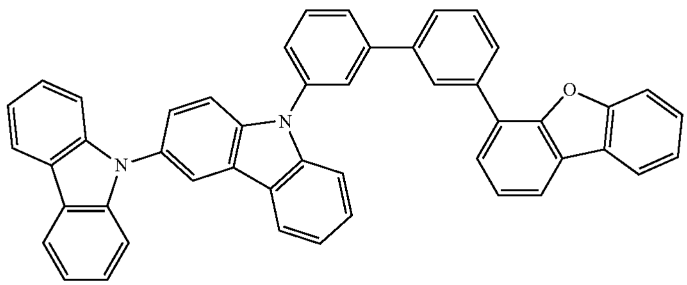
,
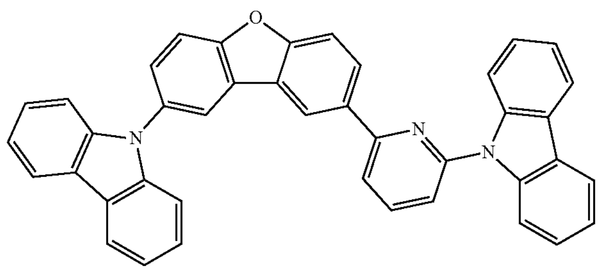
,
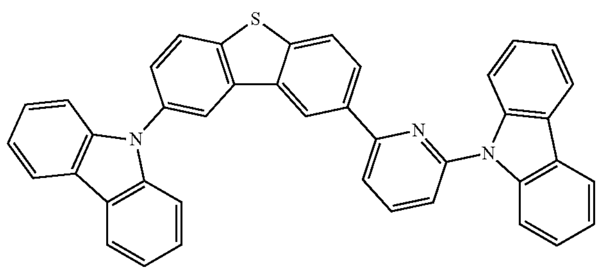
,
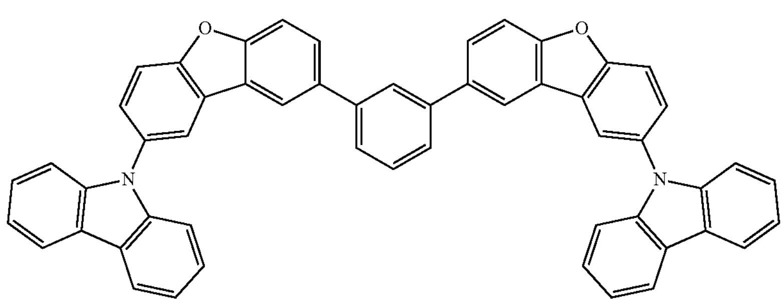
,
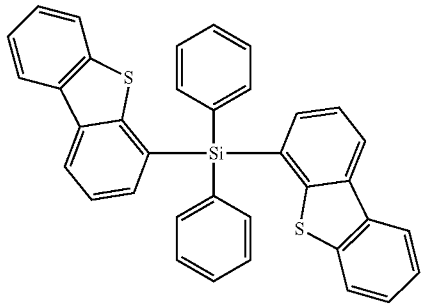
,
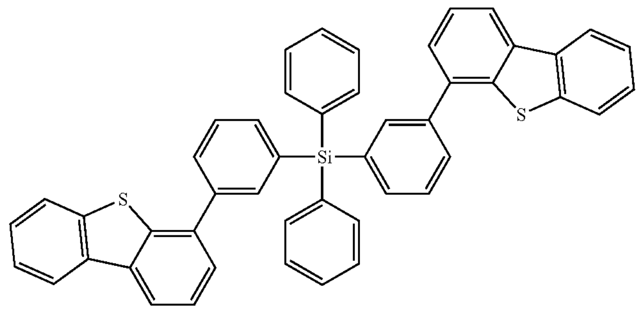
, -continued
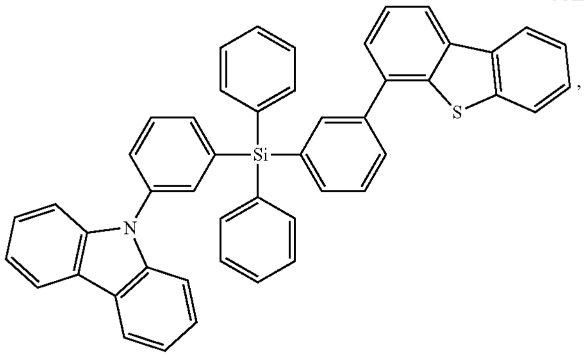
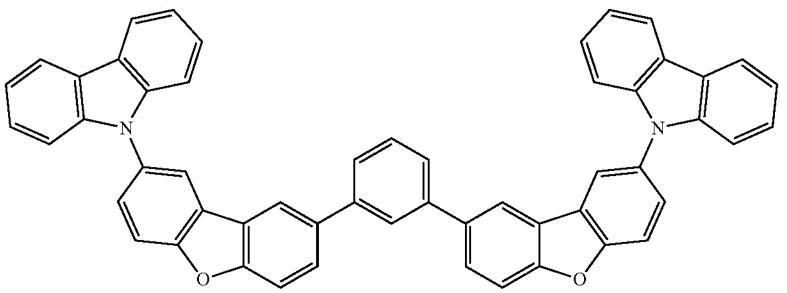
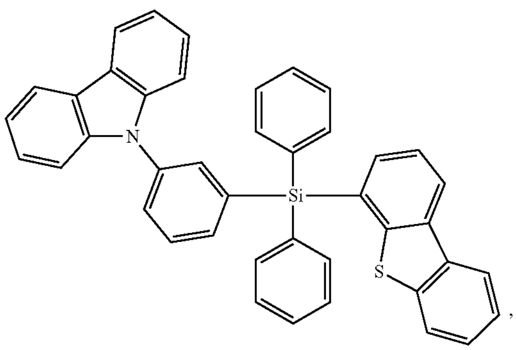
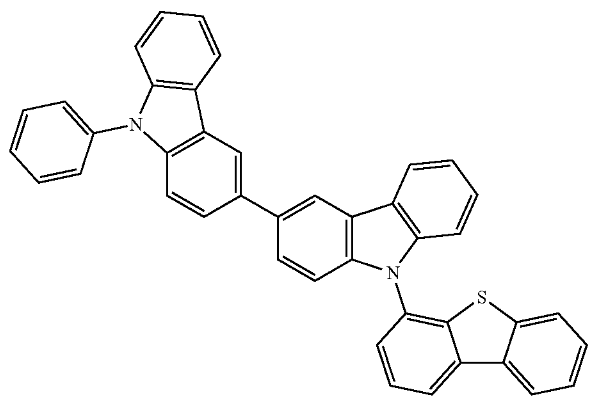
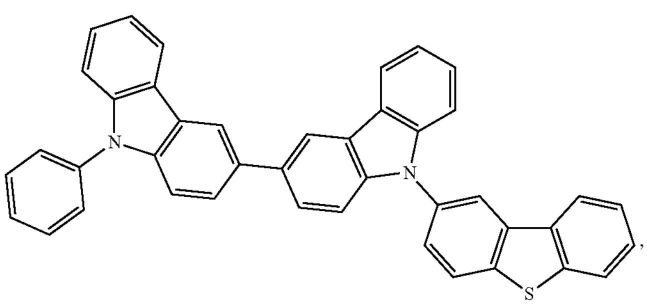
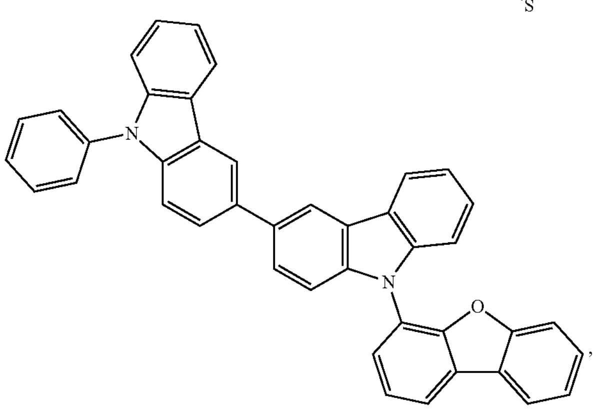

-continued
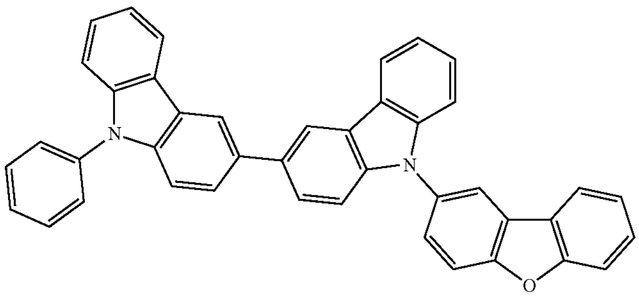
,
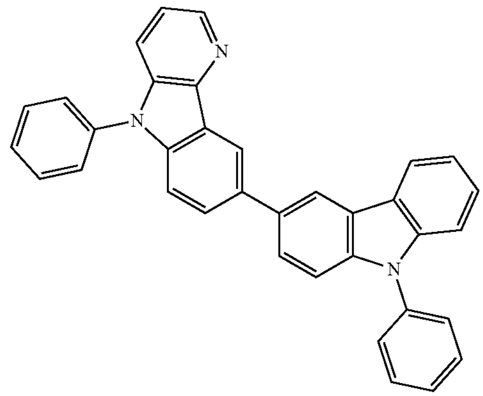
,
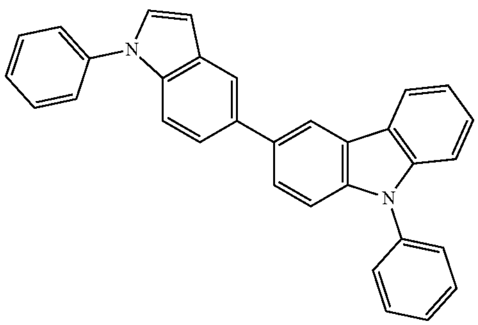
,
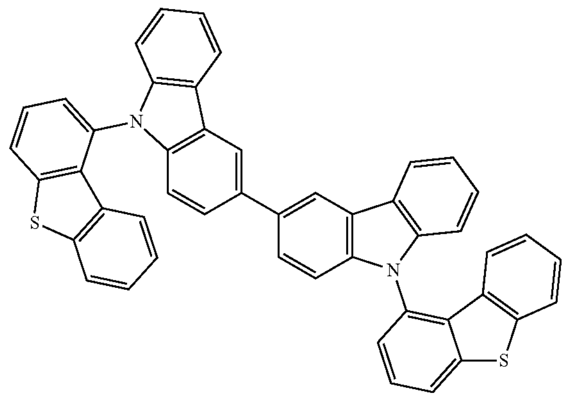
,
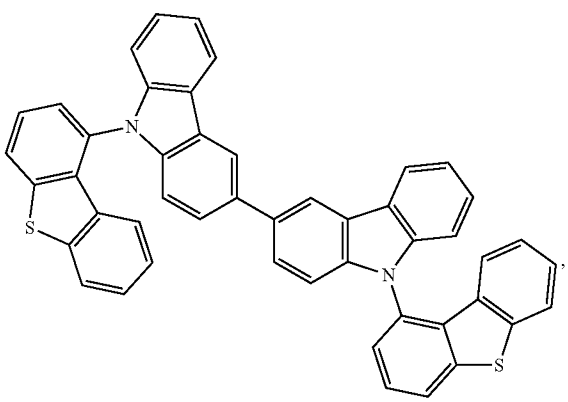
,
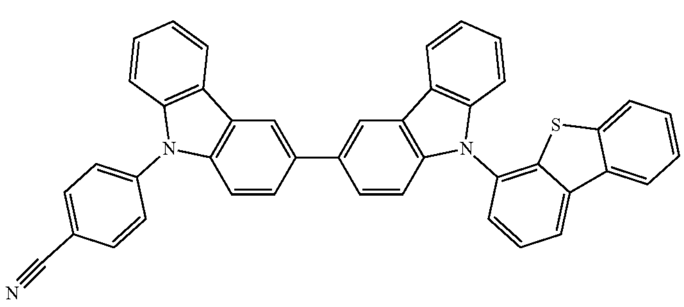
, -continued
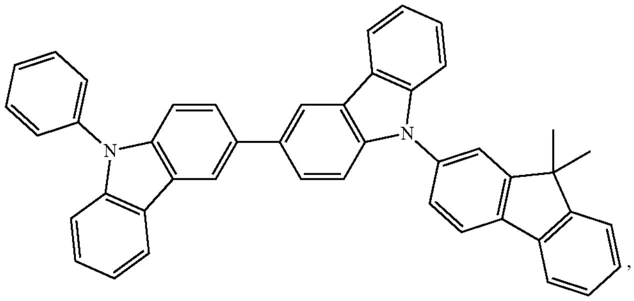
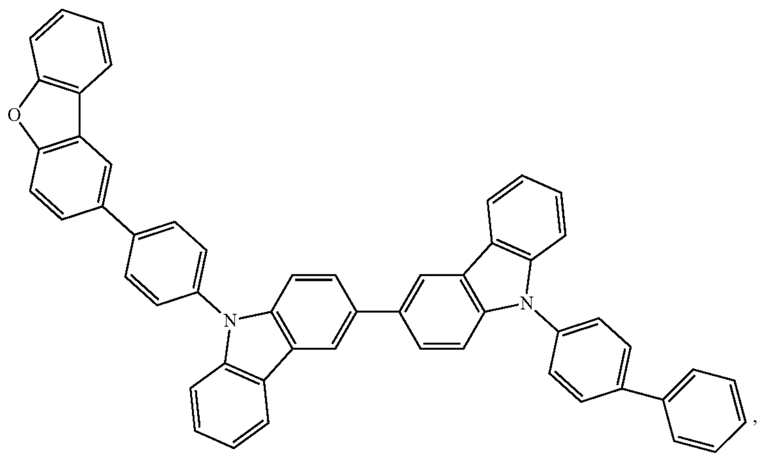
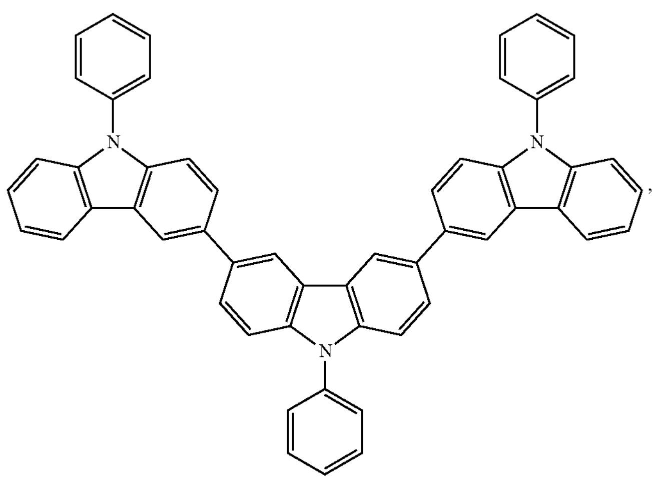
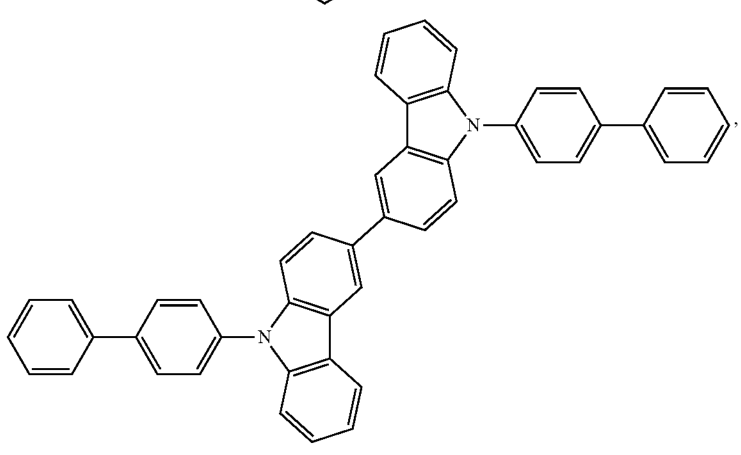

-continued
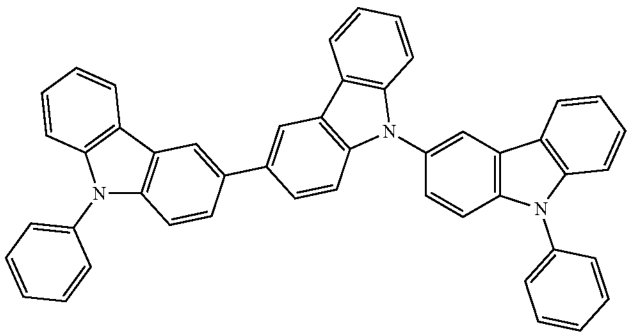
,
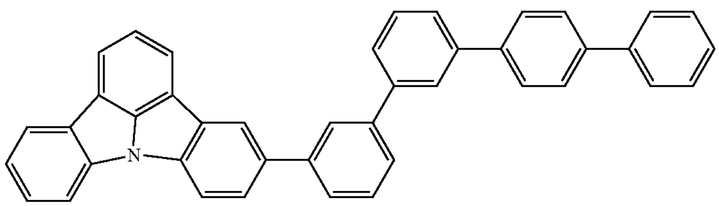
,
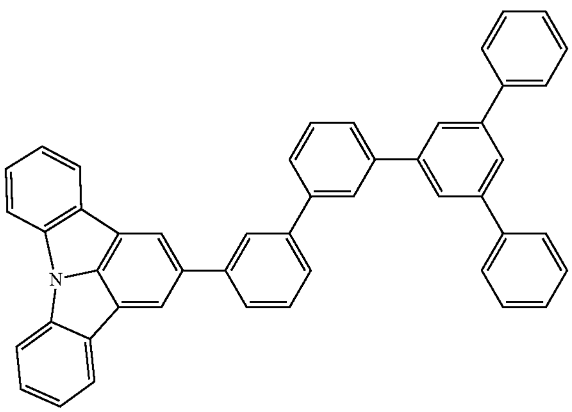
,
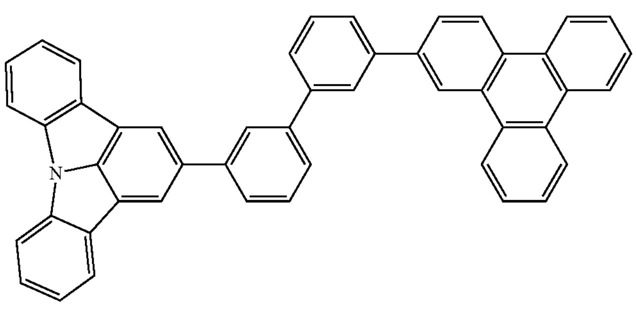
,
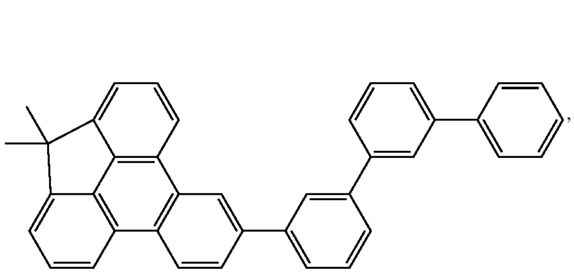
,
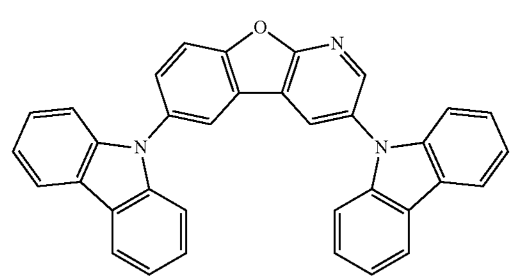
, -continued
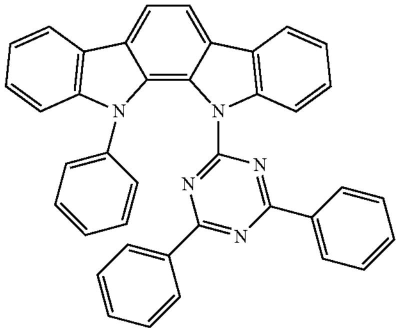,
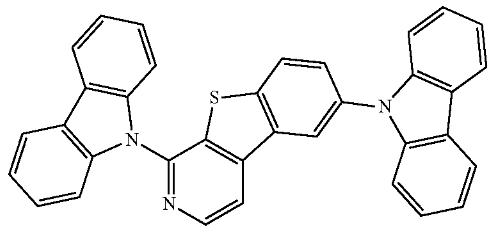,
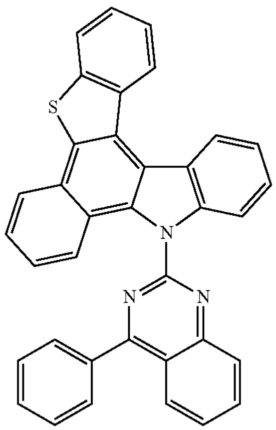,
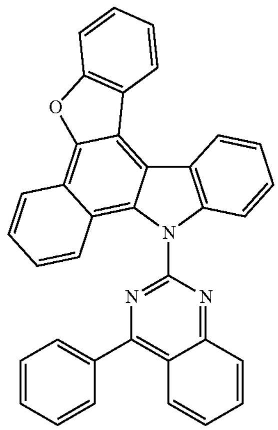,
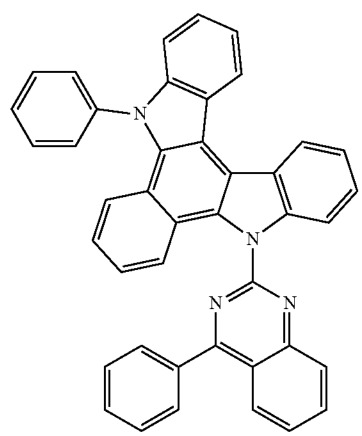,
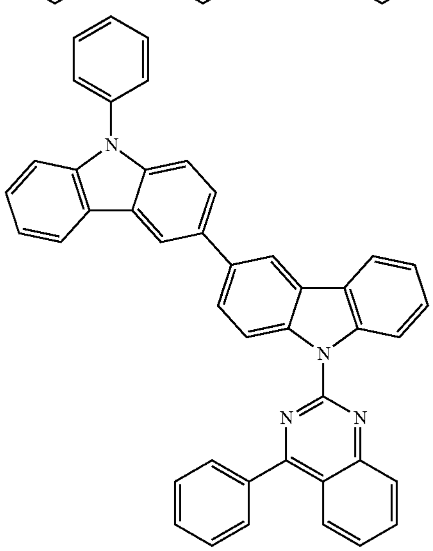,
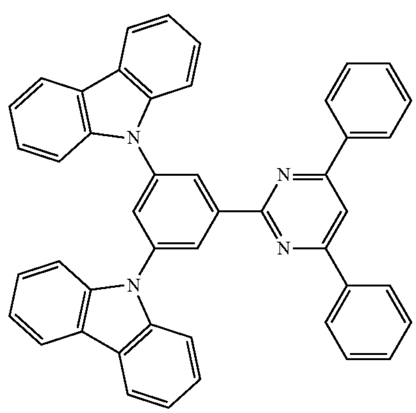,
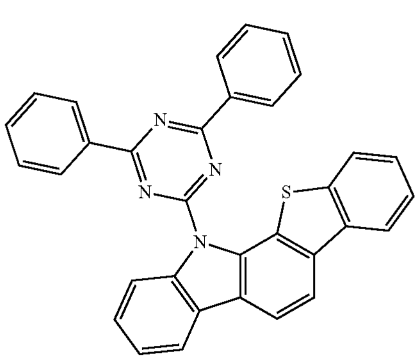,
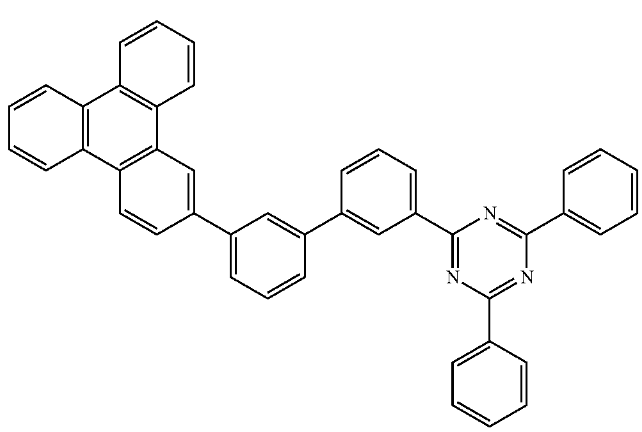, -continued
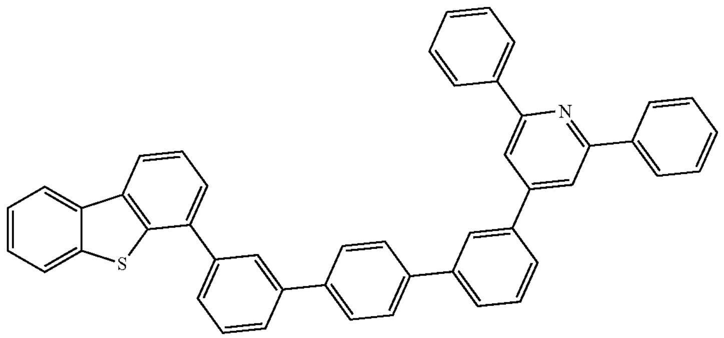
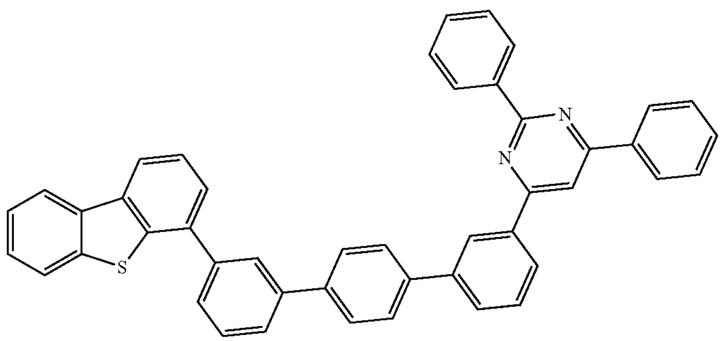
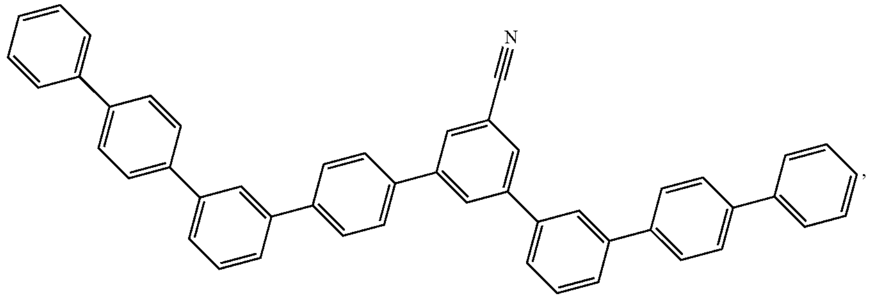
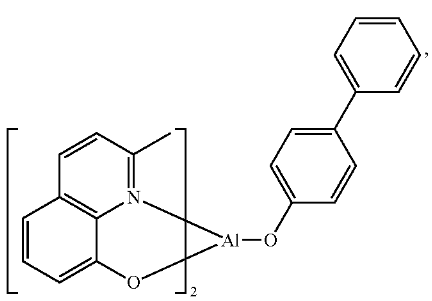
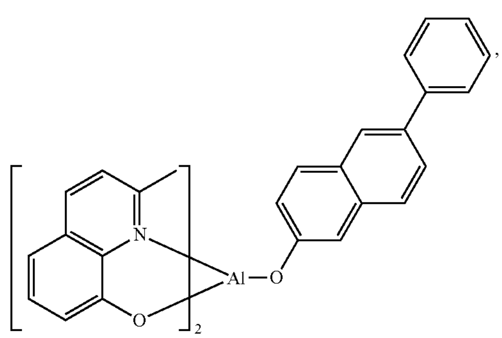
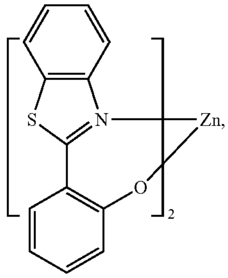
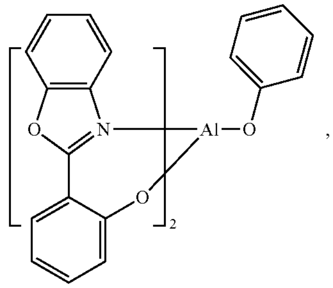
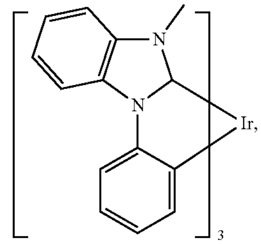

-continued

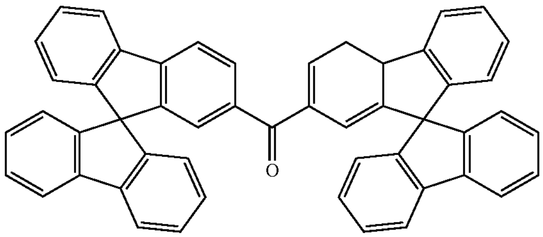
,

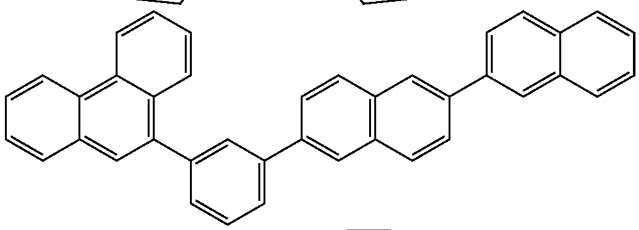
,

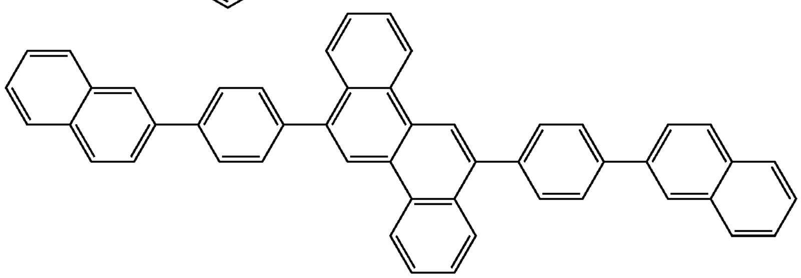
, and

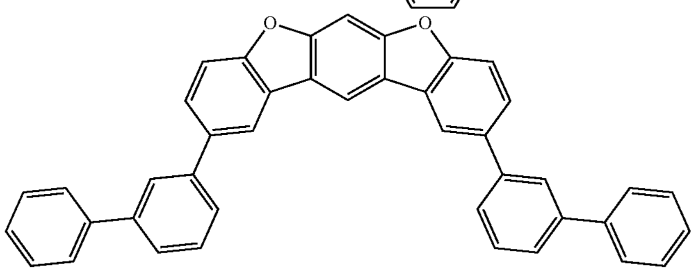
.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
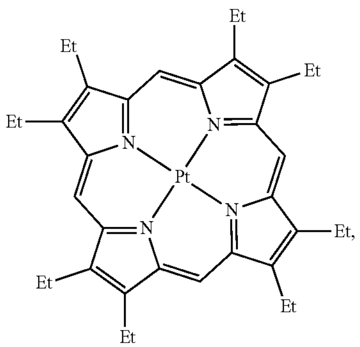
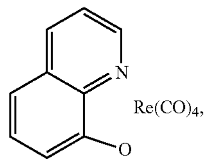
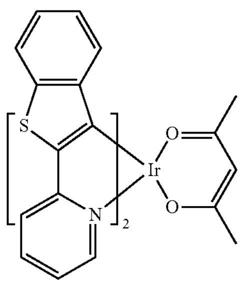
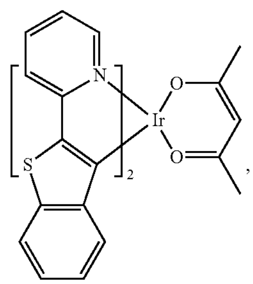
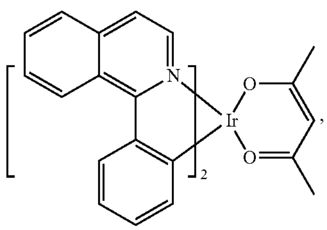
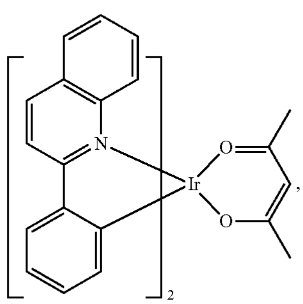
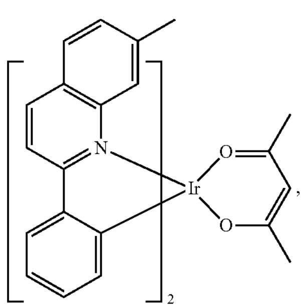
-continued
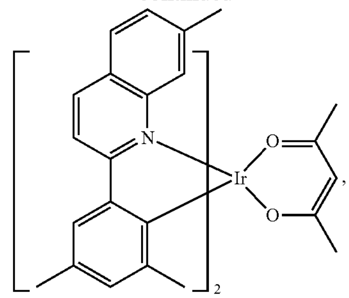
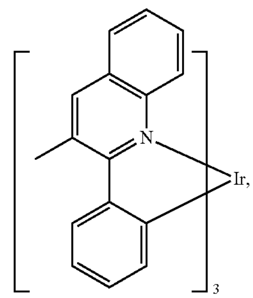
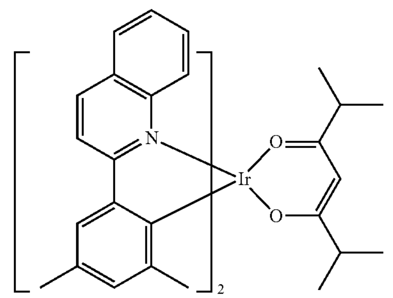
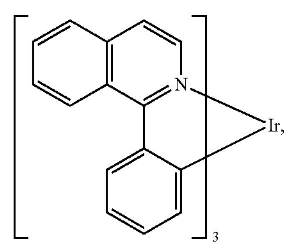
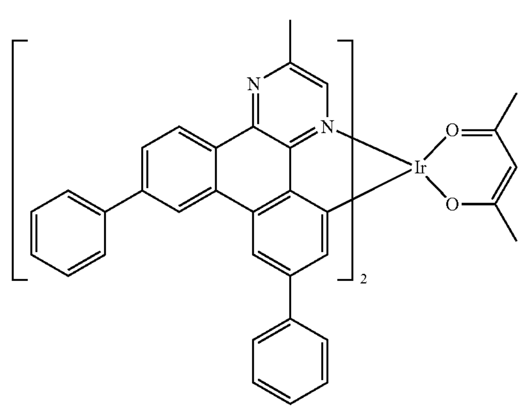

-continued
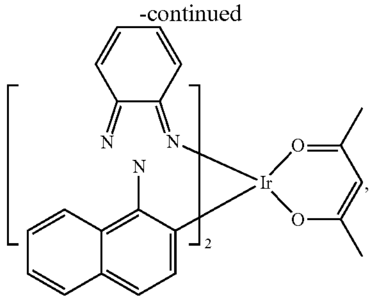
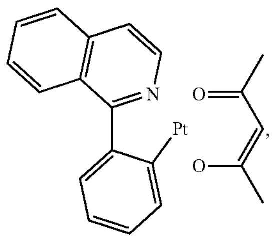
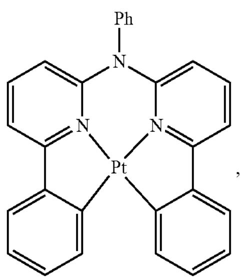
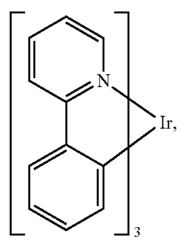
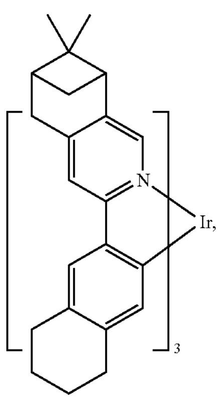
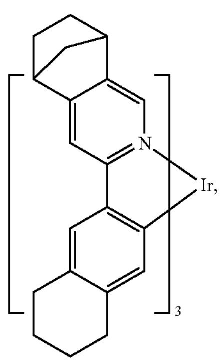
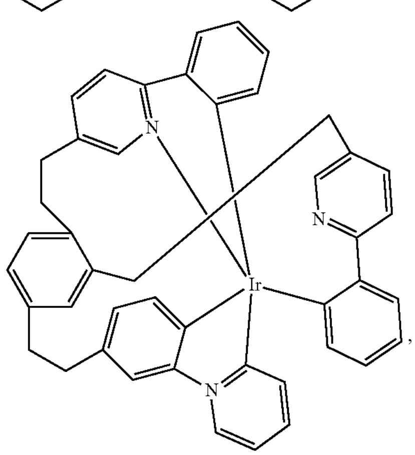
-continued
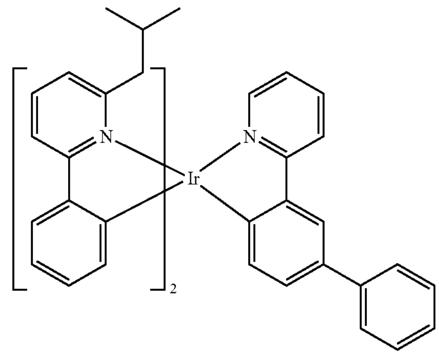
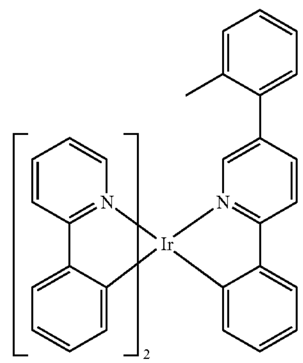
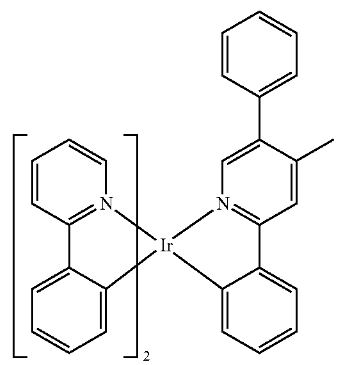
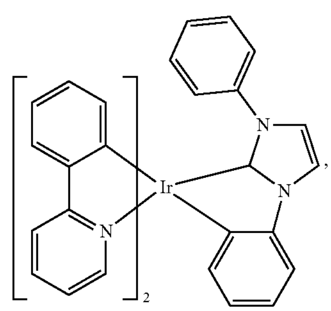
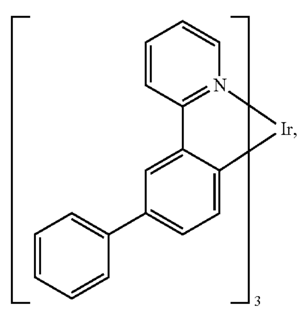
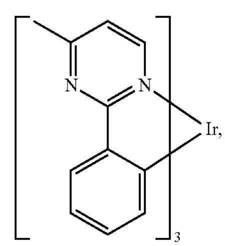

-continued
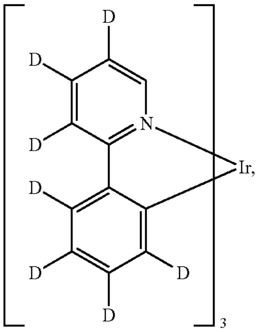
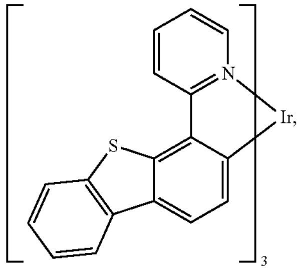
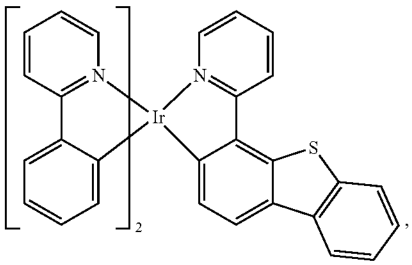
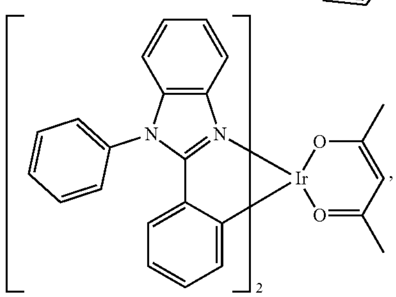
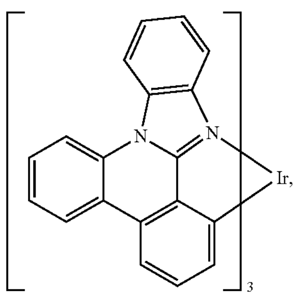
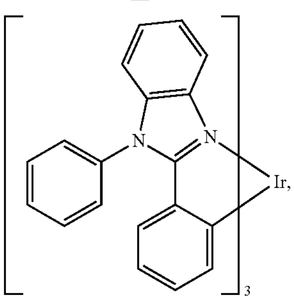
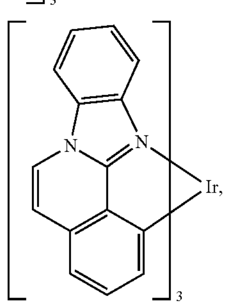
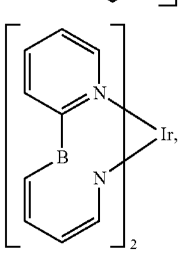
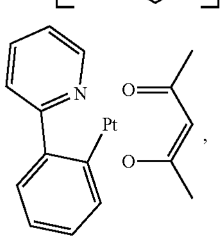
-continued
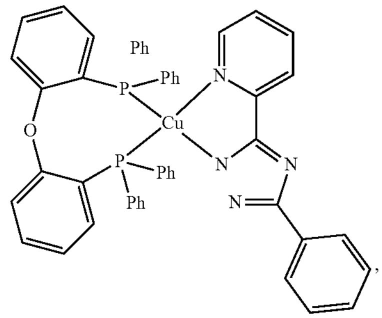
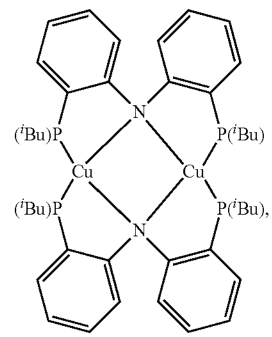
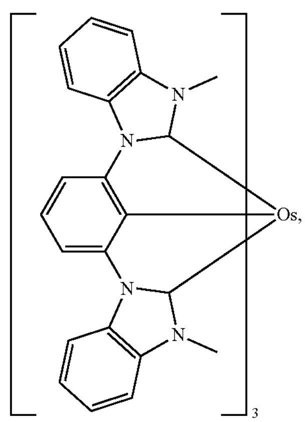
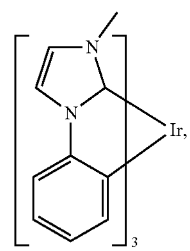
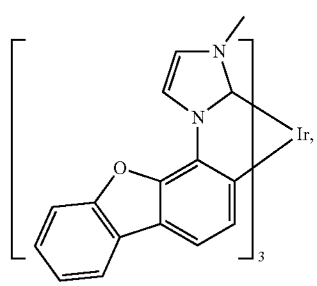
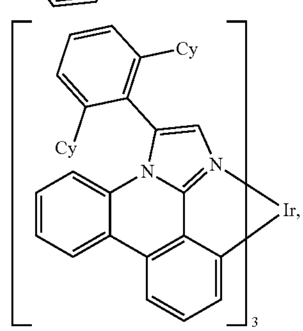

-continued
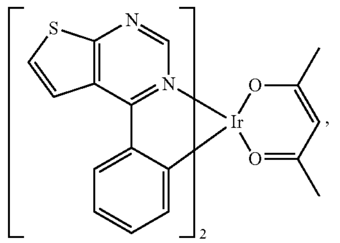
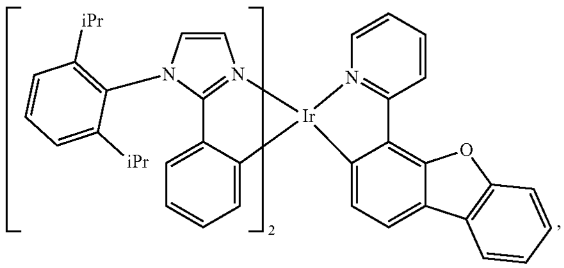
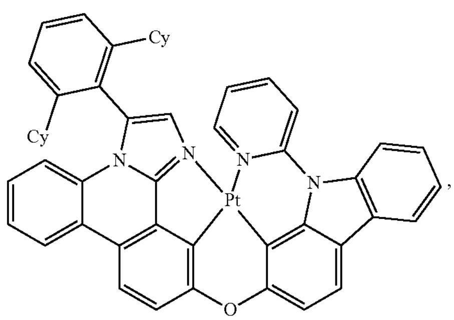
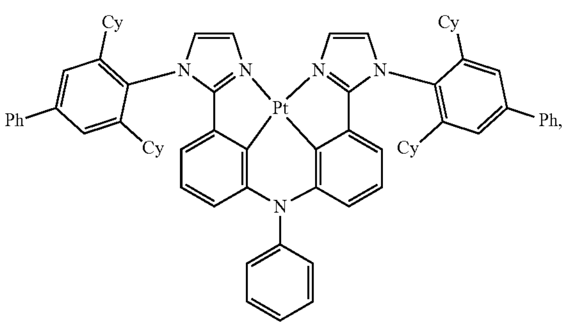
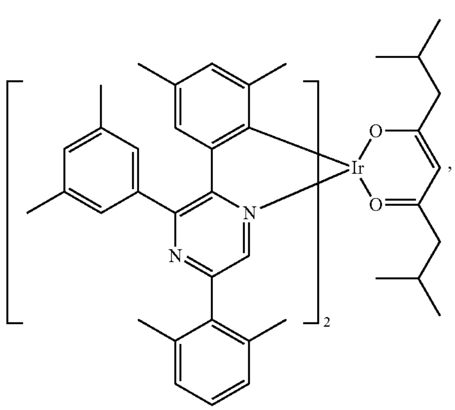
-continued
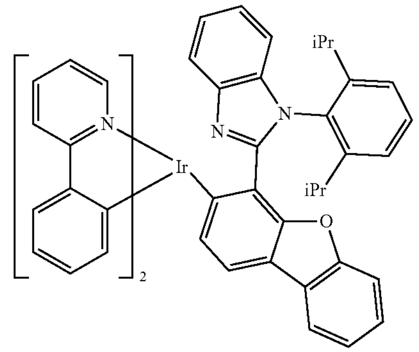
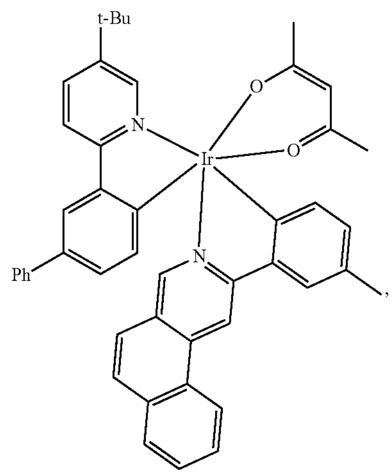
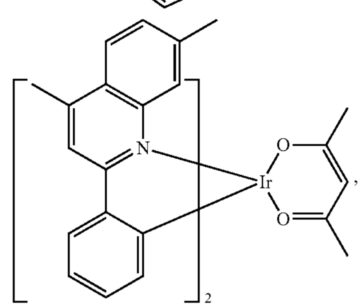
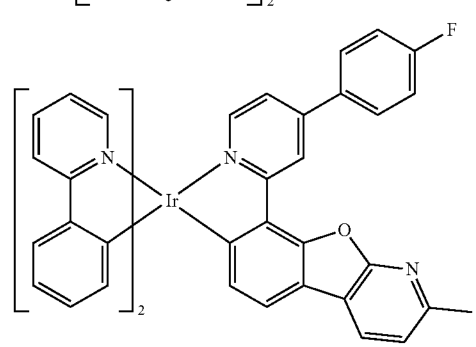
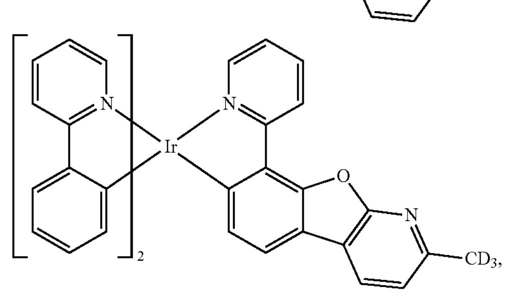

-continued
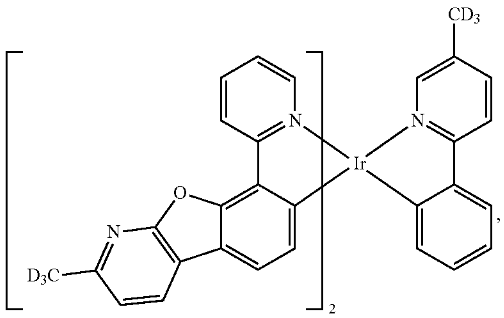
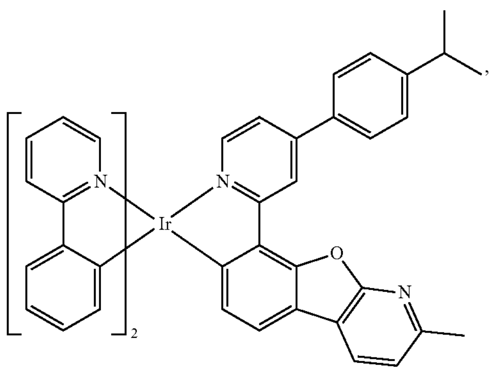
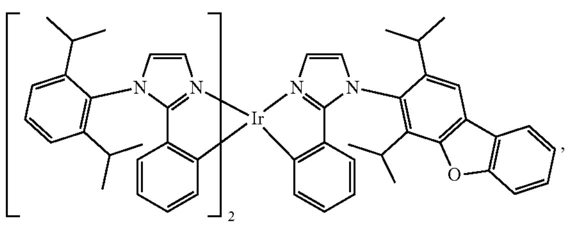
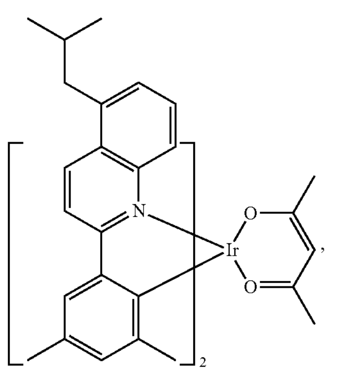
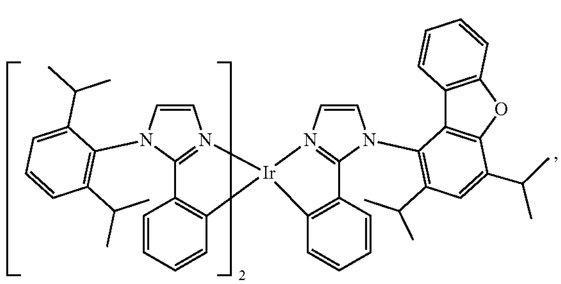
-continued
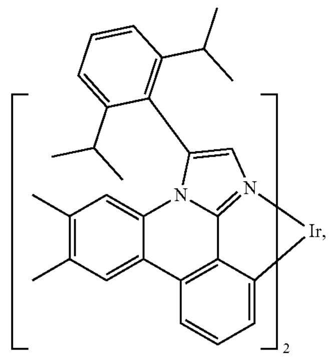
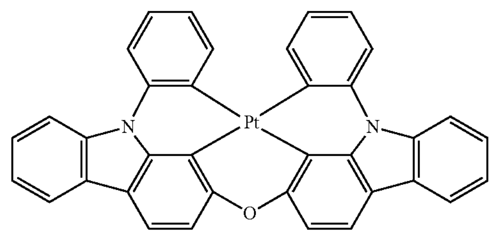
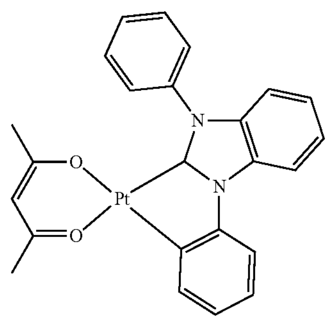
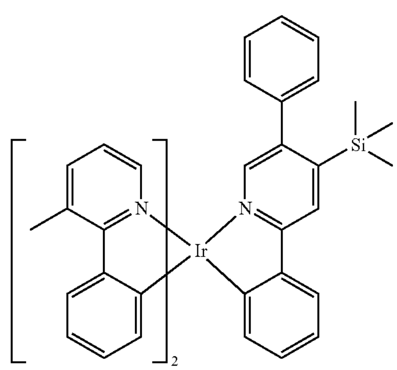
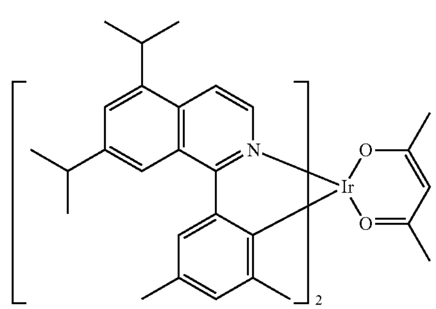

-continued
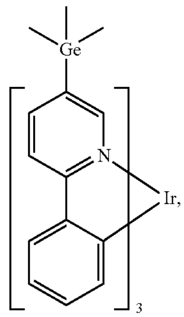
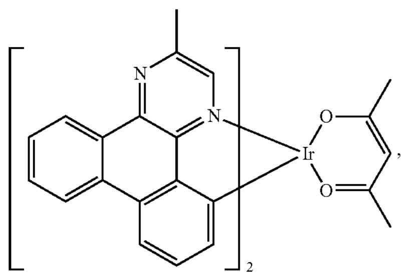
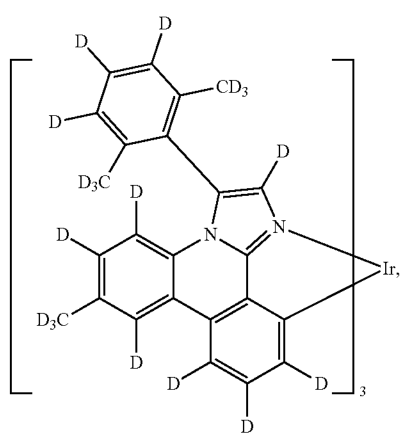
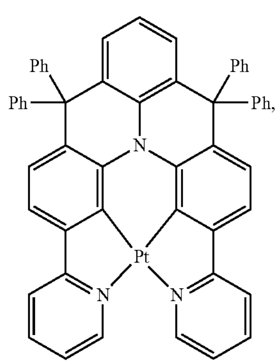
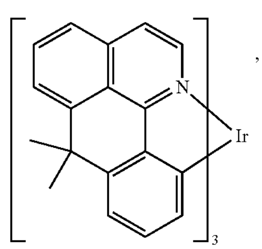
-continued
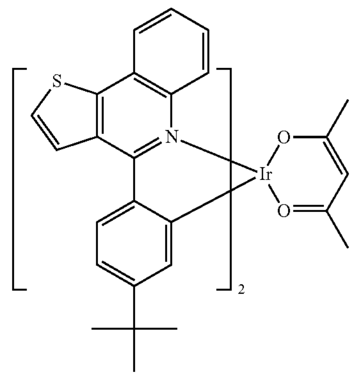
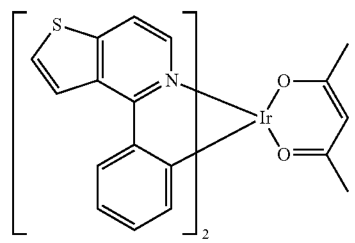
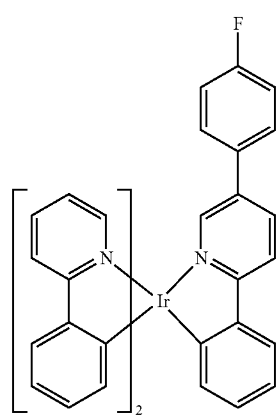
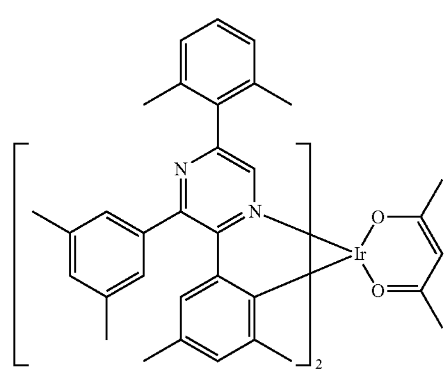

-continued
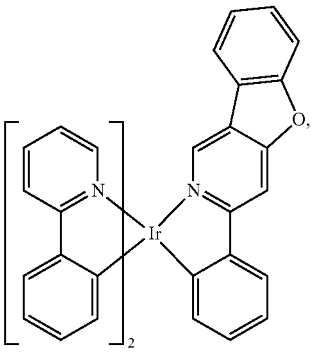
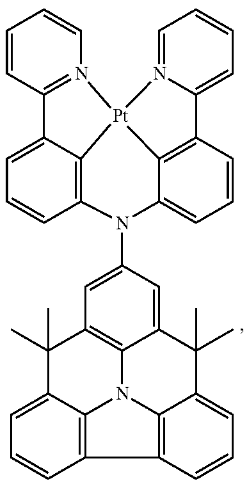
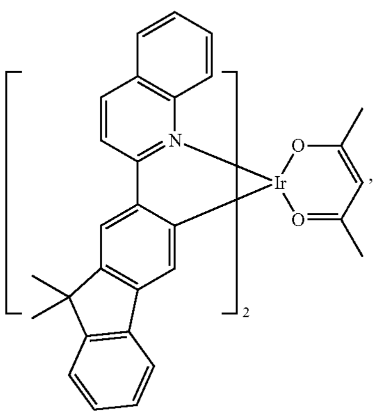
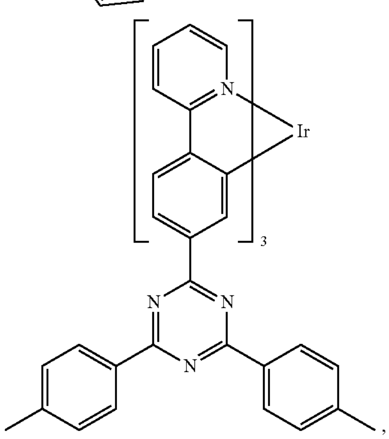
-continued
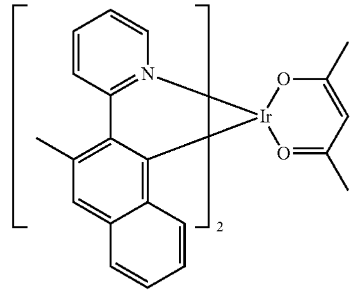
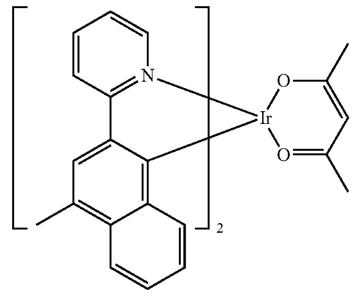
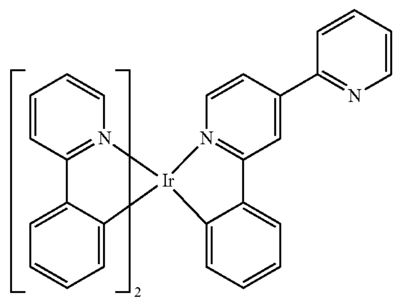
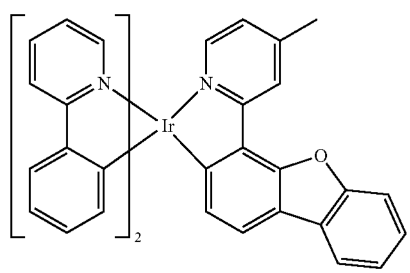
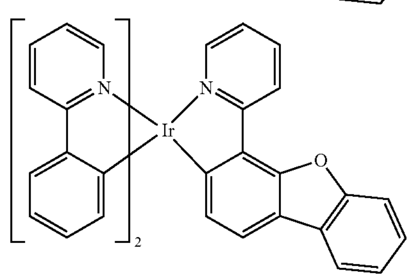
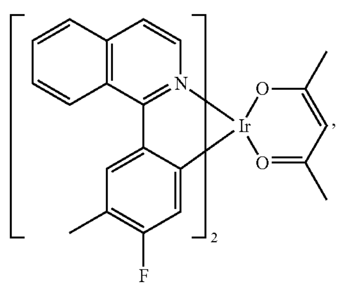

-continued
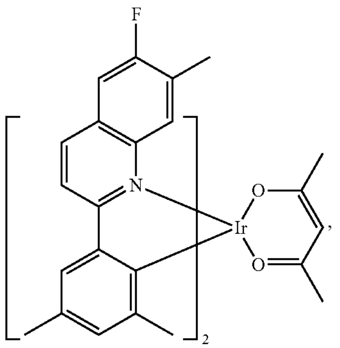
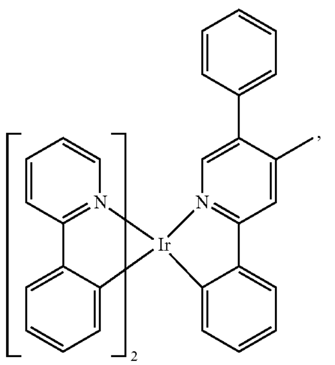
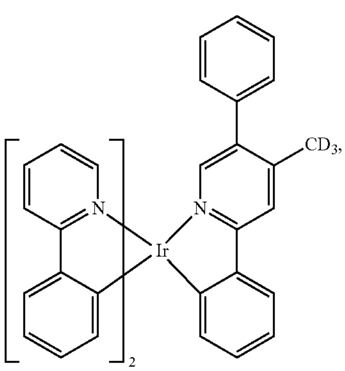
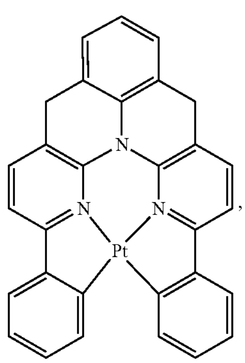
-continued
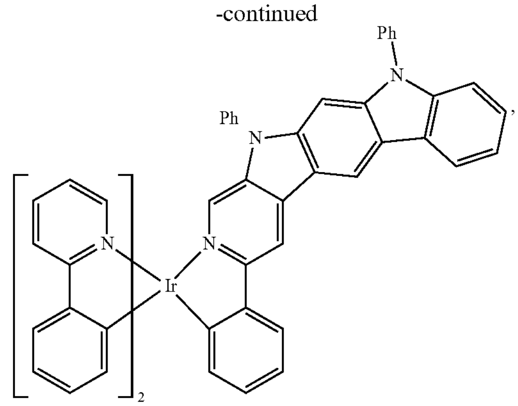
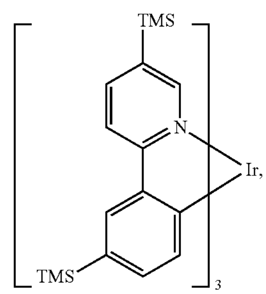
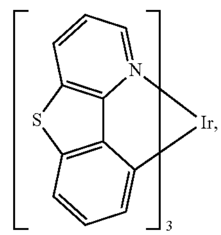
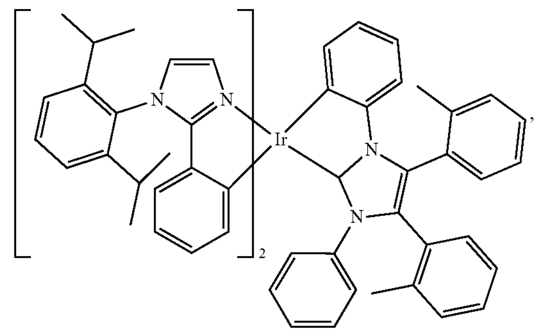
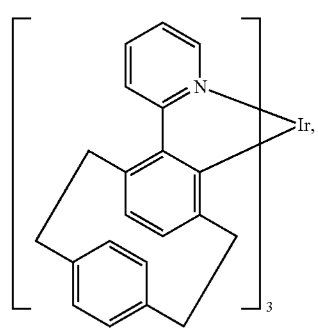
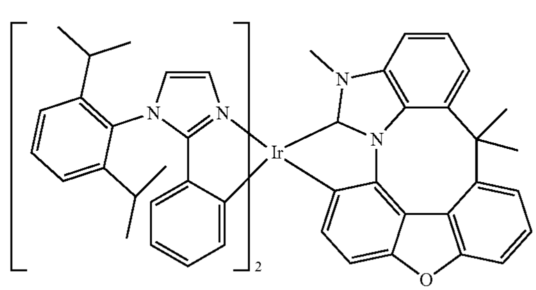

-continued
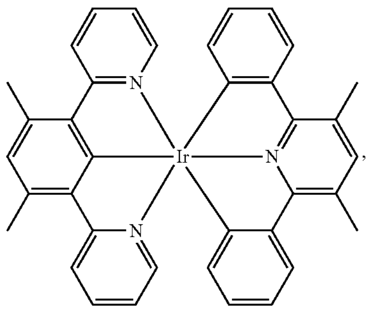
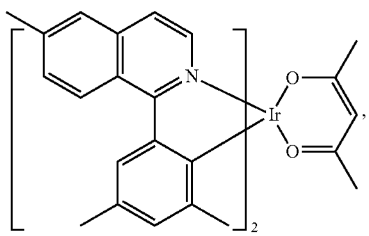
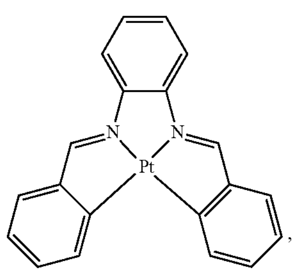
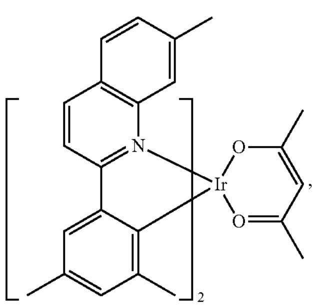
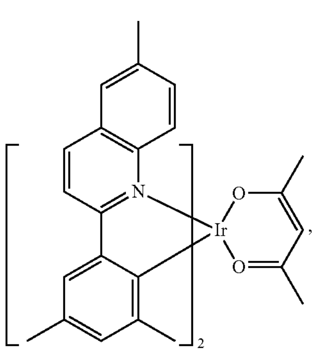
-continued
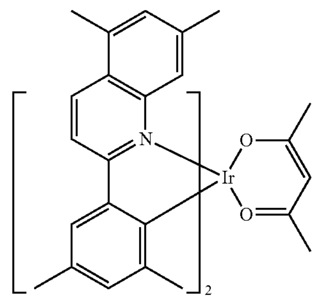
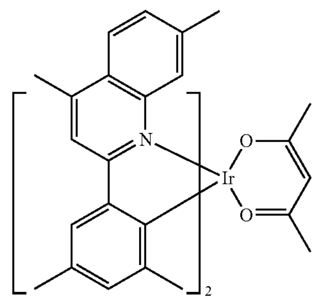
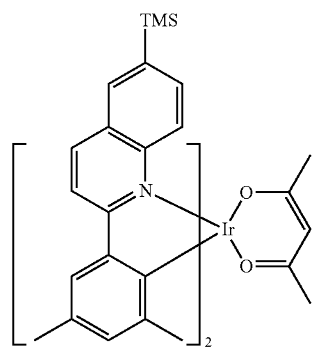
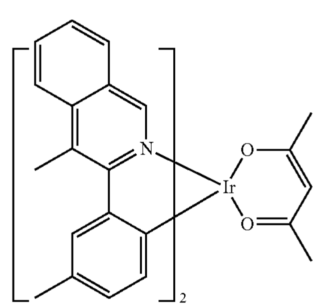
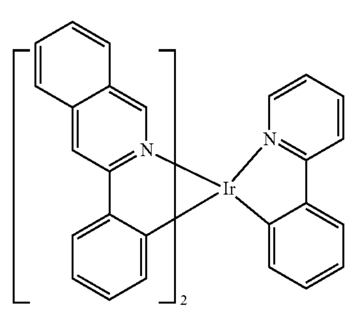

-continued
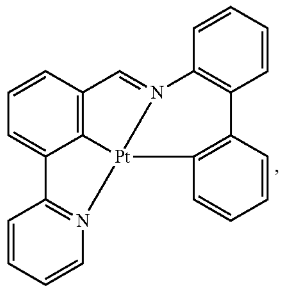
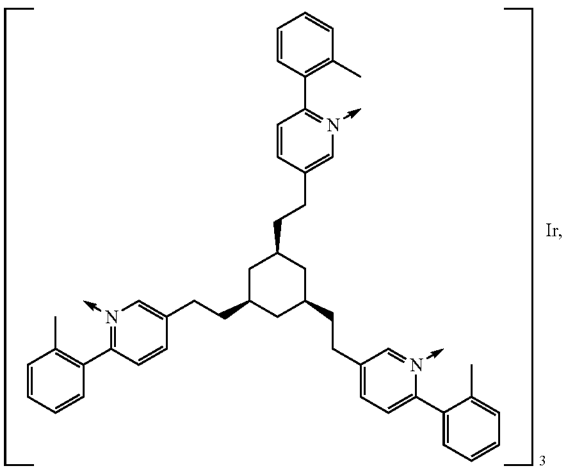
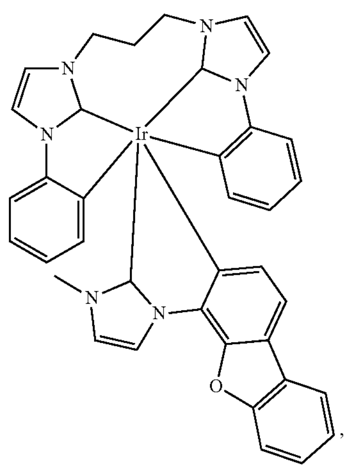
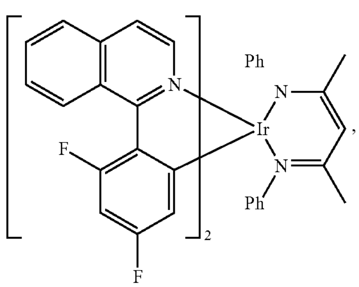
-continued
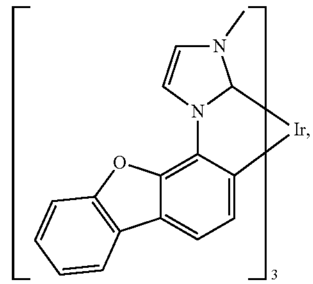
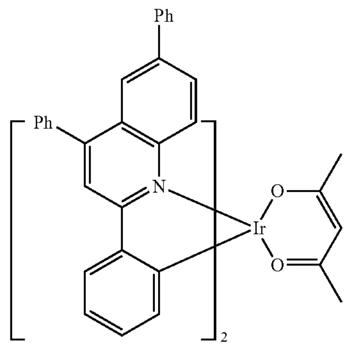
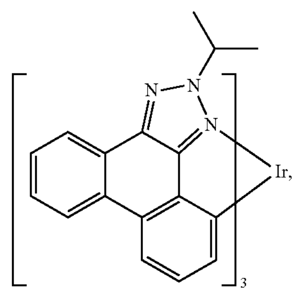
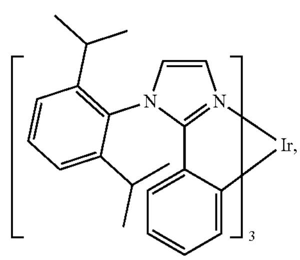
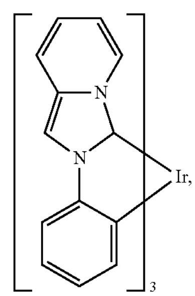
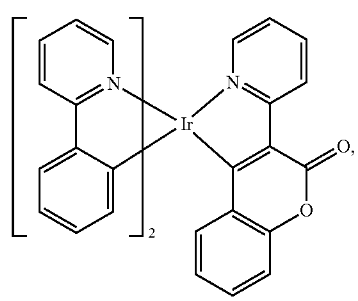

-continued

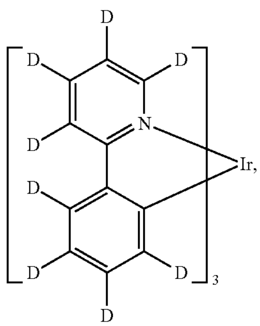

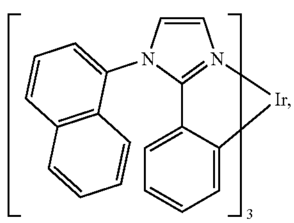

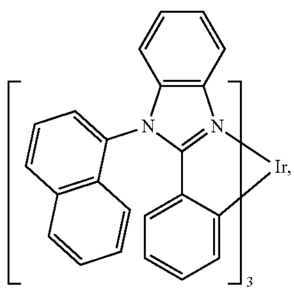

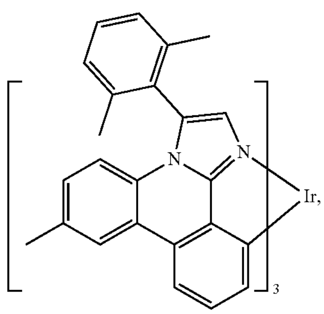

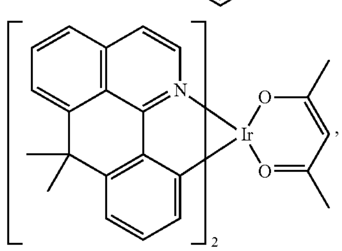

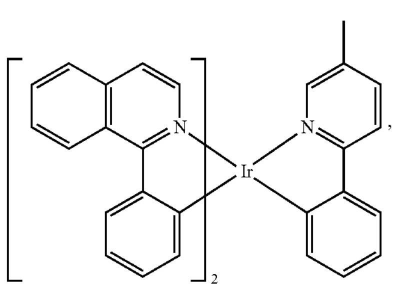

-continued

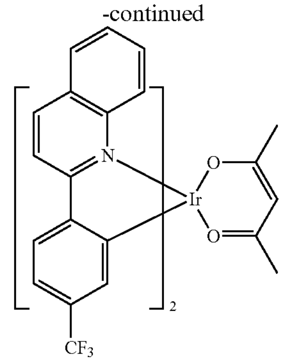

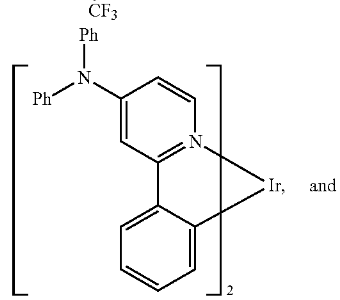

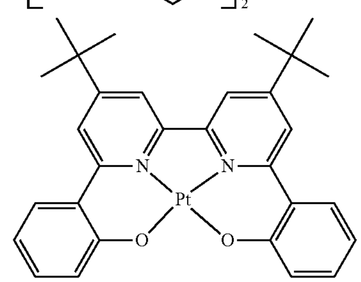

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

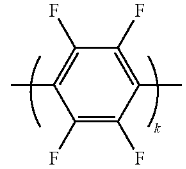

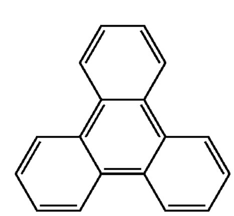

-continued

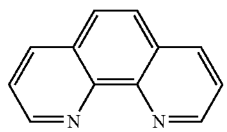

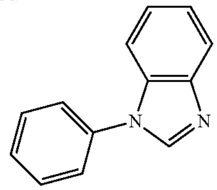

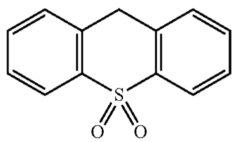

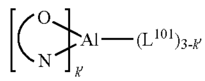

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

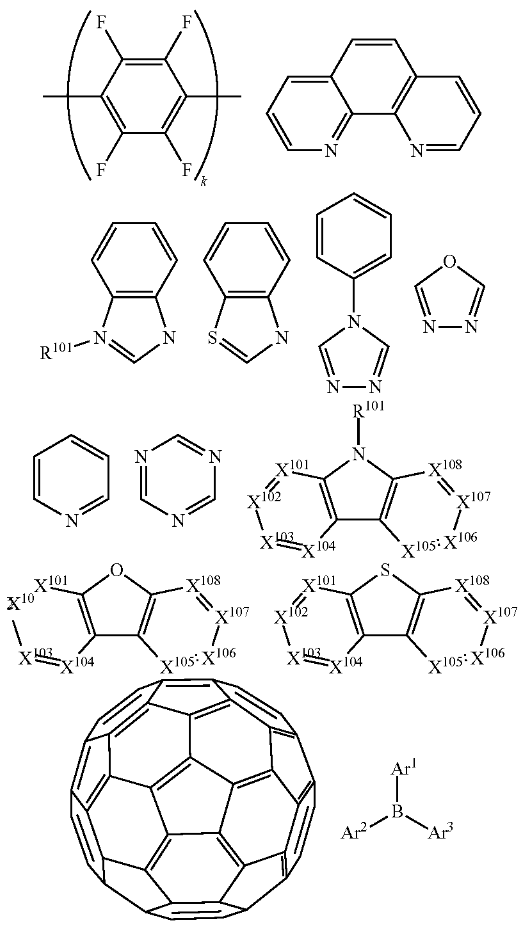

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

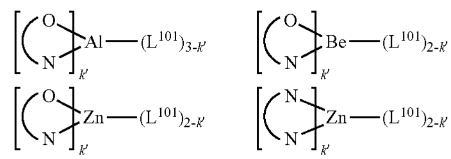

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

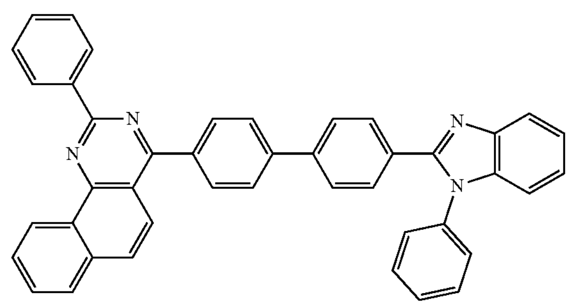

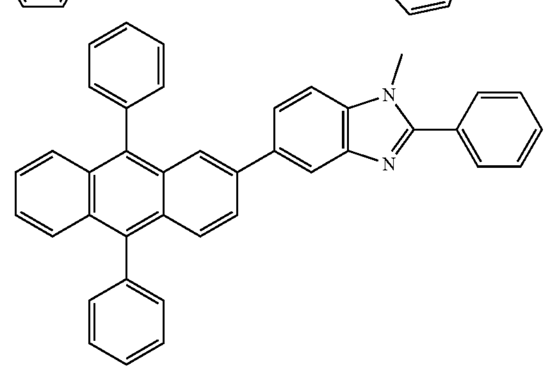

-continued
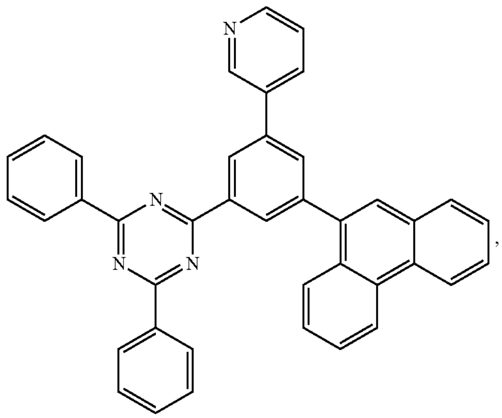
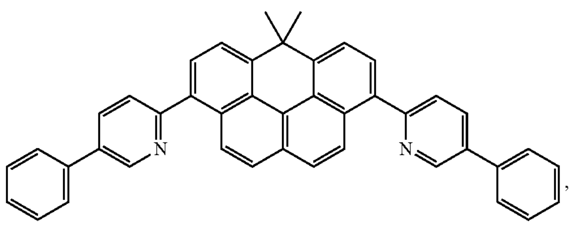
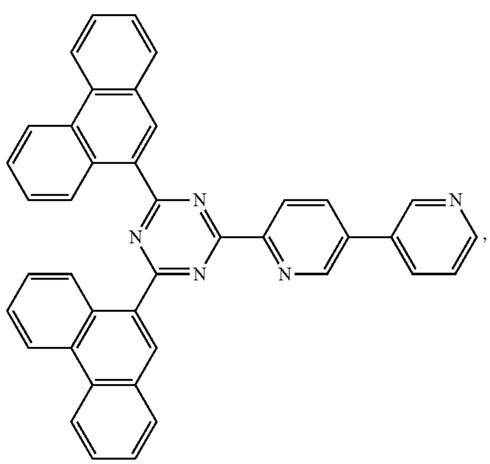
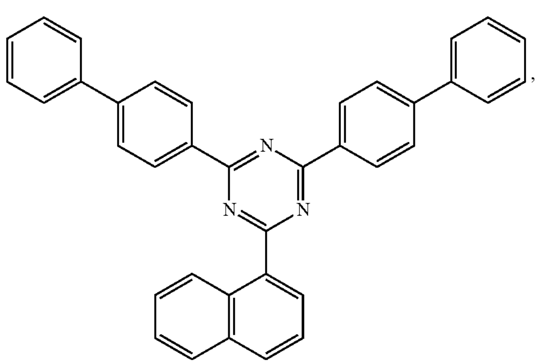
-continued
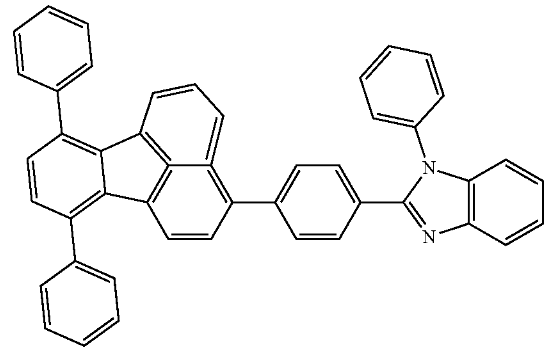
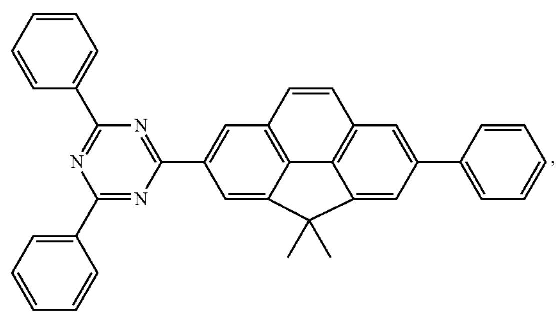
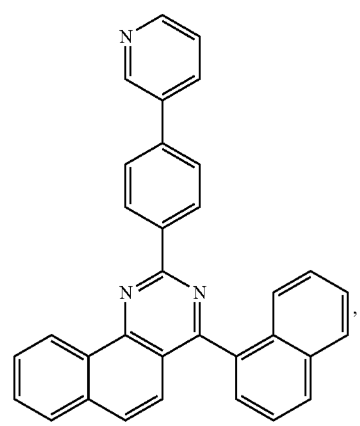
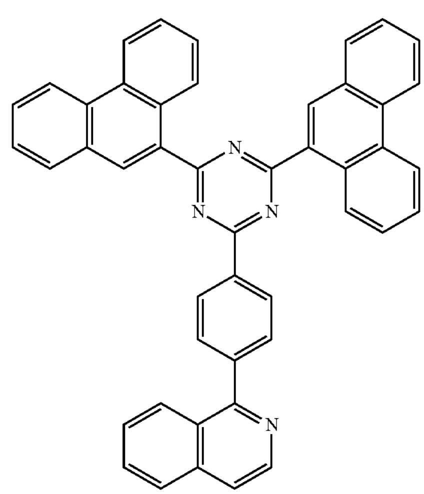

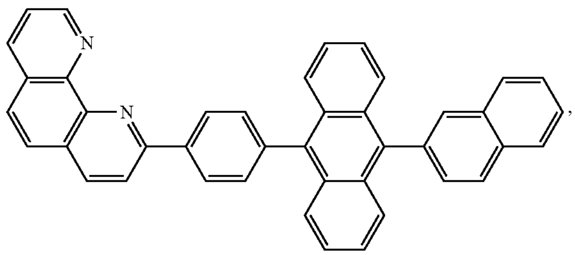
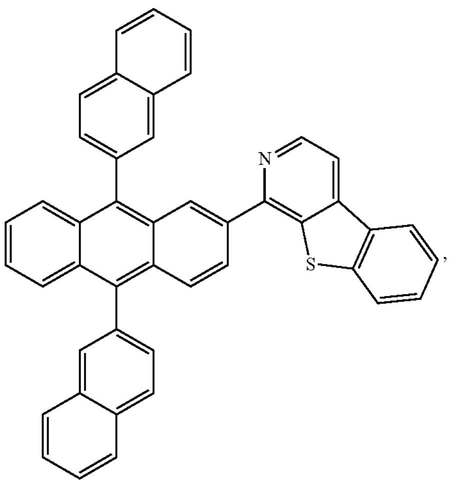
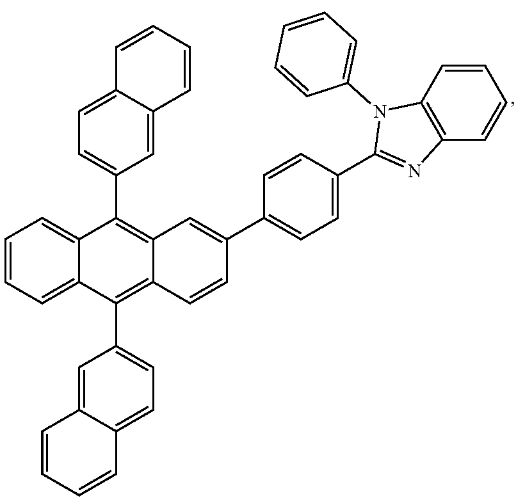
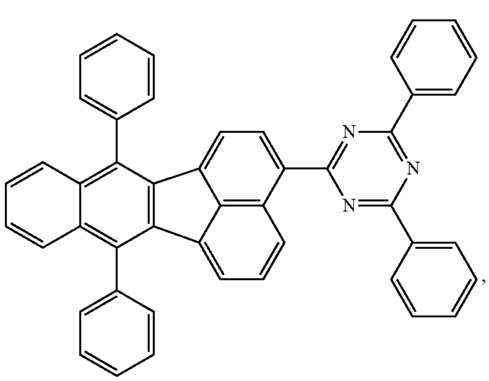
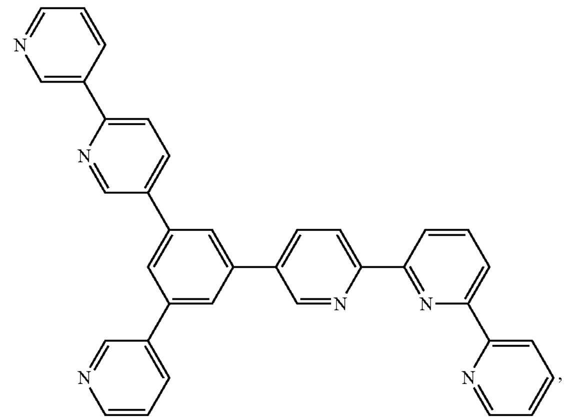
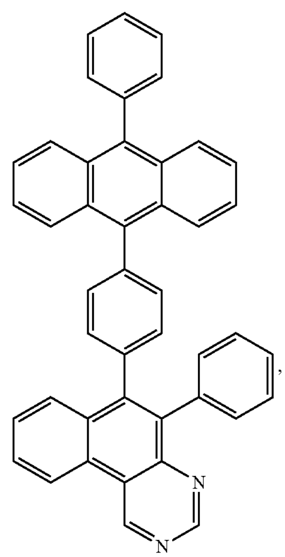
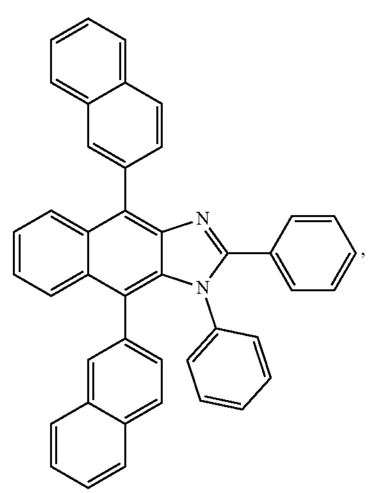

-continued
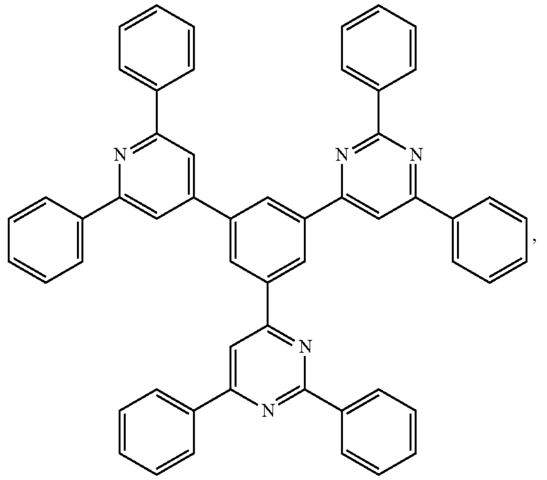
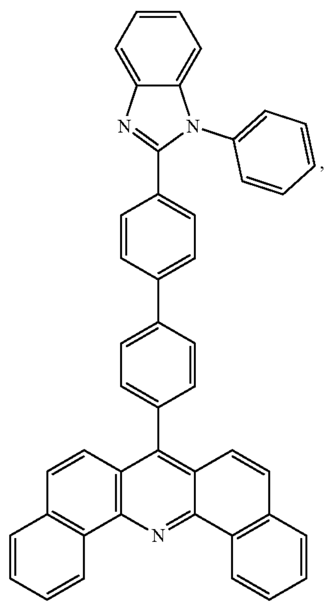
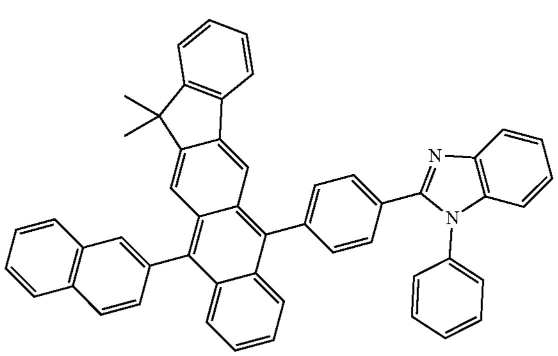
-continued
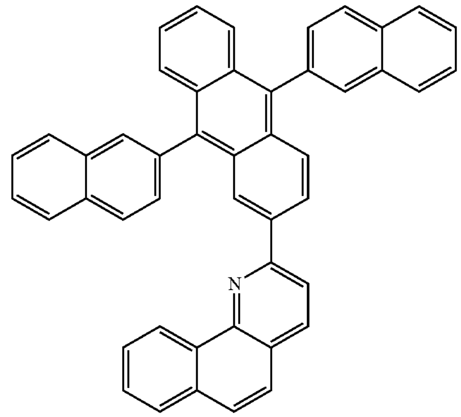
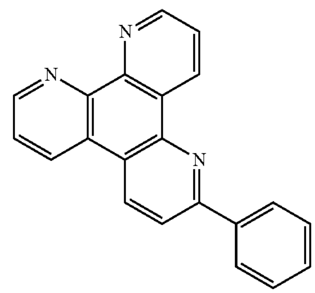
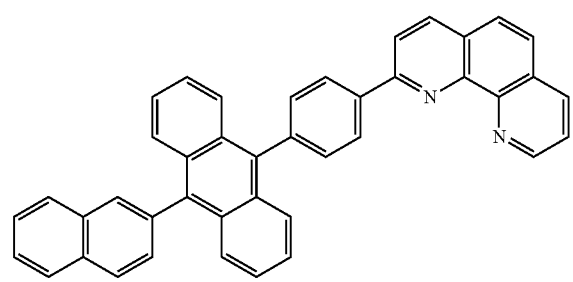
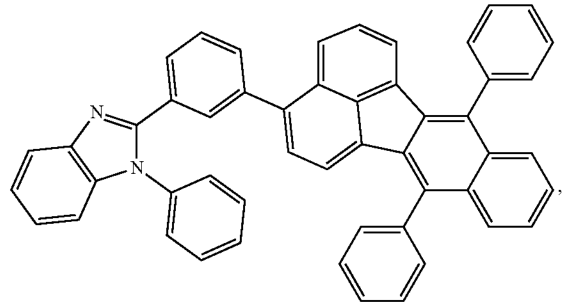

-continued
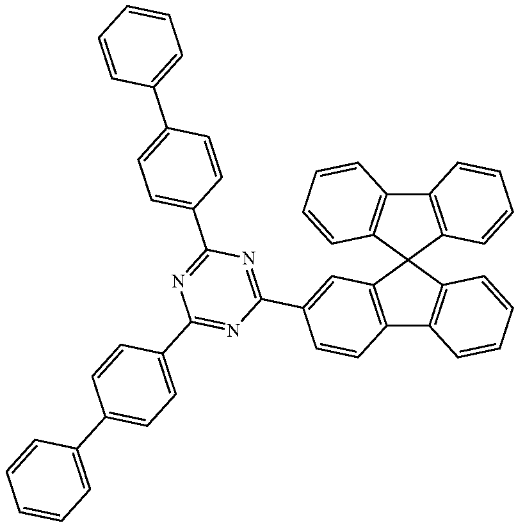
,
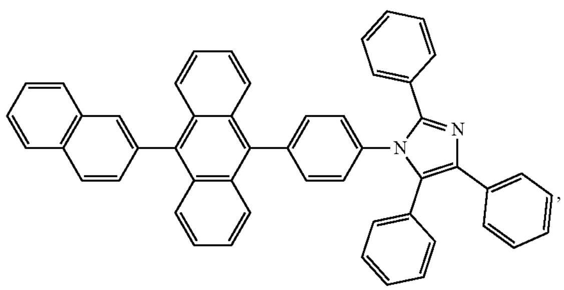
,
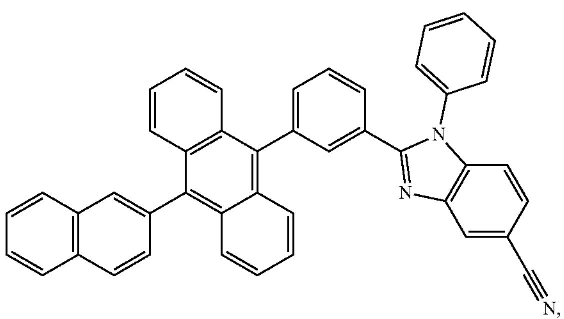
N,
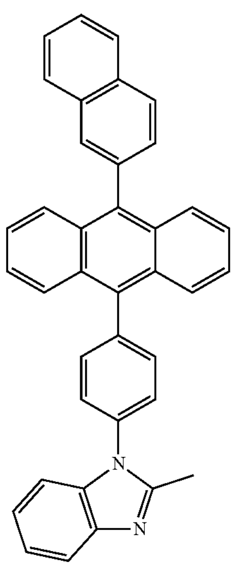
,
-continued
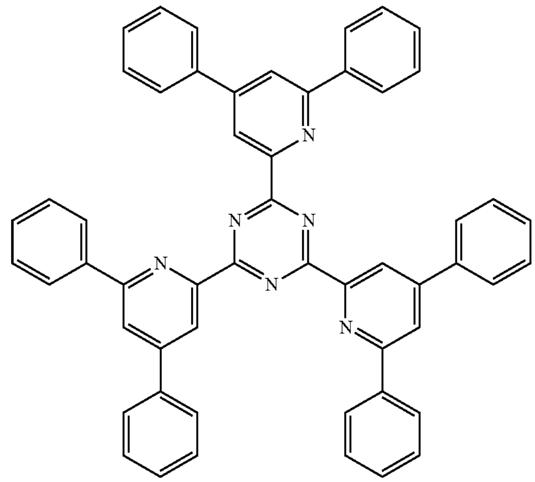
,
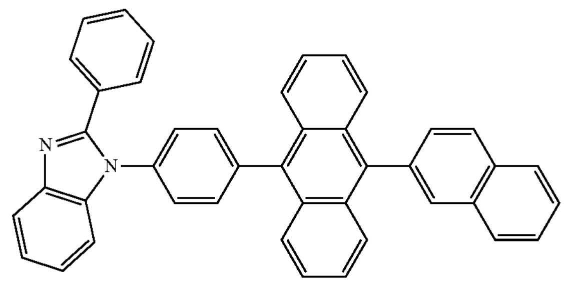
,
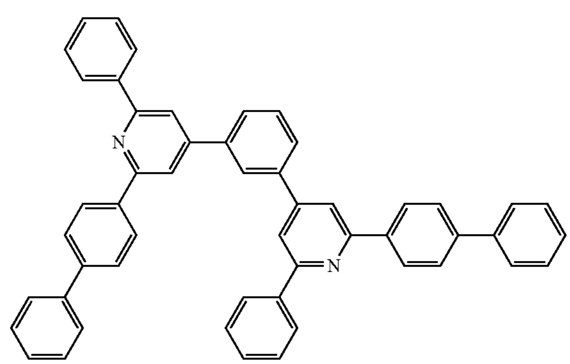
,
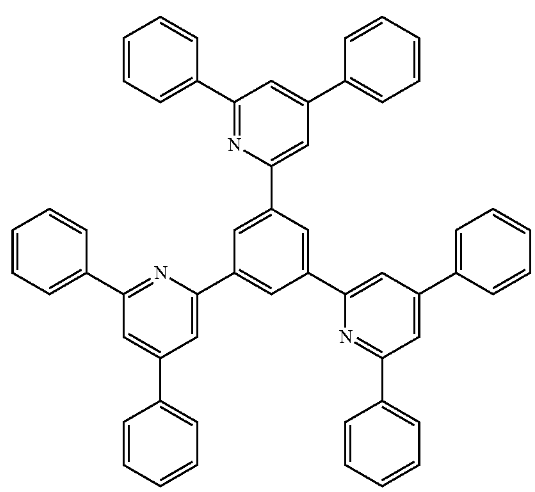
, -continued

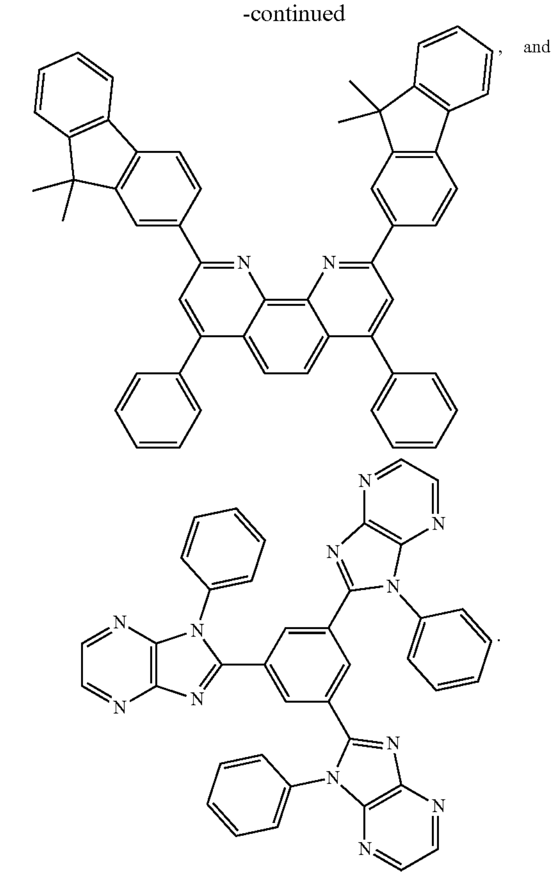

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

Experimental

Synthesis of Compound 221,238 [$Ir(L_{A486})_2(L_{C2})$]

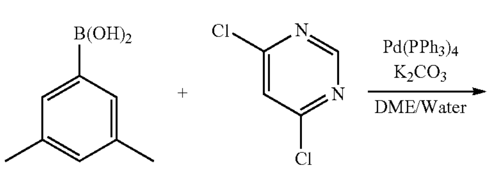

-continued

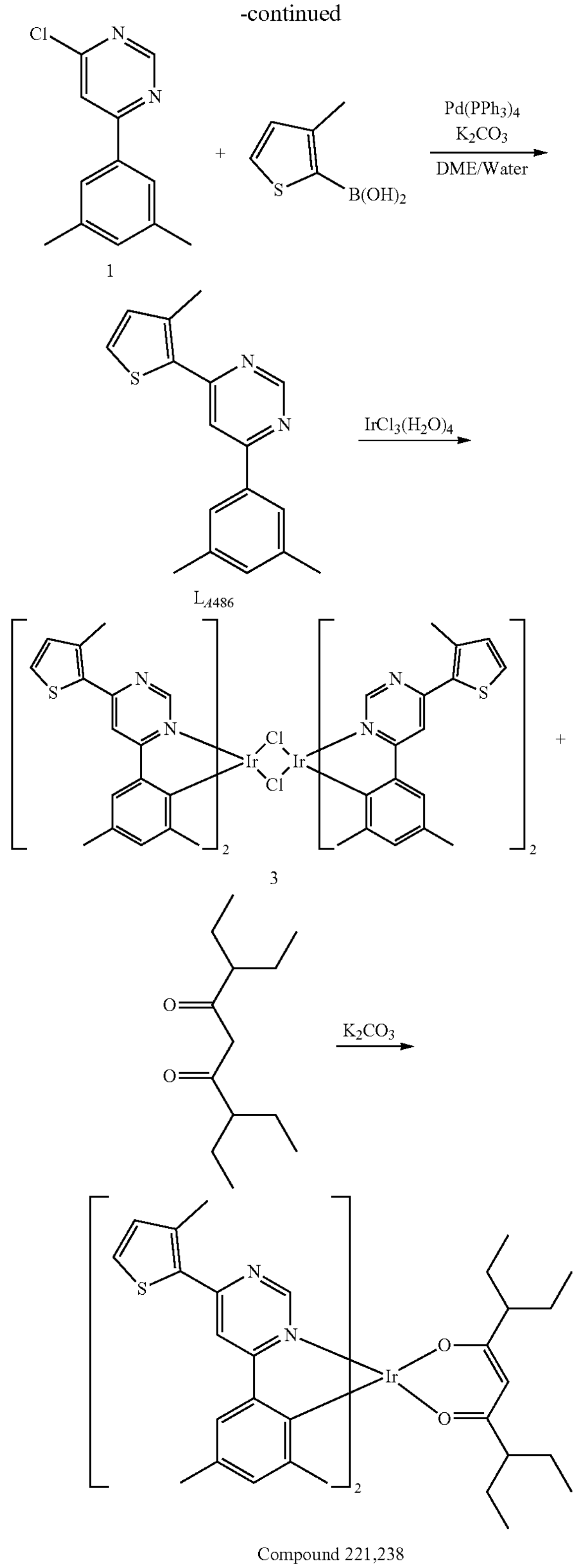

As described in WO2013094620A1, the synthesis of compound 221,238 can be performed via a Suzuki coupling between (3,5-dimethylphenyl)boronic acid and 4,6-dichloropyrimidine to afford 4-chloro-6-(3,5-dimethylphenyl)pyrimidine (Compound 1). Another Suzuki coupling on Intermediary 1 with (3-methylthiophen-2-yl)boronic acid can lead to 4-(3,5-dimethylphenyl)-6-(3-methylthiophen-2-yl) pyrimidine (Ligand $L_{A486}$). Ligand $L_{A486}$ can then be reacted with Iridium(III) Chloride to afford the Iridium Dimer (Intermediary 3) and then the final product can be obtained by reaction of Intermediary 3 with 3,7-diethylnonane-4,6-dione to afford Compound 221, 238.

Synthesis of Compound 221,004 [$Ir(L_{A252})_2(L_{C2})$]

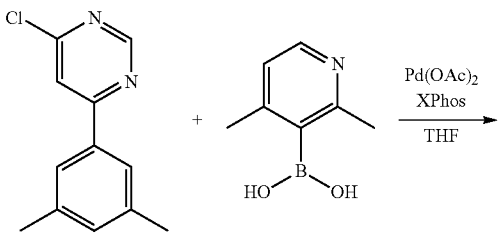

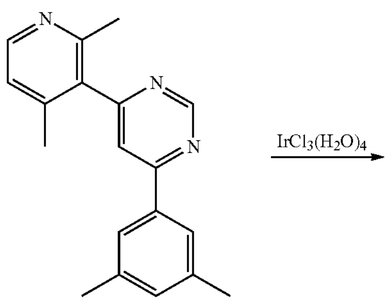

$L_{A252}$

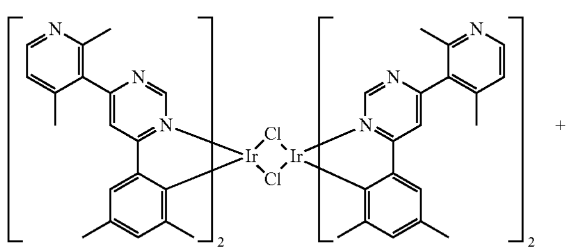

6

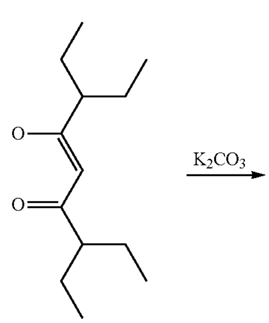

-continued

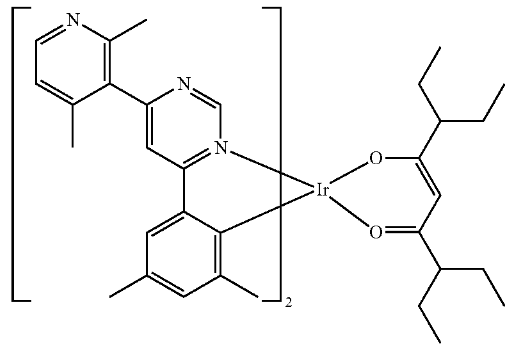

Compound 221,004

Inventive Compound 221,004 can be synthesized in a very similar fashion. However, Ligand $L_{A252}$ is synthesized by using (2,4-dimethylpyridin-3-yl)boronic acid instead of (3-methylthiophen-2-yl)boronic acid in the Suzuki coupling with 4-chloro-6-(3,5-dimethylphenyl)pyrimidine.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula $M(L_A)_x(L_B)_y(L_C)_z$:

wherein the ligand $L_A$ is

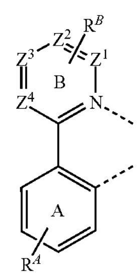

;

wherein the ligand $L_B$ is

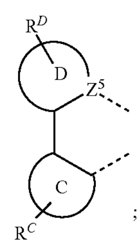

;

wherein the ligand $L_C$ is

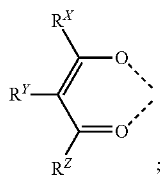

wherein M is a metal having an atomic mass greater than 40;
wherein x is 1 or 2;
wherein y is 0, 1, or 2;
wherein z is 0, 1 or 2;
wherein x+y+z is the oxidation state of the metal M;
wherein $Z^5$ is carbon or nitrogen;
wherein one of $Z^1$ to $Z^4$ is nitrogen and three of $Z^1$ to $Z^4$ are carbon substituted by $R^B$;
wherein rings C and D are each independently a 5 or 6-membered carbocyclic or heterocyclic ring;
wherein $R^A$, $R^B$, $R^C$, and $R^D$ each independently represent mono to the possible maximum number of substitution, or no substitution;
wherein each of $R^A$, $R^B$, $R^C$, $R^D$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, with the proviso that the bonded to $Z^1$ is not aryl or heteroaryl;
wherein at least one of $R^B$ is heteroaryl, which can be further substituted;
wherein the at least one of $R^B$ that is heteroaryl includes a heteroatom selected from the group consisting of N, S, O, and Se, that is adjacent to the bond between the $R^B$ that is heteroaryl and ring B;
wherein, when the heteroaryl is thiophene, the at least one of $R^B$ that is heteroaryl has a structure of

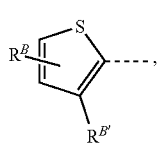

of and $R^{B'}$ is the same as $R^B$ except that $R^{B'}$ is not hydrogen or deuterium;
wherein at least one of $R^A$, $R^B$, $R^{B'}$, $R^C$, and $R^D$ is a partially or fully deuterated moiety; and
wherein any adjacent substituents are optionally joined or fused into a ring.

2. The compound of claim 1, wherein M is selected from the group consisting of Ir, Rh, Re, Ru, Os, Pt, Au, and Cu.

3. The compound of claim 1, wherein M is Ir.

4. The compound of claim 1, wherein the at least one of $R^B$ that is heteroaryl is a six-membered heteroaryl ring, which can be further substituted.

5. The compound of claim 1, wherein the at least one of $R^B$ that is heteroaryl is a five-membered heteroaryl ring, which can be further substituted.

6. The compound of claim 1, wherein $Z^2$ is nitrogen.

7. The compound of claim 1, wherein $Z^3$ is nitrogen.

8. The compound of claim 1, wherein $Z^4$ is nitrogen.

9. The compound of claim 1, wherein ring C is benzene, ring D is pyridine, and $Z_5$ is nitrogen.

10. The compound of claim 1, wherein, when $R^B$ is a heteroaryl, the heteroaryl is selected from the group consisting of:

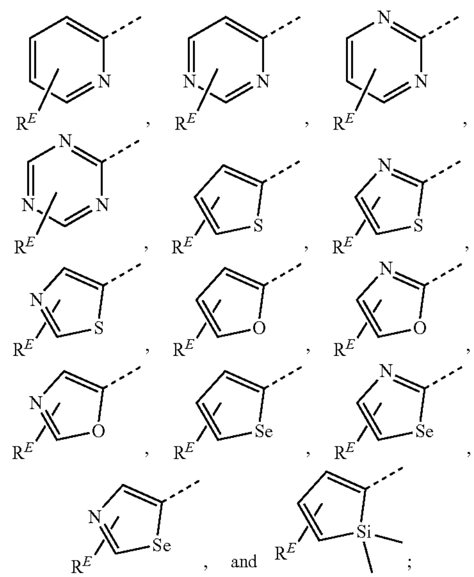

wherein $R^E$ represents mono substitution to the possible maximum number of substitution, or no substitution;
wherein each $R^E$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfanyl, sulfonyl, phosphino, and combinations thereof; and
wherein any adjacent substituents are optionally joined or fused into a ring.

11. The compound of claim 1, wherein at least one of $R^A$, $R^B$, $R^C$, and $R^D$ is selected from the group consisting of:

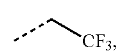
$R^{A1}$

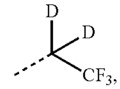
$R^{A2}$

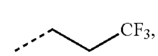
$R^{A3}$

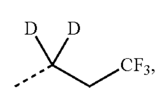
$R^{A4}$

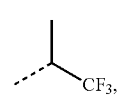
$R^{A5}$

-continued
$R^{A6}$
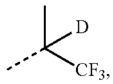
$R^{A7}$
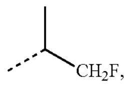
$R^{A8}$
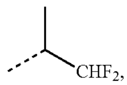
$R^{A8}$
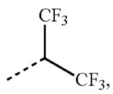
$R^{A10}$
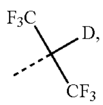
$R^{A11}$
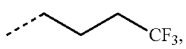
$R^{A12}$
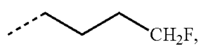
$R^{A13}$
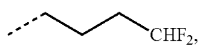
$R^{A14}$
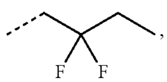
$R^{A15}$
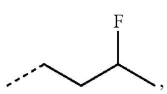
$R^{A16}$
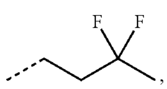
$R^{A17}$
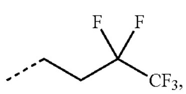
$R^{A18}$
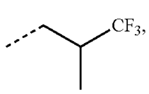
$R^{A19}$
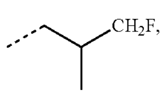
$R^{A20}$
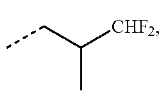
$R^{A21}$
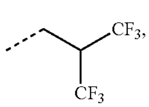
-continued
$R^{A22}$
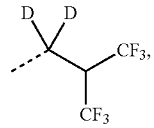
$R^{A23}$
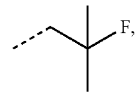
$R^{A24}$
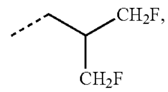
$R^{A25}$
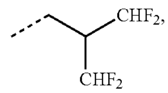
$R^{A26}$
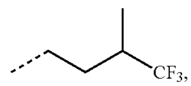
$R^{A27}$
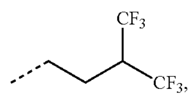
$R^{A28}$
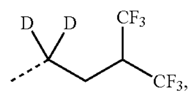
$R^{A29}$
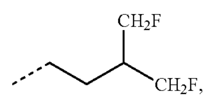
$R^{A30}$
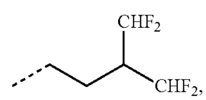
$R^{A31}$
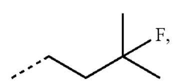
$R^{A32}$
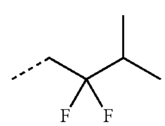
$R^{A33}$
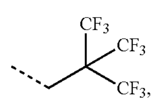
$R^{A34}$
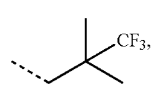
$R^{A35}$
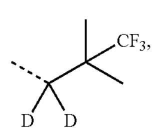

$R^{A36}$
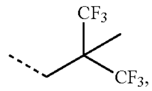
$R^{A37}$
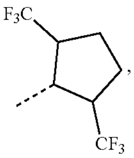
$R^{A38}$
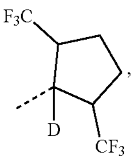
$R^{A39}$
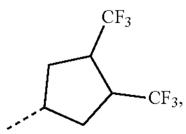
$R^{A40}$
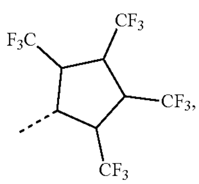
$R^{A41}$
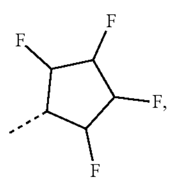
$R^{A42}$
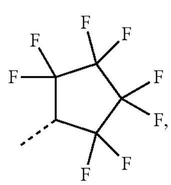
$R^{A43}$
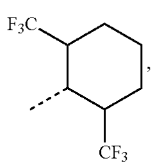
$R^{A44}$
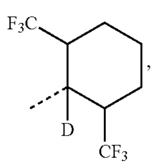
$R^{A45}$
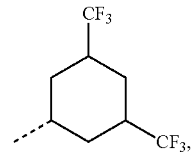
$R^{A46}$
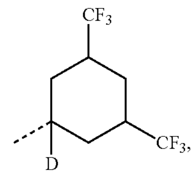
$R^{A47}$
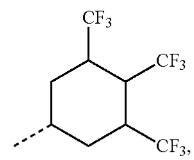
$R^{A48}$
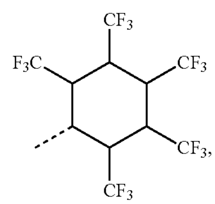
$R^{A49}$
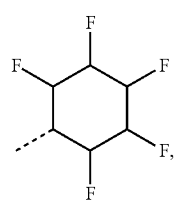
$R^{A50}$
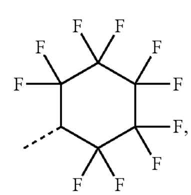
and
$R^{A51}$
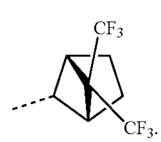

12. The compound of claim 1, wherein the ligand $L_A$ is selected from the group consisting of:

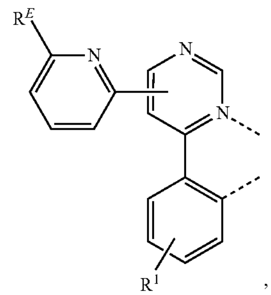
,
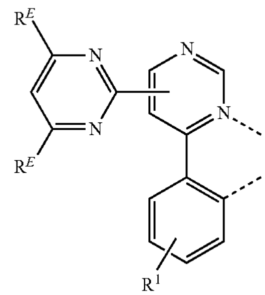
,
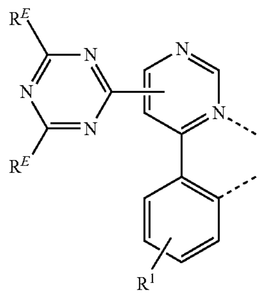
,
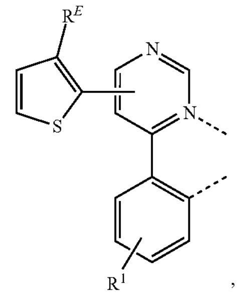
,
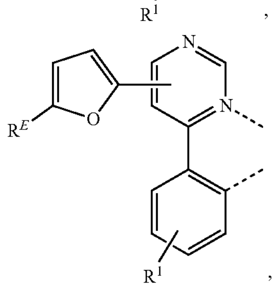
,
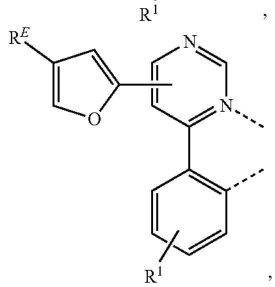
,
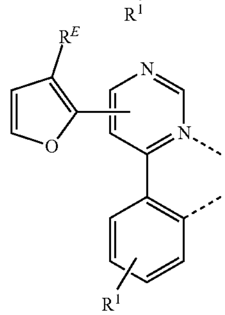
,
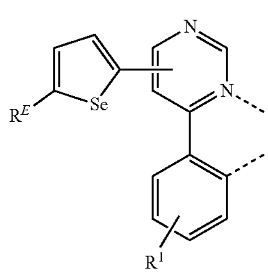
,
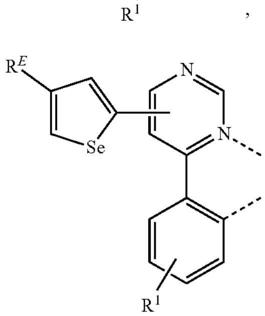
, and
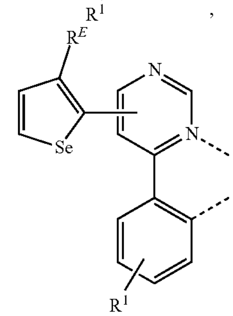
;

wherein $R^1$ represents mono-, di-, tri, or tetra-substitutions, or no substitution;

wherein each $R^1$ and $R^E$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any adjacent substituents are optionally joined or fused into a ring.

13. The compound of claim 1, wherein the ligand $L_A$ is selected from the group consisting of compounds having a structure of

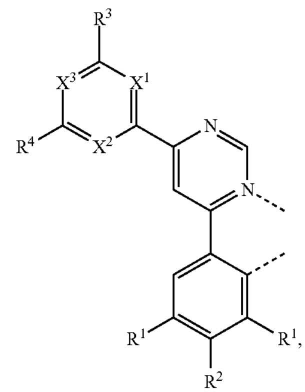

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A3}$ | $R^{B1}$ | $R^{B1}$ | $R^{B3}$ | $R^{B1}$ | N | C | C |
| $L_{A10}$ | $R^{B1}$ | $R^{B1}$ | $R^{A2}$ | $R^{B1}$ | N | C | C |
| $L_{A15}$ | $R^{B2}$ | $R^{B1}$ | $R^{B3}$ | $R^{B1}$ | N | C | C |
| $L_{A22}$ | $R^{B2}$ | $R^{B1}$ | $R^{A2}$ | $R^{B1}$ | N | C | C |
| $L_{A27}$ | $R^{B2}$ | F | $R^{B3}$ | $R^{B1}$ | N | C | C |
| $L_{A34}$ | $R^{B2}$ | F | $R^{A2}$ | $R^{B1}$ | N | C | C |
| $L_{A37}$ | $R^{B3}$ | $R^{B1}$ | $R^{B1}$ | $R^{B1}$ | N | C | C |
| $L_{A38}$ | $R^{B3}$ | $R^{B1}$ | $R^{B2}$ | $R^{B1}$ | N | C | C |
| $L_{A39}$ | $R^{B3}$ | $R^{B1}$ | $R^{B3}$ | $R^{B1}$ | N | C | C |
| $L_{A40}$ | $R^{B3}$ | $R^{B1}$ | $R^{B4}$ | $R^{B1}$ | N | C | C |
| $L_{A41}$ | $R^{B3}$ | $R^{B1}$ | $R^{B5}$ | $R^{B1}$ | N | C | C |
| $L_{A42}$ | $R^{B3}$ | $R^{B1}$ | $R^{B6}$ | $R^{B1}$ | N | C | C |
| $L_{A43}$ | $R^{B3}$ | $R^{B1}$ | $R^{B7}$ | $R^{B1}$ | N | C | C |
| $L_{A44}$ | $R^{B3}$ | $R^{B1}$ | $R^{B8}$ | $R^{B1}$ | N | C | C |
| $L_{A45}$ | $R^{B3}$ | $R^{B1}$ | $R^{B9}$ | $R^{B1}$ | N | C | C |
| $L_{A46}$ | $R^{B3}$ | $R^{B1}$ | $R^{A2}$ | $R^{B1}$ | N | C | C |
| $L_{A47}$ | $R^{B3}$ | $R^{B1}$ | $R^{A27}$ | $R^{B1}$ | N | C | C |
| $L_{A48}$ | $R^{B3}$ | $R^{B1}$ | $R^{A34}$ | $R^{B1}$ | N | C | C |
| $L_{A51}$ | $R^{B1}$ | $R^{B1}$ | $R^{B3}$ | $R^{B3}$ | N | N | C |
| $L_{A58}$ | $R^{B1}$ | $R^{B1}$ | $R^{A2}$ | $R^{A2}$ | N | N | C |
| $L_{A63}$ | $R^{B2}$ | $R^{B1}$ | $R^{B3}$ | $R^{B3}$ | N | N | C |
| $L_{A70}$ | $R^{B2}$ | $R^{B1}$ | $R^{A2}$ | $R^{A2}$ | N | N | C |
| $L_{A75}$ | $R^{B2}$ | F | $R^{B3}$ | $R^{B3}$ | N | N | C |
| $L_{A82}$ | $R^{B2}$ | F | $R^{A2}$ | $R^{A2}$ | N | N | C |
| $L_{A85}$ | $R^{B3}$ | $R^{B1}$ | $R^{B1}$ | $R^{B1}$ | N | N | C |
| $L_{A86}$ | $R^{B3}$ | $R^{B1}$ | $R^{B2}$ | $R^{B2}$ | N | N | C |
| $L_{A87}$ | $R^{B3}$ | $R^{B1}$ | $R^{B3}$ | $R^{B3}$ | N | N | C |
| $L_{A88}$ | $R^{B3}$ | $R^{B1}$ | $R^{B4}$ | $R^{B4}$ | N | N | C |
| $L_{A89}$ | $R^{B3}$ | $R^{B1}$ | $R^{B5}$ | $R^{B5}$ | N | N | C |
| $L_{A90}$ | $R^{B3}$ | $R^{B1}$ | $R^{B6}$ | $R^{B6}$ | N | N | C |
| $L_{A91}$ | $R^{B3}$ | $R^{B1}$ | $R^{B7}$ | $R^{B7}$ | N | N | C |
| $L_{A92}$ | $R^{B3}$ | $R^{B1}$ | $R^{B8}$ | $R^{B8}$ | N | N | C |
| $L_{A93}$ | $R^{B3}$ | $R^{B1}$ | $R^{B9}$ | $R^{B9}$ | N | N | C |
| $L_{A94}$ | $R^{B3}$ | $R^{B1}$ | $R^{A2}$ | $R^{A2}$ | N | N | C |
| $L_{A95}$ | $R^{B3}$ | $R^{B1}$ | $R^{A2}$ | $R^{A27}$ | N | N | C |
| $L_{A96}$ | $R^{B3}$ | $R^{B1}$ | $R^{A34}$ | $R^{A34}$ | N | N | C |
| $L_{A99}$ | $R^{B1}$ | $R^{B1}$ | $R^{B3}$ | $R^{B3}$ | N | N | N |
| $L_{A106}$ | $R^{B1}$ | $R^{B1}$ | $R^{A2}$ | $R^{A2}$ | N | N | N |
| $L_{A111}$ | $R^{B2}$ | $R^{B1}$ | $R^{B3}$ | $R^{B3}$ | N | N | N |
| $L_{A118}$ | $R^{B2}$ | $R^{B1}$ | $R^{A2}$ | $R^{A2}$ | N | N | N |
| $L_{A123}$ | $R^{B2}$ | F | $R^{B3}$ | $R^{B3}$ | N | N | N |
| $L_{A130}$ | $R^{B2}$ | F | $R^{A2}$ | $R^{A2}$ | N | N | N |
| $L_{A133}$ | $R^{B3}$ | $R^{B1}$ | $R^{B1}$ | $R^{B1}$ | N | N | N |
| $L_{A134}$ | $R^{B3}$ | $R^{B1}$ | $R^{B2}$ | $R^{B2}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A135}$ | $R^{B3}$ | $R^{B1}$ | $R^{B3}$ | $R^{B3}$ | N | N | N |
| $L_{A136}$ | $R^{B3}$ | $R^{B1}$ | $R^{B4}$ | $R^{B4}$ | N | N | N |
| $L_{A137}$ | $R^{B3}$ | $R^{B1}$ | $R^{B5}$ | $R^{B5}$ | N | N | N |
| $L_{A138}$ | $R^{B3}$ | $R^{B1}$ | $R^{B6}$ | $R^{B6}$ | N | N | N |
| $L_{A139}$ | $R^{B3}$ | $R^{B1}$ | $R^{B7}$ | $R^{B7}$ | N | N | N |
| $L_{A140}$ | $R^{B3}$ | $R^{B1}$ | $R^{B8}$ | $R^{B8}$ | N | N | N |
| $L_{A141}$ | $R^{B3}$ | $R^{B1}$ | $R^{B9}$ | $R^{B9}$ | N | N | N |
| $L_{A142}$ | $R^{B3}$ | $R^{B1}$ | $R^{A2}$ | $R^{A2}$ | N | N | N |
| $L_{A143}$ | $R^{B3}$ | $R^{B1}$ | $R^{A27}$ | $R^{A27}$ | N | N | N |
| $L_{A144}$ | $R^{B3}$ | $R^{B1}$ | $R^{A34}$ | $R^{A34}$ | N | N | N |

compounds having a structure of

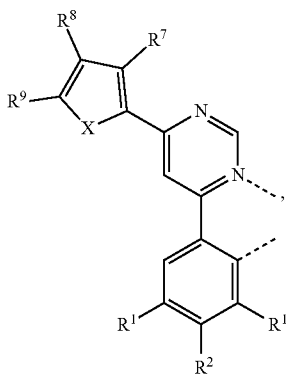

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A475}$ | $R^{B1}$ | $R^{B1}$ | $R^{B3}$ | $R^{B}$ | $R^{B1}$ | S |
| $L_{A482}$ | $R^{B1}$ | $R^{B1}$ | $R^{A2}$ | $R^{B1}$ | $R^{B1}$ | S |
| $L_{A487}$ | $R^{B2}$ | $R^{B1}$ | $R^{B3}$ | $R^{B1}$ | $R^{B1}$ | S |
| $L_{A494}$ | $R^{B2}$ | $R^{B1}$ | $R^{A2}$ | $R^{B1}$ | $R^{B1}$ | S |
| $L_{A499}$ | $R^{B2}$ | F | $R^{B3}$ | $R^{B1}$ | $R^{B1}$ | S |
| $L_{A506}$ | $R^{B2}$ | F | $R^{A2}$ | $R^{B1}$ | $R^{B1}$ | S |
| $L_{A510}$ | $R^{B3}$ | $R^{B1}$ | $R^{B2}$ | $R^{B1}$ | $R^{B1}$ | S |
| $L_{A511}$ | $R^{B3}$ | $R^{B1}$ | $R^{B3}$ | $R^{B1}$ | $R^{B1}$ | S |
| $L_{A512}$ | $R^{B3}$ | $R^{B1}$ | $R^{B4}$ | $R^{B1}$ | $R^{B1}$ | S |
| $L_{A513}$ | $R^{B3}$ | $R^{B1}$ | $R^{B5}$ | $R^{B1}$ | $R^{B1}$ | S |
| $L_{A514}$ | $R^{B3}$ | $R^{B1}$ | $R^{B6}$ | $R^{B1}$ | $R^{B1}$ | S |
| $L_{A515}$ | $R^{B3}$ | $R^{B1}$ | $R^{B7}$ | $R^{B1}$ | $R^{B1}$ | S |
| $L_{A516}$ | $R^{B3}$ | $R^{B1}$ | $R^{B8}$ | $R^{B1}$ | $R^{B1}$ | S |
| $L_{A517}$ | $R^{B3}$ | $R^{B1}$ | $R^{B9}$ | $R^{B1}$ | $R^{B1}$ | S |
| $L_{A518}$ | $R^{B3}$ | $R^{B1}$ | $R^{A2}$ | $R^{B1}$ | $R^{B1}$ | S |
| $L_{A519}$ | $R^{B3}$ | $R^{B1}$ | $R^{A27}$ | $R^{B1}$ | $R^{B1}$ | S |
| $L_{A520}$ | $R^{B3}$ | $R^{B1}$ | $R^{A34}$ | $R^{B1}$ | $R^{B1}$ | S |
| $L_{A523}$ | $R^{B1}$ | $R^{B1}$ | $R^{B3}$ | $R^{B1}$ | $R^{B3}$ | S |
| $L_{A530}$ | $R^{B1}$ | $R^{B1}$ | $R^{A2}$ | $R^{B1}$ | $R^{A2}$ | S |
| $L_{A535}$ | $R^{B2}$ | $R^{B1}$ | $R^{B3}$ | $R^{B1}$ | $R^{B3}$ | S |
| $L_{A542}$ | $R^{B2}$ | $R^{B1}$ | $R^{A2}$ | $R^{B1}$ | $R^{A2}$ | S |
| $L_{A547}$ | $R^{B2}$ | F | $R^{B3}$ | $R^{B1}$ | $R^{B3}$ | S |
| $L_{A554}$ | $R^{B2}$ | F | $R^{A2}$ | $R^{B1}$ | $R^{A2}$ | S |
| $L_{A558}$ | $R^{B3}$ | $R^{B1}$ | $R^{B2}$ | $R^{B1}$ | $R^{B2}$ | S |
| $L_{A559}$ | $R^{B3}$ | $R^{B1}$ | $R^{B3}$ | $R^{B1}$ | $R^{B3}$ | S |
| $L_{A560}$ | $R^{B3}$ | $R^{B1}$ | $R^{B4}$ | $R^{B1}$ | $R^{B4}$ | S |
| $L_{A561}$ | $R^{B3}$ | $R^{B1}$ | $R^{B5}$ | $R^{B1}$ | $R^{B5}$ | S |
| $L_{A562}$ | $R^{B3}$ | $R^{B1}$ | $R^{B6}$ | $R^{B1}$ | $R^{B6}$ | S |
| $L_{A563}$ | $R^{B3}$ | $R^{B1}$ | $R^{B7}$ | $R^{B1}$ | $R^{B7}$ | S |
| $L_{A564}$ | $R^{B3}$ | $R^{B1}$ | $R^{B8}$ | $R^{B1}$ | $R^{B8}$ | S |
| $L_{A565}$ | $R^{B3}$ | $R^{B1}$ | $R^{B9}$ | $R^{B1}$ | $R^{B9}$ | S |
| $L_{A566}$ | $R^{B3}$ | $R^{B1}$ | $R^{A2}$ | $R^{B1}$ | $R^{A2}$ | S |
| $L_{A567}$ | $R^{B3}$ | $R^{B1}$ | $R^{A27}$ | $R^{B1}$ | $R^{A27}$ | S |
| $L_{A568}$ | $R^{B3}$ | $R^{B1}$ | $R^{A34}$ | $R^{B1}$ | $R^{A34}$ | S |
| $L_{A619}$ | $R^{B1}$ | $R^{B1}$ | $R^{B3}$ | $R^{B3}$ | $R^{B1}$ | S |
| $L_{A626}$ | $R^{B1}$ | $R^{B1}$ | $R^{A2}$ | $R^{A2}$ | $R^{B1}$ | S |

-continued

| | $R^1$ | $R^2$ | $R^7$ | $R^8$ | $R^9$ | X |
|---|---|---|---|---|---|---|
| $L_{A631}$ | $R^{B2}$ | $R^{B1}$ | $R^{B3}$ | $R^{B3}$ | $R^{B1}$ | S |
| $L_{A638}$ | $R^{B2}$ | $R^{B1}$ | $R^{A2}$ | $R^{A2}$ | $R^{B1}$ | S |
| $L_{A643}$ | $R^{B2}$ | F | $R^{B3}$ | $R^{B3}$ | $R^{B1}$ | S |
| $L_{A650}$ | $R^{B2}$ | F | $R^{A2}$ | $R^{A2}$ | $R^{B1}$ | S |
| $L_{A654}$ | $R^{B3}$ | $R^{B1}$ | $R^{B2}$ | $R^{B2}$ | $R^{B1}$ | S |
| $L_{A655}$ | $R^{B3}$ | $R^{B1}$ | $R^{B3}$ | $R^{B3}$ | $R^{B1}$ | S |
| $L_{A656}$ | $R^{B3}$ | $R^{B1}$ | $R^{B4}$ | $R^{B4}$ | $R^{B1}$ | S |
| $L_{A657}$ | $R^{B3}$ | $R^{B1}$ | $R^{B5}$ | $R^{B5}$ | $R^{B1}$ | S |
| $L_{A658}$ | $R^{B3}$ | $R^{B1}$ | $R^{B6}$ | $R^{B6}$ | $R^{B1}$ | S |
| $L_{A659}$ | $R^{B3}$ | $R^{B1}$ | $R^{B7}$ | $R^{B7}$ | $R^{B1}$ | S |
| $L_{A660}$ | $R^{B3}$ | $R^{B1}$ | $R^{B8}$ | $R^{B8}$ | $R^{B1}$ | S |
| $L_{A661}$ | $R^{B3}$ | $R^{B1}$ | $R^{B9}$ | $R^{B9}$ | $R^{B1}$ | S |
| $L_{A662}$ | $R^{B3}$ | $R^{B1}$ | $R^{A2}$ | $R^{A2}$ | $R^{B1}$ | S |
| $L_{A663}$ | $R^{B3}$ | $R^{B1}$ | $R^{A27}$ | $R^{A27}$ | $R^{B1}$ | S |
| $L_{A664}$ | $R^{B3}$ | $R^{B1}$ | $R^{A34}$ | $R^{A34}$ | $R^{B1}$ | S |
| $L_{A667}$ | $R^{B1}$ | $R^{B1}$ | $R^{B1}$ | $R^{B1}$ | $R^{B3}$ | O |
| $L_{A674}$ | $R^{B1}$ | $R^{B1}$ | $R^{B1}$ | $R^{B1}$ | $R^{A2}$ | O |
| $L_{A679}$ | $R^{B2}$ | $R^{B1}$ | $R^{B1}$ | $R^{B1}$ | $R^{B3}$ | O |
| $L_{A686}$ | $R^{B2}$ | $R^{B1}$ | $R^{B1}$ | $R^{B1}$ | $R^{A2}$ | O |
| $L_{A691}$ | $R^{B2}$ | F | $R^{B1}$ | $R^{B1}$ | $R^{B3}$ | O |
| $L_{A698}$ | $R^{B2}$ | F | $R^{B1}$ | $R^{B1}$ | $R^{A2}$ | O |
| $L_{A701}$ | $R^{B3}$ | $R^{B1}$ | $R^{B1}$ | $R^{B1}$ | $R^{B1}$ | O |
| $L_{A702}$ | $R^{B3}$ | $R^{B1}$ | $R^{B1}$ | $R^{B1}$ | $R^{B2}$ | O |
| $L_{A703}$ | $R^{B3}$ | $R^{B1}$ | $R^{B1}$ | $R^{B1}$ | $R^{B3}$ | O |
| $L_{A704}$ | $R^{B3}$ | $R^{B1}$ | $R^{B1}$ | $R^{B1}$ | $R^{B4}$ | O |
| $L_{A705}$ | $R^{B3}$ | $R^{B1}$ | $R^{B1}$ | $R^{B1}$ | $R^{B5}$ | O |
| $L_{A706}$ | $R^{B3}$ | $R^{B1}$ | $R^{B1}$ | $R^{B1}$ | $R^{B6}$ | O |
| $L_{A707}$ | $R^{B3}$ | $R^{B1}$ | $R^{B1}$ | $R^{B1}$ | $R^{B7}$ | O |
| $L_{A708}$ | $R^{B3}$ | $R^{B1}$ | $R^{B1}$ | $R^{B1}$ | $R^{B8}$ | O |
| $L_{A709}$ | $R^{B3}$ | $R^{B1}$ | $R^{B1}$ | $R^{B1}$ | $R^{B9}$ | O |
| $L_{A710}$ | $R^{B3}$ | $R^{B1}$ | $R^{B1}$ | $R^{B1}$ | $R^{A2}$ | O |
| $L_{A711}$ | $R^{B3}$ | $R^{B1}$ | $R^{B1}$ | $R^{B1}$ | $R^{A27}$ | O |
| $L_{A712}$ | $R^{B3}$ | $R^{B1}$ | $R^{B1}$ | $R^{B1}$ | $R^{A34}$ | O |
| $L_{A715}$ | $R^{B1}$ | $R^{B1}$ | $R^{B1}$ | $R^{B3}$ | $R^{B1}$ | O |
| $L_{A722}$ | $R^{B1}$ | $R^{B1}$ | $R^{B1}$ | $R^{A2}$ | $R^{B1}$ | O |
| $L_{A727}$ | $R^{B2}$ | $R^{B1}$ | $R^{B1}$ | $R^{B3}$ | $R^{B1}$ | O |
| $L_{A734}$ | $R^{B2}$ | $R^{B1}$ | $R^{B1}$ | $R^{A2}$ | $R^{B1}$ | O |
| $L_{A739}$ | $R^{B2}$ | F | $R^{B1}$ | $R^{B3}$ | $R^{B1}$ | O |
| $L_{A746}$ | $R^{B2}$ | F | $R^{B1}$ | $R^{A2}$ | $R^{B1}$ | O |
| $L_{A749}$ | $R^{B3}$ | $R^{B1}$ | $R^{B1}$ | $R^{B1}$ | $R^{B1}$ | O |
| $L_{A750}$ | $R^{B3}$ | $R^{B1}$ | $R^{B1}$ | $R^{B2}$ | $R^{B1}$ | O |
| $L_{A751}$ | $R^{B3}$ | $R^{B1}$ | $R^{B1}$ | $R^{B3}$ | $R^{B1}$ | O |
| $L_{A752}$ | $R^{B3}$ | $R^{B1}$ | $R^{B1}$ | $R^{B4}$ | $R^{B1}$ | O |
| $L_{A753}$ | $R^{B3}$ | $R^{B1}$ | $R^{B1}$ | $R^{B5}$ | $R^{B1}$ | O |
| $L_{A754}$ | $R^{B3}$ | $R^{B1}$ | $R^{B1}$ | $R^{B6}$ | $R^{B1}$ | O |
| $L_{A755}$ | $R^{B3}$ | $R^{B1}$ | $R^{B1}$ | $R^{B7}$ | $R^{B1}$ | O |
| $L_{A756}$ | $R^{B3}$ | $R^{B1}$ | $R^{B1}$ | $R^{B8}$ | $R^{B1}$ | O |
| $L_{A757}$ | $R^{B3}$ | $R^{B1}$ | $R^{B1}$ | $R^{B9}$ | $R^{B1}$ | O |
| $L_{A758}$ | $R^{B3}$ | $R^{B1}$ | $R^{B1}$ | $R^{A2}$ | $R^{B1}$ | O |
| $L_{A759}$ | $R^{B3}$ | $R^{B1}$ | $R^{B1}$ | $R^{A27}$ | $R^{B1}$ | O |
| $L_{A760}$ | $R^{B3}$ | $R^{B1}$ | $R^{B1}$ | $R^{A34}$ | $R^{B1}$ | O |
| $L_{A763}$ | $R^{B1}$ | $R^{B1}$ | $R^{B3}$ | $R^{B1}$ | $R^{B1}$ | O |
| $L_{A770}$ | $R^{B1}$ | $R^{B1}$ | $R^{A2}$ | $R^{B1}$ | $R^{B1}$ | O |
| $L_{A775}$ | $R^{B2}$ | $R^{B1}$ | $R^{B3}$ | $R^{B1}$ | $R^{B1}$ | O |
| $L_{A782}$ | $R^{B2}$ | $R^{B1}$ | $R^{A2}$ | $R^{B1}$ | $R^{B1}$ | O |
| $L_{A787}$ | $R^{B2}$ | F | $R^{B3}$ | $R^{B1}$ | $R^{B1}$ | O |
| $L_{A794}$ | $R^{B2}$ | F | $R^{A2}$ | $R^{B1}$ | $R^{B1}$ | O |
| $L_{A797}$ | $R^{B3}$ | $R^{B1}$ | $R^{B1}$ | $R^{B1}$ | $R^{B1}$ | O |
| $L_{A798}$ | $R^{B3}$ | $R^{B1}$ | $R^{B2}$ | $R^{B1}$ | $R^{B1}$ | O |
| $L_{A799}$ | $R^{B3}$ | $R^{B1}$ | $R^{B3}$ | $R^{B1}$ | $R^{B1}$ | O |
| $L_{A800}$ | $R^{B3}$ | $R^{B1}$ | $R^{B4}$ | $R^{B1}$ | $R^{B1}$ | O |
| $L_{A801}$ | $R^{B3}$ | $R^{B1}$ | $R^{B5}$ | $R^{B1}$ | $R^{B1}$ | O |
| $L_{A802}$ | $R^{B3}$ | $R^{B1}$ | $R^{B6}$ | $R^{B1}$ | $R^{B1}$ | O |
| $L_{A803}$ | $R^{B3}$ | $R^{B1}$ | $R^{B7}$ | $R^{B1}$ | $R^{B1}$ | O |
| $L_{A804}$ | $R^{B3}$ | $R^{B1}$ | $R^{B8}$ | $R^{B1}$ | $R^{B1}$ | O |
| $L_{A805}$ | $R^{B3}$ | $R^{B1}$ | $R^{B9}$ | $R^{B1}$ | $R^{B1}$ | O |
| $L_{A806}$ | $R^{B3}$ | $R^{B1}$ | $R^{A2}$ | $R^{B1}$ | $R^{B1}$ | O |
| $L_{A807}$ | $R^{B3}$ | $R^{B1}$ | $R^{A27}$ | $R^{B1}$ | $R^{B1}$ | O |
| $L_{A808}$ | $R^{B3}$ | $R^{B1}$ | $R^{A34}$ | $R^{B1}$ | $R^{B1}$ | O |
| $L_{A811}$ | $R^{B1}$ | $R^{B1}$ | $R^{B3}$ | $R^{B1}$ | $R^{B3}$ | O |
| $L_{A818}$ | $R^{B1}$ | $R^{B1}$ | $R^{A2}$ | $R^{B1}$ | $R^{A2}$ | O |
| $L_{A823}$ | $R^{B2}$ | $R^{B1}$ | $R^{B3}$ | $R^{B1}$ | $R^{B3}$ | O |
| $L_{A830}$ | $R^{B2}$ | $R^{B1}$ | $R^{A2}$ | $R^{B1}$ | $R^{A2}$ | O |
| $L_{A835}$ | $R^{B2}$ | F | $R^{B3}$ | $R^{B1}$ | $R^{B3}$ | O |
| $L_{A842}$ | $R^{B2}$ | F | $R^{A2}$ | $R^{B1}$ | $R^{A2}$ | O |
| $L_{A845}$ | $R^{B3}$ | $R^{B1}$ | $R^{B1}$ | $R^{B1}$ | $R^{B1}$ | O |
| $L_{A846}$ | $R^{B3}$ | $R^{B1}$ | $R^{B2}$ | $R^{B1}$ | $R^{B2}$ | O |

-continued

| | $R^1$ | $R^2$ | $R^7$ | $R^8$ | $R^9$ | X |
|---|---|---|---|---|---|---|
| $L_{A847}$ | $R^{B3}$ | $R^{B1}$ | $R^{B3}$ | $R^{B1}$ | $R^{B3}$ | O |
| $L_{A848}$ | $R^{B3}$ | $R^{B1}$ | $R^{B4}$ | $R^{B1}$ | $R^{B4}$ | O |
| $L_{A849}$ | $R^{B3}$ | $R^{B1}$ | $R^{B5}$ | $R^{B1}$ | $R^{B5}$ | O |
| $L_{A850}$ | $R^{B3}$ | $R^{B1}$ | $R^{B6}$ | $R^{B1}$ | $R^{B6}$ | O |
| $L_{A851}$ | $R^{B3}$ | $R^{B1}$ | $R^{B7}$ | $R^{B1}$ | $R^{B7}$ | O |
| $L_{A852}$ | $R^{B3}$ | $R^{B1}$ | $R^{B8}$ | $R^{B1}$ | $R^{B8}$ | O |
| $L_{A853}$ | $R^{B3}$ | $R^{B1}$ | $R^{B9}$ | $R^{B1}$ | $R^{B9}$ | O |
| $L_{A854}$ | $R^{B3}$ | $R^{B1}$ | $R^{A2}$ | $R^{B1}$ | $R^{A2}$ | O |
| $L_{A855}$ | $R^{B3}$ | $R^{B1}$ | $R^{A27}$ | $R^{B1}$ | $R^{A27}$ | O |
| $L_{A856}$ | $R^{B3}$ | $R^{B1}$ | $R^{A34}$ | $R^{B1}$ | $R^{A34}$ | O |
| $L_{A859}$ | $R^{B1}$ | $R^{B1}$ | $R^{B1}$ | $R^{B3}$ | $R^{B3}$ | O |
| $L_{A866}$ | $R^{B1}$ | $R^{B1}$ | $R^{B1}$ | $R^{A2}$ | $R^{A2}$ | O |
| $L_{A871}$ | $R^{B2}$ | $R^{B1}$ | $R^{B1}$ | $R^{B3}$ | $R^{B3}$ | O |
| $L_{A878}$ | $R^{B2}$ | $R^{B1}$ | $R^{B1}$ | $R^{A2}$ | $R^{A2}$ | O |
| $L_{A883}$ | $R^{B2}$ | F | $R^{B1}$ | $R^{B3}$ | $R^{B3}$ | O |
| $L_{A890}$ | $R^{B2}$ | F | $R^{B1}$ | $R^{A2}$ | $R^{A2}$ | O |
| $L_{A893}$ | $R^{B3}$ | $R^{B1}$ | $R^{B1}$ | $R^{B1}$ | $R^{B1}$ | O |
| $L_{A894}$ | $R^{B3}$ | $R^{B1}$ | $R^{B1}$ | $R^{B2}$ | $R^{B2}$ | O |
| $L_{A895}$ | $R^{B3}$ | $R^{B1}$ | $R^{B1}$ | $R^{B3}$ | $R^{B3}$ | O |
| $L_{A896}$ | $R^{B3}$ | $R^{B1}$ | $R^{B1}$ | $R^{B4}$ | $R^{B4}$ | O |
| $L_{A897}$ | $R^{B3}$ | $R^{B1}$ | $R^{B1}$ | $R^{B5}$ | $R^{B5}$ | O |
| $L_{A898}$ | $R^{B3}$ | $R^{B1}$ | $R^{B1}$ | $R^{B6}$ | $R^{B6}$ | O |
| $L_{A899}$ | $R^{B3}$ | $R^{B1}$ | $R^{B1}$ | $R^{B7}$ | $R^{B7}$ | O |
| $L_{A900}$ | $R^{B3}$ | $R^{B1}$ | $R^{B1}$ | $R^{B8}$ | $R^{B8}$ | O |
| $L_{A901}$ | $R^{B3}$ | $R^{B1}$ | $R^{B1}$ | $R^{B9}$ | $R^{B9}$ | O |
| $L_{A902}$ | $R^{B3}$ | $R^{B1}$ | $R^{B1}$ | $R^{A2}$ | $R^{A2}$ | O |
| $L_{A903}$ | $R^{B3}$ | $R^{B1}$ | $R^{B1}$ | $R^{A27}$ | $R^{A27}$ | O |
| $L_{A904}$ | $R^{B3}$ | $R^{B1}$ | $R^{B1}$ | $R^{A34}$ | $R^{A34}$ | O |
| $L_{A907}$ | $R^{B1}$ | $R^{B1}$ | $R^{B3}$ | $R^{B3}$ | $R^{B1}$ | O |
| $L_{A914}$ | $R^{B1}$ | $R^{B1}$ | $R^{A2}$ | $R^{A2}$ | $R^{B1}$ | O |
| $L_{A919}$ | $R^{B2}$ | $R^{B1}$ | $R^{B3}$ | $R^{B3}$ | $R^{B1}$ | O |
| $L_{A926}$ | $R^{B2}$ | $R^{B1}$ | $R^{A2}$ | $R^{A2}$ | $R^{B1}$ | O |
| $L_{A931}$ | $R^{B2}$ | F | $R^{B3}$ | $R^{B3}$ | $R^{B1}$ | O |
| $L_{A938}$ | $R^{B2}$ | F | $R^{A2}$ | $R^{A2}$ | $R^{B1}$ | O |
| $L_{A941}$ | $R^{B3}$ | $R^{B1}$ | $R^{B1}$ | $R^{B1}$ | $R^{B1}$ | O |
| $L_{A942}$ | $R^{B3}$ | $R^{B1}$ | $R^{B2}$ | $R^{B2}$ | $R^{B1}$ | O |
| $L_{A943}$ | $R^{B3}$ | $R^{B1}$ | $R^{B3}$ | $R^{B3}$ | $R^{B1}$ | O |
| $L_{A944}$ | $R^{B3}$ | $R^{B1}$ | $R^{B4}$ | $R^{B4}$ | $R^{B1}$ | O |
| $L_{A945}$ | $R^{B3}$ | $R^{B1}$ | $R^{B5}$ | $R^{B5}$ | $R^{B1}$ | O |
| $L_{A946}$ | $R^{B3}$ | $R^{B1}$ | $R^{B6}$ | $R^{B6}$ | $R^{B1}$ | O |
| $L_{A947}$ | $R^{B3}$ | $R^{B1}$ | $R^{B7}$ | $R^{B7}$ | $R^{B1}$ | O |
| $L_{A948}$ | $R^{B3}$ | $R^{B1}$ | $R^{B8}$ | $R^{B8}$ | $R^{B1}$ | O |
| $L_{A949}$ | $R^{B3}$ | $R^{B1}$ | $R^{B9}$ | $R^{B9}$ | $R^{B1}$ | O |
| $L_{A950}$ | $R^{B3}$ | $R^{B1}$ | $R^{A2}$ | $R^{A2}$ | $R^{B1}$ | O |
| $L_{A951}$ | $R^{B3}$ | $R^{B1}$ | $R^{A27}$ | $R^{A27}$ | $R^{B1}$ | O |
| $L_{A952}$ | $R^{B3}$ | $R^{B1}$ | $R^{A34}$ | $R^{A34}$ | $R^{B1}$ | O |

compounds having a structure of

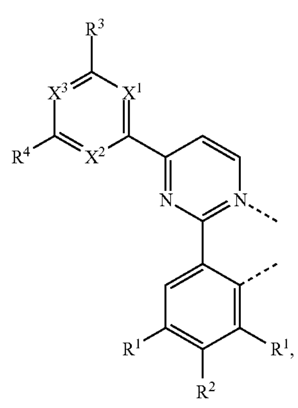

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A955}$ | $R^{B1}$ | $R^{B1}$ | $R^{B3}$ | $R^{B1}$ | N | C | C |
| $L_{A962}$ | $R^{B1}$ | $R^{B1}$ | $R^{A2}$ | $R^{B1}$ | N | C | C |
| $L_{A967}$ | $R^{B2}$ | $R^{B1}$ | $R^{B3}$ | $R^{B1}$ | N | C | C |
| $L_{A974}$ | $R^{B2}$ | $R^{B1}$ | $R^{A2}$ | $R^{B1}$ | N | C | C |
| $L_{A979}$ | $R^{B2}$ | F | $R^{B3}$ | $R^{B1}$ | N | C | C |
| $L_{A986}$ | $R^{B2}$ | F | $R^{A2}$ | $R^{B1}$ | N | C | C |
| $L_{A989}$ | $R^{B3}$ | $R^{B1}$ | $R^{B1}$ | $R^{B1}$ | N | C | C |
| $L_{A990}$ | $R^{B3}$ | $R^{B1}$ | $R^{B2}$ | $R^{B1}$ | N | C | C |
| $L_{A991}$ | $R^{B3}$ | $R^{B1}$ | $R^{B3}$ | $R^{B1}$ | N | C | C |
| $L_{A992}$ | $R^{B3}$ | $R^{B1}$ | $R^{B4}$ | $R^{B1}$ | N | C | C |
| $L_{A993}$ | $R^{B3}$ | $R^{B1}$ | $R^{B5}$ | $R^{B1}$ | N | C | C |
| $L_{A994}$ | $R^{B3}$ | $R^{B1}$ | $R^{B6}$ | $R^{B1}$ | N | C | C |
| $L_{A995}$ | $R^{B3}$ | $R^{B1}$ | $R^{B7}$ | $R^{B1}$ | N | C | C |
| $L_{A996}$ | $R^{B3}$ | $R^{B1}$ | $R^{B8}$ | $R^{B1}$ | N | C | C |
| $L_{A997}$ | $R^{B3}$ | $R^{B1}$ | $R^{B9}$ | $R^{B1}$ | N | C | C |
| $L_{A998}$ | $R^{B3}$ | $R^{B1}$ | $R^{A2}$ | $R^{B1}$ | N | C | C |
| $L_{A999}$ | $R^{B3}$ | $R^{B1}$ | $R^{A27}$ | $R^{B1}$ | N | C | C |
| $L_{A1000}$ | $R^{B3}$ | $R^{B1}$ | $R^{A34}$ | $R^{B1}$ | N | C | C |
| $L_{A1003}$ | $R^{B1}$ | $R^{B1}$ | $R^{B3}$ | $R^{B3}$ | N | N | C |
| $L_{A1010}$ | $R^{B1}$ | $R^{B1}$ | $R^{A2}$ | $R^{A2}$ | N | N | C |
| $L_{A1015}$ | $R^{B2}$ | $R^{B1}$ | $R^{B3}$ | $R^{B3}$ | N | N | C |
| $L_{A1022}$ | $R^{B2}$ | $R^{B1}$ | $R^{A2}$ | $R^{A2}$ | N | N | C |
| $L_{A1027}$ | $R^{B2}$ | F | $R^{B3}$ | $R^{B3}$ | N | N | C |
| $L_{A1034}$ | $R^{B2}$ | F | $R^{A2}$ | $R^{A2}$ | N | N | C |
| $L_{A1037}$ | $R^{B3}$ | $R^{B1}$ | $R^{B1}$ | $R^{B1}$ | N | N | C |
| $L_{A1038}$ | $R^{B3}$ | $R^{B1}$ | $R^{B2}$ | $R^{B2}$ | N | N | C |
| $L_{A1039}$ | $R^{B3}$ | $R^{B1}$ | $R^{B3}$ | $R^{B3}$ | N | N | C |
| $L_{A1040}$ | $R^{B3}$ | $R^{B1}$ | $R^{B4}$ | $R^{B4}$ | N | N | C |
| $L_{A1041}$ | $R^{B3}$ | $R^{B1}$ | $R^{B5}$ | $R^{B5}$ | N | N | C |
| $L_{A1042}$ | $R^{B3}$ | $R^{B1}$ | $R^{B6}$ | $R^{B6}$ | N | N | C |
| $L_{A1043}$ | $R^{B3}$ | $R^{B1}$ | $R^{B7}$ | $R^{B7}$ | N | N | C |
| $L_{A1044}$ | $R^{B3}$ | $R^{B1}$ | $R^{B8}$ | $R^{B8}$ | N | N | C |
| $L_{A1045}$ | $R^{B3}$ | $R^{B1}$ | $R^{B9}$ | $R^{B9}$ | N | N | C |
| $L_{A1046}$ | $R^{B3}$ | $R^{B1}$ | $R^{A2}$ | $R^{A2}$ | N | N | C |
| $L_{A1047}$ | $R^{B3}$ | $R^{B1}$ | $R^{A27}$ | $R^{A27}$ | N | N | C |
| $L_{A1048}$ | $R^{B3}$ | $R^{B1}$ | $R^{A34}$ | $R^{A34}$ | N | N | C |
| $L_{A1051}$ | $R^{B1}$ | $R^{B1}$ | $R^{B3}$ | $R^{B3}$ | N | N | N |
| $L_{A1058}$ | $R^{B1}$ | $R^{B1}$ | $R^{A2}$ | $R^{A2}$ | N | N | N |
| $L_{A1063}$ | $R^{B2}$ | $R^{B1}$ | $R^{B3}$ | $R^{B3}$ | N | N | N |
| $L_{A1070}$ | $R^{B2}$ | $R^{B1}$ | $R^{A2}$ | $R^{A2}$ | N | N | N |
| $L_{A1075}$ | $R^{B2}$ | F | $R^{B3}$ | $R^{B3}$ | N | N | N |
| $L_{A1082}$ | $R^{B2}$ | F | $R^{A2}$ | $R^{A2}$ | N | N | N |
| $L_{A1085}$ | $R^{B3}$ | $R^{B1}$ | $R^{B1}$ | $R^{B1}$ | N | N | N |
| $L_{A1086}$ | $R^{B3}$ | $R^{B1}$ | $R^{B2}$ | $R^{B2}$ | N | N | N |
| $L_{A1087}$ | $R^{B3}$ | $R^{B1}$ | $R^{B3}$ | $R^{B3}$ | N | N | N |
| $L_{A1088}$ | $R^{B3}$ | $R^{B1}$ | $R^{B4}$ | $R^{B4}$ | N | N | N |
| $L_{A1089}$ | $R^{B3}$ | $R^{B1}$ | $R^{B5}$ | $R^{B5}$ | N | N | N |
| $L_{A1090}$ | $R^{B3}$ | $R^{B1}$ | $R^{B6}$ | $R^{B6}$ | N | N | N |
| $L_{A1091}$ | $R^{B3}$ | $R^{B1}$ | $R^{B7}$ | $R^{B7}$ | N | N | N |
| $L_{A1092}$ | $R^{B3}$ | $R^{B1}$ | $R^{B8}$ | $R^{B8}$ | N | N | N |
| $L_{A1093}$ | $R^{B3}$ | $R^{B1}$ | $R^{B9}$ | $R^{B9}$ | N | N | N |
| $L_{A1094}$ | $R^{B3}$ | $R^{B1}$ | $R^{A2}$ | $R^{A2}$ | N | N | N |
| $L_{A1095}$ | $R^{B3}$ | $R^{B1}$ | $R^{A27}$ | $R^{A27}$ | N | N | N |
| $L_{A1096}$ | $R^{B3}$ | $R^{B1}$ | $R^{A34}$ | $R^{A34}$ | N | N | N |

compounds having a structure of

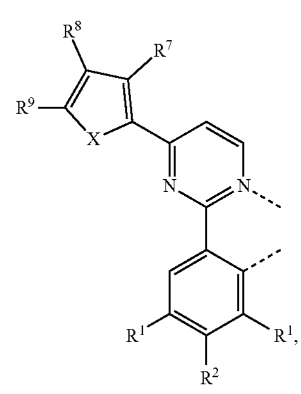

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A1427}$ | $R^{B1}$ | $R^{B1}$ | $R^{B3}$ | $R^{B1}$ | $R^{B1}$ | S |
| $L_{A1434}$ | $R^{B1}$ | $R^{B1}$ | $R^{A2}$ | $R^{B1}$ | $R^{B1}$ | S |
| $L_{A1439}$ | $R^{B2}$ | $R^{B1}$ | $R^{B3}$ | $R^{B1}$ | $R^{B1}$ | S |
| $L_{A1446}$ | $R^{B2}$ | $R^{B1}$ | $R^{A2}$ | $R^{B1}$ | $R^{B1}$ | S |
| $L_{A1451}$ | $R^{B2}$ | F | $R^{B3}$ | $R^{B1}$ | $R^{B1}$ | S |
| $L_{A1458}$ | $R^{B2}$ | F | $R^{A2}$ | $R^{B1}$ | $R^{B1}$ | S |
| $L_{A1462}$ | $R^{B3}$ | $R^{B1}$ | $R^{B2}$ | $R^{B1}$ | $R^{B1}$ | S |
| $L_{A1463}$ | $R^{B3}$ | $R^{B1}$ | $R^{B3}$ | $R^{B1}$ | $R^{B1}$ | S |
| $L_{A1464}$ | $R^{B3}$ | $R^{B1}$ | $R^{B4}$ | $R^{B1}$ | $R^{B1}$ | S |
| $L_{A1465}$ | $R^{B3}$ | $R^{B1}$ | $R^{B5}$ | $R^{B1}$ | $R^{B1}$ | S |
| $L_{A1466}$ | $R^{B3}$ | $R^{B1}$ | $R^{B6}$ | $R^{B1}$ | $R^{B1}$ | S |
| $L_{A1467}$ | $R^{B3}$ | $R^{B1}$ | $R^{B7}$ | $R^{B1}$ | $R^{B1}$ | S |
| $L_{A1468}$ | $R^{B3}$ | $R^{B1}$ | $R^{B8}$ | $R^{B1}$ | $R^{B1}$ | S |
| $L_{A1469}$ | $R^{B3}$ | $R^{B1}$ | $R^{B5}$ | $R^{B1}$ | $R^{B1}$ | S |
| $L_{A1470}$ | $R^{B3}$ | $R^{B1}$ | $R^{A2}$ | $R^{B1}$ | $R^{B1}$ | S |
| $L_{A1471}$ | $R^{B3}$ | $R^{B1}$ | $R^{A27}$ | $R^{B1}$ | $R^{B1}$ | S |
| $L_{A1472}$ | $R^{B3}$ | $R^{B1}$ | $R^{A34}$ | $R^{B1}$ | $R^{B1}$ | S |
| $L_{A1475}$ | $R^{B1}$ | $R^{B1}$ | $R^{B3}$ | $R^{B1}$ | $R^{B3}$ | S |
| $L_{A1482}$ | $R^{B1}$ | $R^{B1}$ | $R^{A2}$ | $R^{B1}$ | $R^{A2}$ | S |
| $L_{A1487}$ | $R^{B2}$ | $R^{B1}$ | $R^{B3}$ | $R^{B1}$ | $R^{B3}$ | S |
| $L_{A1494}$ | $R^{B2}$ | $R^{B1}$ | $R^{A2}$ | $R^{B1}$ | $R^{A2}$ | S |
| $L_{A1499}$ | $R^{B2}$ | F | $R^{B3}$ | $R^{B1}$ | $R^{B3}$ | S |
| $L_{A1506}$ | $R^{B2}$ | F | $R^{A2}$ | $R^{B1}$ | $R^{A2}$ | S |
| $L_{A1510}$ | $R^{B3}$ | $R^{B1}$ | $R^{B2}$ | $R^{B1}$ | $R^{B2}$ | S |
| $L_{A1511}$ | $R^{B3}$ | $R^{B1}$ | $R^{B3}$ | $R^{B1}$ | $R^{B3}$ | S |
| $L_{A1512}$ | $R^{B3}$ | $R^{B1}$ | $R^{B4}$ | $R^{B1}$ | $R^{B4}$ | S |
| $L_{A1513}$ | $R^{B3}$ | $R^{B1}$ | $R^{B5}$ | $R^{B1}$ | $R^{B5}$ | S |
| $L_{A1514}$ | $R^{B3}$ | $R^{B1}$ | $R^{B6}$ | $R^{B1}$ | $R^{B6}$ | S |
| $L_{A1515}$ | $R^{B3}$ | $R^{B1}$ | $R^{B7}$ | $R^{B1}$ | $R^{B7}$ | S |
| $L_{A1516}$ | $R^{B3}$ | $R^{B1}$ | $R^{B8}$ | $R^{B1}$ | $R^{B8}$ | S |
| $L_{A1517}$ | $R^{B3}$ | $R^{B1}$ | $R^{B9}$ | $R^{B1}$ | $R^{B9}$ | S |
| $L_{A1518}$ | $R^{B3}$ | $R^{B1}$ | $R^{A2}$ | $R^{B1}$ | $R^{A2}$ | S |
| $L_{A1519}$ | $R^{B3}$ | $R^{B1}$ | $R^{A27}$ | $R^{B1}$ | $R^{A27}$ | S |
| $L_{A1520}$ | $R^{B3}$ | $R^{B1}$ | $R^{A34}$ | $R^{B1}$ | $R^{A34}$ | S |
| $L_{A1571}$ | $R^{B1}$ | $R^{B1}$ | $R^{B3}$ | $R^{B3}$ | $R^{B1}$ | S |
| $L_{A1578}$ | $R^{B1}$ | $R^{B1}$ | $R^{A2}$ | $R^{A2}$ | $R^{B1}$ | S |
| $L_{A1583}$ | $R^{B2}$ | $R^{B1}$ | $R^{B3}$ | $R^{B3}$ | $R^{B1}$ | S |
| $L_{A1590}$ | $R^{B2}$ | $R^{B1}$ | $R^{A2}$ | $R^{A2}$ | $R^{B1}$ | S |
| $L_{A1595}$ | $R^{B2}$ | F | $R^{B3}$ | $R^{B3}$ | $R^{B1}$ | S |
| $L_{A1602}$ | $R^{B2}$ | F | $R^{A2}$ | $R^{A2}$ | $R^{B1}$ | S |
| $L_{A1606}$ | $R^{B3}$ | $R^{B1}$ | $R^{B2}$ | $R^{B2}$ | $R^{B1}$ | S |
| $L_{A1607}$ | $R^{B3}$ | $R^{B1}$ | $R^{B3}$ | $R^{B3}$ | $R^{B1}$ | S |
| $L_{A1608}$ | $R^{B3}$ | $R^{B1}$ | $R^{B4}$ | $R^{B4}$ | $R^{B1}$ | S |
| $L_{A1609}$ | $R^{B3}$ | $R^{B1}$ | $R^{B5}$ | $R^{B5}$ | $R^{B1}$ | S |
| $L_{A1610}$ | $R^{B3}$ | $R^{B1}$ | $R^{B6}$ | $R^{B6}$ | $R^{B1}$ | S |
| $L_{A1611}$ | $R^{B3}$ | $R^{B1}$ | $R^{B7}$ | $R^{B7}$ | $R^{B1}$ | S |
| $L_{A1612}$ | $R^{B3}$ | $R^{B1}$ | $R^{B8}$ | $R^{B8}$ | $R^{B1}$ | S |
| $L_{A1613}$ | $R^{B3}$ | $R^{B1}$ | $R^{B9}$ | $R^{B9}$ | $R^{B1}$ | S |
| $L_{A1614}$ | $R^{B3}$ | $R^{B1}$ | $R^{A2}$ | $R^{A2}$ | $R^{B1}$ | S |
| $L_{A1615}$ | $R^{B3}$ | $R^{B1}$ | $R^{A27}$ | $R^{A27}$ | $R^{B1}$ | S |
| $L_{A1616}$ | $R^{B3}$ | $R^{B1}$ | $R^{A34}$ | $R^{A34}$ | $R^{B1}$ | S |
| $L_{A1619}$ | $R^{B1}$ | $R^{B1}$ | $R^{B1}$ | $R^{B1}$ | $R^{B3}$ | O |
| $L_{A1626}$ | $R^{B1}$ | $R^{B1}$ | $R^{B1}$ | $R^{B1}$ | $R^{A2}$ | O |
| $L_{A1631}$ | $R^{B2}$ | $R^{B1}$ | $R^{B1}$ | $R^{B1}$ | $R^{B3}$ | O |
| $L_{A1638}$ | $R^{B2}$ | $R^{B1}$ | $R^{B1}$ | $R^{B1}$ | $R^{A2}$ | O |
| $L_{A1643}$ | $R^{B2}$ | F | $R^{B1}$ | $R^{B1}$ | $R^{B3}$ | O |
| $L_{A1650}$ | $R^{B2}$ | F | $R^{B1}$ | $R^{B1}$ | $R^{A2}$ | O |
| $L_{A1653}$ | $R^{B3}$ | $R^{B1}$ | $R^{B1}$ | $R^{B1}$ | $R^{B1}$ | O |
| $L_{A1654}$ | $R^{B3}$ | $R^{B1}$ | $R^{B1}$ | $R^{B1}$ | $R^{B2}$ | O |
| $L_{A1655}$ | $R^{B3}$ | $R^{B1}$ | $R^{B1}$ | $R^{B1}$ | $R^{B3}$ | O |
| $L_{A1656}$ | $R^{B3}$ | $R^{B1}$ | $R^{B1}$ | $R^{B1}$ | $R^{B4}$ | O |
| $L_{A1657}$ | $R^{B3}$ | $R^{B1}$ | $R^{B1}$ | $R^{B1}$ | $R^{B5}$ | O |
| $L_{A1658}$ | $R^{B3}$ | $R^{B1}$ | $R^{B1}$ | $R^{B1}$ | $R^{B6}$ | O |
| $L_{A1659}$ | $R^{B3}$ | $R^{B1}$ | $R^{B1}$ | $R^{B1}$ | $R^{B7}$ | O |
| $L_{A1660}$ | $R^{B3}$ | $R^{B1}$ | $R^{B1}$ | $R^{B}$ | $R^{B8}$ | O |
| $L_{A1661}$ | $R^{B3}$ | $R^{B1}$ | $R^{B1}$ | $R^{B1}$ | $R^{B9}$ | O |
| $L_{A1662}$ | $R^{B3}$ | $R^{B1}$ | $R^{B1}$ | $R^{B1}$ | $R^{A2}$ | O |
| $L_{A1663}$ | $R^{B3}$ | $R^{B1}$ | $R^{B1}$ | $R^{B1}$ | $R^{A27}$ | O |
| $L_{A1664}$ | $R^{B3}$ | $R^{B1}$ | $R^{B1}$ | $R^{B1}$ | $R^{A34}$ | O |
| $L_{A1667}$ | $R^{B1}$ | $R^{B1}$ | $R^{B1}$ | $R^{B3}$ | $R^{B1}$ | O |
| $L_{A1674}$ | $R^{B1}$ | $R^{B1}$ | $R^{B1}$ | $R^{A2}$ | $R^{B1}$ | O |
| $L_{A1679}$ | $R^{B2}$ | $R^{B1}$ | $R^{B1}$ | $R^{B3}$ | $R^{B1}$ | O |
| $L_{A1686}$ | $R^{B2}$ | $R^{B1}$ | $R^{B1}$ | $R^{A2}$ | $R^{B1}$ | O |
| $L_{A1691}$ | $R^{B2}$ | F | $R^{B1}$ | $R^{B3}$ | $R^{B1}$ | O |
| $L_{A1698}$ | $R^{B2}$ | F | $R^{B1}$ | $R^{A2}$ | $R^{B1}$ | O |

-continued

| | $R^1$ | $R^2$ | $R^7$ | $R^8$ | $R^9$ | X |
|---|---|---|---|---|---|---|
| $L_{A1701}$ | $R^{B3}$ | $R^{B1}$ | $R^{B1}$ | $R^{B1}$ | $R^{B1}$ | O |
| $L_{A1702}$ | $R^{B3}$ | $R^{B1}$ | $R^{B1}$ | $R^{B2}$ | $R^{B1}$ | O |
| $L_{A1703}$ | $R^{B3}$ | $R^{B1}$ | $R^{B1}$ | $R^{B3}$ | $R^{B1}$ | O |
| $L_{A1704}$ | $R^{B3}$ | $R^{B1}$ | $R^{B1}$ | $R^{B4}$ | $R^{B1}$ | O |
| $L_{A1705}$ | $R^{B3}$ | $R^{B1}$ | $R^{B1}$ | $R^{B5}$ | $R^{B1}$ | O |
| $L_{A1706}$ | $R^{B3}$ | $R^{B1}$ | $R^{B1}$ | $R^{B6}$ | $R^{B1}$ | O |
| $L_{A1707}$ | $R^{B3}$ | $R^{B1}$ | $R^{B1}$ | $R^{B7}$ | $R^{B1}$ | O |
| $L_{A1708}$ | $R^{B3}$ | $R^{B1}$ | $R^{B1}$ | $R^{B8}$ | $R^{B1}$ | O |
| $L_{A1709}$ | $R^{B3}$ | $R^{B1}$ | $R^{B1}$ | $R^{B9}$ | $R^{B1}$ | O |
| $L_{A1710}$ | $R^{B3}$ | $R^{B1}$ | $R^{B1}$ | $R^{A2}$ | $R^{B1}$ | O |
| $L_{A1711}$ | $R^{B3}$ | $R^{B1}$ | $R^{B1}$ | $R^{A27}$ | $R^{B1}$ | O |
| $L_{A1712}$ | $R^{B3}$ | $R^{B1}$ | $R^{B1}$ | $R^{A34}$ | $R^{B1}$ | O |
| $L_{A1715}$ | $R^{B1}$ | $R^{B1}$ | $R^{B3}$ | $R^{B1}$ | $R^{B1}$ | O |
| $L_{A1722}$ | $R^{B1}$ | $R^{B1}$ | $R^{A2}$ | $R^{B1}$ | $R^{B1}$ | O |
| $L_{A1727}$ | $R^{B2}$ | $R^{B1}$ | $R^{B3}$ | $R^{B1}$ | $R^{B1}$ | O |
| $L_{A1734}$ | $R^{B2}$ | $R^{B1}$ | $R^{A2}$ | $R^{B1}$ | $R^{B1}$ | O |
| $L_{A1739}$ | $R^{B2}$ | F | $R^{B3}$ | $R^{B1}$ | $R^{B1}$ | O |
| $L_{A1746}$ | $R^{B2}$ | F | $R^{A2}$ | $R^{B1}$ | $R^{B1}$ | O |
| $L_{A1749}$ | $R^{B3}$ | $R^{B1}$ | $R^{B1}$ | $R^{B1}$ | $R^{B1}$ | O |
| $L_{A1750}$ | $R^{B3}$ | $R^{B1}$ | $R^{B2}$ | $R^{B1}$ | $R^{B1}$ | O |
| $L_{A1751}$ | $R^{B3}$ | $R^{B1}$ | $R^{B3}$ | $R^{B1}$ | $R^{B1}$ | O |
| $L_{A1752}$ | $R^{B3}$ | $R^{B1}$ | $R^{B4}$ | $R^{B1}$ | $R^{B1}$ | O |
| $L_{A1753}$ | $R^{B3}$ | $R^{B1}$ | $R^{B5}$ | $R^{B1}$ | $R^{B1}$ | O |
| $L_{A1754}$ | $R^{B3}$ | $R^{B1}$ | $R^{B6}$ | $R^{B1}$ | $R^{B1}$ | O |
| $L_{A1755}$ | $R^{B3}$ | $R^{B1}$ | $R^{B7}$ | $R^{B1}$ | $R^{B1}$ | O |
| $L_{A1756}$ | $R^{B3}$ | $R^{B1}$ | $R^{B8}$ | $R^{B1}$ | $R^{B1}$ | O |
| $L_{A1757}$ | $R^{B3}$ | $R^{B1}$ | $R^{B9}$ | $R^{B1}$ | $R^{B1}$ | O |
| $L_{A1758}$ | $R^{B3}$ | $R^{B1}$ | $R^{A2}$ | $R^{B1}$ | $R^{B1}$ | O |
| $L_{A1759}$ | $R^{B3}$ | $R^{B1}$ | $R^{A27}$ | $R^{B1}$ | $R^{B1}$ | O |
| $L_{A1760}$ | $R^{B3}$ | $R^{B1}$ | $R^{A34}$ | $R^{B1}$ | $R^{B1}$ | O |
| $L_{A1763}$ | $R^{B1}$ | $R^{B1}$ | $R^{B3}$ | $R^{B1}$ | $R^{B3}$ | O |
| $L_{A1770}$ | $R^{B1}$ | $R^{B1}$ | $R^{A2}$ | $R^{B1}$ | $R^{A2}$ | O |
| $L_{A1775}$ | $R^{B2}$ | $R^{B1}$ | $R^{B3}$ | $R^{B1}$ | $R^{B3}$ | O |
| $L_{A1782}$ | $R^{B2}$ | $R^{B1}$ | $R^{A2}$ | $R^{B1}$ | $R^{A2}$ | O |
| $L_{A1787}$ | $R^{B2}$ | F | $R^{B3}$ | $R^{B1}$ | $R^{B3}$ | O |
| $L_{A1794}$ | $R^{B2}$ | F | $R^{A2}$ | $R^{B}$ | $R^{A2}$ | O |
| $L_{A1797}$ | $R^{B3}$ | $R^{B1}$ | $R^{B1}$ | $R^{B1}$ | $R^{B1}$ | O |
| $L_{A1798}$ | $R^{B3}$ | $R^{B1}$ | $R^{B2}$ | $R^{B1}$ | $R^{B2}$ | O |
| $L_{A1799}$ | $R^{B3}$ | $R^{B1}$ | $R^{B3}$ | $R^{B1}$ | $R^{B3}$ | O |
| $L_{A1800}$ | $R^{B3}$ | $R^{B1}$ | $R^{B4}$ | $R^{B1}$ | $R^{B4}$ | O |
| $L_{A1801}$ | $R^{B3}$ | $R^{B1}$ | $R^{B5}$ | $R^{B1}$ | $R^{B5}$ | O |
| $L_{A1802}$ | $R^{B3}$ | $R^{B1}$ | $R^{B6}$ | $R^{B1}$ | $R^{B6}$ | O |
| $L_{A1803}$ | $R^{B3}$ | $R^{B1}$ | $R^{B7}$ | $R^{B1}$ | $R^{B7}$ | O |
| $L_{A1804}$ | $R^{B3}$ | $R^{B1}$ | $R^{B8}$ | $R^{B1}$ | $R^{B8}$ | O |
| $L_{A1805}$ | $R^{B3}$ | $R^{B1}$ | $R^{B9}$ | $R^{B1}$ | $R^{B9}$ | O |
| $L_{A1806}$ | $R^{B3}$ | $R^{B1}$ | $R^{A2}$ | $R^{B1}$ | $R^{A2}$ | O |
| $L_{A1807}$ | $R^{B3}$ | $R^{B1}$ | $R^{A27}$ | $R^{B1}$ | $R^{A27}$ | O |
| $L_{A1808}$ | $R^{B3}$ | $R^{B1}$ | $R^{A34}$ | $R^{B1}$ | $R^{A34}$ | O |
| $L_{A1811}$ | $R^{B1}$ | $R^{B1}$ | $R^{B1}$ | $R^{B3}$ | $R^{B3}$ | O |
| $L_{A1818}$ | $R^{B1}$ | $R^{B1}$ | $R^{B1}$ | $R^{A2}$ | $R^{A2}$ | O |
| $L_{A1823}$ | $R^{B2}$ | $R^{B1}$ | $R^{B1}$ | $R^{B3}$ | $R^{B3}$ | O |
| $L_{A1830}$ | $R^{B2}$ | $R^{B1}$ | $R^{B1}$ | $R^{A2}$ | $R^{A2}$ | O |
| $L_{A1835}$ | $R^{B2}$ | F | $R^{B1}$ | $R^{B3}$ | $R^{B3}$ | O |
| $L_{A1842}$ | $R^{B2}$ | F | $R^{B1}$ | $R^{A2}$ | $R^{A2}$ | O |
| $L_{A1845}$ | $R^{B3}$ | $R^{B1}$ | $R^{B1}$ | $R^{B1}$ | $R^{B1}$ | O |
| $L_{A1846}$ | $R^{B3}$ | $R^{B1}$ | $R^{B1}$ | $R^{B2}$ | $R^{B2}$ | O |
| $L_{A1847}$ | $R^{B3}$ | $R^{B1}$ | $R^{B1}$ | $R^{B3}$ | $R^{B3}$ | O |
| $L_{A1848}$ | $R^{B3}$ | $R^{B1}$ | $R^{B1}$ | $R^{B4}$ | $R^{B4}$ | O |
| $L_{A1849}$ | $R^{B3}$ | $R^{B1}$ | $R^{B1}$ | $R^{B5}$ | $R^{B5}$ | O |
| $L_{A1850}$ | $R^{B3}$ | $R^{B1}$ | $R^{B1}$ | $R^{B6}$ | $R^{B6}$ | O |
| $L_{A1851}$ | $R^{B3}$ | $R^{B1}$ | $R^{B1}$ | $R^{B7}$ | $R^{B7}$ | O |
| $L_{A1852}$ | $R^{B3}$ | $R^{B1}$ | $R^{B1}$ | $R^{B8}$ | $R^{B8}$ | O |
| $L_{A1853}$ | $R^{B3}$ | $R^{B1}$ | $R^{B1}$ | $R^{B9}$ | $R^{B9}$ | O |
| $L_{A1854}$ | $R^{B3}$ | $R^{B1}$ | $R^{B1}$ | $R^{A2}$ | $R^{A2}$ | O |
| $L_{A1855}$ | $R^{B3}$ | $R^{B1}$ | $R^{B1}$ | $R^{A27}$ | $R^{A27}$ | O |
| $L_{A1856}$ | $R^{B3}$ | $R^{B1}$ | $R^{B1}$ | $R^{A34}$ | $R^{A34}$ | O |
| $L_{A1859}$ | $R^{B1}$ | $R^{B1}$ | $R^{B3}$ | $R^{B3}$ | $R^{B1}$ | O |
| $L_{A1866}$ | $R^{B1}$ | $R^{B1}$ | $R^{A2}$ | $R^{A2}$ | $R^{B1}$ | O |
| $L_{A1871}$ | $R^{B2}$ | $R^{B1}$ | $R^{B3}$ | $R^{B3}$ | $R^{B1}$ | O |
| $L_{A1878}$ | $R^{B2}$ | $R^{B1}$ | $R^{A2}$ | $R^{A2}$ | $R^{B1}$ | O |
| $L_{A1883}$ | $R^{B2}$ | F | $R^{B3}$ | $R^{B3}$ | $R^{B1}$ | O |
| $L_{A1890}$ | $R^{B2}$ | F | $R^{A2}$ | $R^{A2}$ | $R^{B1}$ | O |
| $L_{A1895}$ | $R^{B3}$ | $R^{B1}$ | $R^{B3}$ | $R^{B3}$ | $R^{B1}$ | O |
| $L_{A1902}$ | $R^{B3}$ | $R^{B1}$ | $R^{A2}$ | $R^{A2}$ | $R^{B1}$ | O |

compounds having a structure of

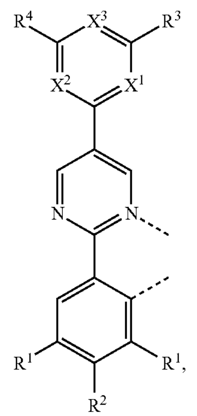

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A1907}$ | $R^{B1}$ | $R^{B1}$ | $R^{B3}$ | $R^{B1}$ | N | C | C |
| $L_{A1914}$ | $R^{B1}$ | $R^{B1}$ | $R^{A2}$ | $R^{B1}$ | N | C | C |
| $L_{A1919}$ | $R^{B2}$ | $R^{B1}$ | $R^{B3}$ | $R^{B1}$ | N | C | C |
| $L_{A1926}$ | $R^{B2}$ | $R^{B1}$ | $R^{A2}$ | $R^{B1}$ | N | C | C |
| $L_{A1931}$ | $R^{B2}$ | F | $R^{B3}$ | $R^{B1}$ | N | C | C |
| $L_{A1938}$ | $R^{B2}$ | F | $R^{A2}$ | $R^{B1}$ | N | C | C |
| $L_{A1941}$ | $R^{B3}$ | $R^{B1}$ | $R^{B1}$ | $R^{B1}$ | N | C | C |
| $L_{A1942}$ | $R^{B3}$ | $R^{B1}$ | $R^{B2}$ | $R^{B1}$ | N | C | C |
| $L_{A1943}$ | $R^{B3}$ | $R^{B1}$ | $R^{B3}$ | $R^{B1}$ | N | C | C |
| $L_{A1944}$ | $R^{B3}$ | $R^{B1}$ | $R^{B4}$ | $R^{B1}$ | N | C | C |
| $L_{A1945}$ | $R^{B3}$ | $R^{B1}$ | $R^{B5}$ | $R^{B1}$ | N | C | C |
| $L_{A1946}$ | $R^{B3}$ | $R^{B1}$ | $R^{B6}$ | $R^{B1}$ | N | C | C |
| $L_{A1947}$ | $R^{B3}$ | $R^{B1}$ | $R^{B7}$ | $R^{B1}$ | N | C | C |
| $L_{A1948}$ | $R^{B3}$ | $R^{B1}$ | $R^{B8}$ | $R^{B1}$ | N | C | C |
| $L_{A1949}$ | $R^{B3}$ | $R^{B1}$ | $R^{B9}$ | $R^{B1}$ | N | C | C |
| $L_{A1950}$ | $R^{B3}$ | $R^{B1}$ | $R^{A2}$ | $R^{B1}$ | N | C | C |
| $L_{A1951}$ | $R^{B3}$ | $R^{B1}$ | $R^{A27}$ | $R^{B1}$ | N | C | C |
| $L_{A1952}$ | $R^{B3}$ | $R^{B1}$ | $R^{A34}$ | $R^{B1}$ | N | C | C |
| $L_{A1955}$ | $R^{B1}$ | $R^{B1}$ | $R^{B3}$ | $R^{B3}$ | N | N | C |
| $L_{A1962}$ | $R^{B1}$ | $R^{B1}$ | $R^{A2}$ | $R^{A2}$ | N | N | C |
| $L_{A1967}$ | $R^{B2}$ | $R^{B1}$ | $R^{B3}$ | $R^{B3}$ | N | N | C |
| $L_{A1974}$ | $R^{B2}$ | $R^{B1}$ | $R^{A2}$ | $R^{A2}$ | N | N | C |
| $L_{A1979}$ | $R^{B2}$ | F | $R^{B3}$ | $R^{B3}$ | N | N | C |
| $L_{A1986}$ | $R^{B2}$ | F | $R^{A2}$ | $R^{A2}$ | N | N | C |
| $L_{A1989}$ | $R^{B3}$ | $R^{B1}$ | $R^{B1}$ | $R^{B1}$ | N | N | C |
| $L_{A1990}$ | $R^{B3}$ | $R^{B1}$ | $R^{B2}$ | $R^{B2}$ | N | N | C |
| $L_{A1991}$ | $R^{B3}$ | $R^{B1}$ | $R^{B3}$ | $R^{B3}$ | N | N | C |
| $L_{A1992}$ | $R^{B3}$ | $R^{B1}$ | $R^{B4}$ | $R^{B4}$ | N | N | C |
| $L_{A1993}$ | $R^{B3}$ | $R^{B1}$ | $R^{B5}$ | $R^{B5}$ | N | N | C |
| $L_{A1994}$ | $R^{B3}$ | $R^{B1}$ | $R^{B6}$ | $R^{B6}$ | N | N | C |
| $L_{A1995}$ | $R^{B3}$ | $R^{B1}$ | $R^{B7}$ | $R^{B7}$ | N | N | C |
| $L_{A1996}$ | $R^{B3}$ | $R^{B1}$ | $R^{B8}$ | $R^{B8}$ | N | N | C |
| $L_{A1997}$ | $R^{B3}$ | $R^{B1}$ | $R^{B9}$ | $R^{B9}$ | N | N | C |
| $L_{A1998}$ | $R^{B3}$ | $R^{B1}$ | $R^{A2}$ | $R^{A2}$ | N | N | C |
| $L_{A1999}$ | $R^{B3}$ | $R^{B1}$ | $R^{A27}$ | $R^{A27}$ | N | N | C |
| $L_{A2000}$ | $R^{B3}$ | $R^{B1}$ | $R^{A34}$ | $R^{A34}$ | N | N | C |
| $L_{A2003}$ | $R^{B1}$ | $R^{B1}$ | $R^{B3}$ | $R^{B3}$ | N | N | N |
| $L_{A2010}$ | $R^{B1}$ | $R^{B1}$ | $R^{A2}$ | $R^{A2}$ | N | N | N |
| $L_{A2015}$ | $R^{B2}$ | $R^{B1}$ | $R^{B3}$ | $R^{B3}$ | N | N | N |
| $L_{A2022}$ | $R^{B2}$ | $R^{B1}$ | $R^{A2}$ | $R^{A2}$ | N | N | N |
| $L_{A2027}$ | $R^{B2}$ | F | $R^{B3}$ | $R^{B3}$ | N | N | N |
| $L_{A2034}$ | $R^{B2}$ | F | $R^{A2}$ | $R^{A2}$ | N | N | N |
| $L_{A2037}$ | $R^{B3}$ | $R^{B1}$ | $R^{B1}$ | $R^{B1}$ | N | N | N |
| $L_{A2038}$ | $R^{B3}$ | $R^{B1}$ | $R^{B2}$ | $R^{B2}$ | N | N | N |
| $L_{A2039}$ | $R^{B3}$ | $R^{B1}$ | $R^{B3}$ | $R^{B3}$ | N | N | N |
| $L_{A2040}$ | $R^{B3}$ | $R^{B1}$ | $R^{B4}$ | $R^{B4}$ | N | N | N |
| $L_{A2041}$ | $R^{B3}$ | $R^{B1}$ | $R^{B5}$ | $R^{B5}$ | N | N | N |
| $L_{A2042}$ | $R^{B3}$ | $R^{B1}$ | $R^{B6}$ | $R^{B6}$ | N | N | N |
| $L_{A2043}$ | $R^{B3}$ | $R^{B1}$ | $R^{B7}$ | $R^{B7}$ | N | N | N |
| $L_{A2044}$ | $R^{B3}$ | $R^{B1}$ | $R^{B8}$ | $R^{B8}$ | N | N | N |

-continued

| | $R^1$ | $R^2$ | $R^3$ | $R^4$ | $X^1$ | $X^2$ | $X^3$ |
|---|---|---|---|---|---|---|---|
| $L_{A2045}$ | $R^{B3}$ | $R^{B1}$ | $R^{B9}$ | $R^{B9}$ | N | N | N |
| $L_{A2046}$ | $R^{B3}$ | $R^{B1}$ | $R^{A2}$ | $R^{A2}$ | N | N | N |
| $L_{A2047}$ | $R^{B3}$ | $R^{B1}$ | $R^{A27}$ | $R^{A27}$ | N | N | N |
| $L_{A2048}$ | $R^{B3}$ | $R^{B1}$ | $R^{A34}$ | $R^{A34}$ | N | N | N |

compounds having a structure of

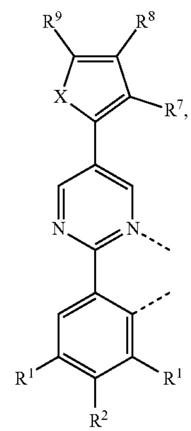

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A2379}$ | $R^{B1}$ | $R^{B1}$ | $R^{B3}$ | $R^{B1}$ | $R^{B1}$ | S |
| $L_{A2386}$ | $R^{B1}$ | $R^{B1}$ | $R^{A2}$ | $R^{B1}$ | $R^{B1}$ | S |
| $L_{A2391}$ | $R^{B2}$ | $R^{B1}$ | $R^{B3}$ | $R^{B1}$ | $R^{B1}$ | S |
| $L_{A2398}$ | $R^{B2}$ | $R^{B1}$ | $R^{A2}$ | $R^{B1}$ | $R^{B1}$ | S |
| $L_{A2403}$ | $R^{B2}$ | F | $R^{B3}$ | $R^{B1}$ | $R^{B1}$ | S |
| $L_{A2410}$ | $R^{B2}$ | F | $R^{A2}$ | $R^{B1}$ | $R^{B1}$ | S |
| $L_{A2414}$ | $R^{B3}$ | $R^{B1}$ | $R^{B2}$ | $R^{B1}$ | $R^{B1}$ | S |
| $L_{A2415}$ | $R^{B3}$ | $R^{B1}$ | $R^{B3}$ | $R^{B1}$ | $R^{B1}$ | S |
| $L_{A2416}$ | $R^{B3}$ | $R^{B1}$ | $R^{B4}$ | $R^{B1}$ | $R^{B1}$ | S |
| $L_{A2417}$ | $R^{B3}$ | $R^{B1}$ | $R^{B5}$ | $R^{B1}$ | $R^{B1}$ | S |
| $L_{A2418}$ | $R^{B3}$ | $R^{B1}$ | $R^{B6}$ | $R^{B1}$ | $R^{B1}$ | S |
| $L_{A2419}$ | $R^{B3}$ | $R^{B1}$ | $R^{B7}$ | $R^{B1}$ | $R^{B1}$ | S |
| $L_{A2420}$ | $R^{B3}$ | $R^{B1}$ | $R^{B8}$ | $R^{B1}$ | $R^{B1}$ | S |
| $L_{A2421}$ | $R^{B3}$ | $R^{B1}$ | $R^{B9}$ | $R^{B1}$ | $R^{B1}$ | S |
| $L_{A2422}$ | $R^{B3}$ | $R^{B1}$ | $R^{A2}$ | $R^{B1}$ | $R^{B1}$ | S |
| $L_{A2423}$ | $R^{B3}$ | $R^{B1}$ | $R^{A27}$ | $R^{B1}$ | $R^{B1}$ | S |
| $L_{A2424}$ | $R^{B3}$ | $R^{B1}$ | $R^{A34}$ | $R^{B1}$ | $R^{B1}$ | S |
| $L_{A2427}$ | $R^{B1}$ | $R^{B1}$ | $R^{B3}$ | $R^{B1}$ | $R^{B3}$ | S |
| $L_{A2434}$ | $R^{B1}$ | $R^{B1}$ | $R^{A2}$ | $R^{B1}$ | $R^{A2}$ | S |
| $L_{A2439}$ | $R^{B2}$ | $R^{B1}$ | $R^{B3}$ | $R^{B1}$ | $R^{B3}$ | S |
| $L_{A2446}$ | $R^{B2}$ | $R^{B1}$ | $R^{A2}$ | $R^{B1}$ | $R^{A2}$ | S |
| $L_{A2451}$ | $R^{B2}$ | F | $R^{B3}$ | $R^{B1}$ | $R^{B3}$ | S |
| $L_{A2458}$ | $R^{B2}$ | F | $R^{A2}$ | $R^{B1}$ | $R^{A2}$ | S |
| $L_{A2462}$ | $R^{B3}$ | $R^{B1}$ | $R^{B2}$ | $R^{B1}$ | $R^{B2}$ | S |
| $L_{A2463}$ | $R^{B3}$ | $R^{B1}$ | $R^{B3}$ | $R^{B1}$ | $R^{B3}$ | S |
| $L_{A2464}$ | $R^{B3}$ | $R^{B1}$ | $R^{B4}$ | $R^{B1}$ | $R^{B4}$ | S |
| $L_{A2465}$ | $R^{B3}$ | $R^{B1}$ | $R^{B5}$ | $R^{B1}$ | $R^{B5}$ | S |
| $L_{A2466}$ | $R^{B3}$ | $R^{B1}$ | $R^{B6}$ | $R^{B1}$ | $R^{B6}$ | S |
| $L_{A2467}$ | $R^{B3}$ | $R^{B1}$ | $R^{B7}$ | $R^{B1}$ | $R^{B7}$ | S |
| $L_{A2468}$ | $R^{B3}$ | $R^{B1}$ | $R^{B8}$ | $R^{B1}$ | $R^{B8}$ | S |
| $L_{A2469}$ | $R^{B3}$ | $R^{B1}$ | $R^{B9}$ | $R^{B1}$ | $R^{B9}$ | S |
| $L_{A2470}$ | $R^{B3}$ | $R^{B1}$ | $R^{A2}$ | $R^{B1}$ | $R^{A2}$ | S |
| $L_{A2471}$ | $R^{B3}$ | $R^{B1}$ | $R^{A27}$ | $R^{B1}$ | $R^{A27}$ | S |
| $L_{A2472}$ | $R^{B3}$ | $R^{B1}$ | $R^{A34}$ | $R^{B1}$ | $R^{A34}$ | S |
| $L_{A2523}$ | $R^{B1}$ | $R^{B1}$ | $R^{B3}$ | $R^{B3}$ | $R^{B1}$ | S |
| $L_{A2530}$ | $R^{B1}$ | $R^{B1}$ | $R^{A2}$ | $R^{A2}$ | $R^{B1}$ | S |
| $L_{A2535}$ | $R^{B2}$ | $R^{B1}$ | $R^{B3}$ | $R^{B3}$ | $R^{B1}$ | S |
| $L_{A2542}$ | $R^{B2}$ | $R^{B1}$ | $R^{A2}$ | $R^{A2}$ | $R^{B1}$ | S |
| $L_{A2547}$ | $R^{B2}$ | F | $R^{B3}$ | $R^{B3}$ | $R^{B1}$ | S |

-continued

| | $R^1$ | $R^2$ | $R^7$ | $R^8$ | $R^9$ | X |
|---|---|---|---|---|---|---|
| $L_{A2554}$ | $R^{B2}$ | F | $R^{A2}$ | $R^{A2}$ | $R^{B1}$ | S |
| $L_{A2558}$ | $R^{B3}$ | $R^{B1}$ | $R^{B2}$ | $R^{B2}$ | $R^{B1}$ | S |
| $L_{A2559}$ | $R^{B3}$ | $R^{B1}$ | $R^{B3}$ | $R^{B3}$ | $R^{B1}$ | S |
| $L_{A2560}$ | $R^{B3}$ | $R^{B1}$ | $R^{B4}$ | $R^{B4}$ | $R^{B1}$ | S |
| $L_{A2561}$ | $R^{B3}$ | $R^{B1}$ | $R^{B5}$ | $R^{B5}$ | $R^{B1}$ | S |
| $L_{A2562}$ | $R^{B3}$ | $R^{B1}$ | $R^{B6}$ | $R^{B6}$ | $R^{B1}$ | S |
| $L_{A2563}$ | $R^{B3}$ | $R^{B1}$ | $R^{B7}$ | $R^{B7}$ | $R^{B1}$ | S |
| $L_{A2564}$ | $R^{B3}$ | $R^{B1}$ | $R^{B8}$ | $R^{B8}$ | $R^{B1}$ | S |
| $L_{A2565}$ | $R^{B3}$ | $R^{B1}$ | $R^{B9}$ | $R^{B9}$ | $R^{B1}$ | S |
| $L_{A2566}$ | $R^{B3}$ | $R^{B1}$ | $R^{A2}$ | $R^{A2}$ | $R^{B1}$ | S |
| $L_{A2567}$ | $R^{B3}$ | $R^{B1}$ | $R^{A27}$ | $R^{A27}$ | $R^{B1}$ | S |
| $L_{A2568}$ | $R^{B3}$ | $R^{B1}$ | $R^{A34}$ | $R^{A34}$ | $R^{B1}$ | S |
| $L_{A2571}$ | $R^{B1}$ | $R^{B1}$ | $R^{B1}$ | $R^{B1}$ | $R^{B3}$ | O |
| $L_{A2578}$ | $R^{B1}$ | $R^{B1}$ | $R^{B1}$ | $R^{B1}$ | $R^{A2}$ | O |
| $L_{A2583}$ | $R^{B2}$ | $R^{B1}$ | $R^{B1}$ | $R^{B1}$ | $R^{B3}$ | O |
| $L_{A2590}$ | $R^{B2}$ | $R^{B1}$ | $R^{B1}$ | $R^{B1}$ | $R^{A2}$ | O |
| $L_{A2595}$ | $R^{B2}$ | F | $R^{B1}$ | $R^{B1}$ | $R^{B3}$ | O |
| $L_{A2602}$ | $R^{B2}$ | F | $R^{B1}$ | $R^{B1}$ | $R^{A2}$ | O |
| $L_{A2605}$ | $R^{B3}$ | $R^{B1}$ | $R^{B1}$ | $R^{B1}$ | $R^{B1}$ | O |
| $L_{A2606}$ | $R^{B3}$ | $R^{B1}$ | $R^{B1}$ | $R^{B1}$ | $R^{B2}$ | O |
| $L_{A2607}$ | $R^{B3}$ | $R^{B1}$ | $R^{B1}$ | $R^{B1}$ | $R^{B3}$ | O |
| $L_{A2608}$ | $R^{B3}$ | $R^{B1}$ | $R^{B1}$ | $R^{B1}$ | $R^{B4}$ | O |
| $L_{A2609}$ | $R^{B3}$ | $R^{B1}$ | $R^{B1}$ | $R^{B1}$ | $R^{B5}$ | O |
| $L_{A2610}$ | $R^{B3}$ | $R^{B1}$ | $R^{B1}$ | $R^{B1}$ | $R^{B6}$ | O |
| $L_{A2611}$ | $R^{B3}$ | $R^{B1}$ | $R^{B1}$ | $R^{B1}$ | $R^{B7}$ | O |
| $L_{A2612}$ | $R^{B3}$ | $R^{B1}$ | $R^{B1}$ | $R^{B1}$ | $R^{B8}$ | O |
| $L_{A2613}$ | $R^{B3}$ | $R^{B1}$ | $R^{B1}$ | $R^{B1}$ | $R^{B9}$ | O |
| $L_{A2614}$ | $R^{B3}$ | $R^{B1}$ | $R^{B1}$ | $R^{B1}$ | $R^{A27}$ | O |
| $L_{A2616}$ | $R^{B3}$ | $R^{B1}$ | $R^{B1}$ | $R^{B1}$ | $R^{A34}$ | O |
| $L_{A2619}$ | $R^{B1}$ | $R^{B1}$ | $R^{B1}$ | $R^{B3}$ | $R^{B1}$ | O |
| $L_{A2626}$ | $R^{B1}$ | $R^{B1}$ | $R^{B1}$ | $R^{A2}$ | $R^{B1}$ | O |
| $L_{A2631}$ | $R^{B2}$ | $R^{B1}$ | $R^{B1}$ | $R^{B3}$ | $R^{B1}$ | O |
| $L_{A2638}$ | $R^{B2}$ | $R^{B1}$ | $R^{B1}$ | $R^{A2}$ | $R^{B1}$ | O |
| $L_{A2643}$ | $R^{B2}$ | F | $R^{B1}$ | $R^{B3}$ | $R^{B1}$ | O |
| $L_{A2650}$ | $R^{B2}$ | F | $R^{B1}$ | $R^{A2}$ | $R^{B1}$ | O |
| $L_{A2653}$ | $R^{B3}$ | $R^{B1}$ | $R^{B1}$ | $R^{B1}$ | $R^{B1}$ | O |
| $L_{A2654}$ | $R^{B3}$ | $R^{B1}$ | $R^{B1}$ | $R^{B2}$ | $R^{B1}$ | O |
| $L_{A2655}$ | $R^{B3}$ | $R^{B1}$ | $R^{B1}$ | $R^{B3}$ | $R^{B1}$ | O |
| $L_{A2656}$ | $R^{B3}$ | $R^{B1}$ | $R^{B1}$ | $R^{B4}$ | $R^{B1}$ | O |
| $L_{A2657}$ | $R^{B3}$ | $R^{B1}$ | $R^{B1}$ | $R^{B5}$ | $R^{B1}$ | O |
| $L_{A2658}$ | $R^{B3}$ | $R^{B1}$ | $R^{B1}$ | $R^{B6}$ | $R^{B1}$ | O |
| $L_{A2659}$ | $R^{B3}$ | $R^{B1}$ | $R^{B1}$ | $R^{B7}$ | $R^{B1}$ | O |
| $L_{A2660}$ | $R^{B3}$ | $R^{B1}$ | $R^{B1}$ | $R^{B8}$ | $R^{B1}$ | O |
| $L_{A2661}$ | $R^{B3}$ | $R^{B1}$ | $R^{B1}$ | $R^{B9}$ | $R^{B1}$ | O |
| $L_{A2662}$ | $R^{B3}$ | $R^{B1}$ | $R^{B1}$ | $R^{A2}$ | $R^{B1}$ | O |
| $L_{A2663}$ | $R^{B3}$ | $R^{B1}$ | $R^{B1}$ | $R^{A27}$ | $R^{B1}$ | O |
| $L_{A2664}$ | $R^{B3}$ | $R^{B1}$ | $R^{B1}$ | $R^{A34}$ | $R^{B1}$ | O |
| $L_{A2667}$ | $R^{B1}$ | $R^{B1}$ | $R^{B1}$ | $R^{B1}$ | $R^{B1}$ | O |
| $L_{A2674}$ | $R^{B1}$ | $R^{B1}$ | $R^{A2}$ | $R^{B1}$ | $R^{B1}$ | O |
| $L_{A2679}$ | $R^{B2}$ | $R^{B1}$ | $R^{B3}$ | $R^{B1}$ | $R^{B1}$ | O |
| $L_{A2686}$ | $R^{B2}$ | $R^{B1}$ | $R^{A2}$ | $R^{B1}$ | $R^{B1}$ | O |
| $L_{A2691}$ | $R^{B2}$ | F | $R^{B3}$ | $R^{B1}$ | $R^{B1}$ | O |
| $L_{A2698}$ | $R^{B2}$ | F | $R^{A2}$ | $R^{B1}$ | $R^{B1}$ | O |
| $L_{A2701}$ | $R^{B3}$ | $R^{B1}$ | $R^{B1}$ | $R^{B1}$ | $R^{B1}$ | O |
| $L_{A2702}$ | $R^{B3}$ | $R^{B1}$ | $R^{B2}$ | $R^{B1}$ | $R^{B1}$ | O |
| $L_{A2703}$ | $R^{B3}$ | $R^{B1}$ | $R^{B3}$ | $R^{B1}$ | $R^{B1}$ | O |
| $L_{A2704}$ | $R^{B3}$ | $R^{B1}$ | $R^{B4}$ | $R^{B1}$ | $R^{B1}$ | O |
| $L_{A2705}$ | $R^{B3}$ | $R^{B1}$ | $R^{B5}$ | $R^{B1}$ | $R^{B1}$ | O |
| $L_{A2706}$ | $R^{B3}$ | $R^{B1}$ | $R^{B6}$ | $R^{B1}$ | $R^{B1}$ | O |
| $L_{A2707}$ | $R^{B3}$ | $R^{B1}$ | $R^{B7}$ | $R^{B1}$ | $R^{B1}$ | O |
| $L_{A2708}$ | $R^{B3}$ | $R^{B1}$ | $R^{B8}$ | $R^{B1}$ | $R^{B1}$ | O |
| $L_{A2709}$ | $R^{B3}$ | $R^{B1}$ | $R^{B9}$ | $R^{B1}$ | $R^{B1}$ | O |
| $L_{A2710}$ | $R^{B3}$ | $R^{B1}$ | $R^{A2}$ | $R^{B1}$ | $R^{B1}$ | O |
| $L_{A2711}$ | $R^{B3}$ | $R^{B1}$ | $R^{A27}$ | $R^{B1}$ | $R^{B1}$ | O |
| $L_{A2712}$ | $R^{B3}$ | $R^{B1}$ | $R^{A34}$ | $R^{B1}$ | $R^{B1}$ | O |
| $L_{A2715}$ | $R^{B1}$ | $R^{B1}$ | $R^{B3}$ | $R^{B1}$ | $R^{B3}$ | O |
| $L_{A2722}$ | $R^{B1}$ | $R^{B1}$ | $R^{A2}$ | $R^{B1}$ | $R^{A2}$ | O |
| $L_{A2727}$ | $R^{B2}$ | $R^{B1}$ | $R^{B3}$ | $R^{B1}$ | $R^{B3}$ | O |
| $L_{A2734}$ | $R^{B2}$ | $R^{B1}$ | $R^{A2}$ | $R^{B1}$ | $R^{A2}$ | O |
| $L_{A2739}$ | $R^{B2}$ | F | $R^{B3}$ | $R^{B1}$ | $R^{B3}$ | O |
| $L_{A2746}$ | $R^{B2}$ | F | $R^{A2}$ | $R^{B1}$ | $R^{A2}$ | O |
| $L_{A2749}$ | $R^{B3}$ | $R^{B1}$ | $R^{B1}$ | $R^{B1}$ | $R^{B1}$ | O |
| $L_{A2750}$ | $R^{B3}$ | $R^{B1}$ | $R^{B2}$ | $R^{B1}$ | $R^{B2}$ | O |
| $L_{A2751}$ | $R^{B3}$ | $R^{B1}$ | $R^{B3}$ | $R^{B1}$ | $R^{B3}$ | O |
| $L_{A2752}$ | $R^{B3}$ | $R^{B1}$ | $R^{B4}$ | $R^{B1}$ | $R^{B4}$ | O |
| $L_{A2753}$ | $R^{B3}$ | $R^{B1}$ | $R^{B5}$ | $R^{B1}$ | $R^{B5}$ | O |
| $L_{A2754}$ | $R^{B3}$ | $R^{B1}$ | $R^{B6}$ | $R^{B1}$ | $R^{B6}$ | O |

-continued

| | $R^1$ | $R^2$ | $R^7$ | $R^8$ | $R^9$ | X |
|---|---|---|---|---|---|---|
| $L_{A2755}$ | $R^{B3}$ | $R^{B1}$ | $R^{B7}$ | $R^{B1}$ | $R^{B7}$ | O |
| $L_{A2756}$ | $R^{B3}$ | $R^{B1}$ | $R^{B8}$ | $R^{B1}$ | $R^{B8}$ | O |
| $L_{A2757}$ | $R^{B3}$ | $R^{B1}$ | $R^{B9}$ | $R^{B1}$ | $R^{B9}$ | O |
| $L_{A2758}$ | $R^{B3}$ | $R^{B1}$ | $R^{A2}$ | $R^{B1}$ | $R^{A2}$ | O |
| $L_{A2759}$ | $R^{B3}$ | $R^{B1}$ | $R^{A27}$ | $R^{B1}$ | $R^{A27}$ | O |
| $L_{A2760}$ | $R^{B3}$ | $R^{B1}$ | $R^{A34}$ | $R^{B1}$ | $R^{A34}$ | O |
| $L_{A2763}$ | $R^{B1}$ | $R^{B1}$ | $R^{B1}$ | $R^{B3}$ | $R^{B3}$ | O |
| $L_{A2770}$ | $R^{B1}$ | $R^{B1}$ | $R^{B1}$ | $R^{A2}$ | $R^{A2}$ | O |
| $L_{A2775}$ | $R^{B2}$ | $R^{B1}$ | $R^{B1}$ | $R^{B3}$ | $R^{B3}$ | O |
| $L_{A2782}$ | $R^{B2}$ | $R^{B1}$ | $R^{B1}$ | $R^{A2}$ | $R^{A2}$ | O |
| $L_{A2787}$ | $R^{B2}$ | F | $R^{B1}$ | $R^{B3}$ | $R^{B3}$ | O |
| $L_{A2794}$ | $R^{B2}$ | F | $R^{B1}$ | $R^{A2}$ | $R^{A2}$ | O |
| $L_{A2797}$ | $R^{B3}$ | $R^{B1}$ | $R^{B1}$ | $R^{B1}$ | $R^{B1}$ | O |
| $L_{A2798}$ | $R^{B3}$ | $R^{B1}$ | $R^{B1}$ | $R^{B2}$ | $R^{B2}$ | O |
| $L_{A2799}$ | $R^{B3}$ | $R^{B1}$ | $R^{B1}$ | $R^{B3}$ | $R^{B3}$ | O |
| $L_{A2800}$ | $R^{B3}$ | $R^{B1}$ | $R^{B1}$ | $R^{B4}$ | $R^{B4}$ | O |
| $L_{A2801}$ | $R^{B3}$ | $R^{B1}$ | $R^{B1}$ | $R^{B5}$ | $R^{B5}$ | O |
| $L_{A2802}$ | $R^{B3}$ | $R^{B1}$ | $R^{B1}$ | $R^{B6}$ | $R^{B6}$ | O |
| $L_{A2803}$ | $R^{B3}$ | $R^{B1}$ | $R^{B1}$ | $R^{B7}$ | $R^{B7}$ | O |
| $L_{A2804}$ | $R^{B3}$ | $R^{B1}$ | $R^{B1}$ | $R^{B8}$ | $R^{B8}$ | O |
| $L_{A2805}$ | $R^{B3}$ | $R^{B1}$ | $R^{B1}$ | $R^{B9}$ | $R^{B9}$ | O |
| $L_{A2806}$ | $R^{B3}$ | $R^{B1}$ | $R^{B1}$ | $R^{A2}$ | $R^{A2}$ | O |
| $L_{A2807}$ | $R^{B3}$ | $R^{B1}$ | $R^{B1}$ | $R^{A27}$ | $R^{A27}$ | O |
| $L_{A2808}$ | $R^{B3}$ | $R^{B1}$ | $R^{B1}$ | $R^{A34}$ | $R^{A34}$ | O |
| $L_{A2811}$ | $R^{B1}$ | $R^{B1}$ | $R^{B3}$ | $R^{B3}$ | $R^{B1}$ | O |
| $L_{A2818}$ | $R^{B1}$ | $R^{B1}$ | $R^{A2}$ | $R^{A2}$ | $R^{B1}$ | O |
| $L_{A2823}$ | $R^{B2}$ | $R^{B1}$ | $R^{B3}$ | $R^{B3}$ | $R^{B1}$ | O |
| $L_{A2830}$ | $R^{B2}$ | $R^{B1}$ | $R^{A2}$ | $R^{A2}$ | $R^{B1}$ | O |
| $L_{A2835}$ | $R^{B2}$ | F | $R^{B3}$ | $R^{B3}$ | $R^{B1}$ | O |
| $L_{A2842}$ | $R^{B2}$ | F | $R^{A2}$ | $R^{A2}$ | $R^{B1}$ | O |
| $L_{A2845}$ | $R^{B3}$ | $R^{B1}$ | $R^{B1}$ | $R^{B1}$ | $R^{B1}$ | O |
| $L_{A2846}$ | $R^{B3}$ | $R^{B1}$ | $R^{B2}$ | $R^{B2}$ | $R^{B1}$ | O |
| $L_{A2847}$ | $R^{B3}$ | $R^{B1}$ | $R^{B3}$ | $R^{B3}$ | $R^{B1}$ | O |
| $L_{A2849}$ | $R^{B3}$ | $R^{B1}$ | $R^{B5}$ | $R^{B5}$ | $R^{B1}$ | O |
| $L_{A2850}$ | $R^{B3}$ | $R^{B1}$ | $R^{B6}$ | $R^{B6}$ | $R^{B1}$ | O |
| $L_{A2851}$ | $R^{B3}$ | $R^{B1}$ | $R^{B7}$ | $R^{B7}$ | $R^{B1}$ | O |
| $L_{A2852}$ | $R^{B3}$ | $R^{B1}$ | $R^{B8}$ | $R^{B8}$ | $R^{B1}$ | O |
| $L_{A2853}$ | $R^{B3}$ | $R^{B1}$ | $R^{B9}$ | $R^{B9}$ | $R^{B1}$ | O |
| $L_{A2854}$ | $R^{B3}$ | $R^{B1}$ | $R^{A2}$ | $R^{A2}$ | $R^{B1}$ | O |
| $L_{A2855}$ | $R^{B3}$ | $R^{B1}$ | $R^{A27}$ | $R^{A27}$ | $R^{B1}$ | O |
| $L_{A2856}$ | $R^{B3}$ | $R^{B1}$ | $R^{A34}$ | $R^{A34}$ | $R^{B1}$ | O |

compounds having a structure of

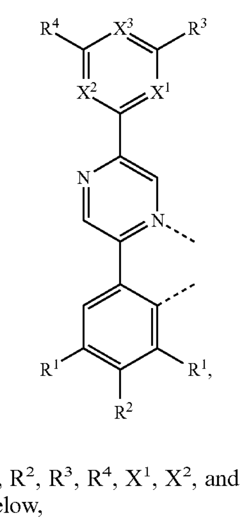

wherein $R^1$, $R^2$, $R^3$, $R^4$, $X^1$, $X^2$, and $X^3$ are defined as provided below,

| | $R^1$ | $R^2$ | $R^3$ | $R^4$ | $X^1$ | $X^2$ | $X^3$ |
|---|---|---|---|---|---|---|---|
| $L_{A2859}$ | $R^{B1}$ | $R^{B1}$ | $R^{B3}$ | $R^{B1}$ | N | C | C |
| $L_{A2866}$ | $R^{B1}$ | $R^{B1}$ | $R^{A2}$ | $R^{B1}$ | N | C | C |
| $L_{A2871}$ | $R^{B2}$ | $R^{B1}$ | $R^{B3}$ | $R^{B1}$ | N | C | C |

-continued

| | $R^1$ | $R^2$ | $R^3$ | $R^4$ | $X^1$ | $X^2$ | $X^3$ |
|---|---|---|---|---|---|---|---|
| $L_{A2878}$ | $R^{B2}$ | $R^{B1}$ | $R^{A2}$ | $R^{B1}$ | N | C | C |
| $L_{A2883}$ | $R^{B2}$ | F | $R^{B3}$ | $R^{B1}$ | N | C | C |
| $L_{A2890}$ | $R^{B2}$ | F | $R^{A2}$ | $R^{B1}$ | N | C | C |
| $L_{A2893}$ | $R^{B3}$ | $R^{B1}$ | $R^{B1}$ | $R^{B1}$ | N | C | C |
| $L_{A2894}$ | $R^{B3}$ | $R^{B1}$ | $R^{B2}$ | $R^{B1}$ | N | C | C |
| $L_{A2895}$ | $R^{B3}$ | $R^{B1}$ | $R^{B3}$ | $R^{B1}$ | N | C | C |
| $L_{A2896}$ | $R^{B3}$ | $R^{B1}$ | $R^{B4}$ | $R^{B1}$ | N | C | C |
| $L_{A2897}$ | $R^{B3}$ | $R^{B1}$ | $R^{B5}$ | $R^{B1}$ | N | C | C |
| $L_{A2898}$ | $R^{B3}$ | $R^{B1}$ | $R^{B6}$ | $R^{B1}$ | N | C | C |
| $L_{A2899}$ | $R^{B3}$ | $R^{B1}$ | $R^{B7}$ | $R^{B1}$ | N | C | C |
| $L_{A2900}$ | $R^{B3}$ | $R^{B1}$ | $R^{B8}$ | $R^{B1}$ | N | C | C |
| $L_{A2901}$ | $R^{B3}$ | $R^{B1}$ | $R^{B9}$ | $R^{B1}$ | N | C | C |
| $L_{A2902}$ | $R^{B3}$ | $R^{B1}$ | $R^{A2}$ | $R^{B1}$ | N | C | C |
| $L_{A2903}$ | $R^{B3}$ | $R^{B1}$ | $R^{A27}$ | $R^{B1}$ | N | C | C |
| $L_{A2904}$ | $R^{B3}$ | $R^{B1}$ | $R^{A34}$ | $R^{B1}$ | N | C | C |
| $L_{A2907}$ | $R^{B1}$ | $R^{B1}$ | $R^{B3}$ | $R^{B3}$ | N | N | C |
| $L_{A2914}$ | $R^{B1}$ | $R^{B1}$ | $R^{A2}$ | $R^{A2}$ | N | N | C |
| $L_{A2919}$ | $R^{B2}$ | $R^{B1}$ | $R^{B3}$ | $R^{B3}$ | N | N | C |
| $L_{A2926}$ | $R^{B2}$ | $R^{B1}$ | $R^{A2}$ | $R^{A2}$ | N | N | C |
| $L_{A2931}$ | $R^{B2}$ | F | $R^{B3}$ | $R^{B3}$ | N | N | C |
| $L_{A2938}$ | $R^{B2}$ | F | $R^{A2}$ | $R^{A2}$ | N | N | C |
| $L_{A2941}$ | $R^{B3}$ | $R^{B1}$ | $R^{B1}$ | $R^{B1}$ | N | N | C |
| $L_{A2942}$ | $R^{B3}$ | $R^{B1}$ | $R^{B2}$ | $R^{B2}$ | N | N | C |
| $L_{A2943}$ | $R^{B3}$ | $R^{B1}$ | $R^{B3}$ | $R^{B3}$ | N | N | C |
| $L_{A2944}$ | $R^{B3}$ | $R^{B1}$ | $R^{B4}$ | $R^{B4}$ | N | N | C |
| $L_{A2945}$ | $R^{B3}$ | $R^{B1}$ | $R^{B5}$ | $R^{B5}$ | N | N | C |
| $L_{A2946}$ | $R^{B3}$ | $R^{B1}$ | $R^{B6}$ | $R^{B6}$ | N | N | C |
| $L_{A2947}$ | $R^{B3}$ | $R^{B1}$ | $R^{B7}$ | $R^{B7}$ | N | N | C |
| $L_{A2948}$ | $R^{B3}$ | $R^{B1}$ | $R^{B8}$ | $R^{B8}$ | N | N | C |
| $L_{A2949}$ | $R^{B3}$ | $R^{B1}$ | $R^{B9}$ | $R^{B9}$ | N | N | C |
| $L_{A2950}$ | $R^{B3}$ | $R^{B1}$ | $R^{A2}$ | $R^{A2}$ | N | N | C |
| $L_{A2951}$ | $R^{B3}$ | $R^{B1}$ | $R^{A27}$ | $R^{A27}$ | N | N | C |
| $L_{A2952}$ | $R^{B3}$ | $R^{B1}$ | $R^{A34}$ | $R^{A34}$ | N | N | C |
| $L_{A2955}$ | $R^{B1}$ | $R^{B1}$ | $R^{B3}$ | $R^{B3}$ | N | N | N |
| $L_{A2962}$ | $R^{B1}$ | $R^{B1}$ | $R^{A2}$ | $R^{A2}$ | N | N | N |
| $L_{A2967}$ | $R^{B2}$ | $R^{B1}$ | $R^{B3}$ | $R^{B3}$ | N | N | N |
| $L_{A2974}$ | $R^{B2}$ | $R^{B1}$ | $R^{A2}$ | $R^{A2}$ | N | N | N |
| $L_{A2979}$ | $R^{B2}$ | F | $R^{B3}$ | $R^{B3}$ | N | N | N |
| $L_{A2986}$ | $R^{B2}$ | F | $R^{A2}$ | $R^{A2}$ | N | N | N |
| $L_{A2989}$ | $R^{B3}$ | $R^{B1}$ | $R^{B1}$ | $R^{B1}$ | N | N | N |
| $L_{A2990}$ | $R^{B3}$ | $R^{B1}$ | $R^{B2}$ | $R^{B2}$ | N | N | N |
| $L_{A2991}$ | $R^{B3}$ | $R^{B1}$ | $R^{B3}$ | $R^{B3}$ | N | N | N |
| $L_{A2992}$ | $R^{B3}$ | $R^{B1}$ | $R^{B4}$ | $R^{B4}$ | N | N | N |
| $L_{A2993}$ | $R^{B3}$ | $R^{B1}$ | $R^{B5}$ | $R^{B5}$ | N | N | N |
| $L_{A2994}$ | $R^{B3}$ | $R^{B1}$ | $R^{B6}$ | $R^{B6}$ | N | N | N |
| $L_{A2995}$ | $R^{B3}$ | $R^{B1}$ | $R^{B7}$ | $R^{B7}$ | N | N | N |
| $L_{A2996}$ | $R^{B3}$ | $R^{B1}$ | $R^{B8}$ | $R^{B8}$ | N | N | N |
| $L_{A2997}$ | $R^{B3}$ | $R^{B1}$ | $R^{B9}$ | $R^{B9}$ | N | N | N |
| $L_{A2998}$ | $R^{B3}$ | $R^{B1}$ | $R^{A2}$ | $R^{A2}$ | N | N | N |
| $L_{A2999}$ | $R^{B3}$ | $R^{B1}$ | $R^{A27}$ | $R^{A27}$ | N | N | N |
| $L_{A3000}$ | $R^{B3}$ | $R^{B1}$ | $R^{A34}$ | $R^{A34}$ | N | N | N |

compounds having a structure of

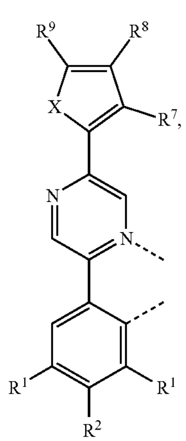

wherein $R^1$, $R^2$, $R^7$, $R^8$, $R^9$, and X are defined as provided below,

| | $R^1$ | $R^2$ | $R^7$ | $R^8$ | $R^9$ | X |
|---|---|---|---|---|---|---|
| $L_{A3331}$ | $R^{B1}$ | $R^{B1}$ | $R^{B3}$ | $R^{B1}$ | $R^{B1}$ | S |
| $L_{A3338}$ | $R^{B1}$ | $R^{B1}$ | $R^{A2}$ | $R^{B1}$ | $R^{B1}$ | S |
| $L_{A3343}$ | $R^{B2}$ | $R^{B1}$ | $R^{B3}$ | $R^{B1}$ | $R^{B1}$ | S |
| $L_{A3350}$ | $R^{B2}$ | $R^{B1}$ | $R^{A2}$ | $R^{B1}$ | $R^{B1}$ | S |
| $L_{A3355}$ | $R^{B2}$ | F | $R^{B3}$ | $R^{B1}$ | $R^{B1}$ | S |
| $L_{A3362}$ | $R^{B2}$ | F | $R^{A2}$ | $R^{B1}$ | $R^{B1}$ | S |
| $L_{A3366}$ | $R^{B3}$ | $R^{B1}$ | $R^{B2}$ | $R^{B1}$ | $R^{B1}$ | S |
| $L_{A3367}$ | $R^{B3}$ | $R^{B1}$ | $R^{B3}$ | $R^{B1}$ | $R^{B1}$ | S |
| $L_{A3368}$ | $R^{B3}$ | $R^{B1}$ | $R^{B4}$ | $R^{B1}$ | $R^{B1}$ | S |
| $L_{A3369}$ | $R^{B3}$ | $R^{B1}$ | $R^{B5}$ | $R^{B1}$ | $R^{B1}$ | S |
| $L_{A3370}$ | $R^{B3}$ | $R^{B1}$ | $R^{B6}$ | $R^{B1}$ | $R^{B1}$ | S |
| $L_{A3371}$ | $R^{B3}$ | $R^{B1}$ | $R^{B7}$ | $R^{B1}$ | $R^{B1}$ | S |
| $L_{A3372}$ | $R^{B3}$ | $R^{B1}$ | $R^{B8}$ | $R^{B1}$ | $R^{B1}$ | S |
| $L_{A3373}$ | $R^{B3}$ | $R^{B1}$ | $R^{B9}$ | $R^{B1}$ | $R^{B1}$ | S |
| $L_{A3374}$ | $R^{B3}$ | $R^{B1}$ | $R^{A2}$ | $R^{B1}$ | $R^{B1}$ | S |
| $L_{A3375}$ | $R^{B3}$ | $R^{B1}$ | $R^{A27}$ | $R^{B1}$ | $R^{B1}$ | S |
| $L_{A3376}$ | $R^{B3}$ | $R^{B1}$ | $R^{A34}$ | $R^{B1}$ | $R^{B1}$ | S |
| $L_{A3379}$ | $R^{B1}$ | $R^{B1}$ | $R^{B3}$ | $R^{B1}$ | $R^{B3}$ | S |
| $L_{A3386}$ | $R^{B1}$ | $R^{B1}$ | $R^{A2}$ | $R^{B1}$ | $R^{A2}$ | S |
| $L_{A3391}$ | $R^{B2}$ | $R^{B1}$ | $R^{B3}$ | $R^{B1}$ | $R^{B3}$ | S |
| $L_{A3398}$ | $R^{B2}$ | $R^{B1}$ | $R^{A2}$ | $R^{B1}$ | $R^{A2}$ | S |
| $L_{A3403}$ | $R^{B2}$ | F | $R^{B3}$ | $R^{B1}$ | $R^{B3}$ | S |
| $L_{A3410}$ | $R^{B2}$ | F | $R^{A2}$ | $R^{B1}$ | $R^{A2}$ | S |
| $L_{A3414}$ | $R^{B3}$ | $R^{B1}$ | $R^{B2}$ | $R^{B1}$ | $R^{B2}$ | S |
| $L_{A3415}$ | $R^{B3}$ | $R^{B1}$ | $R^{B3}$ | $R^{B1}$ | $R^{B3}$ | S |
| $L_{A3416}$ | $R^{B3}$ | $R^{B1}$ | $R^{B4}$ | $R^{B1}$ | $R^{B4}$ | S |
| $L_{A3417}$ | $R^{B3}$ | $R^{B1}$ | $R^{B5}$ | $R^{B1}$ | $R^{B5}$ | S |
| $L_{A3418}$ | $R^{B3}$ | $R^{B1}$ | $R^{B6}$ | $R^{B1}$ | $R^{B6}$ | S |
| $L_{A3419}$ | $R^{B3}$ | $R^{B1}$ | $R^{B7}$ | $R^{B1}$ | $R^{B7}$ | S |
| $L_{A3420}$ | $R^{B3}$ | $R^{B1}$ | $R^{B8}$ | $R^{B1}$ | $R^{B8}$ | S |
| $L_{A3421}$ | $R^{B3}$ | $R^{B1}$ | $R^{B9}$ | $R^{B1}$ | $R^{B9}$ | S |
| $L_{A3422}$ | $R^{B3}$ | $R^{B1}$ | $R^{A2}$ | $R^{B1}$ | $R^{A2}$ | S |
| $L_{A3423}$ | $R^{B3}$ | $R^{B1}$ | $R^{A27}$ | $R^{B1}$ | $R^{A27}$ | S |
| $L_{A3424}$ | $R^{B3}$ | $R^{B1}$ | $R^{A34}$ | $R^{B1}$ | $R^{A34}$ | S |
| $L_{A3475}$ | $R^{B1}$ | $R^{B1}$ | $R^{B3}$ | $R^{B3}$ | $R^{B1}$ | S |
| $L_{A3482}$ | $R^{B1}$ | $R^{B1}$ | $R^{A2}$ | $R^{A2}$ | $R^{B1}$ | S |
| $L_{A3487}$ | $R^{B2}$ | $R^{B1}$ | $R^{B3}$ | $R^{B3}$ | $R^{B1}$ | S |
| $L_{A3494}$ | $R^{B2}$ | $R^{B1}$ | $R^{A2}$ | $R^{A2}$ | $R^{B1}$ | S |
| $L_{A3499}$ | $R^{B2}$ | F | $R^{B3}$ | $R^{B3}$ | $R^{B1}$ | S |
| $L_{A3506}$ | $R^{B2}$ | F | $R^{A2}$ | $R^{A2}$ | $R^{B1}$ | S |
| $L_{A3510}$ | $R^{B3}$ | $R^{B1}$ | $R^{B2}$ | $R^{B2}$ | $R^{B1}$ | S |
| $L_{A3511}$ | $R^{B3}$ | $R^{B1}$ | $R^{B3}$ | $R^{B3}$ | $R^{B1}$ | S |
| $L_{A3512}$ | $R^{B3}$ | $R^{B1}$ | $R^{B4}$ | $R^{B4}$ | $R^{B1}$ | S |
| $L_{A3513}$ | $R^{B3}$ | $R^{B1}$ | $R^{B5}$ | $R^{B5}$ | $R^{B1}$ | S |
| $L_{A3514}$ | $R^{B3}$ | $R^{B1}$ | $R^{B6}$ | $R^{B6}$ | $R^{B1}$ | S |
| $L_{A3515}$ | $R^{B3}$ | $R^{B1}$ | $R^{B7}$ | $R^{B7}$ | $R^{B1}$ | S |
| $L_{A3516}$ | $R^{B3}$ | $R^{B1}$ | $R^{B8}$ | $R^{B8}$ | $R^{B1}$ | S |
| $L_{A3517}$ | $R^{B3}$ | $R^{B1}$ | $R^{B9}$ | $R^{B9}$ | $R^{B1}$ | S |
| $L_{A3518}$ | $R^{B3}$ | $R^{B1}$ | $R^{A2}$ | $R^{A2}$ | $R^{B1}$ | S |
| $L_{A3519}$ | $R^{B3}$ | $R^{B1}$ | $R^{A27}$ | $R^{A27}$ | $R^{B1}$ | S |
| $L_{A3520}$ | $R^{B3}$ | $R^{B1}$ | $R^{A34}$ | $R^{A34}$ | $R^{B1}$ | S |
| $L_{A3523}$ | $R^{B1}$ | $R^{B1}$ | $R^{B1}$ | $R^{B1}$ | $R^{B3}$ | O |
| $L_{A3530}$ | $R^{B1}$ | $R^{B1}$ | $R^{B1}$ | $R^{B1}$ | $R^{A2}$ | O |
| $L_{A3535}$ | $R^{B2}$ | $R^{B1}$ | $R^{B1}$ | $R^{B1}$ | $R^{B3}$ | O |
| $L_{A3542}$ | $R^{B2}$ | $R^{B1}$ | $R^{B1}$ | $R^{B1}$ | $R^{A2}$ | O |
| $L_{A3547}$ | $R^{B2}$ | F | $R^{B1}$ | $R^{B1}$ | $R^{B3}$ | O |
| $L_{A3554}$ | $R^{B2}$ | F | $R^{B1}$ | $R^{B1}$ | $R^{A2}$ | O |
| $L_{A3557}$ | $R^{B3}$ | $R^{B1}$ | $R^{B1}$ | $R^{B1}$ | $R^{B1}$ | O |
| $L_{A3558}$ | $R^{B3}$ | $R^{B1}$ | $R^{B1}$ | $R^{B1}$ | $R^{B2}$ | O |
| $L_{A3559}$ | $R^{B3}$ | $R^{B1}$ | $R^{B1}$ | $R^{B1}$ | $R^{B3}$ | O |
| $L_{A3560}$ | $R^{B3}$ | $R^{B1}$ | $R^{B1}$ | $R^{B1}$ | $R^{B4}$ | O |
| $L_{A3561}$ | $R^{B3}$ | $R^{B1}$ | $R^{B1}$ | $R^{B1}$ | $R^{B5}$ | O |
| $L_{A3562}$ | $R^{B3}$ | $R^{B1}$ | $R^{B1}$ | $R^{B1}$ | $R^{B6}$ | O |
| $L_{A3563}$ | $R^{B3}$ | $R^{B1}$ | $R^{B1}$ | $R^{B1}$ | $R^{B7}$ | O |
| $L_{A3564}$ | $R^{B3}$ | $R^{B1}$ | $R^{B1}$ | $R^{B1}$ | $R^{B8}$ | O |
| $L_{A3565}$ | $R^{B3}$ | $R^{B1}$ | $R^{B1}$ | $R^{B1}$ | $R^{B9}$ | O |
| $L_{A3566}$ | $R^{B3}$ | $R^{B1}$ | $R^{B1}$ | $R^{B1}$ | $R^{A2}$ | O |
| $L_{A3567}$ | $R^{B3}$ | $R^{B1}$ | $R^{B1}$ | $R^{B1}$ | $R^{A27}$ | O |
| $L_{A3568}$ | $R^{B3}$ | $R^{B1}$ | $R^{B1}$ | $R^{B1}$ | $R^{A34}$ | O |
| $L_{A3571}$ | $R^{B3}$ | $R^{B1}$ | $R^{B1}$ | $R^{B3}$ | $R^{B1}$ | O |
| $L_{A3578}$ | $R^{B1}$ | $R^{B1}$ | $R^{B1}$ | $R^{A2}$ | $R^{B1}$ | O |
| $L_{A3583}$ | $R^{B2}$ | $R^{B1}$ | $R^{B1}$ | $R^{B3}$ | $R^{B1}$ | O |
| $L_{A3590}$ | $R^{B2}$ | $R^{B1}$ | $R^{B1}$ | $R^{A2}$ | $R^{B1}$ | O |
| $L_{A3595}$ | $R^{B2}$ | F | $R^{B1}$ | $R^{B3}$ | $R^{B1}$ | O |
| $L_{A3602}$ | $R^{B2}$ | F | $R^{B1}$ | $R^{A2}$ | $R^{B1}$ | O |

-continued

| | $R^1$ | $R^2$ | $R^7$ | $R^8$ | $R^9$ | X |
|---|---|---|---|---|---|---|
| $L_{A3605}$ | $R^{B3}$ | $R^{B1}$ | $R^{B1}$ | $R^{B1}$ | $R^{B1}$ | O |
| $L_{A3606}$ | $R^{B3}$ | $R^{B1}$ | $R^{B1}$ | $R^{B2}$ | $R^{B1}$ | O |
| $L_{A3607}$ | $R^{B3}$ | $R^{B1}$ | $R^{B1}$ | $R^{B3}$ | $R^{B1}$ | O |
| $L_{A3608}$ | $R^{B3}$ | $R^{B1}$ | $R^{B1}$ | $R^{B4}$ | $R^{B1}$ | O |
| $L_{A3609}$ | $R^{B3}$ | $R^{B1}$ | $R^{B1}$ | $R^{B5}$ | $R^{B1}$ | O |
| $L_{A3610}$ | $R^{B3}$ | $R^{B1}$ | $R^{B1}$ | $R^{B6}$ | $R^{B1}$ | O |
| $L_{A3611}$ | $R^{B3}$ | $R^{B1}$ | $R^{B1}$ | $R^{B7}$ | $R^{B1}$ | O |
| $L_{A3612}$ | $R^{B3}$ | $R^{B1}$ | $R^{B1}$ | $R^{B8}$ | $R^{B1}$ | O |
| $L_{A3613}$ | $R^{B3}$ | $R^{B1}$ | $R^{B1}$ | $R^{B9}$ | $R^{B1}$ | O |
| $L_{A3614}$ | $R^{B3}$ | $R^{B1}$ | $R^{B1}$ | $R^{A2}$ | $R^{B1}$ | O |
| $L_{A3615}$ | $R^{B3}$ | $R^{B1}$ | $R^{B1}$ | $R^{A27}$ | $R^{B1}$ | O |
| $L_{A3616}$ | $R^{B3}$ | $R^{B1}$ | $R^{B1}$ | $R^{A34}$ | $R^{B1}$ | O |
| $L_{A3619}$ | $R^{B1}$ | $R^{B1}$ | $R^{B3}$ | $R^{B1}$ | $R^{B1}$ | O |
| $L_{A3626}$ | $R^{B1}$ | $R^{B1}$ | $R^{A2}$ | $R^{B1}$ | $R^{B1}$ | O |
| $L_{A3631}$ | $R^{B2}$ | $R^{B1}$ | $R^{B3}$ | $R^{B1}$ | $R^{B1}$ | O |
| $L_{A3638}$ | $R^{B2}$ | $R^{B1}$ | $R^{A2}$ | $R^{B1}$ | $R^{B1}$ | O |
| $L_{A3643}$ | $R^{B2}$ | F | $R^{B3}$ | $R^{B1}$ | $R^{B1}$ | O |
| $L_{A3650}$ | $R^{B2}$ | F | $R^{A2}$ | $R^{B1}$ | $R^{B1}$ | O |
| $L_{A3653}$ | $R^{B3}$ | $R^{B1}$ | $R^{B1}$ | $R^{B1}$ | $R^{B1}$ | O |
| $L_{A3654}$ | $R^{B3}$ | $R^{B1}$ | $R^{B2}$ | $R^{B1}$ | $R^{B1}$ | O |
| $L_{A3655}$ | $R^{B3}$ | $R^{B1}$ | $R^{B3}$ | $R^{B1}$ | $R^{B1}$ | O |
| $L_{A3656}$ | $R^{B3}$ | $R^{B1}$ | $R^{B4}$ | $R^{B1}$ | $R^{B1}$ | O |
| $L_{A3657}$ | $R^{B3}$ | $R^{B1}$ | $R^{B5}$ | $R^{B1}$ | $R^{B1}$ | O |
| $L_{A3658}$ | $R^{B3}$ | $R^{B1}$ | $R^{B6}$ | $R^{B1}$ | $R^{B1}$ | O |
| $L_{A3659}$ | $R^{B3}$ | $R^{B1}$ | $R^{B7}$ | $R^{B1}$ | $R^{B1}$ | O |
| $L_{A3660}$ | $R^{B3}$ | $R^{B1}$ | $R^{B8}$ | $R^{B1}$ | $R^{B1}$ | O |
| $L_{A3661}$ | $R^{B3}$ | $R^{B1}$ | $R^{B9}$ | $R^{B1}$ | $R^{B1}$ | O |
| $L_{A3662}$ | $R^{B3}$ | $R^{B1}$ | $R^{A2}$ | $R^{B1}$ | $R^{B1}$ | O |
| $L_{A3663}$ | $R^{B3}$ | $R^{B1}$ | $R^{A27}$ | $R^{B1}$ | $R^{B1}$ | O |
| $L_{A3664}$ | $R^{B3}$ | $R^{B1}$ | $R^{A34}$ | $R^{B1}$ | $R^{B1}$ | O |
| $L_{A3667}$ | $R^{B1}$ | $R^{B1}$ | $R^{B3}$ | $R^{B1}$ | $R^{B3}$ | O |
| $L_{A3674}$ | $R^{B1}$ | $R^{B1}$ | $R^{A2}$ | $R^{B1}$ | $R^{A2}$ | O |
| $L_{A3679}$ | $R^{B2}$ | $R^{B1}$ | $R^{B3}$ | $R^{B1}$ | $R^{B3}$ | O |
| $L_{A3686}$ | $R^{B2}$ | $R^{B1}$ | $R^{A2}$ | $R^{B1}$ | $R^{A2}$ | O |
| $L_{A3691}$ | $R^{B2}$ | F | $R^{B3}$ | $R^{B1}$ | $R^{B3}$ | O |
| $L_{A3698}$ | $R^{B2}$ | F | $R^{A2}$ | $R^{B1}$ | $R^{A2}$ | O |
| $L_{A3701}$ | $R^{B3}$ | $R^{B1}$ | $R^{B1}$ | $R^{B1}$ | $R^{B1}$ | O |
| $L_{A3702}$ | $R^{B3}$ | $R^{B1}$ | $R^{B2}$ | $R^{B1}$ | $R^{B2}$ | O |
| $L_{A3703}$ | $R^{B3}$ | $R^{B1}$ | $R^{B3}$ | $R^{B1}$ | $R^{B3}$ | O |
| $L_{A3704}$ | $R^{B3}$ | $R^{B1}$ | $R^{B4}$ | $R^{B1}$ | $R^{B4}$ | O |
| $L_{A3705}$ | $R^{B3}$ | $R^{B1}$ | $R^{B5}$ | $R^{B1}$ | $R^{B5}$ | O |
| $L_{A3706}$ | $R^{B3}$ | $R^{B1}$ | $R^{B6}$ | $R^{B1}$ | $R^{B6}$ | O |
| $L_{A3707}$ | $R^{B3}$ | $R^{B1}$ | $R^{B7}$ | $R^{B1}$ | $R^{B7}$ | O |
| $L_{A3708}$ | $R^{B3}$ | $R^{B1}$ | $R^{B8}$ | $R^{B1}$ | $R^{B8}$ | O |
| $L_{A3709}$ | $R^{B3}$ | $R^{B1}$ | $R^{B9}$ | $R^{B1}$ | $R^{B5}$ | O |
| $L_{A3710}$ | $R^{B3}$ | $R^{B1}$ | $R^{A2}$ | $R^{B1}$ | $R^{A2}$ | O |
| $L_{A3711}$ | $R^{B3}$ | $R^{B1}$ | $R^{A27}$ | $R^{B1}$ | $R^{A27}$ | O |
| $L_{A3712}$ | $R^{B3}$ | $R^{B1}$ | $R^{A34}$ | $R^{B1}$ | $R^{A34}$ | O |
| $L_{A3715}$ | $R^{B1}$ | $R^{B1}$ | $R^{B1}$ | $R^{B3}$ | $R^{B3}$ | O |
| $L_{A3722}$ | $R^{B1}$ | $R^{B1}$ | $R^{B1}$ | $R^{A2}$ | $R^{A2}$ | O |
| $L_{A3727}$ | $R^{B2}$ | $R^{B1}$ | $R^{B1}$ | $R^{B3}$ | $R^{B3}$ | O |
| $L_{A3734}$ | $R^{B2}$ | $R^{B1}$ | $R^{B1}$ | $R^{A2}$ | $R^{A2}$ | O |
| $L_{A3739}$ | $R^{B2}$ | F | $R^{B1}$ | $R^{B3}$ | $R^{B33}$ | O |
| $L_{A3746}$ | $R^{B2}$ | F | $R^{B1}$ | $R^{A2}$ | $R^{A2}$ | O |
| $L_{A3749}$ | $R^{B3}$ | $R^{B1}$ | $R^{B1}$ | $R^{B1}$ | $R^{B1}$ | O |
| $L_{A3750}$ | $R^{B3}$ | $R^{B1}$ | $R^{B1}$ | $R^{B2}$ | $R^{B2}$ | O |
| $L_{A3751}$ | $R^{B3}$ | $R^{B1}$ | $R^{B1}$ | $R^{B3}$ | $R^{B3}$ | O |
| $L_{A3752}$ | $R^{B3}$ | $R^{B1}$ | $R^{B1}$ | $R^{B4}$ | $R^{B4}$ | O |
| $L_{A3753}$ | $R^{B3}$ | $R^{B1}$ | $R^{B1}$ | $R^{B5}$ | $R^{B5}$ | O |
| $L_{A3754}$ | $R^{B3}$ | $R^{B1}$ | $R^{B1}$ | $R^{B6}$ | $R^{B6}$ | O |
| $L_{A3755}$ | $R^{B3}$ | $R^{B1}$ | $R^{B1}$ | $R^{B7}$ | $R^{B7}$ | O |
| $L_{A3756}$ | $R^{B3}$ | $R^{B1}$ | $R^{B1}$ | $R^{B8}$ | $R^{B8}$ | O |
| $L_{A3757}$ | $R^{B3}$ | $R^{B1}$ | $R^{B1}$ | $R^{B9}$ | $R^{B9}$ | O |
| $L_{A3758}$ | $R^{B3}$ | $R^{B1}$ | $R^{B1}$ | $R^{A2}$ | $R^{A2}$ | O |
| $L_{A3759}$ | $R^{B3}$ | $R^{B1}$ | $R^{B1}$ | $R^{A27}$ | $R^{A27}$ | O |
| $L_{A3760}$ | $R^{B3}$ | $R^{B1}$ | $R^{B1}$ | $R^{A34}$ | $R^{A34}$ | O |
| $L_{A3763}$ | $R^{B1}$ | $R^{B1}$ | $R^{B3}$ | $R^{B3}$ | $R^{B1}$ | O |
| $L_{A3770}$ | $R^{B1}$ | $R^{B1}$ | $R^{A2}$ | $R^{A2}$ | $R^{B1}$ | O |
| $L_{A3775}$ | $R^{B2}$ | $R^{B1}$ | $R^{B3}$ | $R^{B3}$ | $R^{B1}$ | O |
| $L_{A3782}$ | $R^{B2}$ | $R^{B1}$ | $R^{A2}$ | $R^{A2}$ | $R^{B1}$ | O |
| $L_{A3787}$ | $R^{B2}$ | F | $R^{B3}$ | $R^{B3}$ | $R^{B1}$ | O |
| $L_{A3794}$ | $R^{B2}$ | F | $R^{A2}$ | $R^{A2}$ | $R^{B1}$ | O |
| $L_{A3797}$ | $R^{B3}$ | $R^{B1}$ | $R^{B1}$ | $R^{B1}$ | $R^{B1}$ | O |
| $L_{A3798}$ | $R^{B3}$ | $R^{B1}$ | $R^{B2}$ | $R^{B2}$ | $R^{B1}$ | O |
| $L_{A3799}$ | $R^{B3}$ | $R^{B1}$ | $R^{B3}$ | $R^{B3}$ | $R^{B1}$ | O |
| $L_{A3800}$ | $R^{B3}$ | $R^{B1}$ | $R^{B4}$ | $R^{B4}$ | $R^{B1}$ | O |
| $L_{A3801}$ | $R^{B3}$ | $R^{B1}$ | $R^{B5}$ | $R^{B5}$ | $R^{B1}$ | O |
| $L_{A3802}$ | $R^{B3}$ | $R^{B1}$ | $R^{B6}$ | $R^{B6}$ | $R^{B1}$ | O |
| $L_{A3803}$ | $R^{B3}$ | $R^{B1}$ | $R^{B7}$ | $R^{B7}$ | $R^{B1}$ | O |
| $L_{A3804}$ | $R^{B3}$ | $R^{B1}$ | $R^{B8}$ | $R^{B8}$ | $R^{B1}$ | O |
| $L_{A3805}$ | $R^{B3}$ | $R^{B1}$ | $R^{B9}$ | $R^{B9}$ | $R^{B1}$ | O |
| $L_{A3806}$ | $R^{B3}$ | $R^{B1}$ | $R^{A2}$ | $R^{A2}$ | $R^{B1}$ | O |
| $L_{A3807}$ | $R^{B3}$ | $R^{B1}$ | $R^{A27}$ | $R^{A27}$ | $R^{B1}$ | O |
| $L_{A3808}$ | $R^{B3}$ | $R^{B1}$ | $R^{A34}$ | $R^{A34}$ | $R^{B1}$ | O |

compounds having a structure of

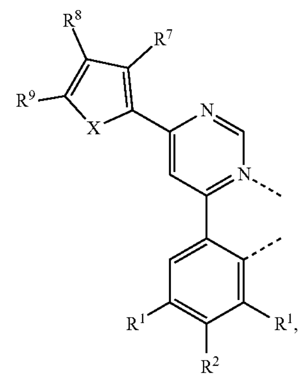

wherein $R^1$, $R^2$, $R^7$, $R^8$, $R^9$, and X are defined as provided below, $R^{A2}$

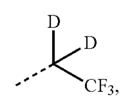

$R^{A27}$

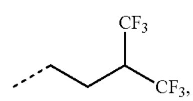

and $R^{A34}$

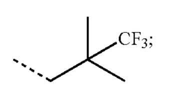

wherein $R^{A2}$, $R^{A27}$, and $R^{A34}$ have the following structures:

| | $R^1$ | $R^2$ | $R^7$ | $R^8$ | $R^9$ | X |
|---|---|---|---|---|---|---|
| $L_{A4762}$ | $R^{B1}$ | $R^{B1}$ | $R^{B3}$ | $R^{B1}$ | $R^{B3}$ | S |
| $L_{A4769}$ | $R^{B1}$ | $R^{B1}$ | $R^{A2}$ | $R^{B1}$ | $R^{A2}$ | S |
| $L_{A4773}$ | $R^{B2}$ | $R^{B1}$ | $R^{B3}$ | $R^{B1}$ | $R^{B3}$ | S |
| $L_{A4780}$ | $R^{B2}$ | $R^{B1}$ | $R^{A2}$ | $R^{B1}$ | $R^{A2}$ | S |
| $L_{A4784}$ | $R^{B2}$ | F | $R^{B3}$ | $R^{B1}$ | $R^{B3}$ | S |
| $L_{A4791}$ | $R^{B2}$ | F | $R^{A2}$ | $R^{B1}$ | $R^{A2}$ | S |
| $L_{A4794}$ | $R^{B3}$ | $R^{B1}$ | $R^{B2}$ | $R^{B1}$ | $R^{B2}$ | S |
| $L_{A4795}$ | $R^{B3}$ | $R^{B1}$ | $R^{B3}$ | $R^{B1}$ | $R^{B3}$ | S |
| $L_{A4796}$ | $R^{B3}$ | $R^{B1}$ | $R^{B4}$ | $R^{B1}$ | $R^{B4}$ | S |
| $L_{A4797}$ | $R^{B3}$ | $R^{B1}$ | $R^{B5}$ | $R^{B1}$ | $R^{B5}$ | S |
| $L_{A4798}$ | $R^{B3}$ | $R^{B1}$ | $R^{B6}$ | $R^{B1}$ | $R^{B6}$ | S |
| $L_{A4799}$ | $R^{B3}$ | $R^{B1}$ | $R^{B7}$ | $R^{B1}$ | $R^{B7}$ | S |
| $L_{A4800}$ | $R^{B3}$ | $R^{B1}$ | $R^{B8}$ | $R^{B1}$ | $R^{B8}$ | S |
| $L_{A4801}$ | $R^{B3}$ | $R^{B1}$ | $R^{B9}$ | $R^{B1}$ | $R^{B9}$ | S |
| $L_{A4802}$ | $R^{B3}$ | $R^{B1}$ | $R^{A2}$ | $R^{B1}$ | $R^{A2}$ | S |
| $L_{A4803}$ | $R^{B3}$ | $R^{B1}$ | $R^{A27}$ | $R^{B1}$ | $R^{A27}$ | S |
| $L_{A4804}$ | $R^{B3}$ | $R^{B1}$ | $R^{A34}$ | $R^{B1}$ | $R^{A34}$ | S |
| $L_{A4850}$ | $R^{B1}$ | $R^{B1}$ | $R^{B3}$ | $R^{B3}$ | $R^{B1}$ | S |

-continued

| | $R^1$ | $R^2$ | $R^7$ | $R^8$ | $R^9$ | X |
|---|---|---|---|---|---|---|
| $L_{A4857}$ | $R^{B1}$ | $R^{B1}$ | $R^{A2}$ | $R^{A2}$ | $R^{B1}$ | S |
| $L_{A4861}$ | $R^{B2}$ | $R^{B1}$ | $R^{B3}$ | $R^{B3}$ | $R^{B1}$ | S |
| $L_{A4868}$ | $R^{B2}$ | $R^{B1}$ | $R^{A2}$ | $R^{A2}$ | $R^{B1}$ | S |
| $L_{A4872}$ | $R^{B2}$ | F | $R^{B3}$ | $R^{B3}$ | $R^{B1}$ | S |
| $L_{A4879}$ | $R^{B2}$ | F | $R^{A2}$ | $R^{A2}$ | $R^{B1}$ | S |
| $L_{A4882}$ | $R^{B3}$ | $R^{B1}$ | $R^{B2}$ | $R^{B2}$ | $R^{B1}$ | S |
| $L_{A4883}$ | $R^{B3}$ | $R^{B1}$ | $R^{B3}$ | $R^{B3}$ | $R^{B1}$ | S |
| $L_{A4884}$ | $R^{B3}$ | $R^{B1}$ | $R^{B4}$ | $R^{B4}$ | $R^{B1}$ | S |
| $L_{A4885}$ | $R^{B3}$ | $R^{B1}$ | $R^{B5}$ | $R^{B5}$ | $R^{B1}$ | S |
| $L_{A4886}$ | $R^{B3}$ | $R^{B1}$ | $R^{B6}$ | $R^{B6}$ | $R^{B1}$ | S |
| $L_{A4887}$ | $R^{B3}$ | $R^{B1}$ | $R^{B7}$ | $R^{B7}$ | $R^{B1}$ | S |
| $L_{A4888}$ | $R^{B3}$ | $R^{B1}$ | $R^{B8}$ | $R^{B8}$ | $R^{B1}$ | S |
| $L_{A4889}$ | $R^{B3}$ | $R^{B1}$ | $R^{B9}$ | $R^{B9}$ | $R^{B1}$ | S |
| $L_{A4890}$ | $R^{B3}$ | $R^{B1}$ | $R^{A2}$ | $R^{A2}$ | $R^{B1}$ | S |
| $L_{A4891}$ | $R^{B3}$ | $R^{B1}$ | $R^{A27}$ | $R^{A27}$ | $R^{B1}$ | S |
| $L_{A4892}$ | $R^{B3}$ | $R^{B1}$ | $R^{A34}$ | $R^{A34}$ | $R^{B1}$ | S |
| $L_{A4894}$ | $R^{B1}$ | $R^{B1}$ | $R^{B3}$ | $R^{B3}$ | $R^{B3}$ | S |
| $L_{A4901}$ | $R^{B1}$ | $R^{B1}$ | $R^{A2}$ | $R^{A2}$ | $R^{A2}$ | S |
| $L_{A4905}$ | $R^{B2}$ | $R^{B1}$ | $R^{B3}$ | $R^{B3}$ | $R^{B3}$ | S |
| $L_{A4912}$ | $R^{B2}$ | $R^{B1}$ | $R^{A2}$ | $R^{A2}$ | $R^{A2}$ | S |
| $L_{A4916}$ | $R^{B2}$ | F | $R^{B3}$ | $R^{B3}$ | $R^{B3}$ | S |
| $L_{A4923}$ | $R^{B2}$ | F | $R^{A2}$ | $R^{A2}$ | $R^{A2}$ | S |
| $L_{A4926}$ | $R^{B3}$ | $R^{B1}$ | $R^{B2}$ | $R^{B2}$ | $R^{B2}$ | S |
| $L_{A4927}$ | $R^{B3}$ | $R^{B1}$ | $R^{B3}$ | $R^{B3}$ | $R^{B3}$ | S |
| $L_{A4928}$ | $R^{B3}$ | $R^{B1}$ | $R^{B4}$ | $R^{B4}$ | $R^{B4}$ | S |
| $L_{A4929}$ | $R^{B3}$ | $R^{B1}$ | $R^{B5}$ | $R^{B5}$ | $R^{B5}$ | S |
| $L_{A4930}$ | $R^{B3}$ | $R^{B1}$ | $R^{B6}$ | $R^{B6}$ | $R^{B6}$ | S |
| $L_{A4931}$ | $R^{B3}$ | $R^{B1}$ | $R^{B7}$ | $R^{B7}$ | $R^{B7}$ | S |
| $L_{A4932}$ | $R^{B3}$ | $R^{B1}$ | $R^{B8}$ | $R^{B8}$ | $R^{B8}$ | S |
| $L_{A4933}$ | $R^{B3}$ | $R^{B1}$ | $R^{B9}$ | $R^{B9}$ | $R^{B9}$ | S |
| $L_{A4934}$ | $R^{B3}$ | $R^{B1}$ | $R^{A2}$ | $R^{A2}$ | $R^{A2}$ | S |
| $L_{A4935}$ | $R^{B3}$ | $R^{B1}$ | $R^{A27}$ | $R^{A27}$ | $R^{A27}$ | S |
| $L_{A4936}$ | $R^{B3}$ | $R^{B1}$ | $R^{A34}$ | $R^{A34}$ | $R^{A34}$ | S |
| $L_{A4937}$ | $R^{B1}$ | $R^{B1}$ | $R^{B2}$ | $R^{B1}$ | $R^{B3}$ | S |
| $L_{A4944}$ | $R^{B1}$ | $R^{B1}$ | $R^{B2}$ | $R^{B1}$ | $R^{A2}$ | S |
| $L_{A4947}$ | $R^{B2}$ | $R^{B1}$ | $R^{B2}$ | $R^{B1}$ | $R^{B3}$ | S |
| $L_{A4954}$ | $R^{B2}$ | $R^{B1}$ | $R^{B2}$ | $R^{B1}$ | $R^{A2}$ | S |
| $L_{A4957}$ | $R^{B2}$ | F | $R^{B2}$ | $R^{B1}$ | $R^{B3}$ | S |
| $L_{A4964}$ | $R^{B2}$ | F | $R^{B2}$ | $R^{B1}$ | $R^{A2}$ | S |
| $L_{A4967}$ | $R^{B3}$ | $R^{B1}$ | $R^{B2}$ | $R^{B1}$ | $R^{B3}$ | S |
| $L_{A4968}$ | $R^{B3}$ | $R^{B1}$ | $R^{B2}$ | $R^{B1}$ | $R^{B4}$ | S |
| $L_{A4969}$ | $R^{B3}$ | $R^{B1}$ | $R^{B2}$ | $R^{B1}$ | $R^{B5}$ | S |
| $L_{A4970}$ | $R^{B3}$ | $R^{B1}$ | $R^{B2}$ | $R^{B1}$ | $R^{B6}$ | S |
| $L_{A4971}$ | $R^{B3}$ | $R^{B1}$ | $R^{B2}$ | $R^{B1}$ | $R^{B7}$ | S |
| $L_{A4972}$ | $R^{B3}$ | $R^{B1}$ | $R^{B2}$ | $R^{B1}$ | $R^{B8}$ | S |
| $L_{A4973}$ | $R^{B3}$ | $R^{B1}$ | $R^{B2}$ | $R^{B1}$ | $R^{B9}$ | S |
| $L_{A4974}$ | $R^{B3}$ | $R^{B1}$ | $R^{B2}$ | $R^{B1}$ | $R^{A2}$ | S |
| $L_{A4975}$ | $R^{B3}$ | $R^{B1}$ | $R^{B2}$ | $R^{B1}$ | $R^{A27}$ | S |
| $L_{A4976}$ | $R^{B3}$ | $R^{B1}$ | $R^{B2}$ | $R^{B1}$ | $R^{A34}$ | S |
| $L_{A4978}$ | $R^{B1}$ | $R^{B1}$ | $R^{B3}$ | $R^{B1}$ | $R^{B3}$ | O |
| $L_{A4985}$ | $R^{B1}$ | $R^{B1}$ | $R^{A2}$ | $R^{B1}$ | $R^{A2}$ | O |
| $L_{A4989}$ | $R^{B2}$ | $R^{B1}$ | $R^{B3}$ | $R^{B1}$ | $R^{B3}$ | O |
| $L_{A4996}$ | $R^{B2}$ | $R^{B1}$ | $R^{A2}$ | $R^{B1}$ | $R^{A2}$ | O |
| $L_{A5000}$ | $R^{B2}$ | F | $R^{B3}$ | $R^{B1}$ | $R^{B3}$ | O |
| $L_{A5007}$ | $R^{B2}$ | F | $R^{A2}$ | $R^{B1}$ | $R^{A2}$ | O |
| $L_{A5010}$ | $R^{B3}$ | $R^{B1}$ | $R^{B2}$ | $R^{B1}$ | $R^{B2}$ | O |
| $L_{A5011}$ | $R^{B3}$ | $R^{B1}$ | $R^{B3}$ | $R^{B1}$ | $R^{B3}$ | O |
| $L_{A5012}$ | $R^{B3}$ | $R^{B1}$ | $R^{B4}$ | $R^{B1}$ | $R^{B4}$ | O |
| $L_{A5013}$ | $R^{B3}$ | $R^{B1}$ | $R^{B5}$ | $R^{B1}$ | $R^{B5}$ | O |
| $L_{A5014}$ | $R^{B3}$ | $R^{B1}$ | $R^{B6}$ | $R^{B1}$ | $R^{B6}$ | O |
| $L_{A5015}$ | $R^{B3}$ | $R^{B1}$ | $R^{B7}$ | $R^{B1}$ | $R^{B7}$ | O |
| $L_{A5016}$ | $R^{B3}$ | $R^{B1}$ | $R^{B8}$ | $R^{B1}$ | $R^{B8}$ | O |
| $L_{A5017}$ | $R^{B3}$ | $R^{B1}$ | $R^{B9}$ | $R^{B1}$ | $R^{B9}$ | O |
| $L_{A5018}$ | $R^{B3}$ | $R^{B1}$ | $R^{A2}$ | $R^{B1}$ | $R^{A2}$ | O |
| $L_{A5019}$ | $R^{B3}$ | $R^{B1}$ | $R^{A27}$ | $R^{B1}$ | $R^{A27}$ | O |
| $L_{A5020}$ | $R^{B3}$ | $R^{B1}$ | $R^{A34}$ | $R^{B1}$ | $R^{A34}$ | O |
| $L_{A5022}$ | $R^{B1}$ | $R^{B1}$ | $R^{B1}$ | $R^{B3}$ | $R^{B3}$ | O |
| $L_{A5029}$ | $R^{B1}$ | $R^{B1}$ | $R^{B1}$ | $R^{A2}$ | $R^{A2}$ | O |
| $L_{A5033}$ | $R^{B2}$ | $R^{B1}$ | $R^{B1}$ | $R^{B3}$ | $R^{B3}$ | O |
| $L_{A5040}$ | $R^{B2}$ | $R^{B1}$ | $R^{B1}$ | $R^{A2}$ | $R^{A2}$ | O |
| $L_{A5044}$ | $R^{B2}$ | F | $R^{B1}$ | $R^{B3}$ | $R^{B3}$ | O |
| $L_{A5051}$ | $R^{B2}$ | F | $R^{B1}$ | $R^{A2}$ | $R^{A2}$ | O |
| $L_{A5055}$ | $R^{B3}$ | $R^{B1}$ | $R^{B1}$ | $R^{B3}$ | $R^{B3}$ | O |
| $L_{A5056}$ | $R^{B3}$ | $R^{B1}$ | $R^{B1}$ | $R^{B4}$ | $R^{B4}$ | O |
| $L_{A5057}$ | $R^{B3}$ | $R^{B1}$ | $R^{B1}$ | $R^{B5}$ | $R^{B5}$ | O |
| $L_{A5058}$ | $R^{B3}$ | $R^{B1}$ | $R^{B1}$ | $R^{B6}$ | $R^{B6}$ | O |
| $L_{A5059}$ | $R^{B3}$ | $R^{B1}$ | $R^{B1}$ | $R^{B7}$ | $R^{B7}$ | O |

-continued

| | $R^1$ | $R^2$ | $R^7$ | $R^8$ | $R^9$ | X |
|---|---|---|---|---|---|---|
| $L_{A5060}$ | $R^{B3}$ | $R^{B1}$ | $R^{B1}$ | $R^{B8}$ | $R^{B8}$ | O |
| $L_{A5061}$ | $R^{B3}$ | $R^{B1}$ | $R^{B1}$ | $R^{B9}$ | $R^{B9}$ | O |
| $L_{A5062}$ | $R^{B3}$ | $R^{B1}$ | $R^{B1}$ | $R^{A2}$ | $R^{A2}$ | O |
| $L_{A5063}$ | $R^{B3}$ | $R^{B1}$ | $R^{B1}$ | $R^{A27}$ | $R^{A27}$ | O |
| $L_{A5064}$ | $R^{B3}$ | $R^{B1}$ | $R^{B1}$ | $R^{A34}$ | $R^{A34}$ | O |
| $L_{A5066}$ | $R^{B3}$ | $R^{B1}$ | $R^{B3}$ | $R^{B3}$ | $R^{B1}$ | O |
| $L_{A5073}$ | $R^{B3}$ | $R^{B1}$ | $R^{A2}$ | $R^{A2}$ | $R^{B1}$ | O |
| $L_{A5077}$ | $R^{B2}$ | $R^{B1}$ | $R^{B3}$ | $R^{B3}$ | $R^{B1}$ | O |
| $L_{A5084}$ | $R^{B2}$ | $R^{B1}$ | $R^{A2}$ | $R^{A2}$ | $R^{B1}$ | O |
| $L_{A5088}$ | $R^{B2}$ | F | $R^{B3}$ | $R^{B3}$ | $R^{B1}$ | O |
| $L_{A5095}$ | $R^{B2}$ | F | $R^{A2}$ | $R^{A2}$ | $R^{B1}$ | O |
| $L_{A5099}$ | $R^{B3}$ | $R^{B1}$ | $R^{B3}$ | $R^{B3}$ | $R^{B1}$ | O |
| $L_{A5106}$ | $R^{B3}$ | $R^{B1}$ | $R^{A2}$ | $R^{A2}$ | $R^{B1}$ | O |
| $L_{A5110}$ | $R^{B1}$ | $R^{B1}$ | $R^{B3}$ | $R^{B3}$ | $R^{B3}$ | O |
| $L_{A5117}$ | $R^{B}$ | $R^{B1}$ | $R^{A2}$ | $R^{A2}$ | $R^{A2}$ | O |
| $L_{A5121}$ | $R^{B2}$ | $R^{B1}$ | $R^{B3}$ | $R^{B3}$ | $R^{B3}$ | O |
| $L_{A5128}$ | $R^{B2}$ | $R^{B1}$ | $R^{A2}$ | $R^{A2}$ | $R^{A2}$ | O |
| $L_{A5132}$ | $R^{B2}$ | F | $R^{B3}$ | $R^{B3}$ | $R^{B3}$ | O |
| $L_{A5139}$ | $R^{B2}$ | F | $R^{A2}$ | $R^{A2}$ | $R^{A2}$ | O |
| $L_{A5143}$ | $R^{B3}$ | $R^{B1}$ | $R^{B3}$ | $R^{B3}$ | $R^{B3}$ | O |
| $L_{A5150}$ | $R^{B3}$ | $R^{B1}$ | $R^{A2}$ | $R^{A2}$ | $R^{A2}$ | O |
| $L_{A5153}$ | $R^{B1}$ | $R^{B1}$ | $R^{B2}$ | $R^{B1}$ | $R^{B3}$ | O |
| $L_{A5160}$ | $R^{B1}$ | $R^{B1}$ | $R^{B2}$ | $R^{B1}$ | $R^{A2}$ | O |
| $L_{A5163}$ | $R^{B2}$ | $R^{B1}$ | $R^{B2}$ | $R^{B1}$ | $R^{B3}$ | O |
| $L_{A5170}$ | $R^{B2}$ | $R^{B1}$ | $R^{B2}$ | $R^{B1}$ | $R^{A2}$ | O |
| $L_{A5173}$ | $R^{B2}$ | F | $R^{B2}$ | $R^{B1}$ | $R^{B3}$ | O |
| $L_{A5180}$ | $R^{B2}$ | F | $R^{B2}$ | $R^{B1}$ | $R^{A2}$ | O |
| $L_{A5183}$ | $R^{B3}$ | $R^{B1}$ | $R^{B2}$ | $R^{B1}$ | $R^{B3}$ | O |
| $L_{A5184}$ | $R^{B3}$ | $R^{B1}$ | $R^{B2}$ | $R^{B1}$ | $R^{B4}$ | O |
| $L_{A5185}$ | $R^{B3}$ | $R^{B1}$ | $R^{B2}$ | $R^{B1}$ | $R^{B5}$ | O |
| $L_{A5186}$ | $R^{B3}$ | $R^{B1}$ | $R^{B2}$ | $R^{B1}$ | $R^{B6}$ | O |
| $L_{A5187}$ | $R^{B3}$ | $R^{B1}$ | $R^{B2}$ | $R^{B1}$ | $R^{B7}$ | O |
| $L_{A5188}$ | $R^{B3}$ | $R^{B1}$ | $R^{B2}$ | $R^{B1}$ | $R^{B8}$ | O |
| $L_{A5189}$ | $R^{B3}$ | $R^{B1}$ | $R^{B2}$ | $R^{B1}$ | $R^{B9}$ | O |
| $L_{A5190}$ | $R^{B3}$ | $R^{B1}$ | $R^{B2}$ | $R^{B1}$ | $R^{A2}$ | O |
| $L_{A5191}$ | $R^{B3}$ | $R^{B1}$ | $R^{B2}$ | $R^{B1}$ | $R^{A27}$ | O |
| $L_{A5192}$ | $R^{B3}$ | $R^{B1}$ | $R^{B2}$ | $R^{B1}$ | $R^{A34}$ | O |

and wherein $R^{B1}$ to $R^{B9}$ has the following structures:

$R^{B1}$

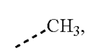

$R^{B2}$

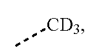

$R^{B3}$

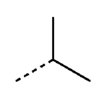

$R^{B4}$

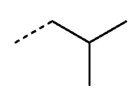

$R^{B5}$

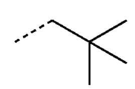

$R^{B6}$

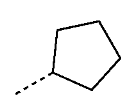

$R^{B7}$

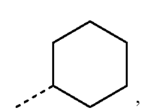

$R^{B8}$ and

-continued

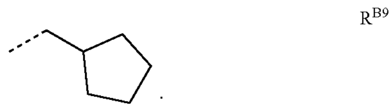

14. The compound of claim 1, wherein z is 1 or 2, and $L_C$ has the formula:

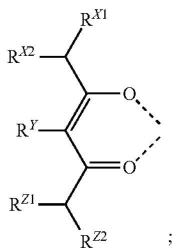

wherein $R^{X1}$, $R^{X2}$, $R^{Z1}$, and $R^{Z2}$ are independently; and wherein at least one of $R^{X1}$, $R^{X2}$, $R^{Z1}$, and $R^{Z2}$ has at least two carbon atoms.

15. An organic light-emitting device (OLED) comprising:

an anode;

a cathode; and an organic layer, disposed between the anode and the cathode, comprising a compound having a formula $M(L_A)_x(L_C)_z$:

wherein the ligand $L_A$ is

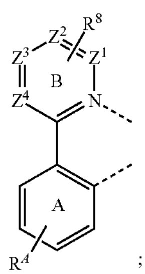

wherein the ligand $L_B$ is

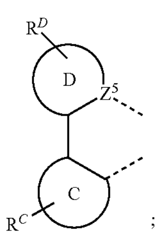

wherein the ligand $L_C$ is

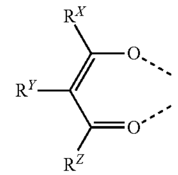

wherein M is a metal having an atomic mass greater than 40;

wherein x is 1 or 2;

wherein y is 0, 1, or 2;

wherein z is 0, 1 or 2;

wherein x+y+z is the oxidation state of the metal M;

wherein $Z^5$ is carbon or nitrogen;

wherein one of $Z^1$ to $Z^4$ is nitrogen and three of $Z^1$ to $Z^4$ are carbon substituted by $R^B$;

wherein rings C and D are each independently a 5 or 6-membered carbocyclic or heterocyclic ring;

wherein $R^A$, $R^B$, $R^C$, and $R^D$ each independently represent mono to the possible maximum number of substitution, or no substitution;

wherein each of $R^A$, $R^B$, $R^C$, $R^D$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, with the proviso that the bonded to $Z^1$ is not aryl or heteroaryl;

wherein at least one of $R^B$ is heteroaryl, which can be further substituted;

wherein the at least one of $R^B$ that is heteroaryl includes a heteroatom selected from the group consisting of N, S, O, and Se, that is adjacent to the bond between the $R^B$ that is heteroaryl and ring B;

wherein, when the heteroaryl is thiophene, the at least one of $R^B$ that is heteroaryl has a structure of

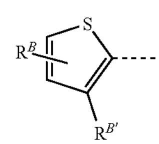

and $R^{B'}$ is the same as $R^B$ except that $R^{B'}$ is not hydrogen or deuterium;

wherein at least one of $R^A$, $R^B$, $R^C$, and $R^D$ is a partially or fully deuterated moiety; and wherein any adjacent substituents are optionally joined or fused into a ring.

16. The OLED of claim 15, wherein the organic layer further comprises a host, wherein the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

17. The OLED of claim 15, wherein the organic layer further comprises a host, wherein the host is selected from the group consisting of:

-continued
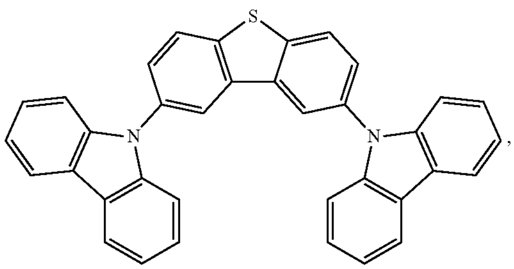
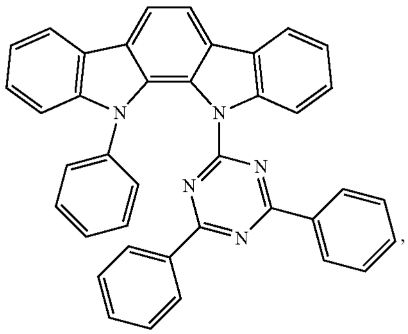
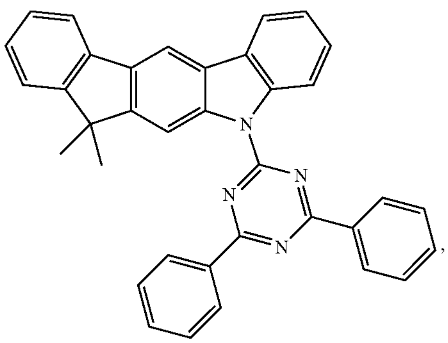
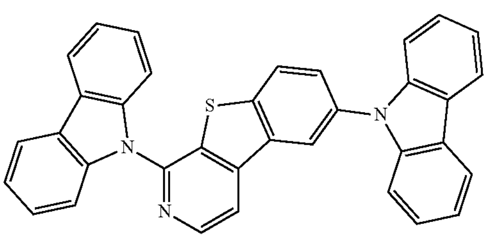
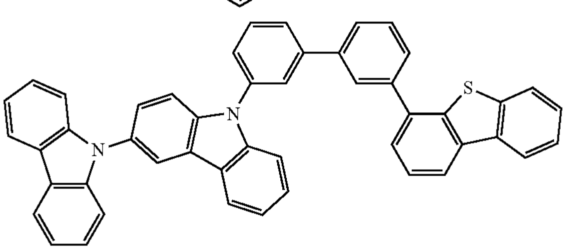
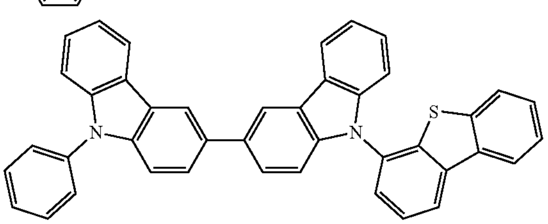
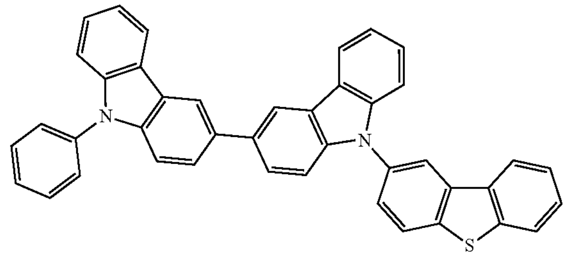
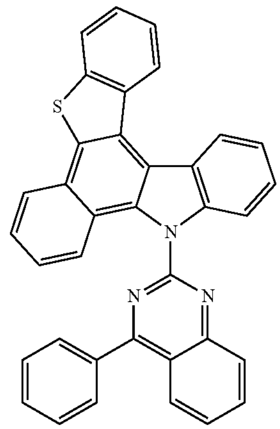
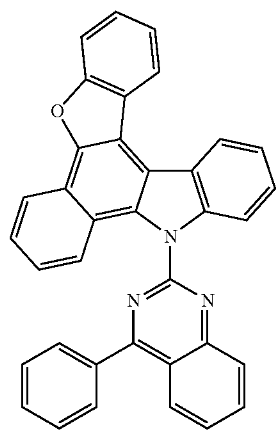
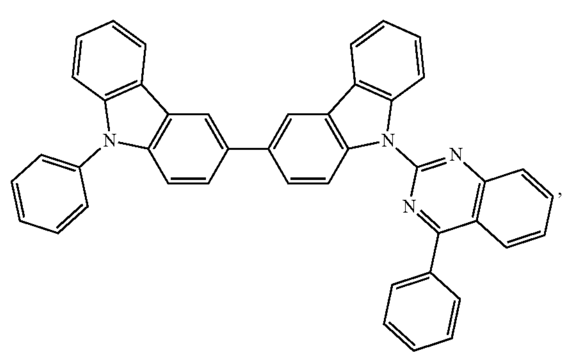

-continued
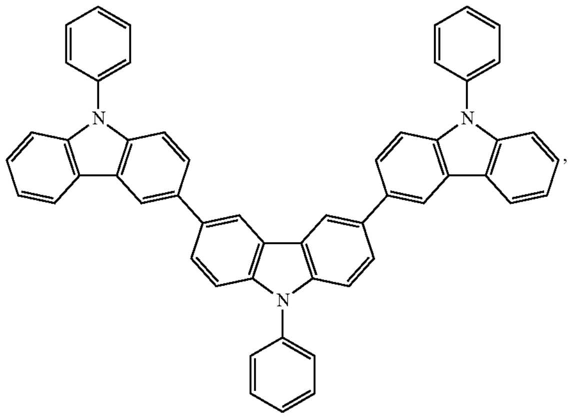
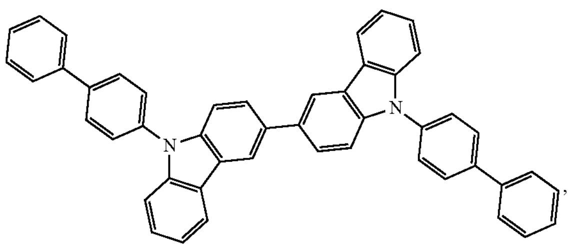
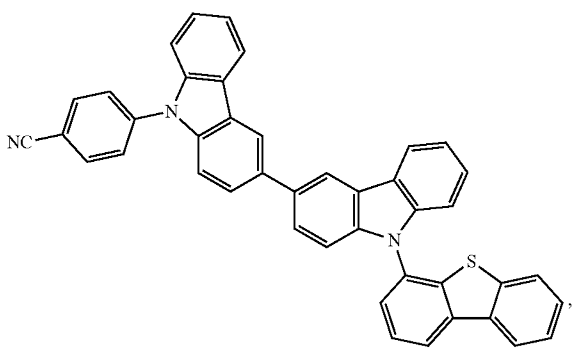
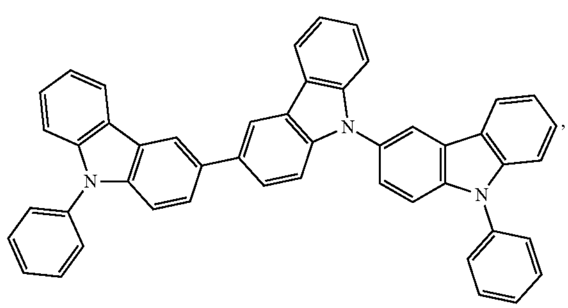
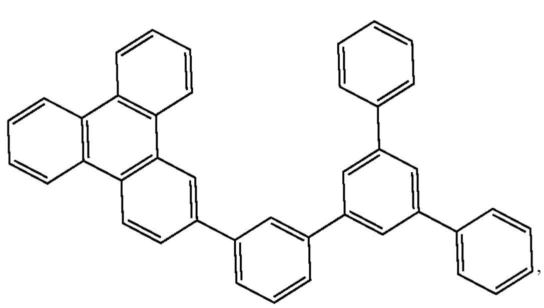
-continued
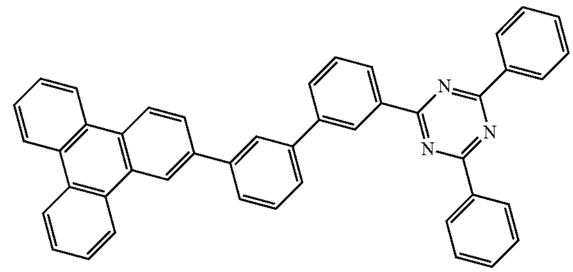
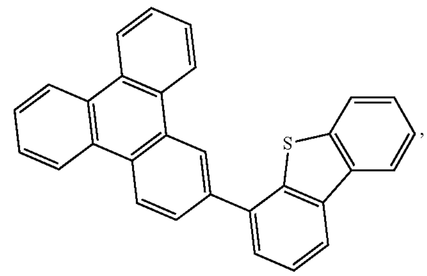
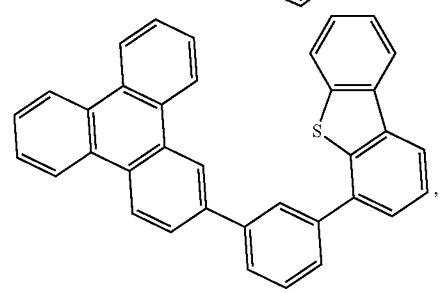
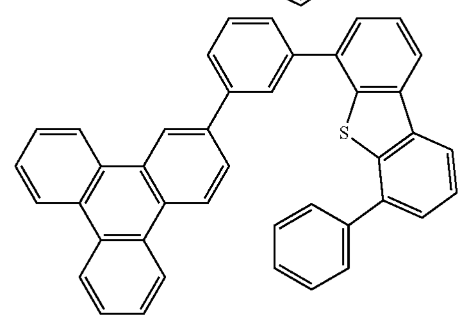
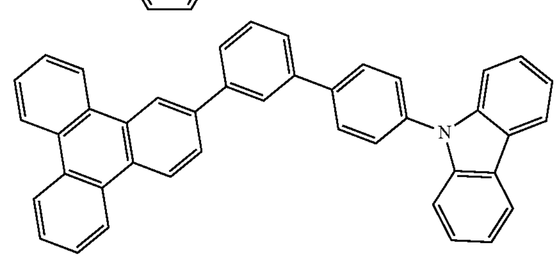
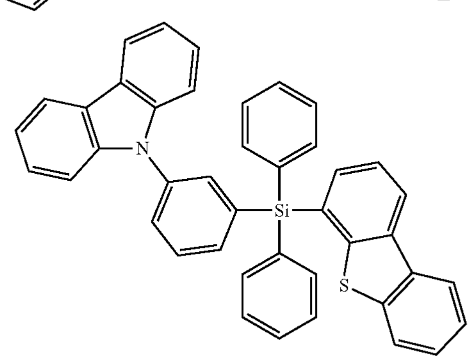

-continued

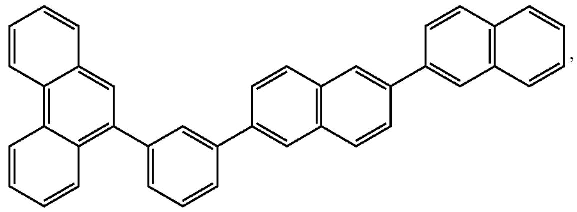 [SMILES: c1cc(-c2ccc3cc(-c4ccc5ccccc5c4)ccc3c2)cc(-c2cc3ccccc3c3ccccc23)c1]

and combinations thereof.

18. A consumer product comprising:

an organic light-emitting device (OLED) comprising:

an anode;

a cathode; and an organic layer, disposed between the anode and the cathode, comprising a compound having a formula $M(L_A)_x(L_C)_z$:

wherein the ligand $L_A$ is

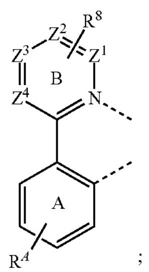

wherein the ligand $L^B$ is

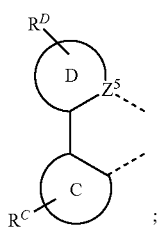

wherein the ligand $L_C$ is

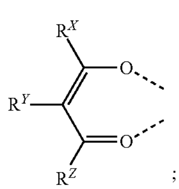

wherein M is a metal having an atomic mass greater than 40;

wherein x is 1 or 2;

wherein y is 0, 1, or 2;

wherein z is 0, 1 or 2;

wherein x+y+z is the oxidation state of the metal M;

wherein $Z^5$ is carbon or nitrogen;

wherein one of $Z^1$ to $Z^4$ is nitrogen and three of $Z^1$ to $Z^4$ are carbon substituted by $R^B$;

wherein rings C and D are each independently a 5 or 6-membered carbocyclic or heterocyclic ring;

wherein $R^A$, $R^B$, $R_C$, and $R^D$ each independently represent mono to the possible maximum number of substitution, or no substitution;

wherein each of $R^A$, $R^B$, $R^C$, $R^D$, $R^X$, $R^Y$, and $R^Z$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, with the proviso that the bonded to $Z^1$ is not aryl or heteroaryl;

wherein at least one of $R^B$ is heteroaryl, which can be further substituted;

wherein the at least one of $R^B$ that is heteroaryl includes a heteroatom selected from the group consisting of N, S, O, and Se, that is adjacent to the bond between the $R^B$ that is heteroaryl and ring B;

wherein, when the heteroaryl is thiophene, the at least one of $R^B$ that is heteroaryl has a structure of

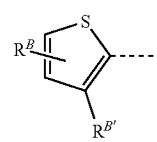

and $R^{B'}$ is the same as $R^B$ except that $R^{B'}$ is not hydrogen or deuterium;

wherein at least one of $R^A$, $R^B$, $R^{B'}$, $R^C$, and $R^D$ is a partially or fully deuterated moiety; and wherein any adjacent substituents are optionally joined or fused into a ring.

19. The compound of claim 13, wherein the compound has the formula $Ir(L_{Ak})_2(L_{Cj})$; wherein $L_{Cj}$ is selected from the group consisting of $L_{C1}$

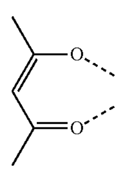

$L_{C2}$

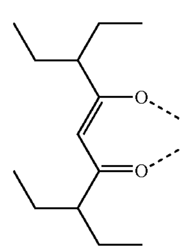

-continued
$L_{C3}$
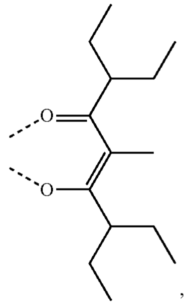
,
$L_{C4}$
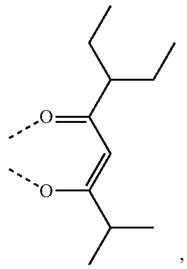
,
$L_{C5}$
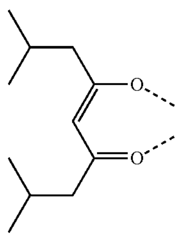
,
$L_{C6}$
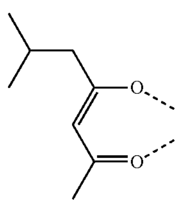
,
$L_{C7}$
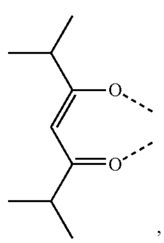
,
-continued
$L_{C8}$
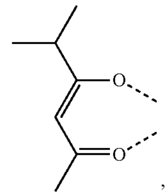
,
$L_{C11}$
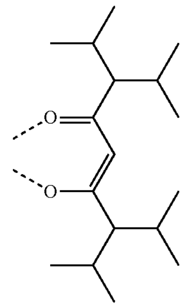
,
$L_{C12}$
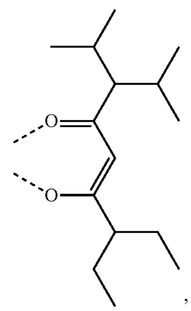
, and
$L_{C13}$
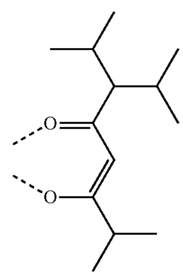
.
20. The compound of claim 1, wherein any substituent of the at least one of $R^B$ that is heteroaryl is either a pendant substituent or bonded to another substituent of the at least one $R^B$ that is heteroaryl.
* * * * *